US012698301B2

(12) United States Patent
Bae et al.

(10) Patent No.: US 12,698,301 B2
(45) Date of Patent: Aug. 4, 2026

(54) ORGANOMETALLIC COMPOUND AND ORGANIC LIGHT-EMITTING DEVICE INCLUDING ORGANOMETALLIC COMPOUND

(71) Applicant: Samsung Electronics Co., Ltd., Suwon-si (KR)

(72) Inventors: Hyejin Bae, Suwon-si (KR); Hwangsuk Kim, Suwon-si (KR); Minsik Min, Suwon-si (KR); Sangho Park, Anyang-si (KR); Soonok Jeon, Suwon-si (KR); Yeonsook Chung, Seoul (KR); Hyesung Choi, Seoul (KR); Jong Soo Kim, Hanam-si (KR); Jun Chwae, Seoul (KR); Hyeonho Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1044 days.

(21) Appl. No.: 17/713,688

(22) Filed: Apr. 5, 2022

(65) Prior Publication Data

US 2023/0101854 A1 Mar. 30, 2023

(30) Foreign Application Priority Data

Jul. 15, 2021 (KR) ........................ 10-2021-0093136

(51) Int. Cl.

| | |
|---|---|
| ***H01L 51/54*** | (2006.01) |
| ***C07F 15/00*** | (2006.01) |
| ***H10K 85/30*** | (2023.01) |
| ***H10K 85/60*** | (2023.01) |
| *H10K 50/11* | (2023.01) |
| *H10K 50/12* | (2023.01) |
| *H10K 101/10* | (2023.01) |

(52) U.S. Cl.

CPC ....... *C07F 15/0086* (2013.01); *H10K 85/346* (2023.02); *H10K 85/6572* (2023.02); *H10K 85/658* (2023.02); *H10K 50/11* (2023.02); *H10K 50/12* (2023.02); *H10K 2101/10* (2023.02)

(58) Field of Classification Search

None

See application file for complete search history.

(56) References Cited

U.S. PATENT DOCUMENTS 11,778,899 B2 * 10/2023 Bae ...................... H10K 85/346 428/690
2013/0168656 A1 7/2013 Tsai et al.
2020/0140471 A1 5/2020 Chen et al.
2020/0266366 A1 8/2020 Bold et al.
2020/0392173 A1 12/2020 Bae et al.
2020/0395560 A1 * 12/2020 Bae ........................ H05B 33/14
2022/0081457 A1 3/2022 Bae et al.

FOREIGN PATENT DOCUMENTS

EP 3828190 A1 6/2021
KR 1020200143235 A 12/2020
KR 1020200143237 A 12/2020
KR 20210065868 A 6/2021
(Continued)

OTHER PUBLICATIONS

Extended Duropean Search Report issued Dec. 5, 2022 of EP Patent Application No. 22184315.4.
(Continued)

*Primary Examiner* — Andrew K Bohaty

(74) *Attorney, Agent, or Firm* — CANTOR COLBURN LLP

(57) ABSTRACT

An organometallic compound, represented by Formula 1:

Formula 1

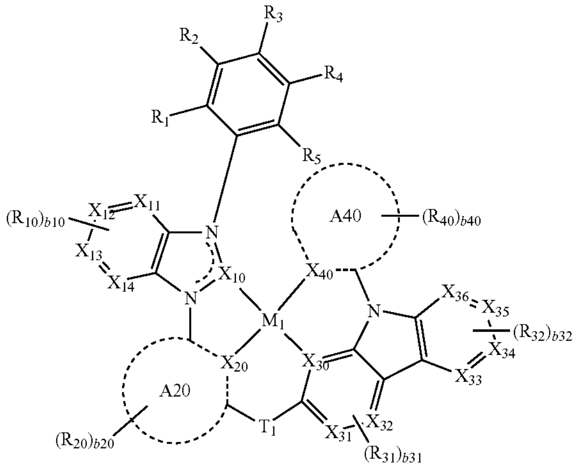

wherein $M_1$ is a transition metal; $X_{10}$ is C; $X_{11}$ to $X_{14}$, $X_{20}$, $X_{30}$ to $X_{36}$, and $X_{40}$ are each independently C or N; ring $A_{20}$ and ring $A_{40}$ are each independently a $C_5$-$C_{30}$ carbocyclic group or a $C_1$-$C_{30}$ heterocyclic group; and $R_1$ to $R_5$, $R_{10}$, $R_{20}$, $R_{31}$, $R_{32}$, $R_{40}$, $R_{51}$, $R_{52}$, $T_1$, b10, b20, b31, b32, and b40 are as defined herein.

17 Claims, 2 Drawing Sheets

(56) References Cited

FOREIGN PATENT DOCUMENTS

| | | | |
|---|---|---|---|
| WO | 0215645 | A1 | 2/2002 |
| WO | 2005019373 | A2 | 3/2005 |

OTHER PUBLICATIONS

Ruben Seifert et al., "Chemical degradation mechanisms of highly efficient blue phosphorescent emitters used for organic light emitting diodes," Organic Electronics, Nov. 7, 2012, pp. 115-123, vol. 14.

Office Action issued Mar. 10, 2026 of KR Patent Application No. 10-2021-0093136.

* cited by examiner

ORGANOMETALLIC COMPOUND AND ORGANIC LIGHT-EMITTING DEVICE INCLUDING ORGANOMETALLIC COMPOUND

CROSS-REFERENCE TO RELATED APPLICATION

This application is based on and claims priority to Korean Patent Application No. 10-2021-0093136, filed on Jul. 15, 2021, in the Korean Intellectual Property Office, and all the benefits accruing therefrom under 35 U.S.C. § 119, the content of which is incorporated by reference herein in its entirety.

BACKGROUND

1. Field

One or more embodiments relate to an organometallic compound and an organic light-emitting device including the same.

2. Description of the Related Art

Organic light-emitting devices (OLEDs) are self-emissive devices that, as compared with devices of the related art, have wide viewing angles, high contrast ratios, short response times, and excellent brightness, driving voltage, and response speed characteristics, and produce full-color images.

OLEDs include an anode, a cathode, and an organic layer located between the anode and the cathode, and including an emission layer. A hole transport region may be located between the anode and the emission layer, and an electron transport region may be located between the emission layer and the cathode. Holes provided from the anode may move towards the emission layer through the hole transport region, and electrons provided from the cathode may move towards the emission layer through the electron transport region. The holes and the electrons recombine in the emission layer to produce excitons. The excitons may transition from an excited state to a ground state, thus generating light.

SUMMARY

Provided are an organometallic compound and an organic light-emitting device including the organometallic compound.

Additional aspects will be set forth in part in the detailed description which follows and, in part, will be apparent from the detailed description, or may be learned by practice of the exemplary embodiments of the disclosure.

According to an aspect, an organometallic compound is represented by Formula 1.

Formula 1

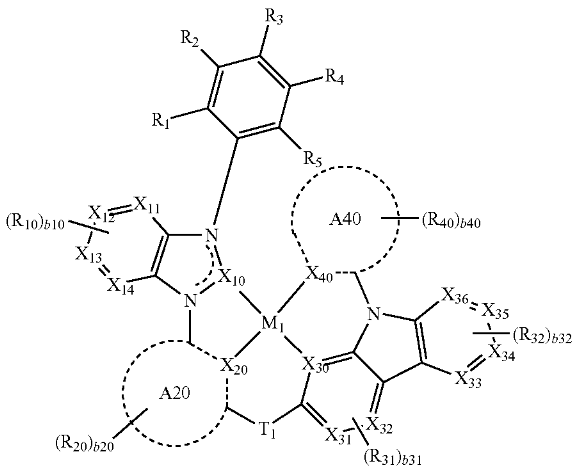

In Formula 1, $M_1$ is a transition metal, $X_{10}$ is carbon (C), $X_{11}$ to $X_{14}$, $X_{20}$, $X_{30}$ to $X_{36}$, and $X_{40}$ are each independently C or nitrogen (N), ring $A_{20}$ and ring $A_{40}$ are each independently a $C_5$-$C_{30}$ carbocyclic group or a $C_1$-$C_{30}$ heterocyclic group, $T_1$ is *—N($R_{51}$)—*', *—B($R_{51}$)—*', *—P($R_{51}$)—*', *—C($R_{51}$)($R_{52}$)—*', *—Si($R_{51}$)($R_{52}$)—*', *—Ge($R_{51}$)($R_{52}$)—*', *—S—*', *—Se—*', *—O—*', *—C(=O)—*', *—S(=O)—*', *—S(=O)$_2$—*', *—C($R_{51}$)=C($R_{52}$)—*' *—C(=S)—*', or *—C≡C—*', wherein * and *' each indicated a binding site to an adjacent atom, $R_2$ is a substituted or unsubstituted $C_1$-$C_{60}$ alkyl group or a substituted or unsubstituted $C_6$-$C_{60}$ aryl group, $R_1$, $R_3$ to $R_5$, $R_{10}$, $R_{20}$, $R_{31}$, $R_{32}$, $R_{40}$, $R_{51}$, and $R_{52}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, —$P(Q_8)(Q_9)$, or —$P(=O)(Q_8)(Q_9)$, two or more of $R_{10}$, $R_{20}$, $R_{31}$, $R_{32}$, $R_{40}$, $R_{51}$, and $R_{52}$ are optionally bonded to each other to form a substituted or unsubstituted $C_5$-$C_{30}$ carbocyclic group or a substituted or unsubstituted $C_1$-$C_{30}$ heterocyclic group, b10 and b32 are each independently an integer from 1 to 4, b20 and b40 are each independently an integer from 1 to 10, b31 is 1 or 2, provided that at least one of $R_{31}$(s) in the number of b31 or $R_{32}$(s) in the number of b32 is:

—F or a cyano group, a $C_1$-$C_{60}$ alkyl group or a $C_6$-$C_{60}$ aryl group, each substituted with at least one of —F, a cyano group, a fluorine-substituted $C_1$-$C_{10}$ alkyl group, a $C_6$-$C_{60}$ aryl group, a $C_1$-$C_{60}$ heteroaryl group, —$Si(Q_{33})(Q_{34})(Q_{35})$, or a combination thereof, a substituted or unsubstituted $C_1$-$C_{60}$ heteroaryl group, or —$Si(Q_3)(Q_4)(Q_5)$, and a substituent of each of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, the substituted monovalent non-aromatic condensed heteropolycyclic group, the substituted $C_5$-$C_{30}$ carbocyclic group, and the substituted $C_1$-$C_{30}$ heterocyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(Q_{18})(Q_{19})$, —$P(=O)(Q_{18})(Q_{19})$, or a combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(Q_{28})(Q_{29})$, —$P(=O)(Q_{28})(Q_{29})$, or a combination thereof, —$N(Q_{31})(Q_{32})$, —$Si(Q_{33})(Q_{34})(Q_{35})$, —$B(Q_{36})(Q_{37})$, —$P(Q_{38})(Q_{39})$, or —$P(=O)(Q_{38})(Q_{39})$, or a combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ substituted or unsubstituted alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

According to another aspect, an organic light-emitting device includes a first electrode, a second electrode, and an organic layer located between the first electrode and the second electrode, wherein the organic layer includes an emission layer, and wherein the organic layer further includes at least one organometallic compound.

Still another aspect provides an electronic apparatus including the organic light-emitting device.

BRIEF DESCRIPTION OF THE DRAWINGS

The above and other aspects and, features of one or more exemplary embodiments of the disclosure will be more apparent from the following detailed description taken in conjunction with the accompanying drawings, in which.

DETAILED DESCRIPTION

Figure 1:
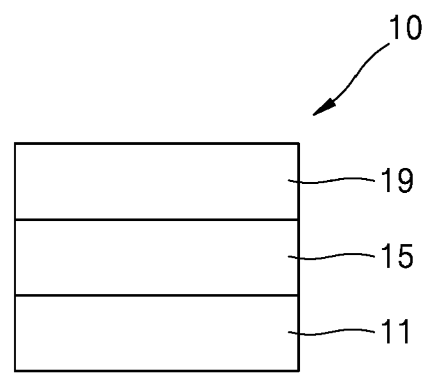
FIG. 1 is a schematic cross-sectional view according to one or more embodiments and shows an organic light-emitting device.

Reference will now be made in further detail to exemplary embodiments, examples of which are illustrated in the accompanying drawings, wherein like reference numerals refer to like elements throughout. In this regard, the present exemplary embodiments may have different forms and should not be construed as being limited to the detailed descriptions set forth herein. Accordingly, the exemplary embodiments are merely described in further detail below, and by referring to the figures, to explain certain aspects.

The terminology used herein is for the purpose of describing one or more exemplary embodiments only and is not intended to be limiting. As used herein, the singular forms "a," "an," and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An aspect provides an organometallic compound represented by Formula 1:

Formula 1

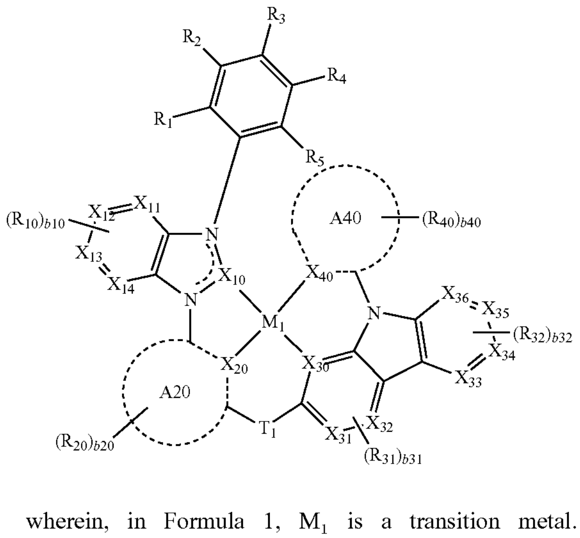

wherein, in Formula 1, $M_1$ is a transition metal.

In one or more embodiments, $M_1$ may be a first-row transition metal, a second-row transition metal, or a third-row transition metal. It is to be understood that "row" refers to a row of the Periodic Table of Elements.

For example, $M_1$ may be iridium (Ir), platinum (Pt), osmium (Os), titanium (Ti), zirconium (Zr), hafnium (Hf), europium (Eu), terbium (Tb), thulium (Tm), rhodium (Rh), palladium (Pd), or gold (Au).

In one or more embodiments, $M_1$ may be platinum (Pt), palladium (Pd), or gold (Au).

In Formula 1, $X_{10}$ is carbon (C), and $X_{11}$ to $X_{14}$, $X_{20}$, $X_{30}$ to $X_{36}$, and $X_{40}$ are each independently C or nitrogen (N).

In one or more embodiments, $X_{11}$ to $X_{14}$ may each be C.

In one or more embodiments, $X_{20}$ and $X_{30}$ may each be C, and $X_{40}$ may be N.

In one or more embodiments, $X_{31}$ to $X_{36}$ may each be C.

In Formula 1, two bonds of a bond between $X_{10}$ and $M_1$, a bond between $X_{20}$ and $M_1$, a bond between $X_{30}$ and $M_1$, and a bond between $X_{40}$ and $M_1$ may each be a coordinate bond, and the other of two bonds of a bond between $X_{10}$ and $M_1$, a bond between $X_{20}$ and $M_1$, a bond between $X_{30}$ and $M_1$, and a bond between $X_{40}$ and $M_1$ may each be a covalent bond. Thus, the organometallic compound represented by Formula 1 may be electrically neutral.

In one or more embodiments, in Formula 1, a bond between $X_{10}$ and $M_1$ may be a coordinate bond.

In one or more embodiments, in Formula 1, one bond of a bond between $X_{20}$ and $M_1$, a bond between $X_{30}$ and $M_1$, and a bond between $X_{40}$ and $M_1$ may be a coordinate bond, and the other two bonds of a bond between $X_{20}$ and $M_1$, a bond between $X_{30}$ and $M_1$, and a bond between $X_{40}$ and $M_1$ may each be a covalent bond.

In one or more embodiments, $X_{20}$ and $X_{30}$ may each be C, $X_{40}$ may be N, a bond between $X_{20}$ and $M_1$ and a bond between $X_{30}$ and $M_1$ may each be a covalent bond, and a bond between $X_{40}$ and $M_1$ may be a coordinate bond.

In one or more embodiments, a moiety represented by

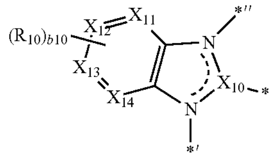

in Formula 1 may be represented by one of Formulae A10-1 to A10-16:

A10-1

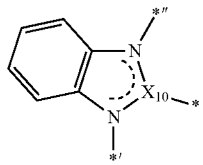

A10-2

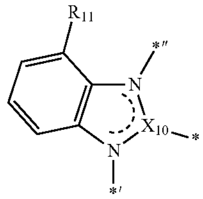

-continued

A10-3

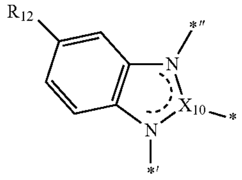

A10-4

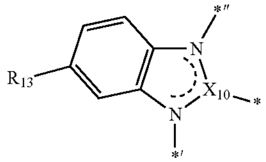

A10-5

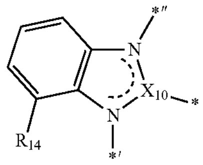

A10-6

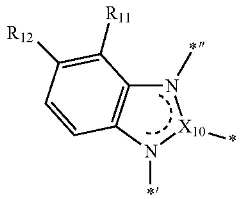

A10-7

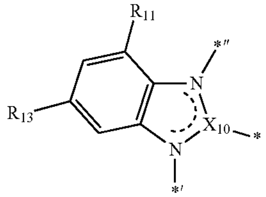

A10-8

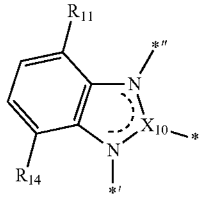

A10-9

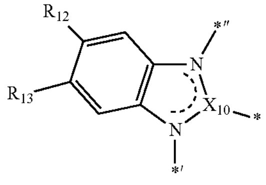

A10-10

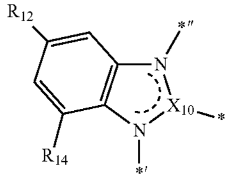

-continued

A10-11

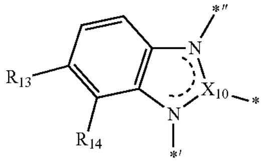

A10-12

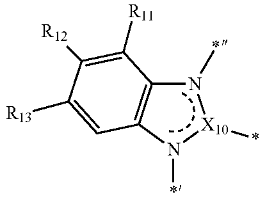

A10-13

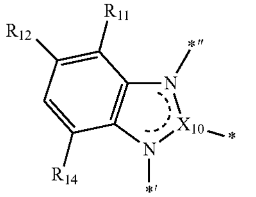

A10-14

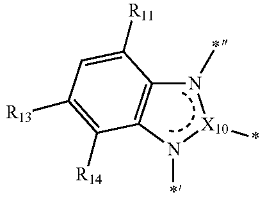

A10-15

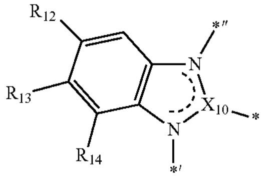

A10-16

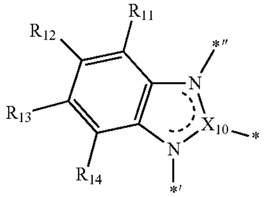

wherein in Formulae A10-1 to A10-16, $X_{10}$ may be understood by referring to the description of $X_{10}$ provided herein, $R_{11}$ to $R_{14}$ may each be understood by referring to the description of $R_{10}$ provided herein, and $R_{11}$ to $R_{14}$ may not each be hydrogen,

* indicates a binding site to $M_1$ in Formula 1,

*' indicates a binding site to ring $A_{20}$ in Formula 1, and

*" indicates a binding site to a phenyl group in Formula 1.

In Formula 1, ring $A_{20}$ and ring $A_{40}$ may each independently be a $C_5$-$C_{30}$ carbocyclic group or a $C_1$-$C_{30}$ heterocyclic group.

For example, ring $A_{20}$ and ring $A_{40}$ may each independently be i) a first ring, ii) a second ring, iii) a condensed ring in which at least two first rings are condensed, iv) a condensed ring in which at least two second rings are condensed, or v) a condensed ring in which at least one first ring and at least one second ring are condensed, the first ring may be a cyclopentane group, a cyclopentadiene group, a furan group, a thiophene group, a pyrrole group, a silole group, a borole group, a phosphole group, a germole group, a selenophene group, an oxazole group, an isoxazole group, an oxadiazole group, an oxatriazole group, a thiazole group, an isothiazole group, a thiadiazole group, a thiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a cyclohexadiene group, a benzene group, a pyridine group, a pyrimidine group, a pyrazine group, a pyridazine group, a triazine group, an oxazine group, a thiazine group, a dihydropyrazine group, a dihydropyridine group, or a dihydroazasilole group.

In one or more embodiments, ring $A_{20}$ and ring $A_{40}$ in Formula 1 may each independently be a cyclopentane group, a cyclopentene group, a cyclohexane group, a cyclohexene group, a cyclohexadiene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a phosphole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophenegroup, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, in Formula 1, ring $A_{20}$ and ring $A_{40}$ may each independently be a benzene group, a naphthalene group, a carbazole group, a fluorene group, a dibenzosilole group, a dibenzothiophene group, a dibenzofuran group, an azacarbazole group, an azafluorene group, an azadibenzosilole group, an azadibenzothiophene group, an azadibenzofuran group, a pyridine group, a pyrimidine group, a pyrazine group, a pyridazine group, a triazine group, a quinoline group, an isoquinoline group, a quinoxaline group, a quinazoline group, a 5,6,7,8-tetrahydroisoquinoline group, or a 5,6,7,8-tetrahydroquinoline group.

In one or more embodiments, in Formula 1, ring $A_{20}$ may be represented by one of Formulae A20(1) to A20(15):

A20(1)

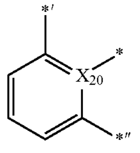

A20(2)

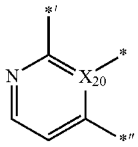

A20(3)

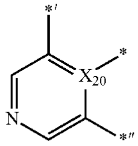

A20(4)

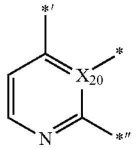

A20(5)

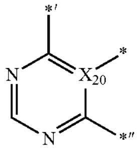

A20(6)

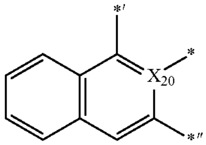

A20(7)

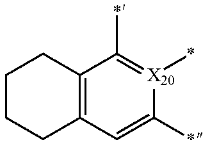

A20(8)

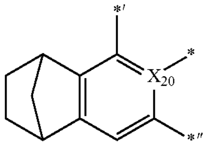

-continued

A20(9)

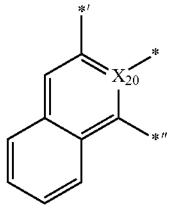

A20(10)

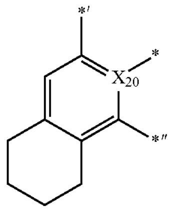

A20(11)

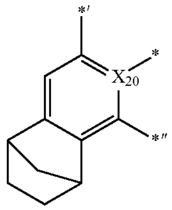

A20(12)

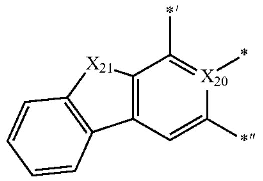

A20(13)

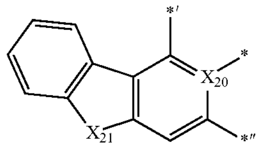

A20(14)

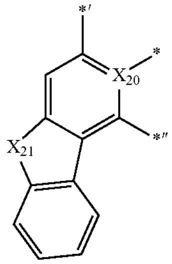

A20(15)

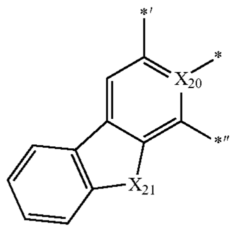

wherein, in Formulae A20(1) to A20(15), $X_{20}$ may be C or N, $X_{21}$ may be O, S, $N(R_{21})$, $C(R_{21})(R_{22})$, or $Si(R_{21})(R_{22})$, $R_{21}$ and $R_{22}$ may each be understood by referring to the description of $R_{20}$ provided herein,

* indicates a binding site to $M_1$ in Formula 1,
*' indicates a binding site to N in Formula 1, and
*" indicates a binding site to $T_1$ in Formula 1.
In one or more embodiments, in Formula 1, ring $A_{40}$ may be represented by one of Formulae A40(1) to A40(34):
A40(1)
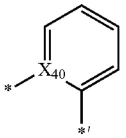
A40(2)
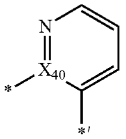
A40(3)
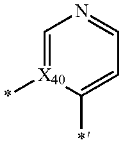
A40(4)
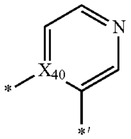
A40(5)
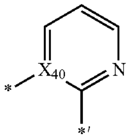
A40(6)
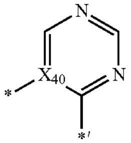
A40(7)
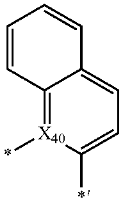
A40(8)
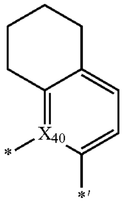
-continued
A40(9)
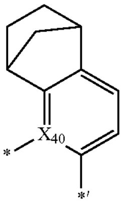
A40(10)
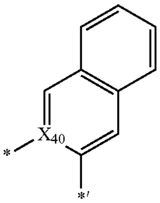
A40(11)
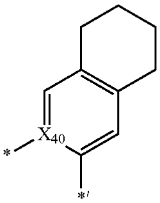
A40(12)
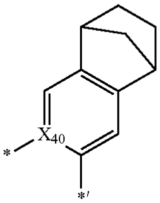
A40(13)
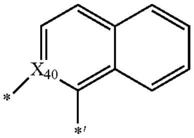
A40(14)
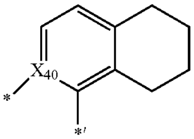
A40(15)
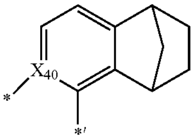
A40(16)
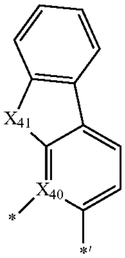

-continued
A40(17)
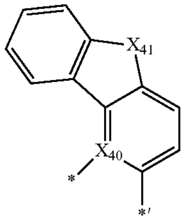
A40(18)
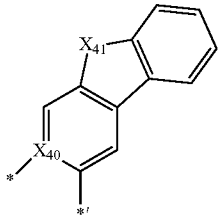
A40(19)
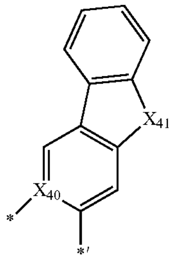
A40(20)
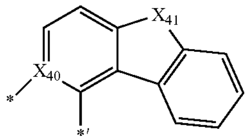
A40(21)
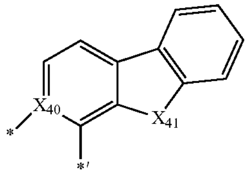
A40(22)
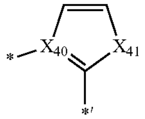
A40(23)
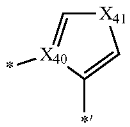
A40(24)
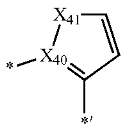
-continued
A40(25)
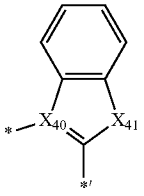
A40(26)
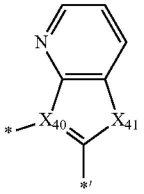
A40(27)
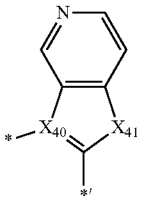
A40(28)
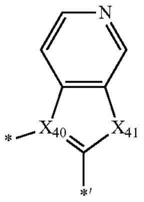
A40(29)
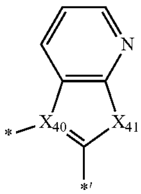
A40(30)
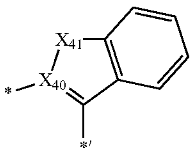
A40(31)
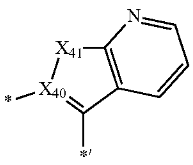
A40(32)
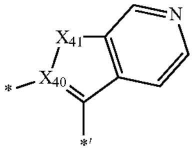

-continued

A40(33)

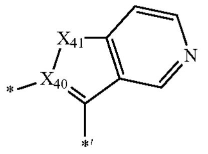

A40(34)

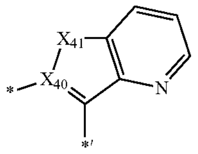

wherein, in Formulae A40(1) to A40(34), $X_{40}$ may be C or N, $X_{41}$ may be O, S, $N(R_{41})$, $C(R_{41})(R_{42})$, or $Si(R_{41})(R_{42})$, $R_{41}$ and $R_{42}$ may each be understood by referring to the description of $R_{40}$ provided herein,

* indicates a binding site to $M_1$ in Formula 1, and

*' indicates a binding site to N in Formula 1.

In Formula 1, $T_1$ is *—$N(R_{51})$—*', *—$B(R_{51})$—*', *—$P(R_{51})$—*', *—$C(R_{51})(R_{52})$—*', *—$Si(R_{51})(R_{52})$—*', *—$Ge(R_{51})(R_{52})$—*', *—S—*', *—Se—*', *—O—*', *—C(═O)—*', *—S(═O)—*', *—$S(═O)_2$—*', *—$C(R_{51})$═$C(R_{52})$—*', *—C(═S)—*', or *—C≡C—*', wherein * and *' each indicated a binding site to an adjacent atom.

In Formula 1, $R_2$ is a substituted or unsubstituted $C_1$-$C_{60}$ alkyl group or a substituted or unsubstituted $C_6$-$C_{60}$ aryl group.

In one or more embodiments, $R_2$ may be:

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, a chrysenyl group, or a combination thereof.

In one or more embodiments, a group represented by

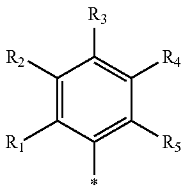

in Formula 1 may be represented by one of Formulae PH-1 to PH-16:

PH-1

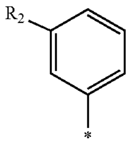

PH-2

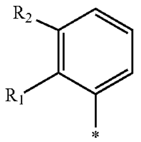

PH-3

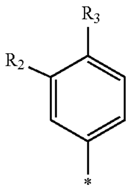

PH-4

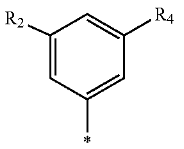

PH-5

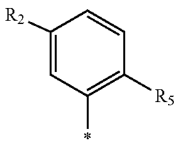

-continued

PH-6

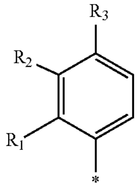

PH-7

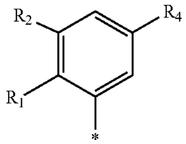

PH-8

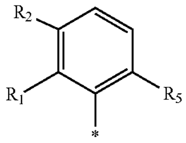

PH-9

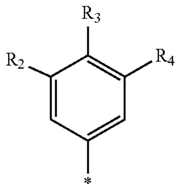

PH-10

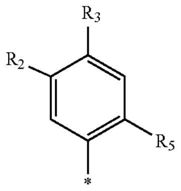

PH-11

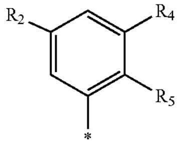

PH-12

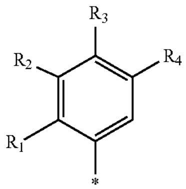

PH-13

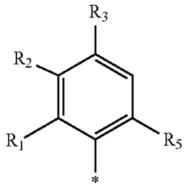

PH-14

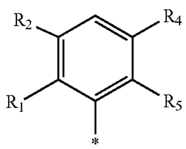

-continued

PH-15

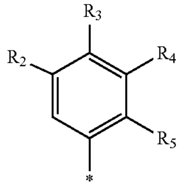

PH-16

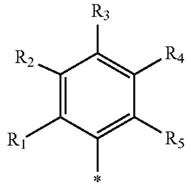

wherein in Formulae PH-1 to PH-16, $R_2$ may be understood by referring to the description of $R_2$ provided herein, $R_1$ and $R_3$ to $R_5$ may respectively be understood by referring to the descriptions of $R_1$ and $R_3$ to $R_5$ provided herein, and $R_1$ and $R_3$ to $R_5$ may each be hydrogen, and

* indicates a binding site to an adjacent atom.

In one or more embodiments, a group represented by

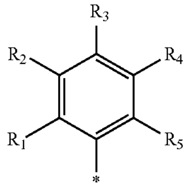

may be represented by Formula PH-1, PH-4, or PH-9, as provided hereinabove.

In one or more embodiments, in Formulae PH-1 to PH-16, $R_1$ and $R_3$ to $R_5$ may each independently be:

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, a chrysenyl group, or a combination thereof.

In one or more embodiments, in Formula 1, i) $R_4$ may be hydrogen, or ii) $R_4$ may be a substituted or unsubstituted $C_1$-$C_{60}$ alkyl group or a substituted or unsubstituted $C_6$-$C_{60}$ aryl group.

In one or more embodiments, in Formula 1, i) $R_1$ and $R_3$ to $R_5$ may each be hydrogen, ii) $R_1$, $R_3$, and $R_5$ may each be hydrogen, and $R_4$ may be:

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, a chrysenyl group, or a combination thereof, or iii) $R_1$ and $R_5$ may each be hydrogen, and $R_3$ and $R_4$ may each independently be:

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, a chrysenyl group, or a combination thereof.

In Formula 1, $R_1$, $R_3$ to $R_5$, $R_{10}$, $R_{20}$, $R_{31}$, $R_{32}$, $R_{40}$, $R_{51}$, and $R_{52}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), —P($Q_8$)($Q_9$), or —P(=O)($Q_8$)($Q_9$).

In Formula 1, two or more of $R_{10}$, $R_{20}$, $R_{31}$, $R_{32}$, $R_{40}$, $R_{51}$, and $R_{52}$ are optionally bonded to each other to form a substituted or unsubstituted $C_5$-$C_{30}$ carbocyclic group or a substituted or unsubstituted $C_1$-$C_{30}$ heterocyclic group.

In Formula 1, b10 and b32 indicate the number of $R_{10}$(s) and $R_{32}$(s), respectively, and b10 and b32 are each independently an integer from 1 to 4. When b10 is 2 or greater, at least two $R_{10}$(s) may be identical to or different from each other. When b32 is 2 or greater, at least two $R_{32}$(s) may be identical to or different from each other.

In Formula 1, b20 and b40 indicate the number of $R_{20}$(s) and $R_{40}$(s), respectively, and b20 and b40 are each an integer from 1 to 10. When b20 is 2 or greater, at least two $R_{20}$(s) may be identical to different from each other. When b40 is 2 or greater, at least two $R_{40}$(s) may be identical to different from each other.

b31 in Formula 1 indicates the number of $R_{31}$(s), and b31 is 1 or 2. When b31 is 2, two $R_{31}$(S) may be identical to or different from each other.

In one or more embodiments, $R_1$, $R_3$ to $R_5$, $R_{10}$, $R_{20}$, $R_{31}$, $R_{32}$, $R_{40}$, $R_{51}$, and $R_{52}$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group or a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, —Si($Q_{33}$)($Q_{34}$)($Q_{35}$), or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, —$Si(Q_{33})(Q_{34})(Q_{35})$ or a combination thereof; or —$Si(Q_3)(Q_4)(Q_5)$, wherein $Q_3$ to $Q_5$ and $Q_{33}$ to $Q_{35}$ may each independently be a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an iso-pentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof.

In Formula 1, at least one of:

$R_{31}$(s) in the number of b31, or $R_{32}$(s) in the number of b32 is:

—F or a cyano group;

a $C_1$-$C_{60}$ alkyl group or a $C_6$-$C_{60}$ aryl group, each substituted with at least one of —F, a cyano group, a fluorine-substituted $C_1$-$C_{10}$ alkyl group, a $C_6$-$C_{60}$ aryl group, a $C_1$-$C_{60}$ heteroaryl group, —$Si(Q_{33})(Q_{34})(Q_{35})$, or a combination thereof;

a substituted or unsubstituted $C_1$-$C_{60}$ heteroaryl group; or

—$Si(Q_3)(Q_4)(Q_5)$.

The term "fluorine-substituted $C_1$-$C_{10}$ alkyl group" as used herein refers to a $C_1$-$C_{10}$ alkyl group substituted with at least one fluorine atom (—F) or a fluorine-containing substituent group (e.g., —$CF_3$), and a fluorine-substituted $C_1$-$C_{10}$ alkyl group optionally may be further substituted with other substituent groups that are not a fluorine atom. For example, the fluorine-substituted $C_1$-$C_{10}$ alkyl group may include —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$.

In one or more embodiments, in Formula 1, at least one of:

$R_{31}$(s) in the number of b31, or $R_{32}$(s) in the number of b32 may be:

—F or a cyano group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, or a chrysenyl group, each substituted with at least one of —F, a cyano group, —$CF_3$, —$CF_2H$, —$CFH_2$, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, —$Si(Q_{33})(Q_{34})(Q_{35})$, or a combination thereof;

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, —$Si(Q_{33})(Q_{34})(Q_{35})$, or a combination thereof, or —$Si(Q_3)(Q_4)(Q_5)$, wherein $Q_3$ to $Q_5$ and $Q_{33}$ to $Q_{35}$ may each independently be a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof.

In one or more embodiments, in Formula 1, at least one of:

$R_{31}$(s) in the number of b31, or $R_{32}$(s) in the number of b32 may be:

—F or a cyano group;

a methyl group, an ethyl group, an n-propyl group, an iso-propyl group, an n-butyl group, an isobutyl group, a sec-butyl group, a tert-butyl group, a phenyl group, a naphthyl group, or a fluorenyl group, each substituted with at least one of —F, a cyano group, —$CF_3$, —$CF_2H$, —$CFH_2$, a phenyl group, a naphthyl group, a carbazolyl group, a dibenzofuranyl group, a dibenzothiophenyl group, —$Si(Q_{33})(Q_{34})(Q_{35})$, or a combination thereof;

an indolyl group, a carbazolyl group, a benzofuranyl group, a benzothiophenyl group, a benzoxazolyl group, a dibenzofuranyl group, a dibenzothiophenyl group, a benzocarbazolyl group, a dibenzocarbazolyl group, an azacarbazolyl group, an azadibenzofuranyl group, or an azadibenzothiophenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$Si(Q_{33})(Q_{34})(Q_{35})$, or a combination thereof; or —$Si(Q_3)(Q_4)(Q_5)$, wherein $Q_3$ to $Q_5$ and $Q_{33}$ to $Q_{35}$ may each independently be a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof.

In one or more embodiments, in Formula 1, at least one of:

$R_{31}$(s) in the number of b31, or $R_{32}$(s) in the number of b32 may be:

—F, a cyano group, —$CF_3$, —$CF_2H$, —$CFH_2$, —$Si(Q_3)(Q_4)(Q_5)$, or a group represented by one of Formulae 3-1 to 3-55, wherein $Q_3$ to $Q_5$ may each independently be a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof:

3-1

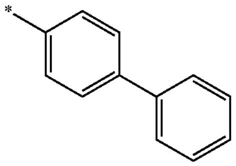

3-2

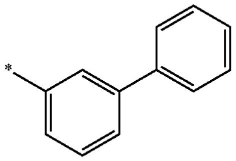

3-3

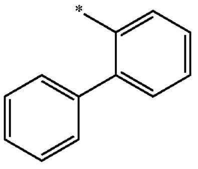

3-4

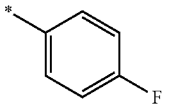

3-5

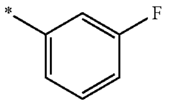

3-6

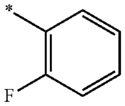

3-7

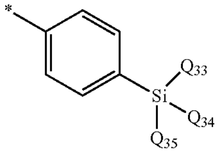

-continued
3-8
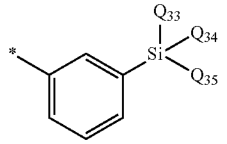
3-9
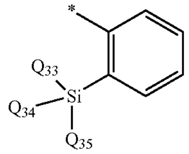
3-10
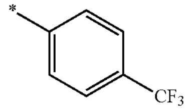
3-11
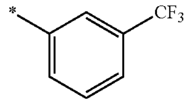
3-12
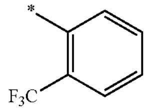
3-13
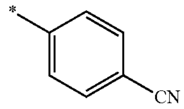
3-14
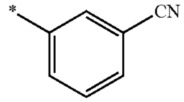
3-15
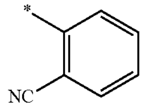
3-16
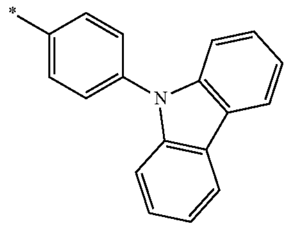
3-17
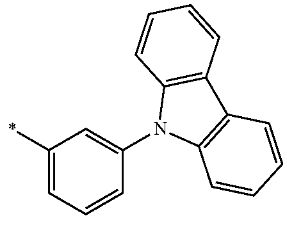
-continued
3-18
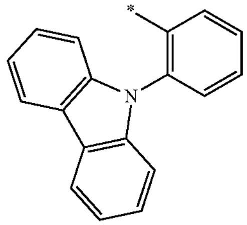
3-19
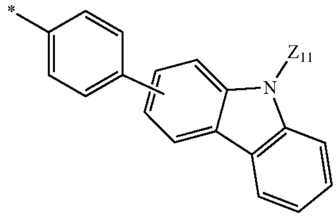
3-20
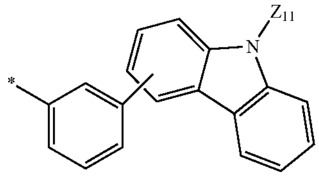
3-21
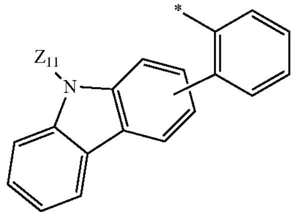
3-22
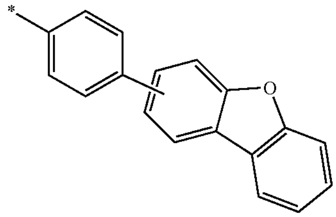
3-23
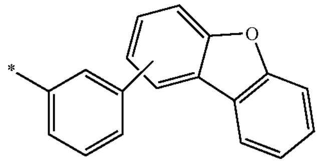
3-24
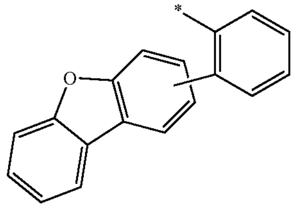

-continued
3-25
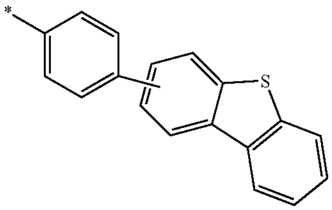
3-26
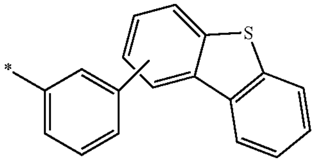
3-27
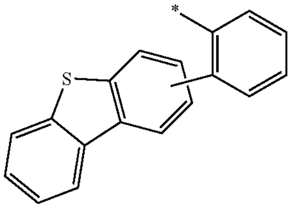
3-28
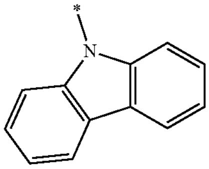
3-29
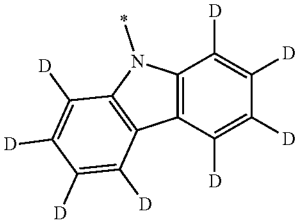
3-30
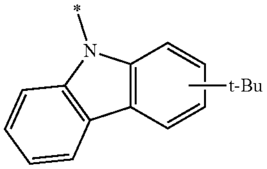
3-31
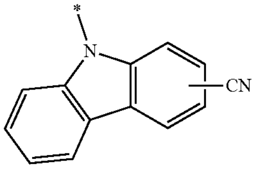
3-32
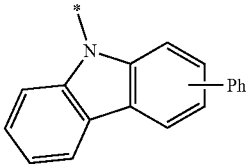
-continued
3-33
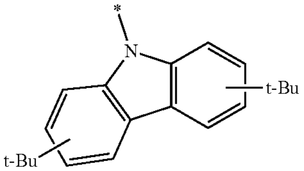
3-34
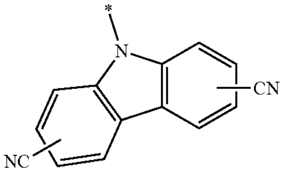
3-35
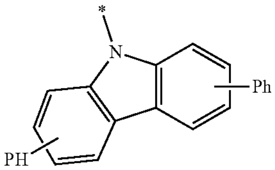
3-36
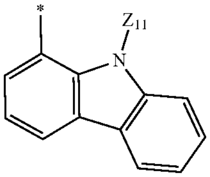
3-37
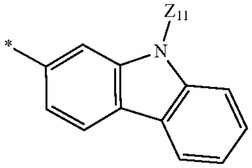
3-38
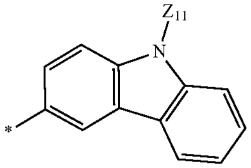
3-39
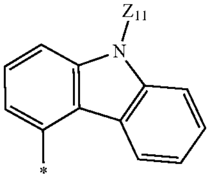
3-40
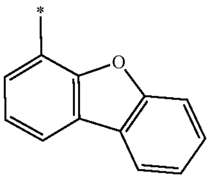
3-41
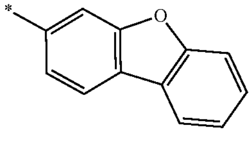

-continued 3-42

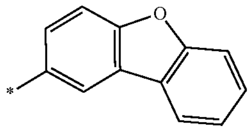

3-43

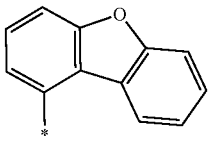

3-44

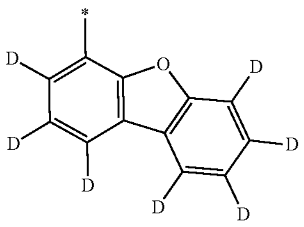

3-45

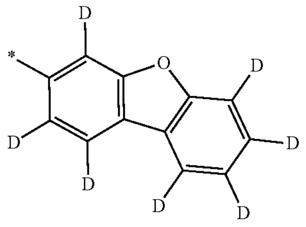

3-46

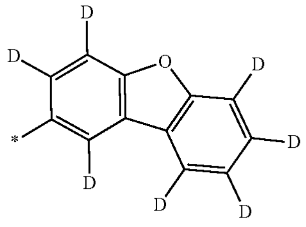

3-47

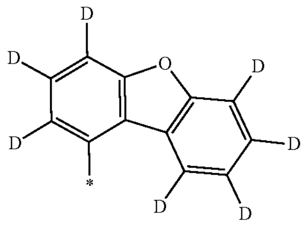

3-48

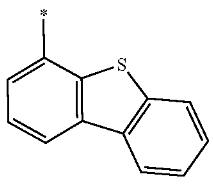

3-49

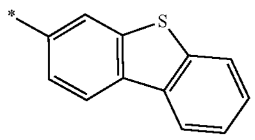

-continued 3-50

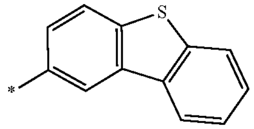

3-51

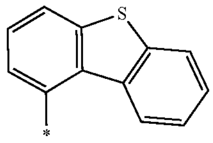

3-52

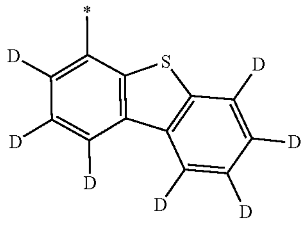

3-53

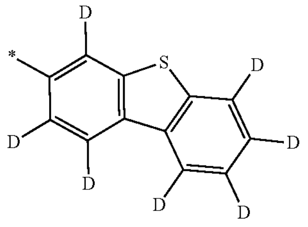

3-54

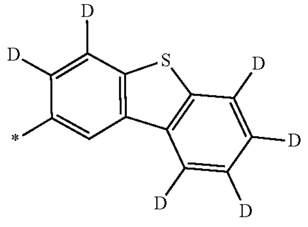

3-55

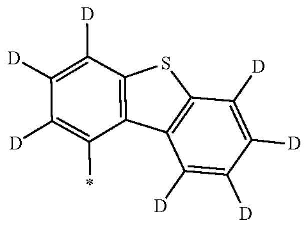

wherein, in Formulae 3-1 to 3-55, $Q_{33}$ to $Q_{35}$ and $Z_{11}$ may each independently be a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof, "t-Bu" represents a tert-butyl group, "Ph" represents a phenyl group, and

* indicates a binding site to an adjacent atom.

In one or more embodiments, in Formula 1, the sum of b31 and b32 may be 1.

In one or more embodiments, a moiety represented by

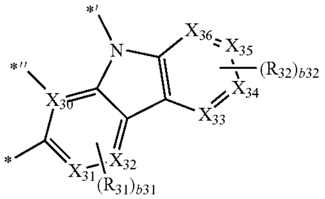

in Formula 1 may be represented by one of Formulae A30(1) to A30(6):

A30(1)

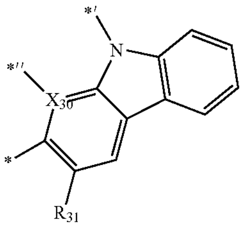

A30(2)

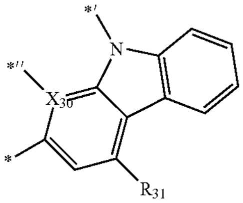

A30(3)

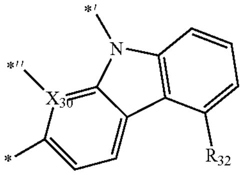

A30(4)

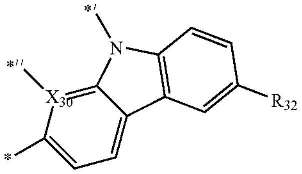

A30(5)

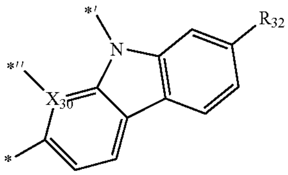

A30(6)

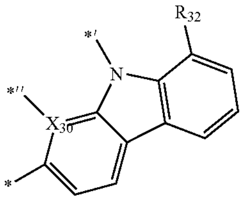

wherein, in Formulae A30(1) to A30(6), $R_{31}$ and $R_{32}$ may each independently be:

—F or a cyano group;

a $C_1$-$C_{60}$ alkyl group or a $C_6$-$C_{60}$ aryl group, each substituted with at least one of —F, a cyano group, a fluorine-substituted $C_1$-$C_{10}$ alkyl group, a $C_6$-$C_{60}$ aryl group, a $C_1$-$C_{60}$ heteroaryl group, —Si($Q_{33}$)($Q_{34}$)($Q_{35}$), or a combination thereof;

a substituted or unsubstituted $C_1$-$C_{60}$ heteroaryl group; or

—Si($Q_3$)($Q_4$)($Q_5$), wherein $X_{30}$, $Q_3$ to $Q_5$, and $Q_{33}$ to $Q_{35}$ may respectively be understood by referring to the descriptions of $X_{30}$, $Q_3$ to $Q_5$, and $Q_{33}$ to $Q_{35}$ provided herein,

* and *' each indicate a binding site to an adjacent atom, and

*" indicates a binding site to $M_1$.

In one or more embodiments, an organometallic compound may be represented by Formula 1A:

Formula 1A

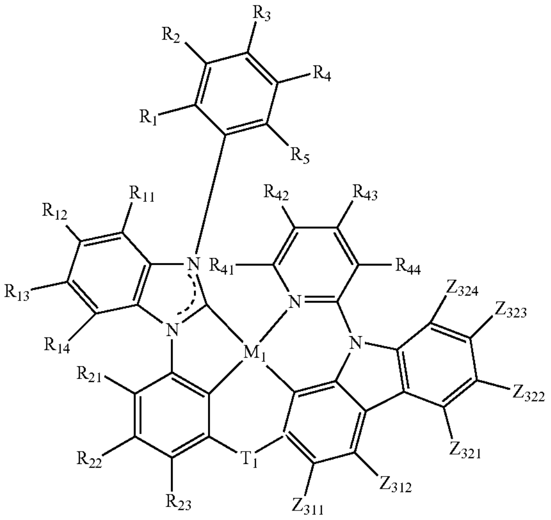

wherein, in Formula 1A, $M_1$, $T_1$, and $R_1$ to $R_5$ may respectively be understood by referring to the descriptions of $M_1$, $T_1$, and $R_1$ to $R_5$ in Formula 1, $R_{11}$ to $R_{14}$ may each independently be understood by referring to the description of $R_{10}$ in Formula 1, $R_{21}$ to $R_{23}$ may each independently be understood by referring to the description of $R_{20}$ in Formula 1, $Z_{311}$ and $Z_{312}$ may each independently be understood by referring to the description of $R_{31}$ in Formula 1, $Z_{321}$ to $Z_{324}$ may each independently be understood by referring to the description of $R_{32}$ in Formula 1, $R_{41}$ to $R_{44}$ may each independently be understood by referring to the description of $R_{40}$ in Formula 1, and at least one of $Z_{311}$, $Z_{312}$, and $Z_{321}$ to $Z_{324}$ may be:

—F or a cyano group;

a $C_1$-$C_{60}$ alkyl group or a $C_6$-$C_{60}$ aryl group, each substituted with at least one of —F, a cyano group, a fluorine-substituted $C_1$-$C_{10}$ alkyl group, a $C_6$-$C_{60}$ aryl group, a $C_1$-$C_{60}$ heteroaryl group, —Si($Q_{33}$)($Q_{34}$)($Q_{35}$), or a combination thereof;

a substituted or unsubstituted $C_1$-$C_{60}$ heteroaryl group; or

—Si($Q_3$)($Q_4$)($Q_5$).

For example, in Formula 1A, $T_1$ may be *—N($R_{51}$)—*', *—B($R_{51}$)—*', *—C($R_{51}$)($R_{52}$)—*', *—Si($R_{51}$)($R_{52}$)—*', *—Ge($R_{51}$)($R_{52}$)—*', *—S—*', or *—O—*', wherein * and *' each indicate a binding site to an adjacent atom.

In one or more embodiments, in Formula 1A, $R_{43}$ may not be hydrogen. For example, in Formula 1A, $R_{43}$ may be a substituted or unsubstituted $C_1$-$C_{60}$ alkyl group or a substituted or unsubstituted $C_6$-$C_{60}$ aryl group. $R_{43}$ may be identical to or different from $R_2$.

In one or more embodiments, in Formula 1A, $R_{43}$ may be:

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, a chrysenyl group, or a combination thereof.

In the present specification, a substituent of each of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, the substituted monovalent non-aromatic condensed heteropolycyclic group, the substituted $C_5$-$C_{30}$ carbocyclic group, and the substituted $C_1$-$C_{30}$ heterocyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P($Q_{18}$)($Q_{19}$), —P(═O)($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(Q_{28})(Q_{29})$, —$P(=O)(Q_{28})(Q_{29})$, or a combination thereof;

—$N(Q_{31})(Q_{32})$, —$Si(Q_{33})(Q_{34})(Q_{35})$, —$B(Q_{36})(Q_{37})$, —$P(Q_{38})(Q_{39})$, or —$P(=O)(Q_{38})(Q_{39})$; or a combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a $C_2$-$C_{60}$ substituted or unsubstituted alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

In one or more embodiments, the organometallic compound may be one or more of Compounds 1 to 308, but embodiments are not limited thereto:

1

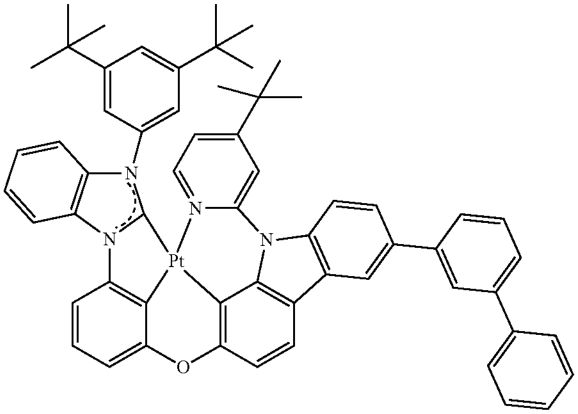

2

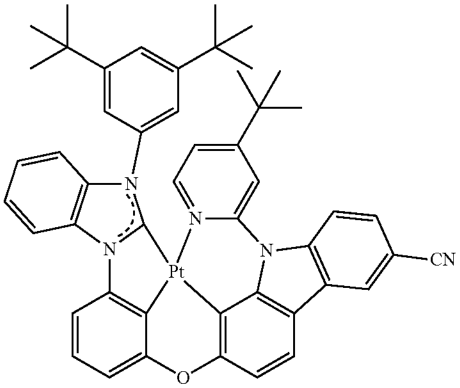

-continued
3
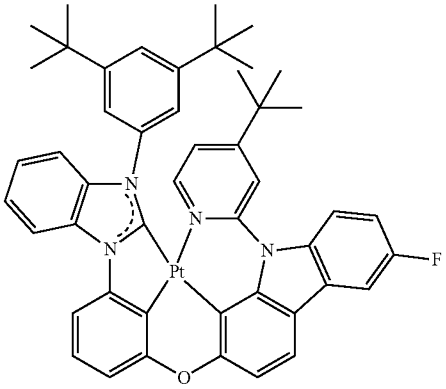
4
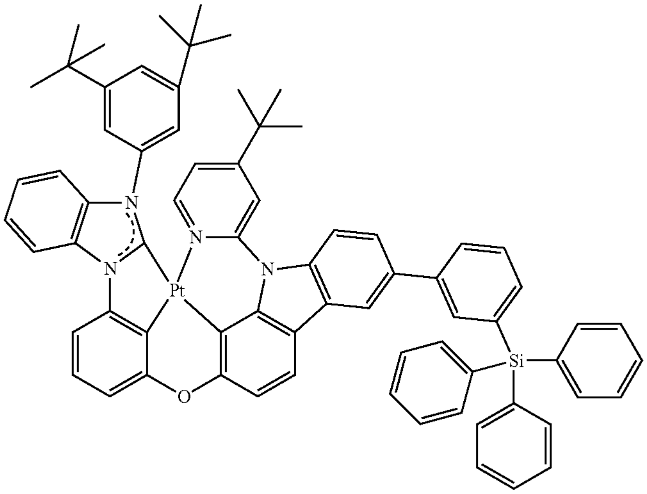
5
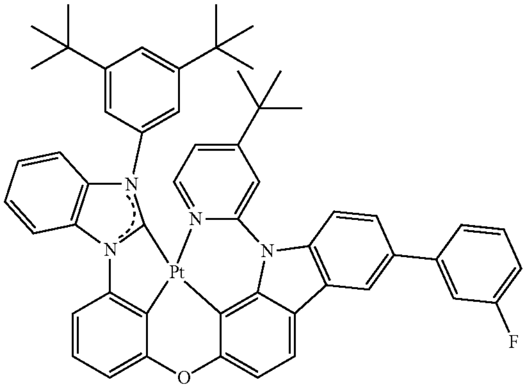

-continued
6
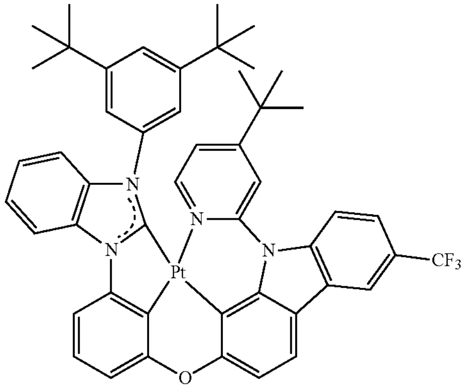
7
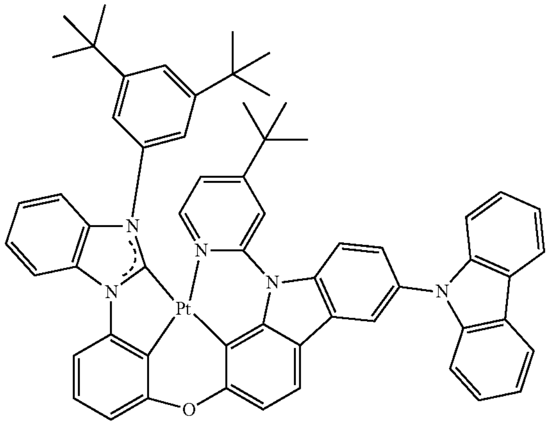
8
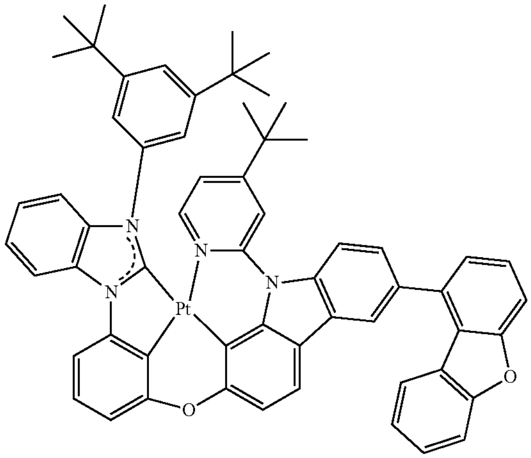

-continued
9
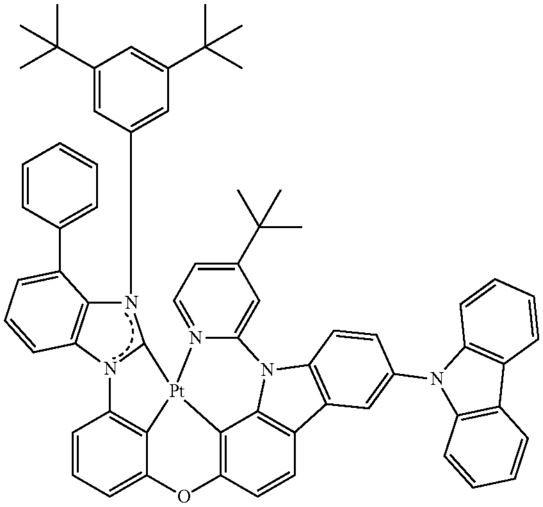
10
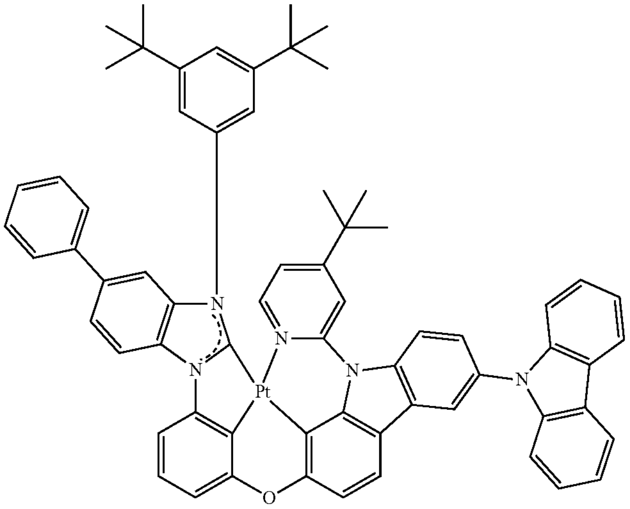
11
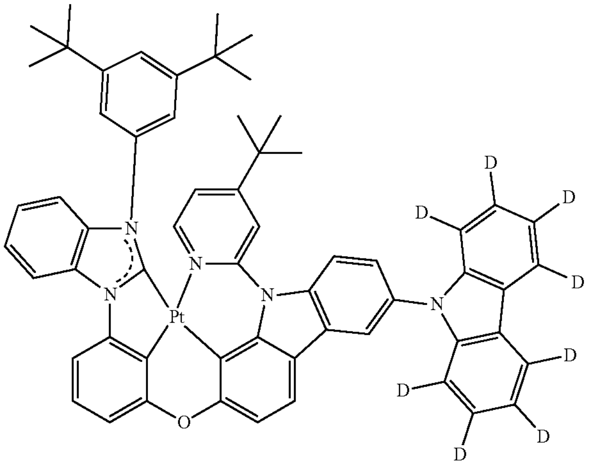

-continued
12
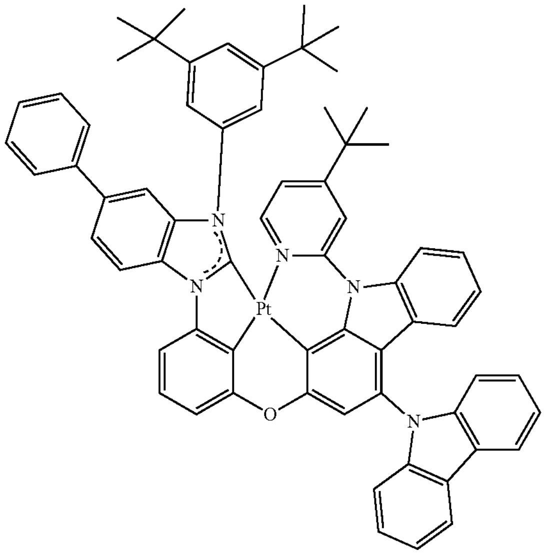
13
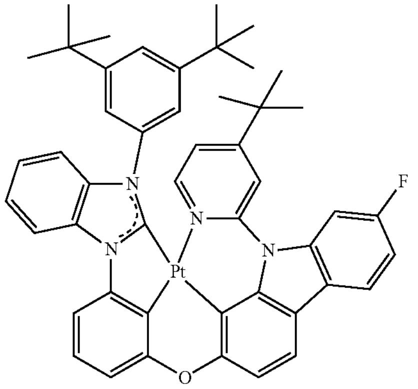
14
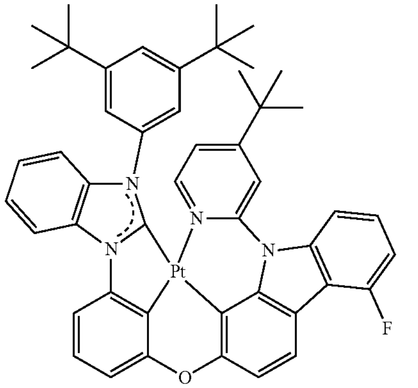

-continued
15
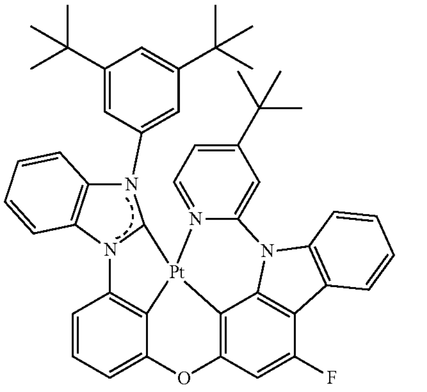
16
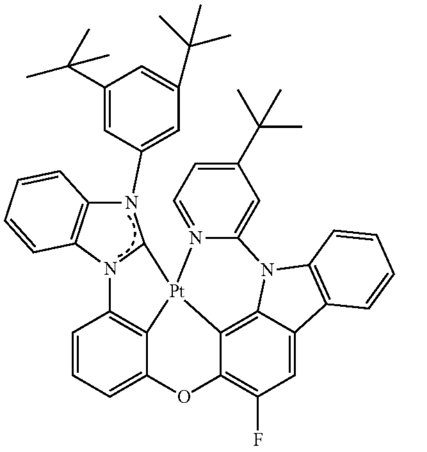
17
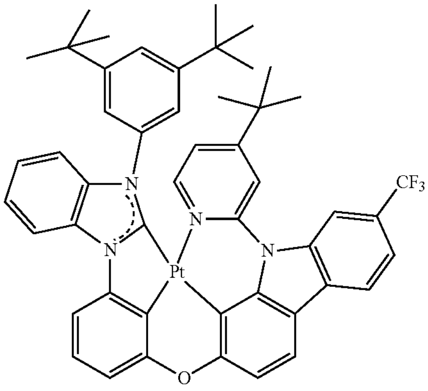
18
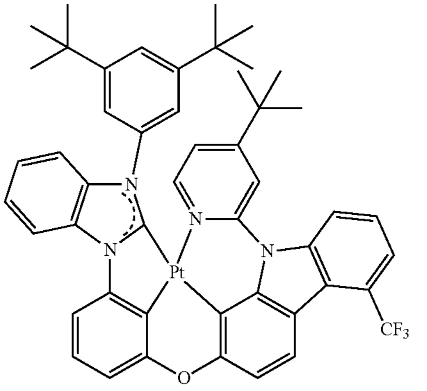

-continued
19
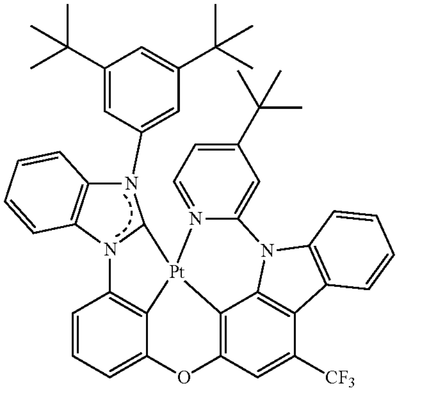
20
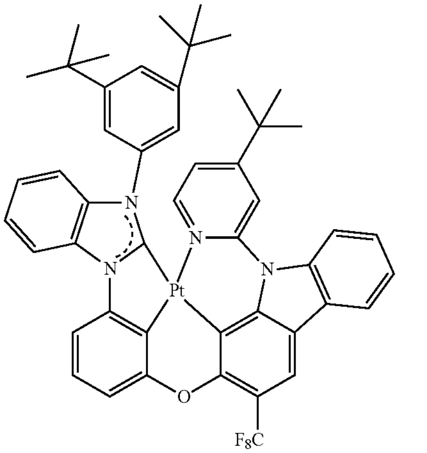
21
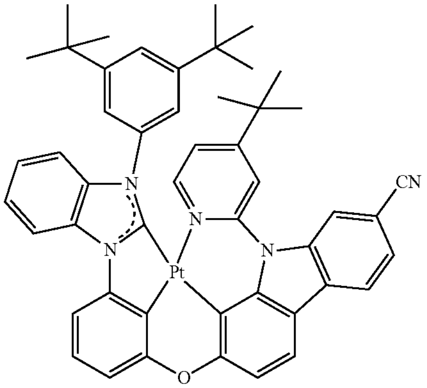
22
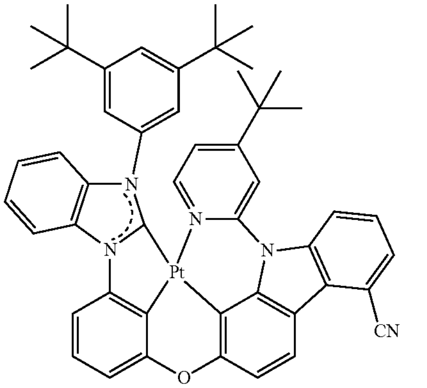

-continued
23
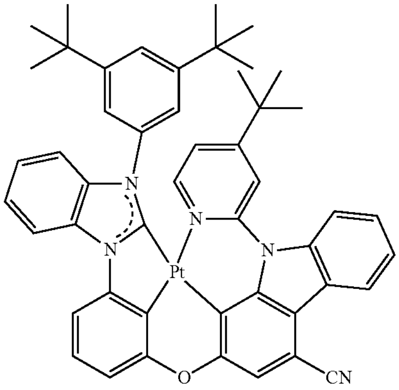
24
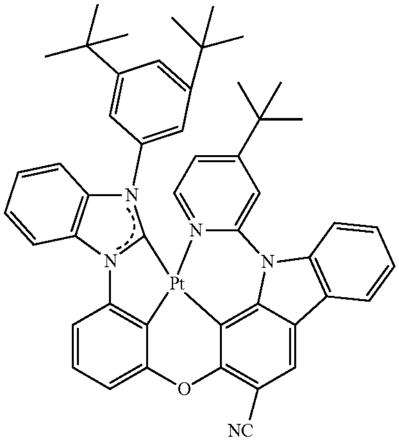
25
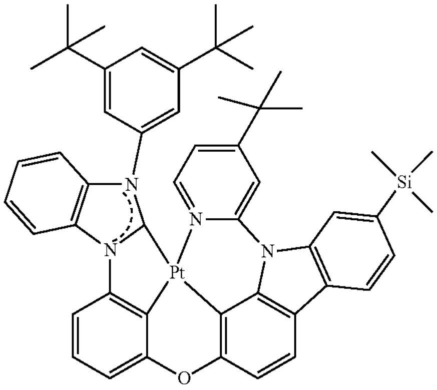
26
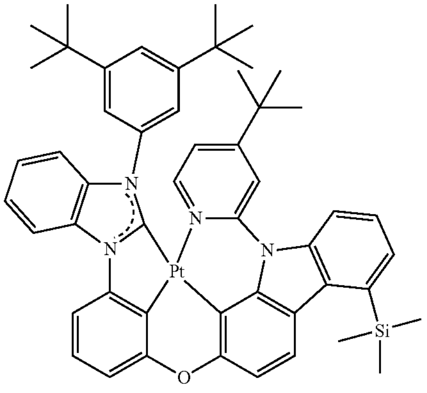

-continued
27
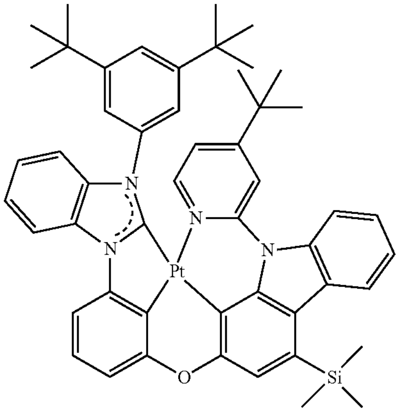
28
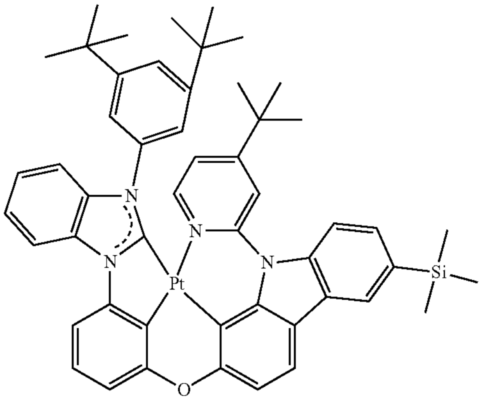
29
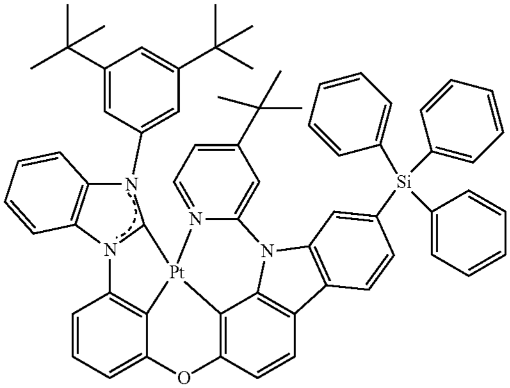
30
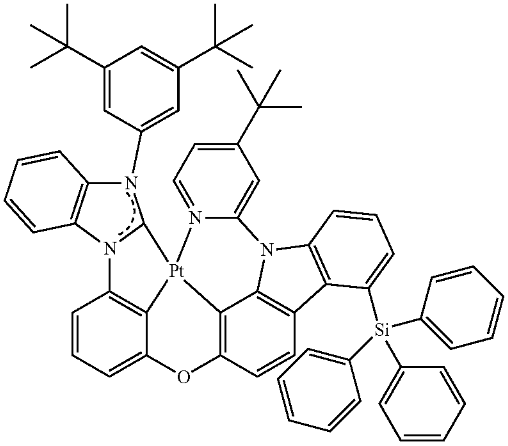

-continued
31
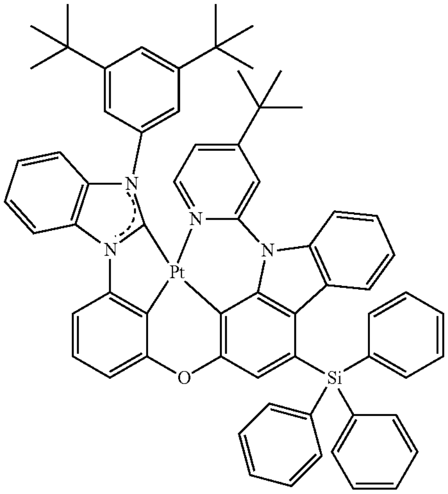
32
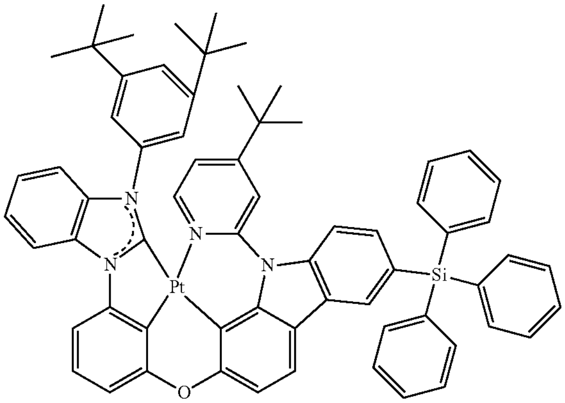
33
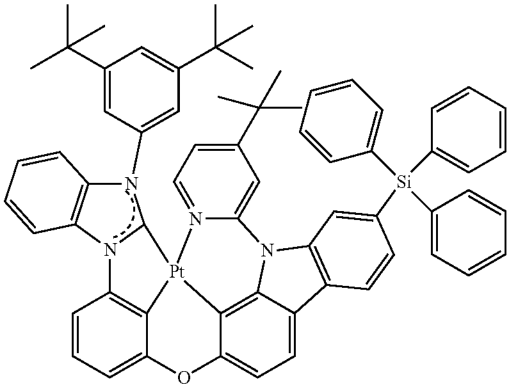

-continued
34
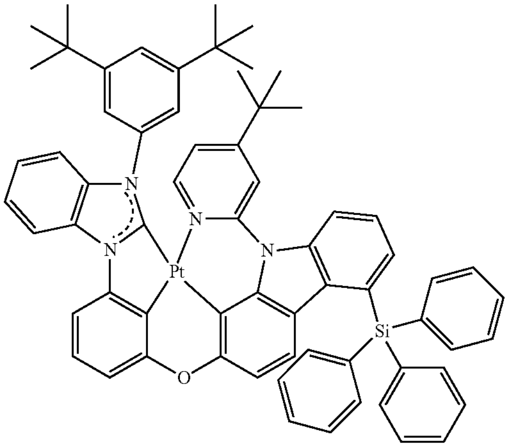
35
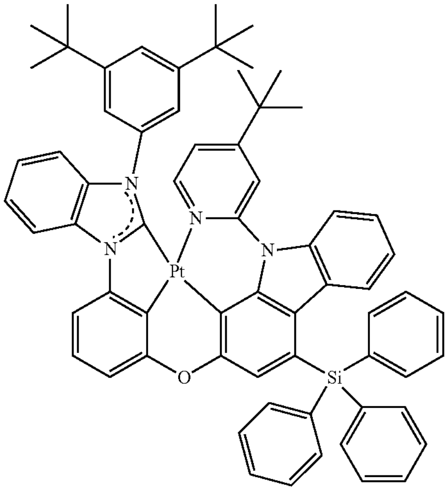
36
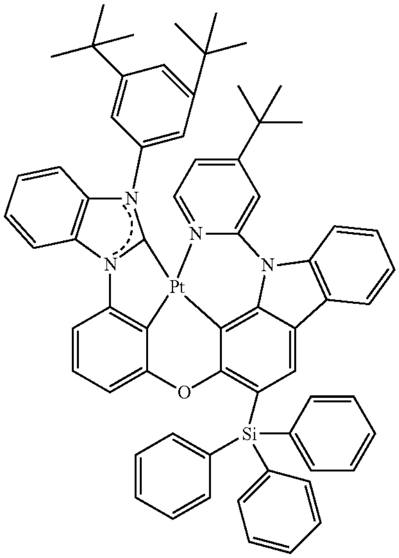

-continued
37
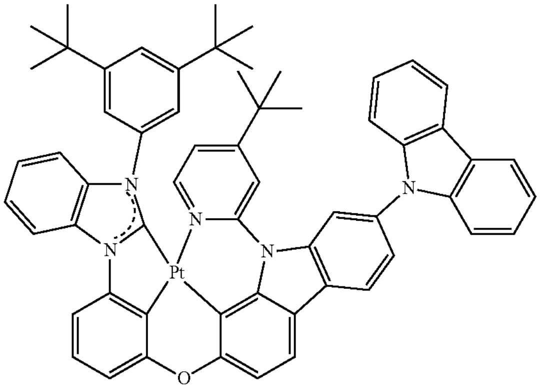
38
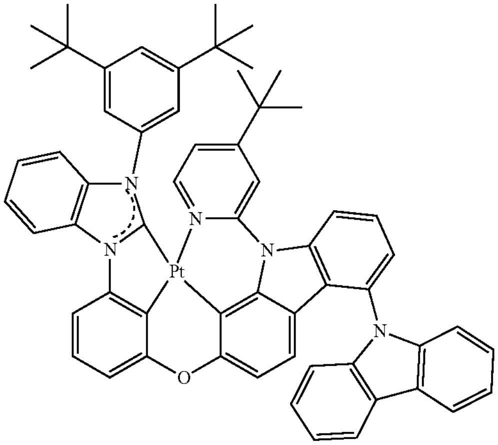
39
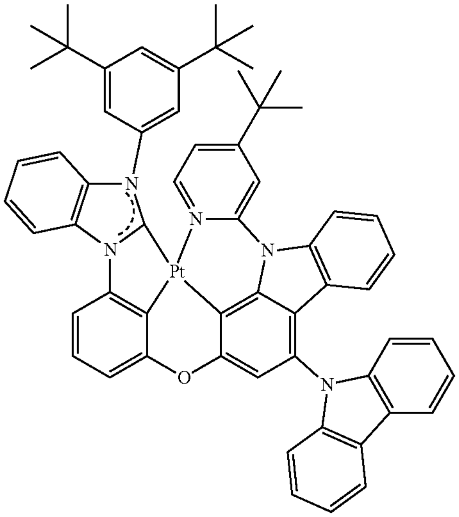

-continued
40
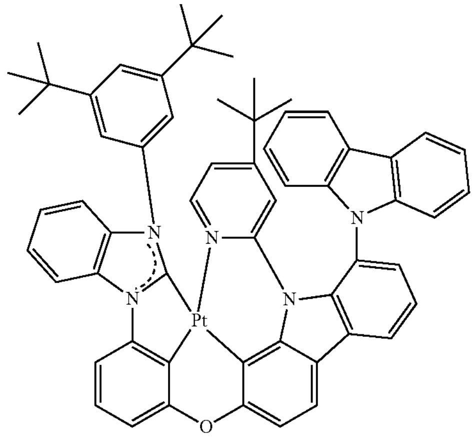
41
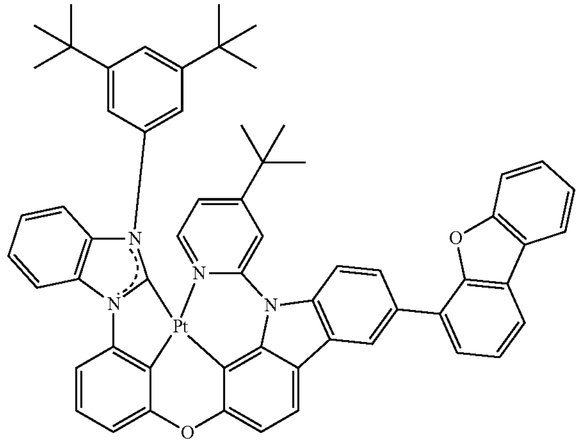
42
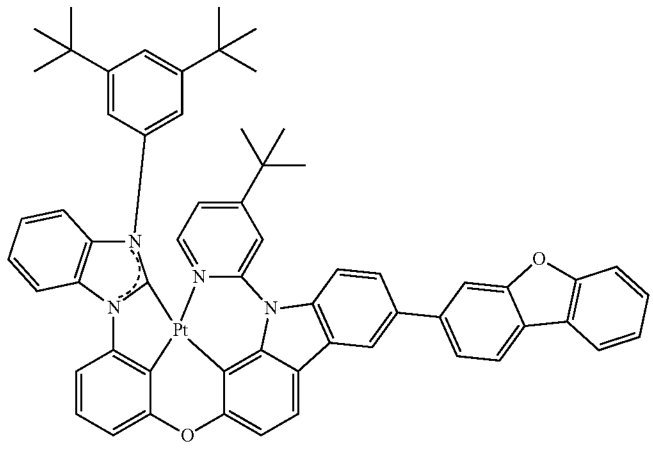

-continued
43
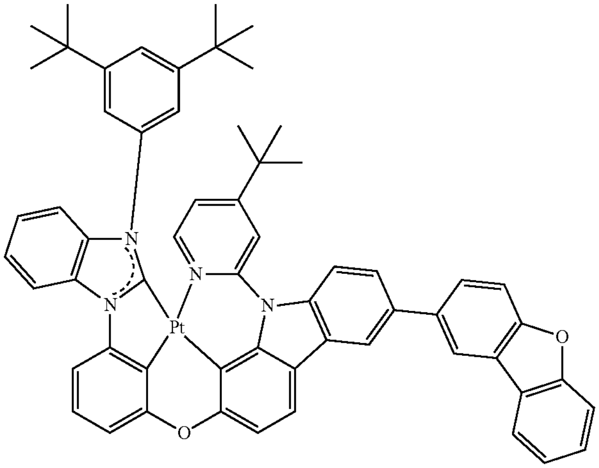
44
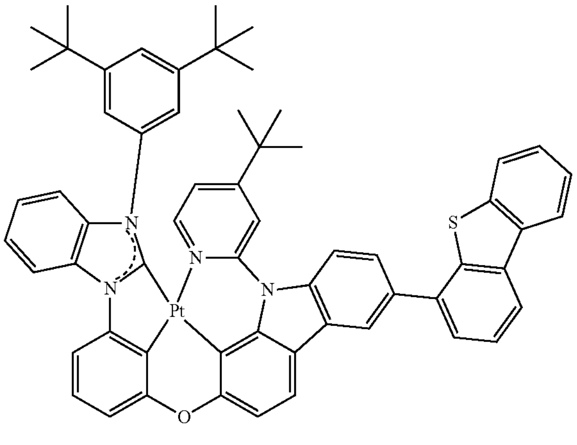
45
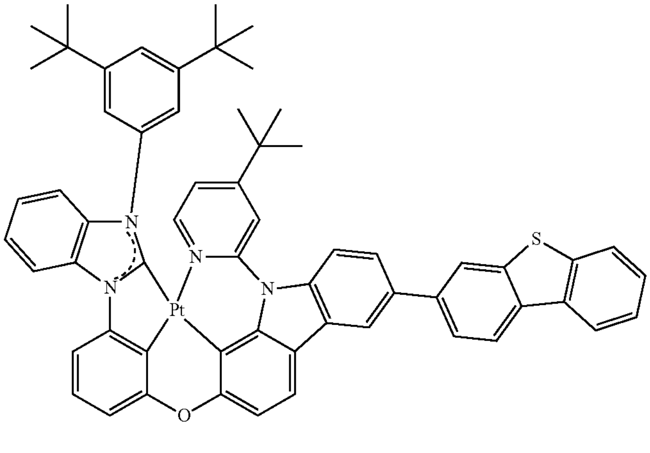

-continued
46
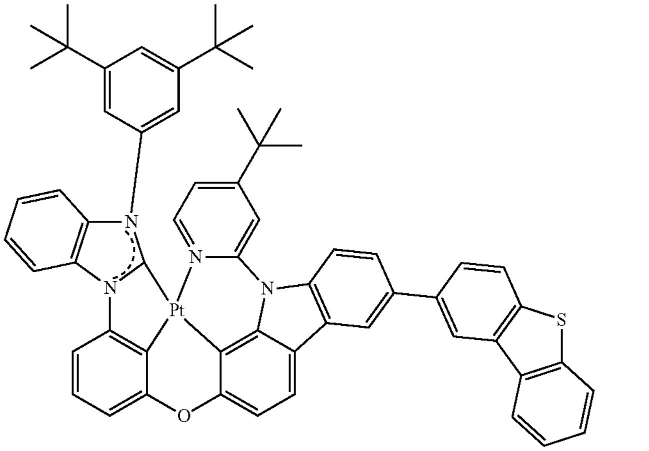
47
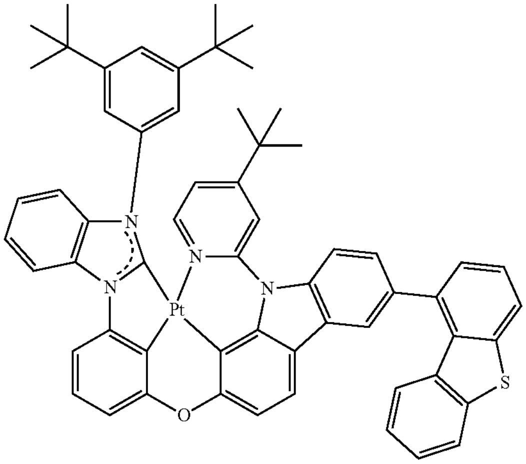
48
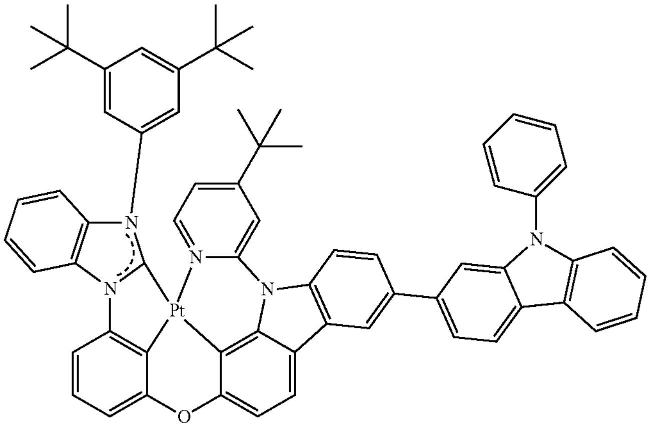

-continued
49
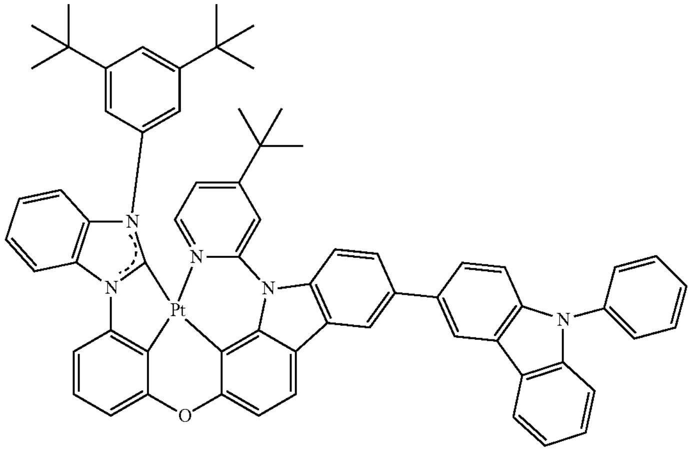
50
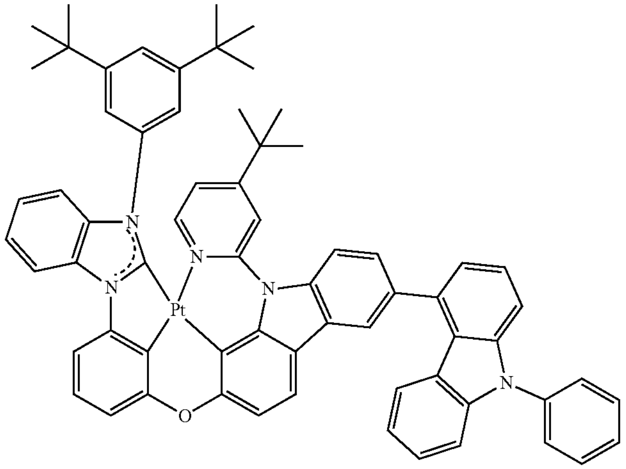
51
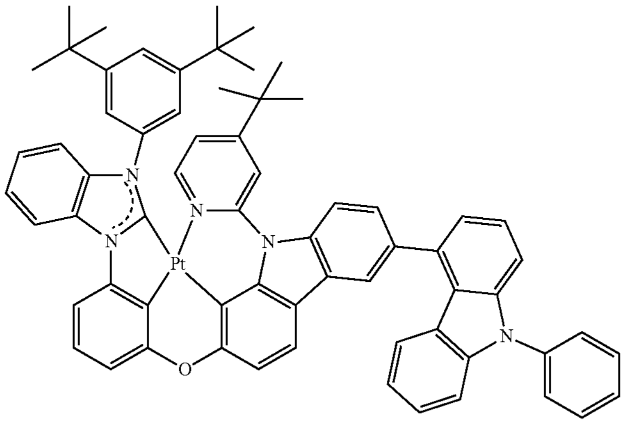

-continued
52
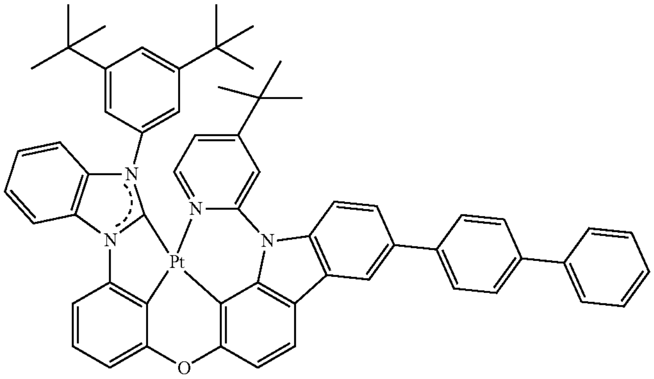
53
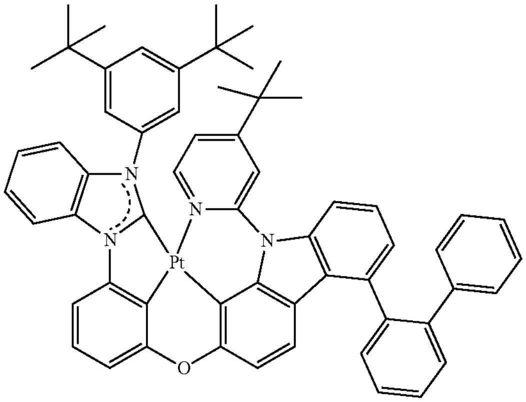
54
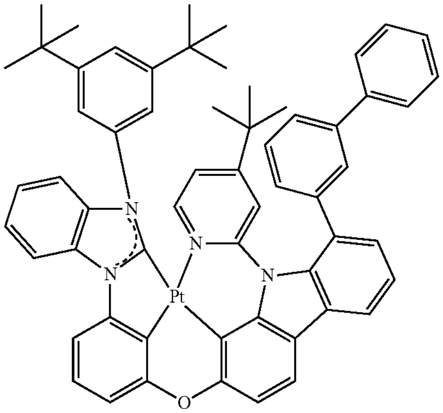
55
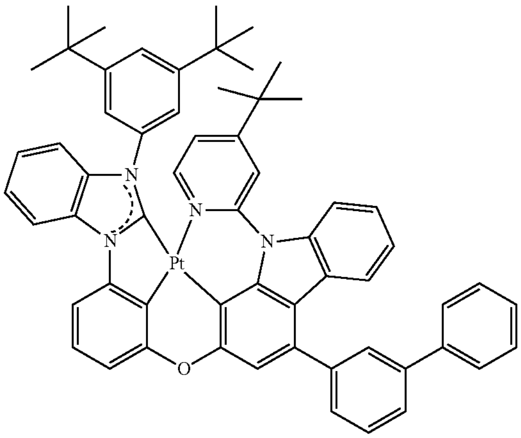

-continued
56
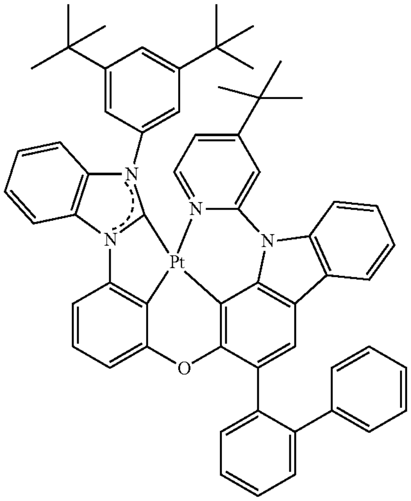
57
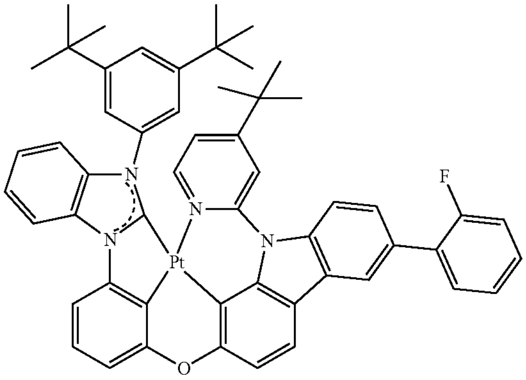
58
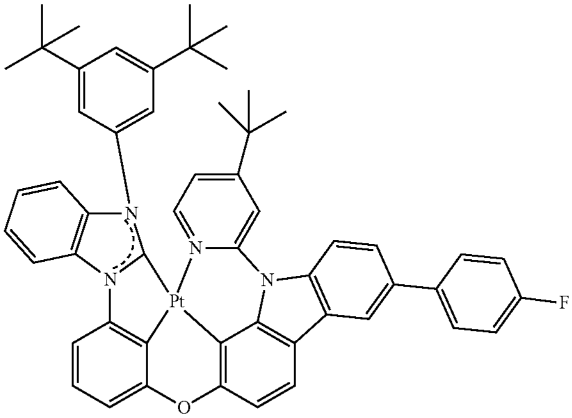

-continued
59
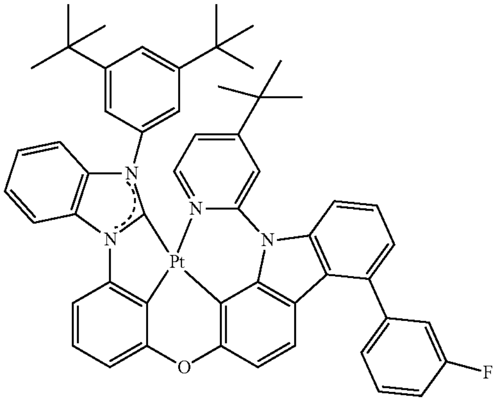
60
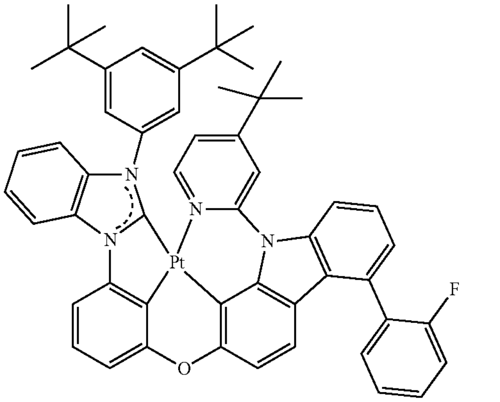
61
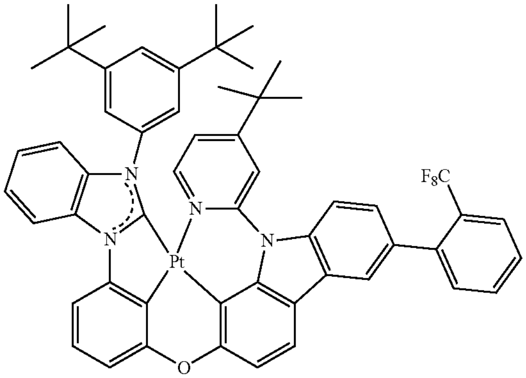
62
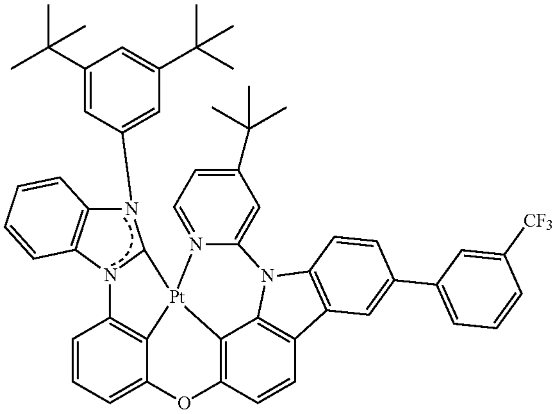

-continued
63
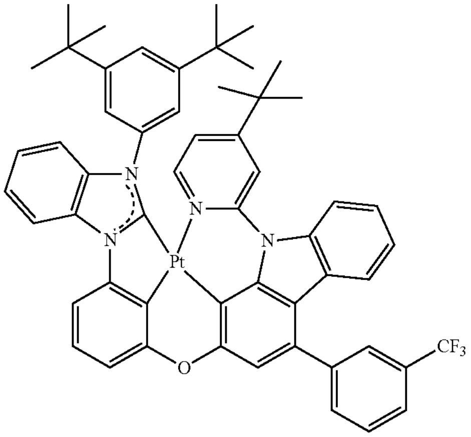
64
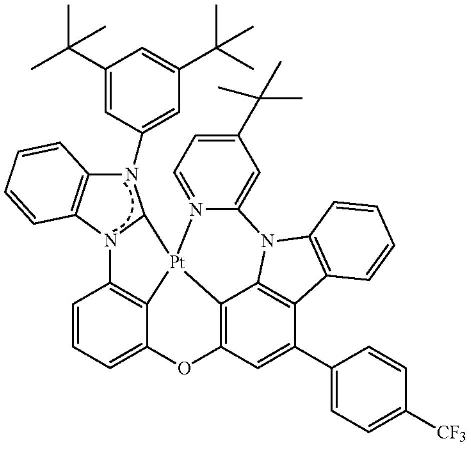
65
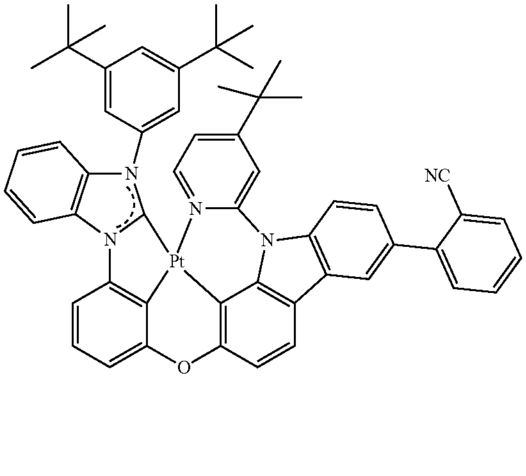

-continued
66
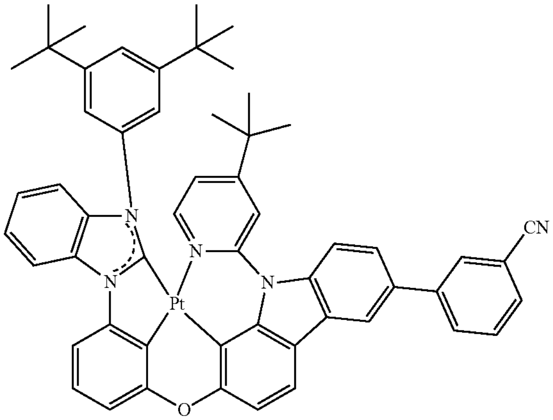
67
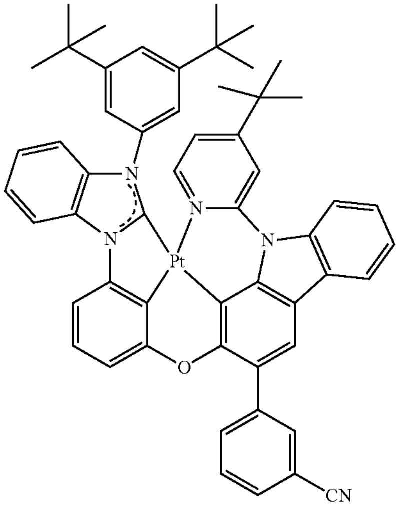
68
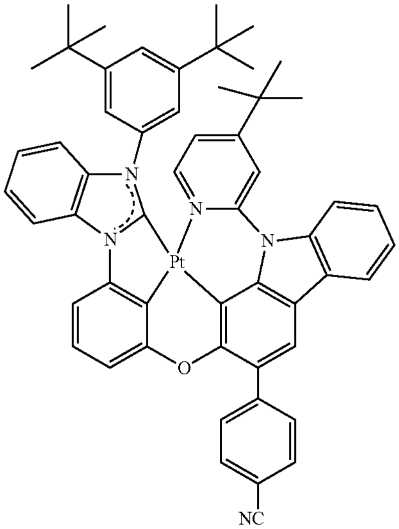

-continued
69
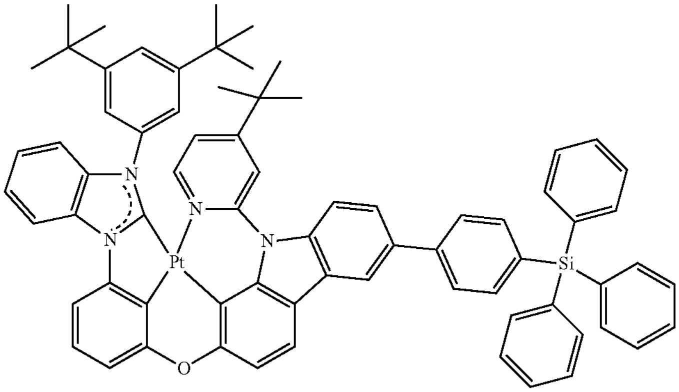
70
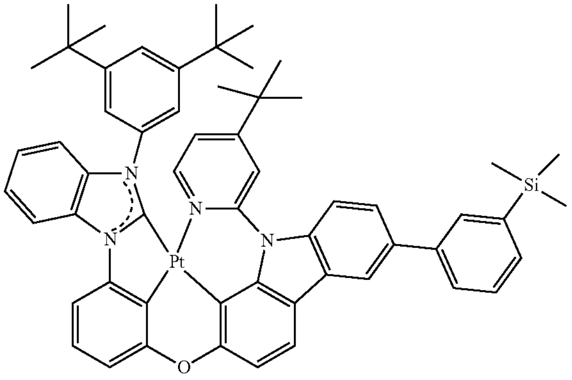
71
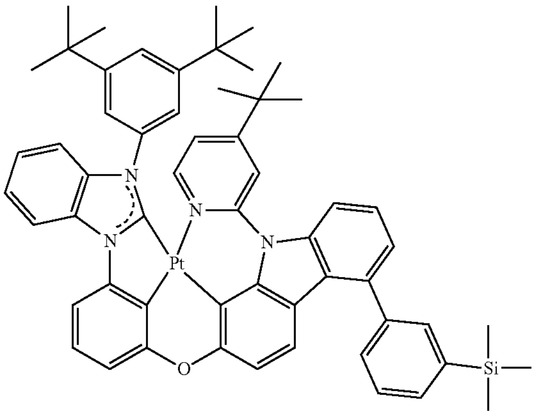

-continued
72
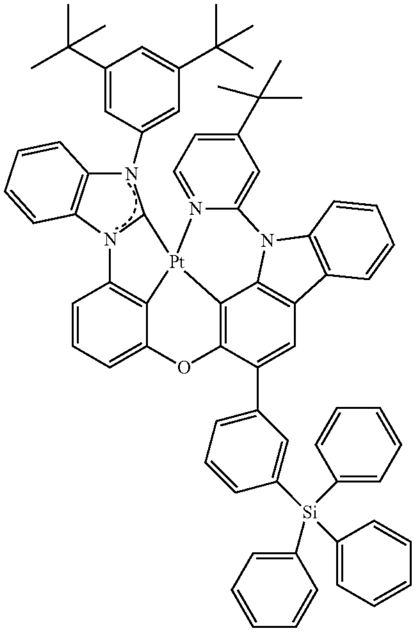
73
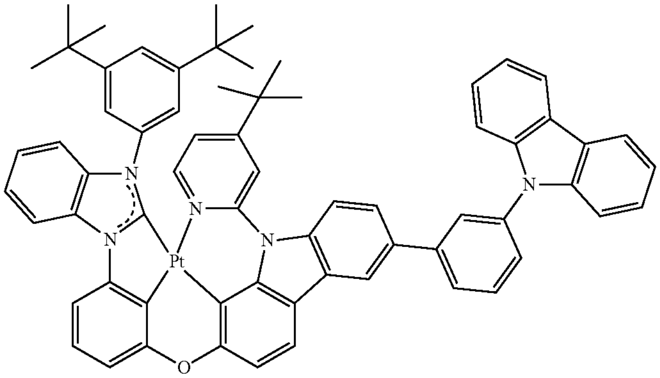
74
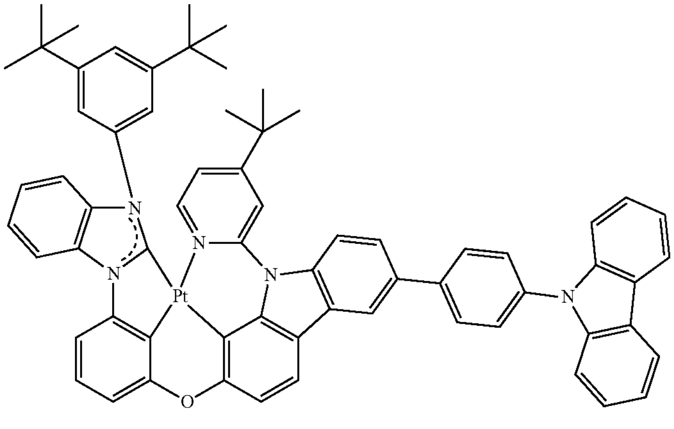

-continued
75
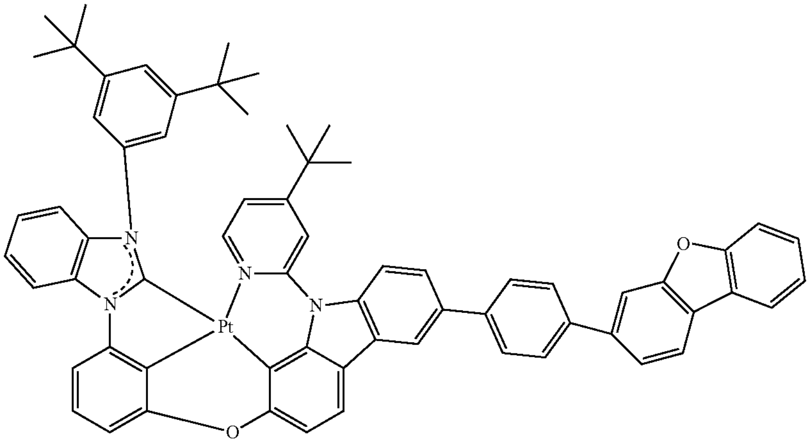
76
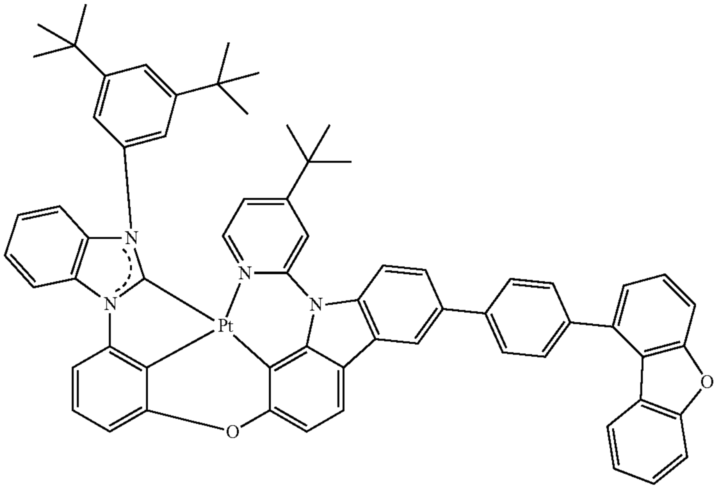
77
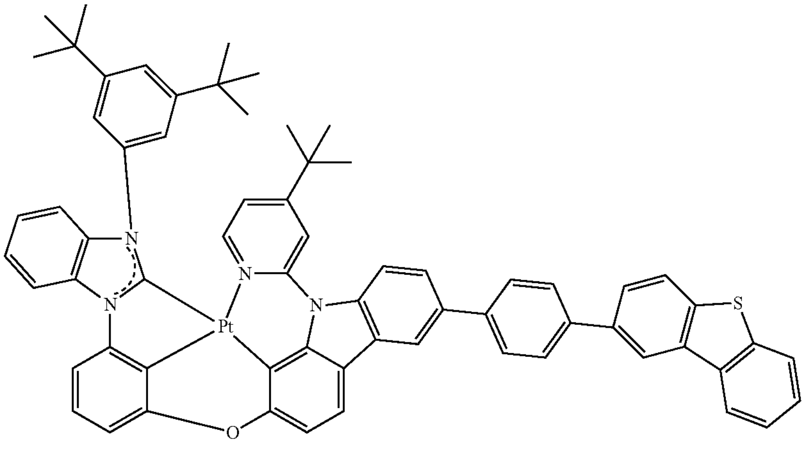

-continued
78
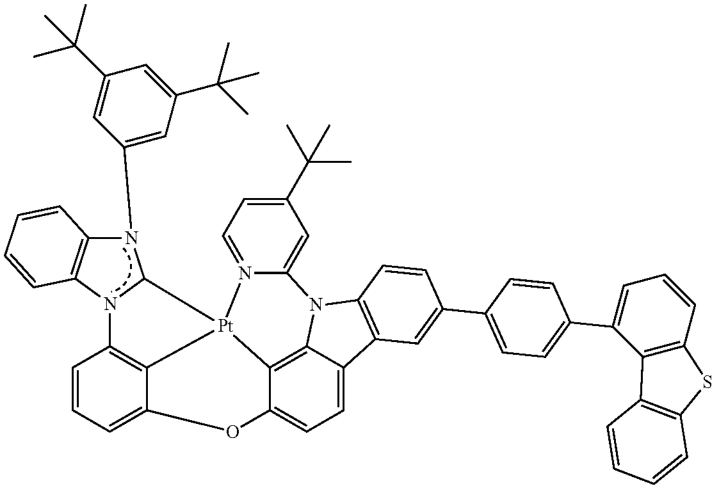
79
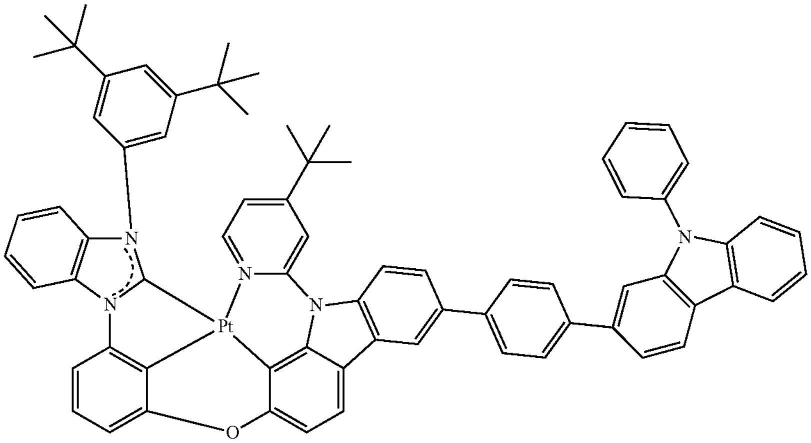
80
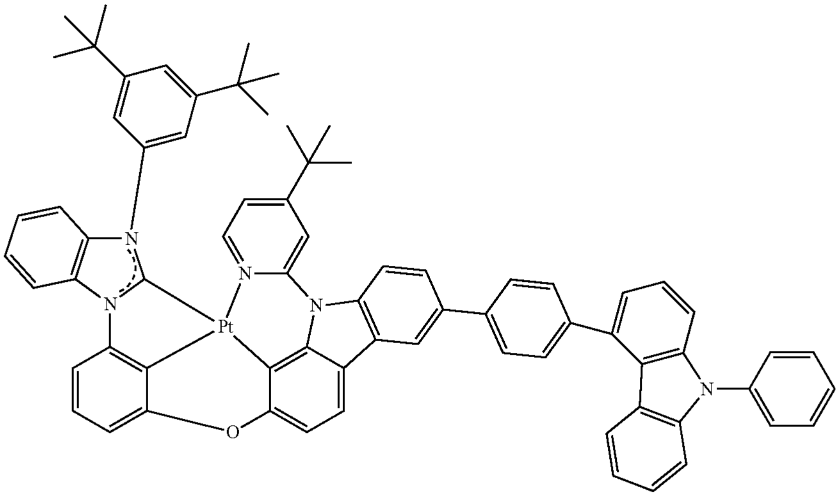

-continued
81
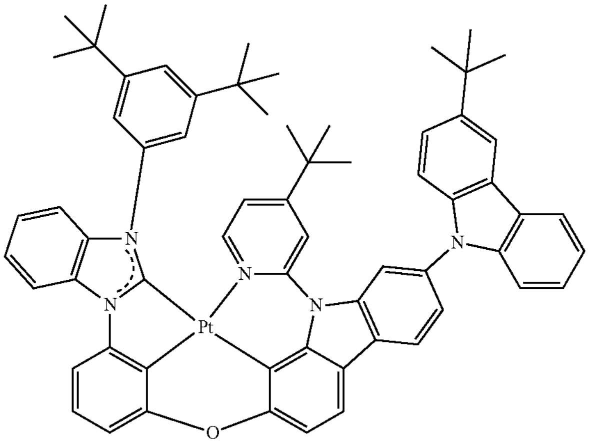
82
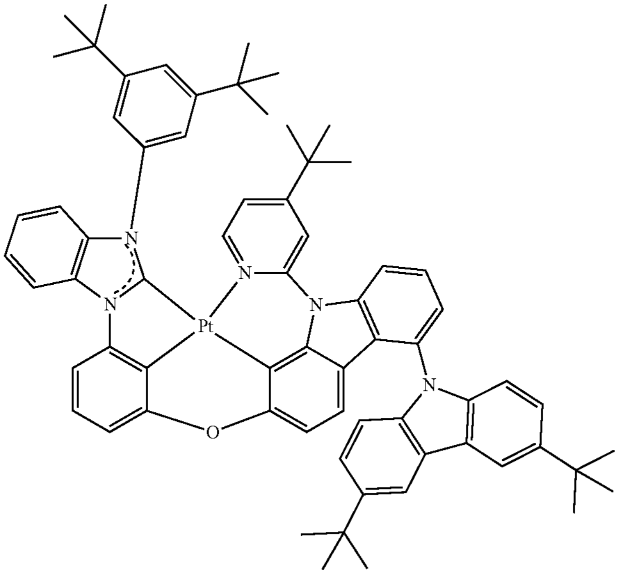
83
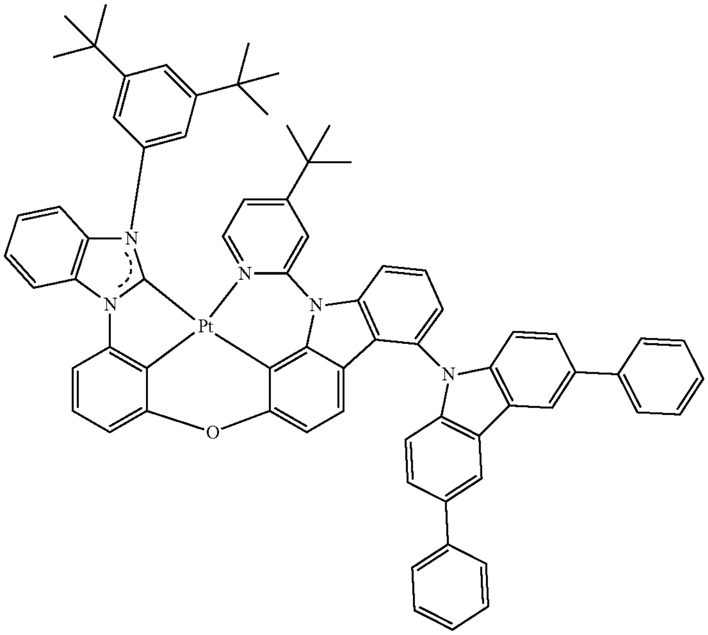

-continued
84
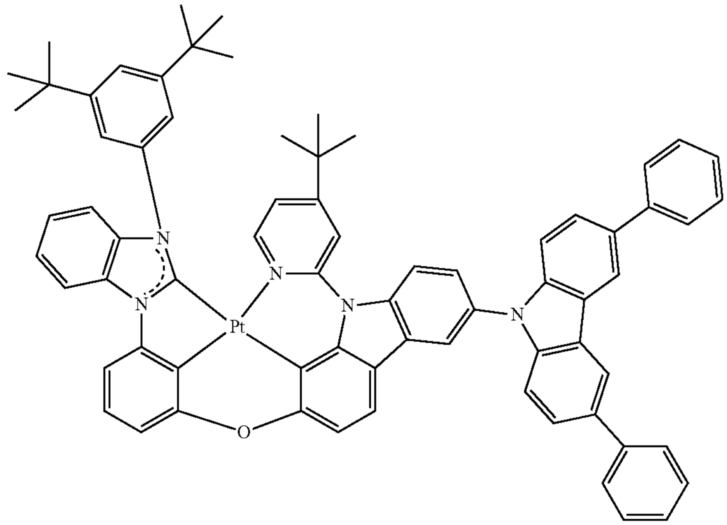
85
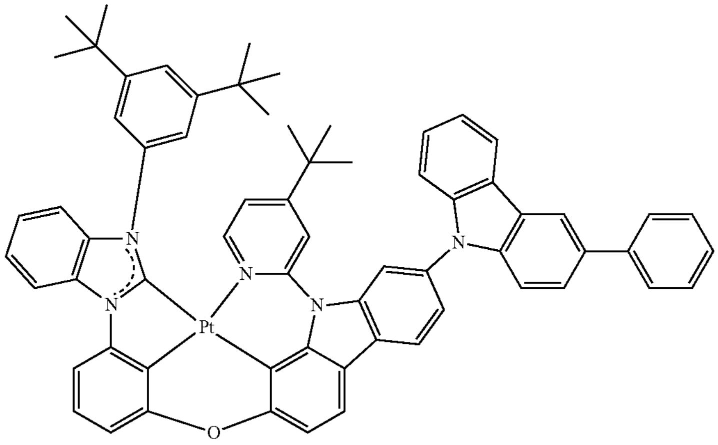
86
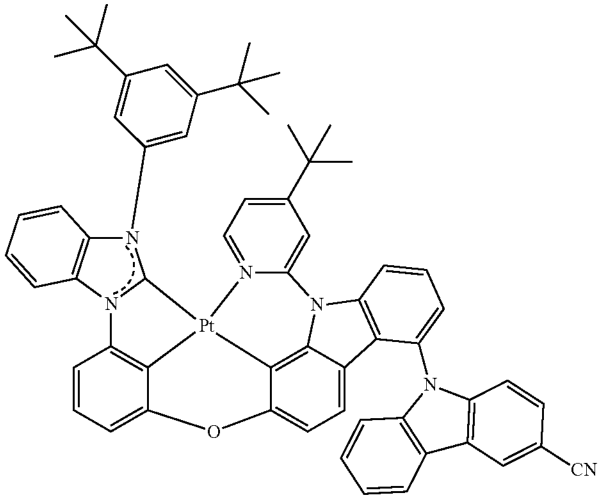

-continued
87
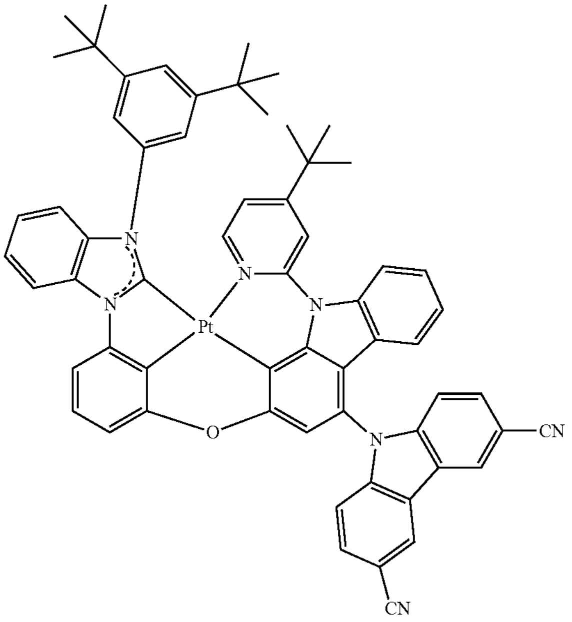
88
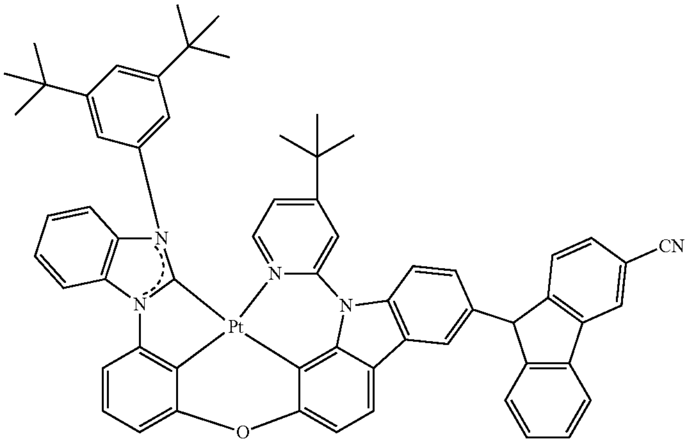
89
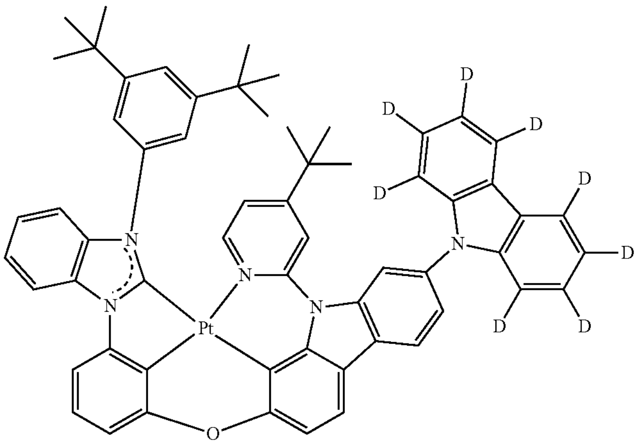

-continued
90
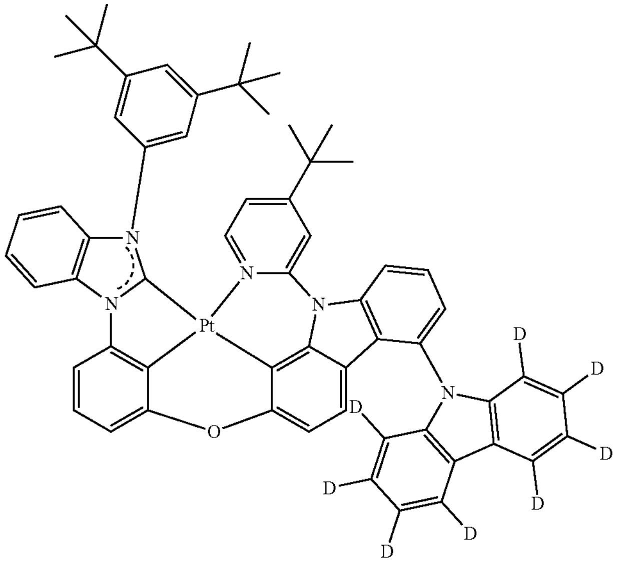
91
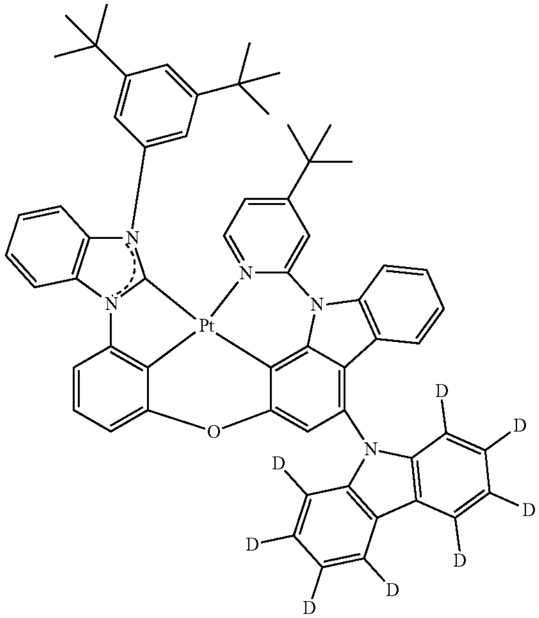

-continued
92
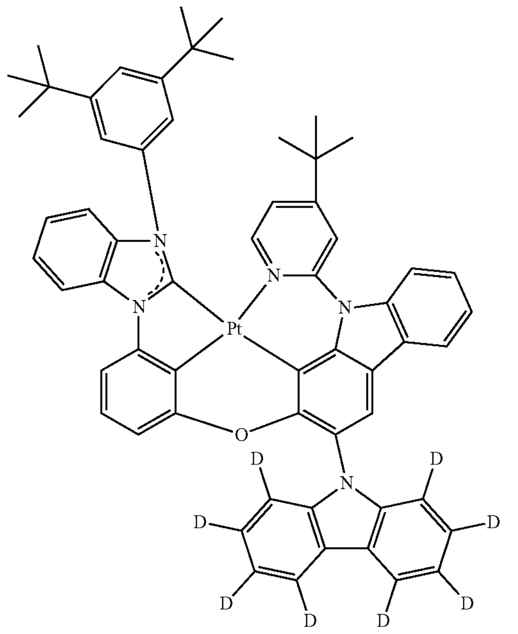
93
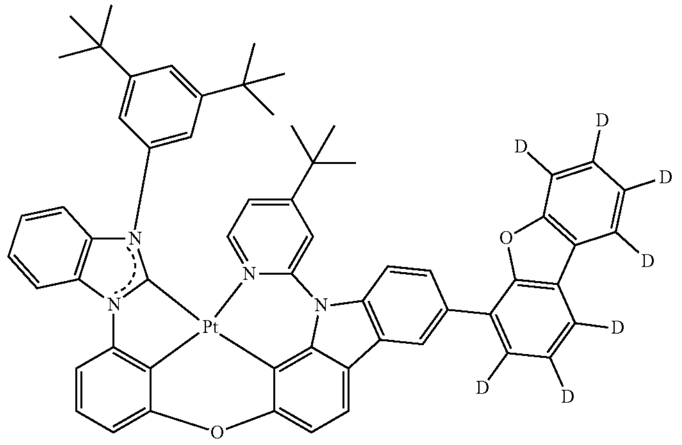
94
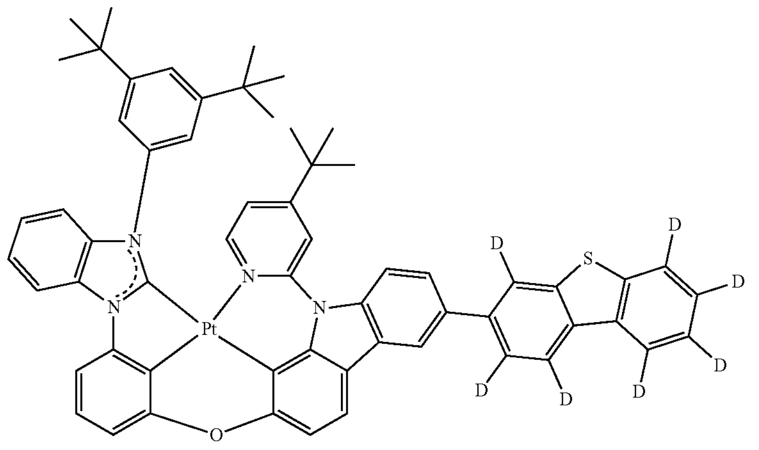

-continued
95
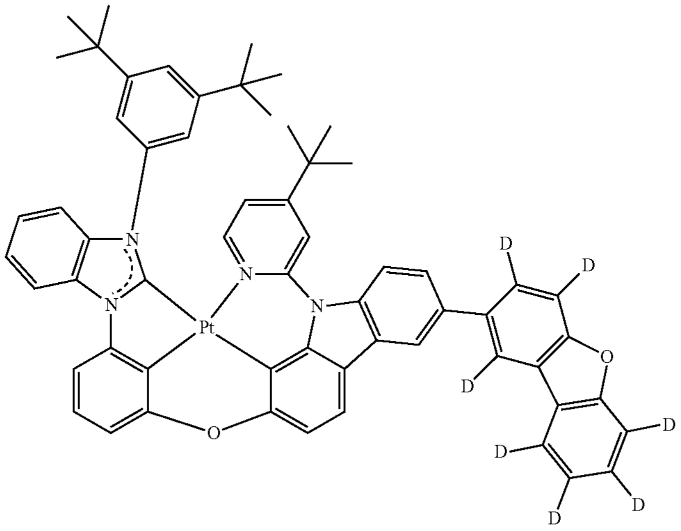
96
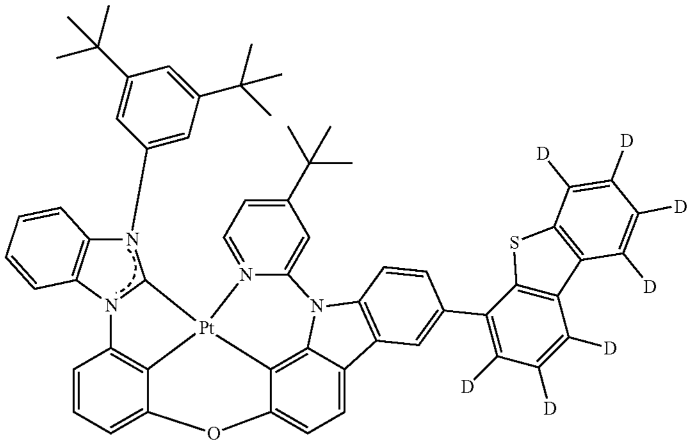
97
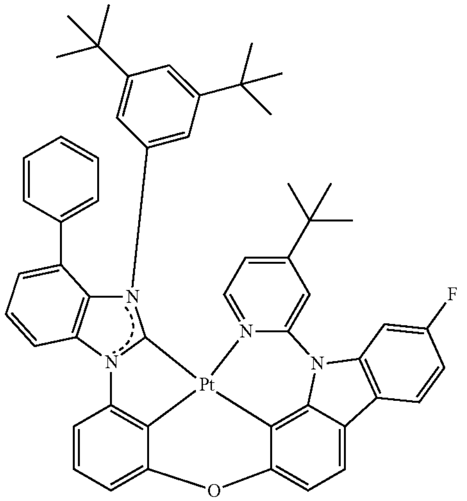

-continued
98
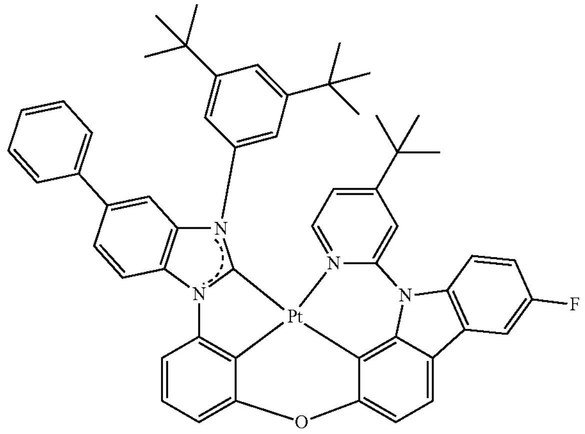
99
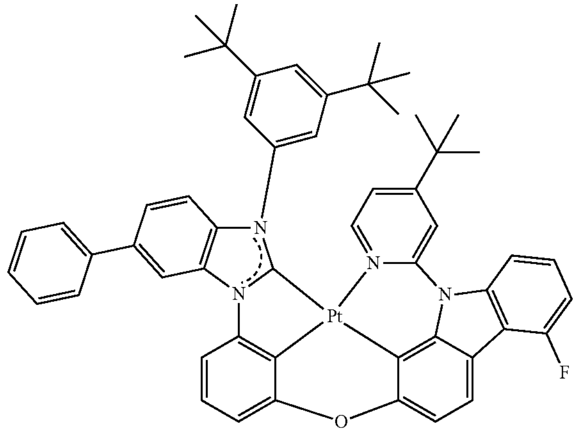
100
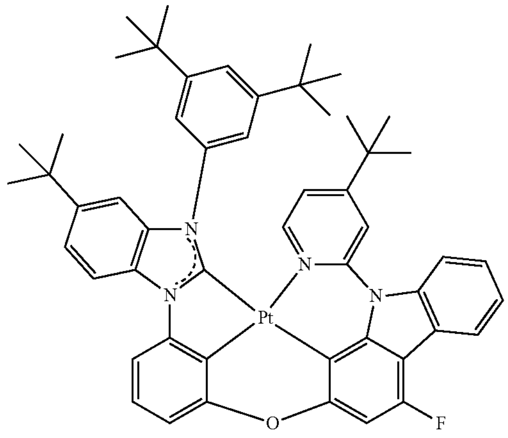

-continued
101
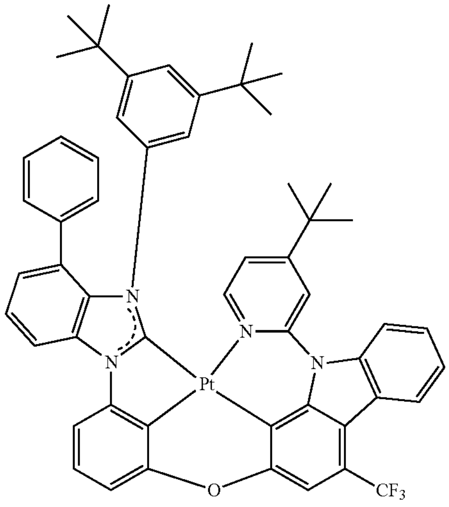
102
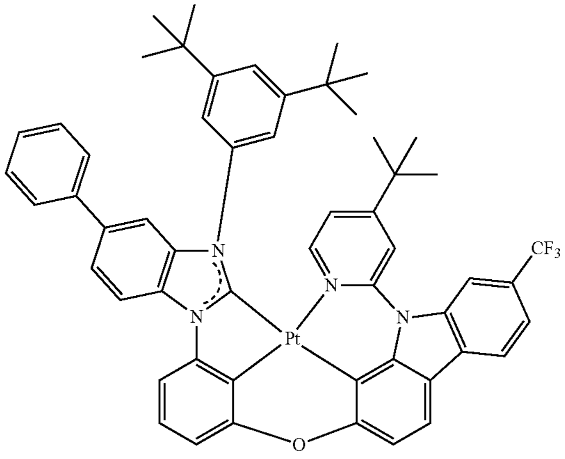
103
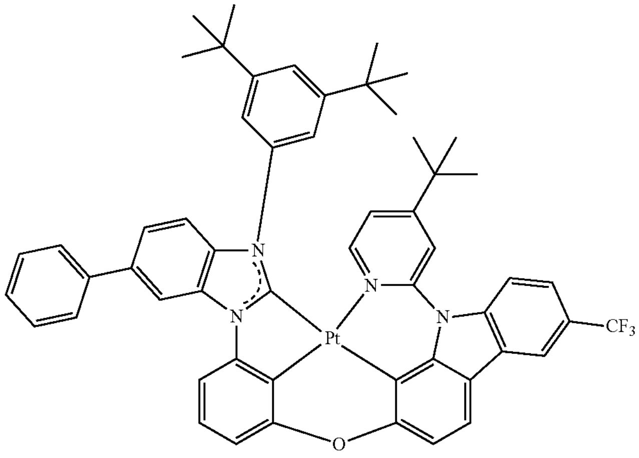

-continued
104
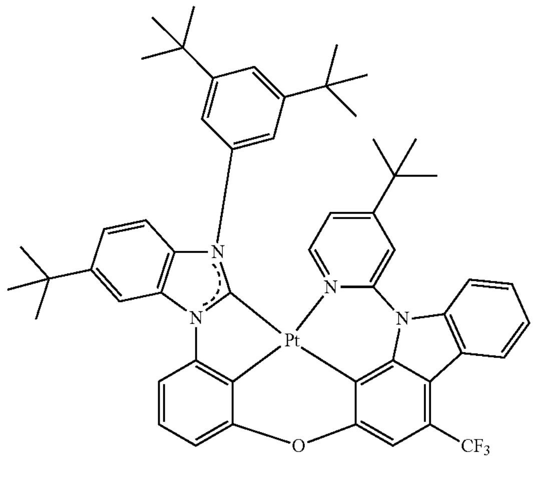
105
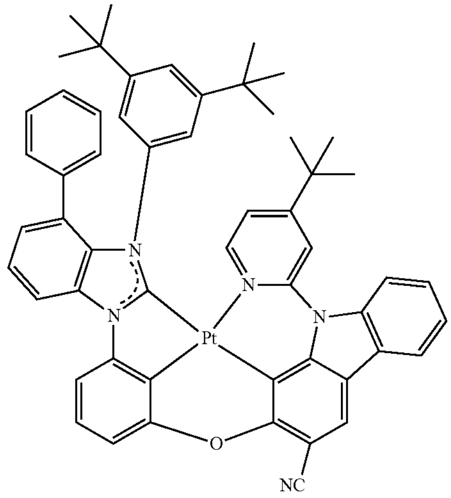
106
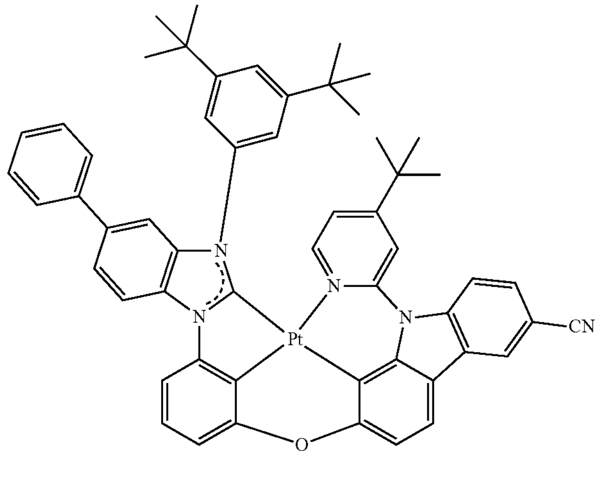

-continued
107
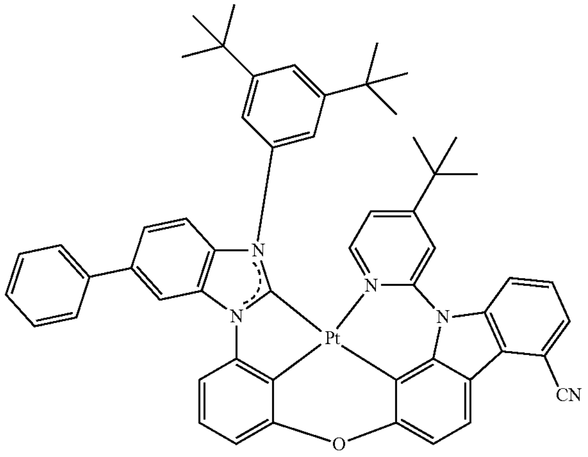
108
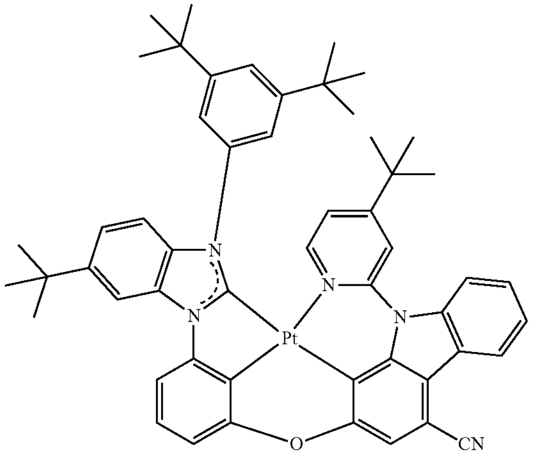
109
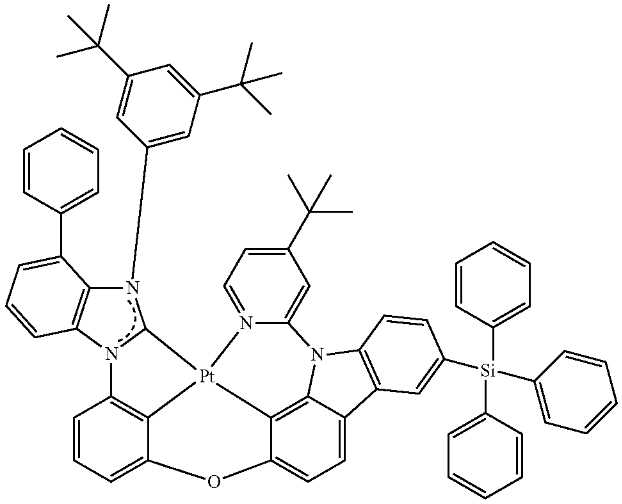

-continued
110
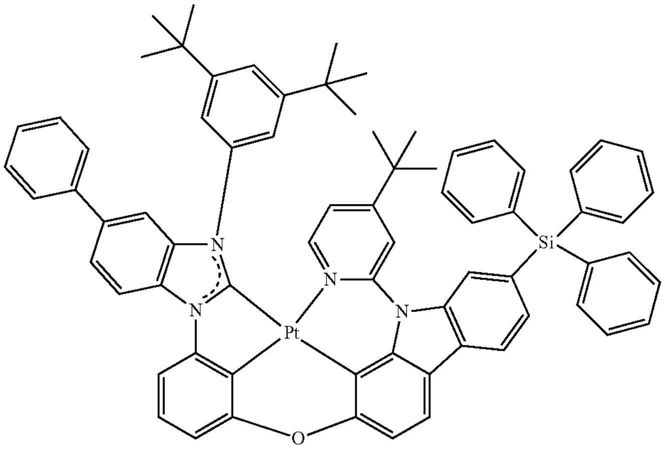
111
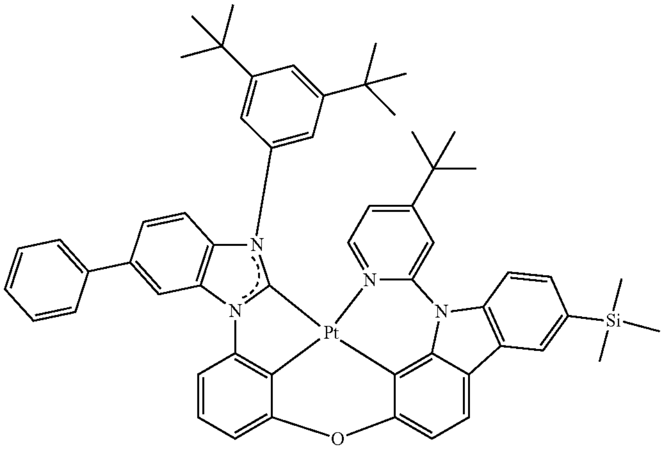
112
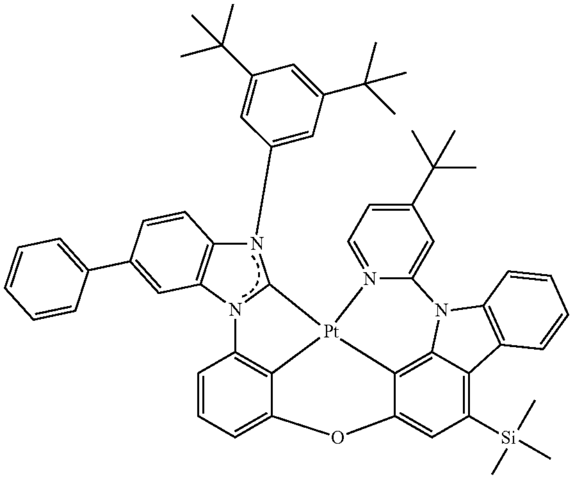

-continued
113
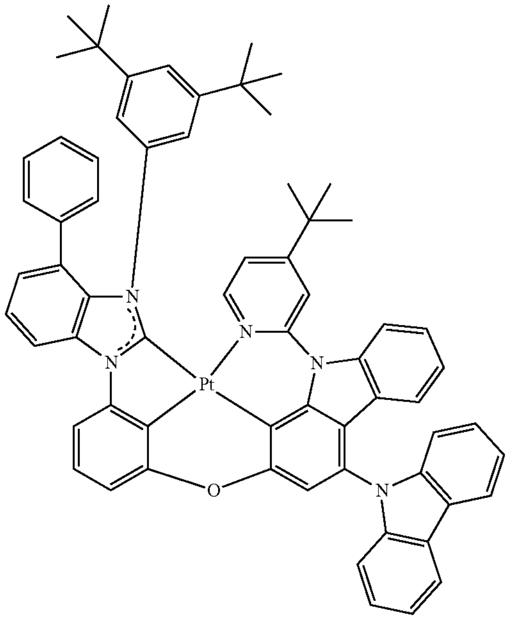
114
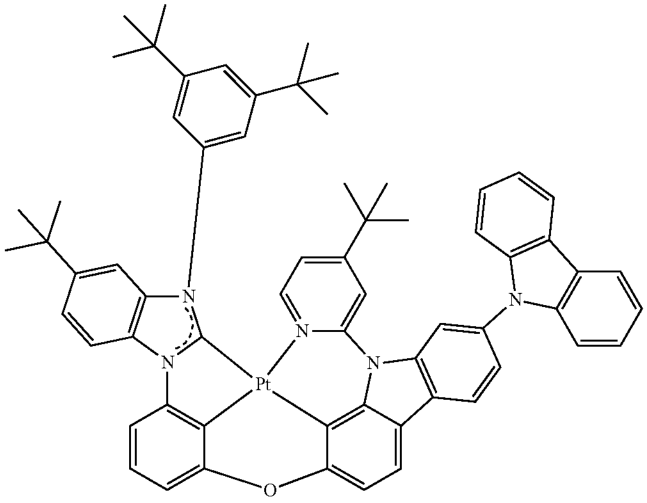
115
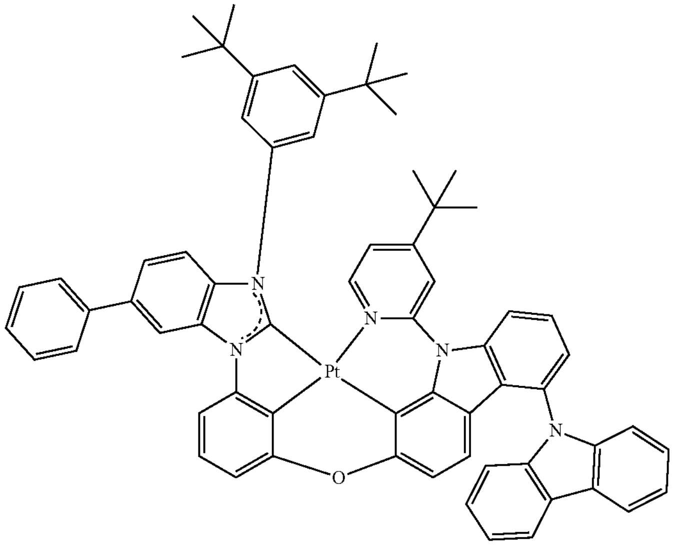

-continued
116
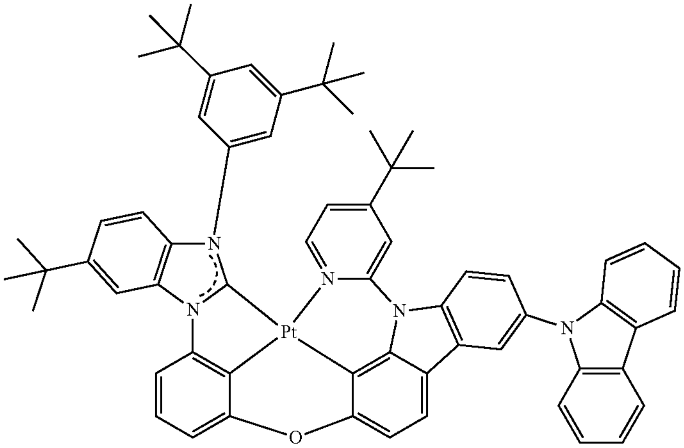
117
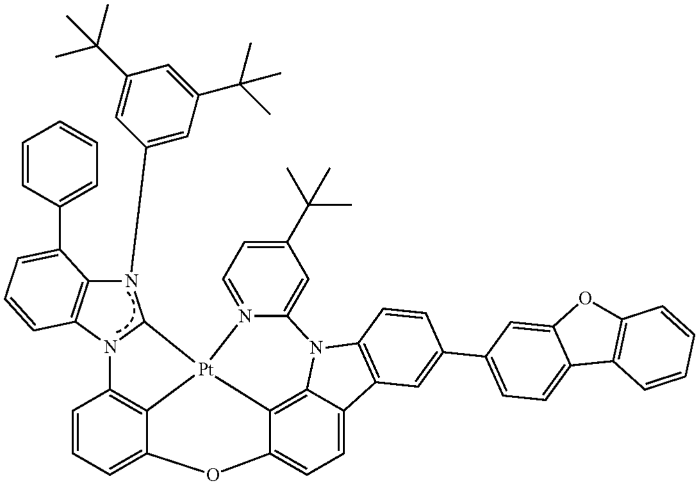
118
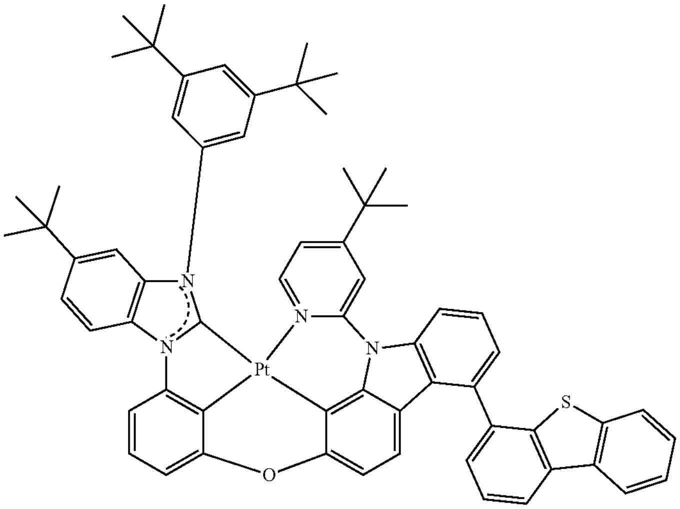

-continued
119
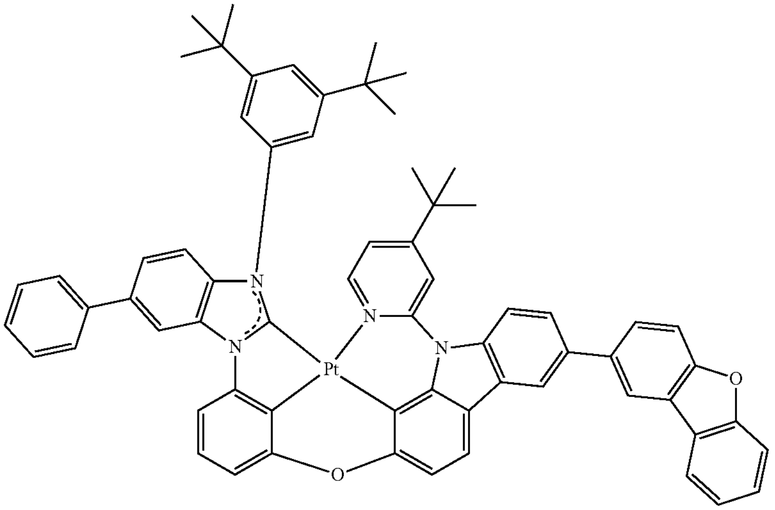
120
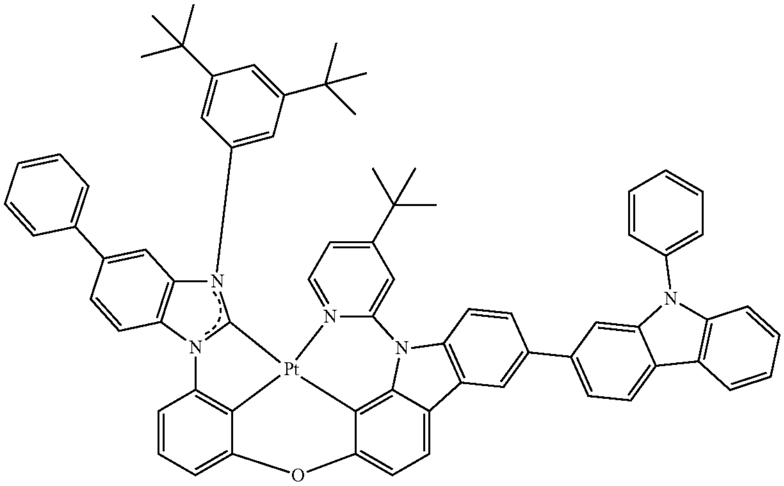
121
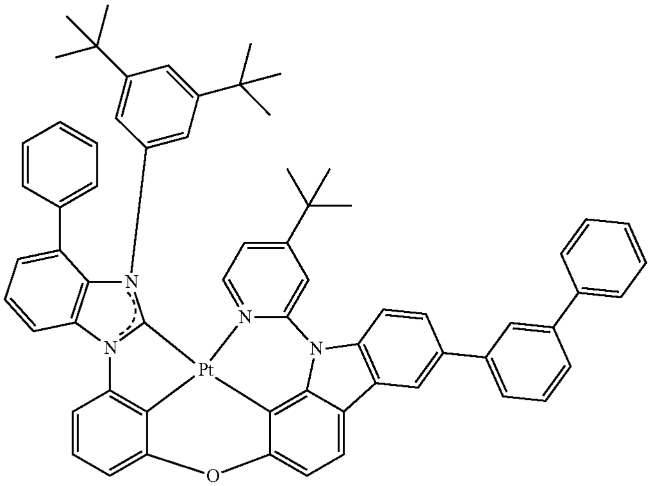

-continued
122
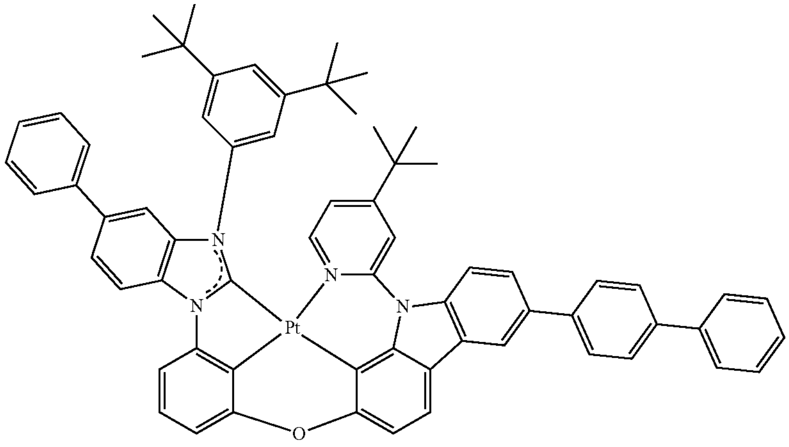
123
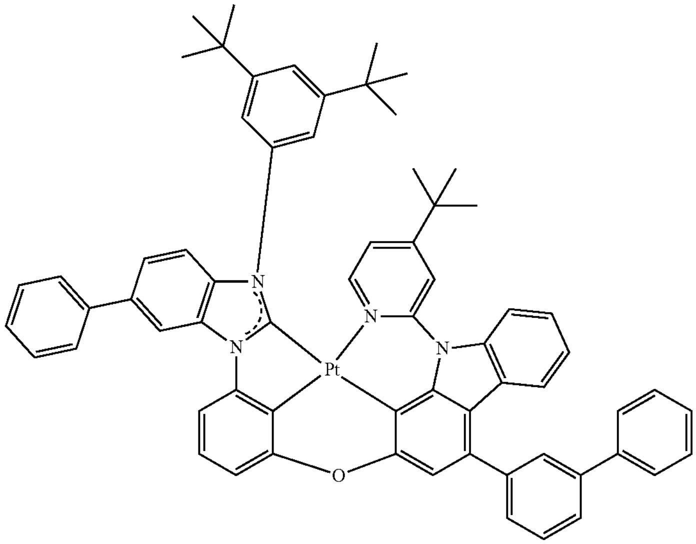
124
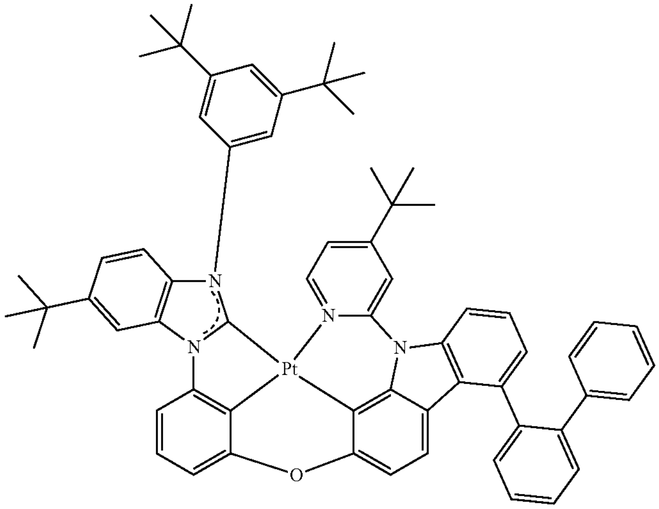

-continued
125
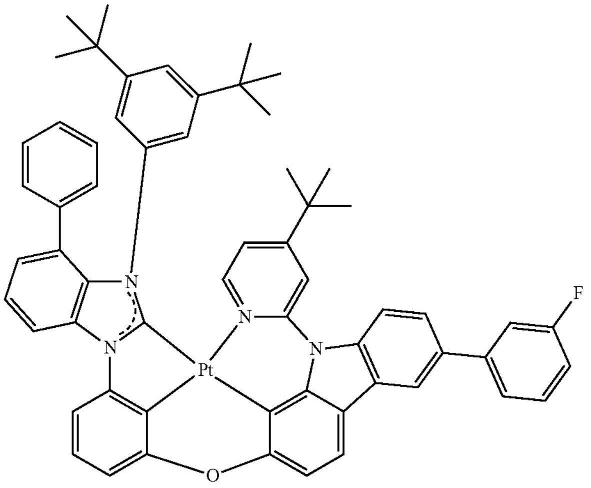
126
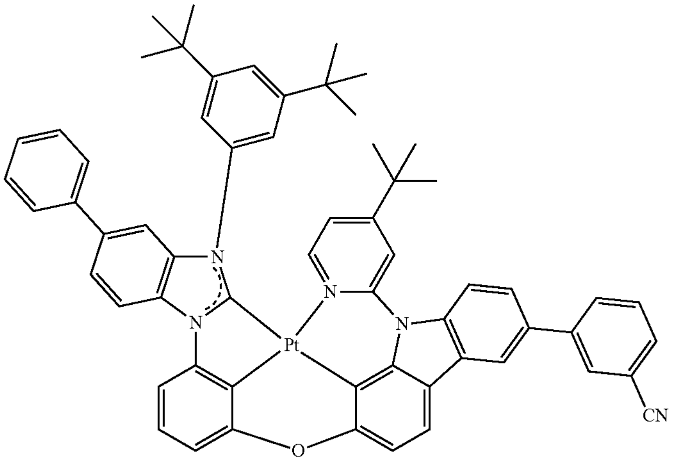
127
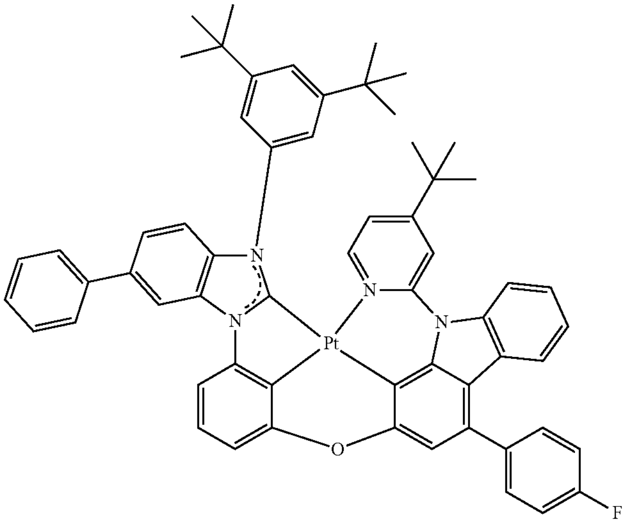

-continued
128
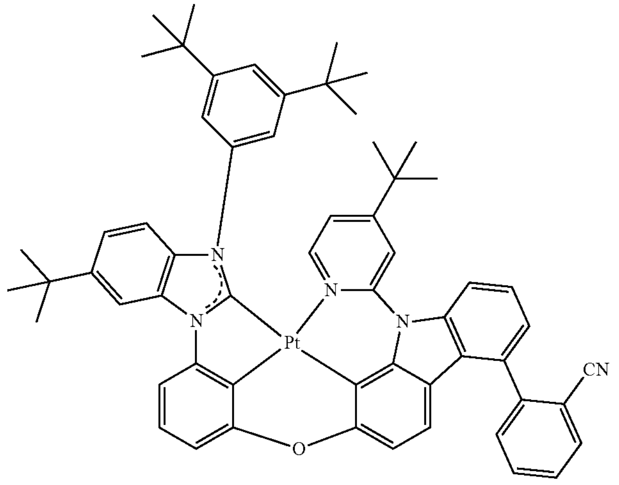
129
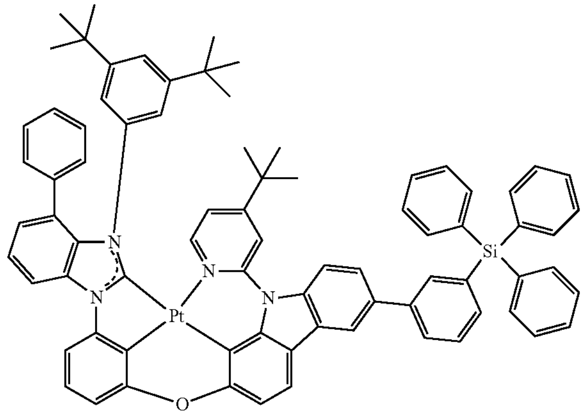
130
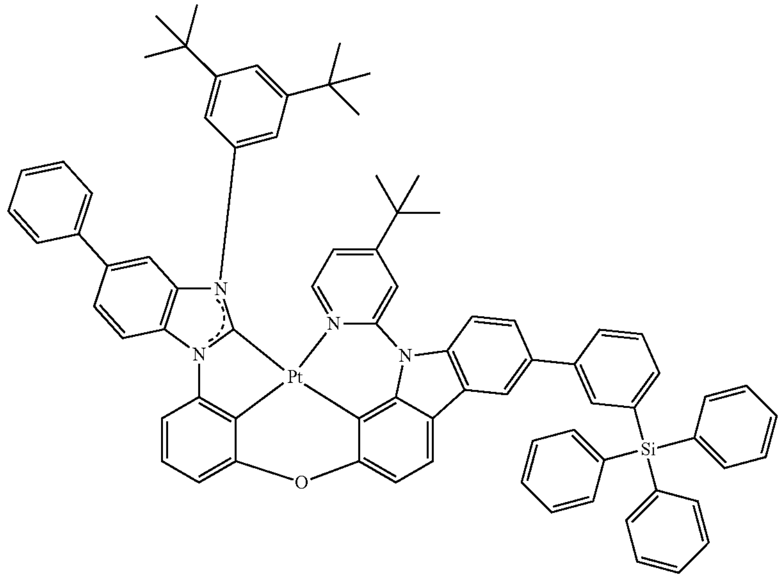

-continued
131
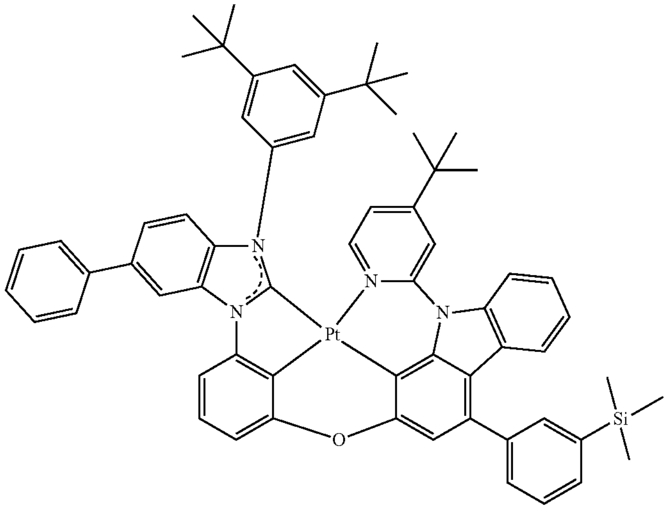
132
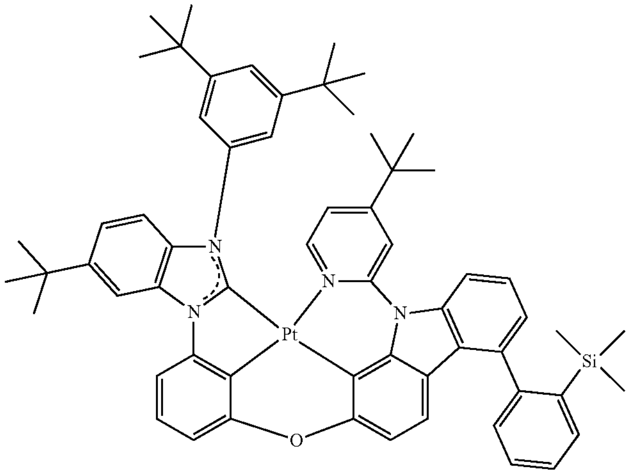
133
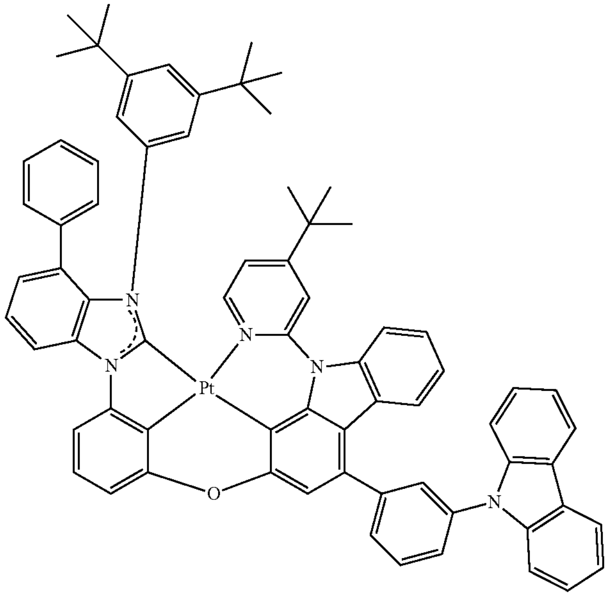

-continued
134
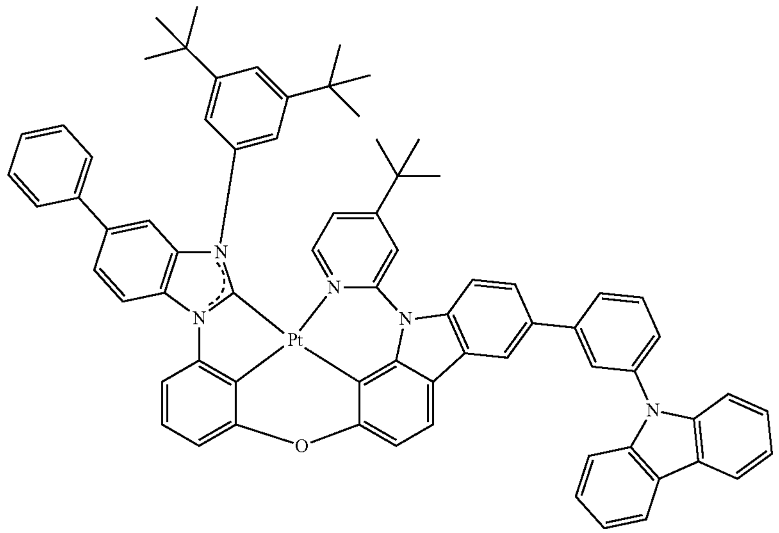
135
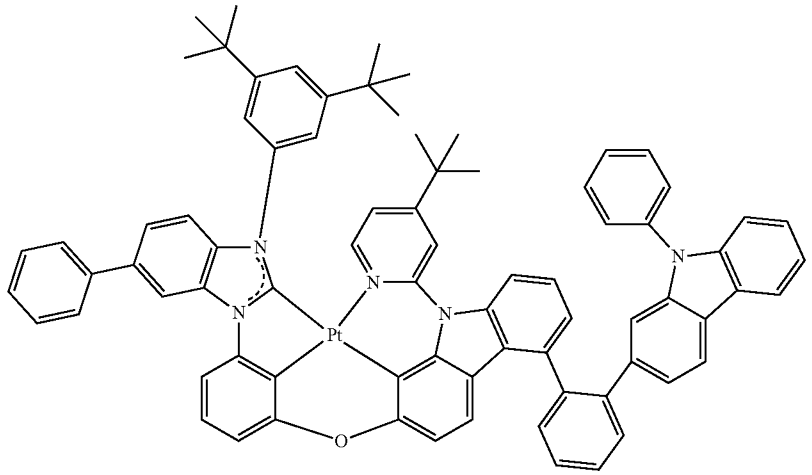
136
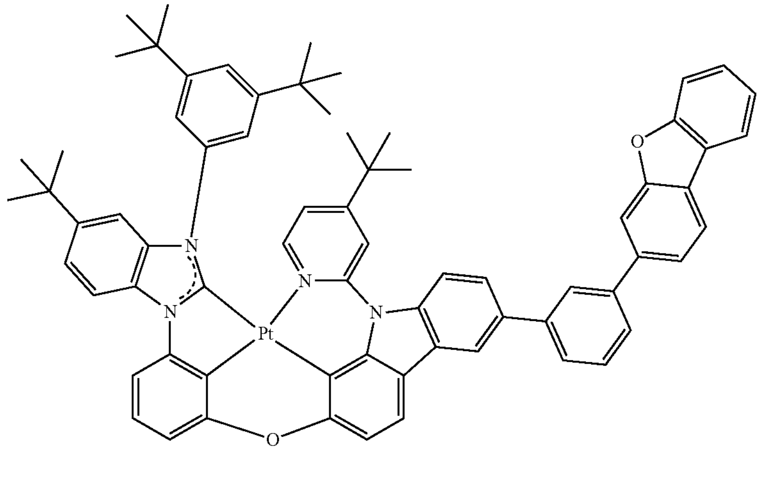

-continued
137
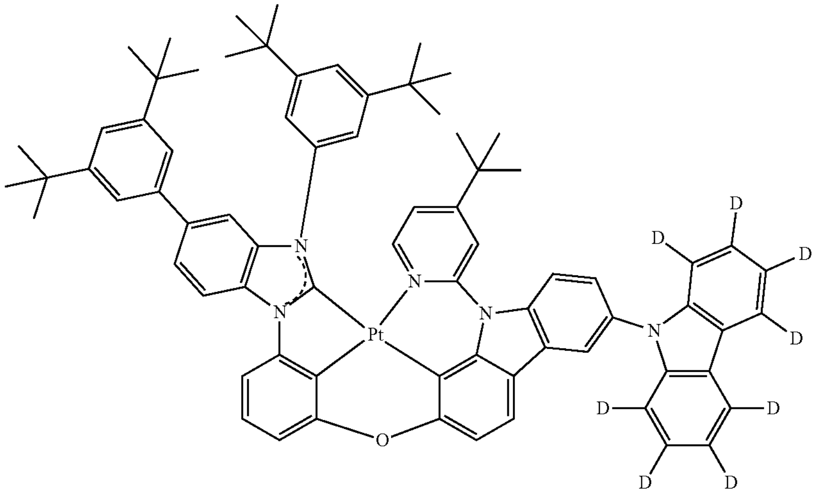
138
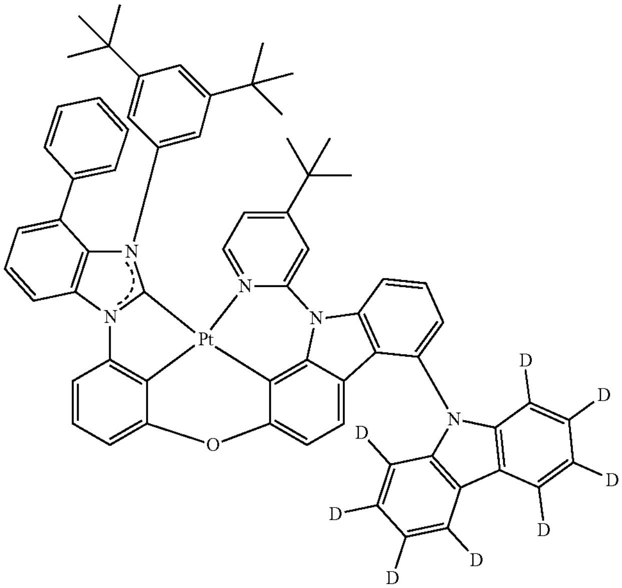

-continued
139
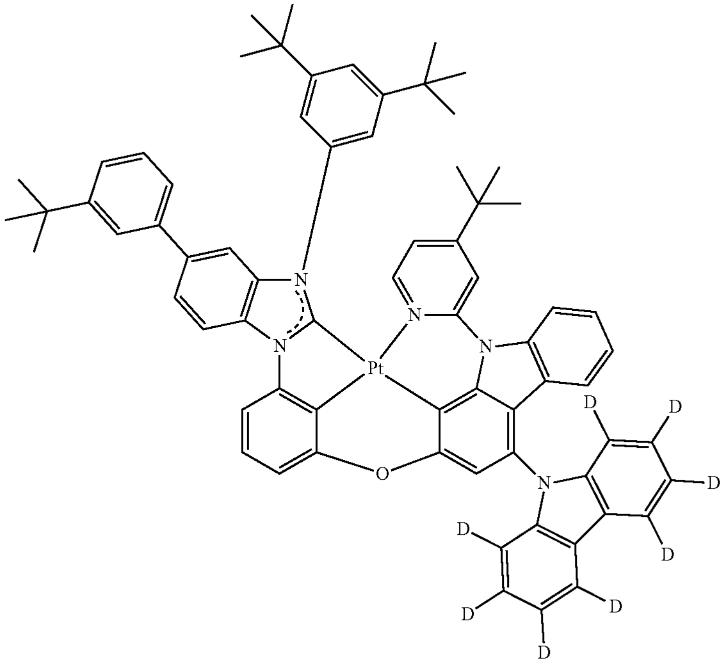
140
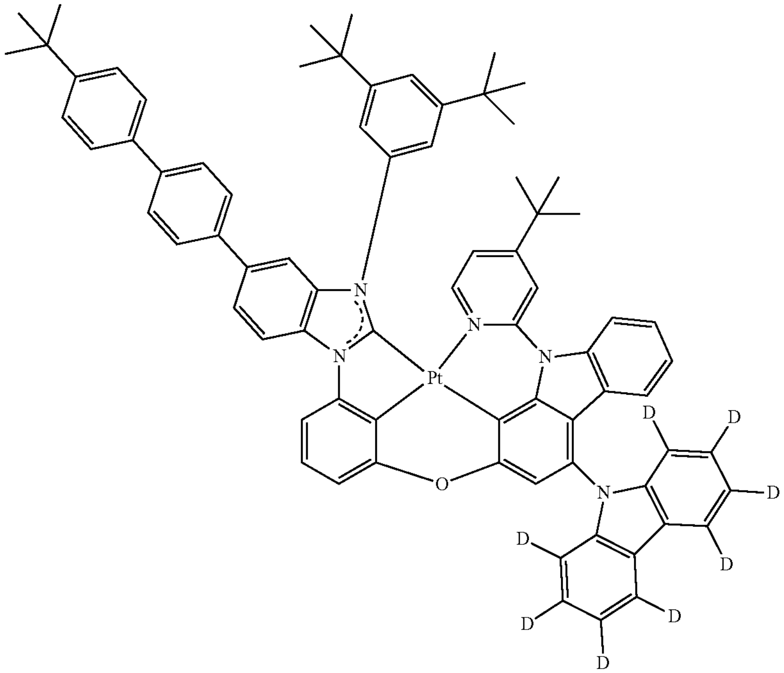

-continued
141
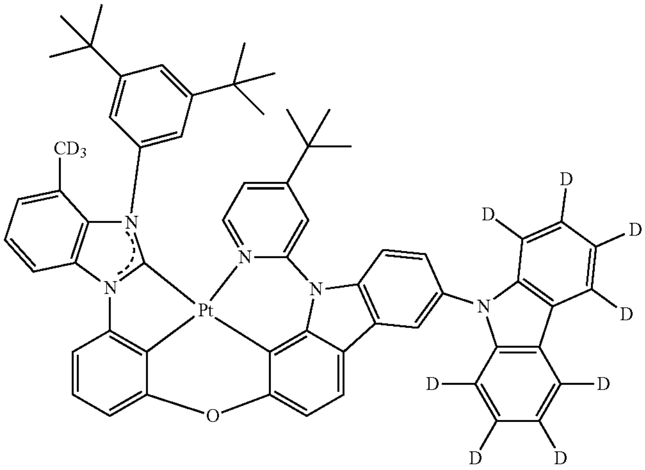
142
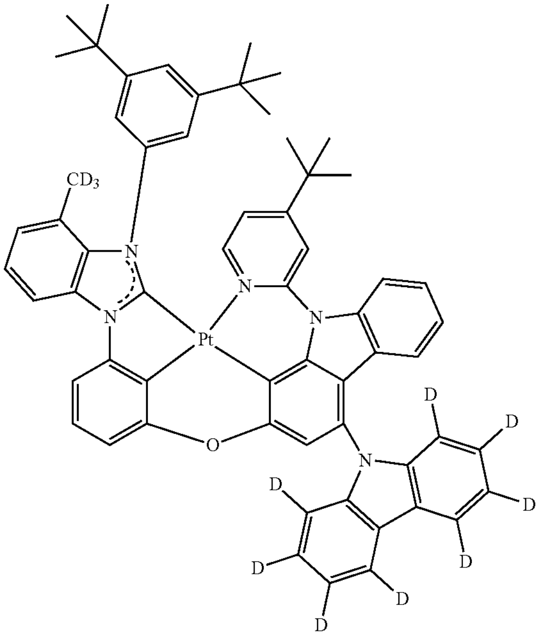
143
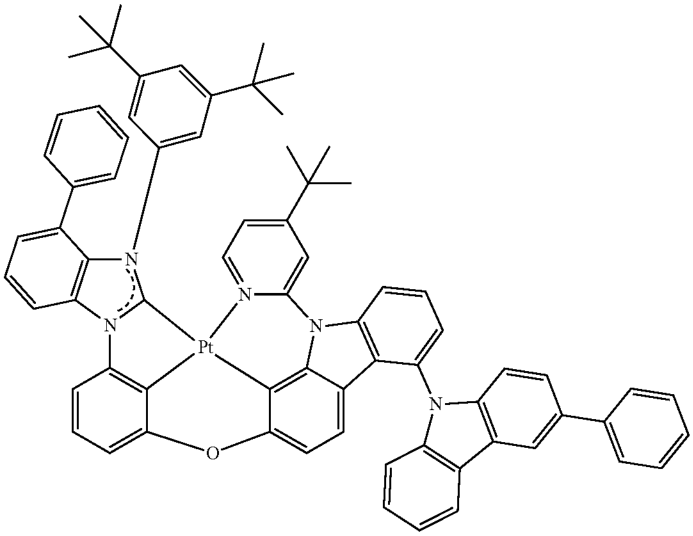

-continued
144
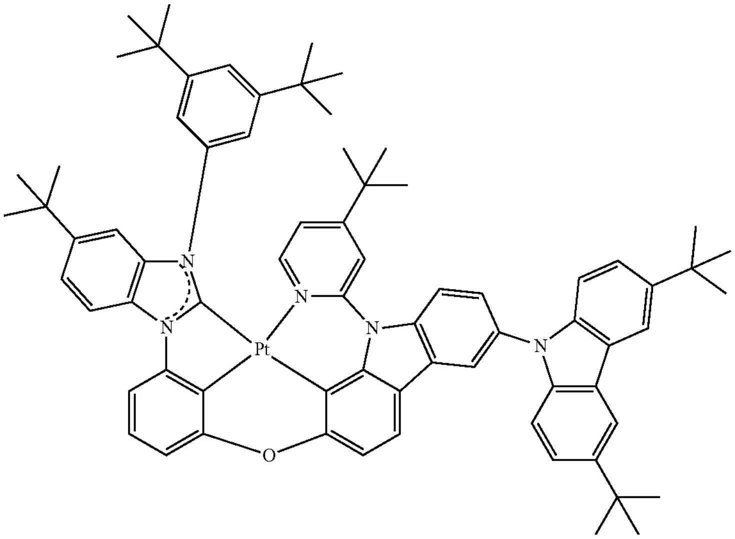
145
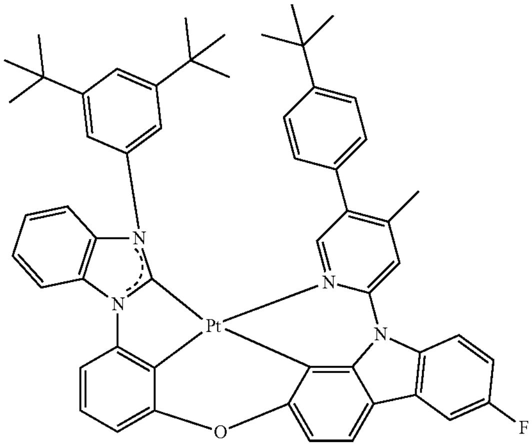
146
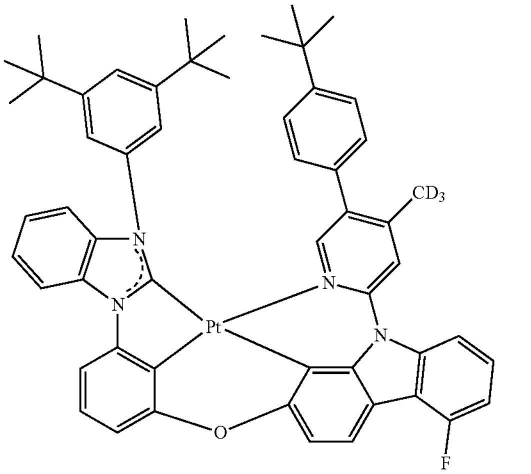

-continued
147
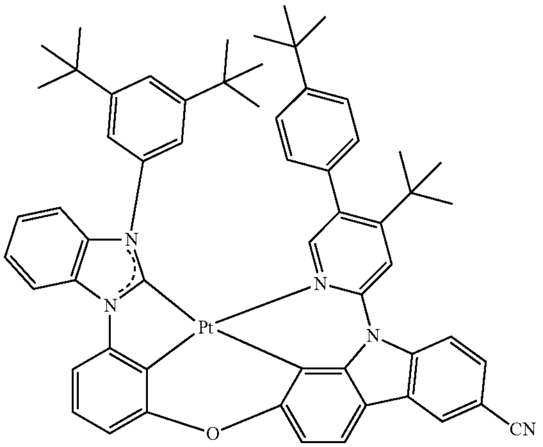
148
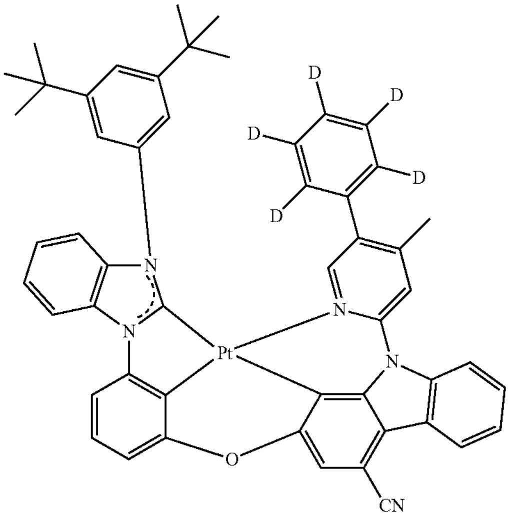
149
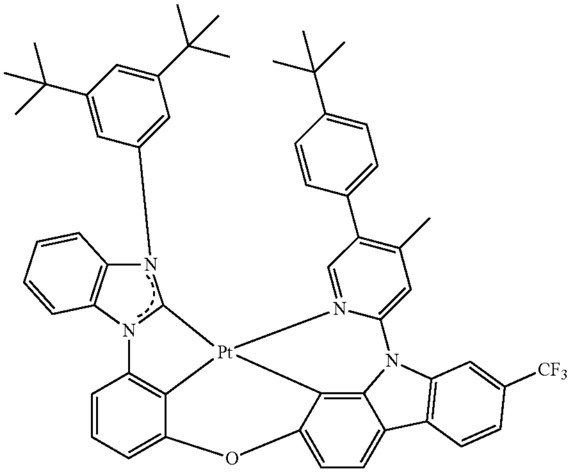

-continued
150
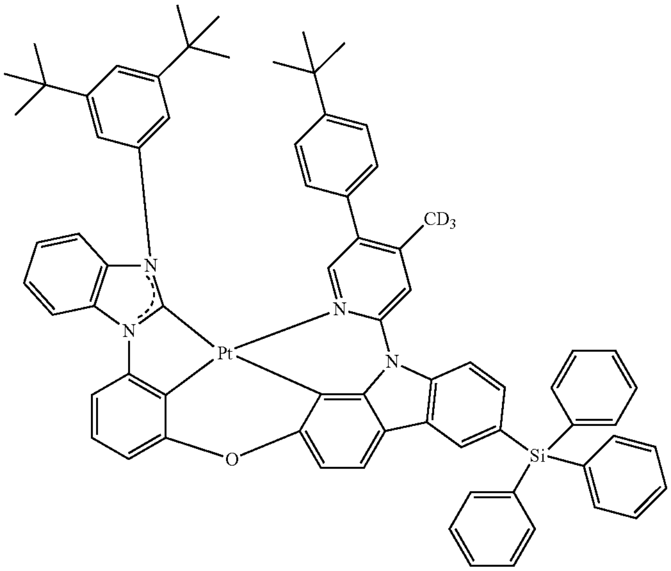
151
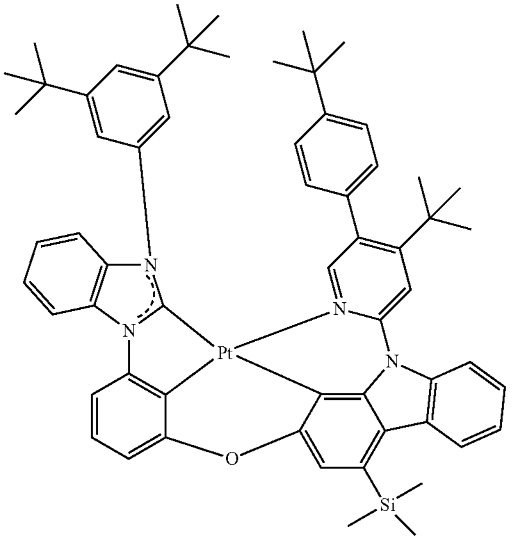
152
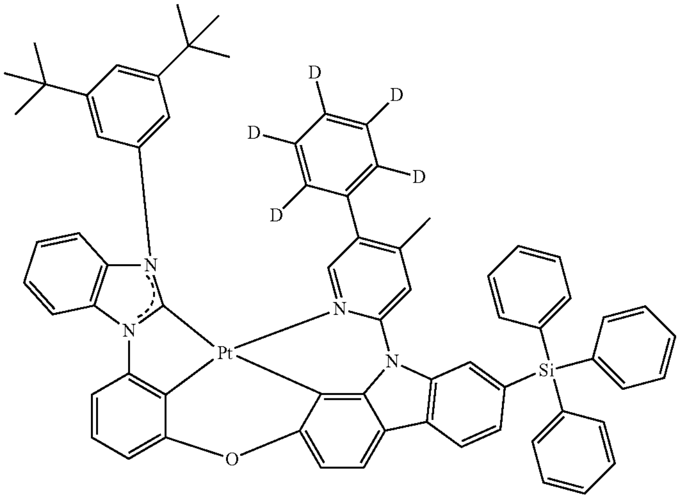

-continued
153
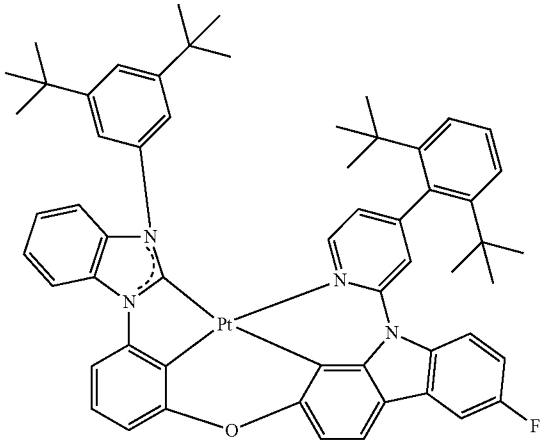
154
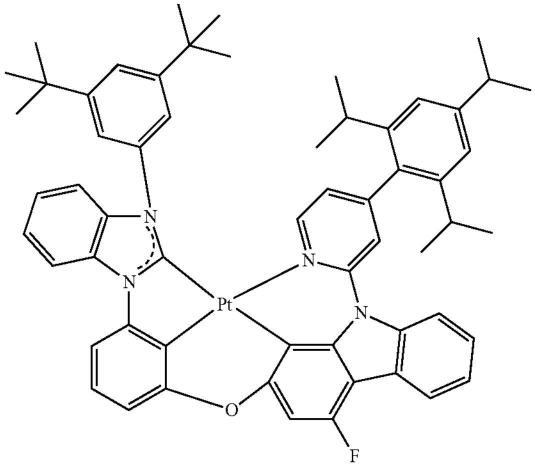
155
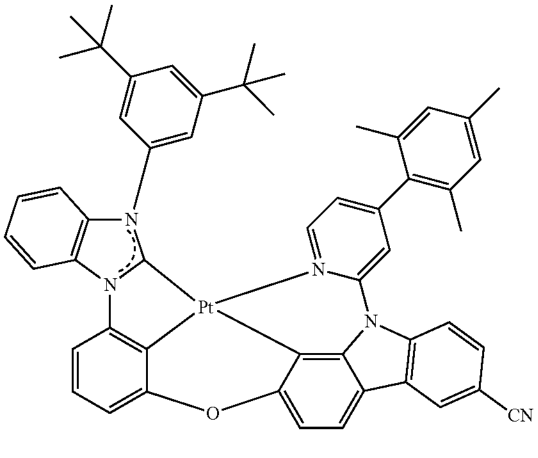

-continued
156
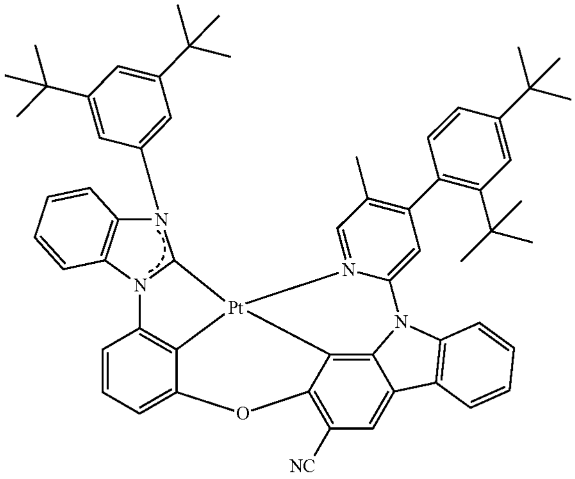
157
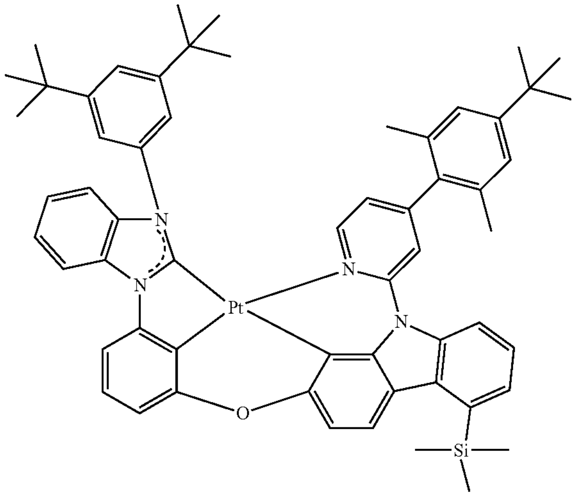
158
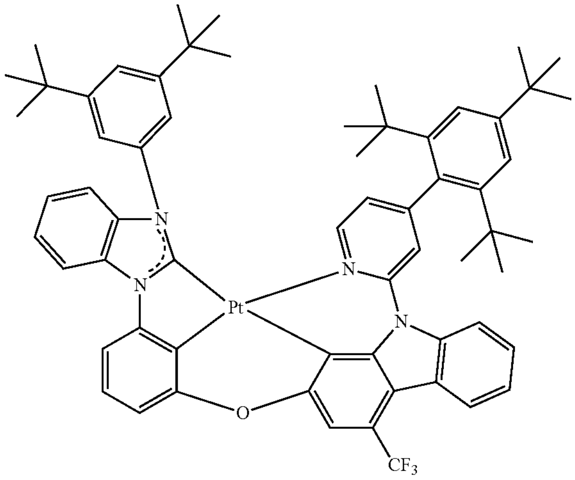

-continued
159
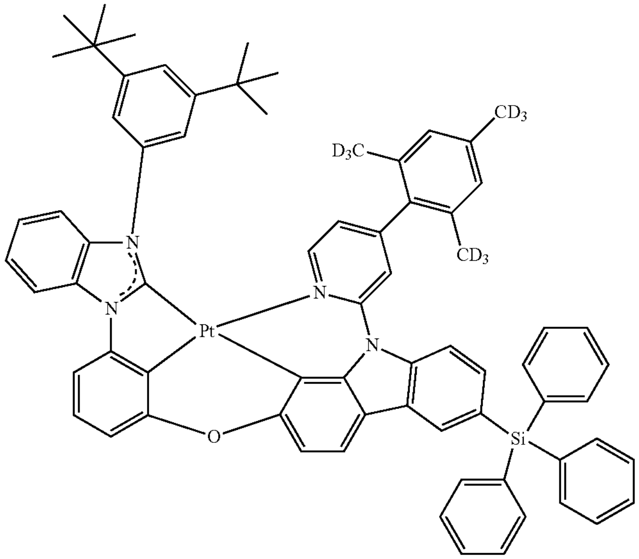
160
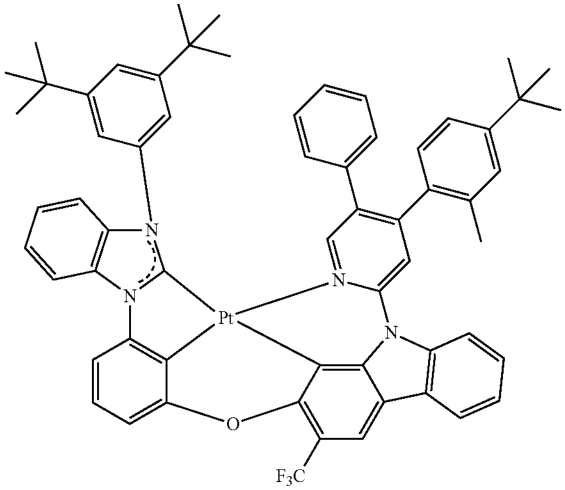
161
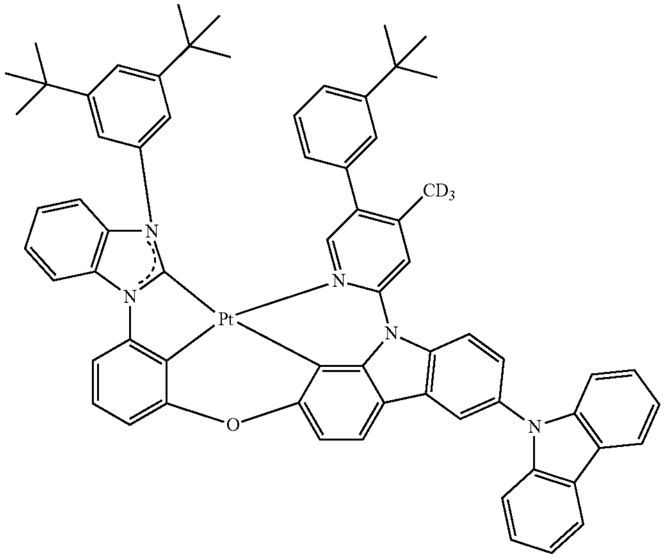

-continued
162
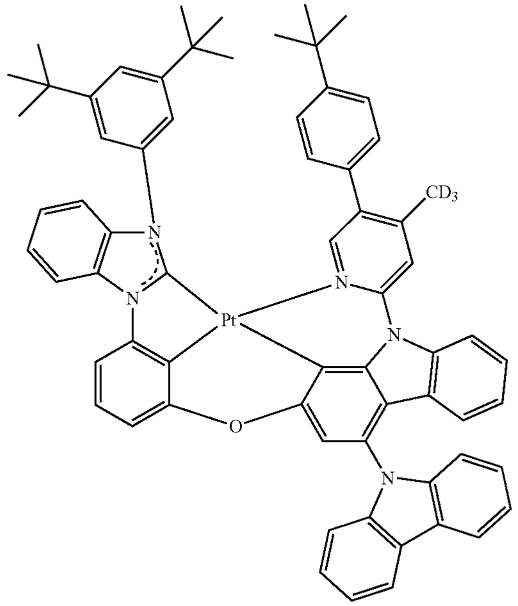
163
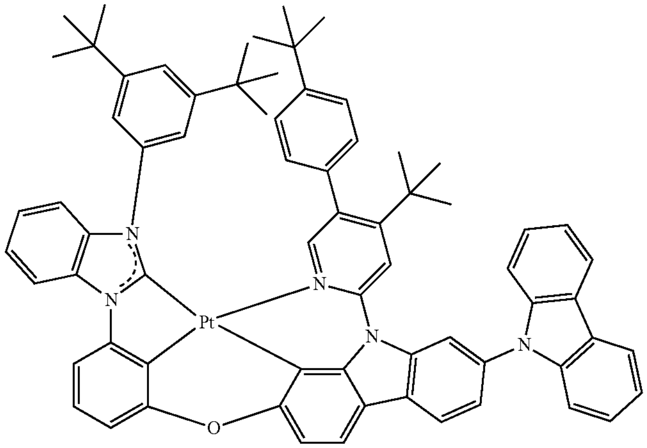

-continued
164
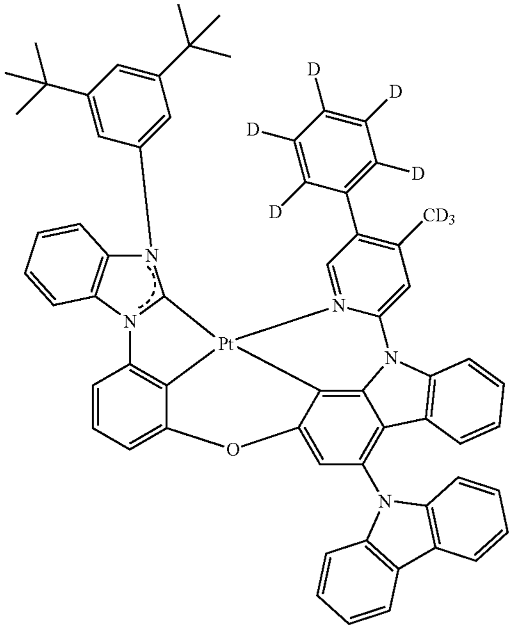
165
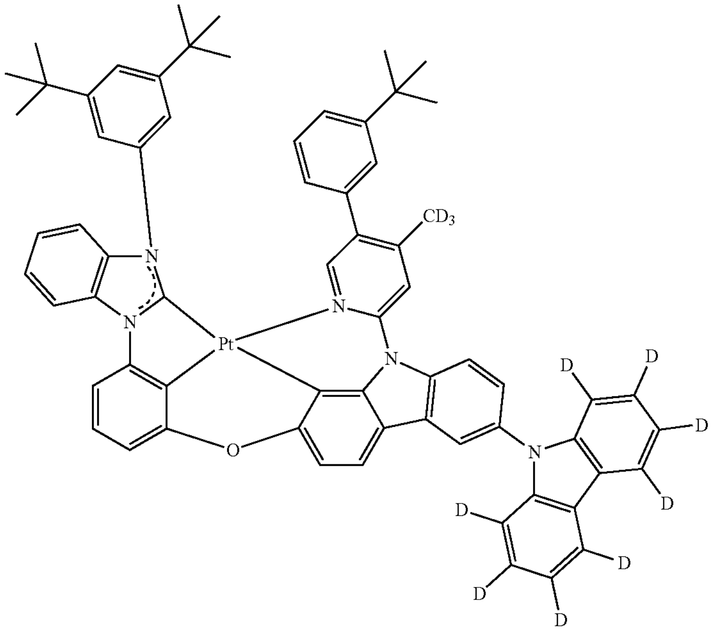

-continued
166
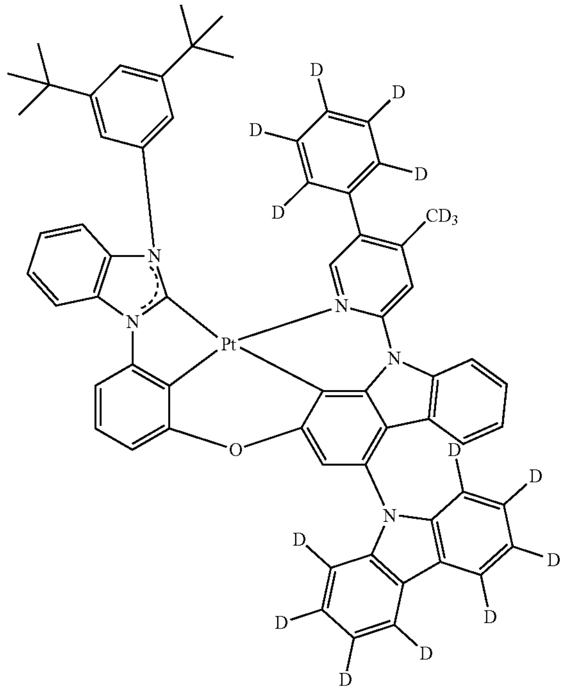
167
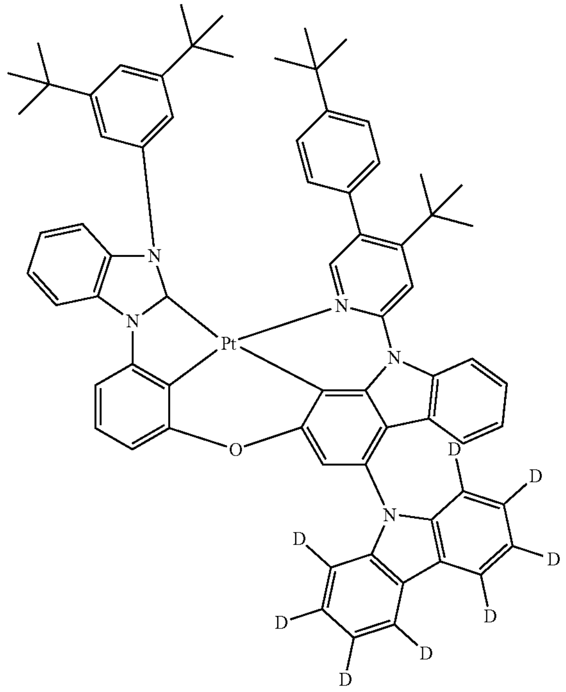

-continued
168
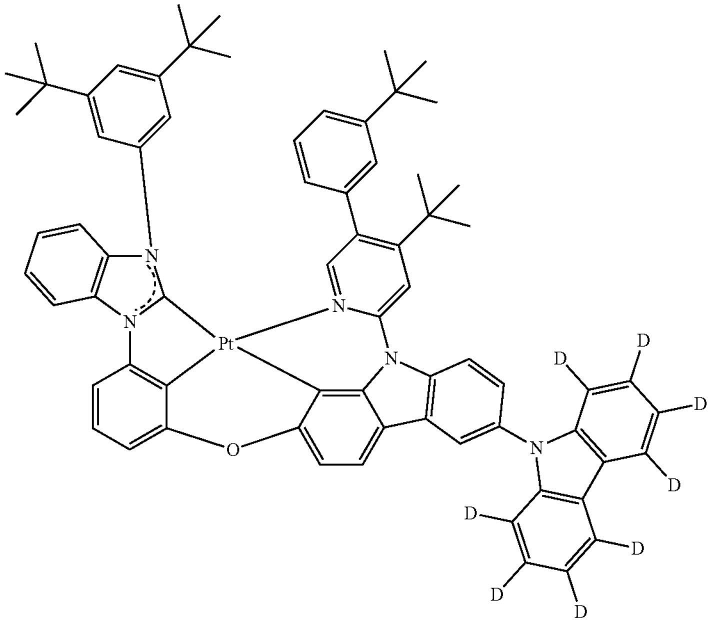
169
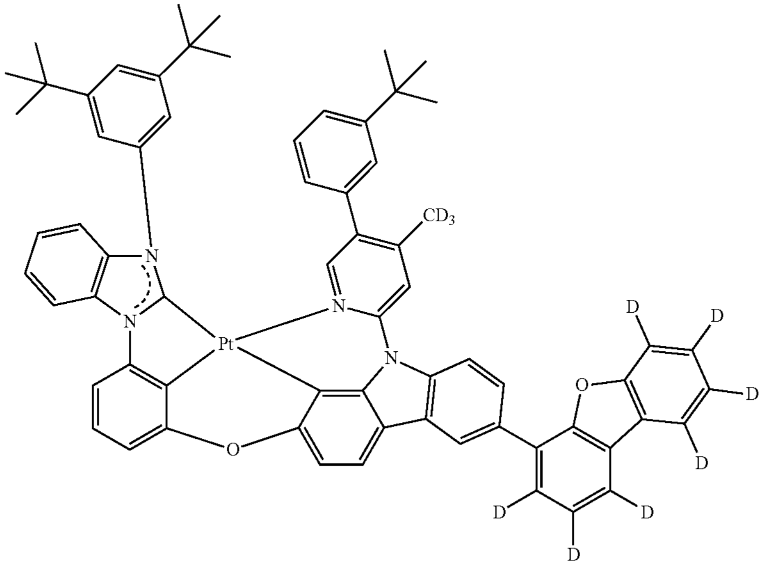

-continued
170
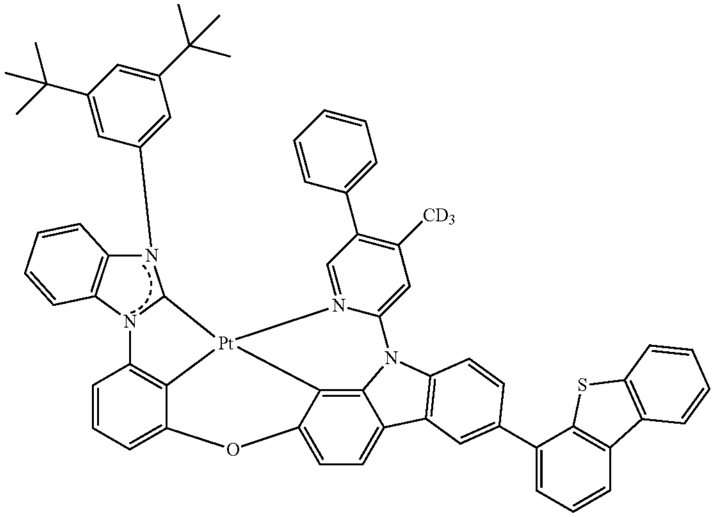
171
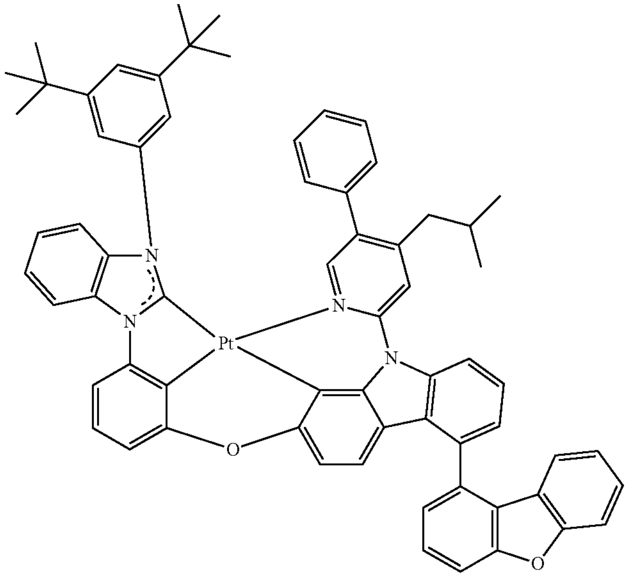

-continued
172
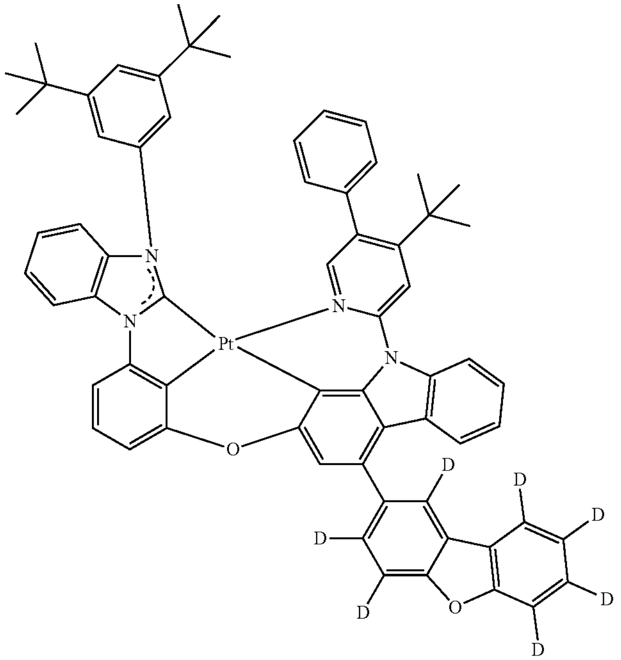
173
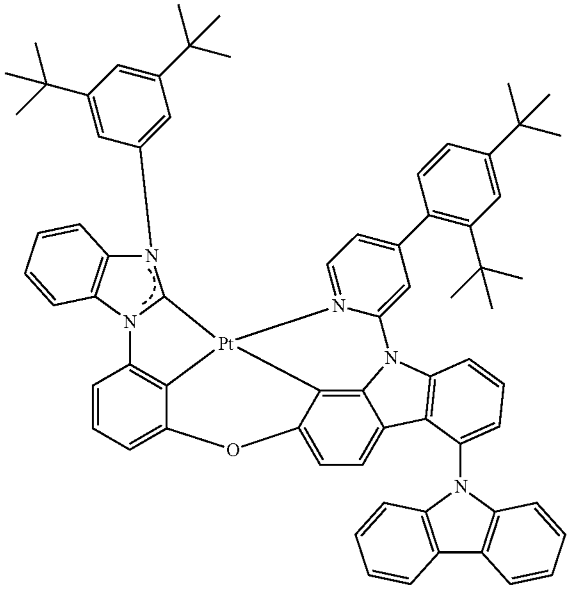

-continued
174
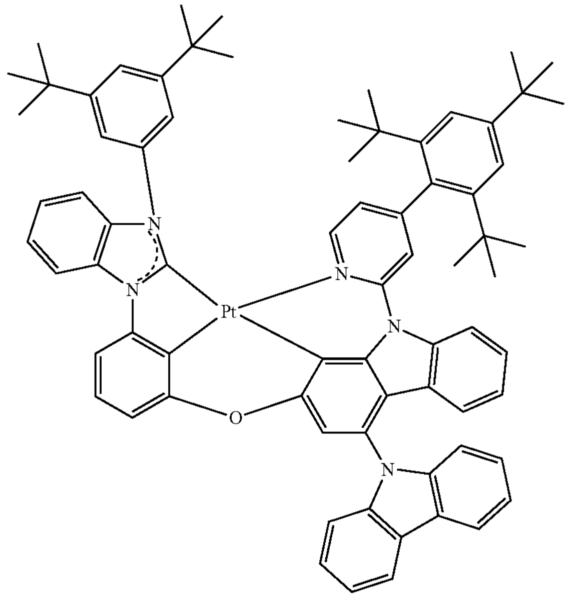
175
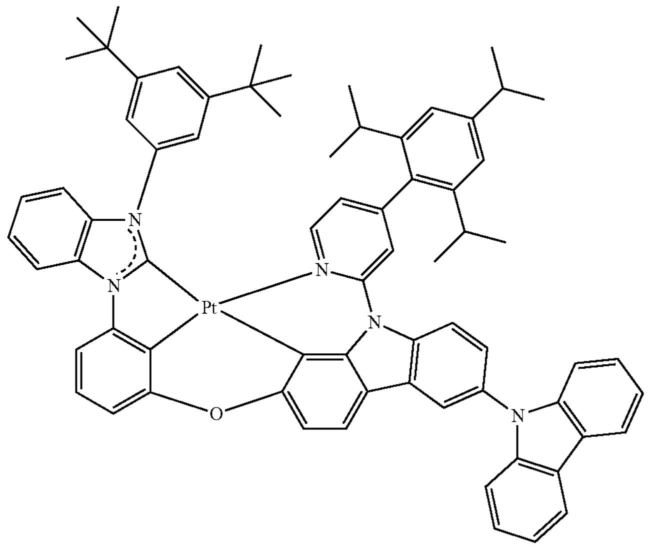

-continued
176
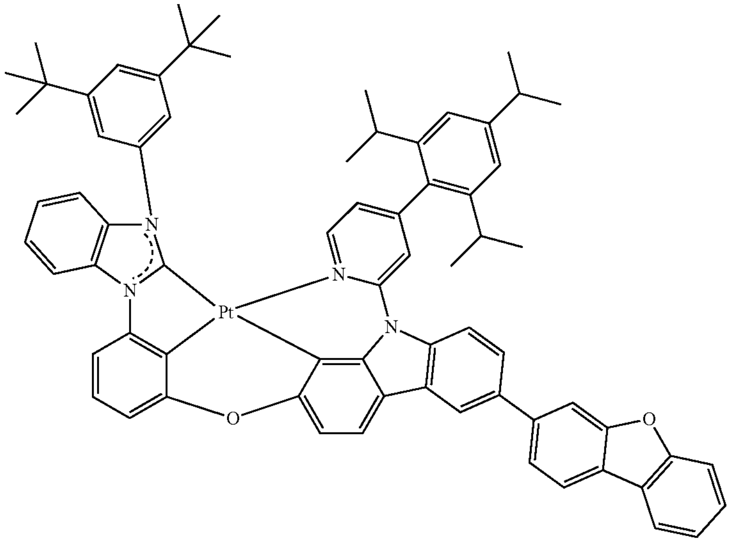
177
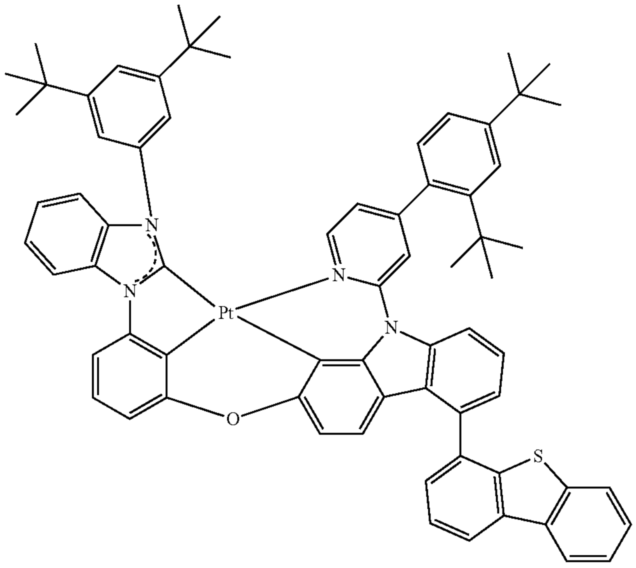

-continued
178
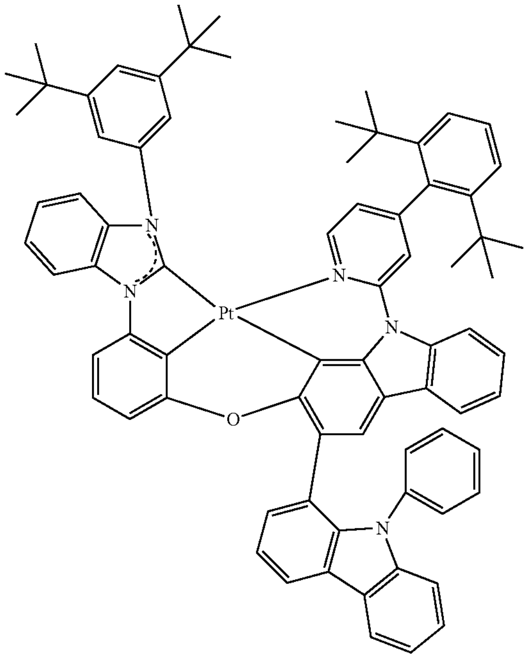
179
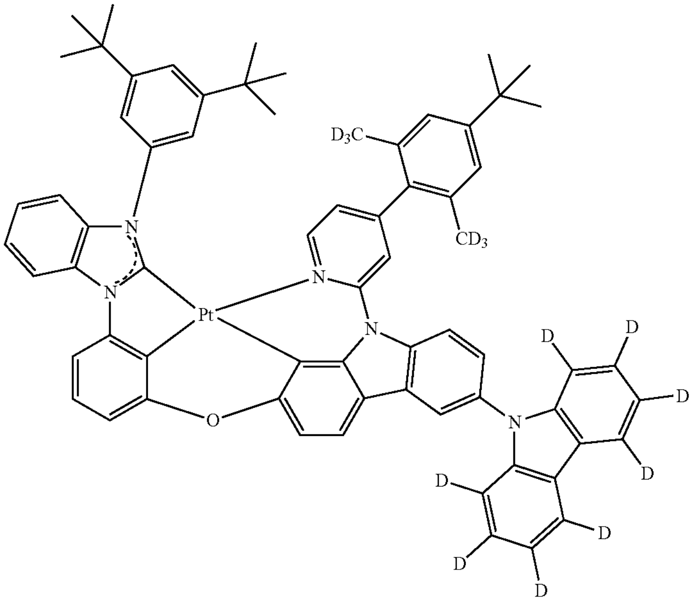

-continued
180
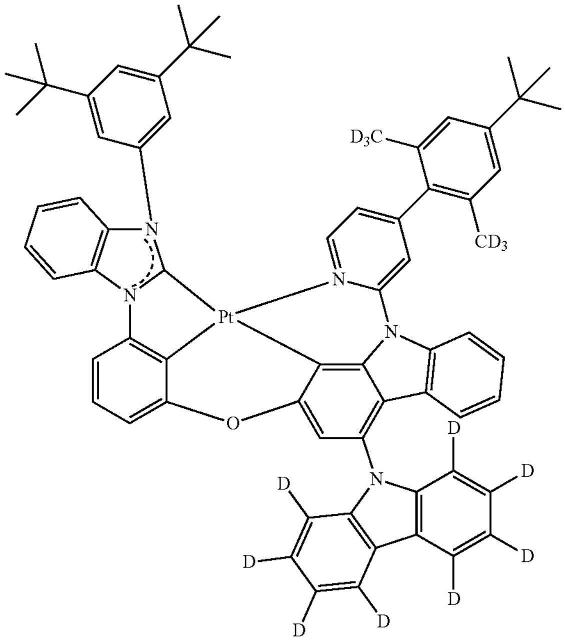
181
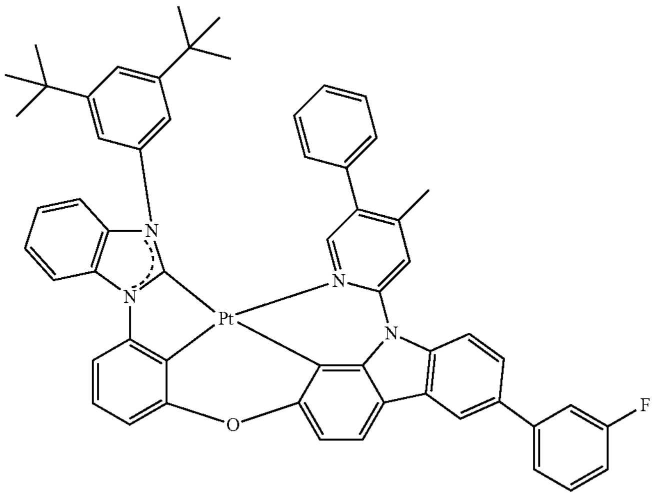

-continued
182
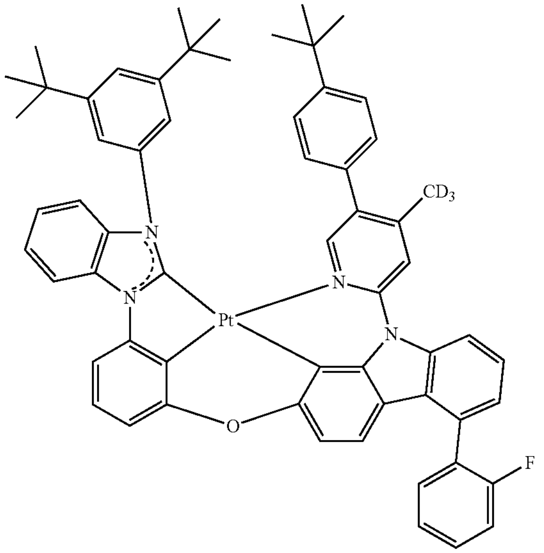
183
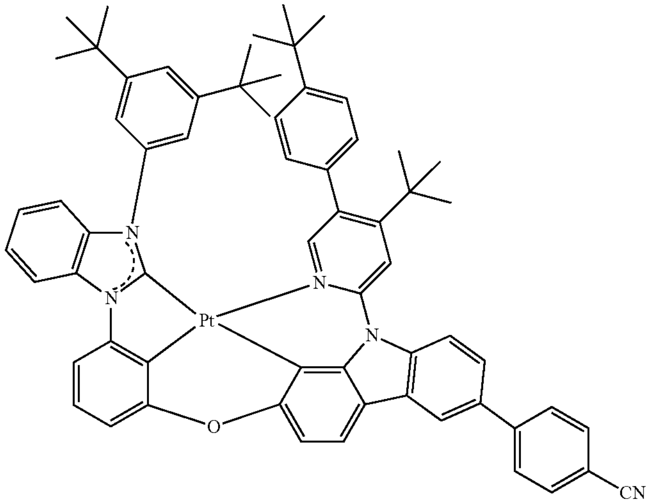
184
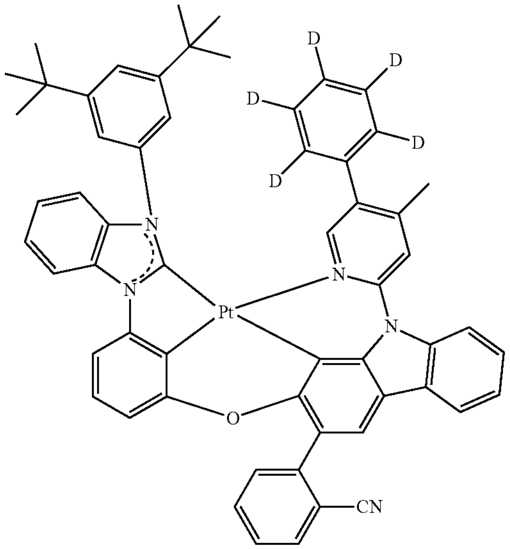

-continued
185
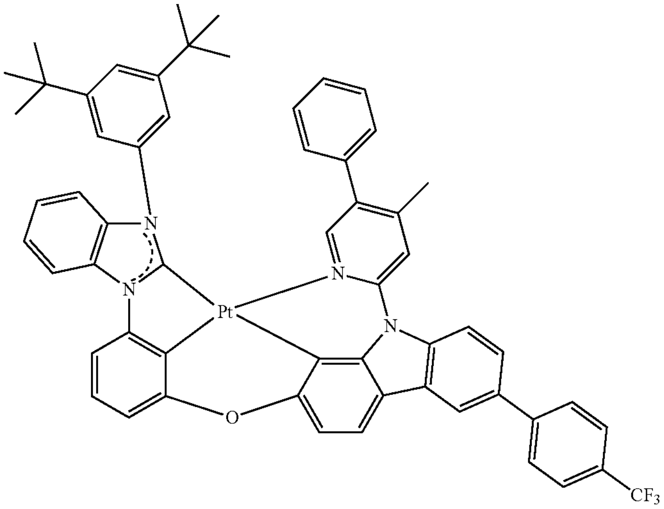
186
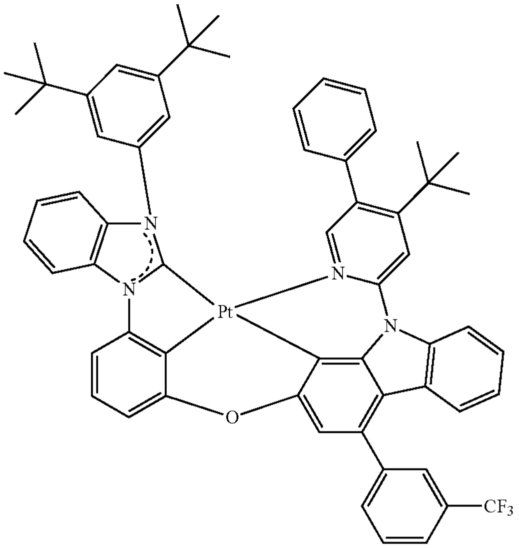
187
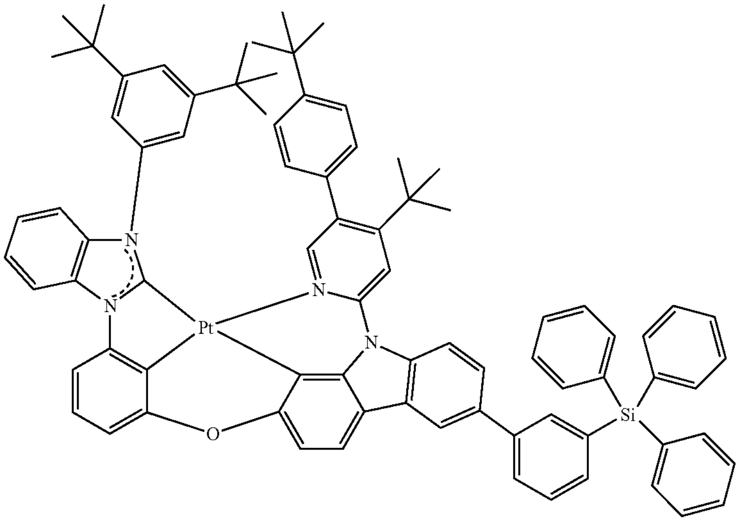

-continued
188
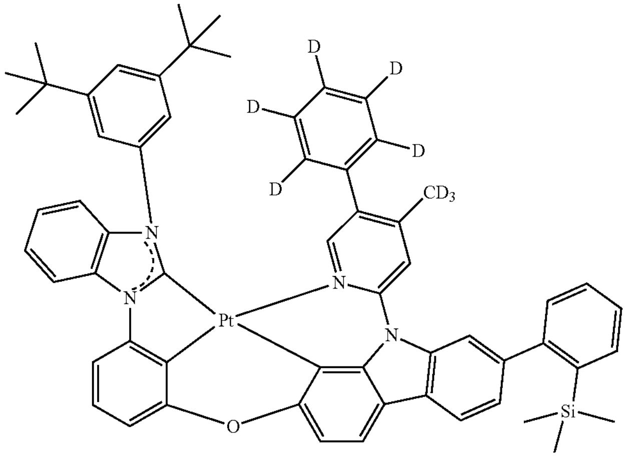
189
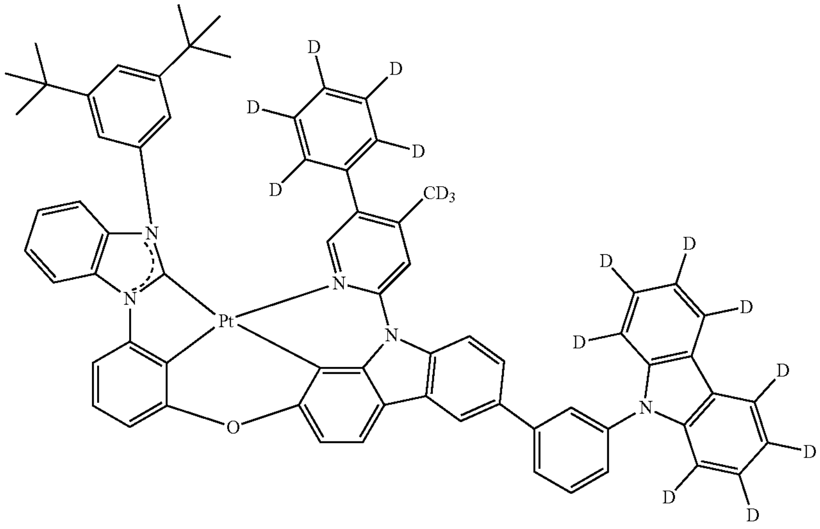
190
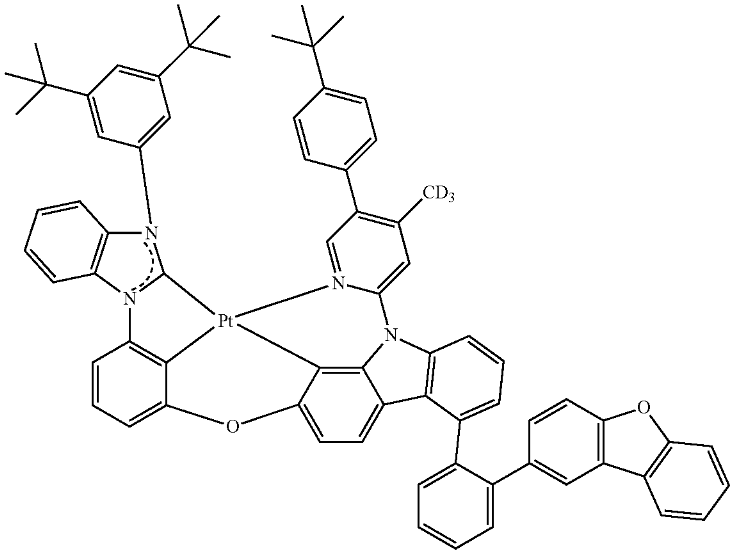

-continued
191
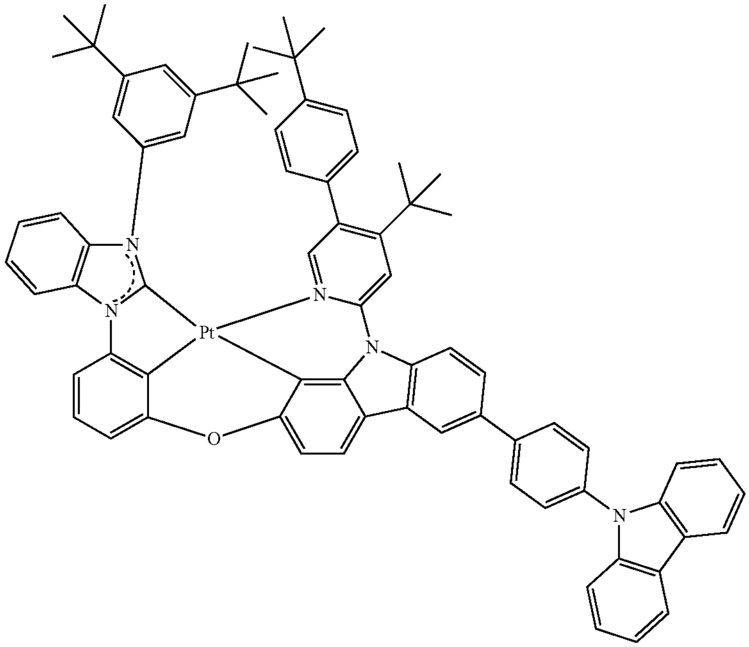
192
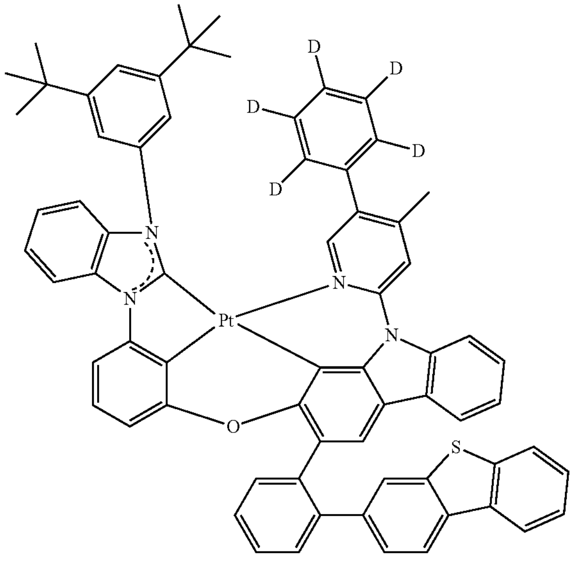

-continued
193
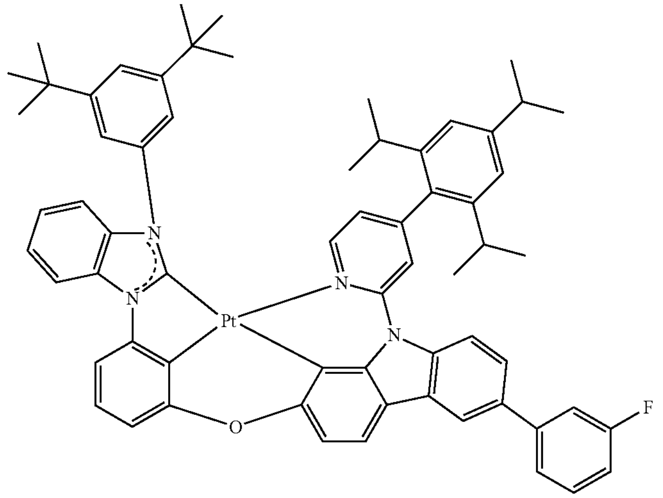
194
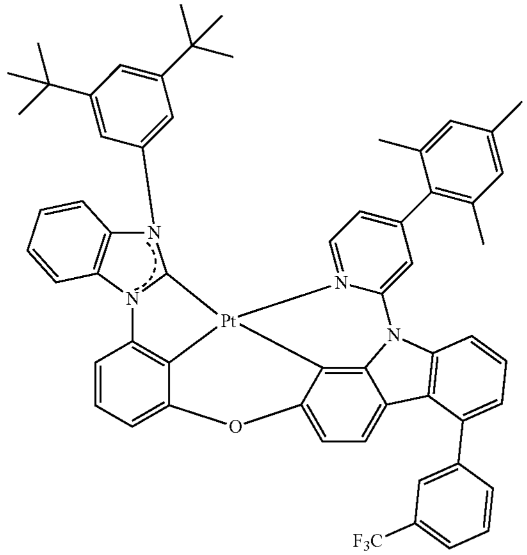
195
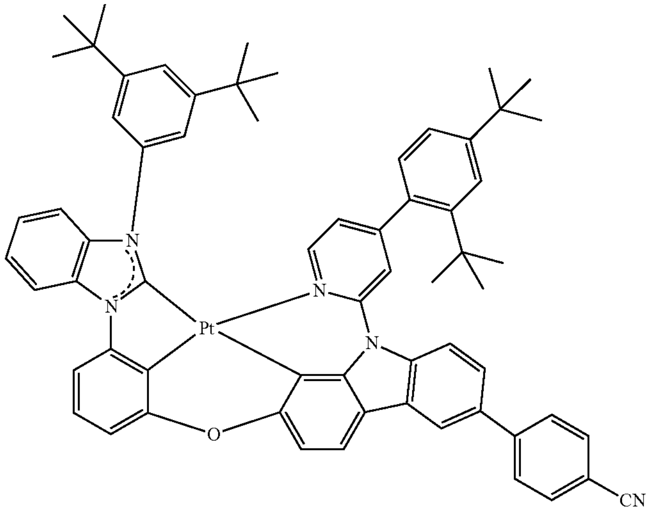

-continued
196
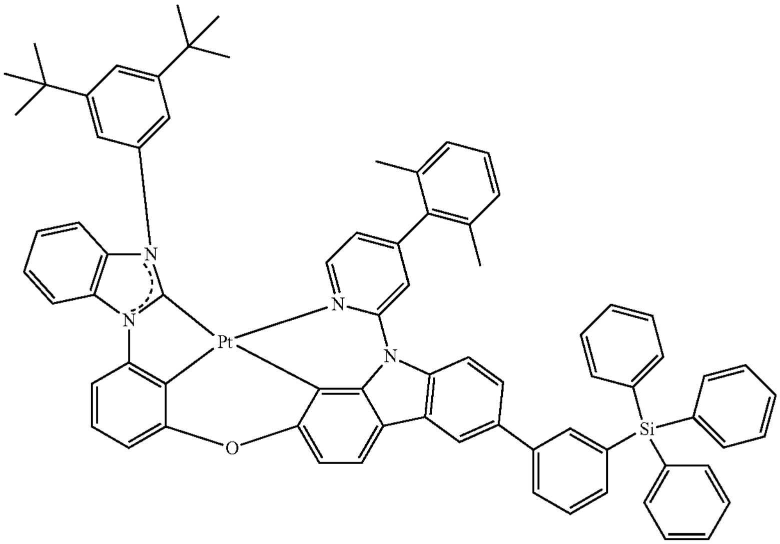
197
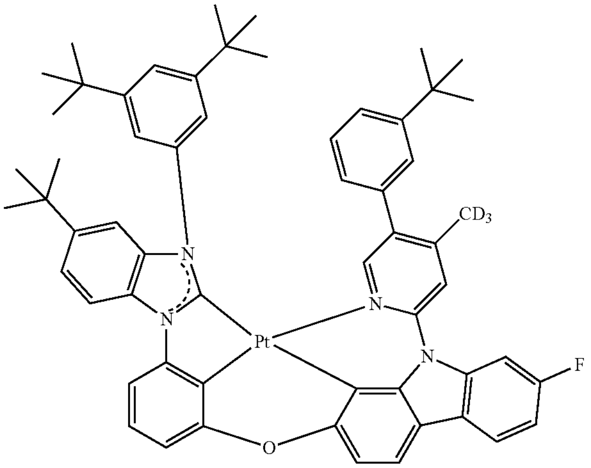
198
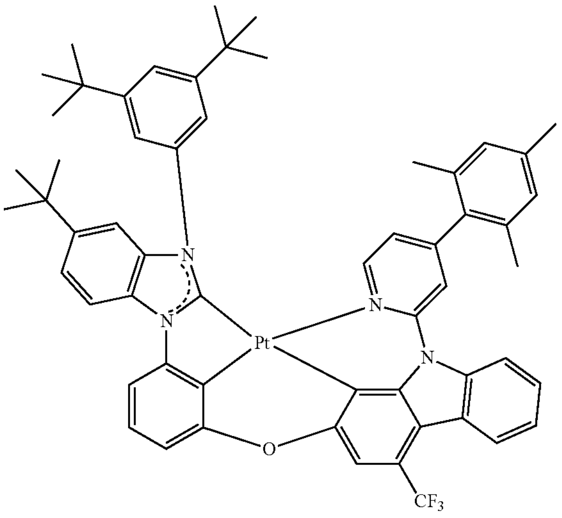

-continued
199
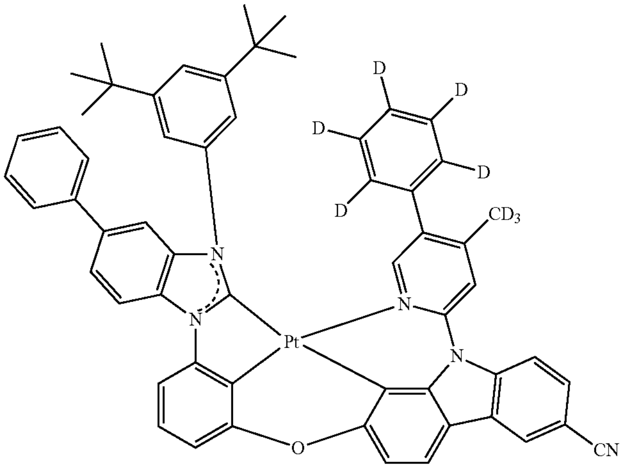
200
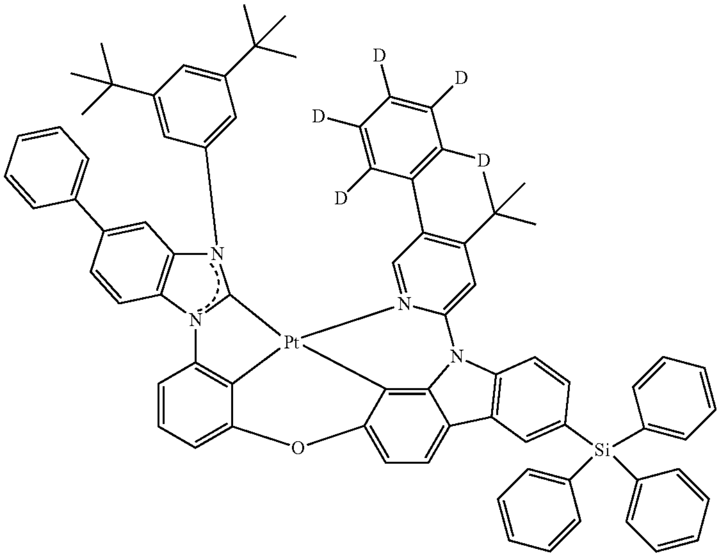
201
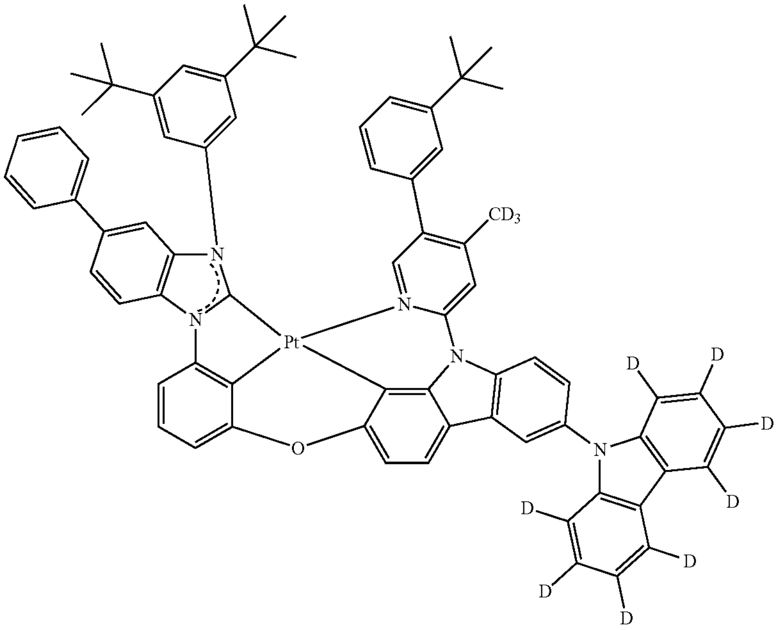

-continued
202
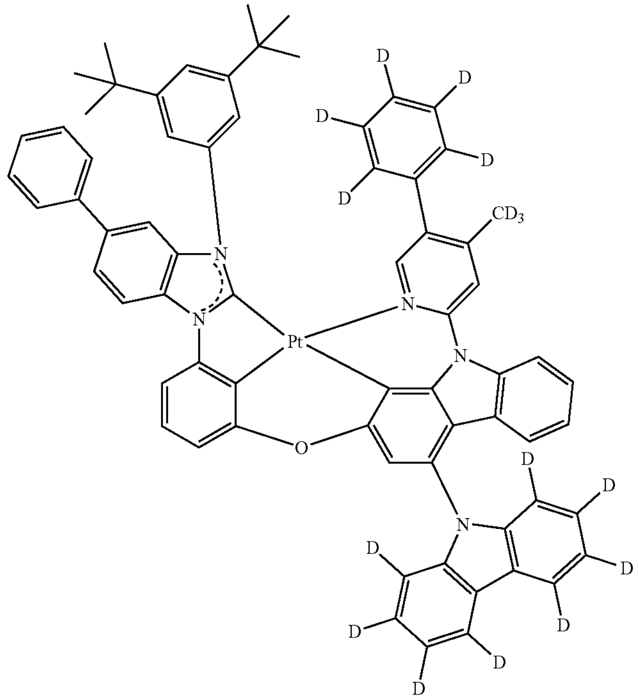
203
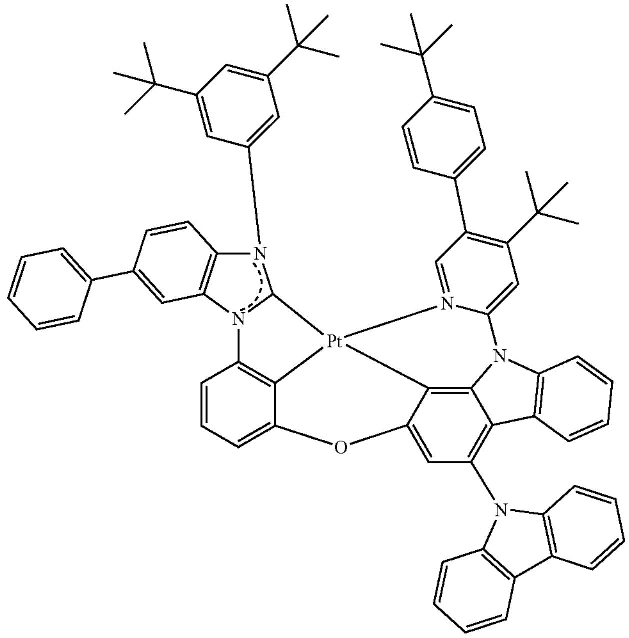

-continued
204
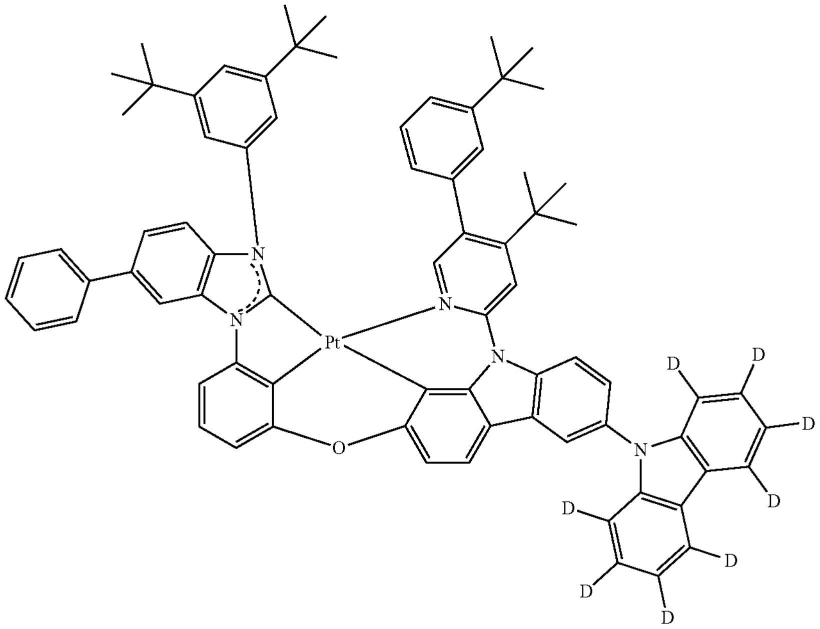
205
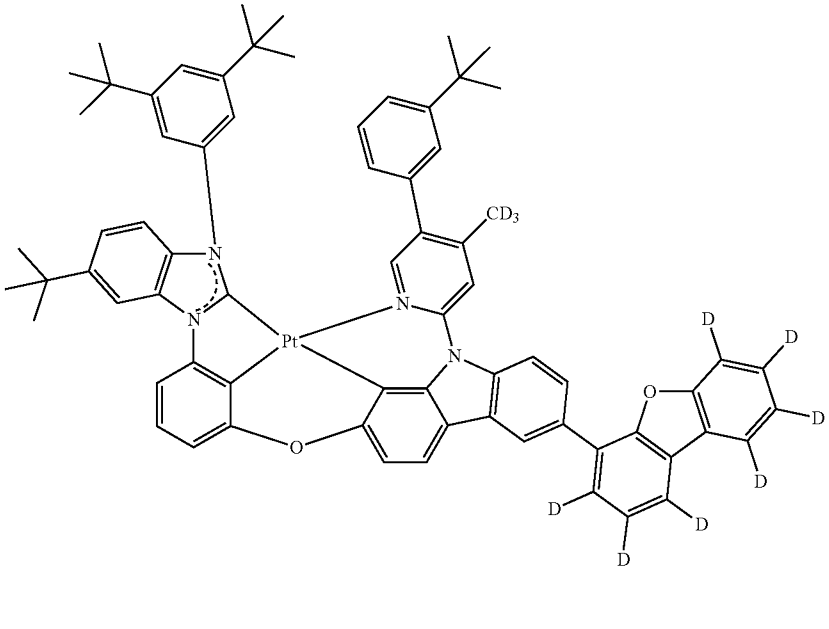

-continued
206
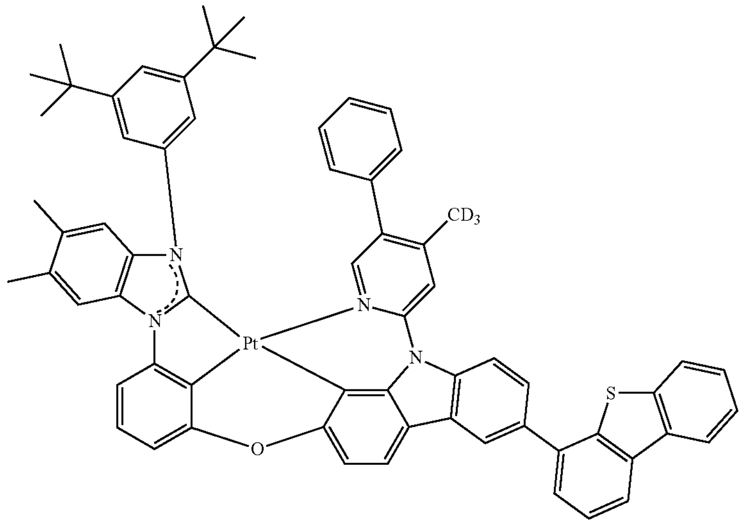
207
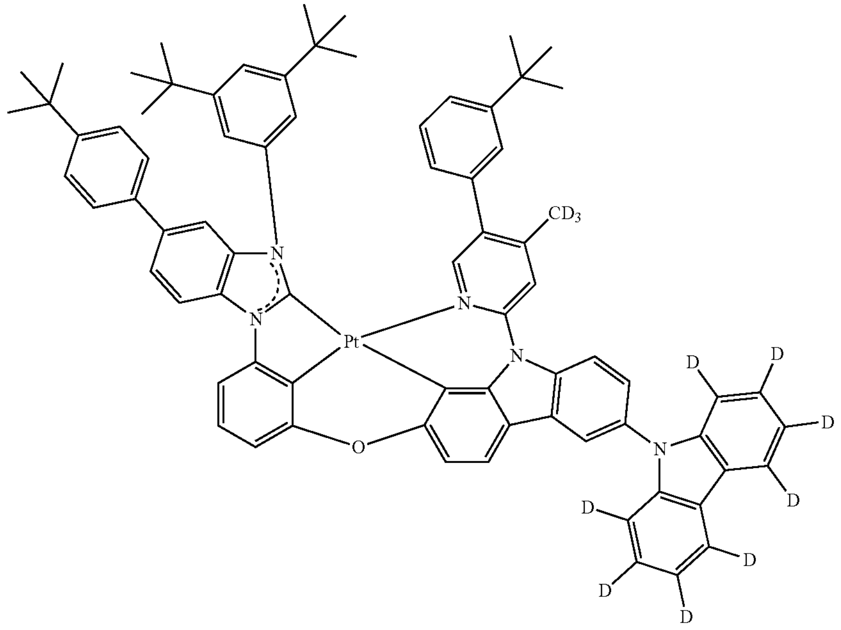

-continued
208
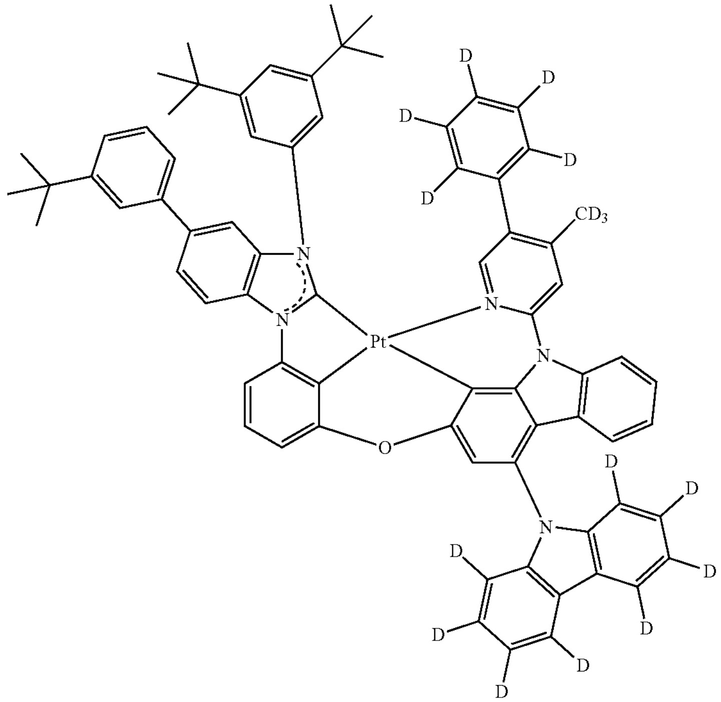
209
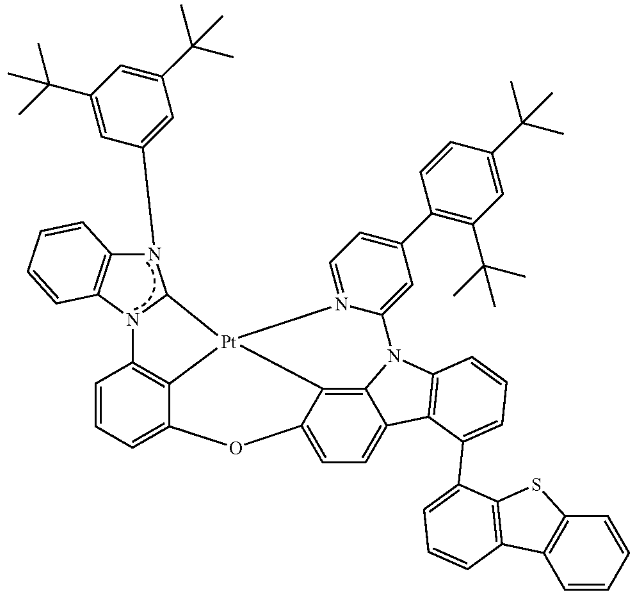

-continued
210
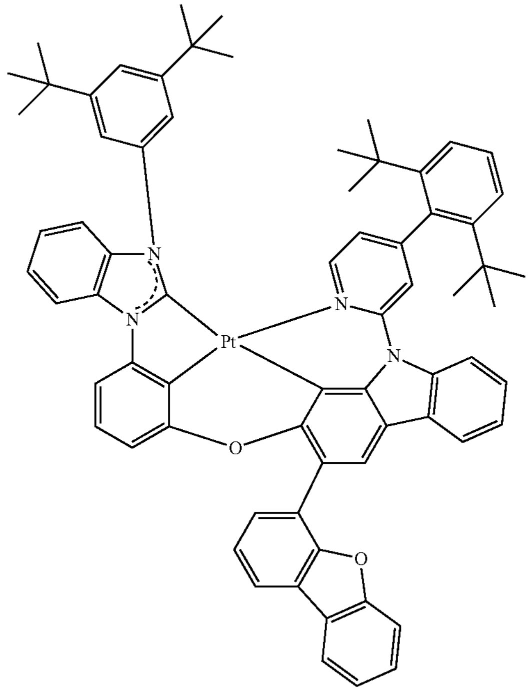
211
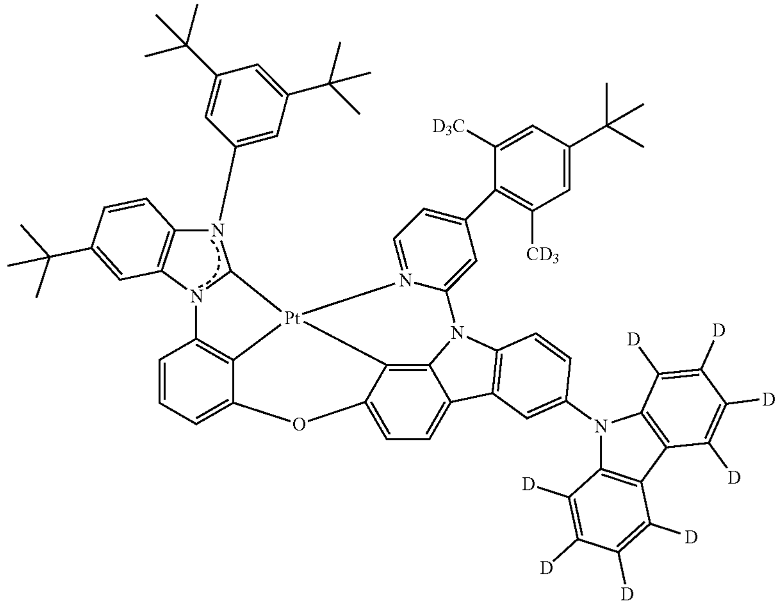

-continued
212
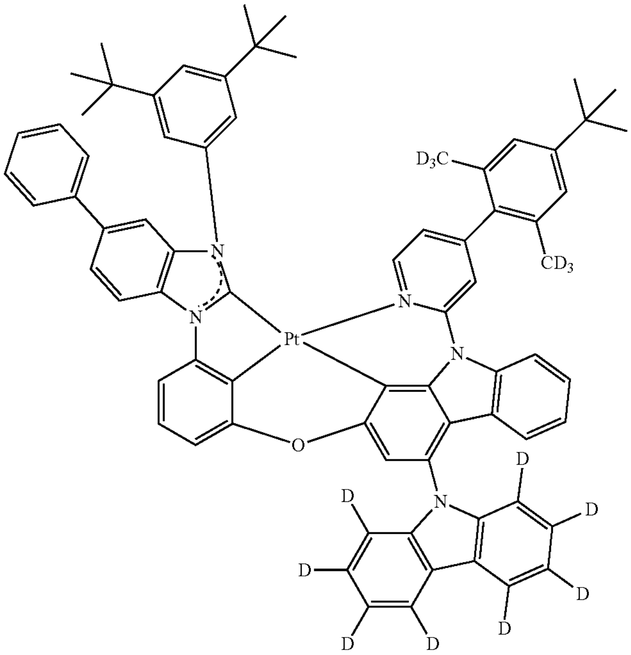
213
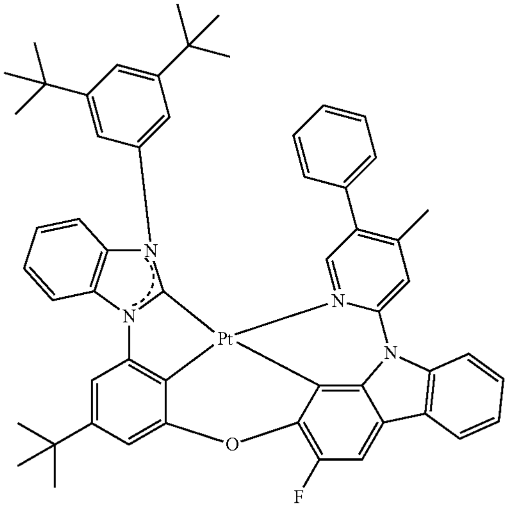

-continued
214
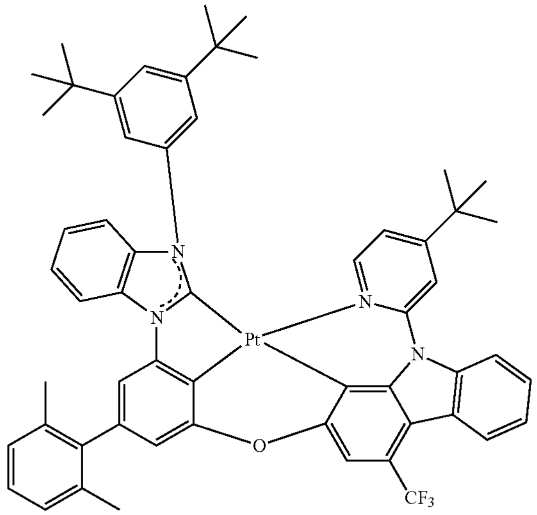
215
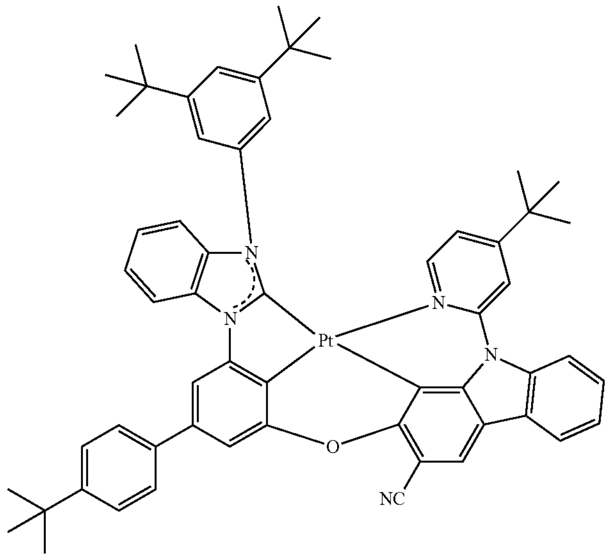

-continued
216
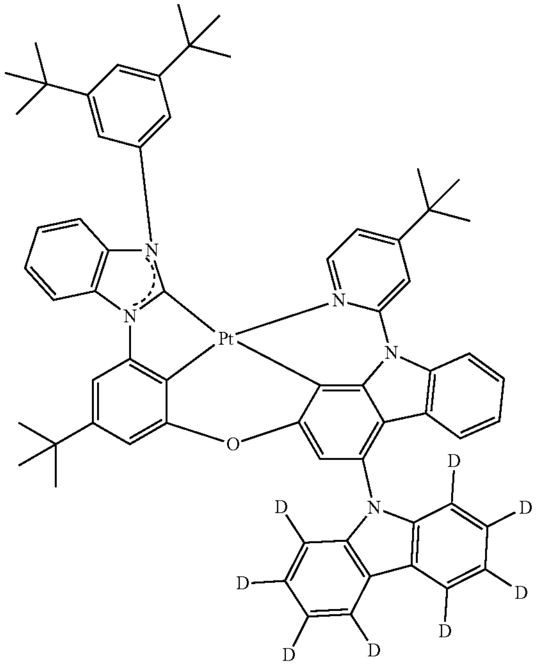
217
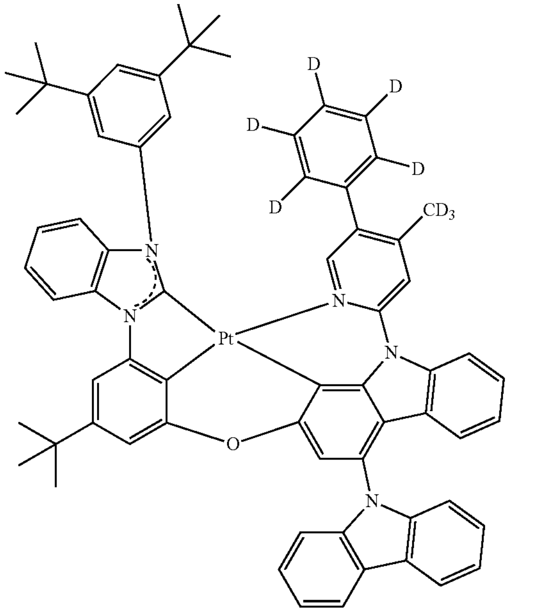

-continued
218
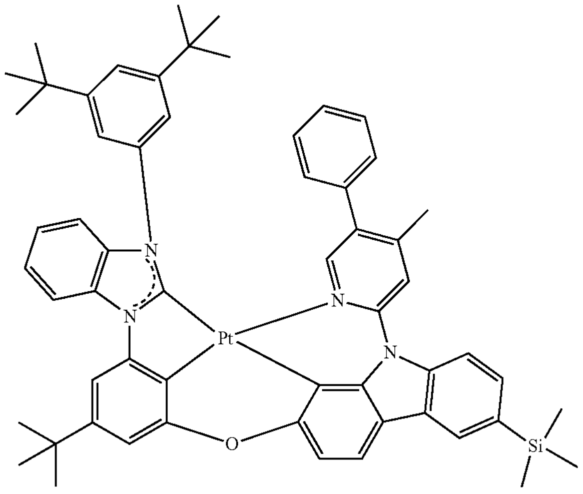
219
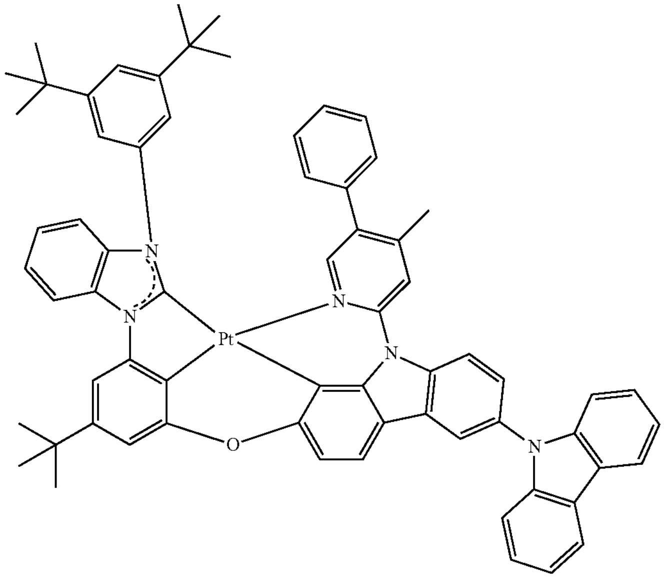

-continued
220
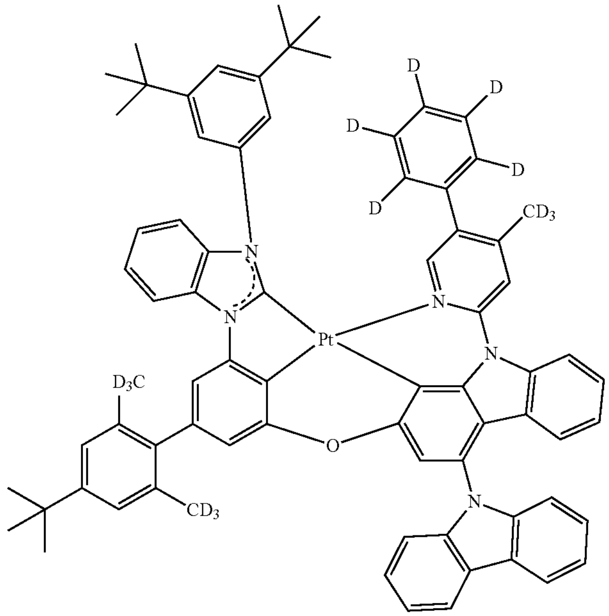
221
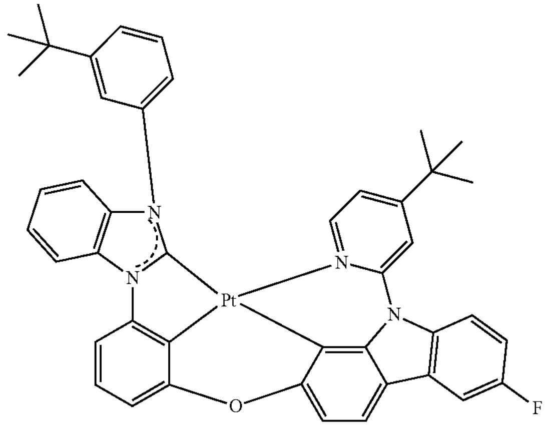
222
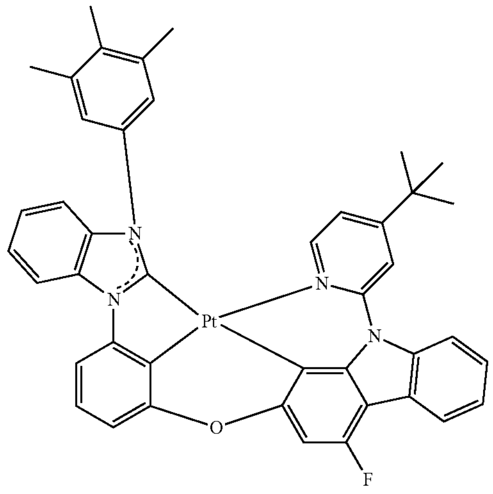

-continued
223
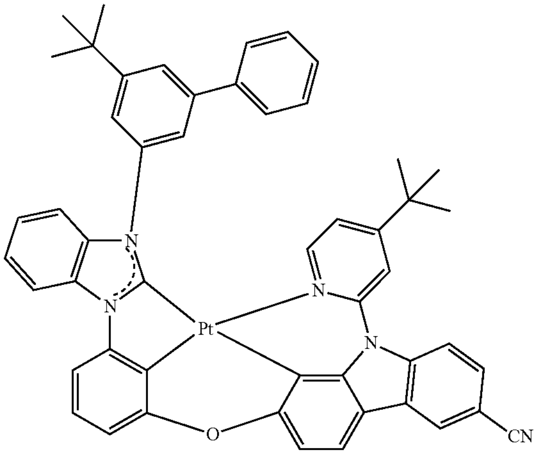
224
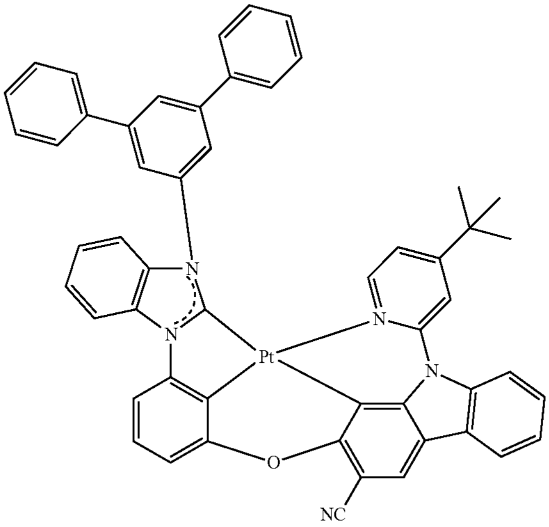
225
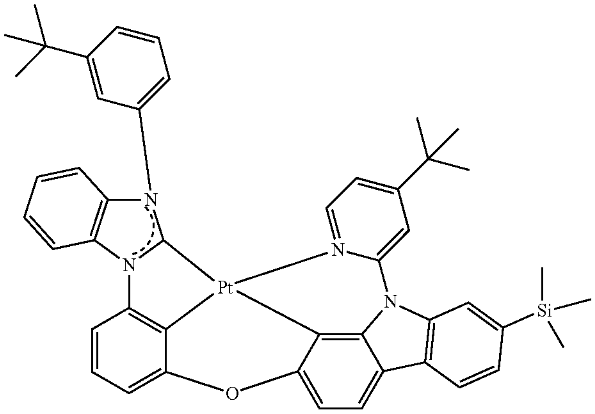

-continued
226
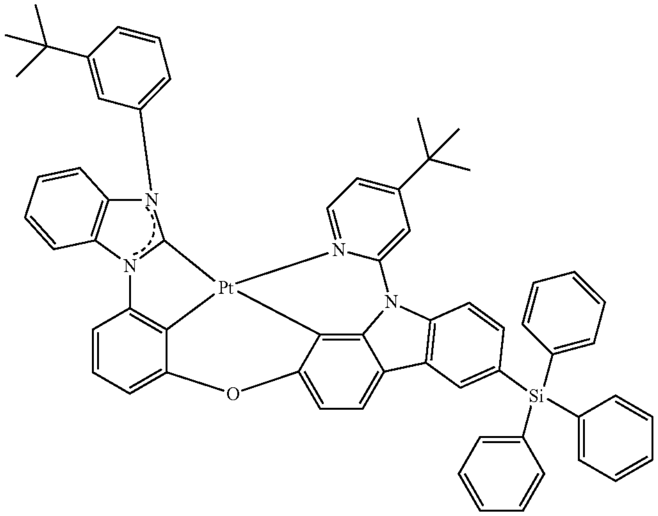
227
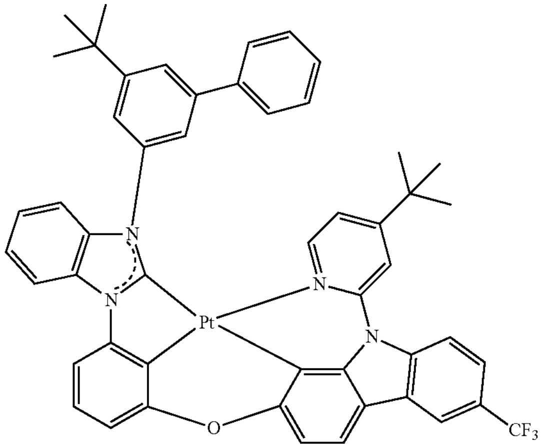
228
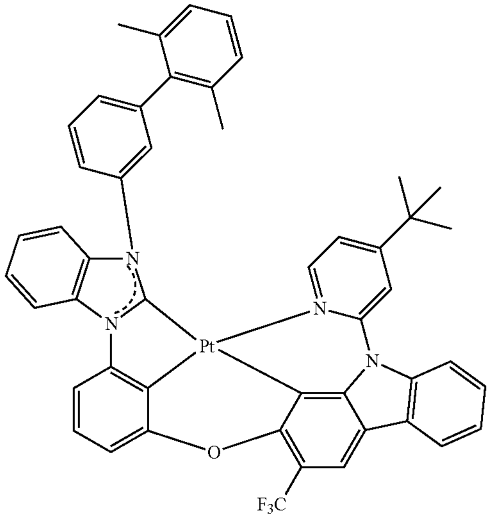

-continued
229
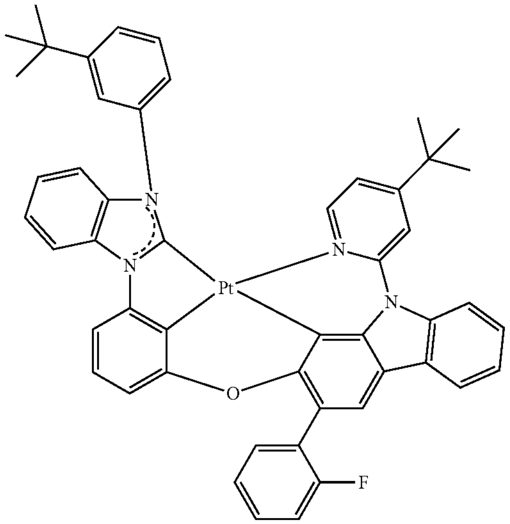
230
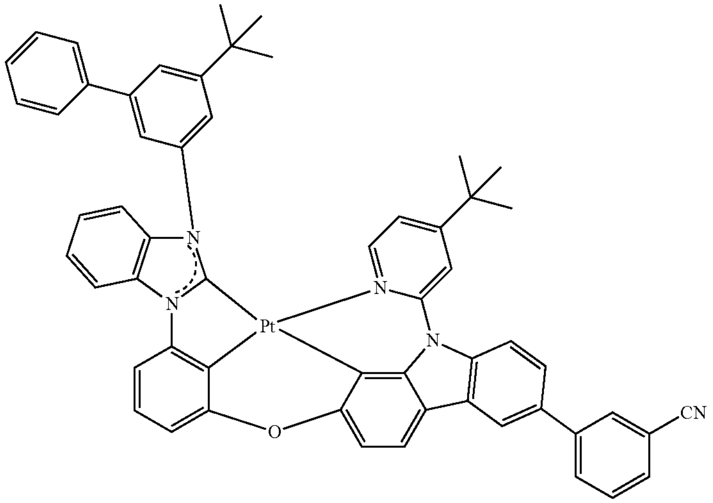
231
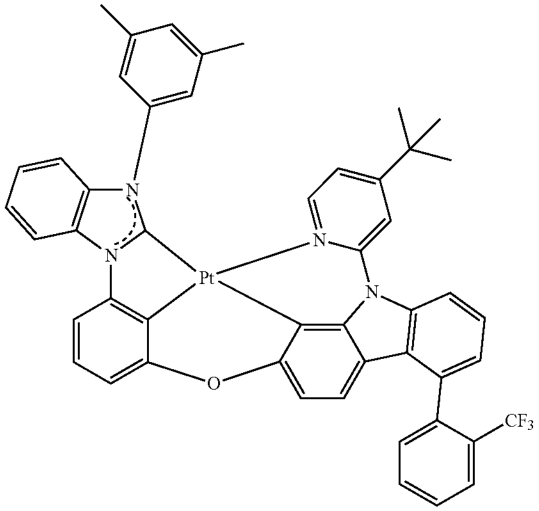

-continued
232
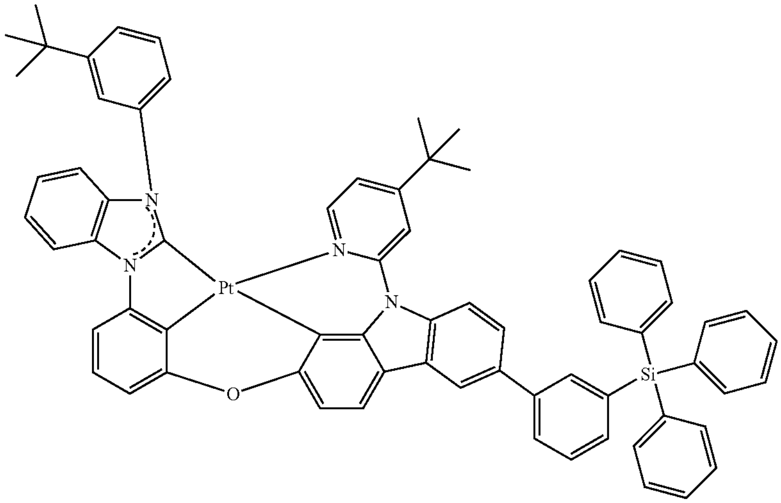
233
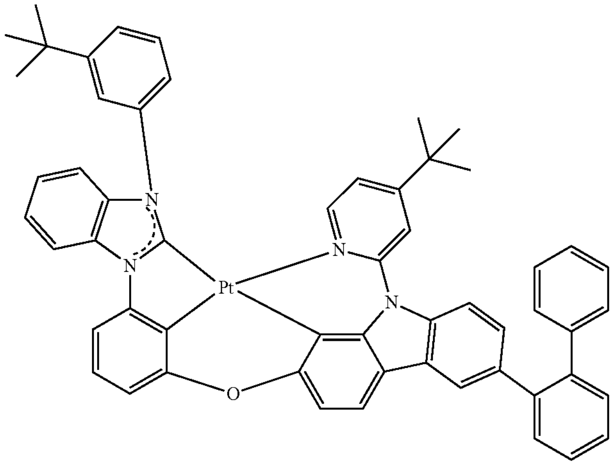
234
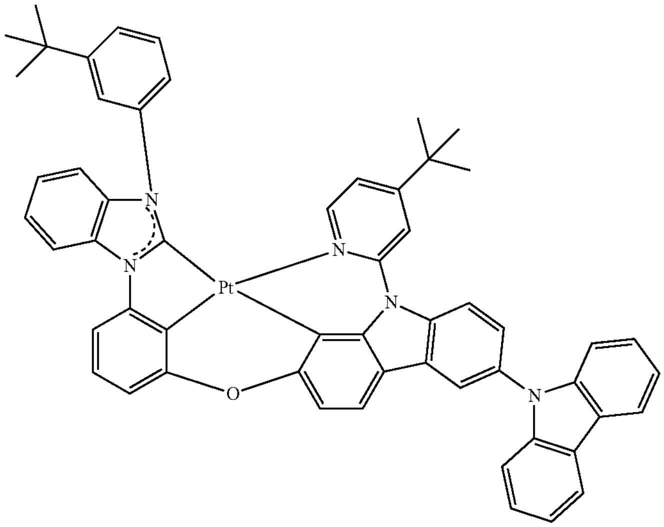

-continued
235
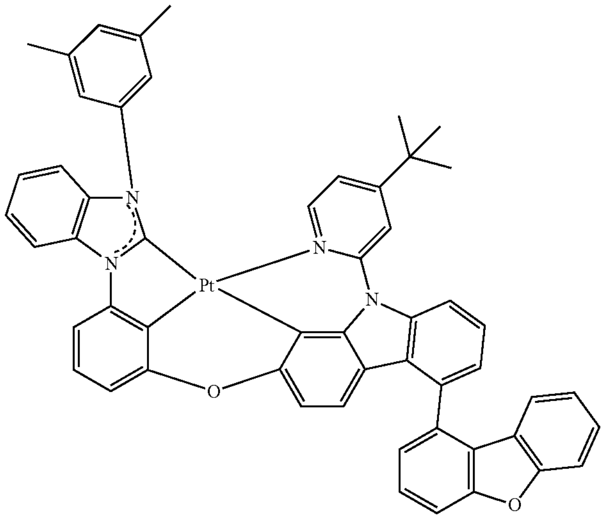
236
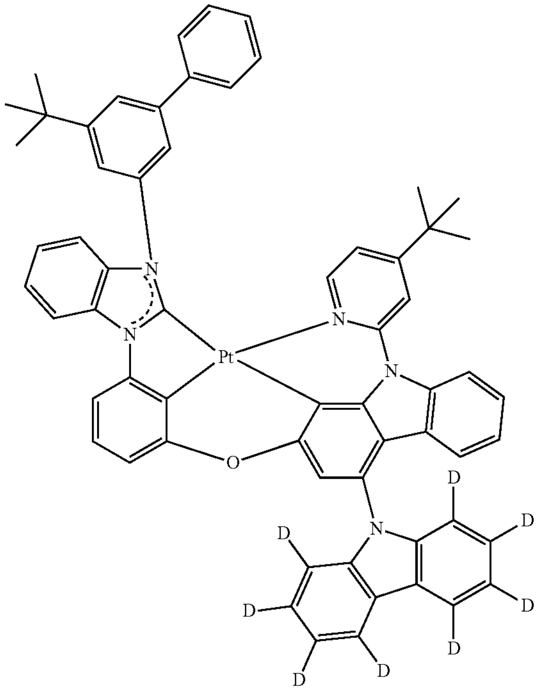

-continued
237
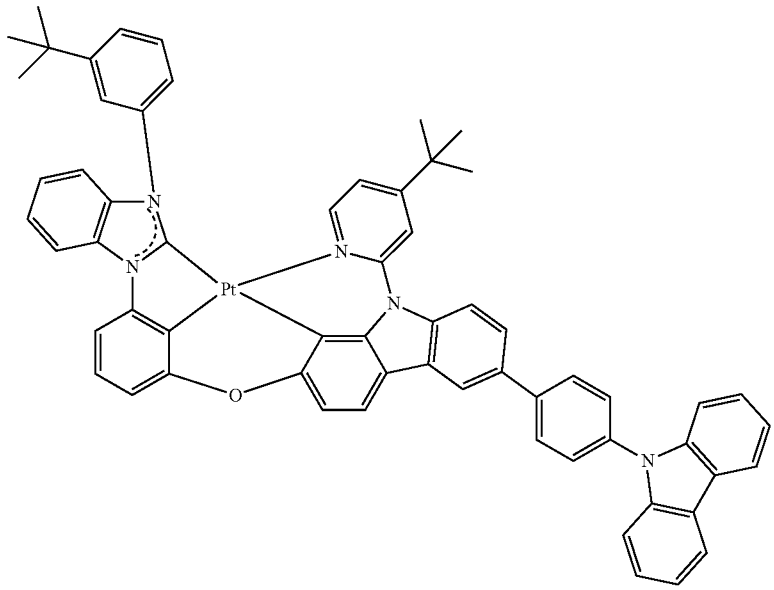
238
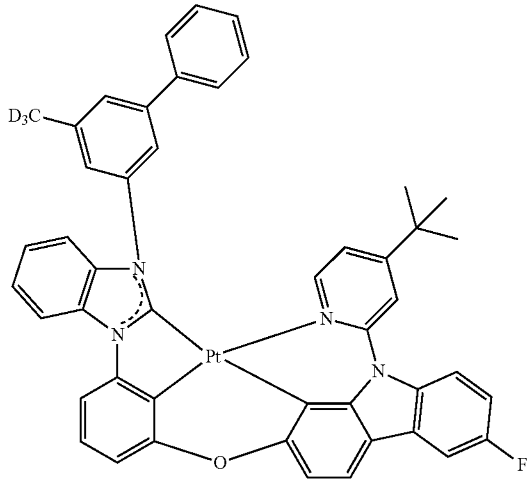
239
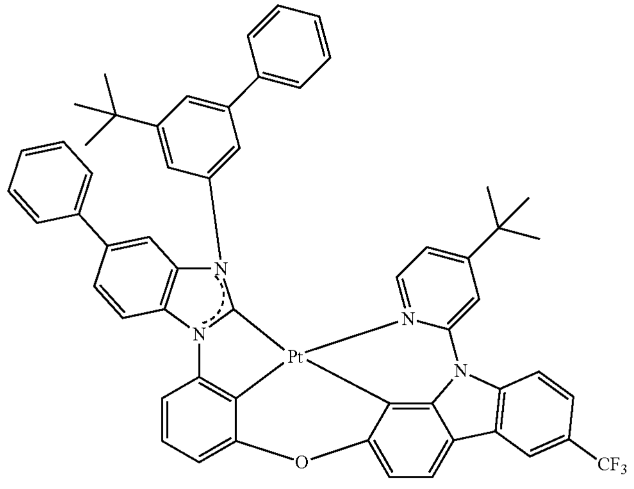

-continued
240
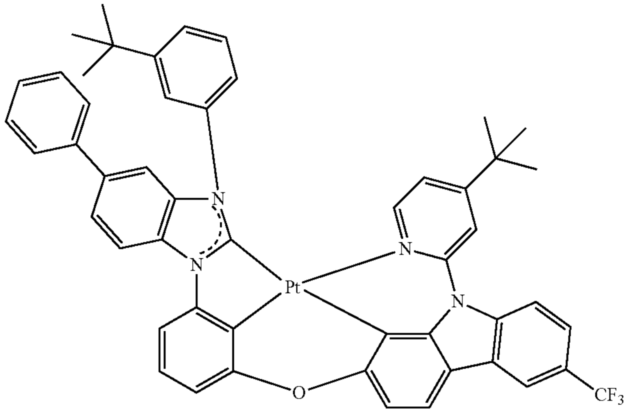
241
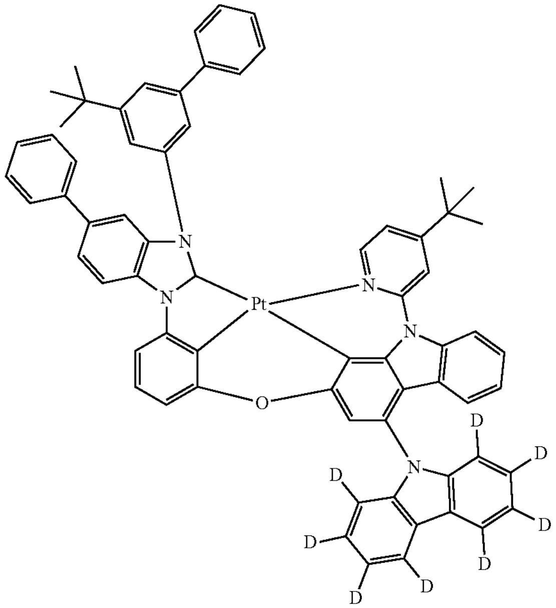
242
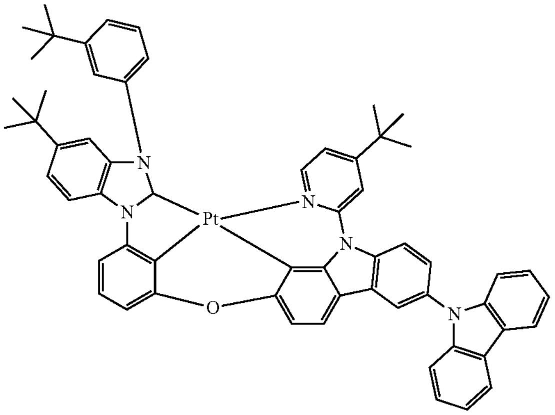
243
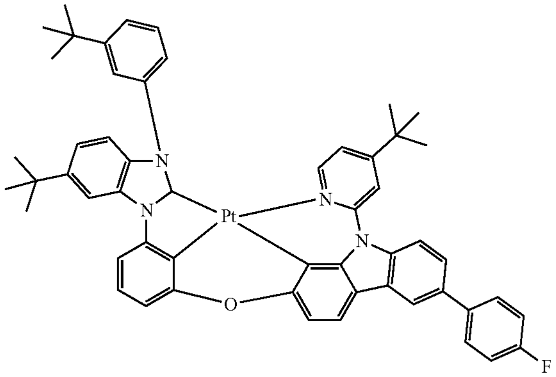
244
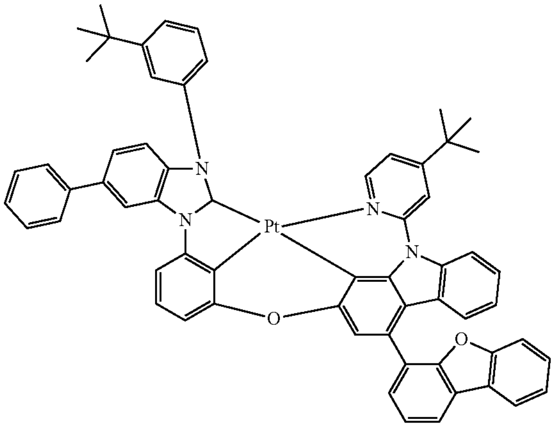

-continued
245
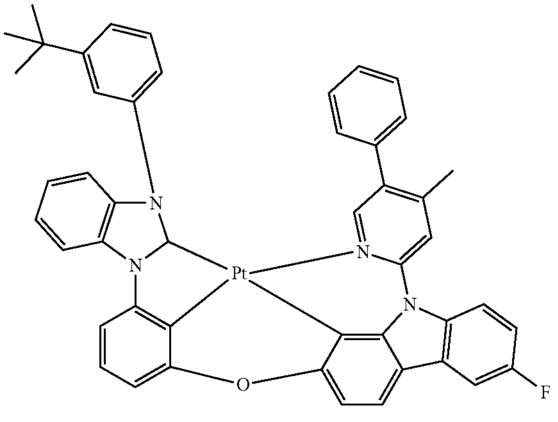
246
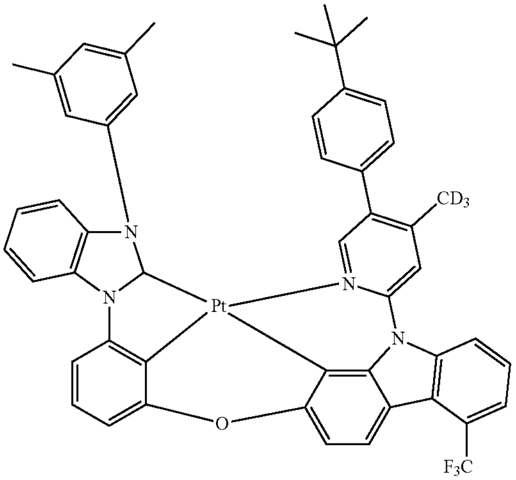
247
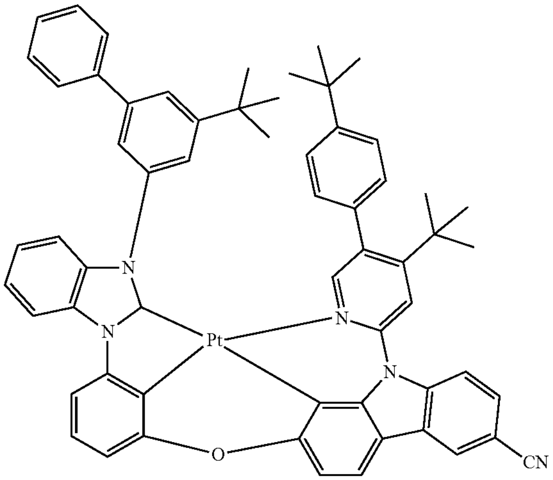
248
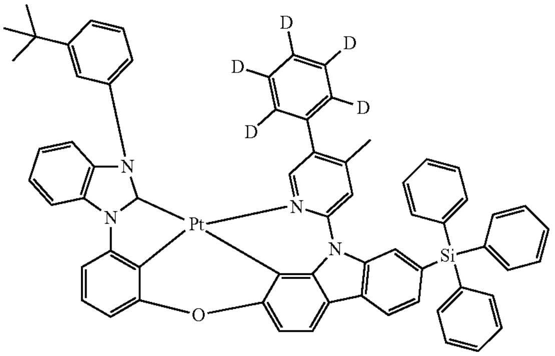
249
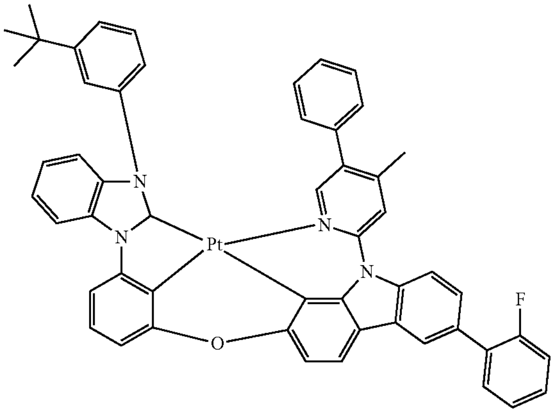
250
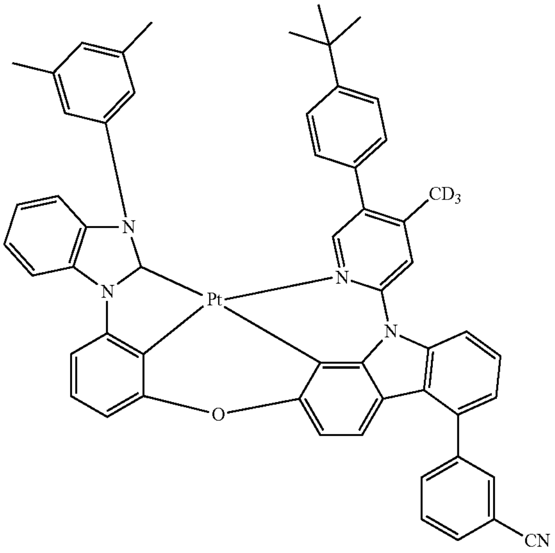

-continued
251
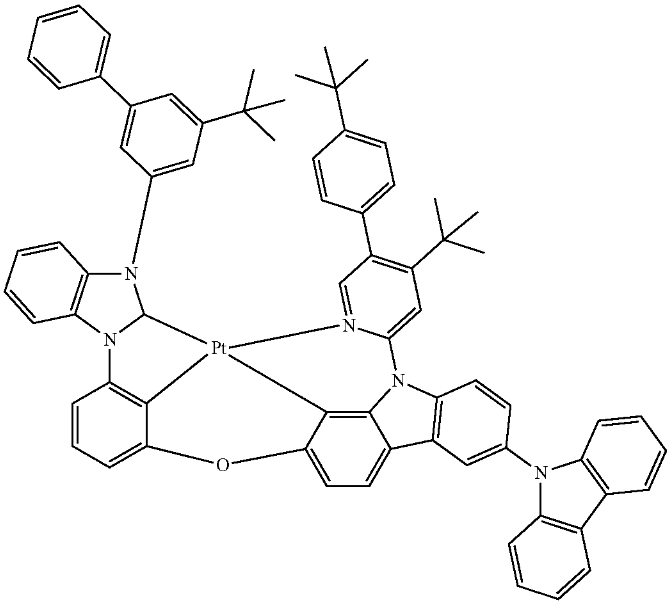
252
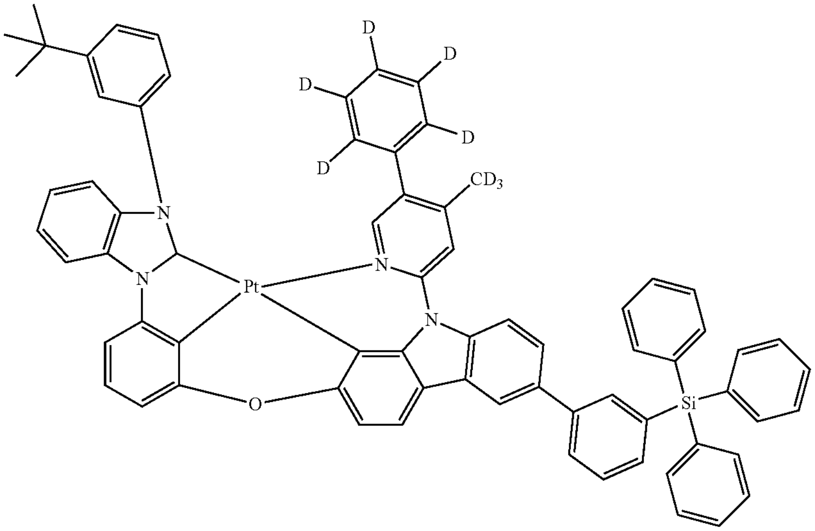

-continued
253
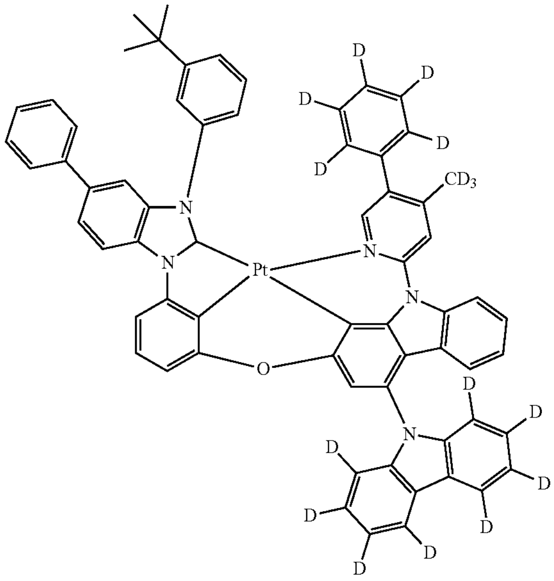
254
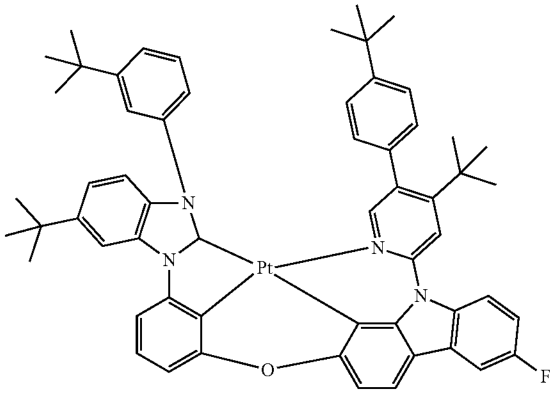
255
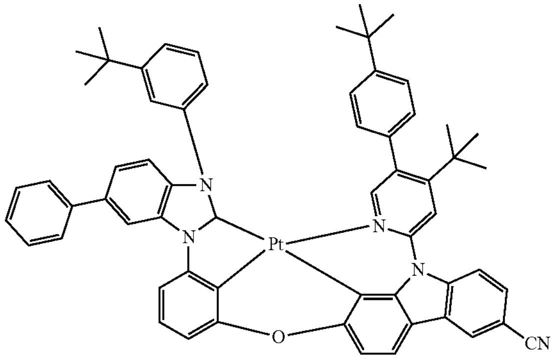
256
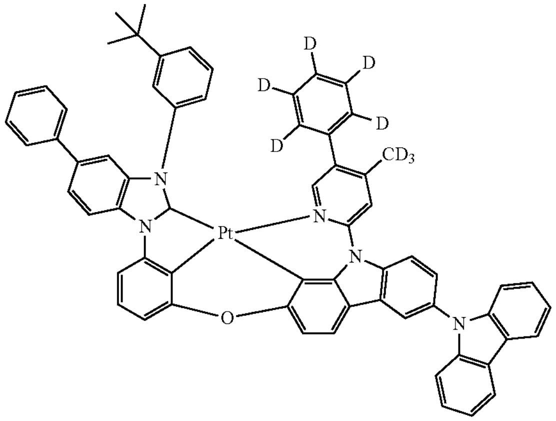
257
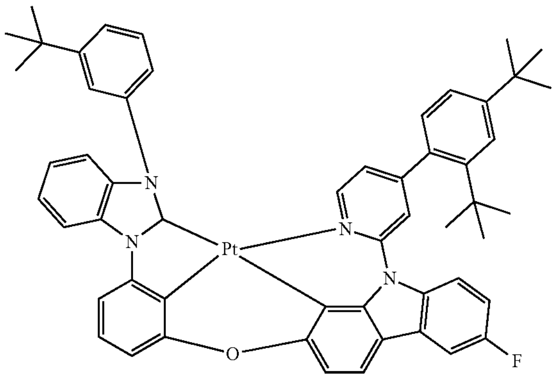
258
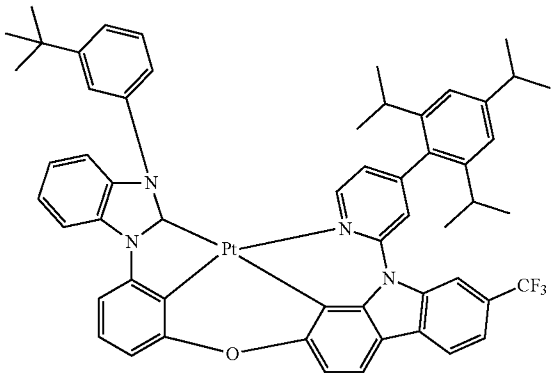

-continued
259
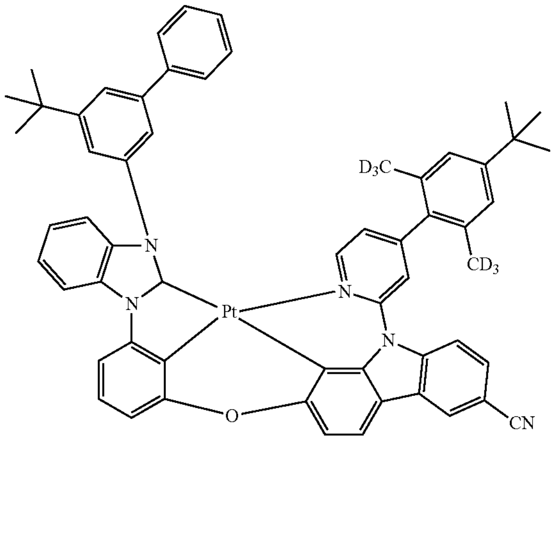
260
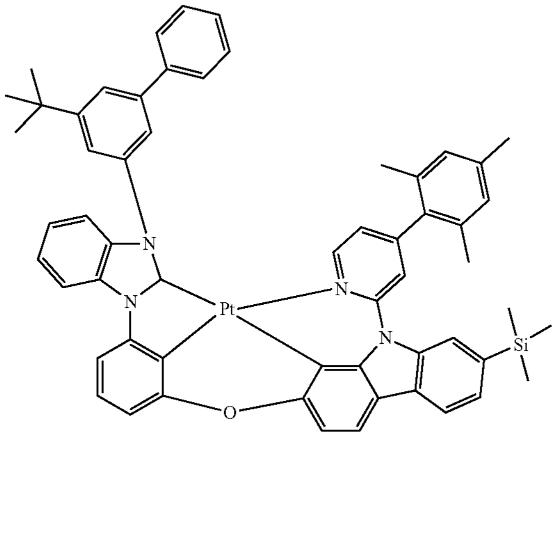
261
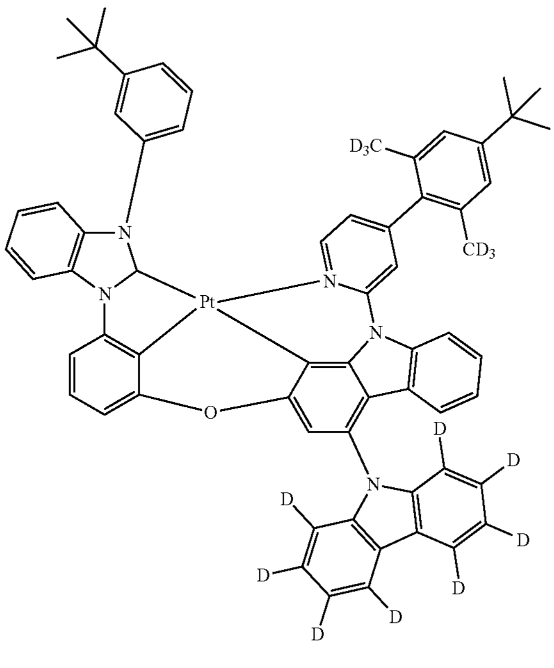
262
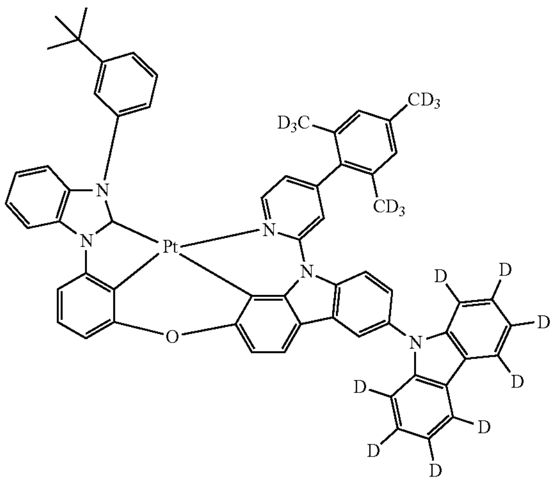

-continued
263
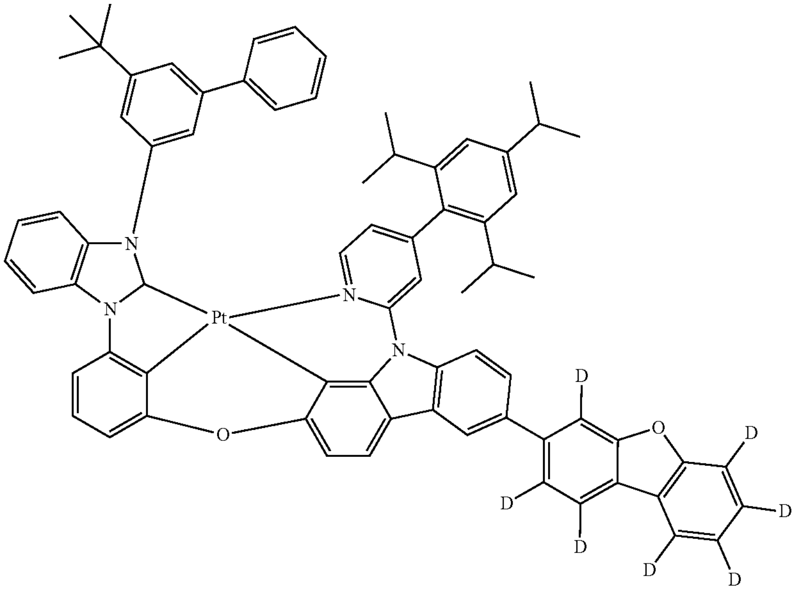
264
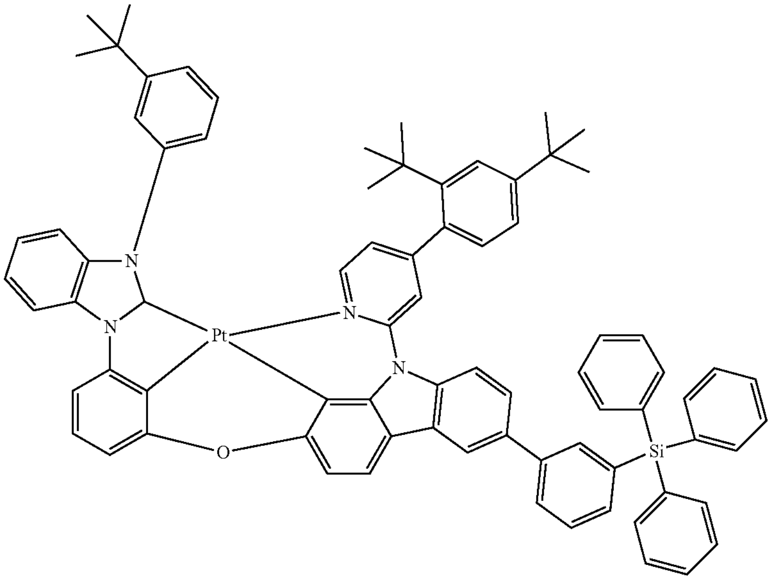
265
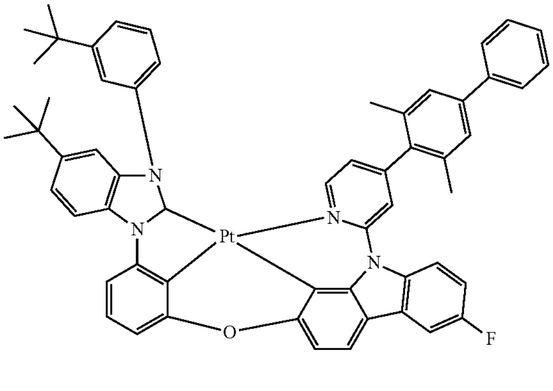
266
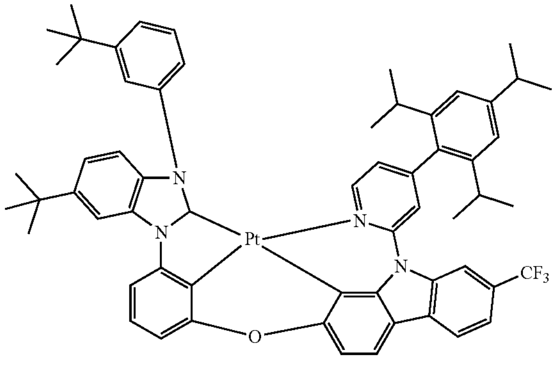

-continued
267
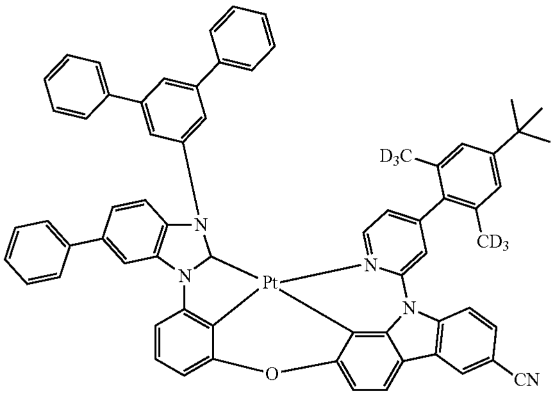
268
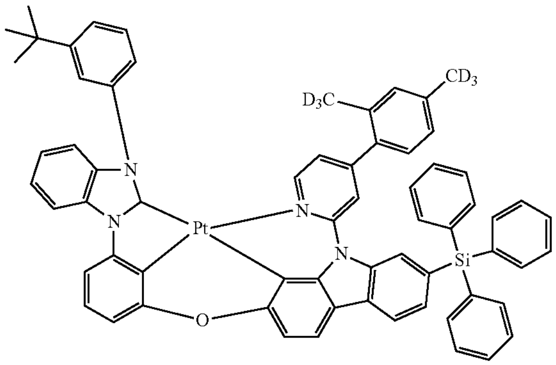
269
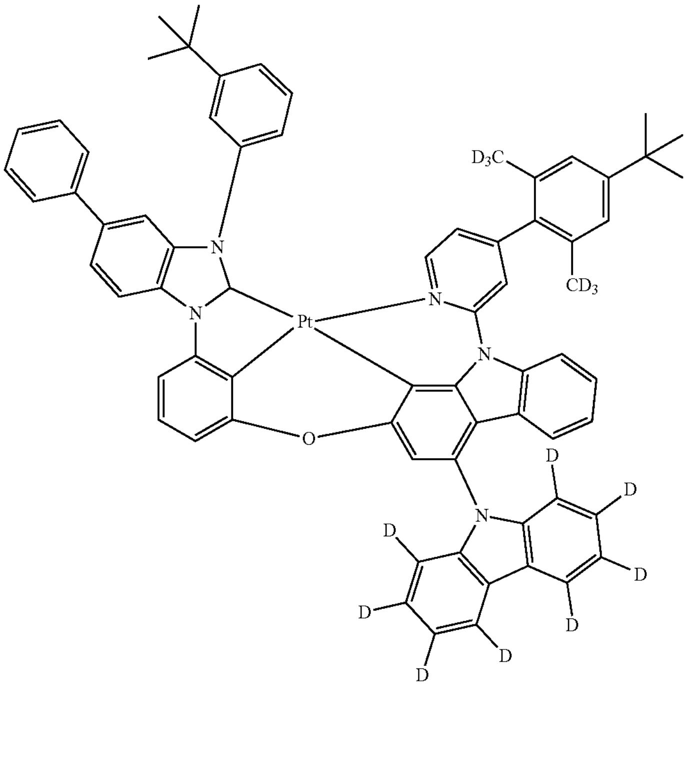

-continued
270
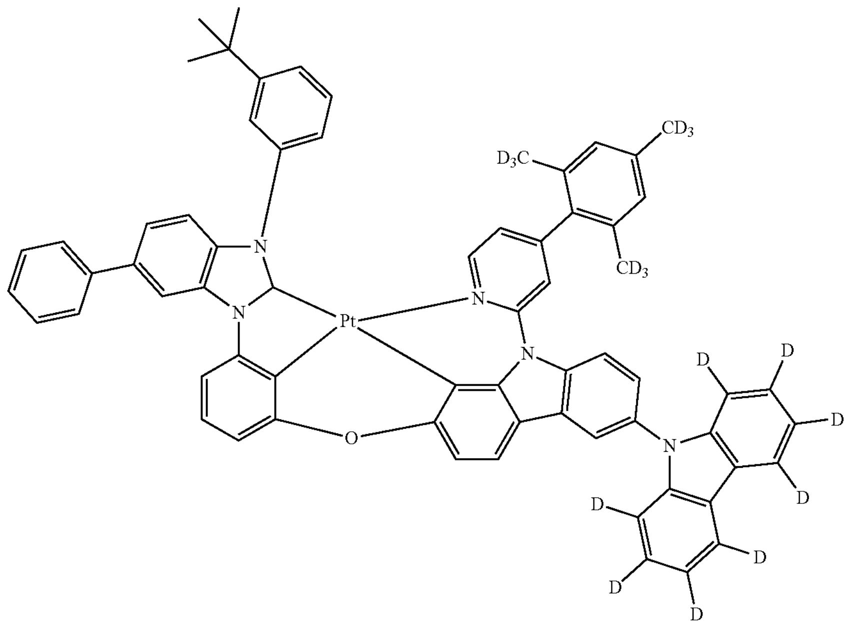
271
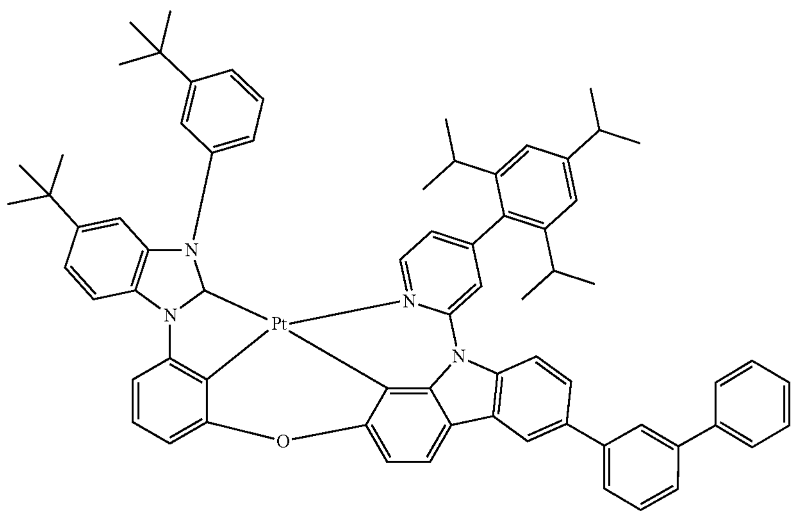

-continued
272
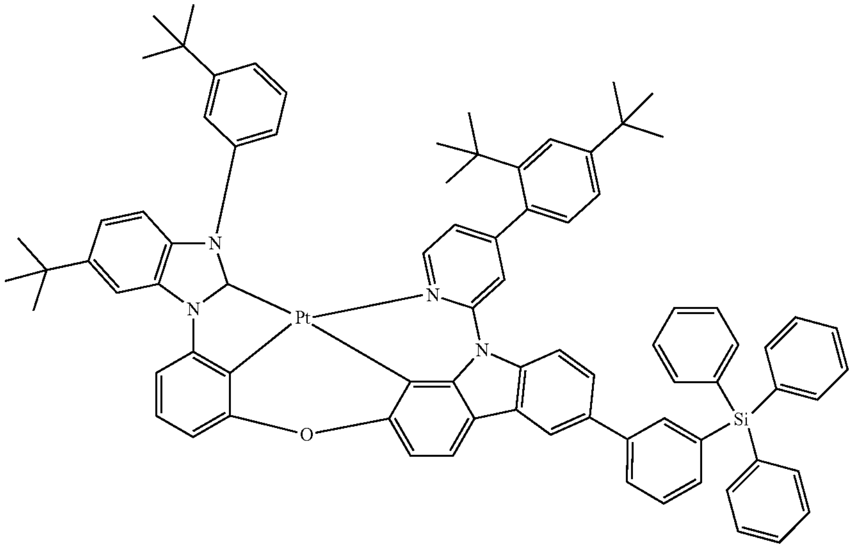
273
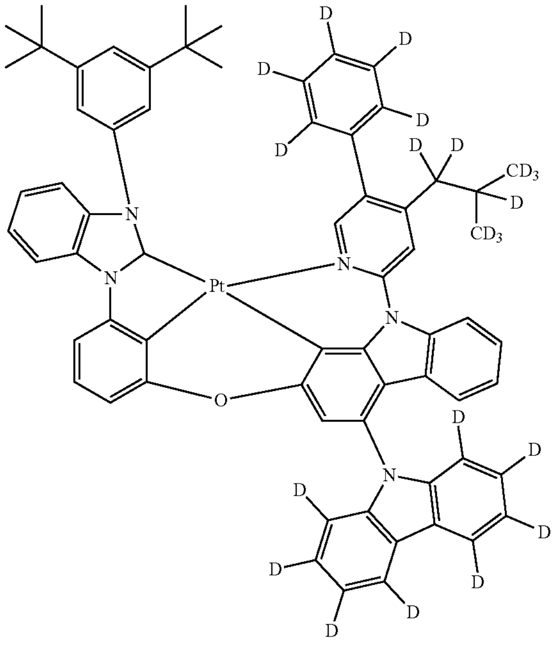

-continued
274
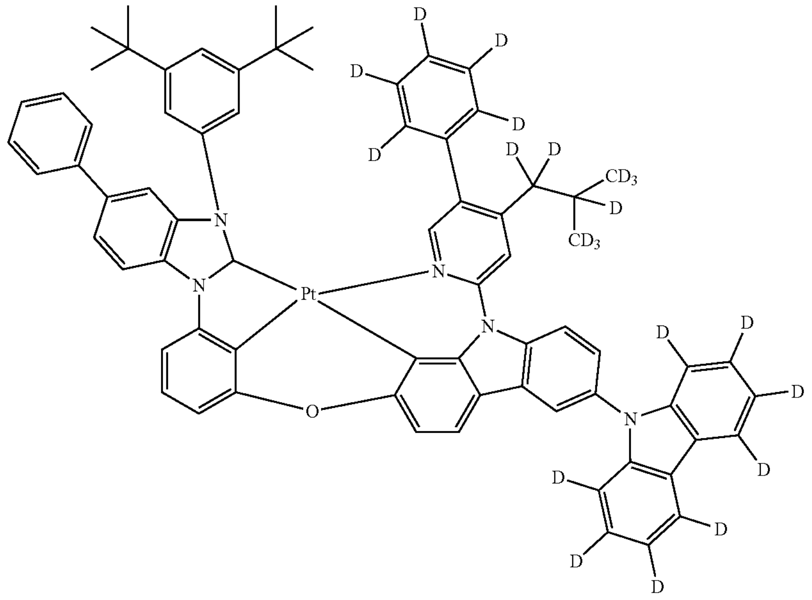
275
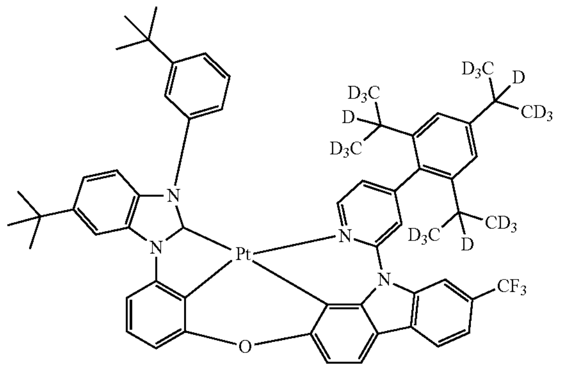
276
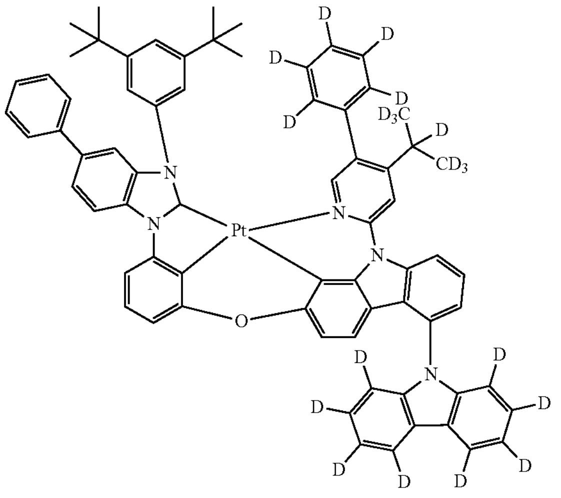

-continued
277
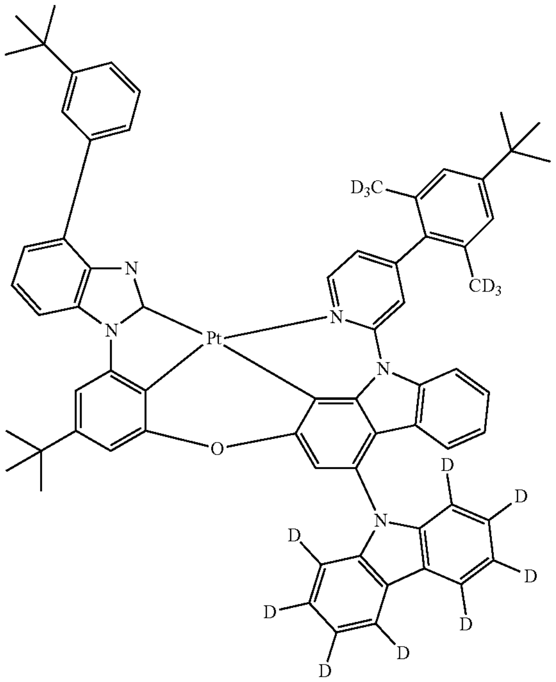
278
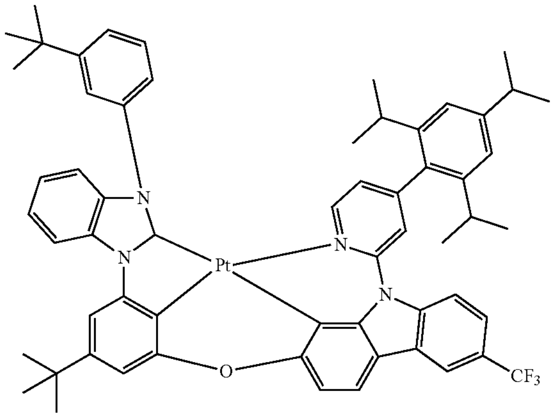
279
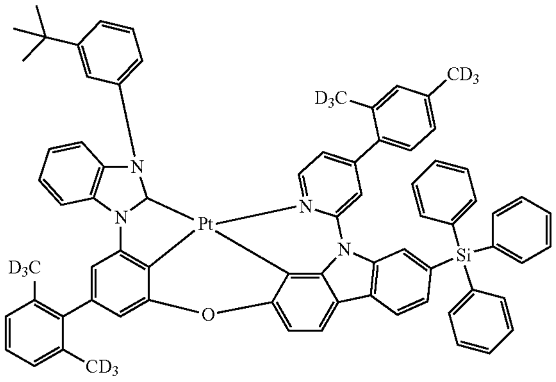
280
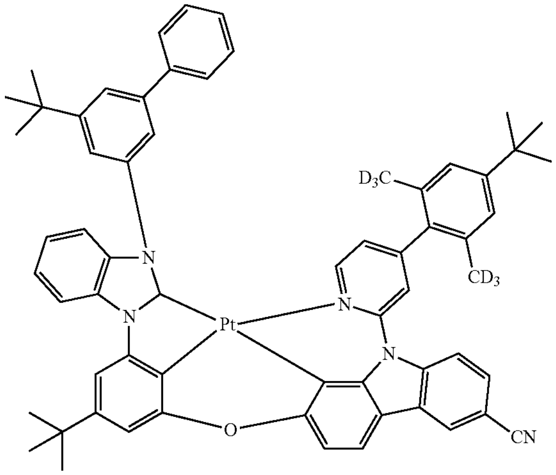
281
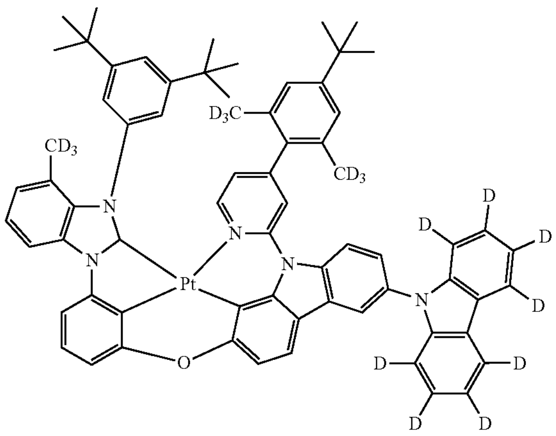
282
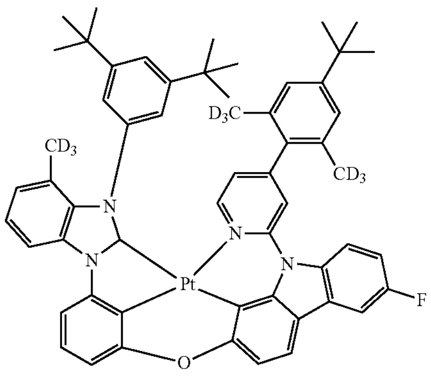

-continued
283
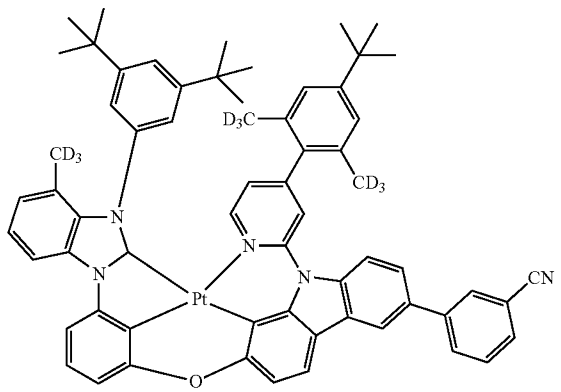
284
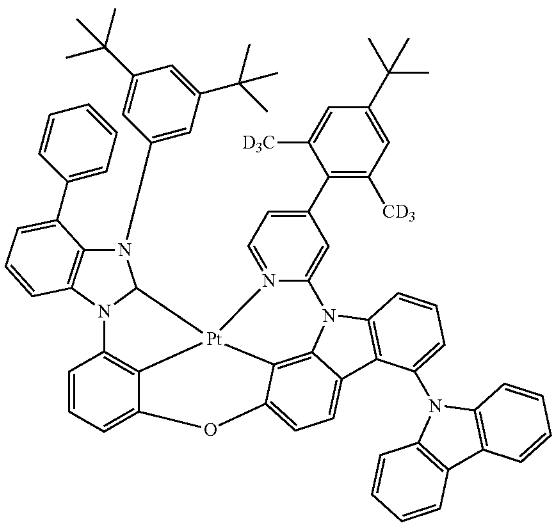
285
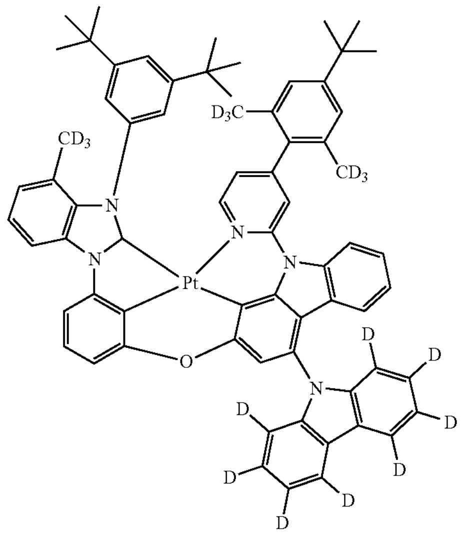
286
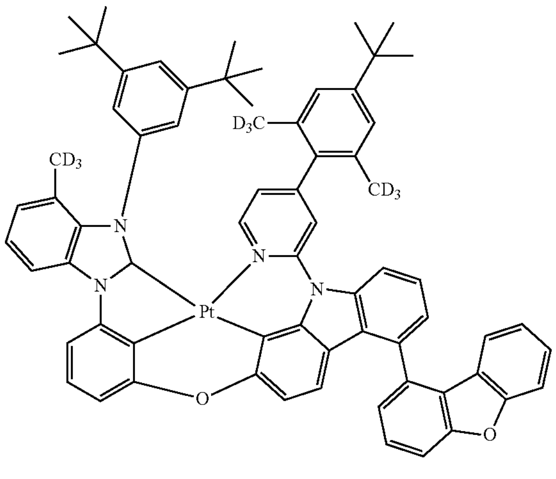

-continued
287
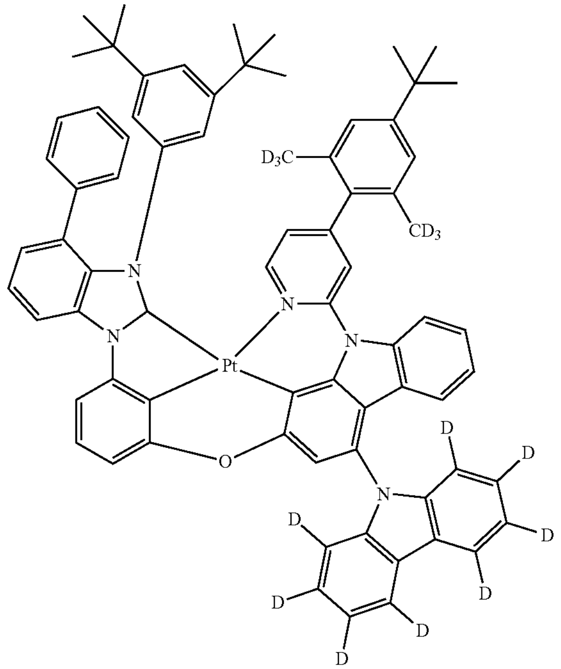
288
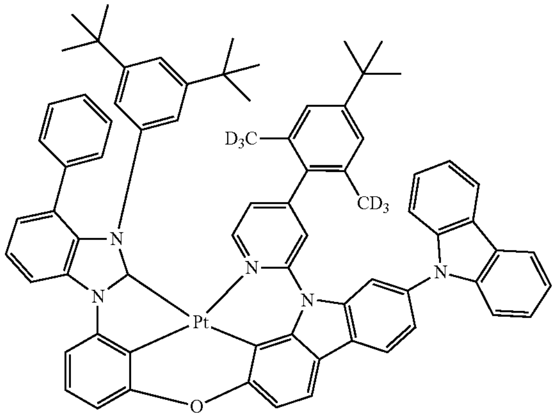
289
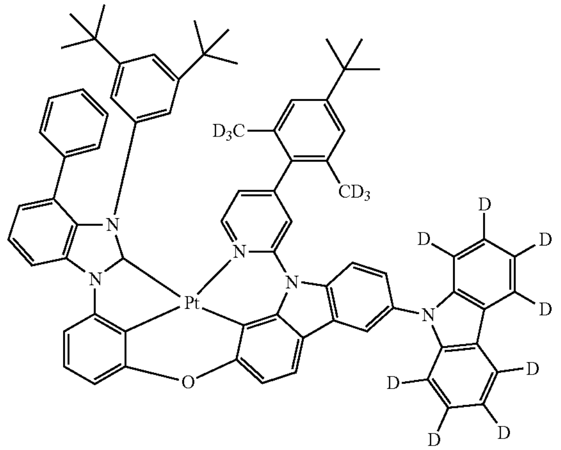
290
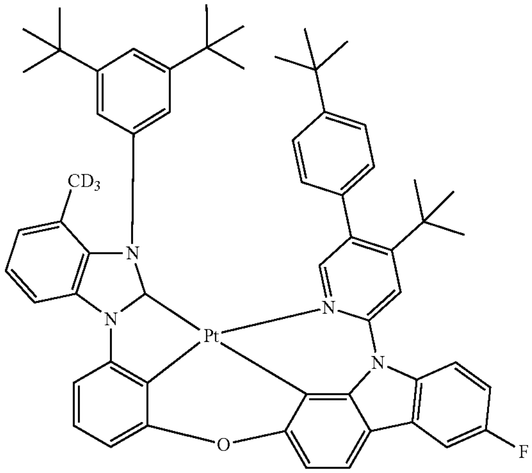

-continued
291
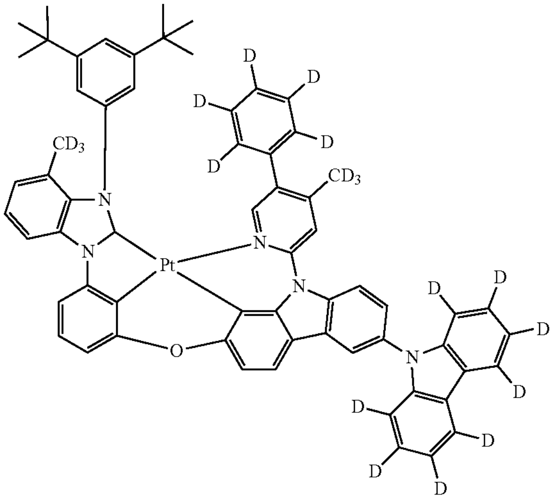
292
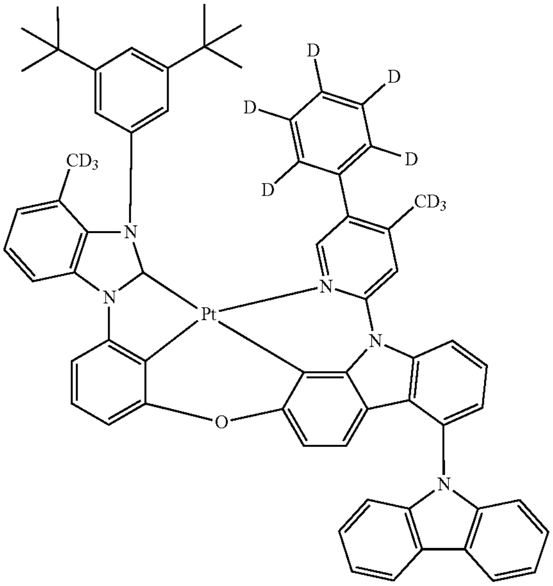
293
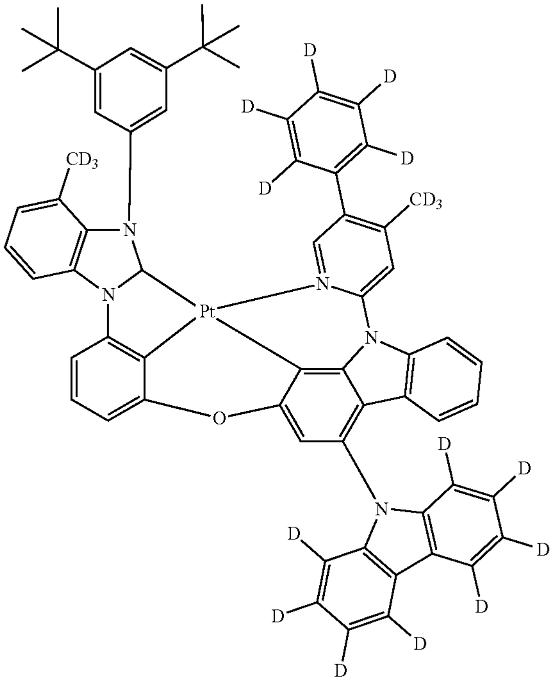
294
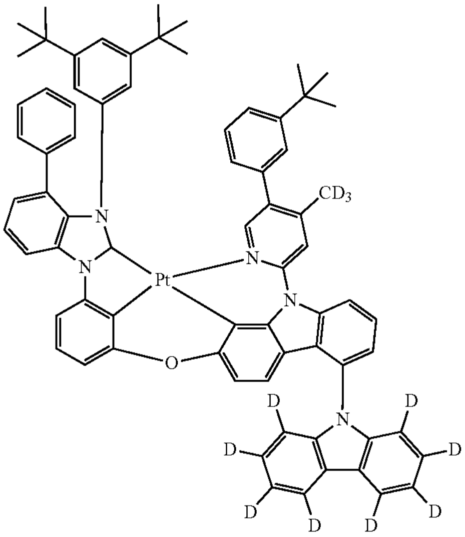

-continued
295
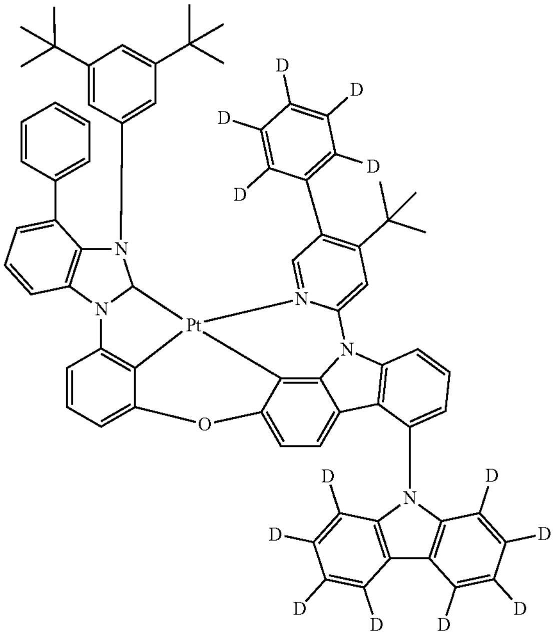
296
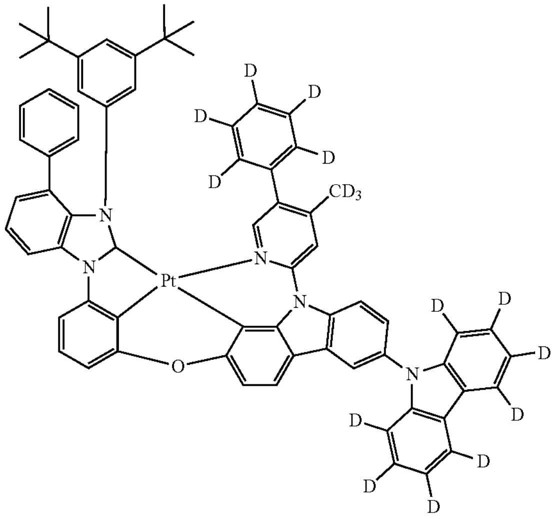
297
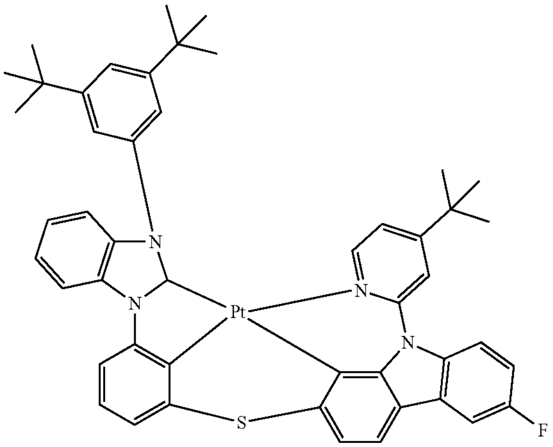
298
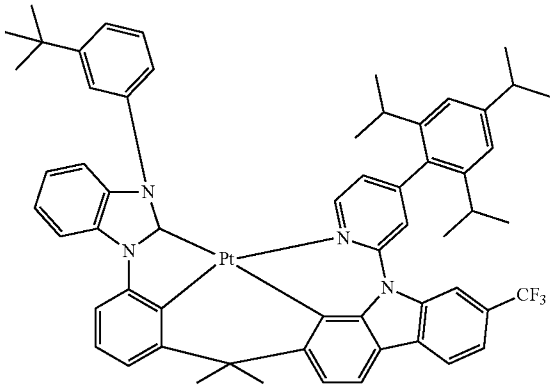

-continued
299
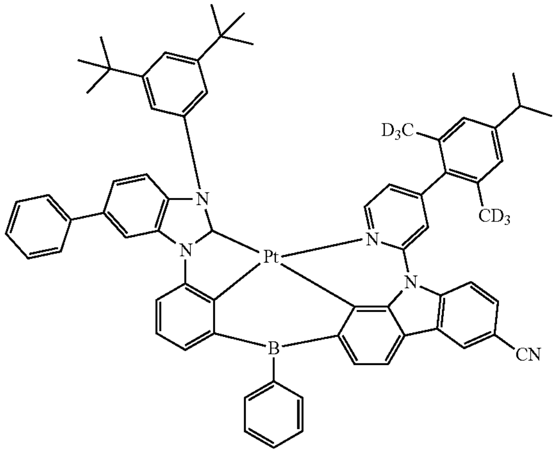
300
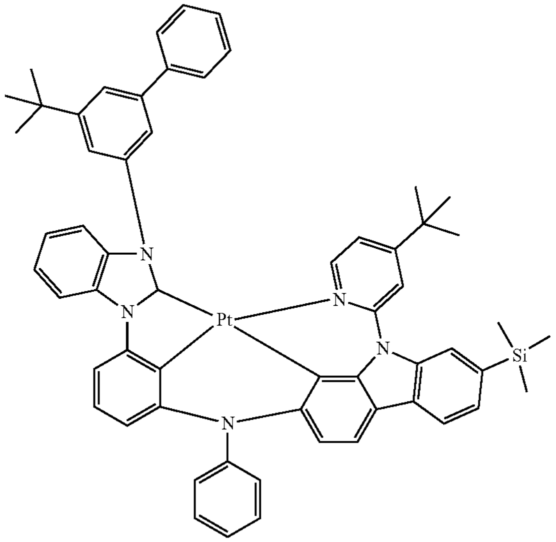
301
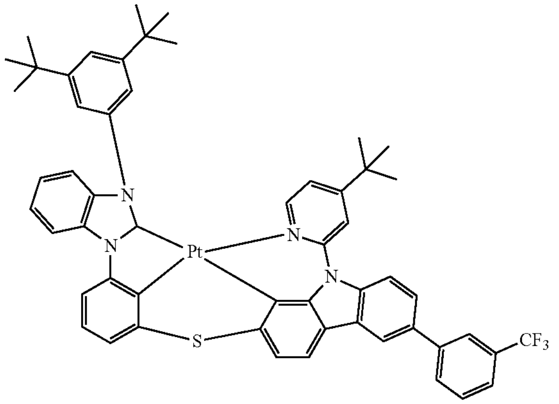
302
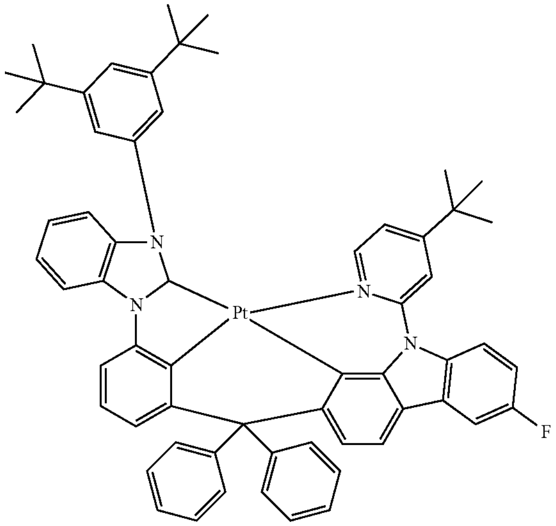
303
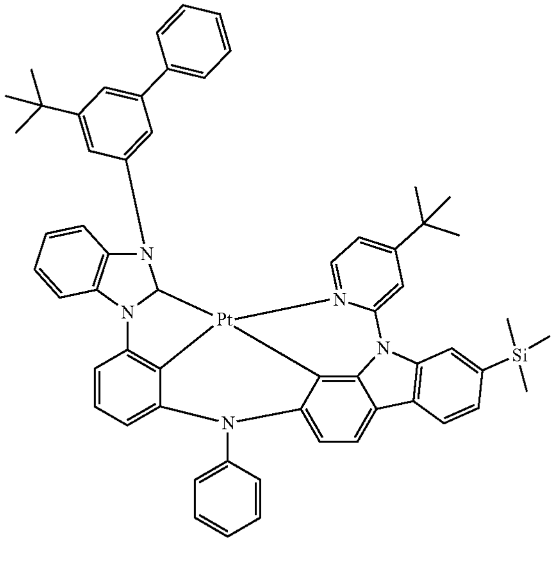
304
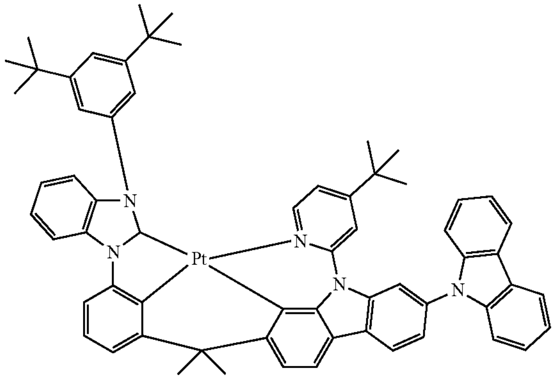

-continued

305

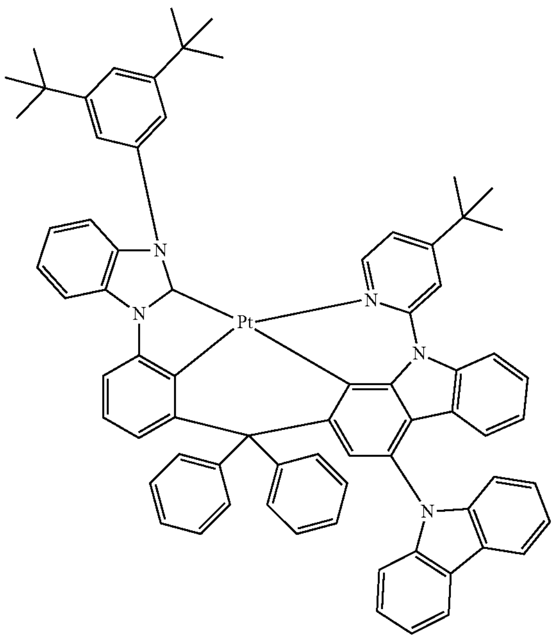

306

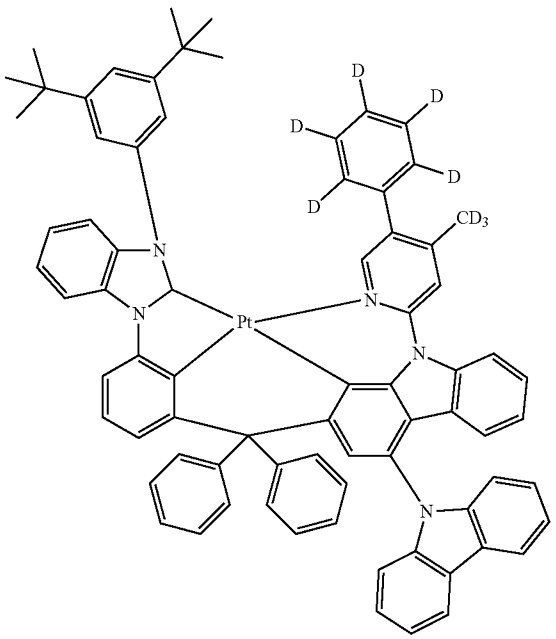

307

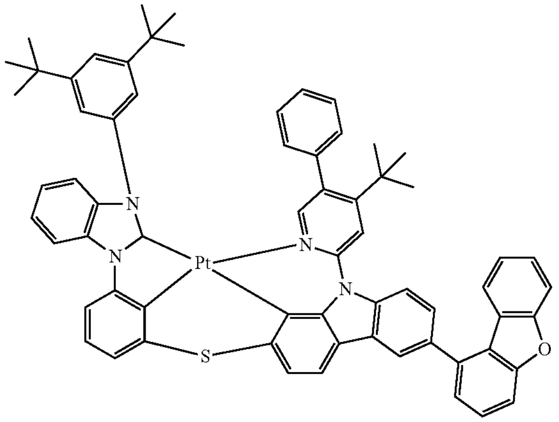

308

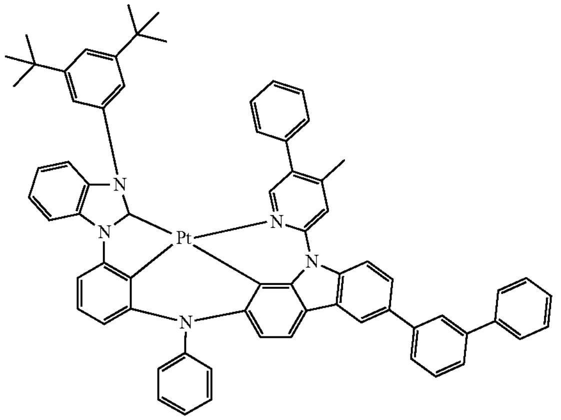

Without withing to be bound to theory, a substituent $R_2$ in the organometallic compound represented by Formula 1 may improve luminescence efficiency of the organometallic compound due to inductive effects. When the $R_2$ position is substituted, a core may be protected by the sterically bulky $R_2$ substituent, which provides a steric hinderance at this position of the ligand. Thus, quenching of molecules of the organometallic compound may be prevented. Accordingly, when the organometallic compound is included in an electronic device, e.g., an organic light-emitting device, the organic light-emitting device may have improved efficiency and lifespan.

As previously described, the organometallic compound represented by Formula 1 satisfies Condition 1:

Condition 1

At least one of:

$R_{31}$(s) in the number of b31, or $R_{32}$(s) in the number of b32 in Formula 1 is:

—F or a cyano group;

a $C_1$-$C_{60}$ alkyl group or a $C_6$-$C_{60}$ aryl group, each substituted with at least one of —F, a cyano group, a fluorine-substituted $C_1$-$C_{10}$ alkyl group, a $C_6$-$C_{60}$ aryl group, a $C_1$-$C_{60}$ heteroaryl group, —Si($Q_{33}$)($Q_{34}$)($Q_{35}$), or a combination thereof;

a substituted or unsubstituted $C_1$-$C_{60}$ heteroaryl group; or —Si($Q_3$)($Q_4$)($Q_5$).

The highest occupied molecular orbital (HOMO) may be present around a carbazole-based moiety in a ligand of the organometallic compound, and thus, the carbazole-based moiety may be a position having high reactivity. A substituent other than hydrogen may be introduced to the carbazole-based moiety of the organometallic compound to thereby improve chemical stability of the organometallic compound. In addition, by appropriately varying a type of substituent of the carbazole-based moiety, the HOMO energy level of the organometallic compound may be controlled. Accordingly, an organic light-emitting device including the organometallic compound may have improved driving voltage.

In addition, when the carbazole-based moiety is substituted as described in further detail herein, emitting dipole orientation (EDO) may be controlled in a horizontal direction, and thus, the organic light-emitting device including the organometallic compound may have improved external quantum efficiency.

When the organometallic compound represented by Formula 1 satisfies Condition 1, the HOMO energy level of the organometallic compound may be controlled, as compared with that of a compound including an unsubstituted alkyl group or an unsubstituted aryl group in the carbazole-based moiety. Accordingly, when a blue light-emitting device includes the organometallic compound as an emitter, the emission wavelength and the energy level may be easily controlled to be proper for the blue light-emitting device.

The HOMO energy level, lowest unoccupied molecular orbital (LUMO) energy level, lowest triplet excited state ($T_1$) energy level, and maximum emission wavelength ($\lambda_{max}$, nanometer (nm)) of selected organometallic compounds represented by Formula 1 (Compounds 1 to 12) and Comparative Compound C1 were evaluated by density functional theory (DFT) using the Gaussian 09 program to perform molecular structure optimizations at a B3LYP level. The results thereof are shown in Table 1, where energies are provided in electron Volt (eV).

TABLE 1

| Compound No. | HOMO (eV) | LUMO (eV) | $T_1$ (eV) | $\lambda_{max}$ (nm) |
|---|---|---|---|---|
| 1 | −4.68 | −1.23 | 2.66 | 466 |
| 2 | −4.92 | −1.50 | 2.68 | 463 |
| 3 | −4.74 | −1.28 | 2.67 | 464 |
| 4 | −4.67 | −1.23 | 2.66 | 466 |
| 5 | −4.72 | −1.29 | 2.66 | 466 |
| 6 | −4.82 | −1.37 | 2.68 | 463 |
| 7 | −4.79 | −1.32 | 2.67 | 464 |
| 8 | −4.72 | −1.28 | 2.66 | 466 |
| 9 | −4.77 | −1.34 | 2.67 | 464 |
| 10 | −4.79 | −1.34 | 2.66 | 466 |
| 11 | −4.79 | −1.32 | 2.67 | 464 |
| 12 | −4.84 | −1.35 | 2.67 | 464 |
| C1 | −4.65 | −1.22 | 2.65 | 467 |

1

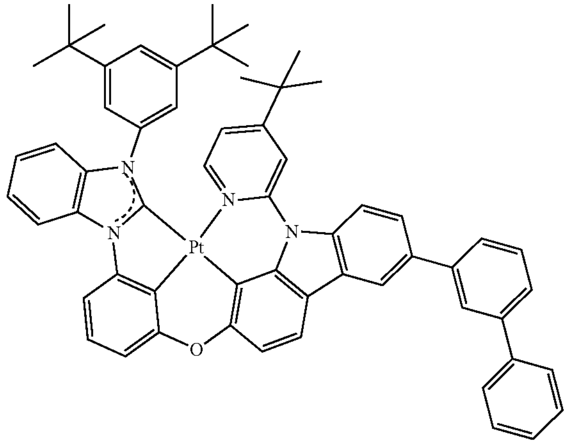

-continued

2

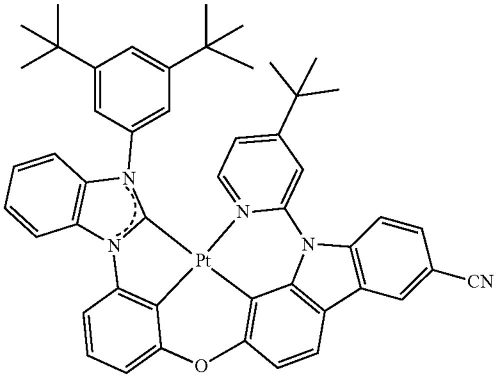

3

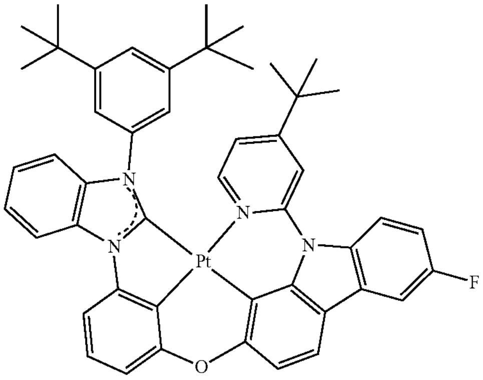

4

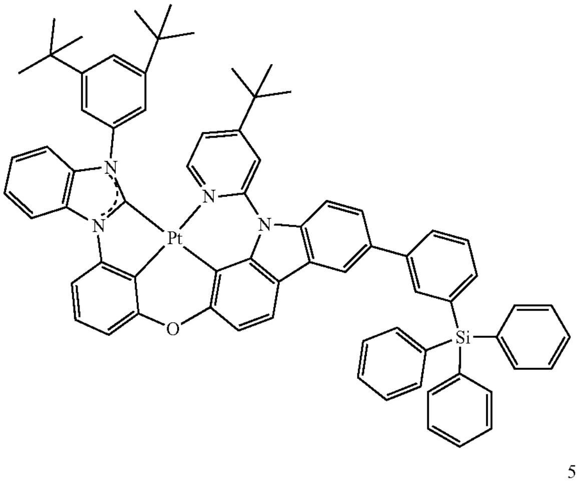

5

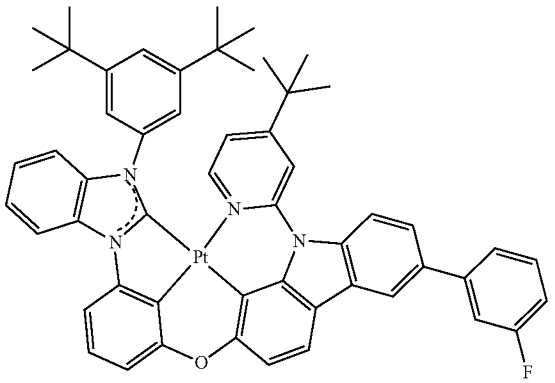

-continued
6
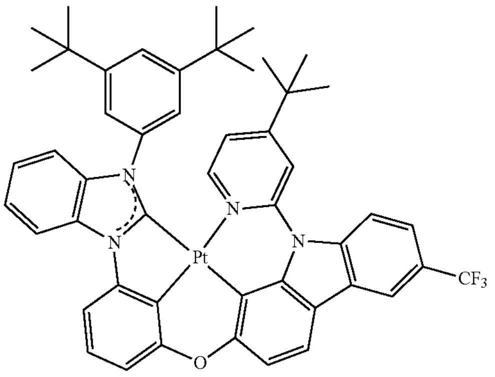
7
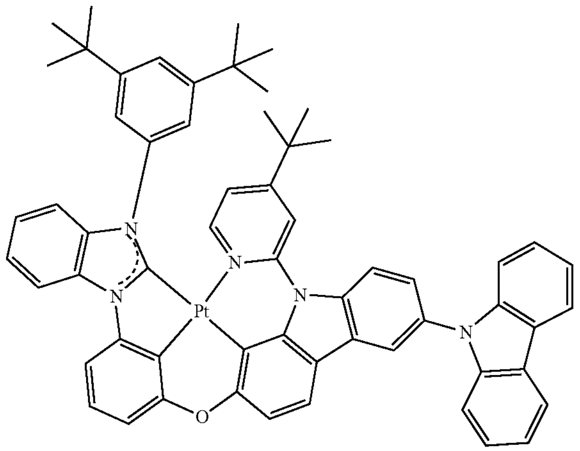
8
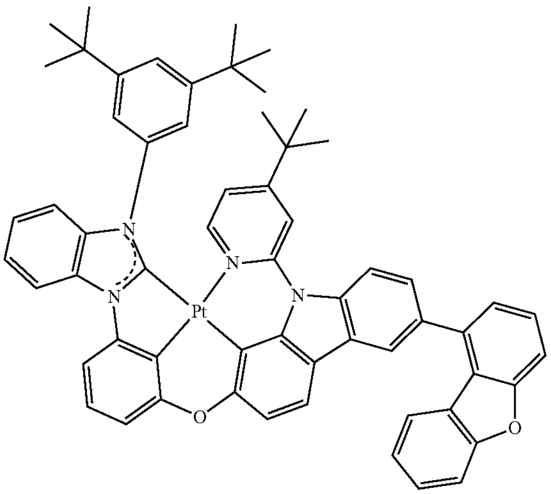
-continued
9
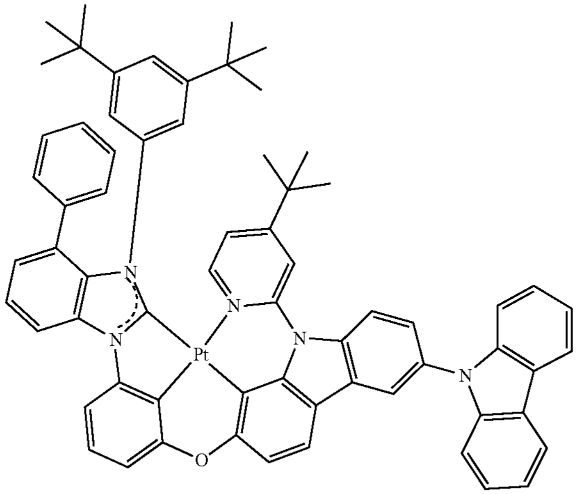
10
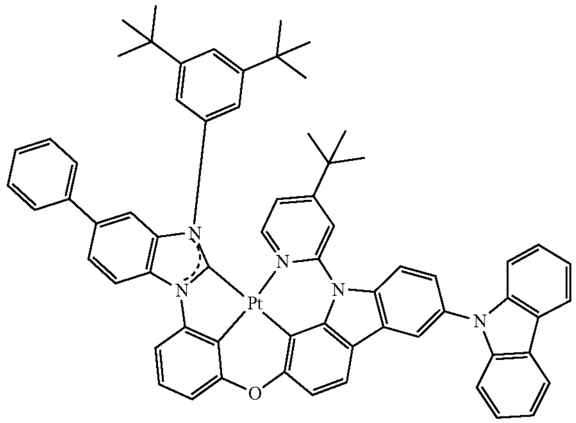
11
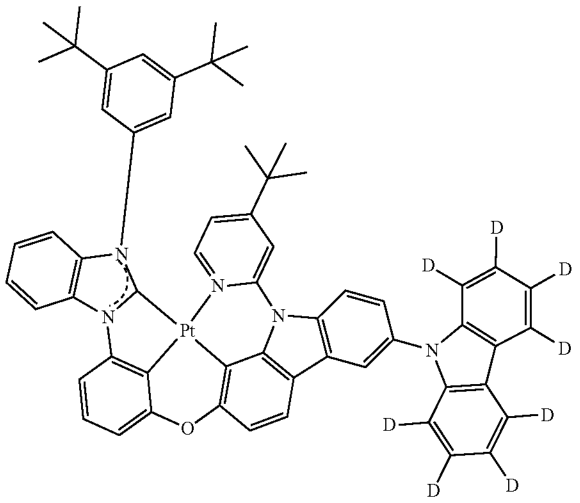

-continued

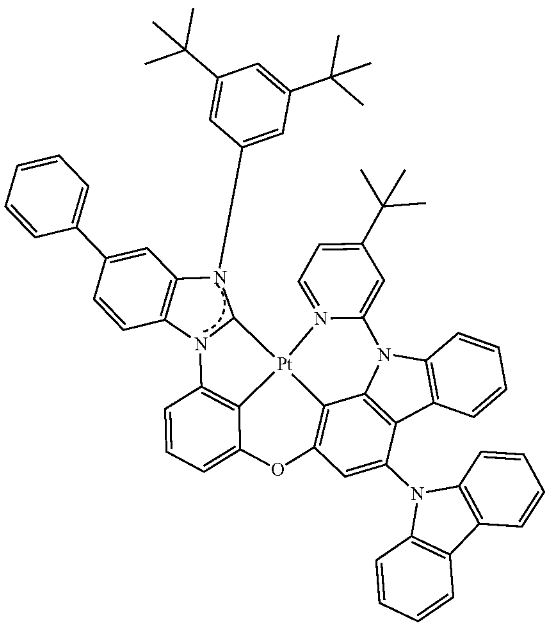

12

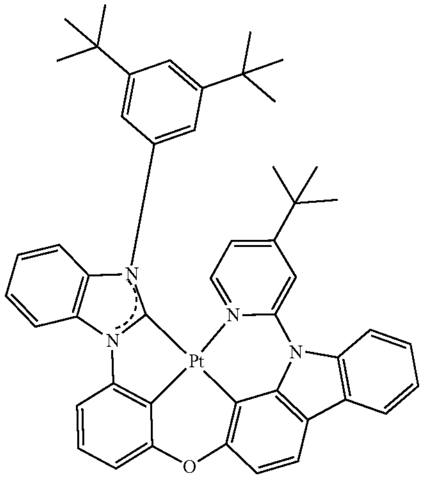

C1

Referring to the results of Table 1, the organometallic compound according to one or more embodiments was found to have a deep HOMO energy level and a high $T_1$ energy level, as compared with Compound C1. Accordingly, the organometallic compound according to one or more embodiments were found to have blue optical characteristics and electrical characteristics suitable for blue light emission.

A method of synthesizing the organometallic compound represented by Formula 1 may be apparent to one of ordinary skill in the art and by referring to Synthesis Examples provided herein.

The organometallic compound represented by Formula 1 may be suitable for use in an organic layer of an organic light-emitting device, for example, as an emission layer material of the organic layer. Thus, according to another aspect, there is provided an organic light-emitting device that includes: a first electrode; a second electrode; and an organic layer located between the first electrode and the second electrode, wherein the organic layer includes an emission layer, and wherein the organic layer further includes at least one organometallic compound.

The organic light-emitting device may include an organic layer including the organometallic compound represented by Formula 1. Thus, the organic light-emitting device may have excellent driving voltage, excellent external quantum efficiency, emission spectrum having a reduced second peak intensity, and external colorimetric purity.

As used herein, the expression the "(organic layer) includes at least one organometallic compound" may be construed as meaning the "(organic layer) may include one organometallic compound of Formula 1 or two different organometallic compounds of Formula 1".

For example, Compound 1 may only be included in the organic layer as an organometallic compound. In this embodiment, Compound 1 may be included in the emission layer of the organic light-emitting device. In one or more embodiments, Compounds 1 and 2 may be included in the organic layer as organometallic compounds. In this embodiment, Compounds 1 and 2 may both be included in the same layer (for example, both Compounds 1 and 2 may be included in the emission layer).

In one or more embodiments, the at least one organometallic compound may be included in the emission layer of the organic light-emitting device.

In one or more embodiments, the emission layer may further include a host, and an amount of the host in the emission layer may be greater than an amount of the at least one organometallic compound in the emission layer.

The emission layer may emit red light, green light, or blue light. In one or more embodiments, the emission layer may emit blue light having a maximum emission wavelength in a range of about 410 nm to about 490 nm.

In one or more embodiments, the emission layer may include as a first emission layer embodiment or as a second emission layer embodiment as defined below:

First Emission Layer Embodiment

The emission layer may include the organometallic compound represented by Formula 1, and the organometallic compound may serve as a phosphorescence emitter. For example, a ratio of emission components emitted from the organometallic compound may be about 80 percent (%) or greater, about 85% or greater, about 90% or greater, or about 95% or greater of the total emission components emitted from the emission layer. In other words, at least about 80% or greater, about 85% or greater, about 90% or greater, or about 95% or greater of total emission from the emission layer is emitted from the at least one organometallic compound. Blue light may be emitted from the organometallic compound.

Second Emission Layer Embodiment

The emission layer may further include, in addition to the organometallic compound represented by Formula 1, a phosphorescent dopant, a fluorescent dopant, or a combination thereof, which is different from the organometallic compound. Here, the organometallic compound may serve, not as a phosphorescence emitter, but as a sensitizer or as an auxiliary dopant. In one or more embodiments, the emission layer may further include a fluorescent dopant, the fluorescent dopant may be different from the organometallic compound, and a ratio of emission components emitted from the fluorescent dopant may be 80% or greater, 85% or greater, 90% or greater, or 95% or greater of the total emission components emitted from the emission layer. In other words, at least about 80% or greater, 85% or greater, 90% or greater, or 95% or greater of total emission from the emission layer is emitted from the fluorescent dopant.

In the second emission layer embodiment, a content (amount) of the phosphorescent dopant, the fluorescent dopant, or the combination thereof may be in a range of about 1 part to about 100 parts by weight, about 5 parts to about 50 parts by weight, or about 10 parts to about 20 parts by weight, based on 100 parts by weight of the organometallic compound represented by Formula 1.

In the second Embodiment, a total content of the organometallic compound represented by Formula 1 and the phosphorescent dopant, the fluorescent dopant, or the combination thereof may be in a range of about 1 part to about 30 parts by weight, about 3 parts to about 20 parts by weight, or about 5 parts to about 15 parts by weight, based on 100 parts by weight of the emission layer.

A fluorescent dopant that may be used in the second emission layer embodiment may not include a transition metal.

In the second emission layer embodiment, the emission layer may emit fluorescence produced upon transition of triplet excitons of the organometallic compound represented by Formula 1 to the fluorescent dopant.

For example, the fluorescent dopant may include a compound represented by Formula 503-1 or Formula 503-2:

Formula 503-1

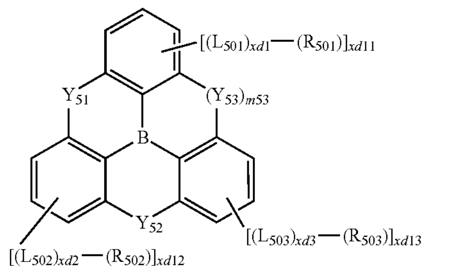

Formula 503-2

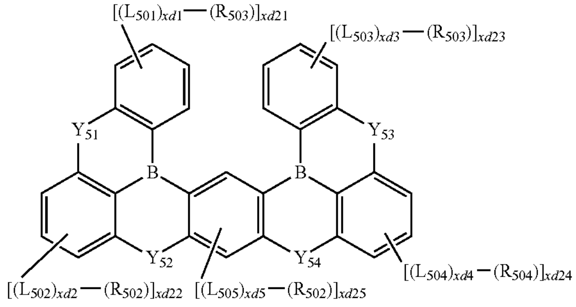

wherein, in Formulae 503-1 and 503-2, $Y_{51}$ to $Y_{54}$ may each independently be a single bond, O, S, $N[(L_{506})_{xd6}-R_{506}]$, $C[(L_{506})_{xd6}-R_{506}][(L_{507})_{xd7}-R_{507}]$, or $Si[(L_{506})_{xd6}-R_{506}][(L_{507})_{xd7}-R_{507}]$, m53 may be 0 or 1, $L_{501}$ to $L_{507}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xd1 to xd7 may each independently be 0, 1, 2, or 3, $R_{501}$ to $R_{507}$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, or a $C_1$-$C_{20}$ alkylthio group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or a combination thereof, when m53 is 0, xd11 and xd13 may each independently be 0, 1, 2, 3, or 4, when m53 is 1, xd11 and xd13 may each independently be 0, 1, 2, or 3, xd21 and xd23 may each independently be 0, 1, 2, 3, or 4, xd12, xd22, and xd24 may each independently be 0, 1, 2, or 3, xd25 may be 0, 1, or 2, and two or more of $R_{501}$ to $R_{507}$ may optionally be bonded to each other to form a substituted or unsubstituted $C_5$-$C_{30}$ carbocyclic group or a substituted or unsubstituted $C_1$-$C_{30}$ heterocyclic group.

In one or more embodiments, the first electrode may be anode, which is a hole injection electrode, and the second electrode may be a cathode, which is an electron injection electrode. Alternatively, the first electrode may be a cathode, which is an electron injection electrode, and the second electrode may be an anode, which is a hole injection electrode.

In one or more embodiments, the first electrode may be an anode, the second electrode may be a cathode, and the organic layer may include a hole transport region between the first electrode and the emission layer and an electron transport region between the emission layer and the second electrode, wherein the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

For example, the organometallic compound may be included in at least one of the hole transport region and the electron transport region.

The term "organic layer" as used herein refers to a single and/or a plurality of layers between the first electrode and the second electrode in an organic light-emitting device. The "organic layer" may include not only organic compounds but also organometallic complexes including metals.

Description of FIG. 1

FIG. 1 is a schematic cross-sectional view illustrating an organic light-emitting device 10 according to one or more embodiments. Hereinafter, a structure of an organic light-emitting device according to one or more embodiments and a method of manufacturing the organic light-emitting device will be described with reference to FIG. 1.

The organic light-emitting device 10 in FIG. 1 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and/or water repellency.

The first electrode 11 may be produced by depositing or sputtering, onto the substrate, a material for forming the first electrode 11. The first electrode 11 may be an anode. The material for forming the first electrode 11 may be selected from materials with a high work function for easy hole injection.

The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be a metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In one or more embodiments, the first electrode 11 may have a triple-layered structure of ITO/Ag/ITO, but embodiments are not limited thereto.

The organic layer 15 may be on the first electrode 11.

The organic layer 15 may include a hole transport region, an emission layer, and an electron transport region.

The hole transport region may be between the first electrode 11 and the emission layer.

The hole transport region may include at least one selected from a hole injection layer, a hole transport layer, an electron blocking layer, and a buffer layer.

The hole transport region may include a hole injection layer only or a hole transport layer only. In one or more embodiments, the hole transport region may include a hole injection layer and a hole transport layer which are sequentially stacked on the first electrode 11. In one or more embodiments, the hole transport region may include a hole injection layer, a hole transport layer, and an electron blocking layer, which are sequentially stacked in the stated order on the first electrode 11.

When the hole transport region includes a hole injection layer, the hole injection layer may be formed on the first electrode 11 by using one or more suitable methods, such as vacuum deposition, spin coating, casting, and Langmuir-Blodgett (L-B) deposition.

When a hole injection layer is formed by vacuum deposition, for example, the vacuum deposition may be performed at a deposition temperature in a range of about 100° C. to about 500° C., at a vacuum degree in a range of about $10^{-8}$ torr to about $10^{-3}$ torr, and at a deposition rate in a range of about 0.01 angstroms per second (A/sec) to about 100 Å//sec, although the conditions may vary depending on a compound that is used as a hole injection material and a structure and thermal properties of a desired hole injection layer, but conditions for the vacuum deposition are not limited thereto.

When a hole injection layer is formed by spin coating, the spin coating may be performed at a coating rate in a range of about 2,000 revolutions per minute (rpm) to about 5,000 rpm, and at a temperature in a range of about 80° C. to 200° C., to facilitate removal of a solvent after the spin coating, though the conditions may vary depending on a compound that is used as a hole injection material and a structure and thermal properties of a desired hole injection layer, but conditions for the spin coating are not limited thereto.

The conditions for forming a hole transport layer and an electron blocking layer may be inferred from the conditions for forming the hole injection layer.

The hole transport region may include at least one of (4,4',4"-tris(3-methylphenylphenylamino)triphenylamine) (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(naphthalene-1-yl)-N,N'-diphenyl-benzidine (NPB), pi-NPB, N,N'-bis(3-methylphenyl)-N,N'-diphenyl-[1,1-biphenyl]-4,4'-diamine (TPD), spiro-TPD, spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANI/CSA), (polyaniline)/poly(4-styrenesulfonate) (PANI/PSS), a compound represented by Formula 201, or a compound represented by Formula 202:

-continued
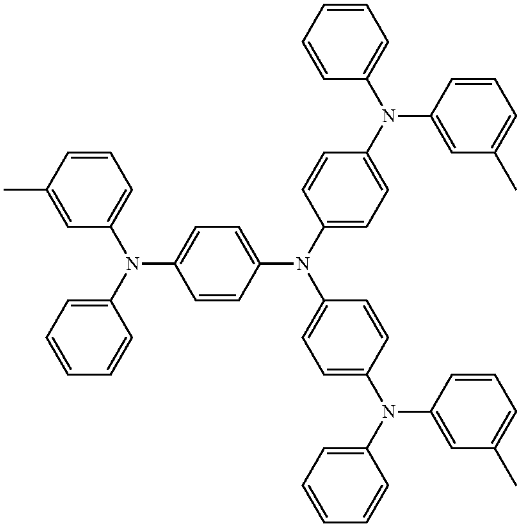
m-MTDATA
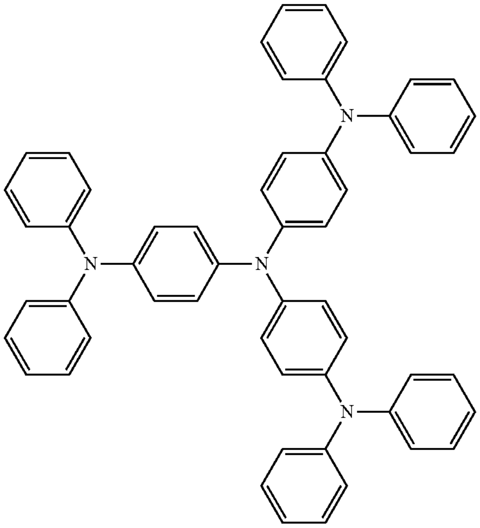
TDATA
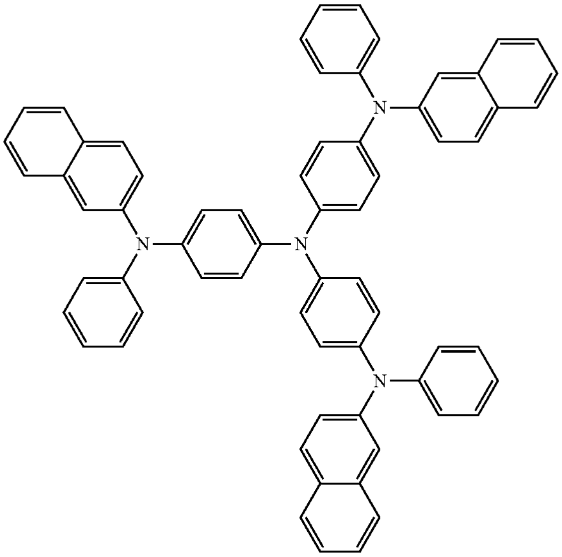
2-TNATA
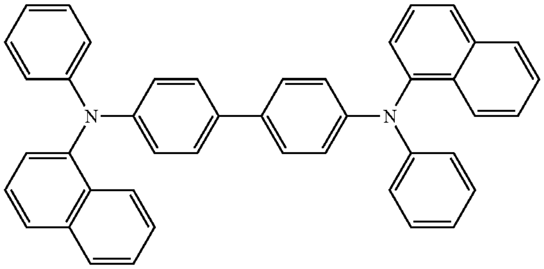
NPB
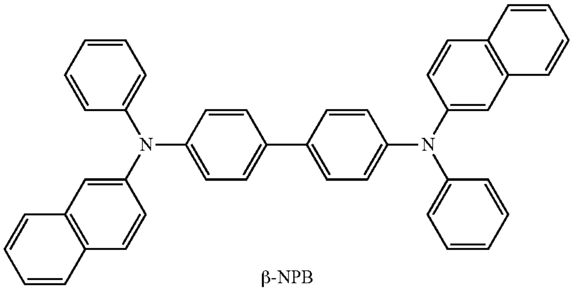
β-NPB
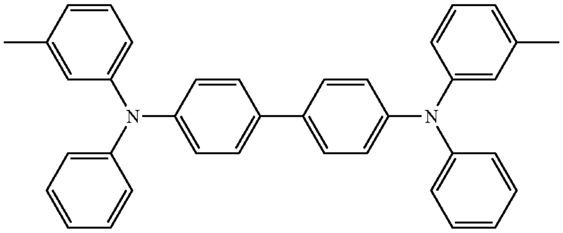
TPD
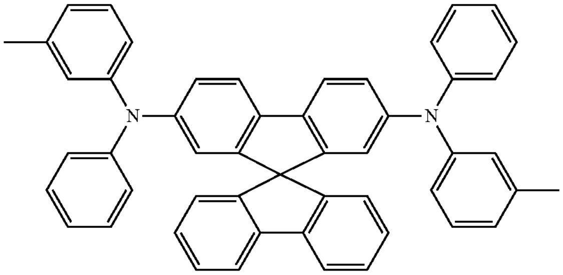
Spiro-TPD
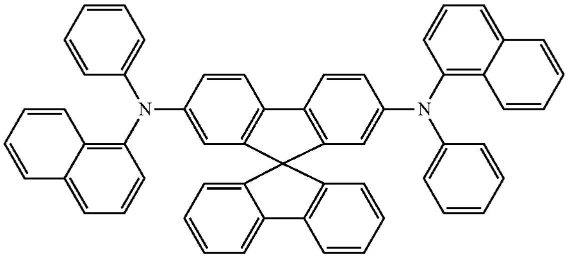
Spiro-NPB
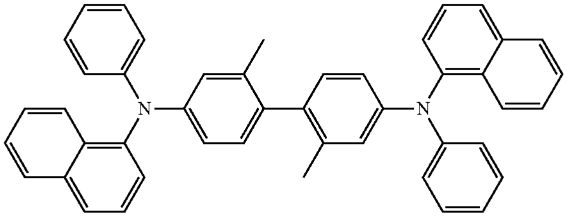
methylated NPB -continued

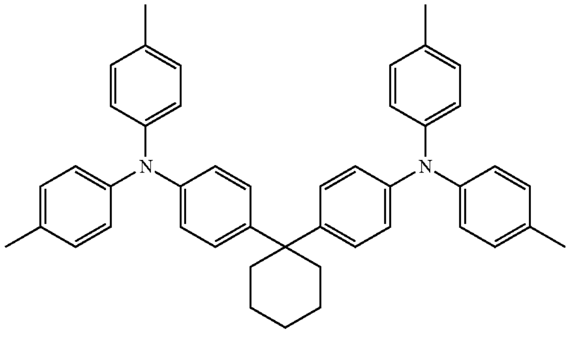

TAPC

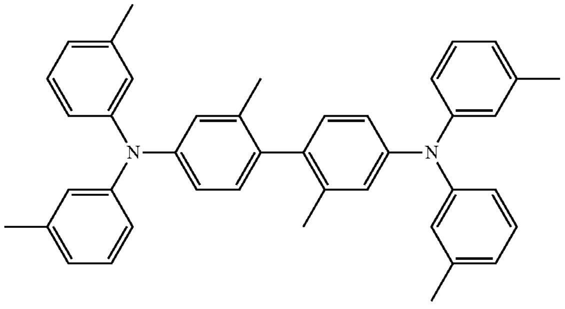

HMTPD

Formula 201

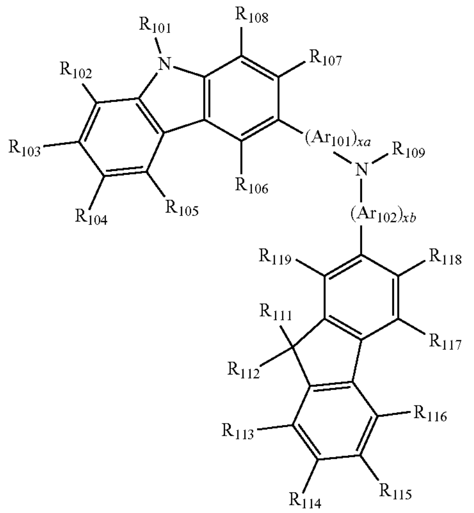

Formula 202

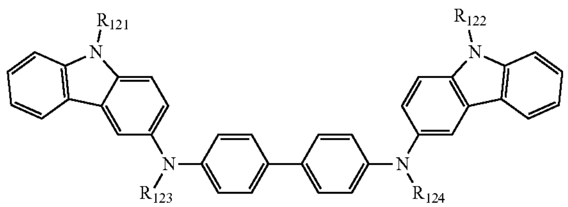

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a monovalent non-aromatic condensed polycyclic group, a monovalent non-aromatic condensed heteropolycyclic group, or a combination thereof.

In Formula 201, xa and xb may each independently be an integer from 0 to 5. In one or more embodiments, xa and xb may each independently be 0, 1, or 2. In one or more embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, a hexyl group, or the like), a $C_1$-$C_{10}$ alkoxy group (e.g., a methoxy group, an ethoxy group, a propoxy group, a butoxy group, a pentoxy group, or the like), or a $C_1$-$C_{10}$ alkylthio group;

a $C_1$-$C_{10}$ alkyl group, a $C_1$-$C_{10}$ alkoxy group, or a $C_1$-$C_{10}$ alkylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_1$-$C_{10}$ alkylthio group, or a combination thereof.

In Formula 201, $R_{109}$ may be a phenyl group, a naphthyl group, an anthracenyl group, or a pyridinyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{10}$ alkylthio group, a phenyl group, a naphthyl group, an anthracenyl group, a pyridinyl group, or a combination thereof.

In one or more embodiments, the compound represented by Formula 201 may be represented by Formula 201A:

Formula 201A

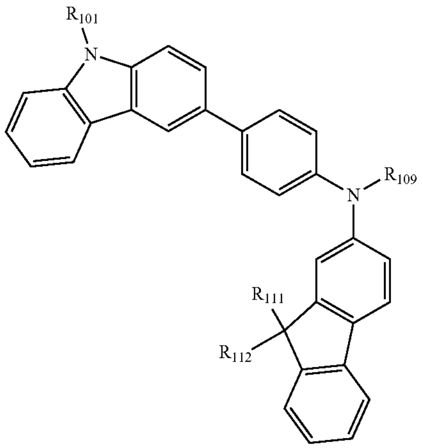

wherein, in Formula 201A, $R_{101}$, $R_{111}$, $R_{112}$, and $R_{109}$ may respectively be understood by referring to the descriptions of $R_{101}$, $R_{111}$, $R_{112}$, and $R_{109}$ provided herein.

In one or more embodiments, the hole transport region may include one of Compounds HT1 to HT20, or a combination thereof:

HT1

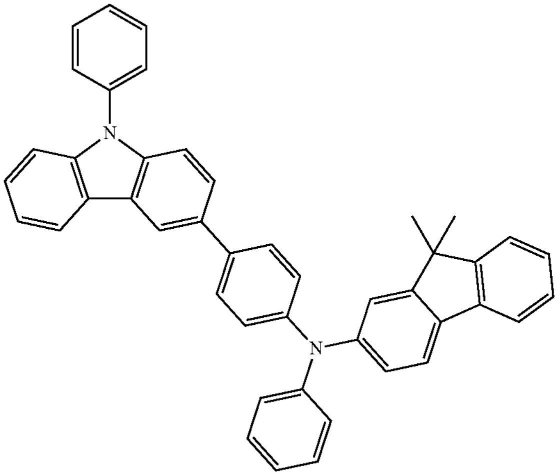

-continued

HT2

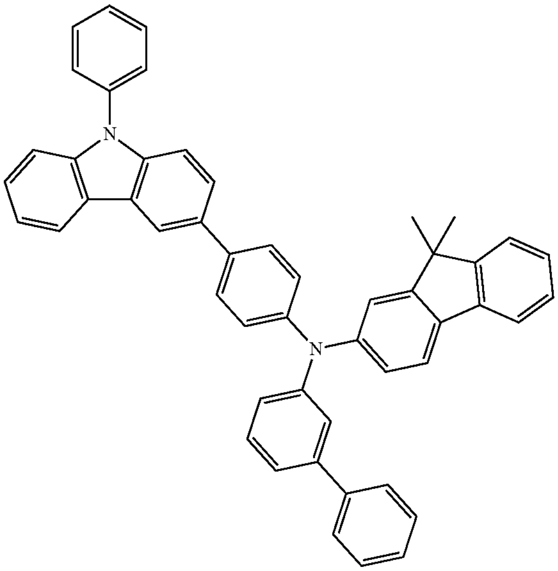

HT3

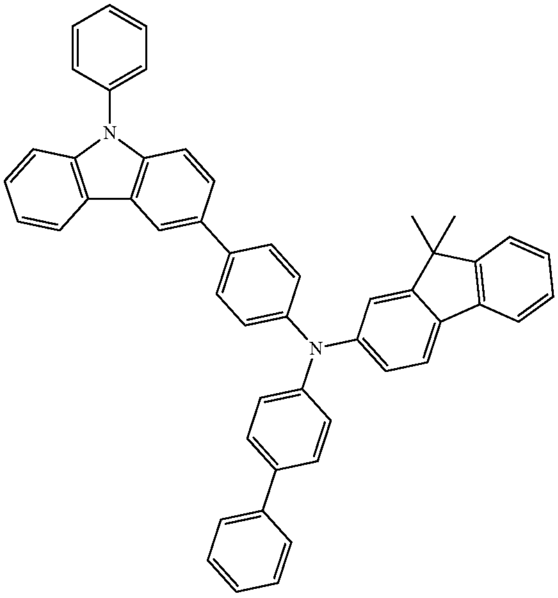

-continued
HT4
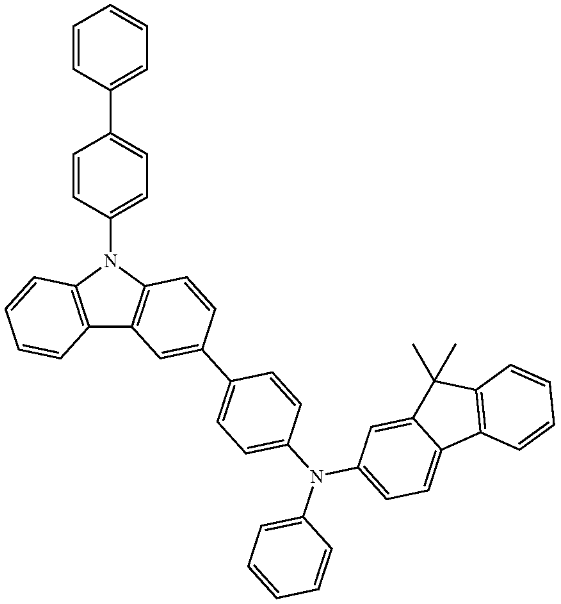
HT5
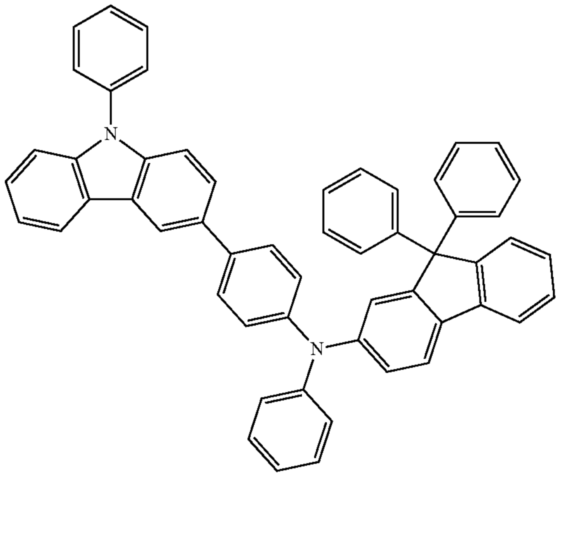
-continued
HT6
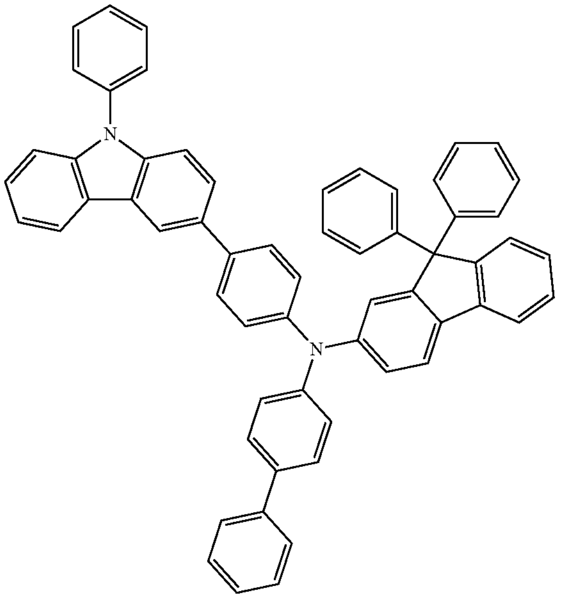
HT7
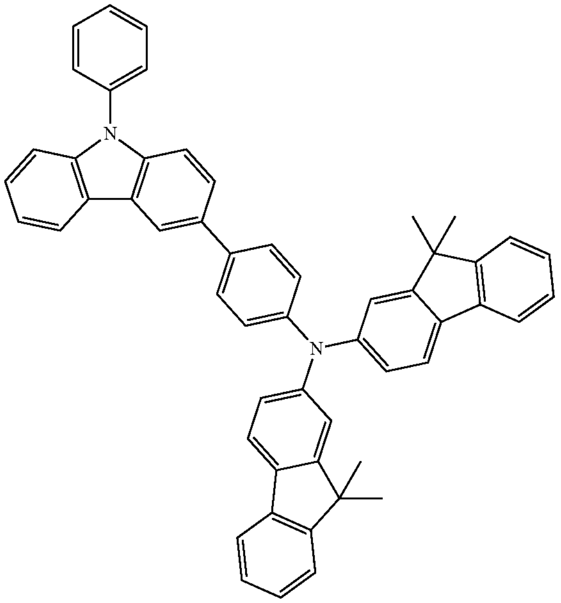

-continued
HT8
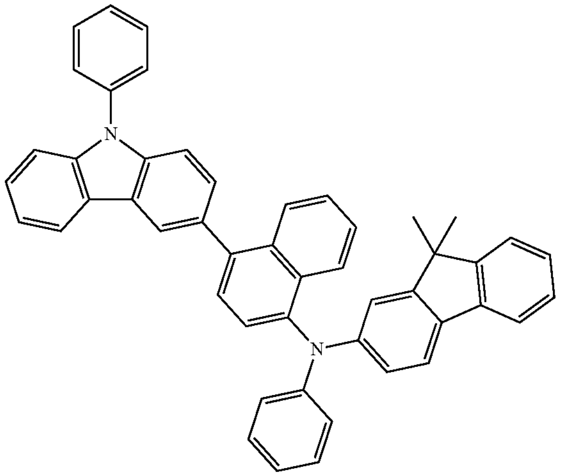
HT9
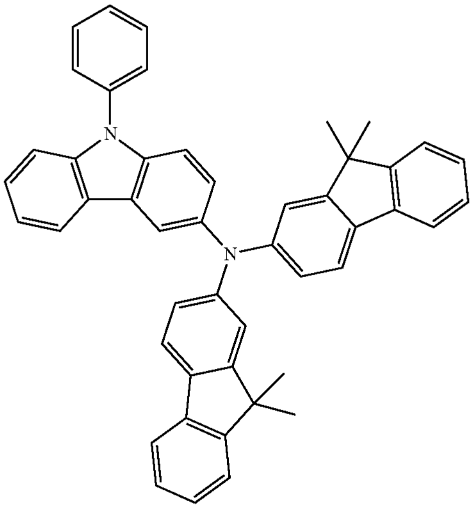
HT10
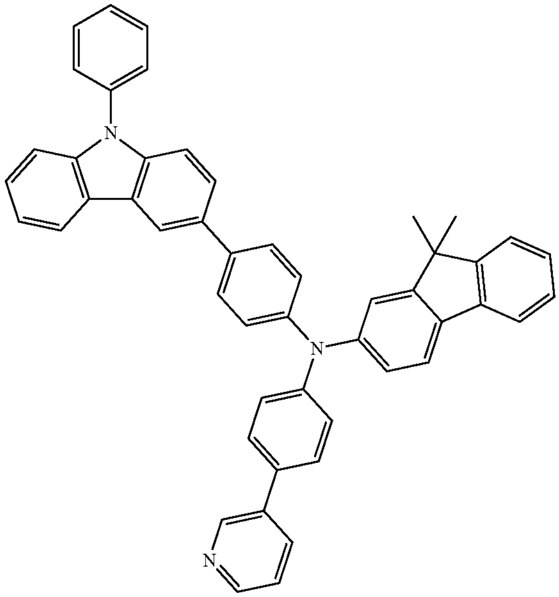
-continued
HT11
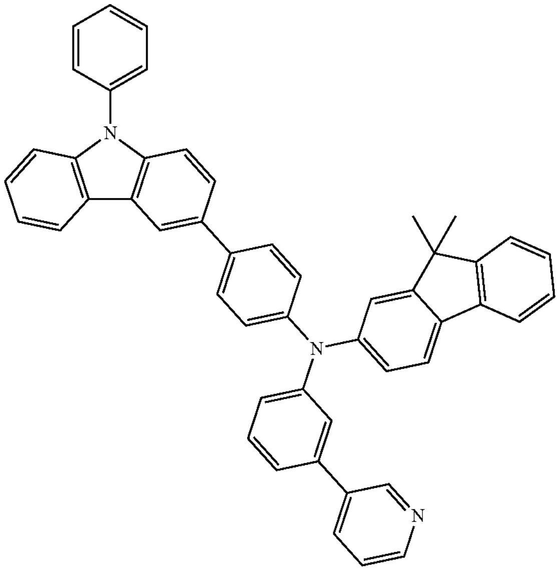
HT12
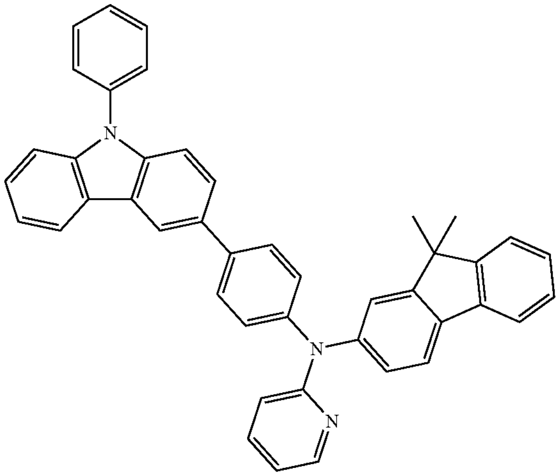
HT13
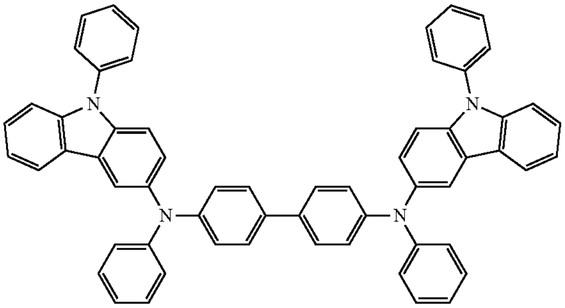

-continued

HT14

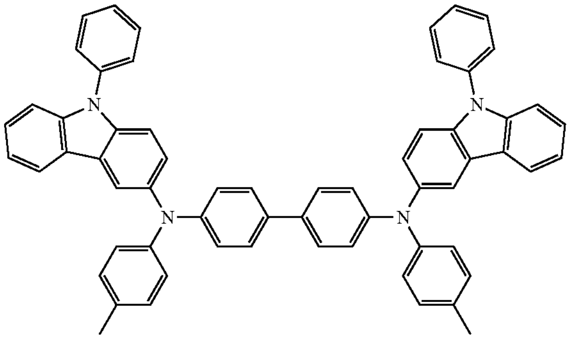

HT15

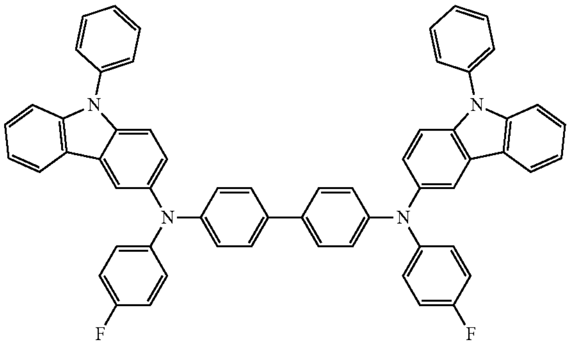

HT16

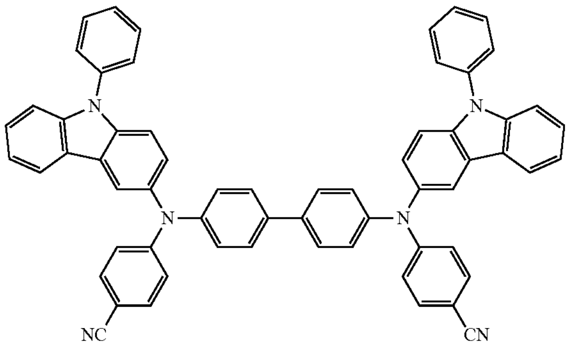

HT17

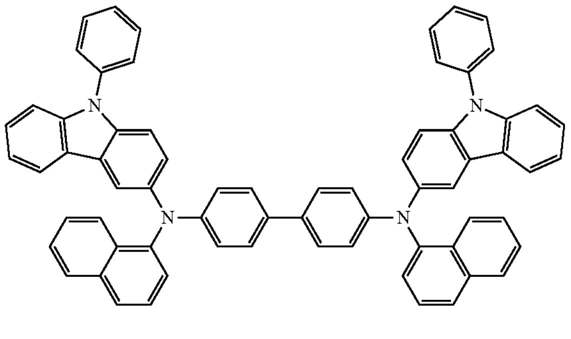

-continued

HT18

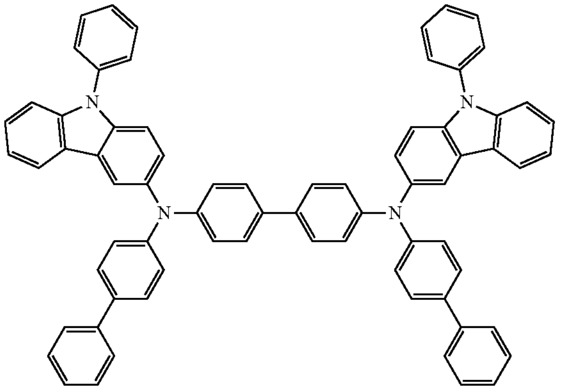

HT19

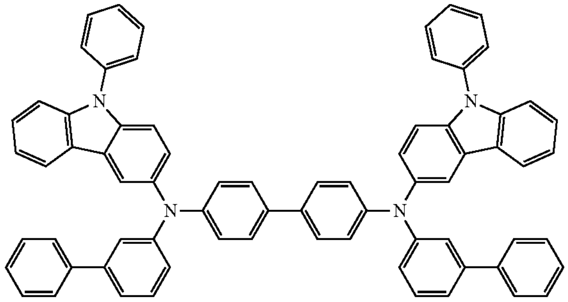

HT20

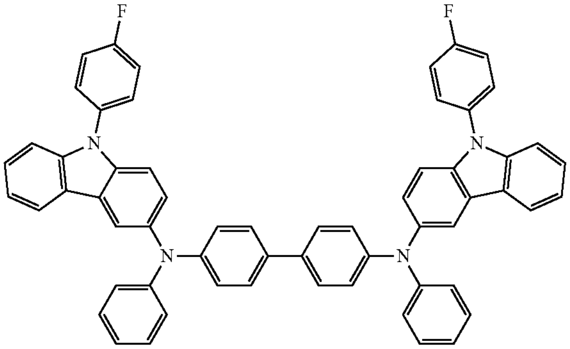

The thickness of the hole transport region may be in a range of about 100 Å (angstrom) to about 10,000 Å, and in one or more embodiments, about 100 Å to about 1,000 Å. When the hole transport region includes at least one of a hole injection layer and a hole transport layer, the thickness of the hole injection layer may be in a range of about 100 Å to about 10,000 Å, and in one or more embodiments, about 100 Å to about 1,000 Å, and the thickness of the hole transport layer may be in a range of about 50 Å to about 2,000 Å, and in one or more embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may be a quinone derivative, a metal oxide, a compound containing a cyano group, or a combination thereof, but embodiments are not limited thereto. For example, non-limiting examples of the p-dopant include a quinone derivative, such as tetracyanoquinodimethane (TCNQ), 2,3,5,6-tetrafluoro-tetracyano-1,4-benzoquinonedimethane (F4-TCNQ), or F6-TCNNQ; a metal oxide, such as a tungsten oxide or a molybdenum oxide; or a compound containing a cyano group, such as Compound HT-D1 or Compound HT-D2, but embodiments are not limited thereto:

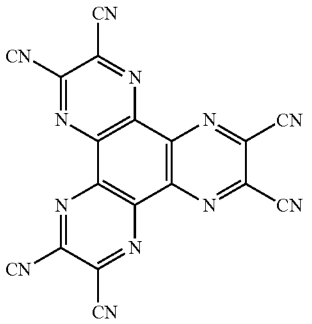

HT-D1

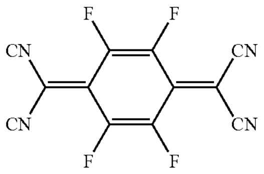

F4-TCNQ

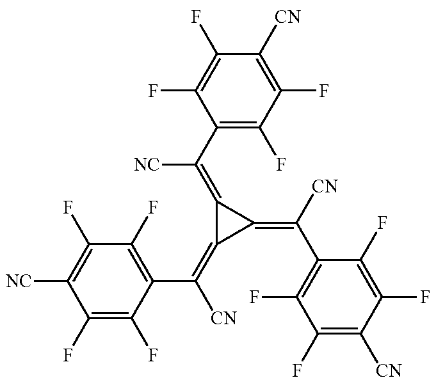

HT-D2

-continued

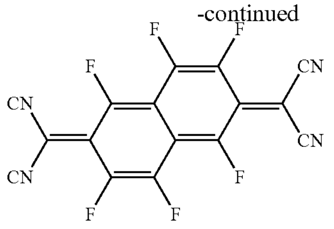

F6-TCNNQ

The hole transport region may further include a buffer layer.

The buffer layer may compensate for an optical resonance distance depending on a wavelength of light emitted from the emission layer to improve the efficiency of an organic light-emitting device.

The emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to those conditions for forming a hole injection layer, though the conditions may vary depending on a compound that is used.

The hole transport region may further include an electron blocking layer. The electron blocking layer may include any suitable known material, e.g., mCP, but embodiments are not limited thereto:

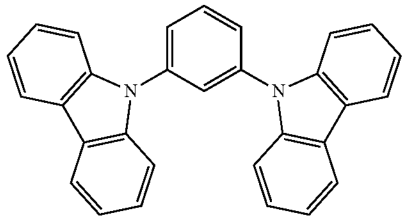

mCP

The thickness of the electron blocking layer may be in a range of about 50 Å to about 1,000 Å, and in one or more embodiments, about 70 Å to about 500 Å. When the thickness of the electron blocking layer is within any of these ranges, excellent electron blocking characteristics may be obtained without a substantial increase in driving voltage.

When the organic light-emitting device 10 is a full-color organic light-emitting device, the emission layer may be patterned into a red emission layer, a green emission layer, and a blue emission layer. In one or more embodiments, the emission layer may have a structure in which the red emission layer, the green emission layer, and/or the blue emission layer are layered to emit white light. In one or more embodiments, the structure of the emission layer may vary.

The emission layer may include the organometallic compound represented by Formula 1.

The emission layer may include a host and a dopant, and the dopant may include the organometallic compound represented by Formula 1.

The host may include 1,3,5-tri(1-phenyl-1H-benzo[d]imidazol-2-yl)phenyl (TPBi), 3-tert-butyl-9,10-di(naphth-2-yl) anthracene (TBADN), 9,10-di(naphthalene-2-yl)anthracene (ADN, also known as "DNA"), 4,4'-bis(N-carbazolyl)-1,1'-biphenyl (CBP), 4,4'-bis(9-carbazolyl)-2,2'-dimethyl-biphenyl (CDBP), TCP, mCP, Compound H50, Compound H51, Compound H52, or a combination thereof:

-continued
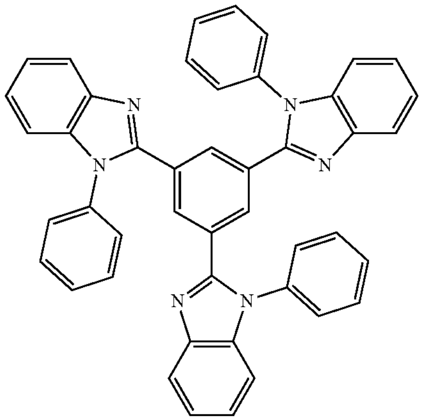
TPBi
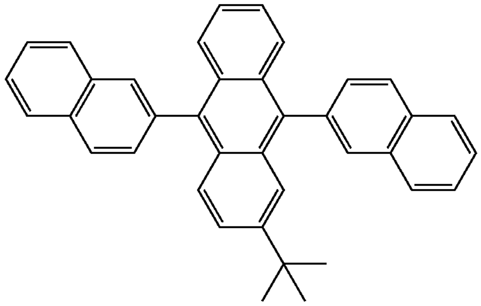
TBADN
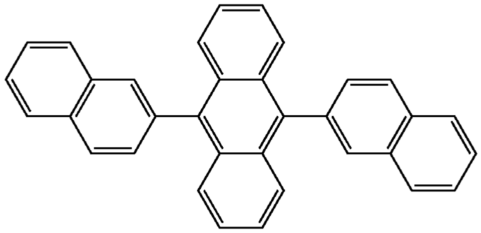
ADN
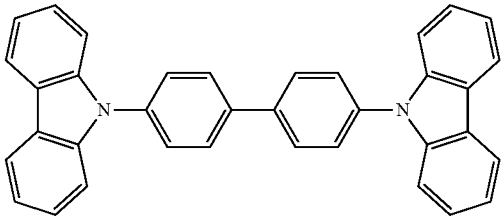
CBP
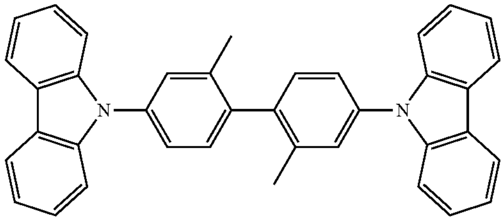
CDBP
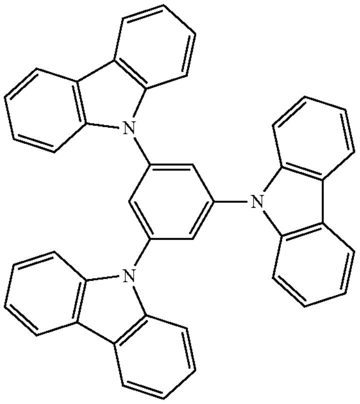
TCP
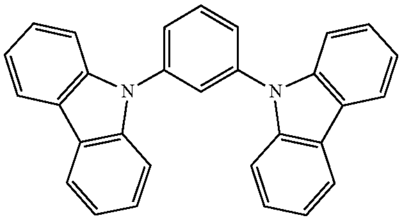
mCP
H50
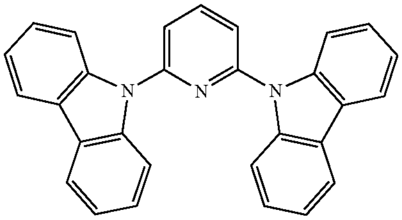
H51
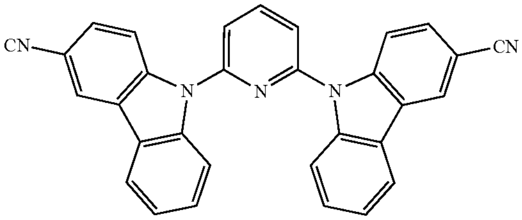
H52
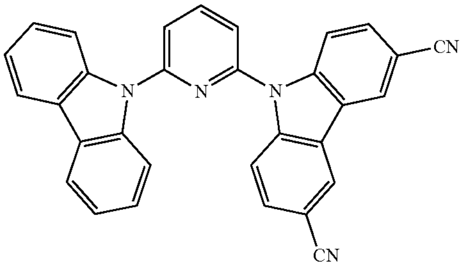

In one or more embodiments, the host may further include a compound represented by Formula 301:

Formula 301

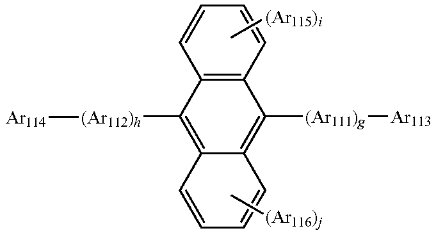

wherein, in Formula 301, $Ar_{111}$ and $Ar_{112}$ may each independently be:

a phenylene group, a naphthylene group, a phenanthrenylene group, or a pyrenylene group; or a phenylene group, a naphthylene group, a phenanthrenylene group, and a pyrenylene group, each substituted with at least one of a phenyl group, a naphthyl group, an anthracenyl group, or a combination thereof.

In Formula 301, $Ar_{113}$ to $Ar_{116}$ may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, or a pyrenyl group, each substituted with at least one of a phenyl group, a naphthyl group, an anthracenyl group, or a combination thereof.

In Formula 301, g, h, i, and j may each independently be 0, 1, 2, 3, or 4, for example, 0, 1, or 2.

In Formula 301, $Ar_{113}$ to $Ar_{116}$ may each independently be:

a $C_1$-$C_{10}$ alkyl group substituted with at least one of a phenyl group, a naphthyl group, an anthracenyl group, or a combination thereof;

a phenyl group, a naphthyl group, an anthracenyl group, a pyrenyl group, a phenanthrenyl group, or a fluorenyl group; or a phenyl group, a naphthyl group, an anthracenyl group, a pyrenyl group, a phenanthrenyl group, or a fluorenyl group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a phenyl group, a naphthyl group, an anthracenyl group, a pyrenyl group, a phenanthrenyl group, a fluorenyl group, or a combination thereof, or

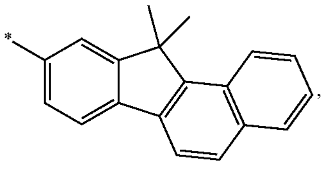 [SMILES: *c1ccc2c(c1)C(C)(C)c1c-2ccc2ccccc12], but embodiments are not limited thereto.

In one or more embodiments, the host may include a compound represented by Formula 302:

Formula 302

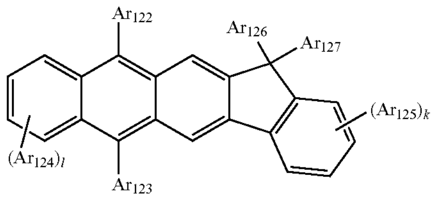

In Formula 302, $Ar_{122}$ to $Ar_{125}$ may each be understood by referring to the description of $Ar_{113}$ in Formula 301.

In Formula 302, $Ar_{126}$ and $Ar_{127}$ may each independently be a $C_1$-$C_{10}$ alkyl group, e.g., a methyl group, an ethyl group, or a propyl group.

In Formula 302, k and l may each independently be an integer of 0, 1, 2, 3, or 4. In one or more embodiments, k and l may each be 0, 1, or 2.

When the organic light-emitting device 10 is a full-color organic light-emitting device, the emission layer may be patterned into a red emission layer, a green emission layer, and a blue emission layer. In one or more embodiments, the emission layer may have a structure in which the red emission layer, the green emission layer, and/or the blue emission layer are layered to emit white light. In one or more embodiments, the structure of the emission layer may vary.

When the emission layer includes the host and the dopant, an amount of the dopant may be selected from a range of about 0.01 parts to about 20 parts by weight based on about 100 parts by weight of the emission layer, but embodiments are not limited thereto. When the amount of the dopant is within this range, light emission without quenching may be realized.

In one or more embodiments, the organic layer in organic light-emitting device may further include, in addition to the organometallic compound represented by Formula 1, a phosphorescent dopant or a fluorescent dopant. For example, the organic layer in organic light-emitting device may further include, in addition to the organometallic compound represented by Formula 1, a fluorescent dopant.

In one or more embodiments, the fluorescent dopant may be a condensed polycyclic compound, a styryl-based compound, or a combination thereof.

In one or more embodiments, the fluorescent dopant may include a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a group represented by one of Formulae 501-1 to 501-21, or a combination thereof:

501-1

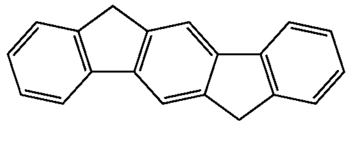

-continued
501-2
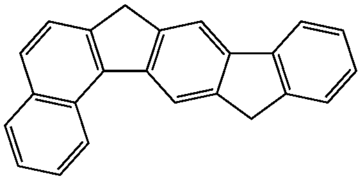
501-3
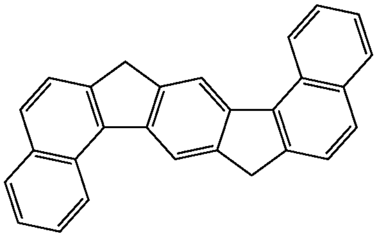
501-4
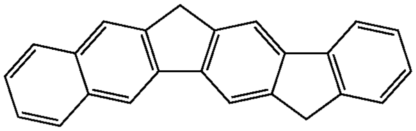
501-5
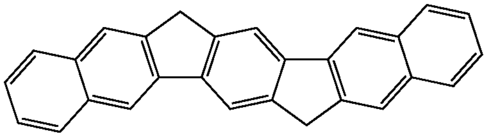
501-6
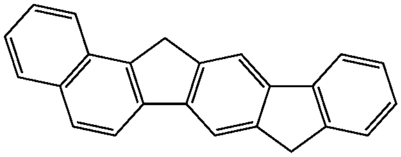
501-7
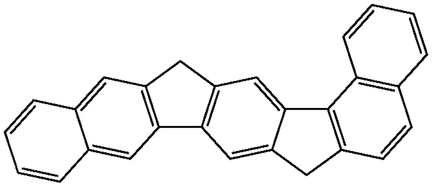
501-8
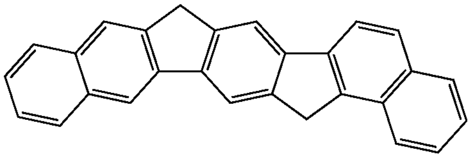
501-9
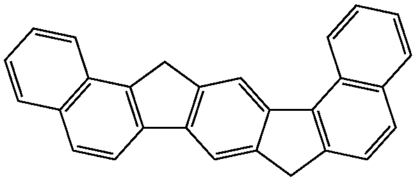
-continued
501-10
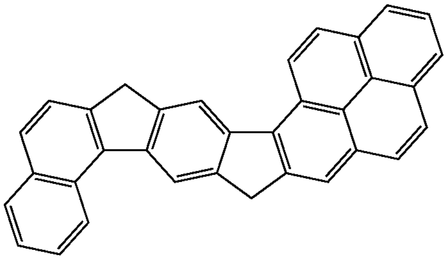
501-11
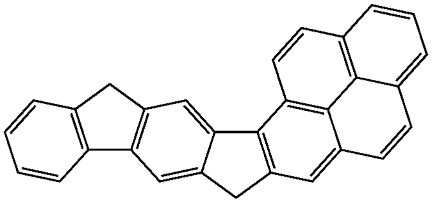
501-12
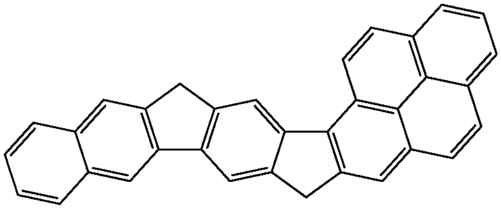
501-13
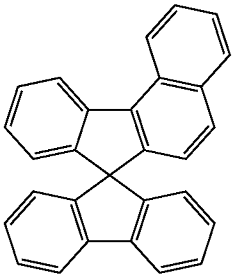
501-14
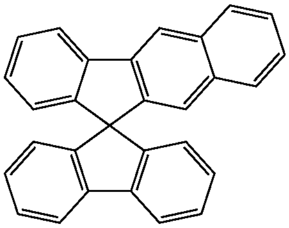
501-15
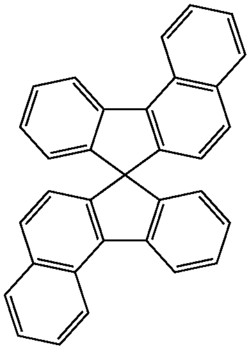

-continued 501-16

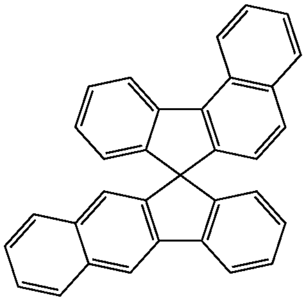

501-17

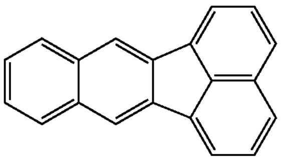

501-18

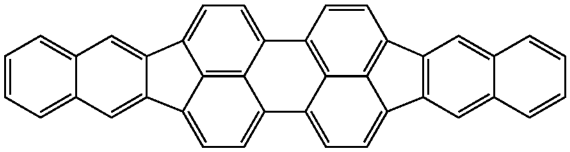

501-19

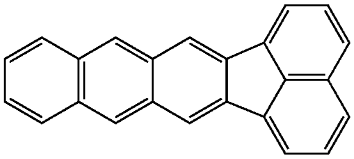

501-20

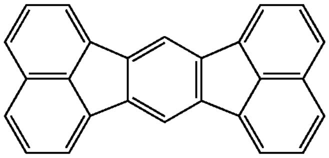

501-21

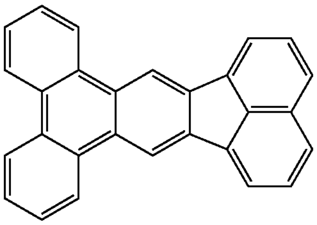

According to one or more embodiments, the fluorescent dopant may include a compound represented by Formula 501:

Formula 501

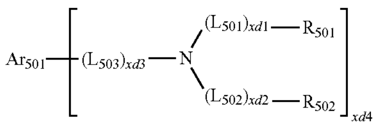

wherein, in Formula 501, $Ar_{501}$ a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-21; or naphthalene, fluorene, spiro-bifluorene, benzofluorene, dibenzofluorene, phenanthrene, anthracene, fluoranthene, triphenylene, pyrene, chrysene, naphthacene, picene, perylene, pentaphene, indenoanthracene, tetracene, bisanthracene, or groups represented by Formulae 501-1 to 501-21, each substituted with at least one of deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{30}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or $—Si(Q_{501})(Q_{502})(Q_{503})$, wherein $Q_{501}$ to $Q_{503}$ may each independently be hydrogen, a $C_1$-$C_{60}$ alkyl group, a $C_1$-$C_{60}$ alkoxy group, a $C_1$-$C_{60}$ alkylthio group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $R_{501}$ and $R_{502}$ may each independently be:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or a combination thereof, xd1 to xd3 may each independently be 0, 1, 2, or 3, and xd4 may be 0, 1, 2, 3, 4, 5, or 6.

In one or more embodiments, in Formula 501, $Ar_{501}$ may be:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-21; or naphthalene, fluorene, spiro-bifluorene, benzofluorene, dibenzofluorene, phenanthrene, anthracene, fluoranthene, triphenylene, pyrene, chrysene, naphthacene, picene, perylene, pentaphene, indenoanthracene, tetracene, bisanthracene, or groups represented by Formulae 501-1 to 501-21, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a dibenzofuranyl group, a dibenzothiophenyl group, a carbazolyl group, a pyridinyl group, a pyrimidinyl group, a triazinyl group, a quinolinyl group, an isoquinolinyl group, —$Si(Q_{501})(Q_{502})(Q_{503})$, or a combination thereof, wherein $Q_{501}$ to $Q_{503}$ may each independently be hydrogen, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, or a combination thereof, $L_{501}$ to $L_{503}$ may each be understood by referring to the description of $L_1$ provided herein, xd1 to xd3 may be each independently 0, 1, or 2, and xd4 may be 0, 1, 2, or 3, but embodiments are not limited thereto.

In one or more embodiments, the fluorescence dopant may include a compound represented by one of Formulae 502-1 to 502-5:

Formula 502-1

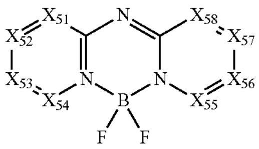

Formula 502-2

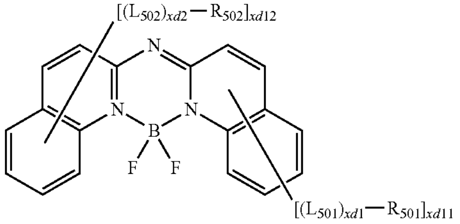

Formula 502-3

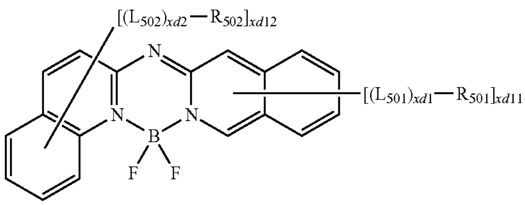

Formula 502-4

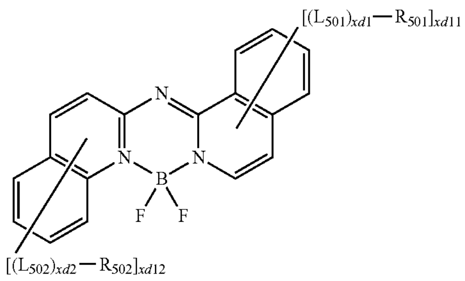

-continued

Formula 502-5

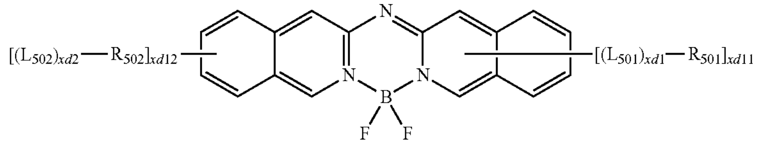

wherein, in Formulae 502-1 to 502-5, $X_{51}$ may be N or C-[$(L_{501})_{xd1}$-$R_{501}$], $X_{52}$ may be N or C-[$(L_{502})_{xd2}$-$R_{502}$], $X_{53}$ may be N or C-[$(L_{503})_{xd3}$-$R_{503}$], $X_{54}$ may be N or C-[$(L_{504})_{xd4}$-$R_{504}$], $X_{55}$ may be N or C-[$(L_{505})_{xd5}$-$R_{505}$], $X_{56}$ may be N or C-[$(L_{506})_{xd6}$-$R_{506}$], $X_{57}$ may be N or C-[$(L_{507})_{xd7}$-$R_{507}$], and $X_{58}$ may be N or C-[$(L_{508})_{xd8}$-$R_{508}$], $L_{501}$ to $L_{508}$ may each be understood by referring to the description of $L_{501}$ in Formula 501, xd1 to xd8 may each be understood by referring to the description of xd1 in Formula 501, $R_{501}$ to $R_{508}$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, or a $C_1$-$C_{20}$ alkylthio group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or a combination thereof, xd11 and xd12 may each independently be 0, 1, 2, 3, 4, or 5, two or more of $R_{501}$ to $R_{504}$ may optionally be bonded together to form a substituted or unsubstituted $C_5$-$C_{30}$ carbocyclic group or a substituted or unsubstituted $C_1$-$C_{30}$ heterocyclic group, and two or more of $R_{505}$ to $R_{508}$ may optionally be bonded together to form a substituted or unsubstituted $C_5$-$C_{30}$ carbocyclic group or a substituted or unsubstituted $C_1$-$C_{30}$ heterocyclic group.

In one or more embodiments, the fluorescent dopant may include a compound represented by Formula 503-1 or Formula 503-2:

Formula 503-1

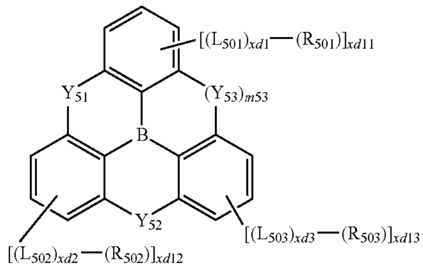

Formula 503-2

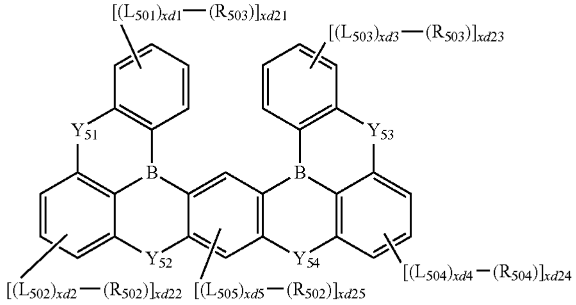

wherein, in Formulae 503-1 and 503-2, $Y_{51}$ to $Y_{54}$ may each independently be a single bond, O, S, N[$(L_{506})_{xd6}$-$R_{506}$], C[$(L_{506})_{xd6}$-$R_{506}$][$(L_{507})_{xd7}$-$R_{507}$], or Si[$(L_{506})_{xd6}$-$R_{506}$][$(L_{507})_{xd7}$-$R_{507}$], m53 may be 0 or 1, $L_{501}$ to $L_{507}$ may each be understood by referring to the description of $L_{501}$ in Formula 501, xd1 to xd7 may each be understood by referring to the description of xd1 in Formula 501, $R_{501}$ to $R_{507}$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, or a $C_1$-$C_{20}$ alkylthio group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or a combination thereof, when m53 is 0, xd11 and xd13 may each independently be 0, 1, 2, 3, or 4, when m53 is 1, xd11 and xd13 may each independently be 0, 1, 2, or 3, xd21 and xd23 may each independently be 0, 1, 2, 3, or 4, xd12, xd22, and xd24 may each independently be 0, 1, 2, or 3, xd25 may be 0, 1, or 2, and two or more of $R_{501}$ to $R_{507}$ may optionally be bonded to each other to form a substituted or unsubstituted $C_5$-$C_{30}$ carbocyclic group or a substituted or unsubstituted $C_1$-$C_{30}$ heterocyclic group.

The fluorescent dopant may include, for example, Compounds FD(1) to FD(16), Compounds FD1 to FD17, or a combination thereof:

FD(1)

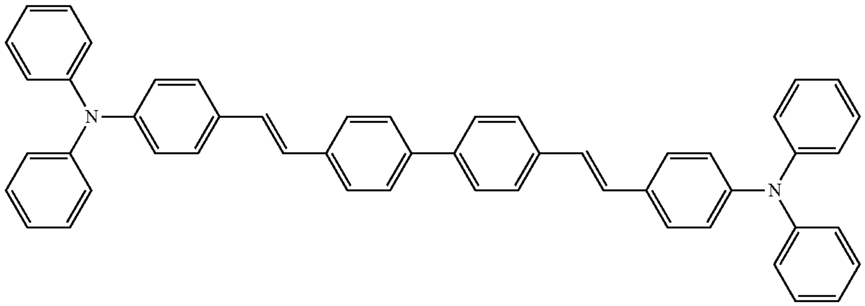

FD(2)

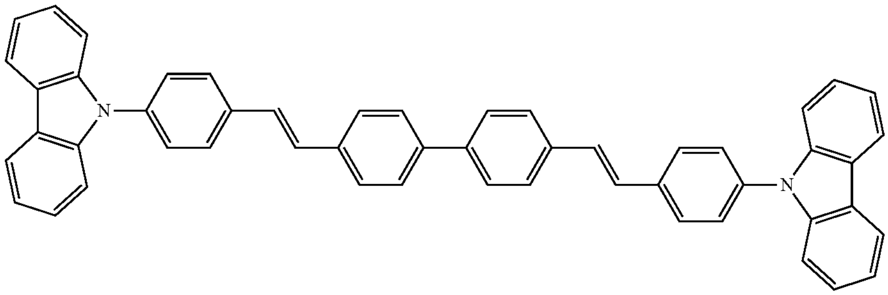

-continued
FD(3)
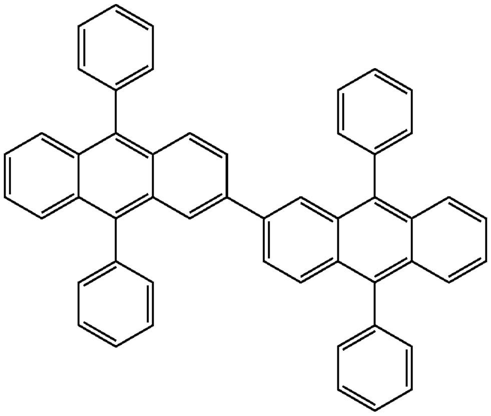
FD(4)
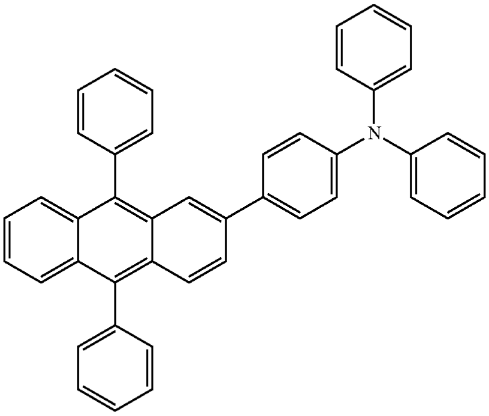
FD(5)
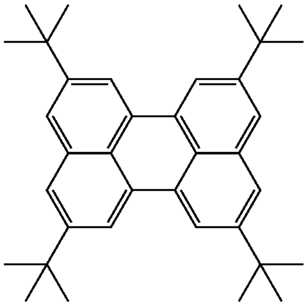
FD(6)
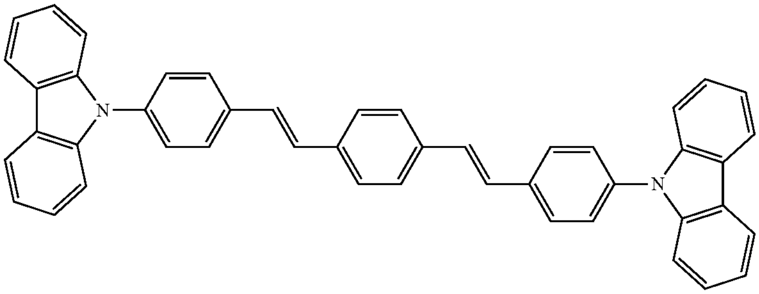
FD(7)
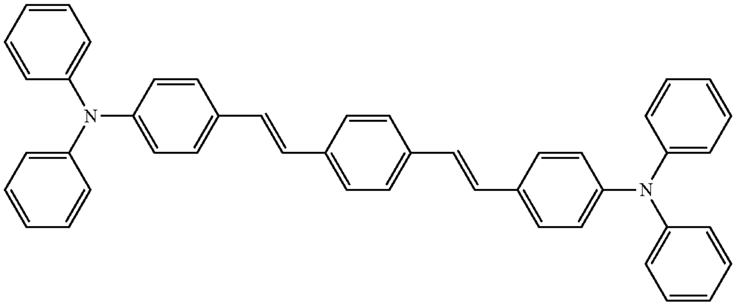

-continued
FD(8)
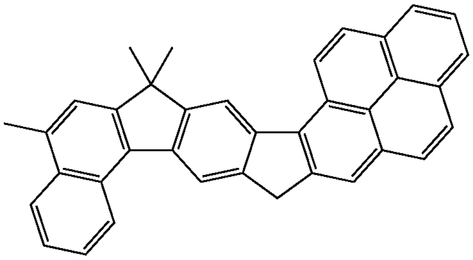
FD(9)
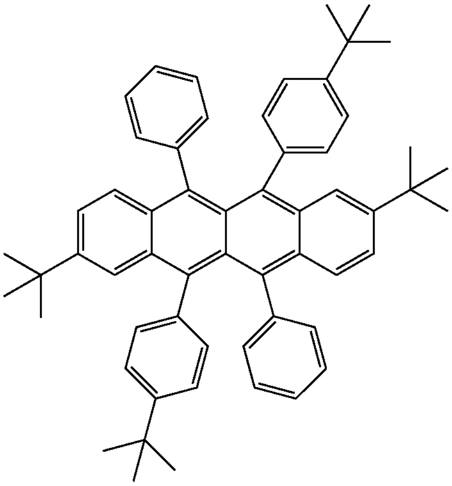
FD(10)
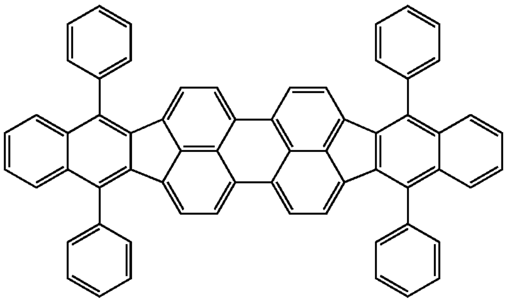
FD(11)
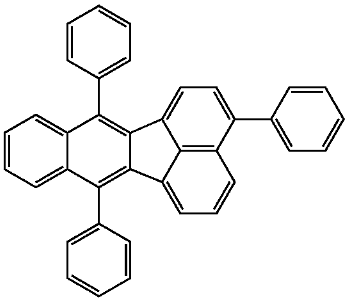
FD(12)
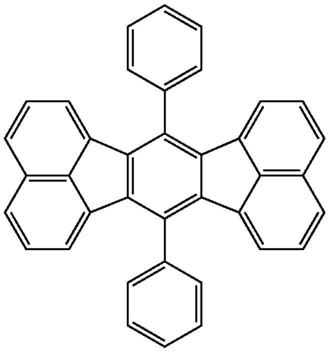
FD(13)
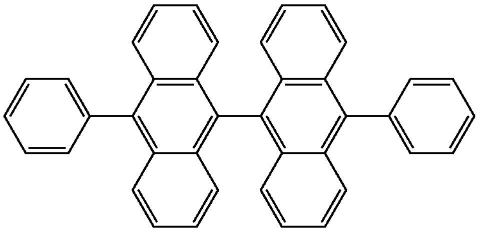
FD(14)
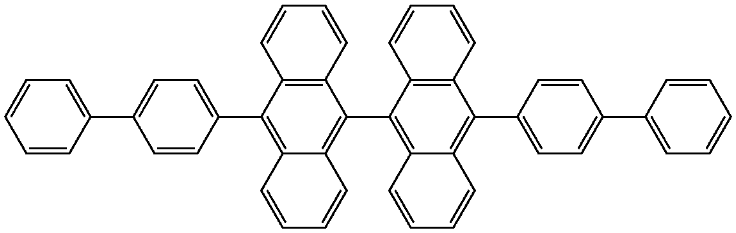

-continued
FD(15)
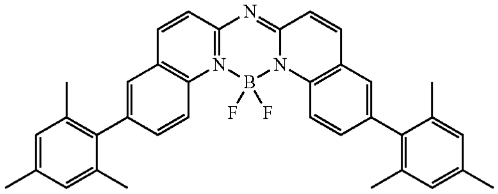
FD(16)
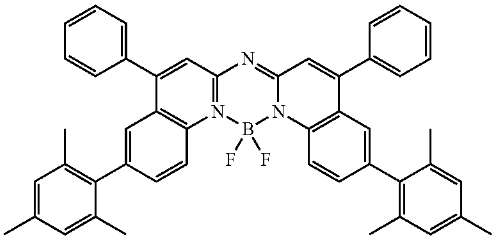
FD1
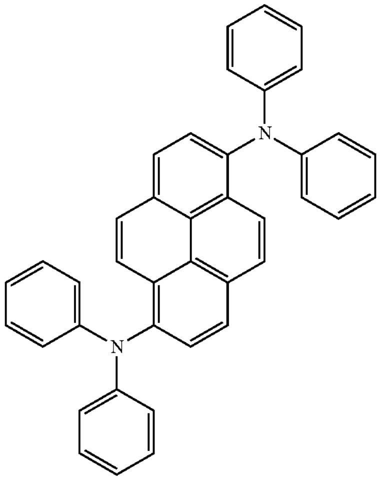
FD2
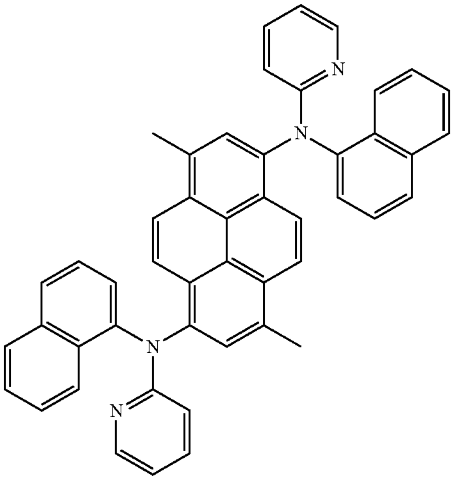
FD3
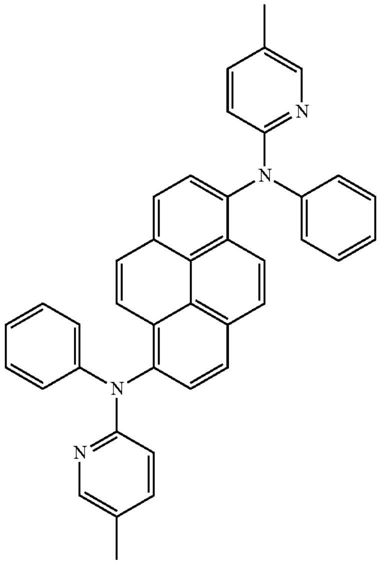
FD4
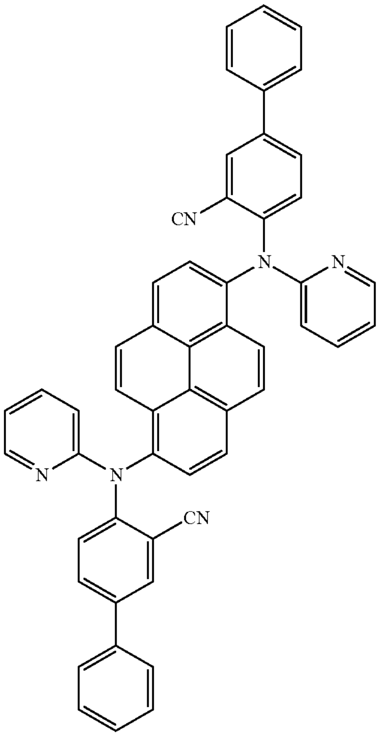

-continued
FD5
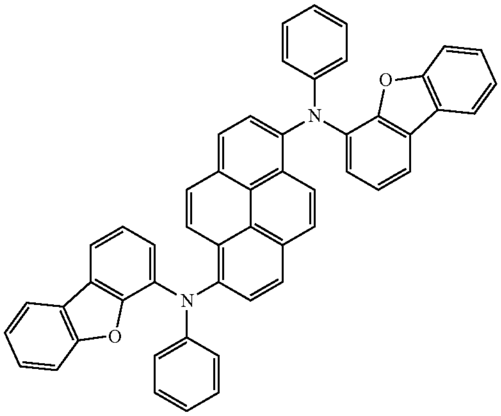
FD6
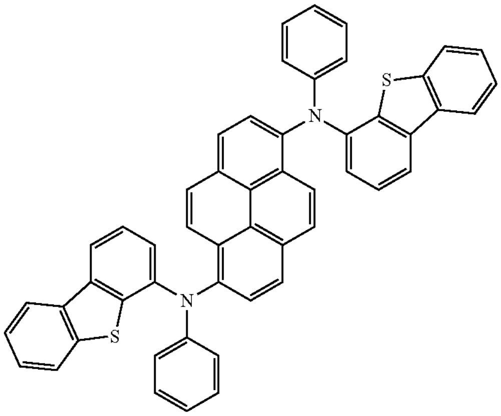
FD7
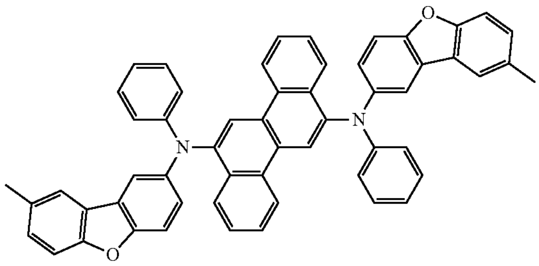
FD8
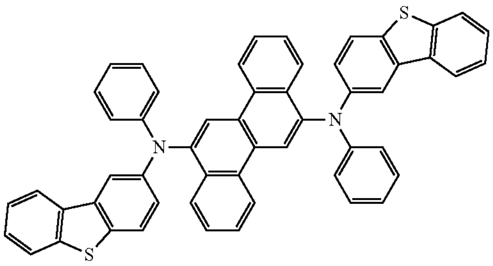
FD9
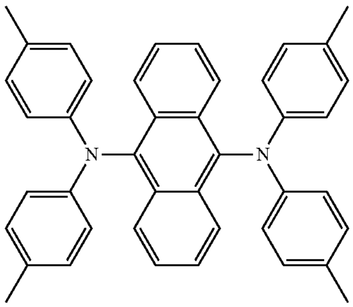
FD10
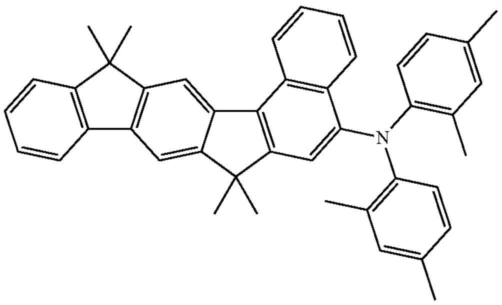
FD11
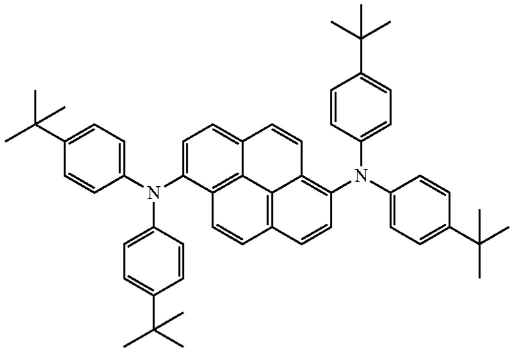
FD12
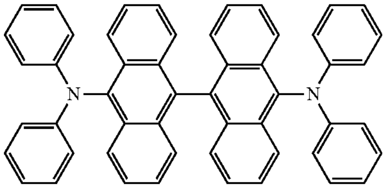

-continued

FD13

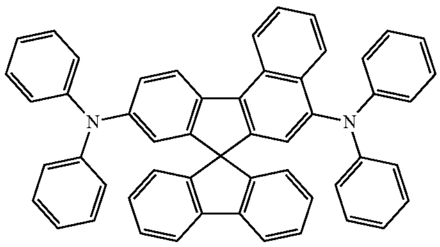

FD14

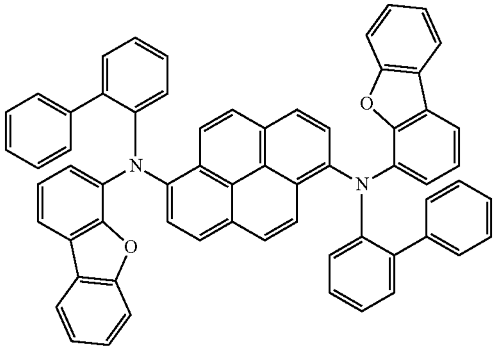

FD15

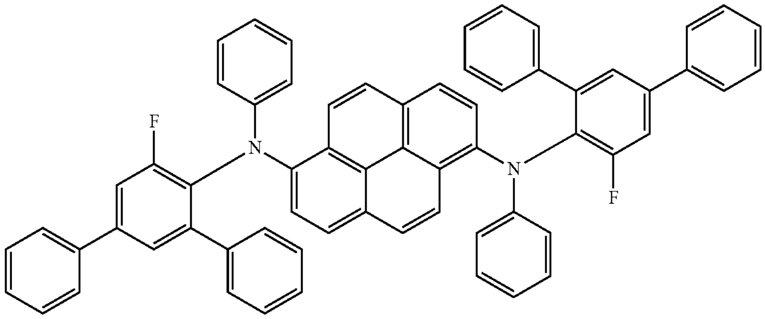

FD16

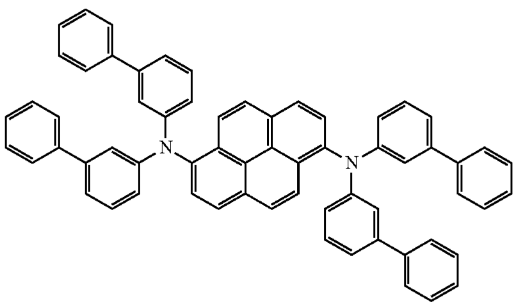

FD17

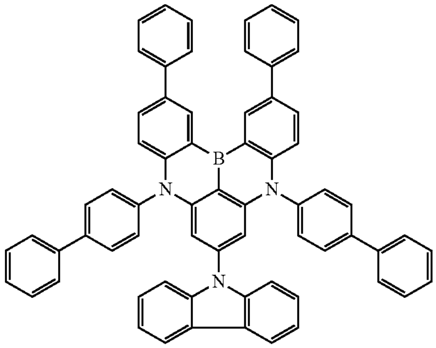

The thickness of the emission layer may be in a range of about 100 Å to about 1,000 Å, and in one or more embodiments, about 200 Å to about 600 Å. When the thickness of the emission layer is within any of these ranges, improved luminescence characteristics may be obtained without a substantial increase in driving voltage.

Next, an electron transport region may be formed on the emission layer.

The electron transport region may include at least one selected from a hole blocking layer, an electron transport layer, and an electron injection layer.

In one or more embodiments, the electron transport region may have a hole blocking layer/an electron transport layer/an electron injection layer structure or an electron transport layer/an electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer, for example, may include at least one of 2,9-dimethyl-4,7-diphenyl-1,10-phenanthroline (BCP) or 4,7-diphenyl-1,10-phenanthroline (Bphen), but embodiments are not limited thereto:

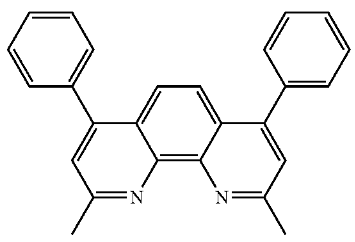

BCP

-continued

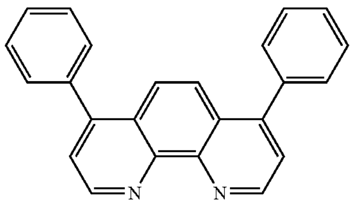

Bphen

The thickness of the hole blocking layer may be in a range of about 20 Å to about 1,000 Å, and in one or more embodiments, about 30 Å to about 300 Å. When the thickness of the hole blocking layer is within any of these ranges, excellent hole blocking characteristics may be obtained without a substantial increase in driving voltage.

The electron transport layer may include BCP, Bphen, 1,3,5-tri(1-phenyl-1H-benzo[d]imidazol-2-yl)phenyl (TPBi), tris(8-hydroxyquinolinato)aluminum ($Alq_3$), bis(2-methyl-8-quinolinolato-N1,O8)-(1,1'-biphenyl-4-olato)aluminum (BAlq), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or a combination thereof:

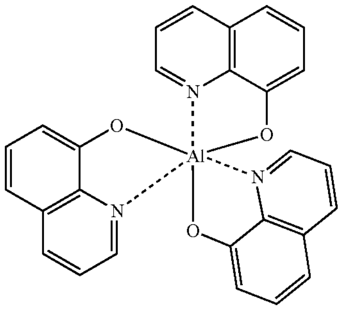

$Alq_3$

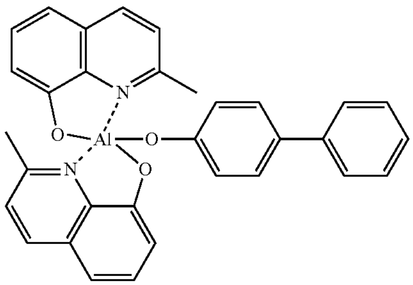

BAlq

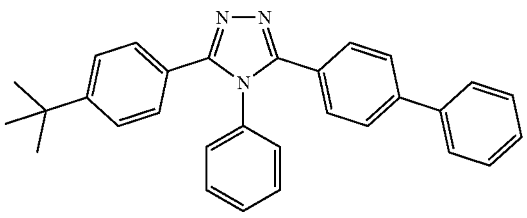

TAZ

-continued

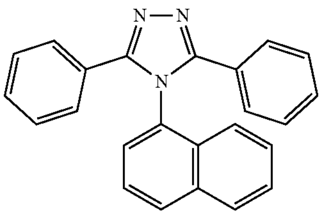

NTAZ

In one or more embodiments, the electron transport layer may include at least one of Compounds ET1 to ET25, but embodiments are not limited thereto:

ET1

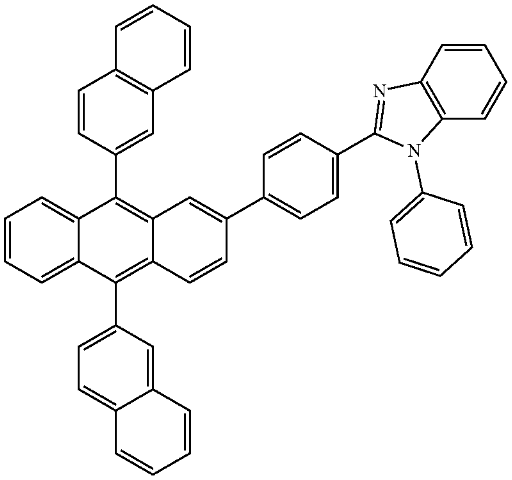

ET2

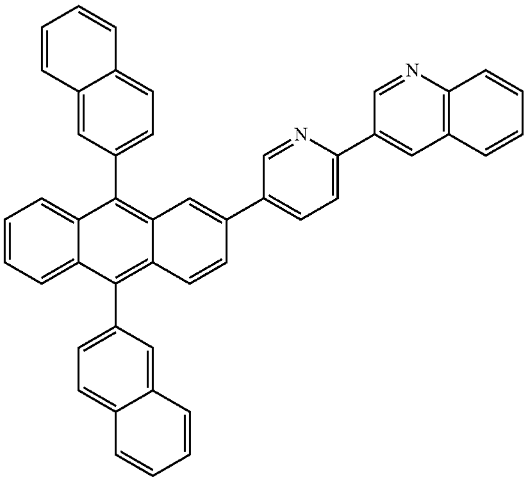

-continued
ET3
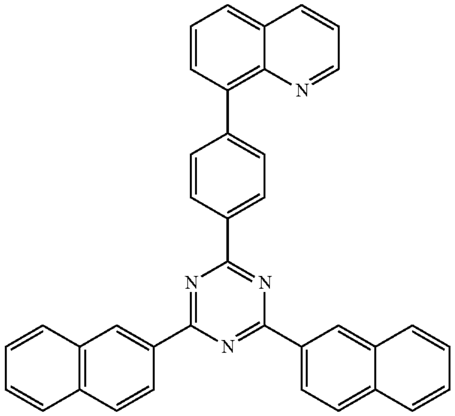
ET4
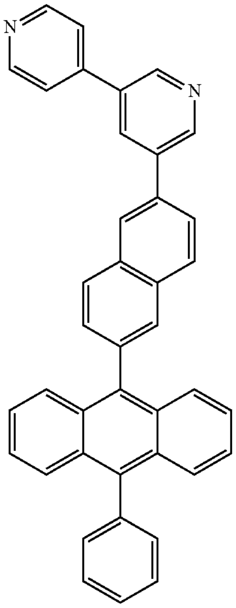
ET5
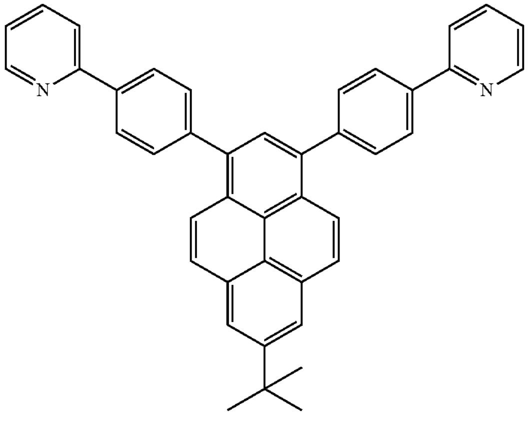
-continued
ET6
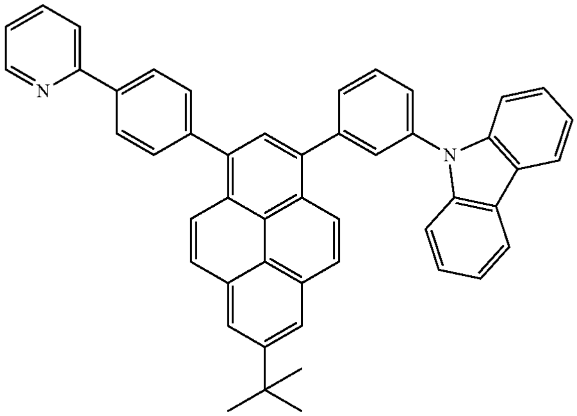
ET7
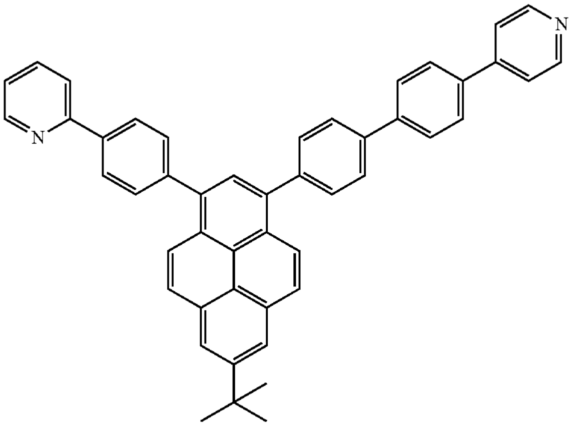
ET8
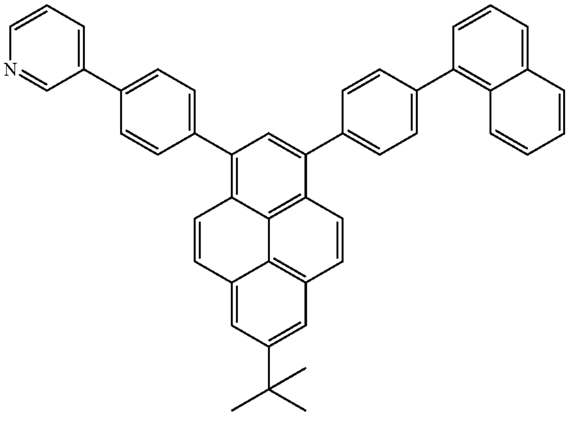

-continued
ET9
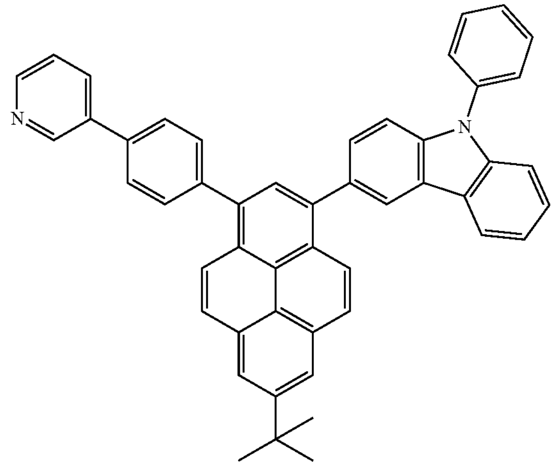
ET10
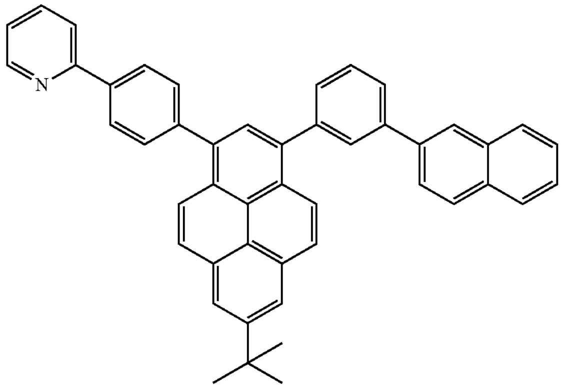
ET11
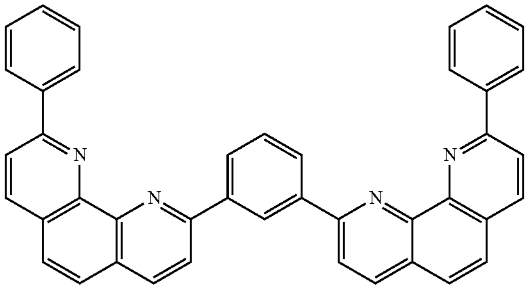
ET12
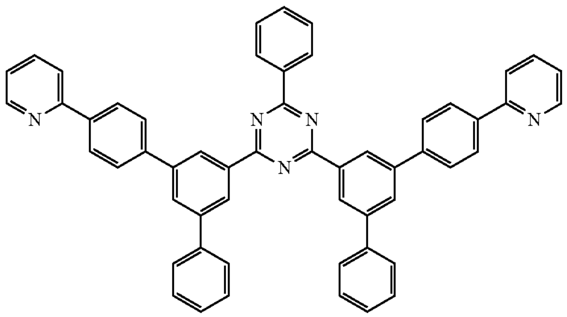
-continued
ET13
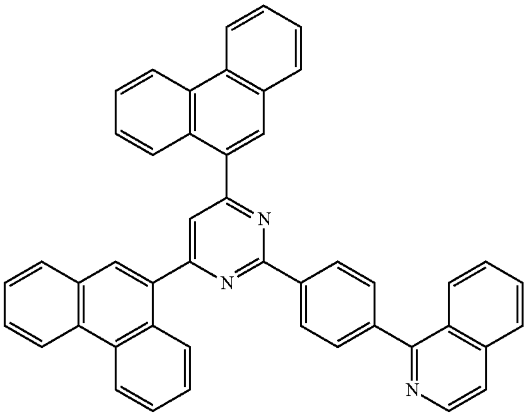
ET14
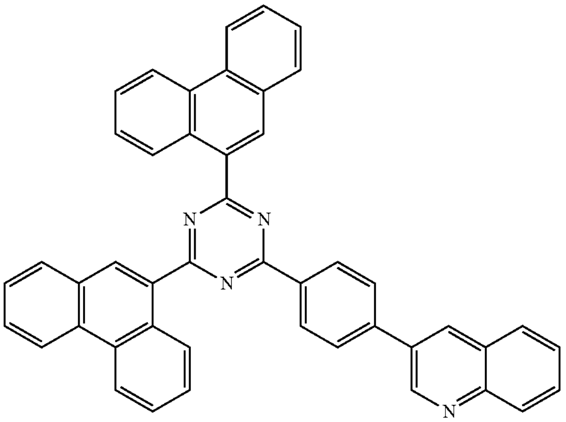
ET15
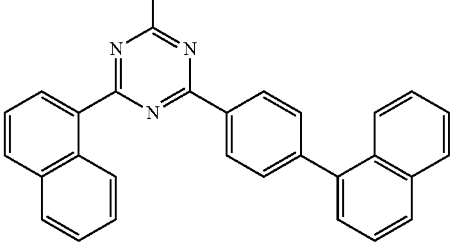

-continued
ET16
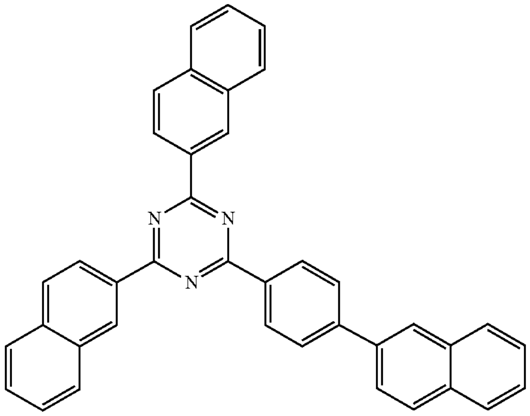
ET17
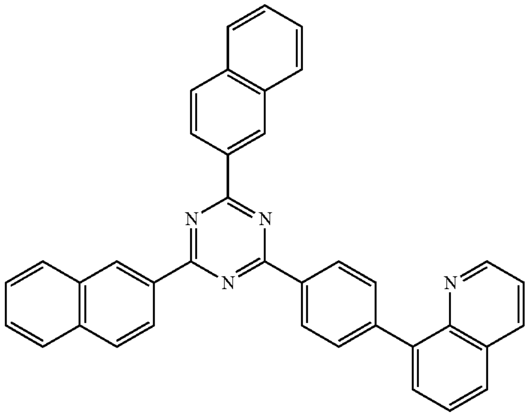
ET18
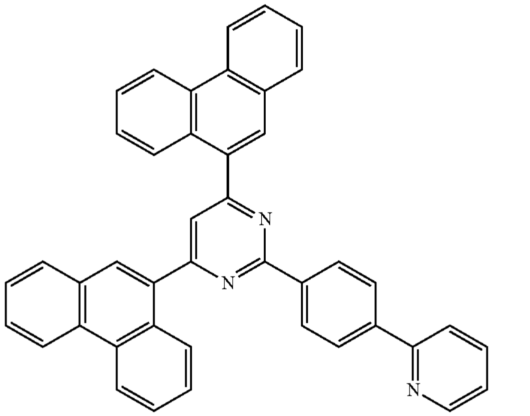
-continued
ET19
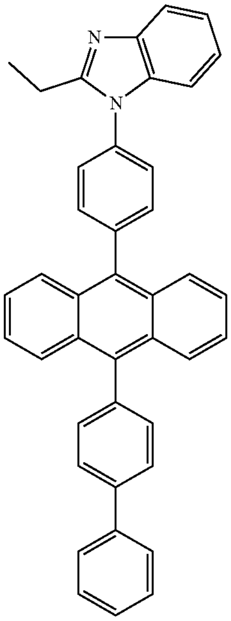
ET20
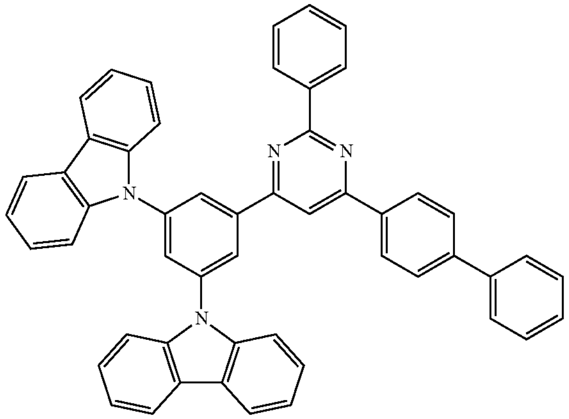
ET21
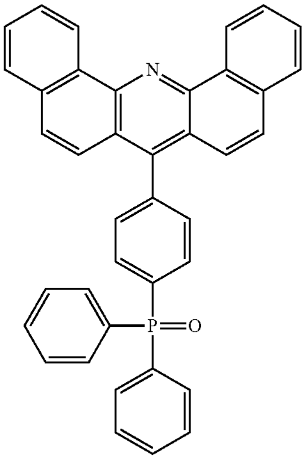

-continued

ET22

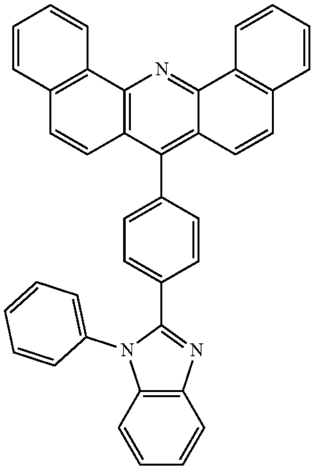

ET23

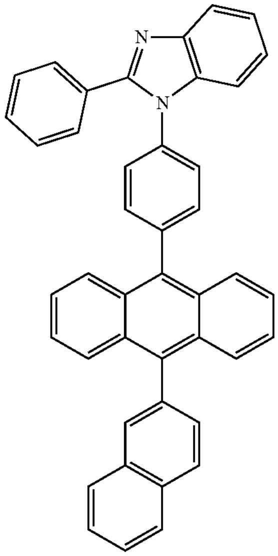

ET24

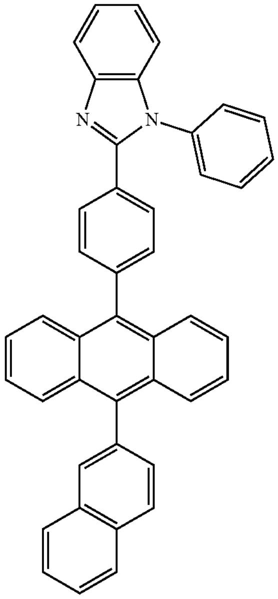

-continued

ET25

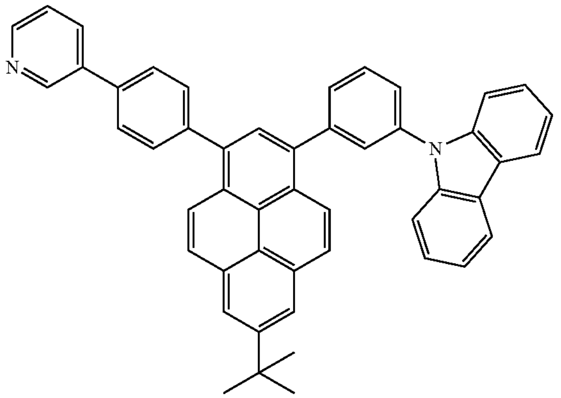

The thickness of the electron transport layer may be in a range of about 100 Å to about 1,000 Å, and in one or more embodiments, about 150 Å to about 500 Å. When the thickness of the electron transport layer is within any of these ranges, excellent electron transport characteristics may be obtained without a substantial increase in driving voltage.

The electron transport layer may further include a material containing metal, in addition to the materials described above.

The material containing metal may include a Li complex. The Li complex may include, e.g., Compound ET-D1 (LiQ) or Compound ET-D2:

ET-D1

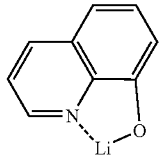

ET-D2

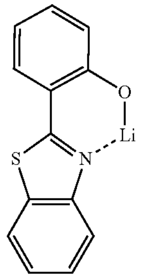

The electron transport region may include an electron injection layer that facilitates injection of electrons from the second electrode 19.

The electron injection layer may include at least one of LiQ, LiF, NaCl, CsF, $Li_2O$, or BaO.

The thickness of the electron injection layer may be in a range of about 1 Å to about 100 Å, for example, about 3 Å to about 90 Å. When the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, and a mixture thereof. Examples of the material for forming the second electrode 19 may include lithium (Li), magnesium (Mg), aluminum (Al), silver (Ag), aluminum-lithium (Al—Li), calcium (Ca), magnesium-indium (Mg—In), and magnesium-silver (Mg—Ag). In one or more embodiments, ITO or IZO may be used to form a transmissive second electrode 19 to manufacture a top emission light-emitting device. In one or more embodiments, the material for forming the second electrode 19 may vary.

Hereinbefore the organic light-emitting device 10 has been described with reference to FIG. 1, but embodiments are not limited thereto.

According to an aspect of still another embodiment, a diagnostic composition may include at least one organometallic compound represented by Formula 1.

Since the organometallic compound represented by Formula 1 provides high luminescence efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

General Definitions of Terms

The term "$C_1$-$C_{60}$ alkyl group" as used herein refers to a linear or branched saturated aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having substantially the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_1$-$C_{60}$ alkylthio group" as used herein refers to a monovalent group represented by —$SA_{101'}$ (wherein $A_{101'}$ is a $C_1$-$C_{60}$ alkyl group).

The term "$C_2$-$C_{60}$ alkenyl group" as used herein refers to a group formed by including at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a group formed by including at least one carbon-carbon triple bond in the middle or at the terminus of the $C_2$-$C_{60}$ alkyl group. Examples thereof include an ethenyl group and a propenyl group. The term "$C_2$-$C_{60}$ alkynylene group" as used herein refers to a divalent group having substantially the same structure as the $C_2$-$C_{60}$ alkynyl group.

The term "$C_3$-$C_{10}$ cycloalkyl group" as used herein refers to a monovalent monocyclic saturated hydrocarbon group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, P, Si, Se, Ge, and S as a ring-forming atom and 1 to 10 carbon atoms. Examples thereof include a tetrahydrofuranyl group and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group including 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si, Se, Ge, and S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent $C_6$-$C_{60}$ aryl group having a carbocyclic aromatic system and 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and a $C_6$-$C_{60}$ arylene group each include at least two rings, the at least two rings may be fused.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group having a heterocyclic aromatic system having at least one heteroatom selected from N, O, P, Si, and S as a ring-forming atom and 1 to 60 carbon atoms. The term "$C_1$-$C_{60}$ heteroarylene group" as used herein refers to a divalent $C_1$-$C_{60}$ heteroaryl group having a heterocyclic aromatic system having at least one heteroatom selected from N, O, P, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include at least two rings, the at least two rings may be fused.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein refers to —$OA_{102}$ (wherein $A_{102}$ is a $C_6$-$C_{60}$ aryl group). The term "$C_6$-$C_{60}$ arylthio group" as used herein refers to —$SA_{103}$ (wherein $A_{103}$ is a $C_6$-$C_{60}$ aryl group).

The term "$C_1$-$C_{60}$ heteroaryloxy group" as used herein indicates —$OA_{102'}$ (wherein $A_{102'}$ is a $C_1$-$C_{60}$ heteroaryl group), and the term "$C_1$-$C_{60}$ heteroarylthio group" as used herein indicates —$SA_{103'}$ (wherein $A_{103'}$ is a $C_1$-$C_{60}$ heteroaryl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, and S and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group.

The term "$C_1$-$C_{30}$ heterocyclic group" as used herein refers to saturated or unsaturated cyclic group including 1 to 30 carbon atoms and at least one heteroatom selected from N, O, P, Si, Se, Ge, and S as ring-forming atoms. The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, the substituted monovalent non-aromatic condensed heteropolycyclic group, the substituted $C_5$-$C_{30}$ carbocyclic group, and the substituted or unsubstituted $C_1$-$C_{30}$ heterocyclic group may be:

deuterium, —F, —Cl, —Br, —I, $SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(Q_{18})(Q_{19})$, —$P(=O)(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(Q_{28})(Q_{29})$, —$P(=O)(Q_{28})(Q_{29})$, or a combination thereof; or $—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(Q_{38})(Q_{39})$, or $—P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ may each independently be: hydrogen, deuterium, —F, —Cl, —Br, —I, $—SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ in this specification may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, a phenyl group, a biphenyl group, or a naphthyl group, each unsubstituted or substituted with at least one of deuterium, a $C_1$-$C_{10}$ alkyl group, a phenyl group, or a combination thereof.

The term "room temperature" and "ambient temperature" as used herein refers to a temperature of about 25° C.

The terms "a biphenyl group, a terphenyl group, and a tetraphenyl group" as used herein each refer to a monovalent group having two, three, and four phenyl groups linked via a single bond, respectively.

Hereinafter, exemplary compounds and organic light-emitting devices according to one or more exemplary embodiments will be described in further detail with reference to Synthesis Examples and Examples, however, the present disclosure is not limited thereto. The wording "B was used instead of A" used in describing Synthesis Examples means that an amount of B used was identical to an amount of A used based on molar equivalence.

EXAMPLES

Synthesis Example 1: Synthesis Example 1: Synthesis of Compound 1

(1) Synthesis of Intermediate 1(1)

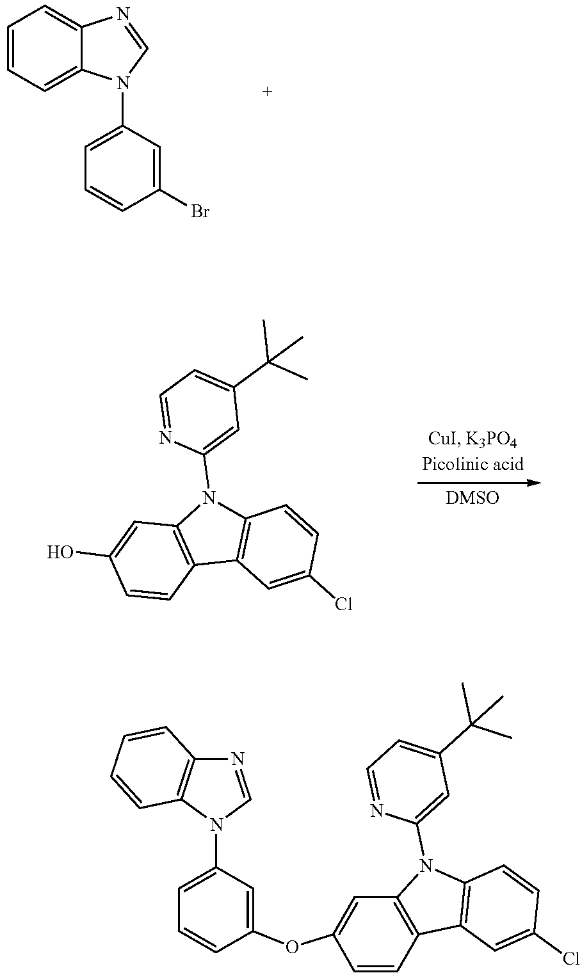

1(1)

51.3 millimole (mmol) (14 grams (g)) of 1-(3-bromophenyl)-1H-benzo[d]imidazole and 57.0 mmol (20 g) of 9-(4-(tert-butyl) a pyridine-2-yl)-6-chloro-9H-carbazol-2-ol were dissolved in 500 milliliters (mL) of dimethyl sulfoxide (DMSO). Then, 15.5 mmol (3.0 g) of CuI, 207.2 mmol (44.0 g) of $K_3PO_4$, and 77.7 mmol (9.6 g) of picolinic acid were added thereto, followed by reflux at a temperature of 100° C. for 12 hours. The resultant was allowed to cool to room temperature, and an organic layer was extracted three times therefrom using a mixture of ethyl acetate and water, followed by drying the organic layer with magnesium sulfate. Under a reduced pressure, a solvent was removed therefrom to obtain a crude product. Then, using silica gel column chromatography (eluent: ethyl acetate and hexanes), Intermediate 1(1) was obtained (yield: 72%).

Higher performance liquid chromatography-mass spectrometry analysis (HPLC-MS): 543.24 $[M+H]^+$.

(2) Synthesis of Intermediate 1(2)

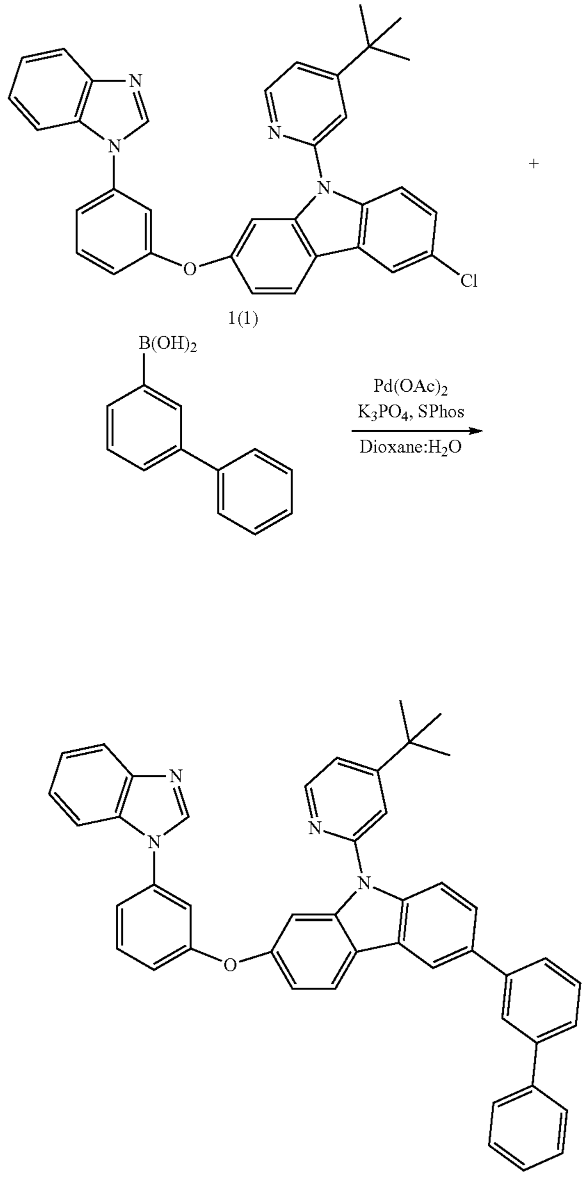

1(1)

1(2)

11.0 mmol (6.0 g) of Intermediate 1(1) and 14.4 mmol (2.8 g) of [1,1'-biphenyl]-3-yl boronic acid were dissolved in a solution containing 25 mL of 1,4-dioxane and 8 mL of deionized (DI) water. Then, 2.2 mmol (0.5 g) of palladium (II) acetate ($Pd(OAc)_2$), 33.0 mmol (7.0 g) of $K_3PO_4$, and 4.4 mmol (1.8 g) of 2-dicyclohexylphosphino-2',6'-dimethoxybiphenyl (SPhos) were added to the mixture, followed by reflux at a temperature of 110° C. for 12 hours. The resultant was allowed to cool to room temperature, and an organic layer was extracted three times therefrom using a mixture of ethyl acetate and water, followed by drying the organic layer with magnesium sulfate. Under a reduced pressure, a solvent was removed therefrom to obtain a crude product. Then, using silica gel column chromatography (eluent: ethyl acetate and hexanes), Intermediate 1(2) was obtained (yield: 85%).

HPLC-MS: 661.35 $[M+H]^+$.

(3) Synthesis of Intermediate 1(3)

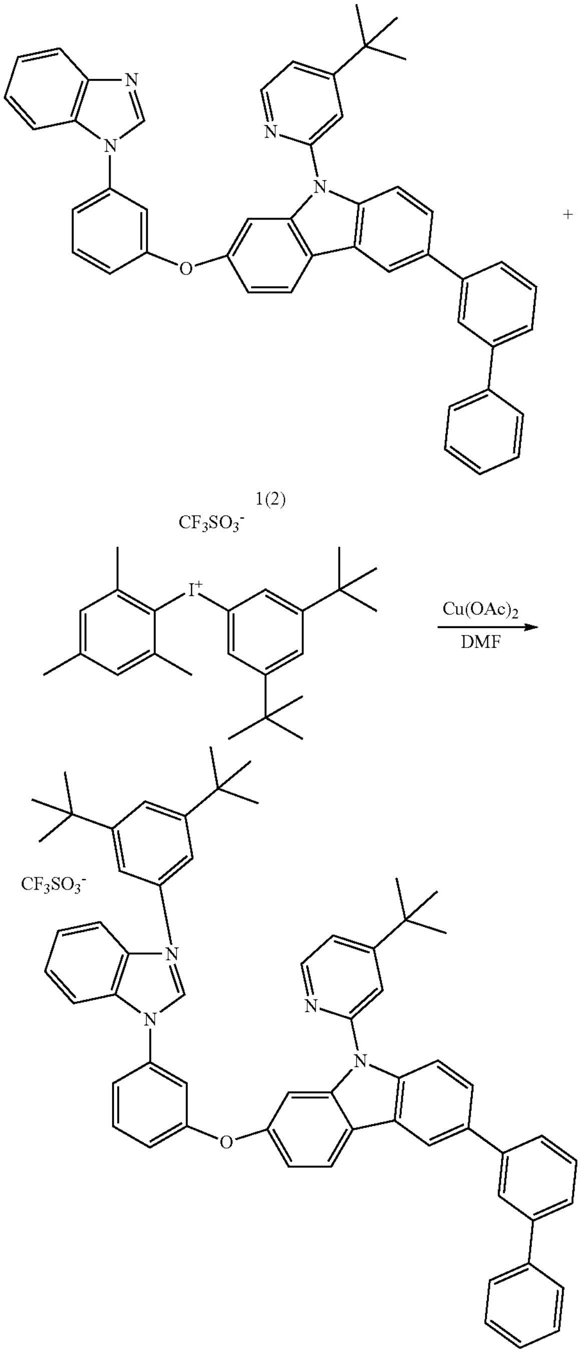

1(2)

1(3)

8.47 mmol (5.6 g) of Intermediate 1(2), 11.0 mmol (6.4 g) of (3,5-di-t-butylphenyl)(mesityl)iodonium trifluoromethane sulfonate, and 0.85 mmol (0.15 g) of copper (II) acetate ($Cu(OAc)_2$) were added to 40 mL of dimethylformamide (DMF), followed by heating at reflux at a temperature of 130° C. for 12 hours. The solvent was removed under a reduced pressure to obtain a crude product. Then, using silica gel column chromatography (eluent: dichloromethane and acetone), Intermediate 1(3) was obtained (yield: 47%).

HPLC-MS: 849.51 $[M-OTF]^+$, (4) Synthesis of Compound 1

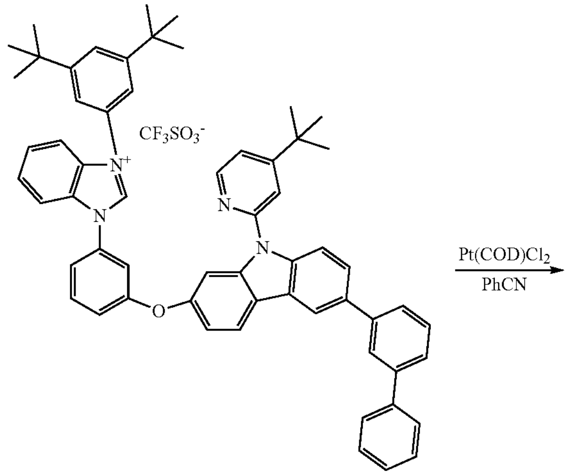

1(3)

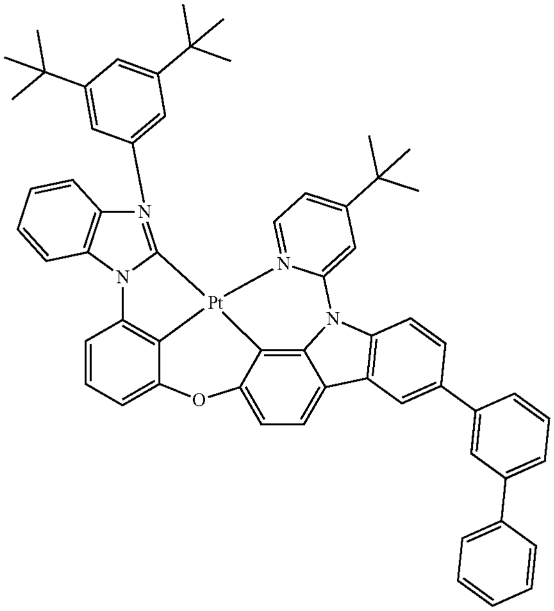

1

4.0 mmol (1.5 g) of (1,5-cyclooctadiene)platinum(II) dichloride ($Pt(COD)Cl_2$), 4.0 g mmol (4.0 mmol) of Intermediate 1(3), and 12.0 mmol (1.0 g) of sodium acetate (NaOAc) were added to 70 mL of benzonitrile (PhCN), followed by reflux at a temperature of 180° C. for 12 hours. Once the reaction was complete, the resultant was allowed to cool to room temperature. Then, a solvent was removed therefrom under a reduced pressure to obtain a crude product. Then, using silica gel column chromatography (eluent: dichloromethane and hexanes), Compound 1 was obtained (yield: 37%).

HPLC-MS: 1042.48 $[M+H]^+$.

Synthesis Example 2: Synthesis of Compound 2

(1) Synthesis of Intermediate 2(1)

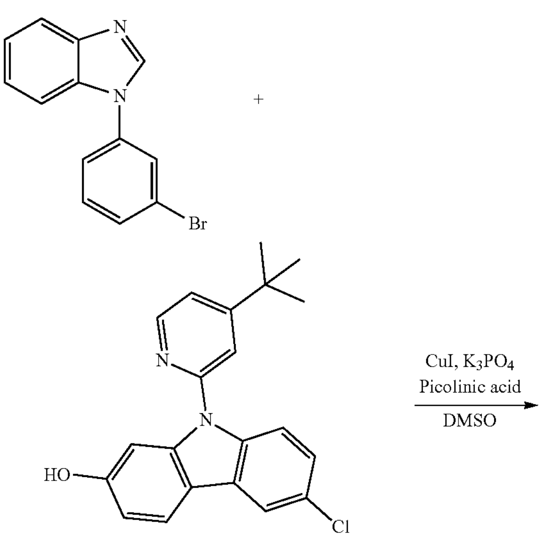

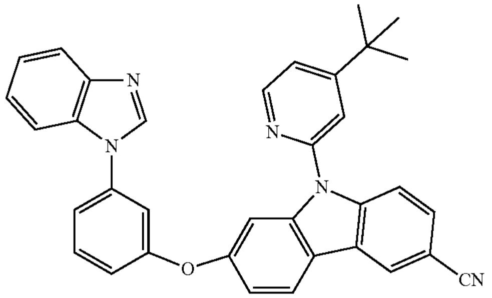

2(1)

Intermediate 2(1) was synthesized in a similar manner as in Synthesis of Intermediate 1(1) in Synthesis Example 1, except that 9-(4-(tert-butyl)pyridin-2-yl)-7-hydroxy-9H-carbazol-3-carbonitrile was used instead of 9-(4-(tert-butyl)pyridin-2-yl)-6-chloro-9H-carbazol-2-ol (yield: 75%).

HPLC-MS: 534.21 $[M+H]^+$.

(2) Synthesis of Intermediate 2(2)

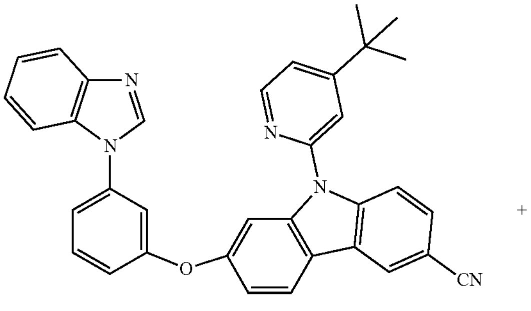

2(1)

-continued

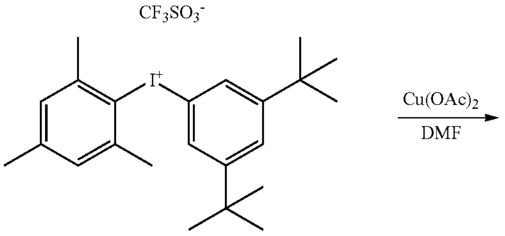

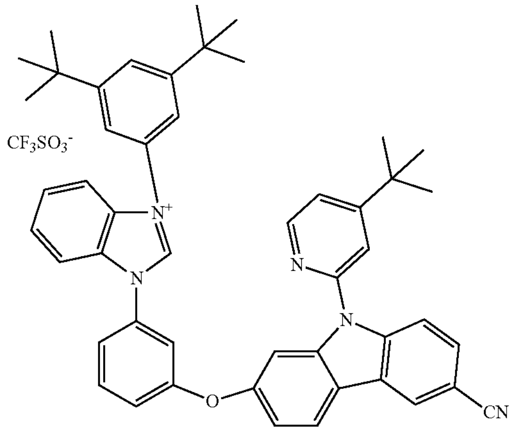

2(2)

Intermediate 2(2) was synthesized in a similar manner as in Synthesis of Intermediate 1(3) in Synthesis Example 1, except that Intermediate 2(1) was used instead of Intermediate 1(2) (yield: 60%).

HPLC-MS: 722.38 [M-OTf]$^+$.

(3) Synthesis of Compound 2

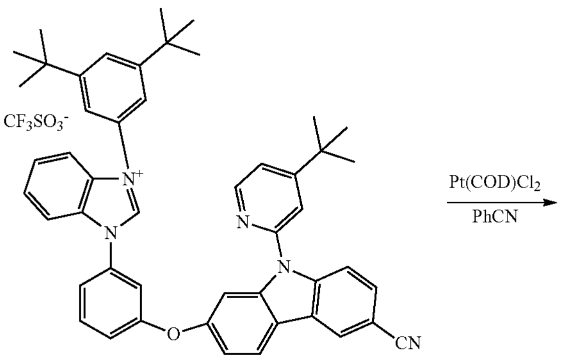

2(2)

-continued

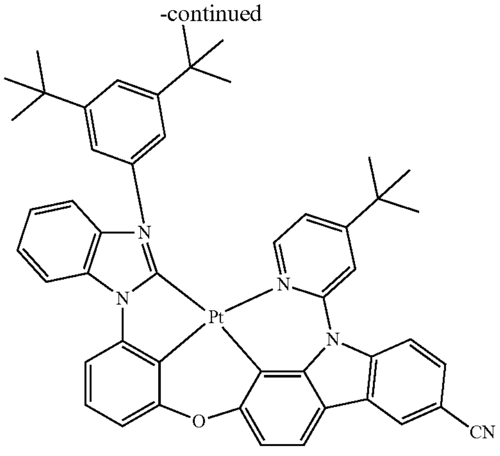

2

Compound 2 was synthesized in a similar manner as in Synthesis of Compound 1 in Synthesis Example 1, except that Intermediate 2(2) was used instead of Intermediate 1(3) (yield: 35%).

HPLC-MS: 915.32 [M+H]$^+$.

Synthesis Example 3: Synthesis of Compound 3

(1) Synthesis of Intermediate 3(1)

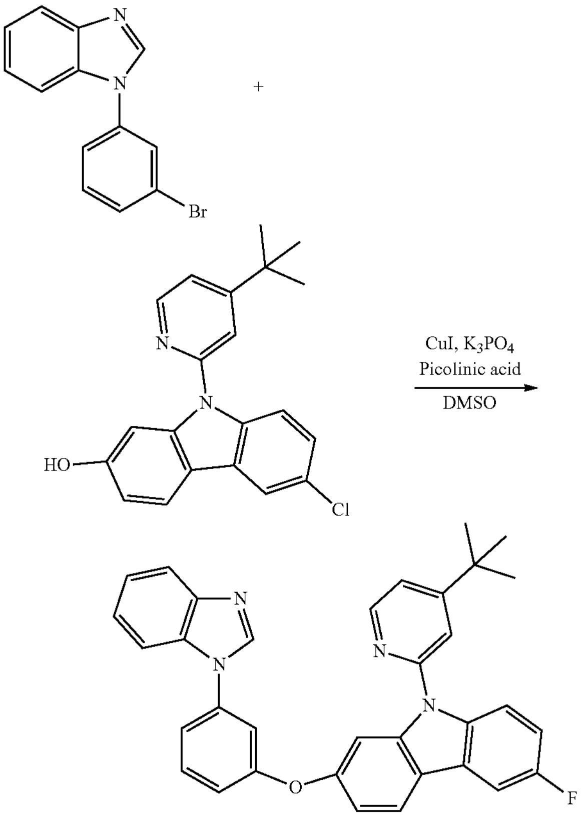

3(1)

Intermediate 3(1) was synthesized in a similar manner as in Synthesis of Intermediate 1(1) in Synthesis Example 1, except that 9-(4-(tert-butyl)pyridin-2-yl)-6-fluoro-9H-carbazol-2-ol was used instead of 9-(4-(tert-butyl)pyridin-2-yl)-6-chloro-9H-carbazol-2-ol (yield: 47%).

HPLC-MS: 527.23 $[M+H]^+$.

(2) Synthesis of Intermediate 3(2)

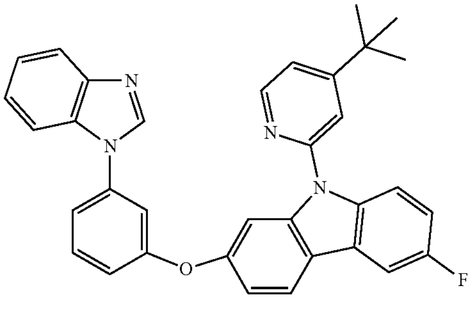

3(1)

+

$CF_3SO_3^-$

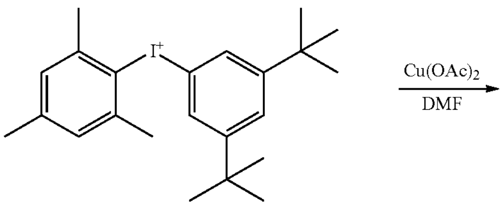

$CF_3SO_3^-$

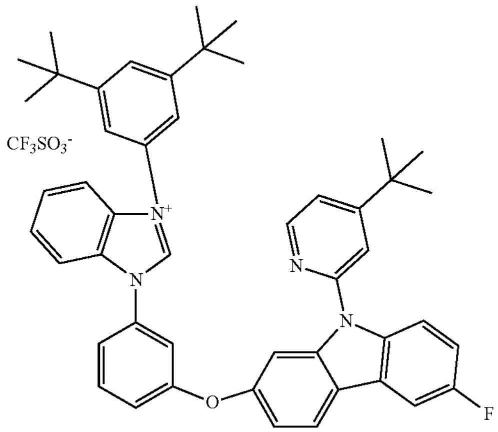

3(2)

Intermediate 3(2) was synthesized in a similar manner as in Synthesis of Intermediate 1(3) in Synthesis Example 1, except that Intermediate 3(1) was used instead of Intermediate 1(2) (yield: 84%).

HPLC-MS: 715.38 $[M-OTf]^+$.

(3) Synthesis of Compound 3

$CF_3SO_3^-$

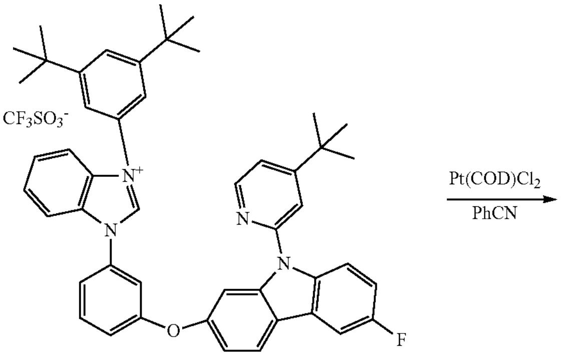

3(2)

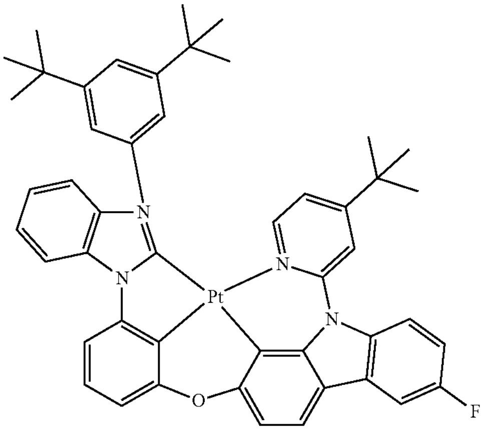

3

Compound 3 was synthesized in a similar manner as in Synthesis of Compound 1 in Synthesis Example 1, except that Intermediate 3(2) was used instead of Intermediate 1(3) (yield: 46%).

HPLC-MS: 908.33 $[M+H]^+$.

Synthesis Example 4: Synthesis of Compound 4

(1) Synthesis of Intermediate 4(1)

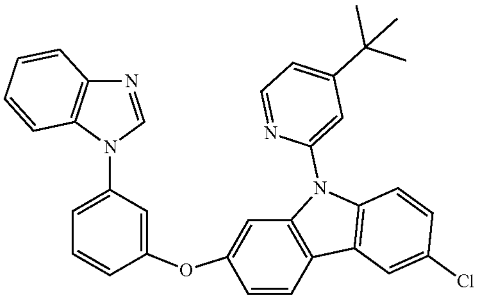

1(1)

+

-continued

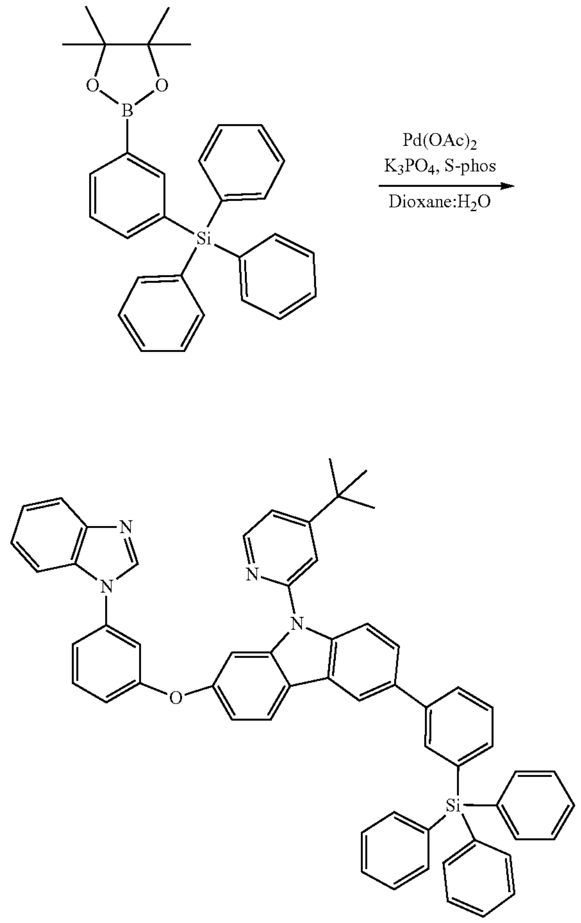

4(1)

Intermediate 4(1) was synthesized in a similar manner as in Synthesis of Intermediate 1(2) in Synthesis Example 1, except that triphenyl(3-(4,4,5,5-tetramethyl-1,3,2-dioxaboran-2-yl)phenyl)silane was used instead of [1,1'-biphenyl]-3-yl boronic acid (yield: 73%).

HPLC-MS: 843.34 $[M+H]^+$.

(2) Synthesis of Intermediate 4(2)

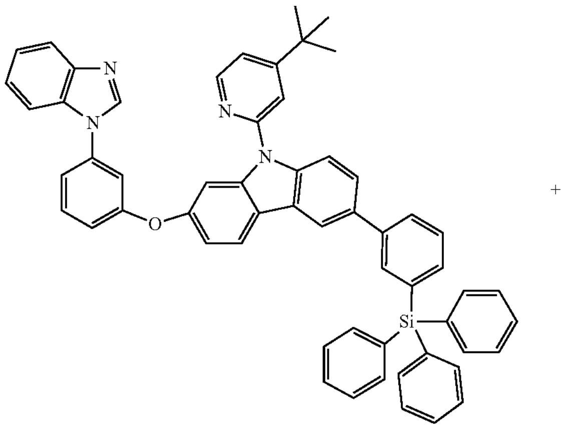

4(1)

-continued

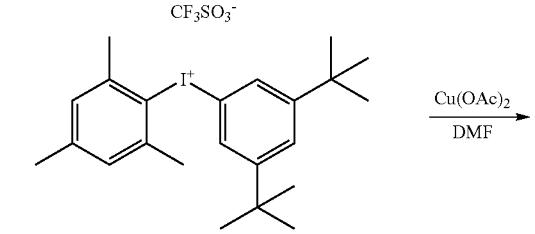

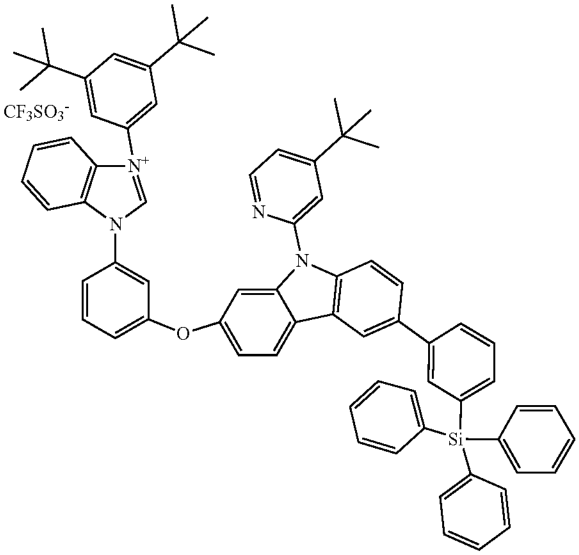

4(2)

Intermediate 4(2) was synthesized in a similar manner as in Synthesis of Intermediate 1(3) in Synthesis Example 1, except that Intermediate 4(1) was used instead of Intermediate 1(2) (yield: 61%).

HPLC-MS: 1031.50 $[M-OTf]^+$.

(3) Synthesis of Compound 4
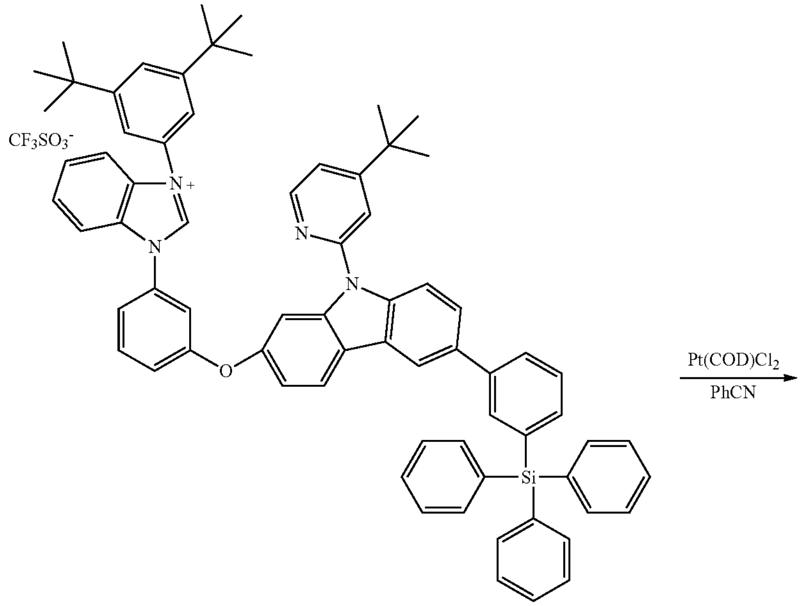
4(2)
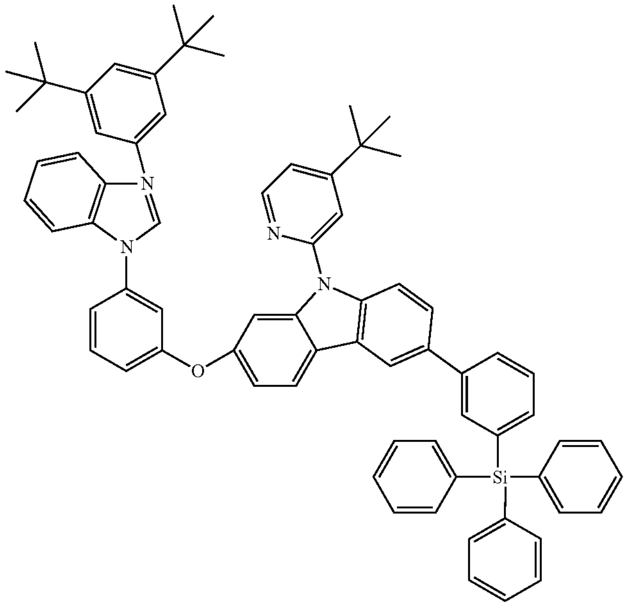
4

Compound 4 was synthesized in a similar manner as in Synthesis of Compound 1 in Synthesis Example 1, except that Intermediate 4(2) was used instead of Intermediate 1(3) (yield: 39%).

HPLC-MS: 1224.44 $[M+H]^+$.

Synthesis Example 5: Synthesis of Compound 5

(1) Synthesis of Intermediate 5(1)

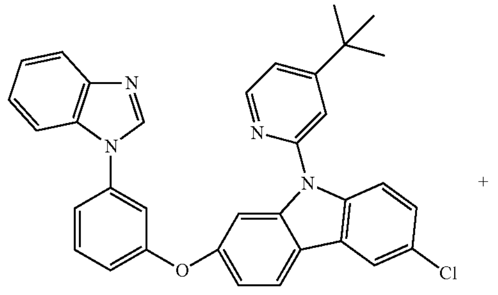

1(1)

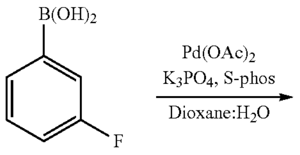

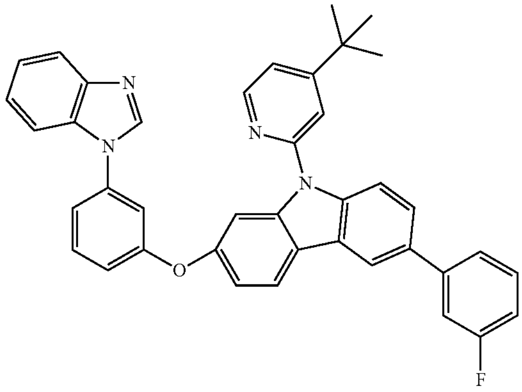

5(1)

Intermediate 5(1) was synthesized in a similar manner as in Synthesis of Intermediate 1(2) in Synthesis Example 1, except that (3-fluorophenyl)boronic acid was used instead of [1,1'-biphenyl]-3-yl boronic acid (yield: 79%).

HPLC-MS: 603.24 $[M+H]^+$.

(2) Synthesis of Intermediate 5(2)

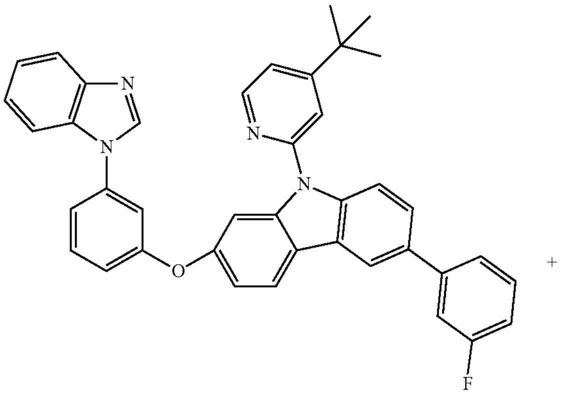

5(1)

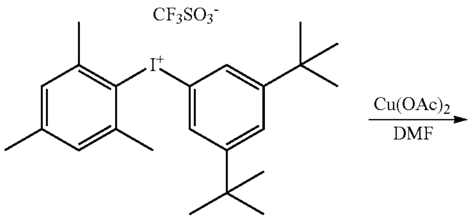

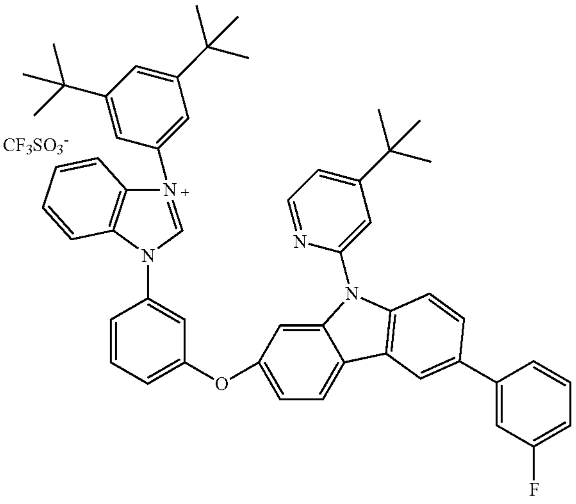

5(2)

Intermediate 5(2) was synthesized in a similar manner as in Synthesis of Intermediate 1(3) in Synthesis Example 1, except that Intermediate 5(1) was used instead of Intermediate 1(2) (yield: 81%).

HPLC-MS: 791.40 $[M-OTf]^+$.

(3) Synthesis of Compound 5

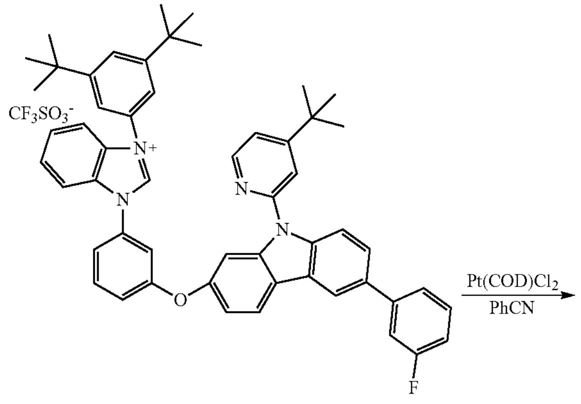

5(2)

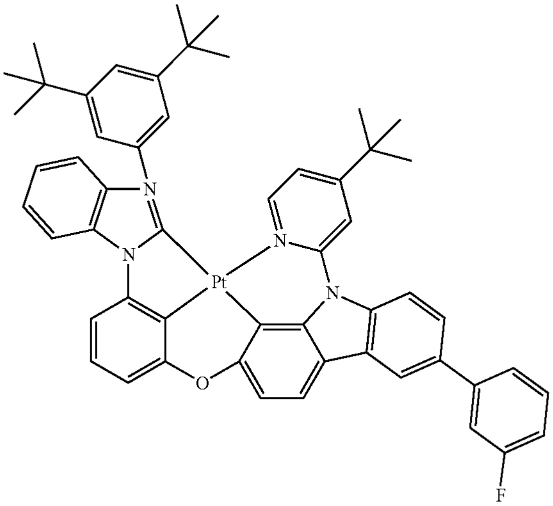

5

Compound 5 was synthesized in a similar manner as in Synthesis of Compound 1 in Synthesis Example 1, except that Intermediate 5(2) was used instead of Intermediate 1(3) (yield: 34%).

HPLC-MS: 984.31 $[M+H]^+$.

Synthesis Example 6: Synthesis of Compound 6

(1) Synthesis of Intermediate 6(1)

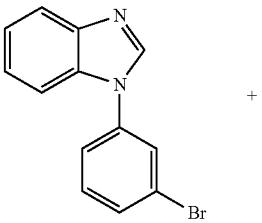

-continued

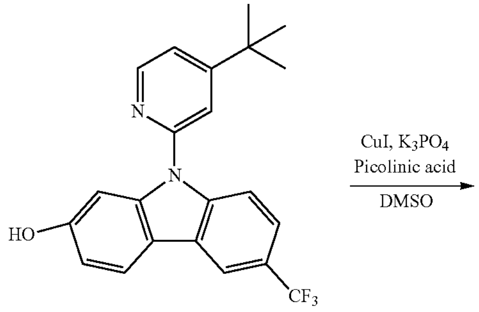

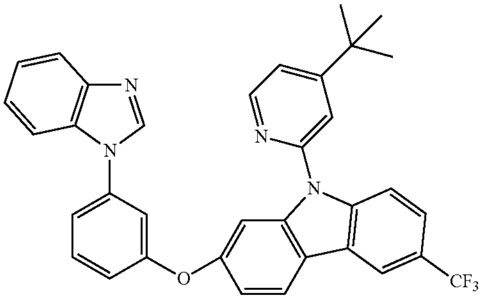

6(1)

Intermediate 6(1) was synthesized in a similar manner as in Synthesis of Intermediate 1(1) in Synthesis Example 1, except that 9-(4-(tert-butyl)pyridin-2-yl)-6-(trifluoromethyl)-9H-carbazol-2-ol was used instead of 9-(4-(tert-butyl)pyridin-2-yl)-6-chloro-9H-carbazol-2-ol (yield: 51%).

HPLC-MS: 577.19 $[M+H]^+$.

(2) Synthesis of Intermediate 6(2)

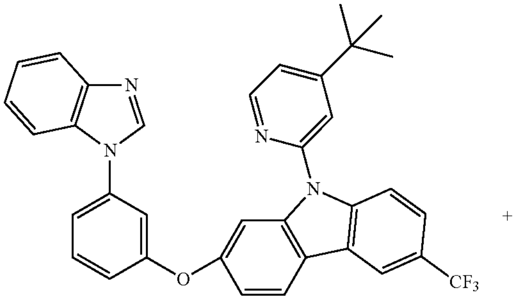

6(1)

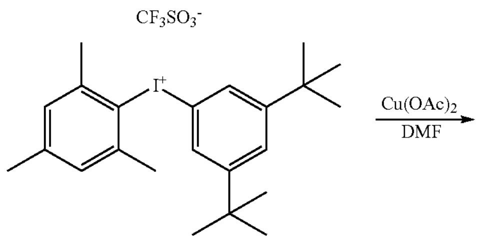

-continued

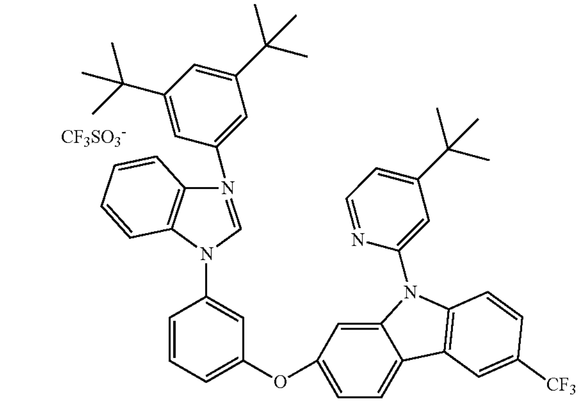

6(2)

Intermediate 6(2) was synthesized in a similar manner as in Synthesis of Intermediate 1(3) in Synthesis Example 1, except that Intermediate 6(1) was used instead of Intermediate 1(2) (yield: 63%).

HPLC-MS: 765.24 [M-OTf]$^+$.

(3) Synthesis of Compound 6

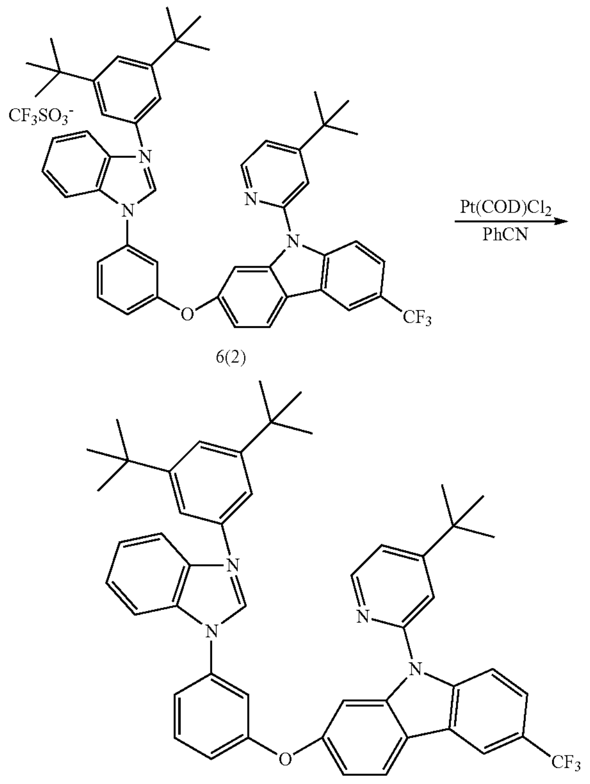

6(2)

6

Compound 6 was synthesized in a similar manner as in Synthesis of Compound 1 in Synthesis Example 1, except that Intermediate 6(2) was used instead of Intermediate 1(3) (yield: 35%).

HPLC-MS: 958.26 [M+H]$^+$.

Synthesis Example 7: Synthesis of Compound 7

(1) Synthesis of Intermediate 7(1)

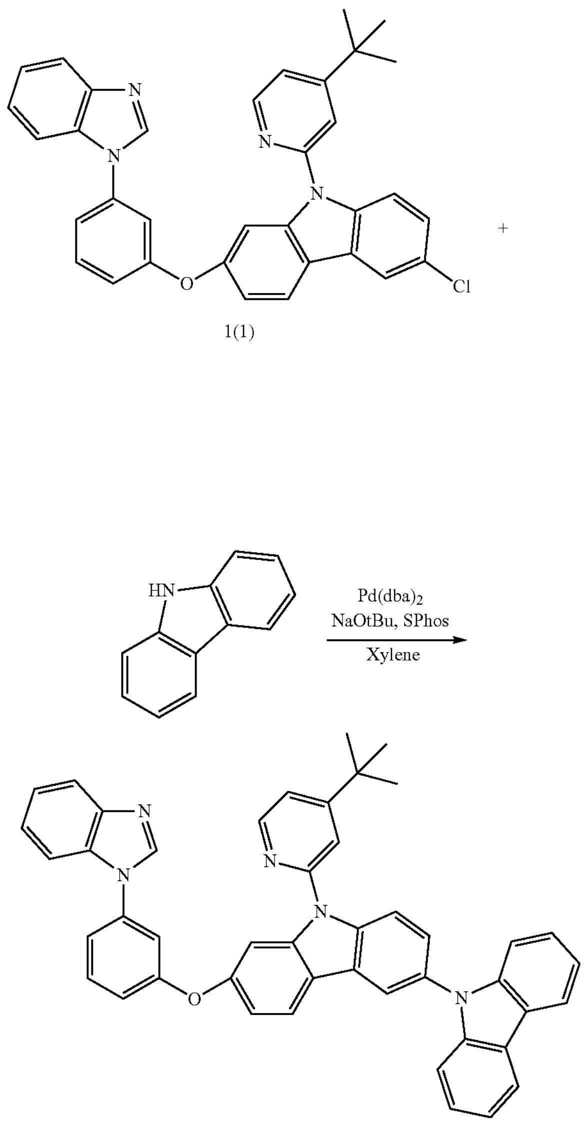

1(1)

7(1)

7.4 mmol (4.0 g) of Intermediate (1) and 0.6 mmol (1.6 g) of 9H-carbazole were dissolved in 40 mL of xylene, and 0.74 mmol (0.4 g) of bis(dibenzylideneacetone)palladium(0) (Pd(dba)$_2$), 14.8 mmol (1.4 g) of sodium tert-butoxide (NaO$^t$Bu), and 0.81 mmol (0.3 g) of picolinic acid were added to the solution, followed by reflux at a temperature of 110° C. for 12 hours. The resultant was cooled to room temperature, and an organic layer was extracted three times therefrom using a mixture of ethyl acetate and water, followed by drying the organic layer with magnesium sulfate. Under a reduced pressure, a solvent was removed therefrom to obtain a crude product. Then, using silica gel column chromatography (eluent: ethyl acetate and hexanes), Intermediate 7(1) was obtained (yield: 46%).

HPLC-MS: 674.28 [M+H]$^+$.

(2) Synthesis of Intermediate 7(2)
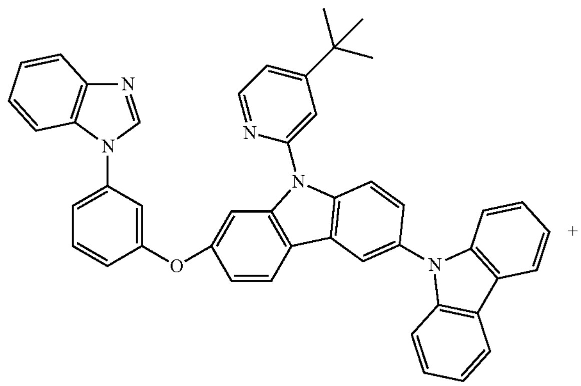
7(1)
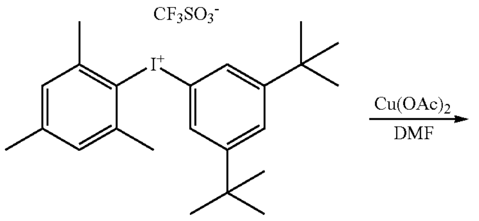
-continued
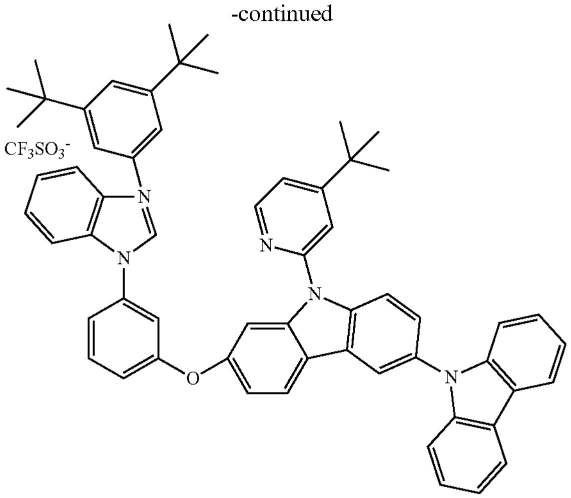
7(2)
Intermediate 7(2) was synthesized in a similar manner as in Synthesis of Intermediate 1(3) in Synthesis Example 1, except that Intermediate 7(1) was used instead of Intermediate 1(2) (yield: 86%).
HPLC-MS: 862.43 [M-OTf]$^+$.
(3) Synthesis of Compound 7
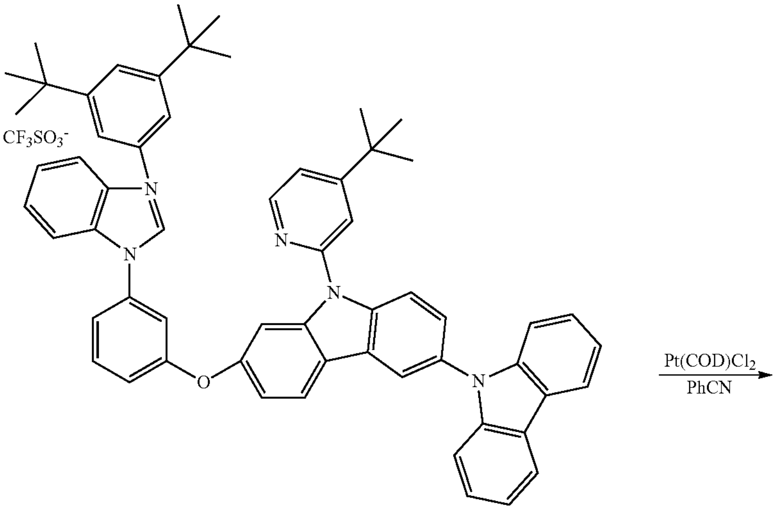
7(2)

-continued

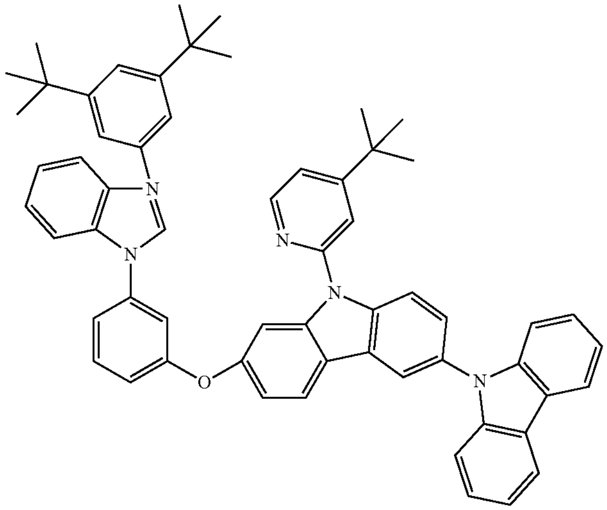

7

Compound 7 was synthesized in a similar manner as in Synthesis of Compound 1 in Synthesis Example 1, except that Intermediate 7(2) was used instead of Intermediate 1(3) (yield: 42%).

HPLC-MS: 1055.38 [M+H]+.

Synthesis Example 8: Synthesis of Compound 8

(1) Synthesis of Intermediate 8(1)

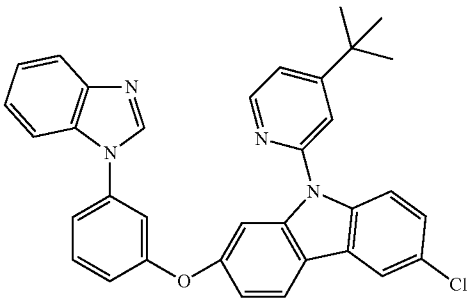

1(1)

+

-continued

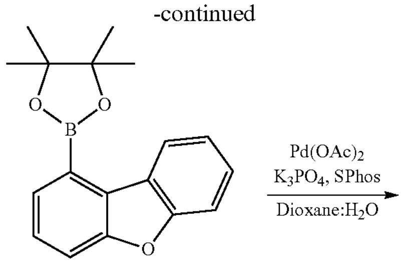

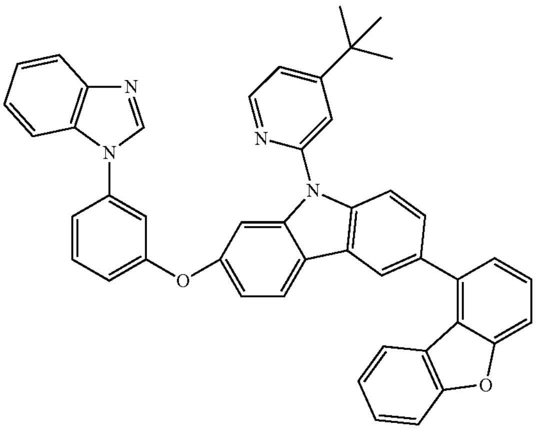

8(1)

Intermediate 8(1) was synthesized in a similar manner as in Synthesis of Intermediate 1(2) in Synthesis Example 1, except that 2-(dibenzo[b, d]furan-1-yl)-4,4,5,5-tetramethyl-1,3,2-dioxaborolane was used instead of [1,1'-biphenyl]-3-yl boronic acid (yield: 80%).

HPLC-MS: 675.26 [M+H]+.

(2) Synthesis of Intermediate 8(2)

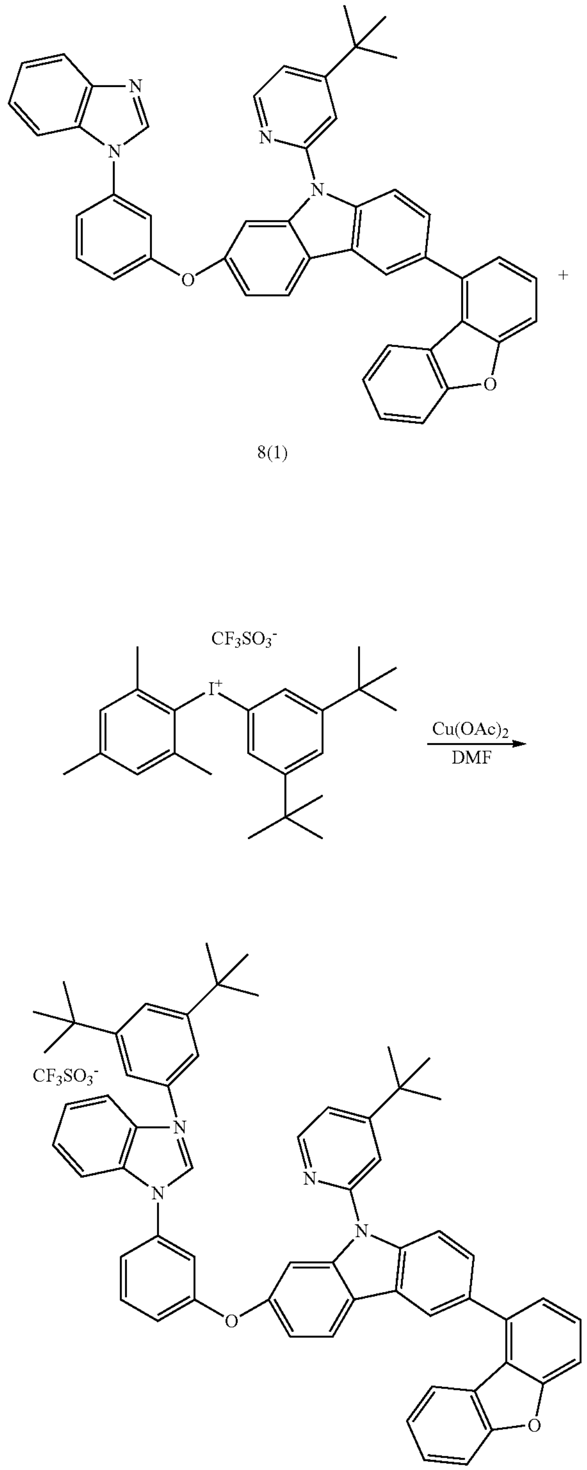

8(1)

8(2)

Intermediate 8(2) was synthesized in a similar manner as in Synthesis of Intermediate 1(3) in Synthesis Example 1, except that Intermediate 8(1) was used instead of Intermediate 1(2) (yield: 73%).

HPLC-MS: 863.41 [M-OTf]$^+$.

(3) Synthesis of Compound 8

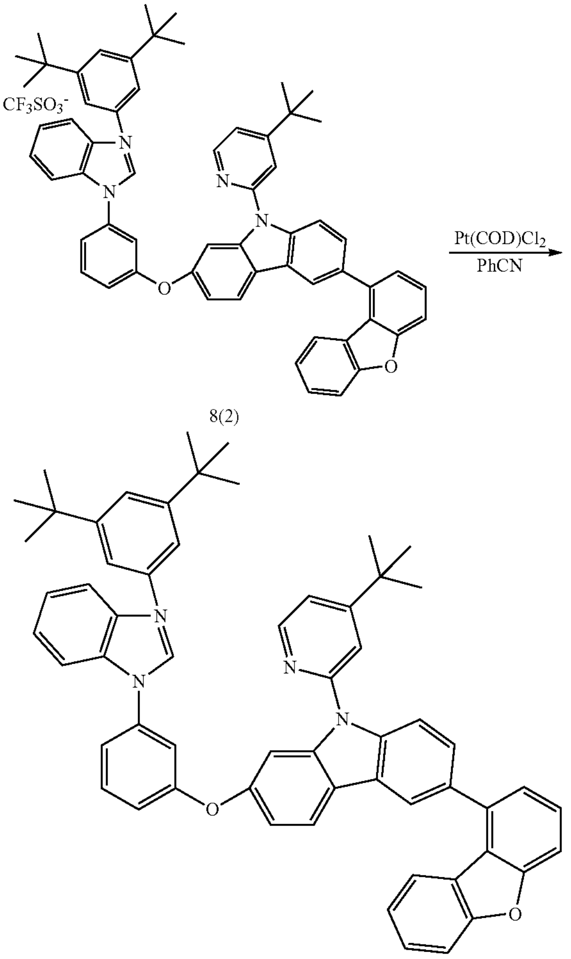

8(2)

8

Compound 8 was synthesized in a similar manner as in Synthesis of Compound 1 in Synthesis Example 1, except that Intermediate 8(2) was used instead of Intermediate 1(3) (yield: 49%).

HPLC-MS: 1056.35 [M+H]$^+$.

Synthesis Example 9: Synthesis of Compound 9

(1) Synthesis of Intermediate 9(1)

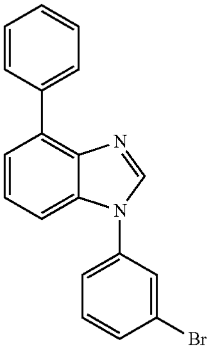

+

-continued

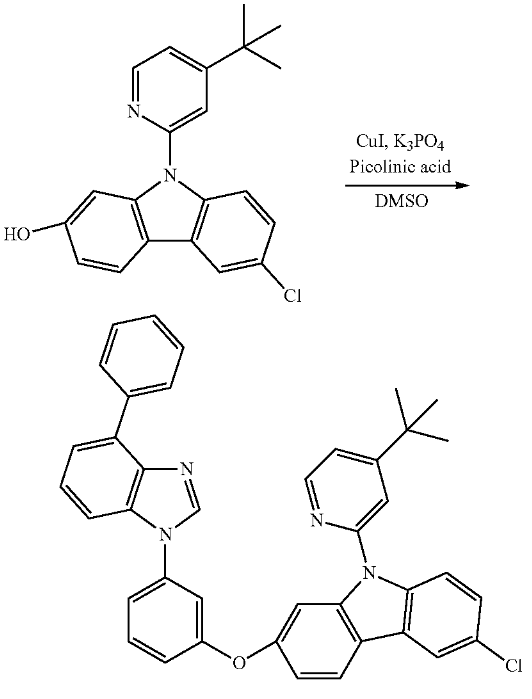

9(1)

Intermediate 9(1) was synthesized in a similar manner as in Synthesis of Intermediate 1(1) in Synthesis Example 1, except that 1-(3-bromophenyl)-4-phenyl-1H-benzo[d]imidazole was used instead of 1-(3-bromophenyl)-1H-benzo[d]imidazole (yield: 68%).

HPLC-MS: 619.21 $[M+H]^+$.

(2) Synthesis of Intermediate 9(2)

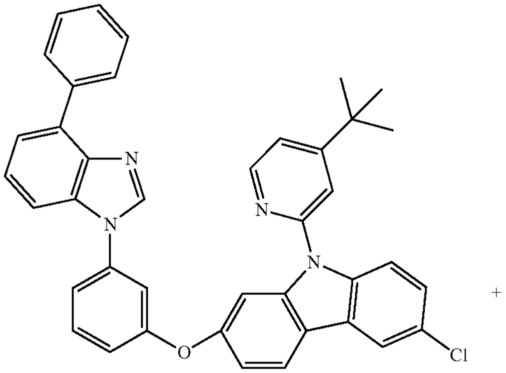

9(1)

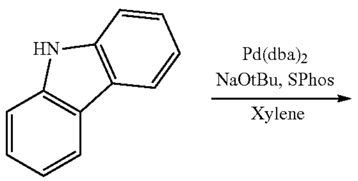

-continued

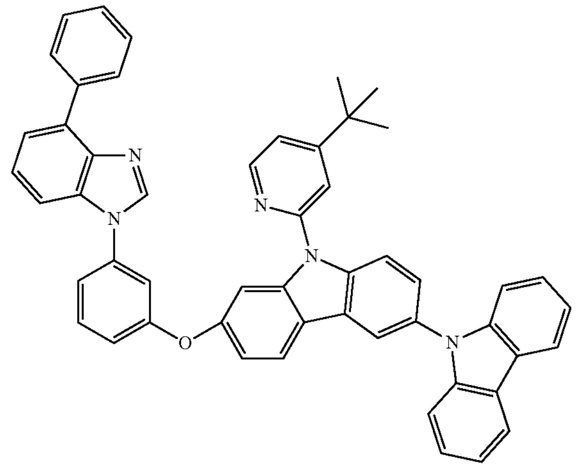

9(2)

Intermediate 9(2) was synthesized in a similar manner as in Synthesis of Intermediate 7(1) in Synthesis Example 1, except that Intermediate 9(1) was used instead of Intermediate 1(1) (yield: 44%).

HPLC-MS: 750.29 $[M+H]^+$.

(3) Synthesis of Intermediate 9(3)

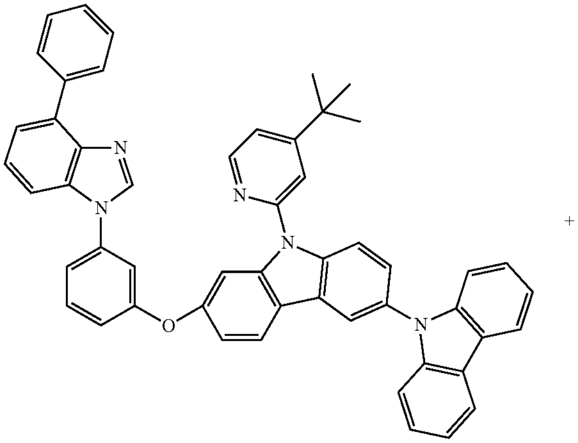

9(2)

$CF_3SO_3^-$

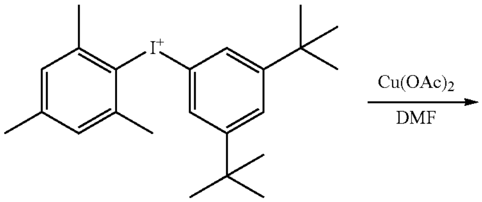

-continued
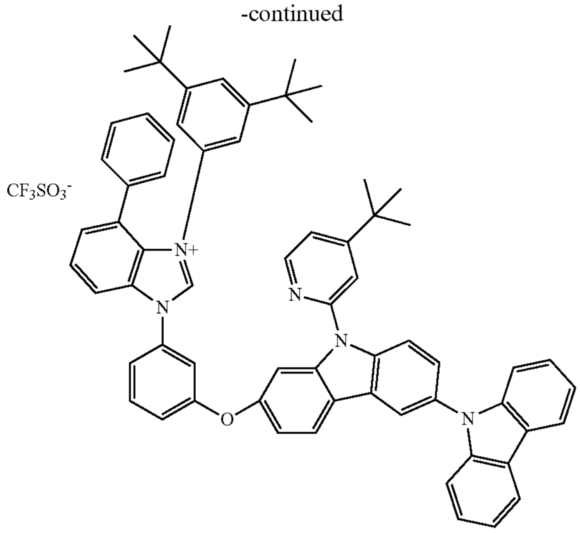
9(3)
Intermediate 9(3) was synthesized in a similar manner as in Synthesis of Intermediate 1(3) in Synthesis Example 1, except that Intermediate 9(2) was used instead of Intermediate 1(2) (yield: 71%).
HPLC-MS: 938.42 [M-OTf]$^+$.
(4) Synthesis of Compound 9
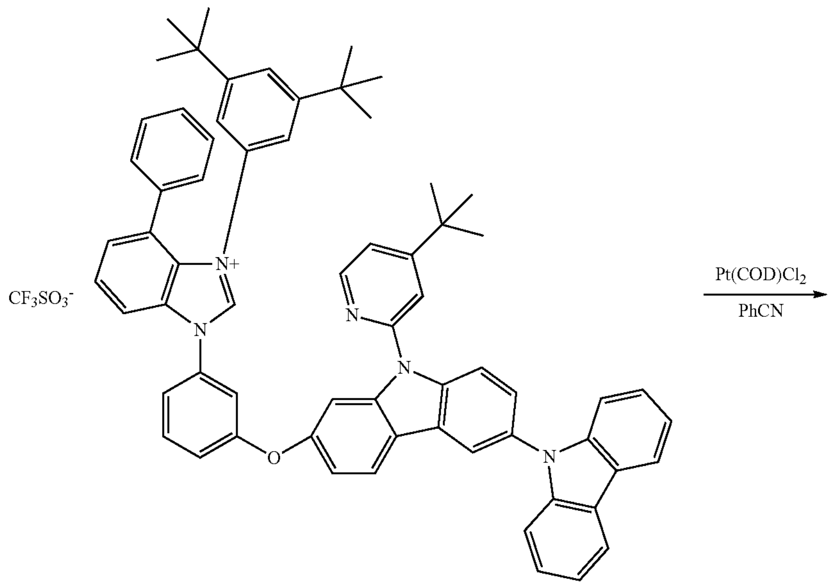
9(3)

-continued

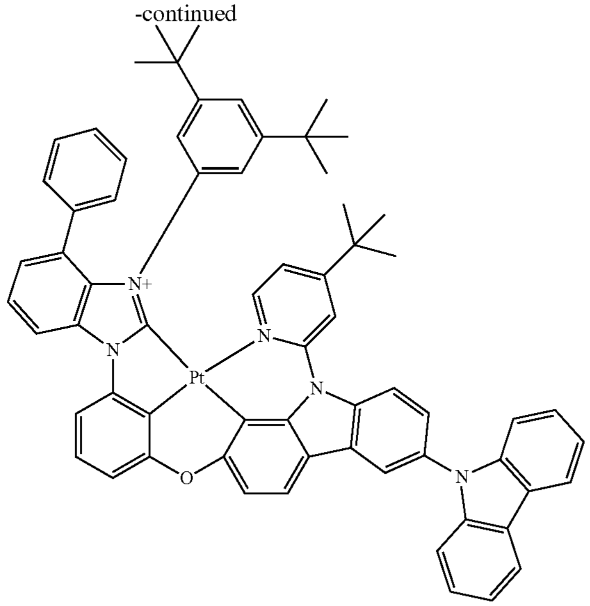

9

Compound 9 was synthesized in a similar manner as in Synthesis of Compound 1 in Synthesis Example 1, except that Intermediate 9(3) was used instead of Intermediate 1(3) (yield: 36%).

HPLC-MS: 1131.34 $[M+H]^+$.

Synthesis Example 10: Synthesis of Compound 10

(1) Synthesis of Intermediate 10(1)

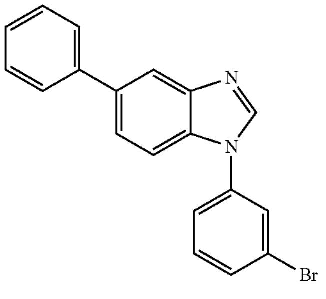

+

-continued

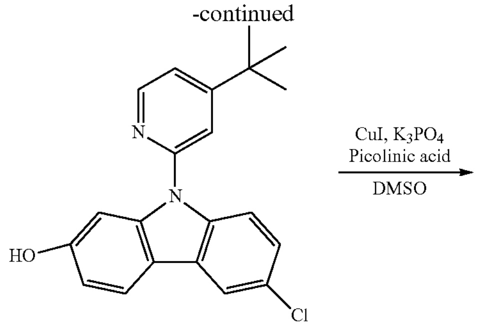

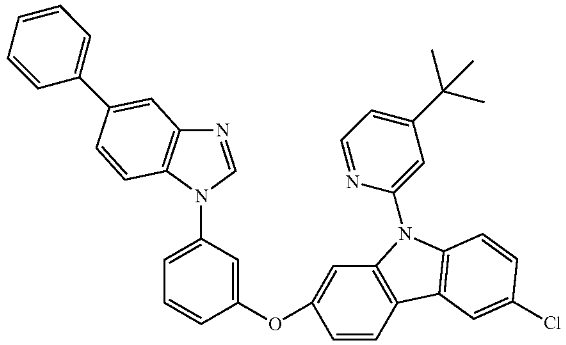

10(1)

Intermediate 10(1) was synthesized in a similar manner as in Synthesis of Intermediate 1(1) in Synthesis Example 1, except that 1-(3-bromophenyl)-5-phenyl-1H-benzo[d]imidazole was used instead of 1-(3-bromophenyl)-1H-benzo[d]imidazole (yield: 60%).

HPLC-MS: 619.22 $[M+H]^+$.

(2) Synthesis of Intermediate 10(2)

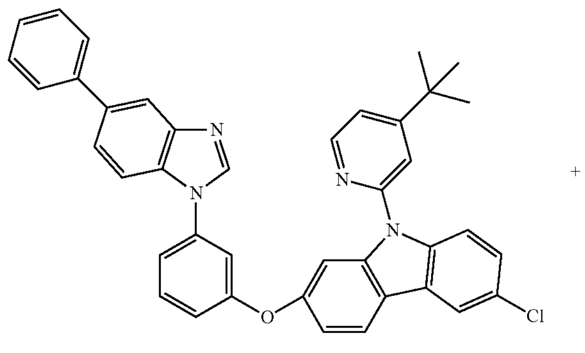

10(1)

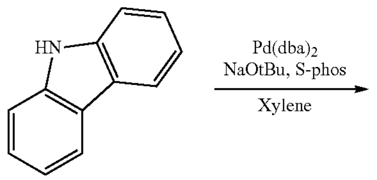

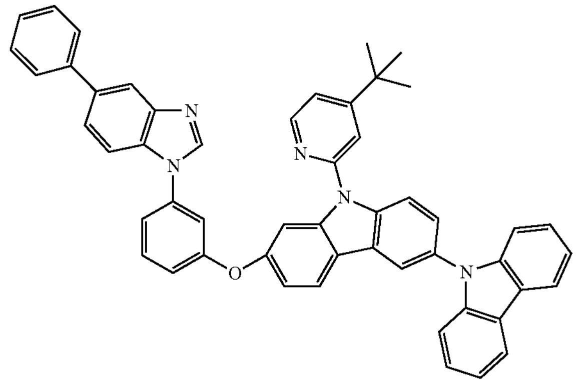

10(2)

Intermediate 10(2) was synthesized in a similar manner as in Synthesis of Intermediate 7(1) in Synthesis Example 7, except that Intermediate 10(1) was used instead of Intermediate 1(1) (yield: 47%).

HPLC-MS: 750.28 $[M+H]^+$.

(3) Synthesis of Intermediate 10(3)

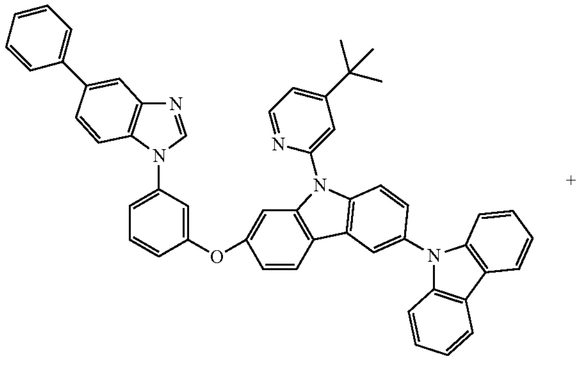

10(2)

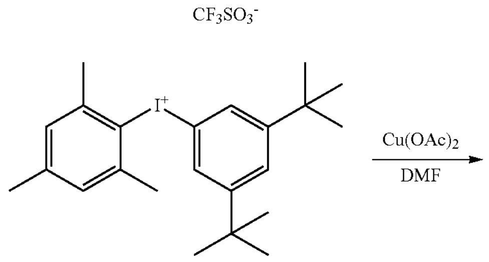

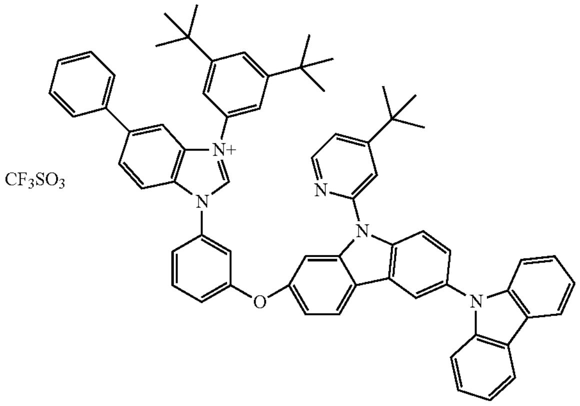

10(3)

Intermediate 10(3) was synthesized in a similar manner as in Synthesis of Intermediate 1(3) in Synthesis Example 1, except that Intermediate 10(2) was used instead of Intermediate 1(2) (yield: 84%).

HPLC-MS: 938.41 $[M-OTf]^+$.

(4) Synthesis of Compound 10
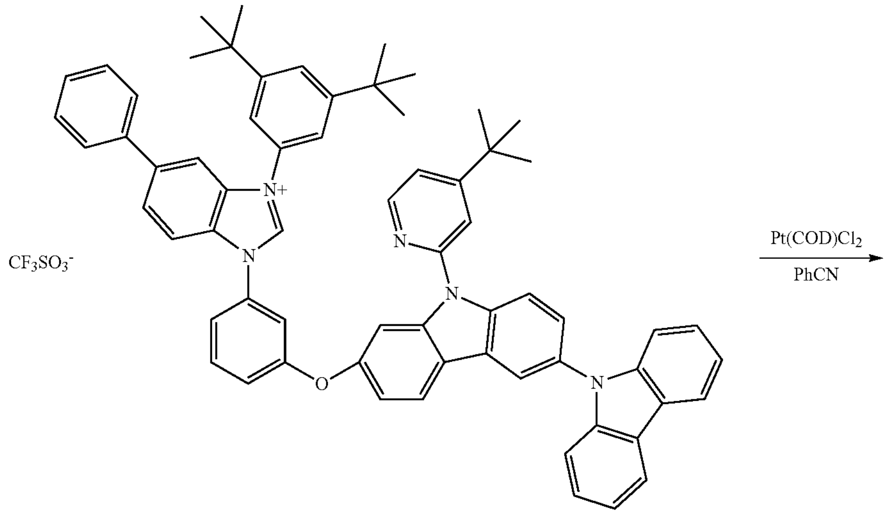
10(3)
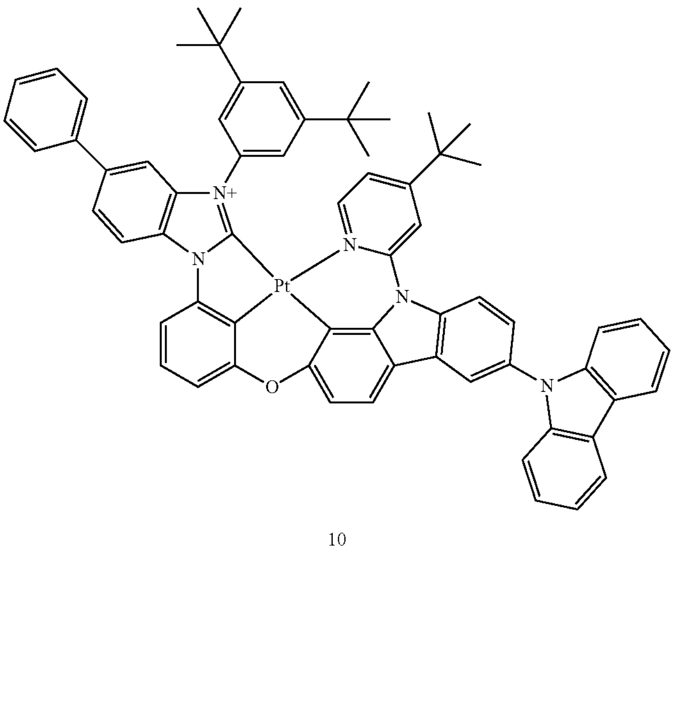
10

Compound 10 was synthesized in a similar manner as in Synthesis of Compound 1 in Synthesis Example 1, except that Intermediate 10(3) was used instead of Intermediate 1(3) (yield: 34%).

HPLC-MS: 1131.36 $[M+H]^+$.

Synthesis Example 11: Synthesis of Compound 11

(1) Synthesis of Intermediate 11(1)

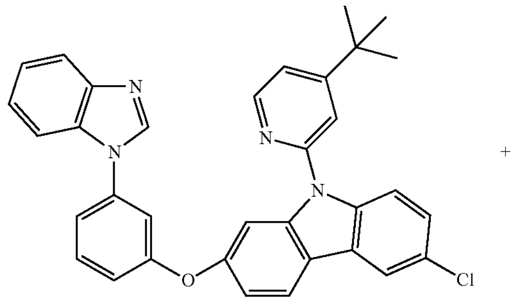

1(1)

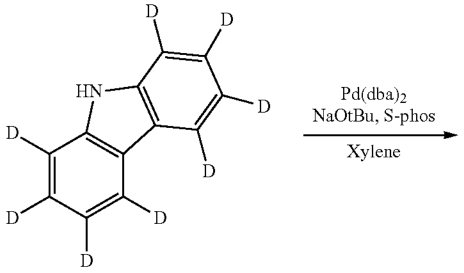

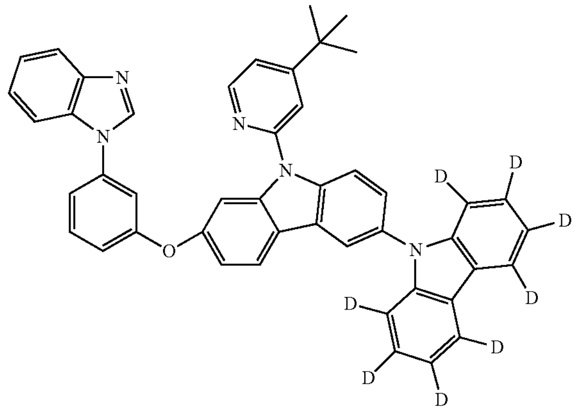

11(1)

Intermediate 11(1) was synthesized in a similar manner as in Synthesis of Intermediate 7(1) in Synthesis Example 7, except that 9H-carbazole-d8 was used instead of 9H-carbazole (yield: 46%).

HPLC-MS: 681.32 $[M+H]^+$.

(2) Synthesis of Intermediate 11(2)

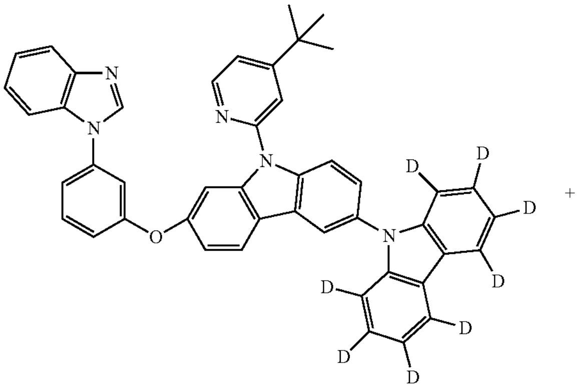

11(1)

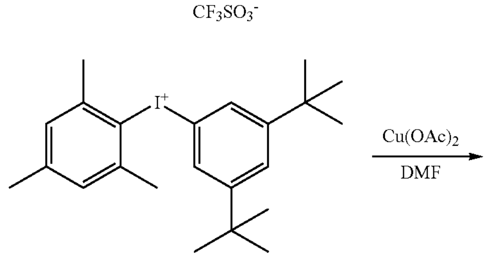

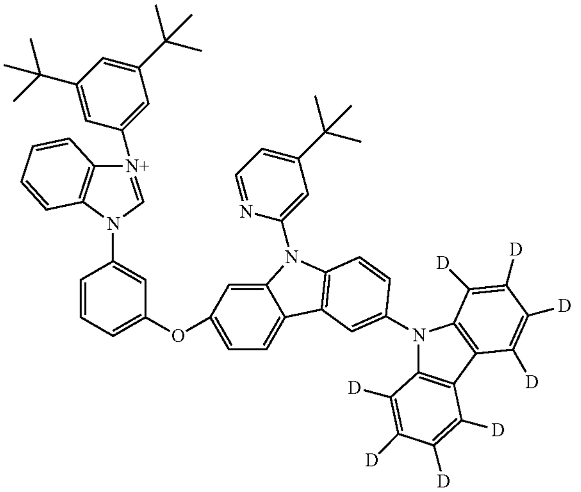

11(2)

Intermediate 11(2) was synthesized in a similar manner as in Synthesis of Intermediate 1(3) in Synthesis Example 1, except that Intermediate 11(1) was used instead of Intermediate 1(2) (yield: 82%).

HPLC-MS: 869.50 $[M-OTf]^+$.

(3) Synthesis of Compound 11
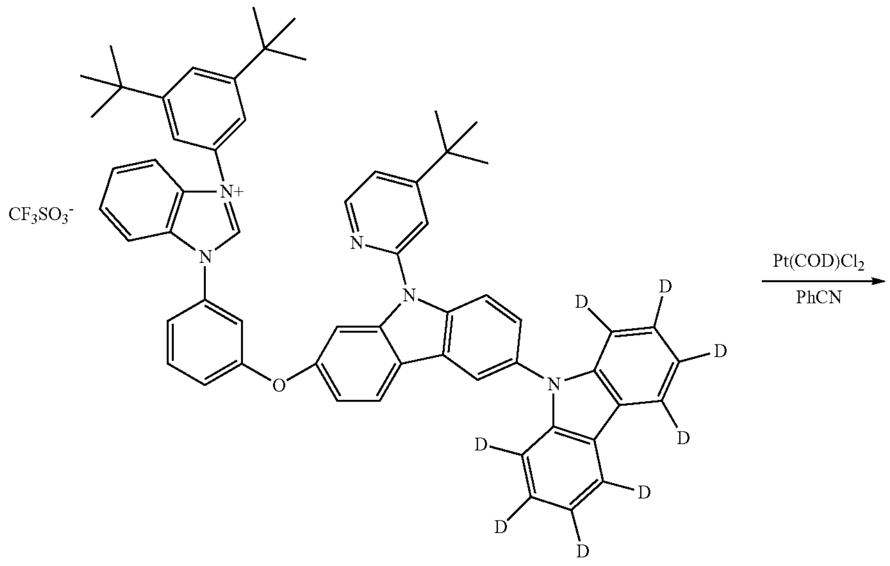
11(2)
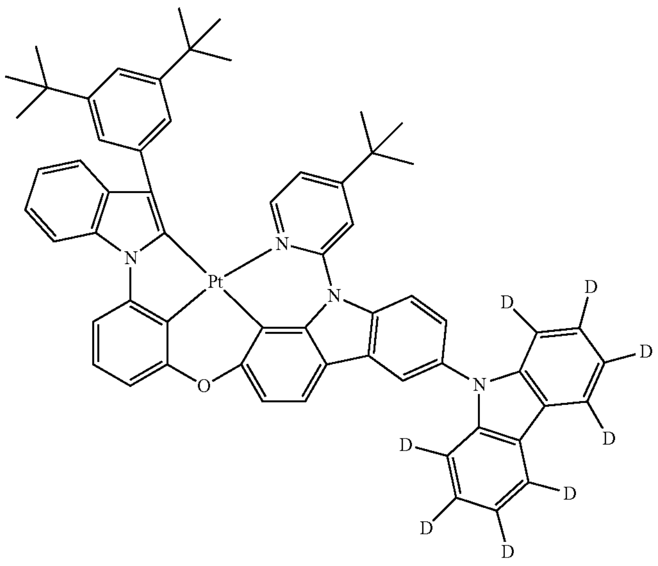
11

Compound 11 was synthesized in a similar manner as in Synthesis of Compound 1 in Synthesis Example 1, except that Intermediate 11(3) was used instead of Intermediate 1(3) (yield: 43%).

HPLC-MS: 1061.43 $[M+H]^+$.

Synthesis Example 12: Synthesis of Compound 12

(1) Synthesis of Intermediate 12(1)

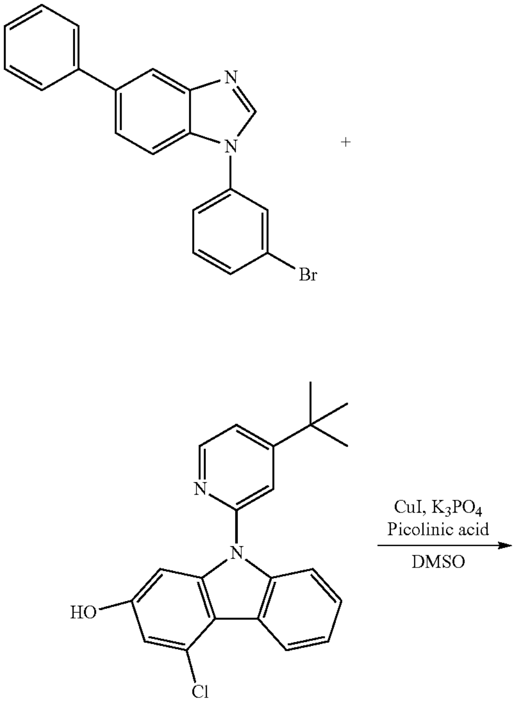

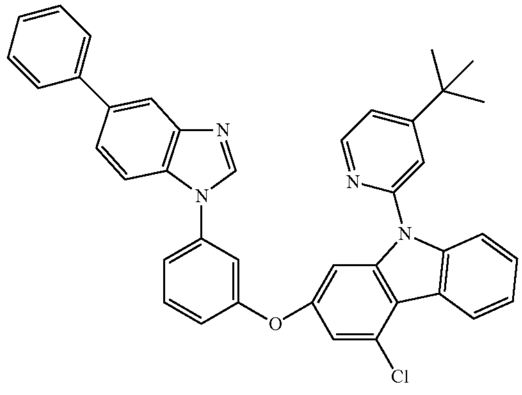

12(1)

Intermediate 12(1) was synthesized in a similar manner as in Synthesis of Intermediate (1) in Synthesis Example 1, except that 1-(3-bromophenyl)-5-phenyl-1H-benzo[d]imidazole was used instead of 1-(3-bromophenyl)-1H-benzo[d]imidazole, and 9-(4-(tert-butyl)pyridin-2-yl)-4-chloro-9H-carbazole-2-ol was used instead of 9-(4-(tert-butyl)pyridin-2-yl)-6-chloro-9H-carbazole-2-ol (yield: 51%).

HPLC-MS: 619.23 $[M+H]^+$.

(2) Synthesis of Intermediate 12(2)

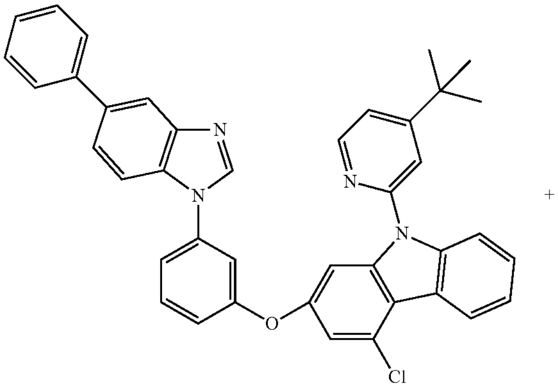

12(1)

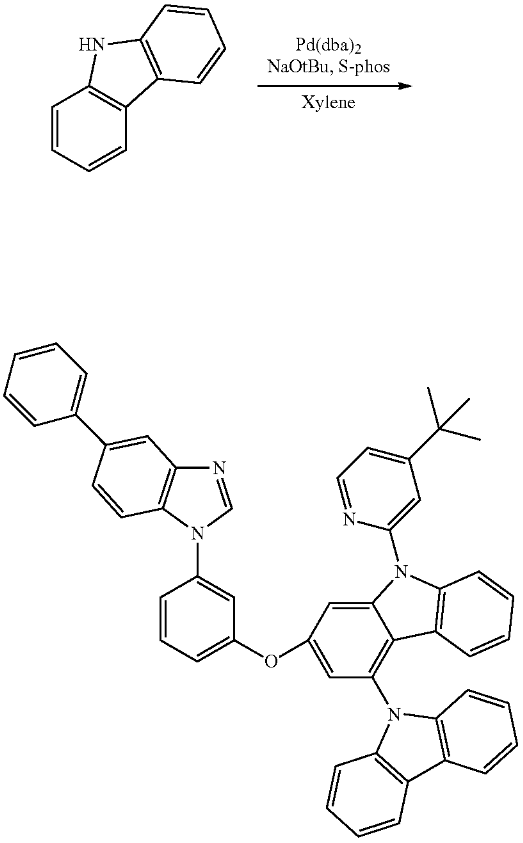

12(2)

Intermediate 12(2) was synthesized in a similar manner as in Synthesis of Intermediate 7(1) in Synthesis Example 7, except that Intermediate 12(1) was used instead of Intermediate 1(1) (yield: 66%).

HPLC-MS: 750.26 $[M+H]^+$.

(3) Synthesis of Intermediate 12(3)

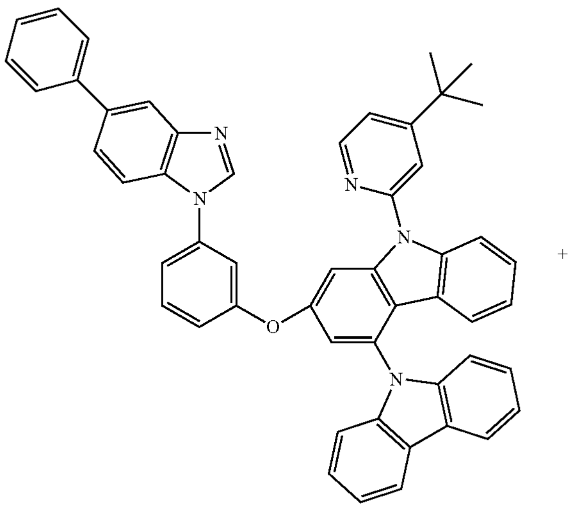

12(2)

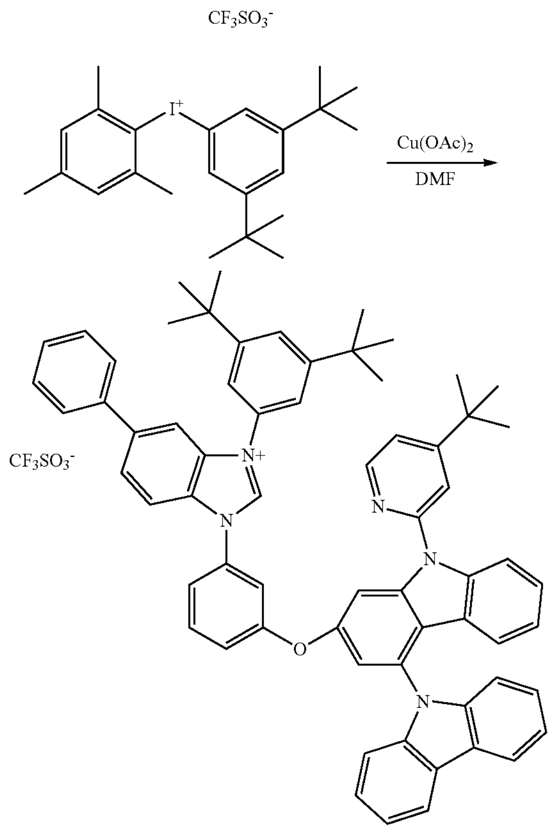

12(3)

Intermediate 12(3) was synthesized in a similar manner as in Synthesis of Intermediate 1(3) in Synthesis Example 1, except that Intermediate 12(2) was used instead of Intermediate 1(2) (yield: 89%).

HPLC-MS: 938.40 [M-OTf]$^+$.

(4) Synthesis of Compound 12

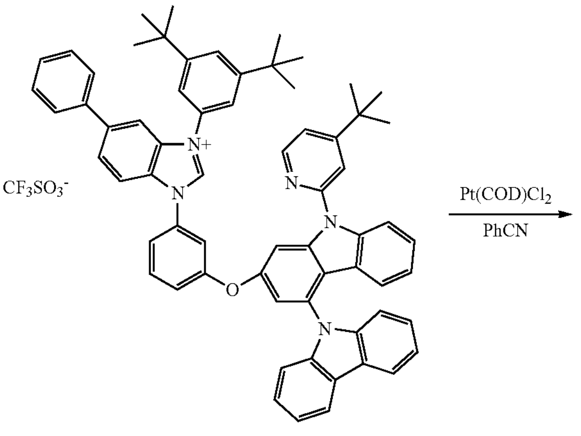

12(3)

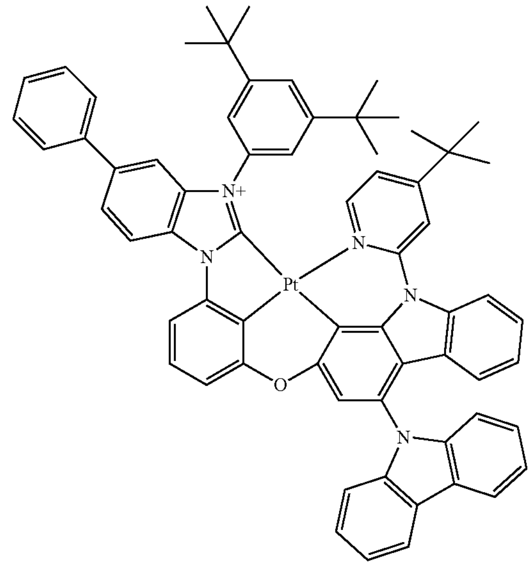

12

Compound 12 was synthesized in a similar manner as in Synthesis of Compound 1 in Synthesis Example 1, except that Intermediate 12(3) was used instead of Intermediate 1(3) (yield: 36%).

HPLC-MS: 1131.43 [M+H]$^+$.

Figure 2:
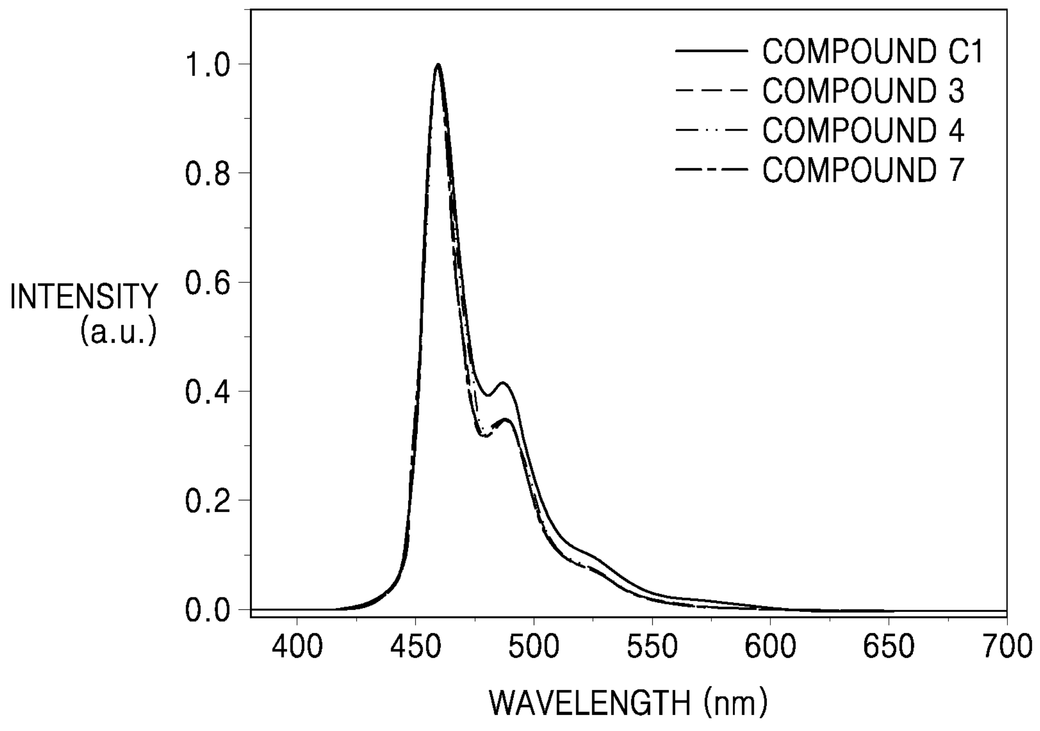
FIG. 2 is a graph of wavelength (nanometers (nm)) versus intensity (arbitrary units, a.u.) showing photoluminescence (PL) spectra of organometallic compounds according to one or more exemplary embodiments and Comparative Compounds as described herein.

Evaluation Example 1: Evaluation of Photoluminescence (PL) Optical Characteristics Compound 1 was diluted in toluene at a concentration of 10 millimolar (mM), and a PL spectrum of Compound 1 was measured at room temperature by using an ISC PC1 spectrofluorometer, in which a xenon lamp was mounted. The evaluation was performed on Compounds 2 to 12 and Comparative Compound C1. The PL spectra of the compounds are shown in FIG. 2. The maximum emission wavelength ($PL_{max}$, nm), full width at half maximum (FWHM, nm), and second peak intensity of each compound were measured from the PL spectra thereof. The results thereof are shown in Table 2.

TABLE 2
| Compound No. | $PL_{max}$ (nm) | FWHM (nm) | Second peak intensity |
|---|---|---|---|
| 1 | 460 | 19 | 0.357 |
| 2 | 458 | 20 | 0.363 |
| 3 | 459 | 18 | 0.352 |
| 4 | 460 | 18 | 0.346 |
| 5 | 460 | 18 | 0.351 |
| 6 | 458 | 19 | 0.376 |
| 7 | 459 | 18 | 0.355 |
| 8 | 459 | 19 | 0.335 |
| 9 | 458 | 16 | 0.310 |
| 10 | 461 | 19 | 0.384 |
| 11 | 459 | 18 | 0.354 |
| 12 | 460 | 19 | 0.412 |
| C1 | 460 | 20 | 0.419 |
1
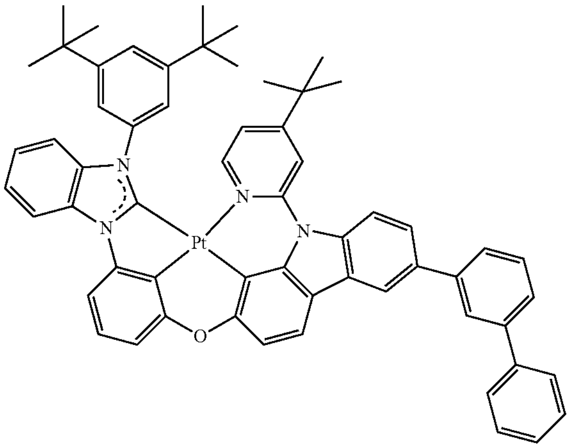
2
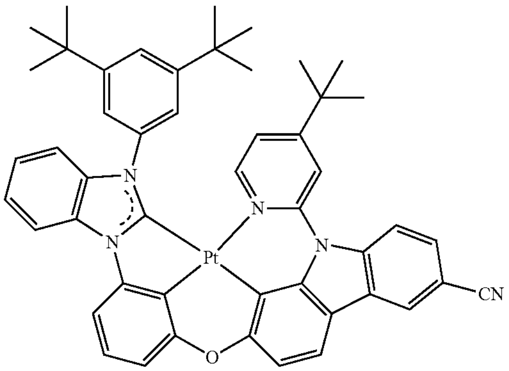
-continued
3
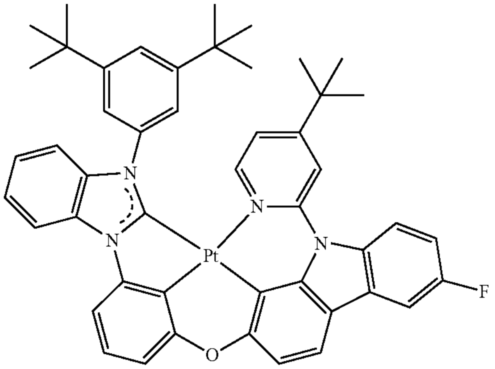
4
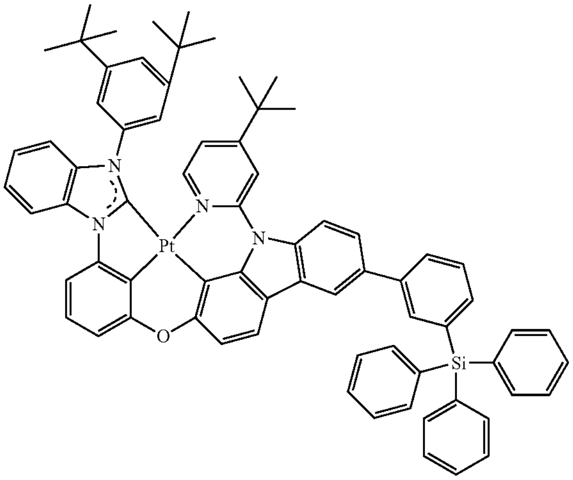
5
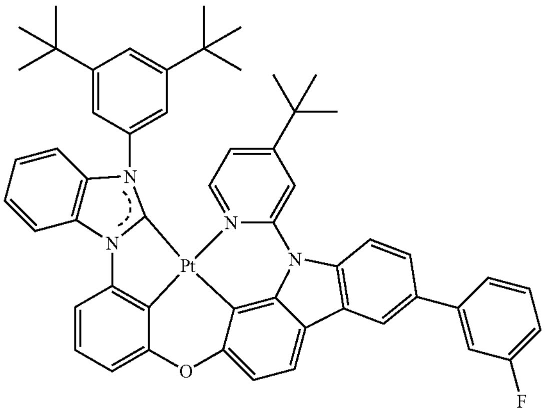

-continued
6
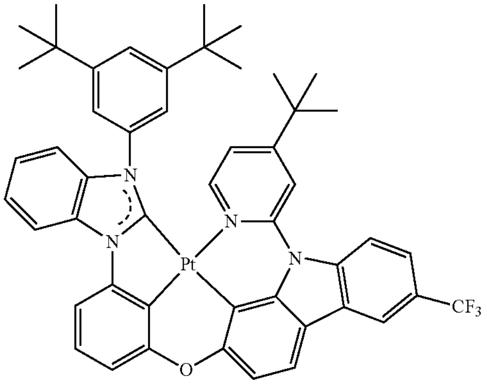
7
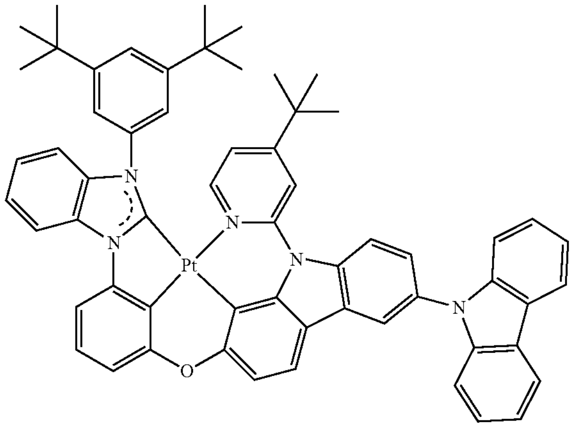
8
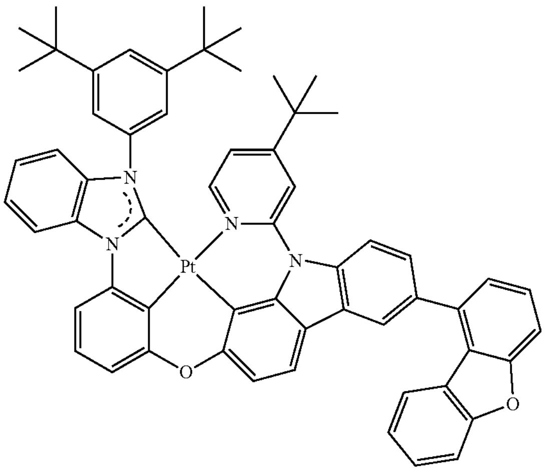
-continued
9
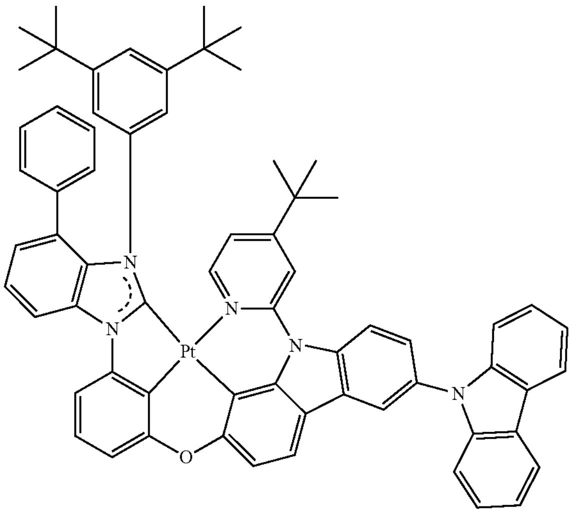
10
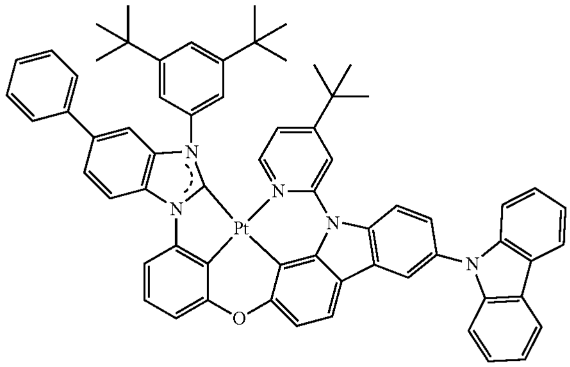
11
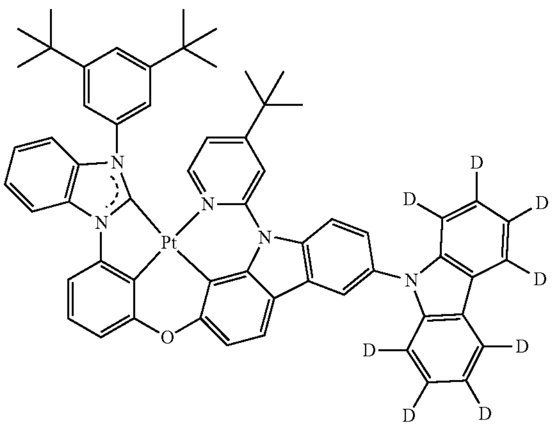

-continued

12

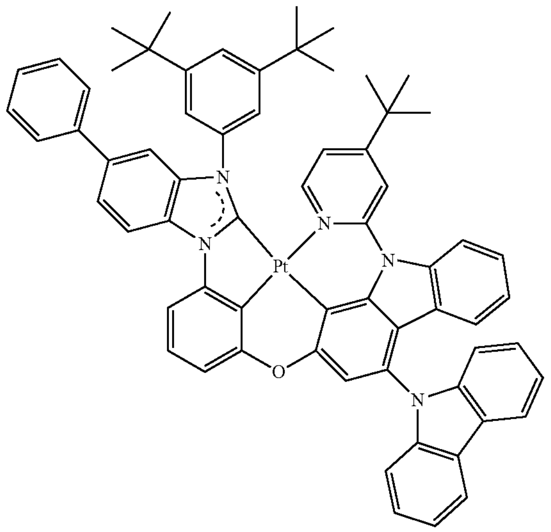

C1

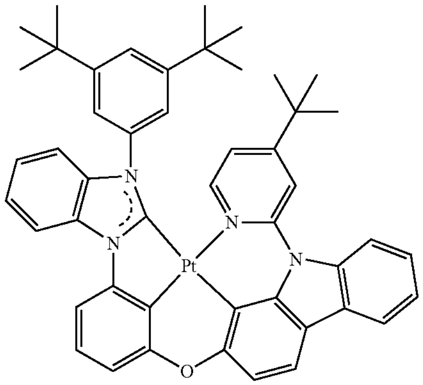

Referring to the results shown in FIG. 2 and Table 2, Compounds 1 to 12 according to one or more embodiments were each found to have a PL spectrum having a FWHM narrower than or equal to Comparative Compound C1 and a small second peak intensity.

Evaluation Example 2: Evaluation of PL Quantum Yield (PLQY)

A $CH_2Cl_2$ solution of poly(methyl methacrylate) (PMMA), 5 percent by weight (wt %) of CBP, and Compound 1 were mixed together. The resultant mixture obtained therefrom was coated on a quartz substrate by using a spin coater, heat-treated in an oven at a temperature of 80° C., and cooled to room temperature, thereby obtaining a film.

Luminescence quantum yields in the film was evaluated by using Hamamatsu Photonics absolute PL quantum yield measurement system employing PLQY measurement software (Hamamatsu Photonics, Ltd., Shizuoka, Japan), in which a xenon light source, a monochromator, a photonic multichannel analyzer, and an integrating sphere are mounted. Thus, PLQY Compound 1 was evaluated. This process was repeatedly performed on Compounds 2 to 12 and Comparative Compound C1. The results thereof are shown in Table 3.

TABLE 3

| Compound No. | PLQY in PMMA |
|---|---|
| 1 | 0.779 |
| 2 | 0.722 |
| 3 | 0.817 |
| 4 | 0.775 |
| 5 | 0.775 |
| 6 | 0.819 |
| 7 | 0.797 |
| 8 | 0.762 |
| 9 | 0.790 |
| 10 | 0.804 |
| 11 | 0.797 |
| 12 | 0.859 |
| C1 | 0.712 |

Referring to the results of Table 3, Films of Compounds 1 to 12 according to one or more embodiments were each found to having a high PLQY and improved luminescence characteristics, as compared with a film of Comparative Compound C1.

Example 1

A glass substrate having an indium tin oxide (ITO) electrode (a first electrode, an anode) deposited thereon at a thickness of 500 Å was washed with DI water in the presence of ultrasound waves. Once the washing with DI water was complete, ultrasound wave washing was performed on the substrate by using isopropyl alcohol, acetone, and methanol in this stated order. Subsequently, the substrate was dried, transferred to a plasma washer, washed for 5 minutes using oxygen plasma, and mounted in a vacuum deposition device.

Compound HT3 was vacuum-deposited on the ITO electrode of the glass substrate to form a first hole injection layer having a thickness of 3,500 Å, Compound HT-D1 was vacuum-deposited on the first hole injection layer to form a second hole injection layer having a thickness of 300 Å, and TAPC was vacuum-deposited on the second hole injection layer to form an electron blocking layer having a thickness of 100 Å, thereby forming a hole transport region.

Compound H52 as a host and Compound 1 (10 wt %) as an emitter were co-deposited on the hole transport region to form an emission layer having a thickness of 300 Å.

Compound ET3 was vacuum-deposited on the emission layer to form an electron transport layer having a thickness of 250 Å, ET-D1 (Liq) was deposited on the electron transport layer to form an electron injection layer having a thickness of 5 Å, and an Al second electrode (a cathode) was formed on the electron injection layer to have a thickness of 1,000 Å, thereby completing the manufacture of an organic light-emitting device.

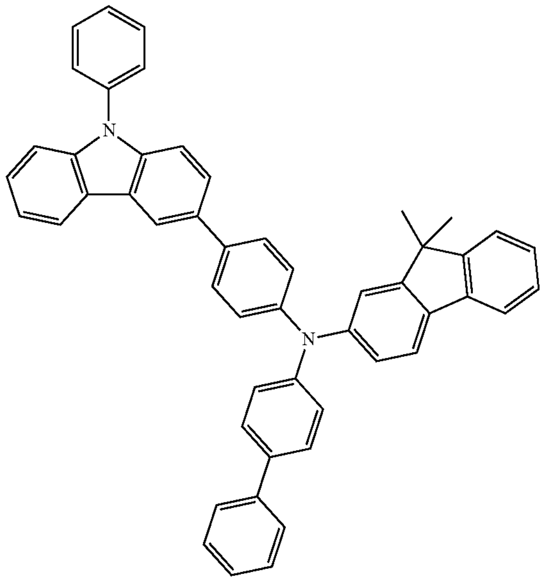

HT3

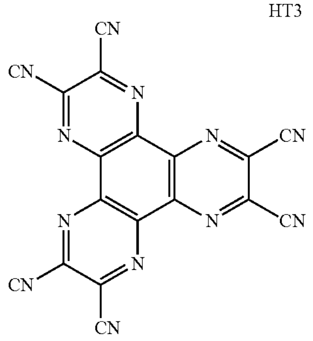

HT-D1

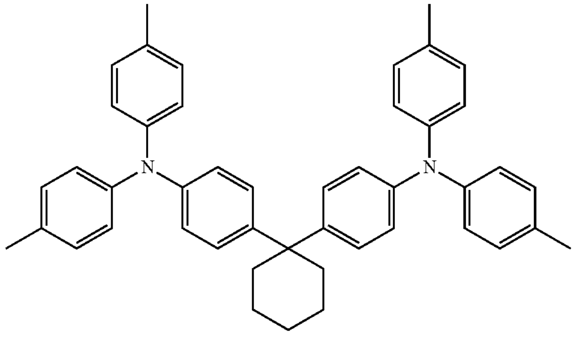

TAPC

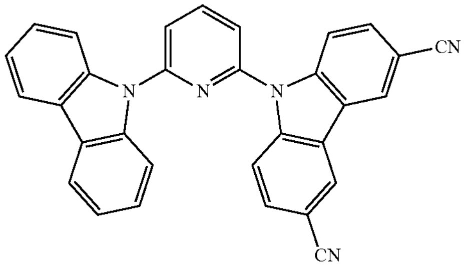

H52

-continued

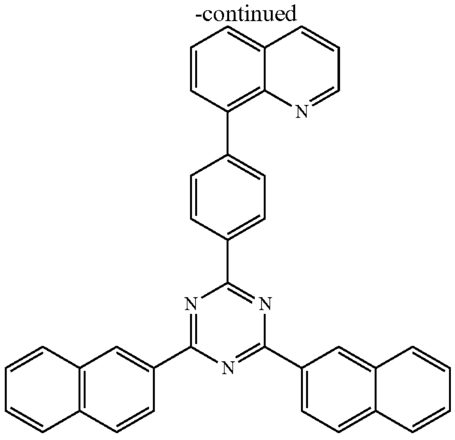

ET3

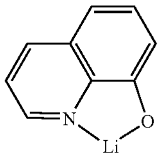

ET-D1

Examples 2 and 12 and Comparative Example 1

Organic light-emitting devices were manufactured in a similar manner as in Example 1, except that the compounds shown in Table 4 were used instead of Compound 1 as an emitter in formation of an emission layer.

Evaluation Example 3

The EL spectrum, the maximum emission wavelength of the EL spectrum ($\lambda_{max}$, nm), the driving voltage (relative value), and the external quantum efficiency (EQE, relative value) of each of the organic light-emitting devices manufactured in Examples 1 to 12 and Comparative Example 1 were evaluated. The results thereof are shown in Table 4. The driving voltage and EQE in Table 4 are shown as relative values with respect to Comparative Example 1. The driving voltage and EQE were measured as follows.

(1) Measurement of Maximum Emission Wavelength of EL Spectrum

The maximum emission wavelength of EL spectra of the manufactured organic light-emitting devices at a luminance of 1,000 candelas per square meter (cd/m$^2$) were measured by using a luminance meter (Minolta Cs-1000A).

(2) Measurement of External Quantum Efficiency

A Keithley 2400 current voltmeter and a luminance meter (Minolta Cs-1000A) were used in evaluation of the external quantum efficiency at a luminance of 1,000 cd/m$^2$.

TABLE 4

| | Emission layer dopant | $\lambda_{max}$ (nm) | Driving voltage (relative value) | EQE (relative value) |
|---|---|---|---|---|
| Example 1 | 1 | 464 | 93 | 114 |
| Example 2 | 2 | 460 | 90 | 104 |
| Example 3 | 3 | 462 | 93 | 123 |
| Example 4 | 4 | 462 | 100 | 110 |
| Example 5 | 5 | 463 | 93 | 119 |

TABLE 4-continued

| | Emission layer dopant | $\lambda_{max}$ (nm) | Driving voltage (relative value) | EQE (relative value) |
|---|---|---|---|---|
| Example 6 | 6 | 461 | 92 | 116 |
| Example 7 | 7 | 462 | 88 | 116 |
| Example 8 | 8 | 462 | 100 | 106 |
| Example 9 | 9 | 460 | 89 | 125 |
| Example 10 | 10 | 464 | 85 | 132 |
| Example 11 | 11 | 462 | 86 | 123 |
| Example 12 | 12 | 462 | 83 | 129 |
| Comparative Example 1 | C1 | 462 | 100 | 100 |

Referring to the results of Table 4, the organic light-emitting devices of Examples 1 to 3 were each found to have driving voltage and EQE that are equal to or better than those of the organic light-emitting device of Comparative Example 1.

Evaluation Example 4: Evaluation of EL Spectrum and Second Peak

Figure 3:
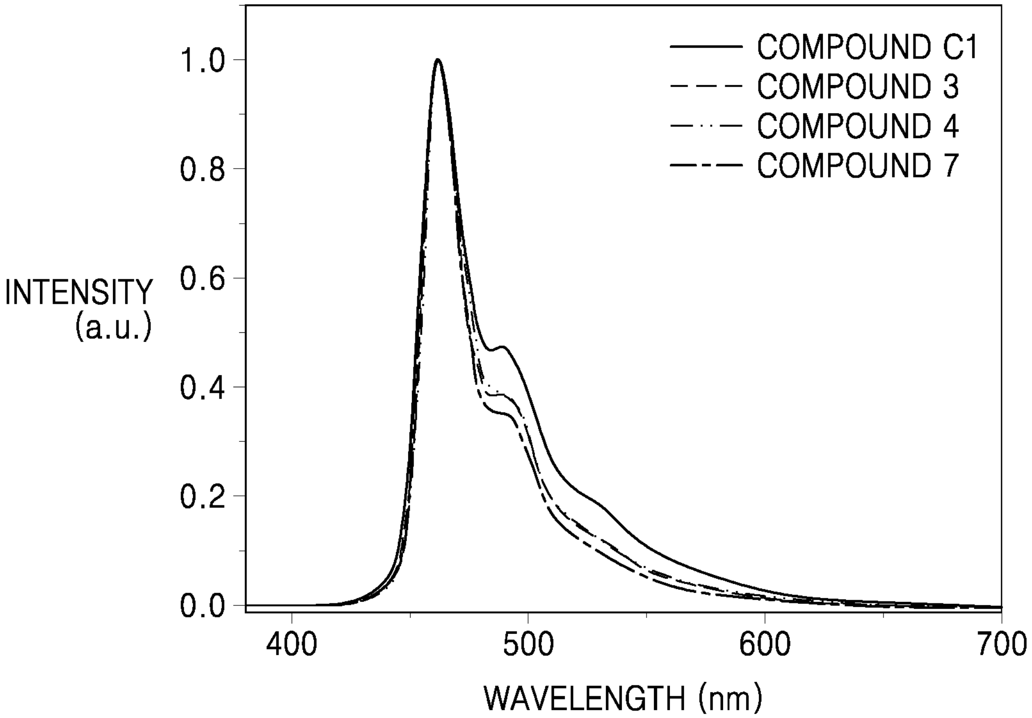
FIG. 3 is a graph of wavelength (nm) versus intensity (a.u.) showing electroluminescence (EL) spectra of organometallic compounds of Examples 3, 4 and 7 and Comparative Example 1.

The EL spectra of the organic light-emitting devices of Examples 3, 4, and 7 and Comparative Example 1 are shown in FIG. 3.

As shown in FIG. 3, the EL spectra of the organic light-emitting devices of Examples 3, 4 and 7 were each found to have smaller second peak intensity, as compared with the EL spectrum of the organic light-emitting device of Comparative Example 1.

Example 13

An organic light-emitting device was manufactured in a similar manner as in Example 1, except that 10 wt % of Compound 3 was used as a sensitizer instead of 1.5 wt % of FD17 as an emitter in formation of the emission layer.

Example 14

An organic light-emitting device was manufactured in a similar manner as in Example 1, except that 10 wt % of Compound 4 was used as a sensitizer instead of 1.5 wt % of FD17 as an emitter in formation of the emission layer.

Example 15

An organic light-emitting device was manufactured in a similar manner as in Example 1, except that 10 wt % of Compound 7 was used as a sensitizer instead of 1.5 wt % of FD17 as an emitter in formation of the emission layer.

Example 16

An organic light-emitting device was manufactured in a similar manner as in Example 1, except that 10 wt % of Compound 8 was used as a sensitizer instead of 1.5 wt % of FD17 as an emitter in formation of the emission layer.

Comparative Example 16

An organic light-emitting device was manufactured in a similar manner as in Example 1, except that FD17 was used as an emitter in formation of the emission layer.

TABLE 5

| | Dopant compound | Driving voltage (relative value) | EQE (relative value) | Lifespan ($T_{95}$) (relative value) | $\lambda_{max}$ (nm) |
|---|---|---|---|---|---|
| Example 13 | Compound 3 + FD17 | 78 | 172 | 963 | 462 |
| Example 14 | Compound 4 + FD17 | 94 | 174 | 1444 | 462 |
| Example 15 | Compound 7 + FD17 | 80 | 180 | 1000 | 462 |
| Example 16 | Compound 8 + FD17 | 91 | 161 | 852 | 462 |
| Comparative Example 2 | FD17 | 100 | 100 | 100 | 462 |

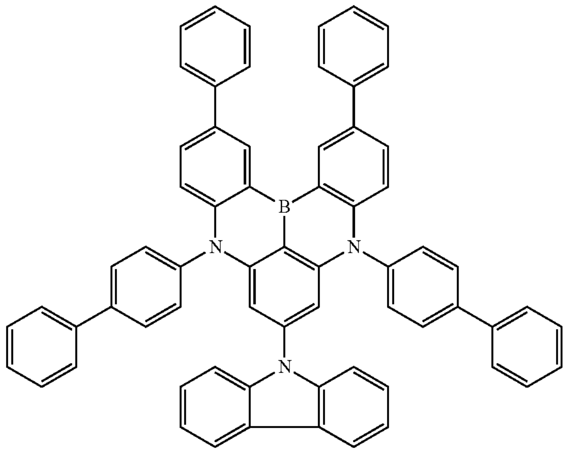

FD17

Referring to the results of Table 5, the organic light-emitting devices of Examples 13 to 16 using the organometallic compound according to one or more embodiments as a sensitizer in the emission layer were each found to have improved driving voltage, conversion efficiency, and lifespan, as compared with the organic light-emitting device of Comparative Example 2 not using a sensitizer.

As apparent from the foregoing description, the organometallic compound represented by Formula 1 was found to show an emission spectrum of which the second peak intensity is small, and thus, an organic light-emitting device including the organometallic compound may realize deep blue color due to the improved colorimetric purity.

It should be understood that the exemplary embodiments described herein should be considered in a descriptive sense and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. An organic light-emitting device, comprising:

a first electrode;

a second electrode; and an organic layer located between the first electrode and the second electrode, wherein the organic layer comprises an emission layer, and wherein the emission layer further comprises at least one organometallic compound represented by Formula 1, and at least one fluorescent dopant represented by Formula 503-1 or Formula 503-2:

Formula 1

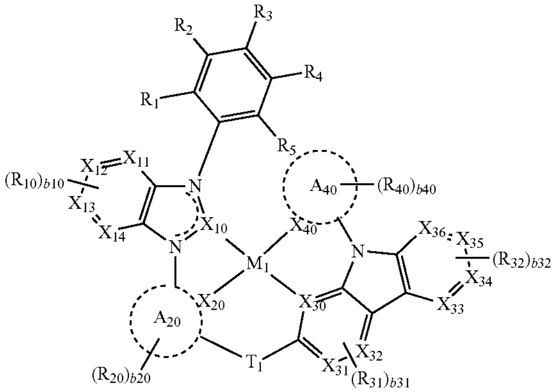

wherein, in Formula 1, $M_1$ is iridium (Ir), platinum (Pt), osmium (Os), titanium (Ti), zirconium (Zr), hafnium (Hf), europium (Eu), terbium (Tb), thulium (Tm), rhodium (Rh), palladium (Pd), or gold (Au), $X_{10}$ is C, $X_{11}$ to $X_{14}$, $X_{20}$, $X_{30}$ to $X_{36}$, and $X_{40}$ are each independently C or N, ring $A_{20}$ and ring $A_{40}$ are each independently a $C_5$-$C_{30}$ carbocyclic group or a $C_1$-$C_{30}$ heterocyclic group, $T_1$ is *—N($R_{51}$)—*', *—B($R_{51}$)—*', *—P($R_{51}$)—*', *—C($R_{51}$)($R_{52}$)—*', *—Si($R_{51}$)($R_{52}$)—*', *—Ge($R_{51}$)($R_{52}$)—*', *—S—*', *—Se—*', *—O—*', *—C(═O)—*', *—S(═O)—*', *—S(═O)$_2$—*', *—C($R_{51}$)═C($R_{52}$)—*', *—C(═S)—*', or *—C≡C—*', wherein * and *' each indicated a binding site to an adjacent atom, $R_2$ is a substituted or unsubstituted $C_1$-$C_{60}$ alkyl group or a substituted or unsubstituted $C_6$-$C_{60}$ aryl group, $R_1$, $R_3$ to $R_5$, $R_{10}$, $R_{20}$, $R_{31}$, $R_{32}$, $R_{40}$, $R_{51}$, and $R_{52}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), —P($Q_8$)($Q_9$), or —P(═O)($Q_8$)($Q_9$), two or more of $R_{10}$, $R_{20}$, $R_{31}$, $R_{32}$, $R_{40}$, $R_{51}$, and $R_{52}$ are optionally bonded to each other to form a substituted or unsubstituted $C_5$-$C_{30}$ carbocyclic group or a substituted or unsubstituted $C_1$-$C_{30}$ heterocyclic group, b10 and b32 are each independently an integer from 1 to 4, b20 and b40 are each independently an integer from 1 to 10, b31 is 1 or 2, provided that at least one of $R_{31}$(s) in the number of b31 or $R_{32}$(s) in the number of b32 is:

F or a cyano group;

a $C_1$-$C_{60}$ alkyl group or a $C_6$-$C_{60}$ aryl group, each substituted with at least one of —F, a cyano group, a fluorine-containing $C_1$-$C_{10}$ alkyl group, a $C_6$-$C_{60}$ aryl group, a $C_1$-$C_{60}$ heteroaryl group, —Si($Q_{33}$)($Q_{34}$)($Q_{35}$), or a combination thereof;

a substituted or unsubstituted $C_1$-$C_{60}$ heteroaryl group; or —Si($Q_3$)($Q_4$)($Q_5$), and a substituent of each of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, the substituted monovalent non-aromatic condensed heteropolycyclic group, the substituted $C_5$-$C_{30}$ carbocyclic group, and the substituted $C_1$-$C_{30}$ heterocyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P($Q_{18}$)($Q_{19}$), —P(═O)($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P($Q_{28}$)($Q_{29}$), —P(═O)($Q_{28}$)($Q_{29}$), or a combination thereof;

—N($Q_{31}$)($Q_{32}$), —Si($Q_{33}$)($Q_{34}$)($Q_{35}$), —B($Q_{36}$)($Q_{37}$), —P($Q_{38}$)($Q_{39}$), or —P(═O)($Q_{38}$)($Q_{39}$); or a combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group;

Formula 503-1

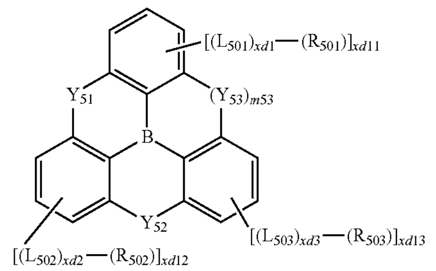

Formula 503-2

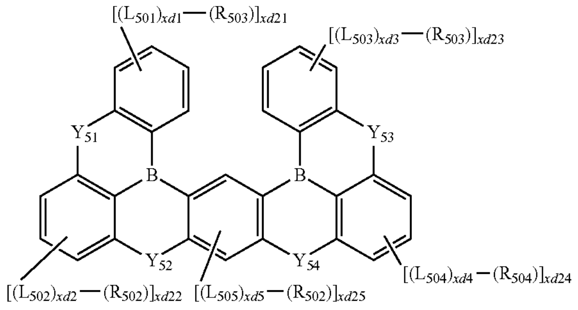

wherein, in Formulae 503-1 and 503-2, $Y_{51}$ to $Y_{54}$ are each independently a single bond, O, S, N[$(L_{506})_{xd6}$-$R_{506}$], C[$(L_{506})_{xd6}$-$R_{506}$][$(L_{507})_{xd7}$-$R_{507}$], or Si[$(L_{506})_{xd6}$-$R_{506}$][$(L_{507})_{xd7}$-$R_{507}$], m53 is 0 or 1, $L_{501}$ to $L_{507}$ are each independently a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropoly cyclic group, xd1 to xd7 are each independently 0, 1, 2, or 3, $R_{501}$ to $R_{507}$ are each independently:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, or a $C_1$-$C_{20}$ alkylthio group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or a combination thereof, when m53 is 0, xd11 and xd13 are each independently 0, 1, 2, 3, or 4, when m53 is 1, xd11 and xd13 are each independently 0, 1, 2, or 3, xd21 and xd23 are each independently 0, 1, 2, 3, or 4, xd12, xd22, and xd24 are each independently 0, 1, 2, or 3, xd25 is 0, 1, or 2, and two or more of $R_{501}$ to $R_{507}$ are optionally bonded to each other to form a substituted or unsubstituted $C_5$-$C_{30}$ carbocyclic group or a substituted or unsubstituted $C_1$-$C_{30}$ heterocyclic group.

2. The organic light-emitting device of claim 1, wherein Min Formula 1 is platinum (Pt), palladium (Pd), or gold (Au).

3. The organic light-emitting device of claim 1, wherein ring $A_{20}$ and ring $A_{40}$ in Formula 1 are each independently a cyclopentane group, a cyclopentene group, a cyclohexane group, a cyclohexene group, a cyclohexadiene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a phosphole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene-group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

4. The organic light-emitting device of claim 1, wherein ring $A_{20}$ in Formula 1 is represented by one of Formulae A20(1) to A20(15):

A20(1)

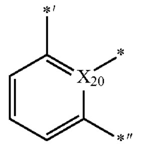

A20(2)

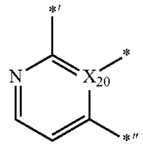

A20(3)

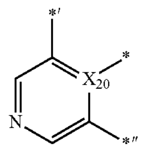

A20(4)

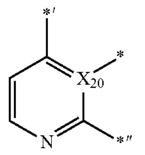

A20(5)

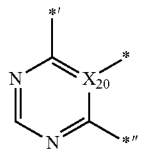

A20(6)

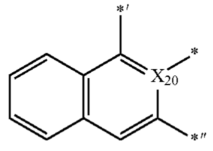

-continued

A20(7)

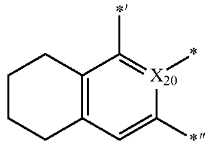

A20(8)

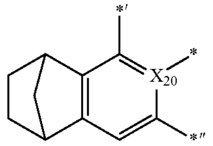

A20(9)

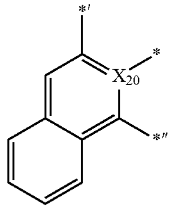

A20(10)

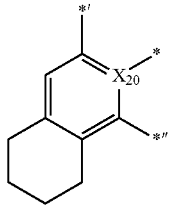

A20(11)

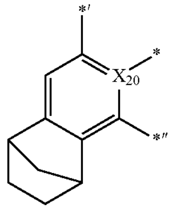

A20(12)

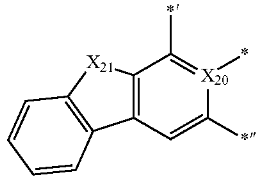

A20(13)

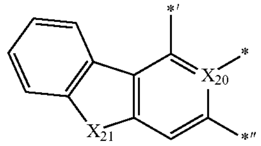

A20(14)

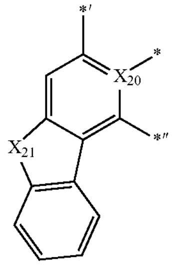

-continued

A20(15)

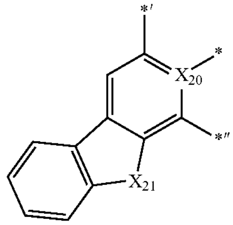

wherein, in Formulae A20(1) to A20(15), $X_{20}$ is C or N, $X_{21}$ is O, S, $N(R_{21})$, $C(R_{21})(R_{22})$, or $Si(R_{21})(R_{22})$, $R_{21}$ and $R_{22}$ are each independently as defined for $R_{20}$ in claim 1,

* indicates a binding site to $M_1$ in Formula 1,

*' indicates a binding site to N in Formula 1, and

*" indicates a binding site to $T_1$ in Formula 1.

5. The organic light-emitting device of claim 1, wherein ring $A_{40}$ in Formula 1 is represented by one of Formulae A40(1) to A40(34):

A40(1)

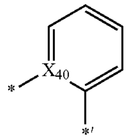

A40(2)

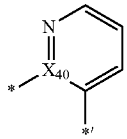

A40(3)

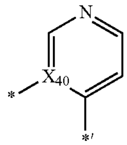

A40(4)

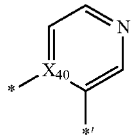

A40(5)

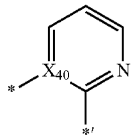

A40(6)

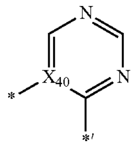

-continued
A40(7)
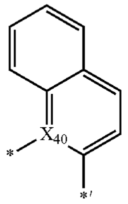
A40(8)
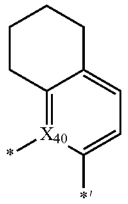
A40(9)
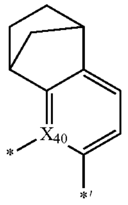
A40(10)
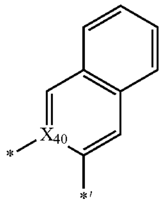
A40(11)
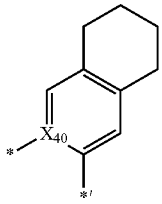
A40(12)
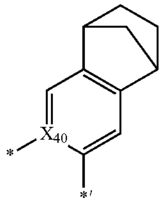
A40(13)
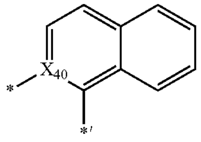
A40(14)
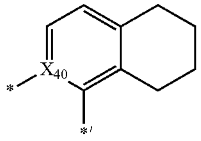
-continued
A40(15)
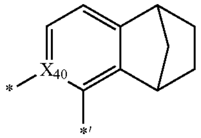
A40(16)
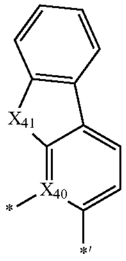
A40(17)
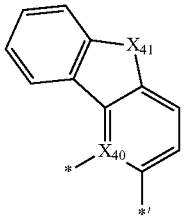
A40(18)
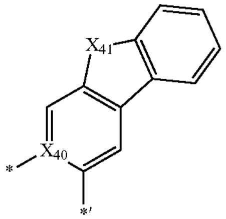
A40(19)
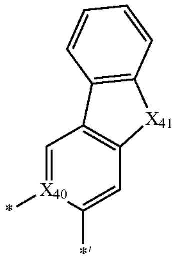
A40(20)
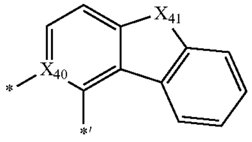
A40(21)
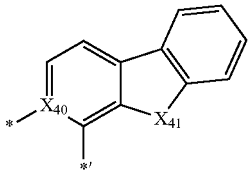
A40(22)
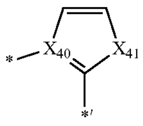

-continued

A40(23)

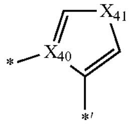

A40(24)

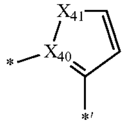

A40(25)

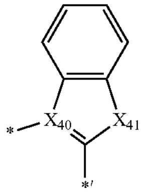

A40(26)

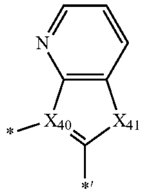

A40(27)

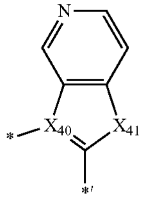

A40(28)

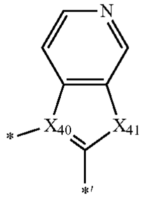

A40(29)

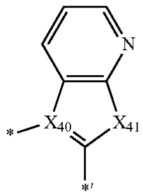

A40(30)

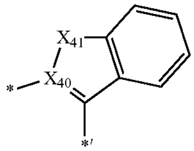

A40(31)

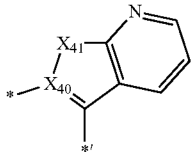

-continued

A40(32)

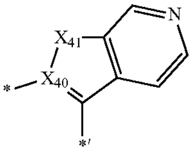

A40(33)

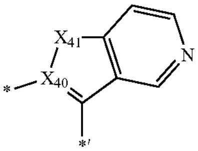

A40(34)

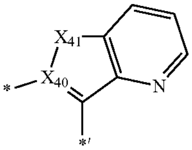

wherein, in Formulae A40(1) to A40(34), $X_{40}$ is C or N, $X_{41}$ is O, S, $N(R_{41})$, $C(R_{41})(R_{42})$, or $Si(R_{41})(R_{42})$, $R_{41}$ and $R_{42}$ are each independently as defined for $R_{40}$ in claim 1,

* indicates a binding site to M1 in Formula 1, and

*' indicates a binding site to N in Formula 1.

6. The organic light-emitting device of claim 1, wherein $R_2$ in Formula 1 is:

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, or a tert-decyl group, each unsubstituted or substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, a chrysenyl group, or a combination thereof.

7. The organic light-emitting device of claim 1, wherein, in Formula 1, i) $R_4$ is hydrogen, or ii) $R_4$ is a substituted or unsubstituted $C_1$-$C_{60}$ alkyl group or a substituted or unsubstituted $C_6$-$C_{60}$ aryl group.

8. The organic light-emitting device of claim 1, wherein, in Formula 1, i) $R_1$ and $R_3$ to $R_5$ are each hydrogen, ii) $R_1$, $R_3$, and $R_5$ are each hydrogen, and $R_4$ is:

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, or a tert-decyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, a chrysenyl group, or a combination thereof, or iii) $R_1$ and $R_5$ are each hydrogen, and $R_3$ and $R_4$ are each independently:

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, or a tert-decyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or ay combination thereof; or a phenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, a chrysenyl group, or a combination thereof.

9. The organic light-emitting device of claim 1, wherein, in Formula 1, at least one of $R_{31}$(s) in the number of b31, or $R_{32}$(s) in the number of b32 is:

—F or a cyano group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a phenanthrenyl group, an anthracenyl group, a fluoranthenyl group, a triphenylenyl group, a pyrenyl group, or a chrysenyl group, each substituted with at least one of —F, a cyano group, $—CF_3$, $—CF_2H$, $—CFH_2$, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, $—Si(Q_{33})(Q_{34})(Q_{35})$, or a combination thereof;

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, $—Si(Q_{33})(Q_{34})(Q_{35})$, or a combination thereof; or $—Si(Q_3)(Q_4)(Q_5)$, wherein $Q_3$ to $Q_5$ and $Q_{33}$ to $Q_{35}$ are each independently a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof.

10. The organic light-emitting device of claim 1, wherein, in Formula 1, at least one of $R_{31}$(s) in the number of b31, or $R_{32}$(s) in the number of b32 is:

—F, a cyano group, $—CF_3$, $—CF_2H$, $—CFH_2$, $—Si(Q_3)(Q_4)(Q_5)$, or a group represented by one of Formulae 3-1 to 3-55, wherein $Q_3$ to $Q_5$ are each independently a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof:

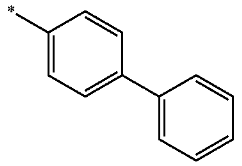

3-1

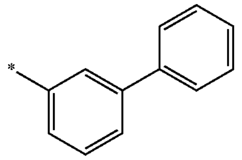

3-2

-continued
3-3
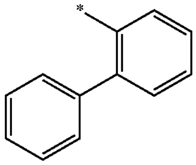
3-4
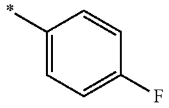
3-5
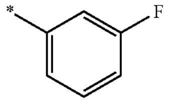
3-6
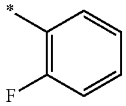
3-7
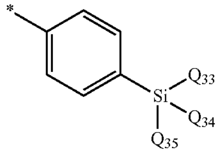
3-8
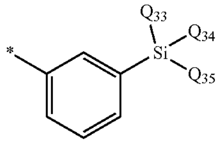
3-9
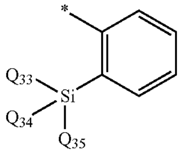
3-10
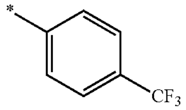
3-11
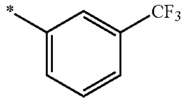
3-12
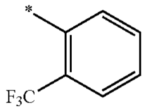
3-13
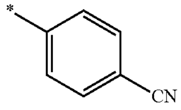
3-14
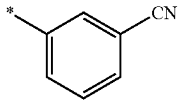
-continued
3-15
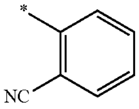
3-16
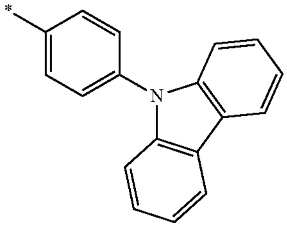
3-17
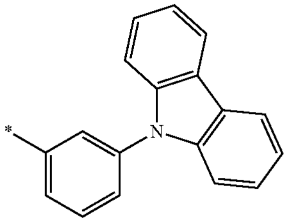
3-18
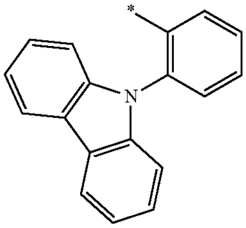
3-19
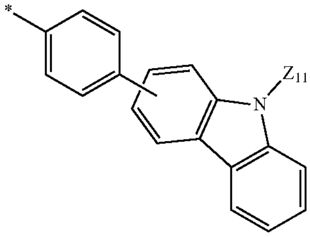
3-20
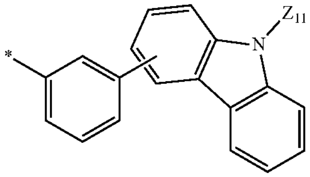
3-21
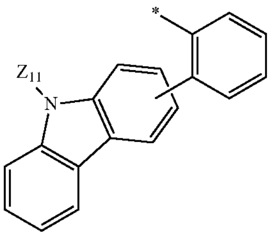

-continued
3-22
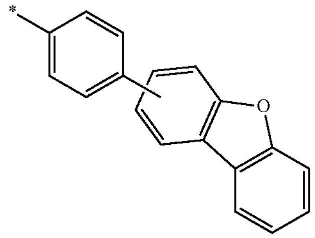
3-23
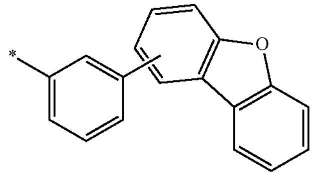
3-24
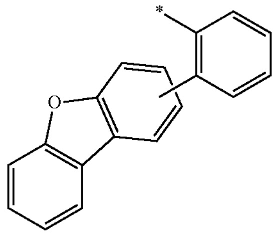
3-25
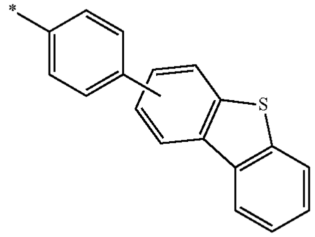
3-26
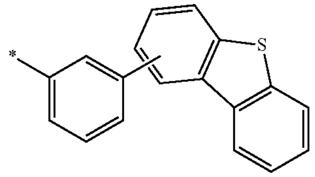
3-27
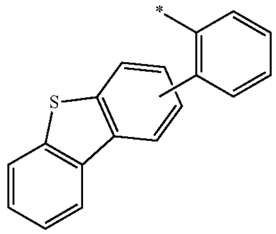
3-28
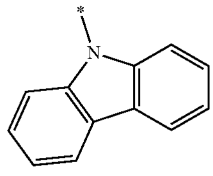
-continued
3-29
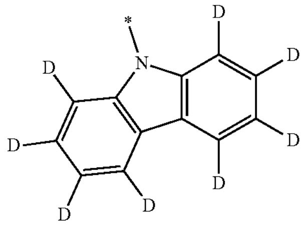
3-30
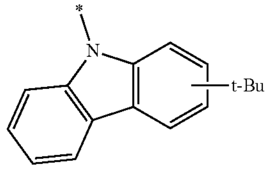
3-31
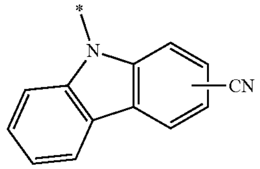
3-32
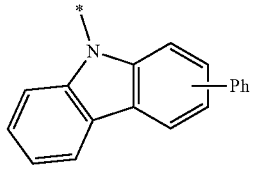
3-33
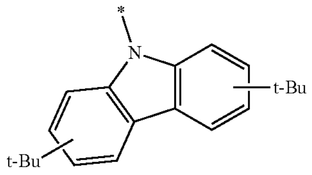
3-34
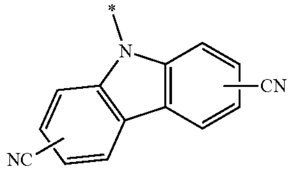
3-35
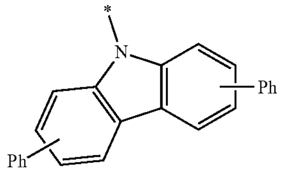
3-36
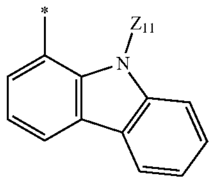

-continued
3-37
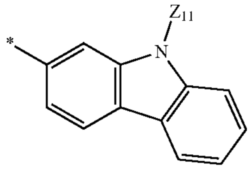
3-38
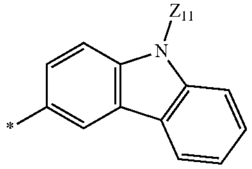
3-39
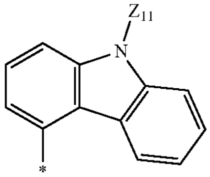
3-40
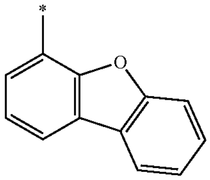
3-41
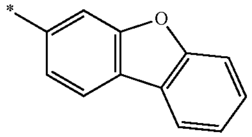
3-42
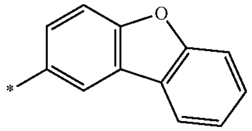
3-43
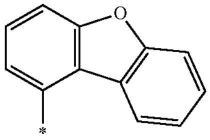
3-44
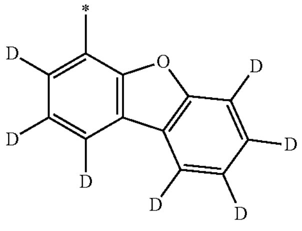
3-45
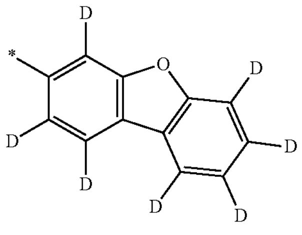
-continued
3-46
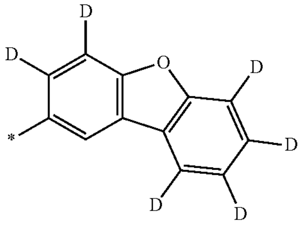
3-47
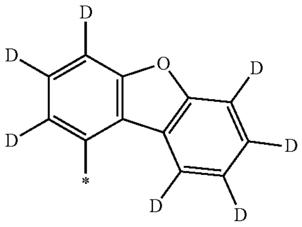
3-48
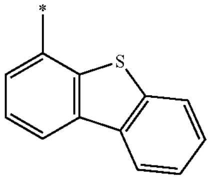
3-49
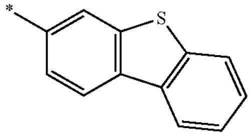
3-50
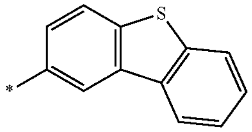
3-51
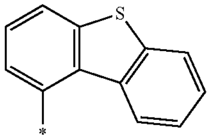
3-52
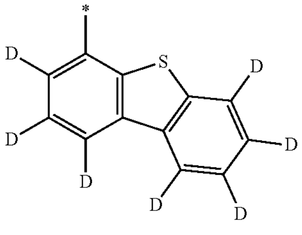
3-53
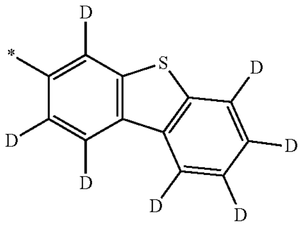

-continued 3-54

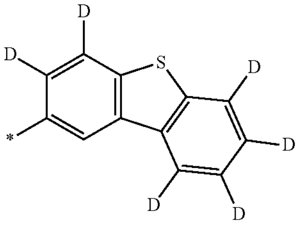

3-55

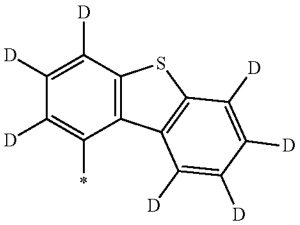

wherein, in Formulae 3-1 to 3-55, $Q_{33}$ to $Q_{35}$ and $Z_{11}$ are each independently a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof, t-Bu represents a tert-butyl group, Ph represents a phenyl group, and

* indicates a binding site to an adjacent atom.

11. The organic light-emitting device of claim 1, wherein a moiety represented by

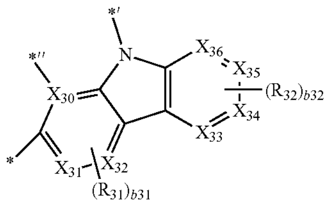

in Formula 1 is represented by one of Formulae A30(1) to A30(6):

A30(1)

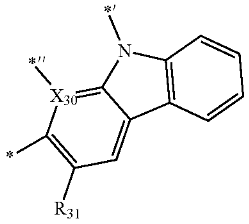

-continued

A30(2)

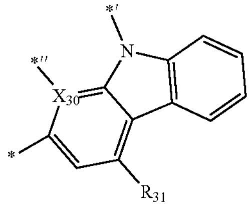

A30(3)

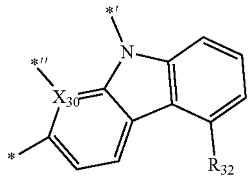

A30(4)

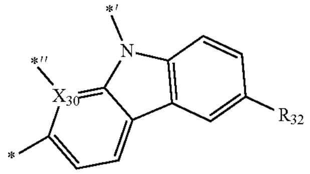

A30(5)

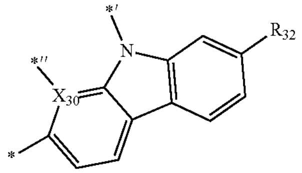

A30(6)

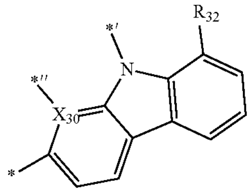

wherein, in Formulae A30(1) to A30(6), $R_{31}$ and $R_{32}$ are each independently:

—F or a cyano group;

a $C_1$-$C_{60}$ alkyl group or a $C_6$-$C_{60}$ aryl group, each substituted with at least one of —F, a cyano group, a fluorine-substituted $C_1$-$C_{10}$ alkyl group, a $C_6$-$C_{60}$ aryl group, a $C_1$-$C_{60}$ heteroaryl group, —Si($Q_{33}$)($Q_{34}$)($Q_{35}$), or a combination thereof;

a substituted or unsubstituted $C_1$-$C_{60}$ heteroaryl group; or

—Si($Q_3$)($Q_4$)($Q_5$), wherein $X_{30}$, $Q_3$ to $Q_5$, and $Q_{33}$ to $Q_{35}$ are as defined in claim 1,

* and *' each indicate a binding site to an adjacent atom, and

*'' indicates a binding site to M1.

12. The organic light-emitting device of claim 1, wherein the organometallic compound is represented by Formula 1A:

Formula 1A

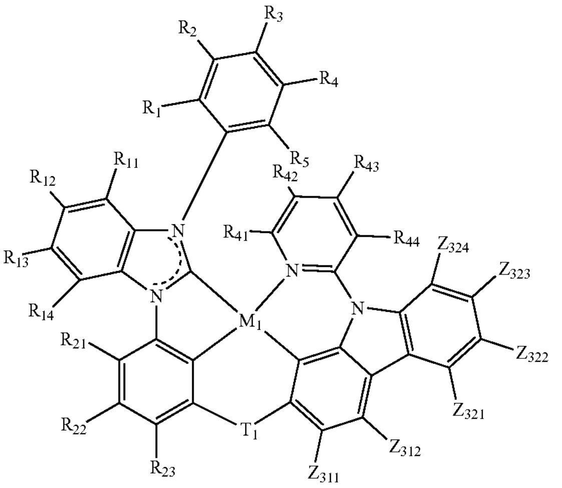

wherein, in Formula 1A, $M_1$, $T_1$, and $R_1$ to $R_5$ are as defined in claim 1, $R_{11}$ to $R_{14}$ are each independently as defined for $R_{10}$ in claim 1, $R_{21}$ to $R_{23}$ are each independently as defined for $R_{20}$ in claim 1, $Z_{311}$ and $Z_{312}$ are each independently as defined for $R_{31}$ in claim 1, $Z_{321}$ to $Z_{324}$ are each independently as defined for $R_{32}$ in claim 1, $R_{41}$ to $R_{44}$ are each independently as defined for $R_{40}$ in claim 1, and at least one of $Z_{311}$, $Z_{312}$, or $Z_{321}$ to $Z_{324}$ is:

—F or a cyano group;

a $C_1$-$C_{60}$ alkyl group or a $C_6$-$C_{60}$ aryl group, each substituted with at least one of —F, a cyano group, a fluorine-substituted $C_1$-$C_{10}$ alkyl group, a $C_6$-$C_{60}$ aryl group, a $C_1$-$C_{60}$ heteroaryl group, —Si($Q_{33}$)($Q_{34}$)($Q_{35}$), or a combination thereof;

a substituted or unsubstituted $C_1$-$C_{60}$ heteroaryl group; or

—Si($Q_3$)($Q_4$)($Q_5$).

13. An organometallic compound, wherein the organometallic compound is represented by one or more of Compounds 1 to 308:

1

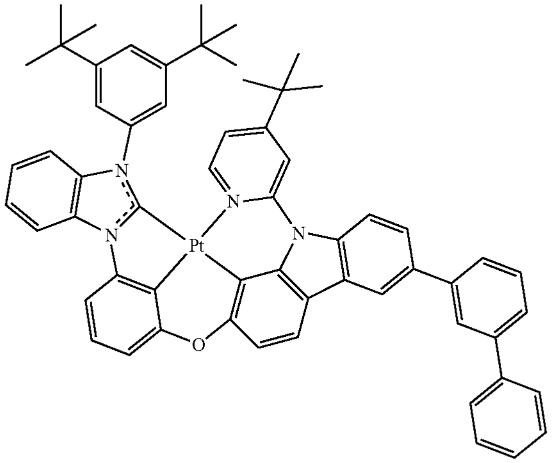

2

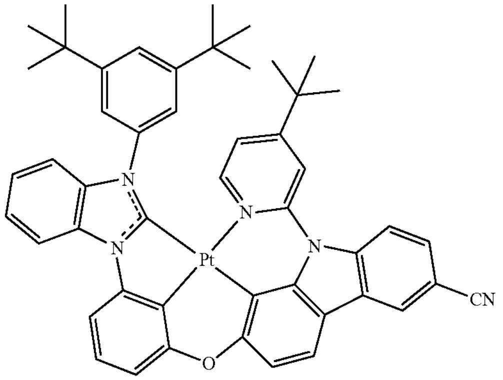

3

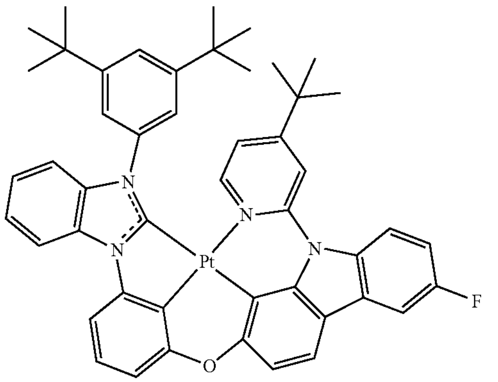

4

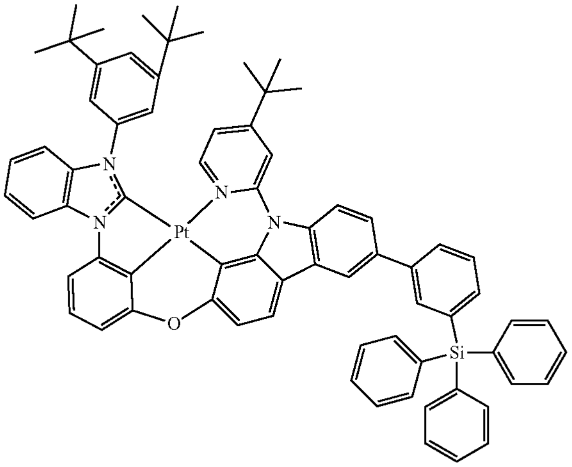

-continued
5
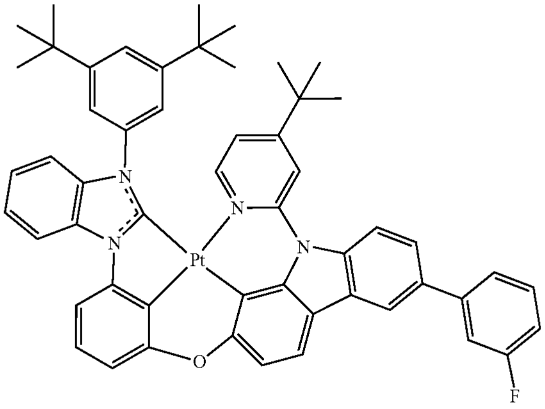
6
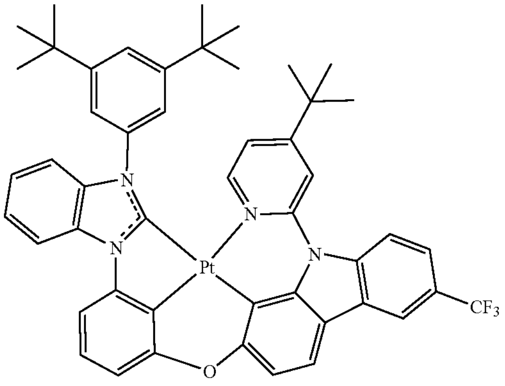
7
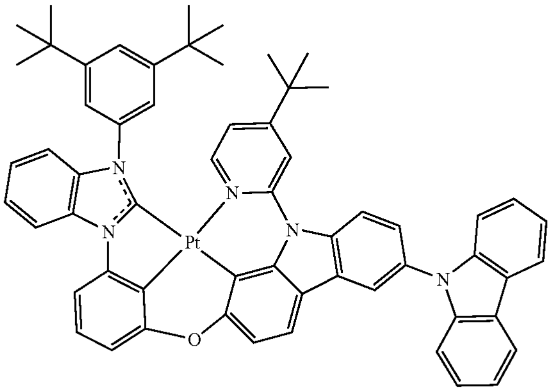
8
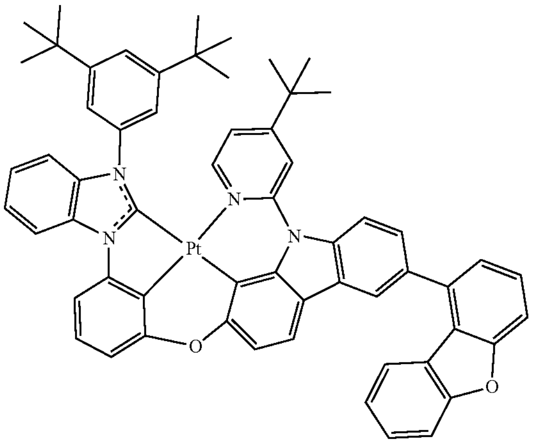
9
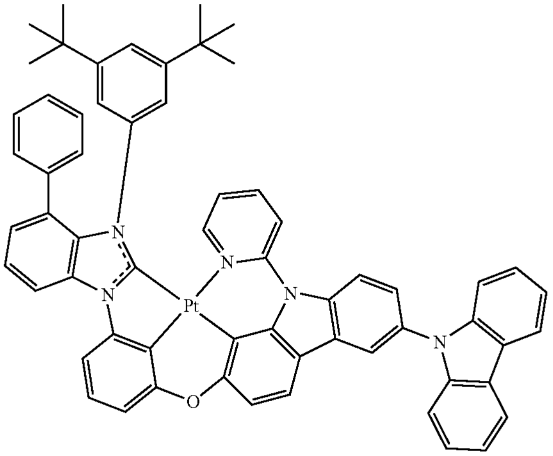
10
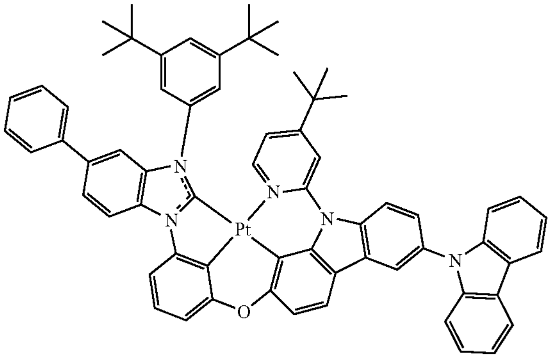

-continued
11
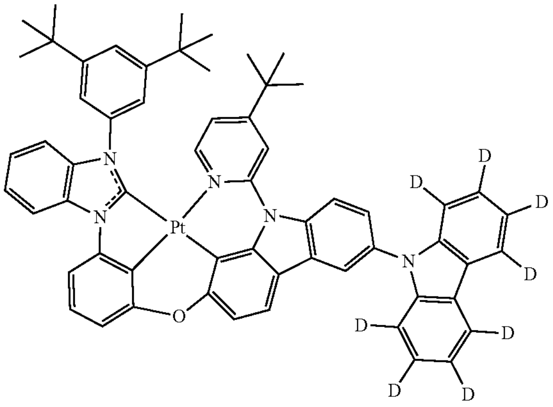
12
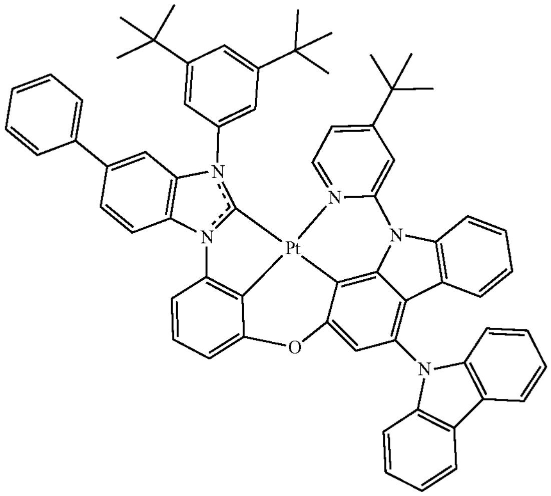
13
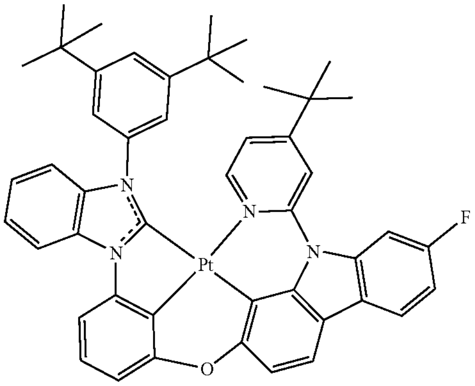
14
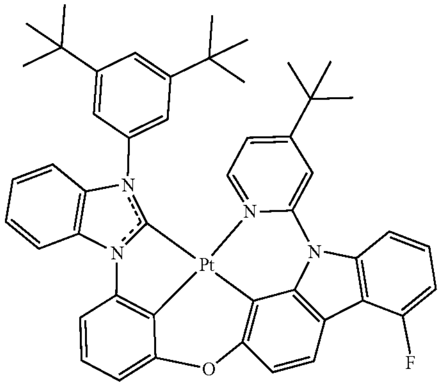
15
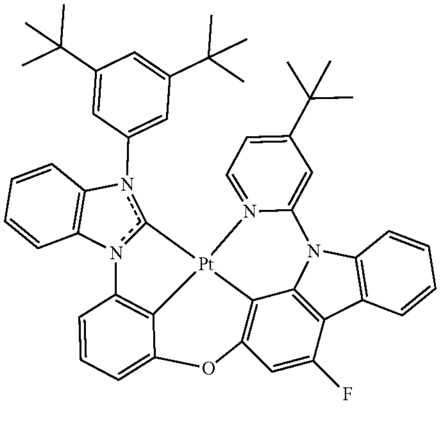
16
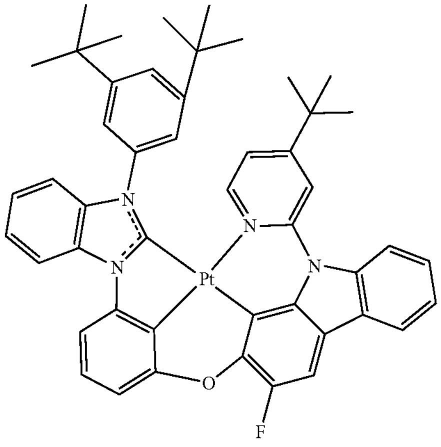

-continued
17
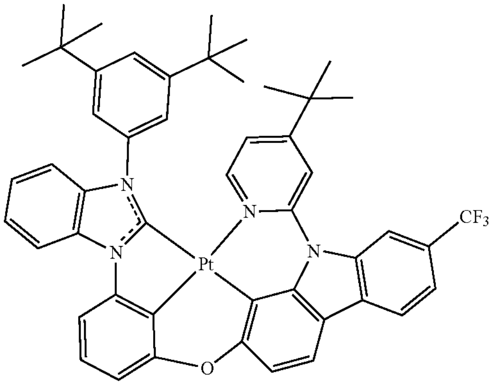
18
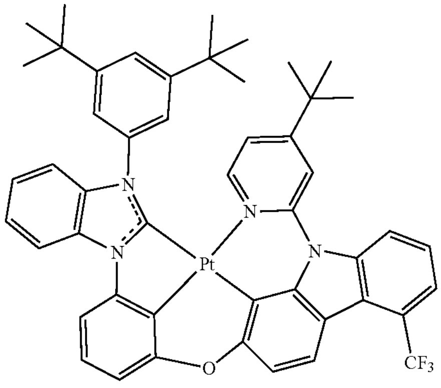
19
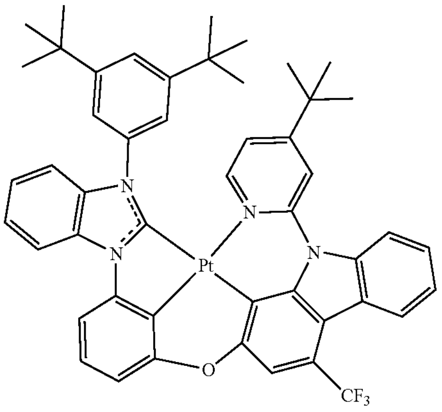
20
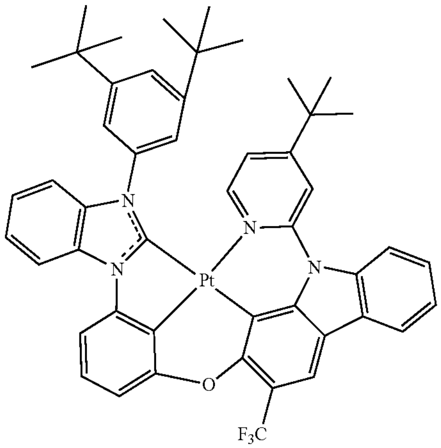
21
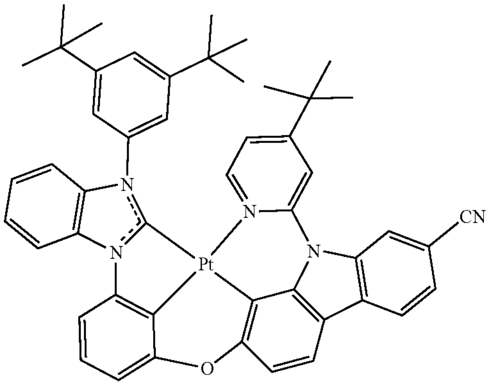
22
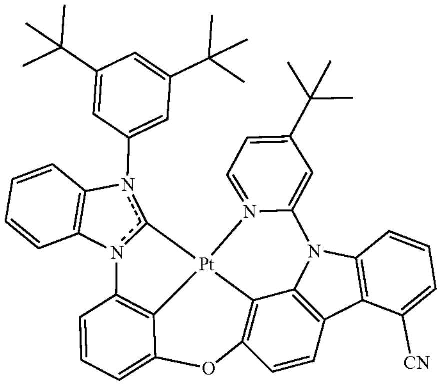

-continued
23
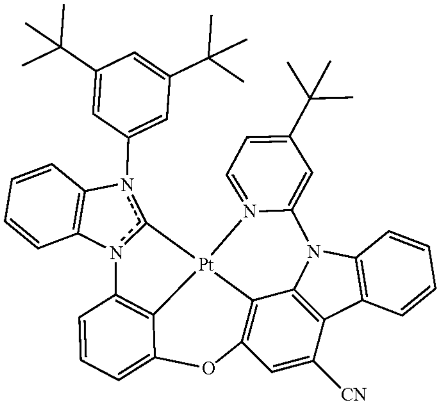
24
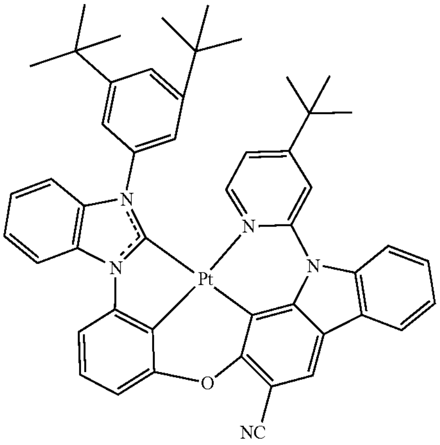
25
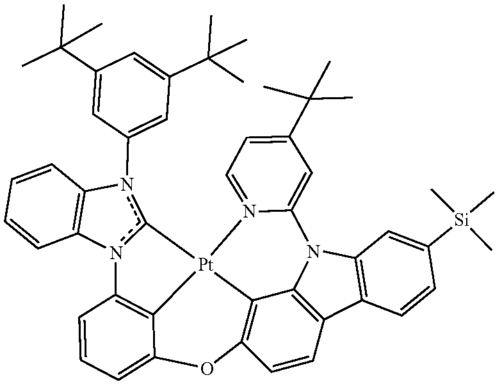
26
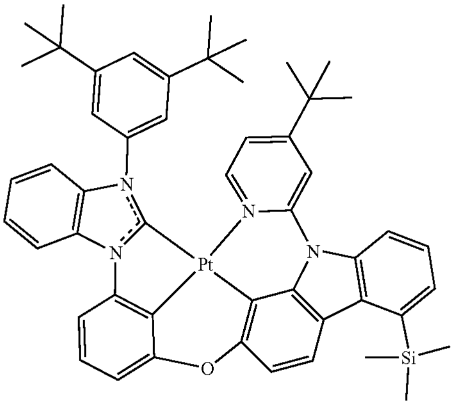
27
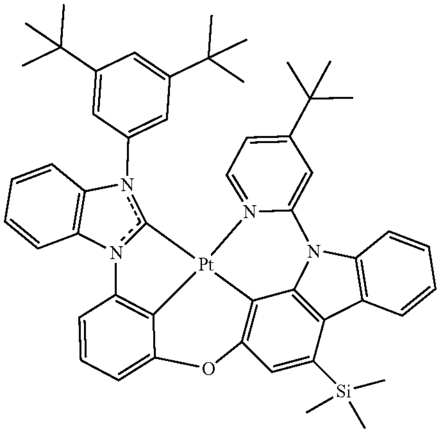
28
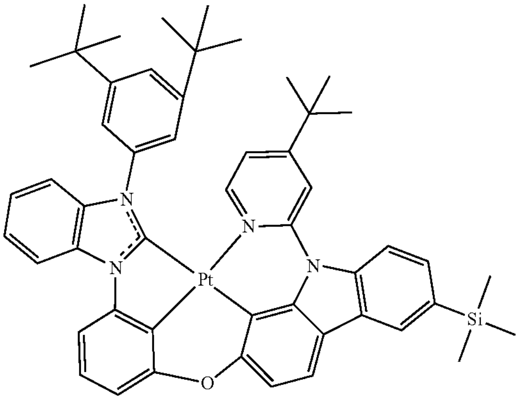

-continued
29
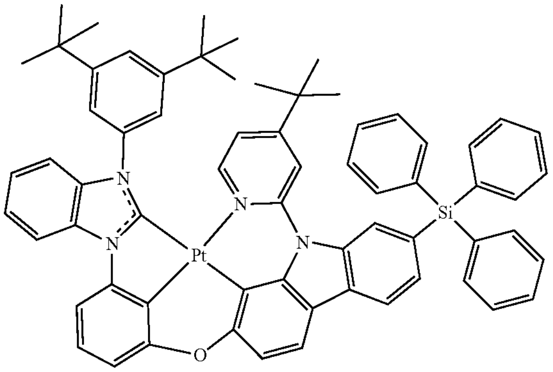
30
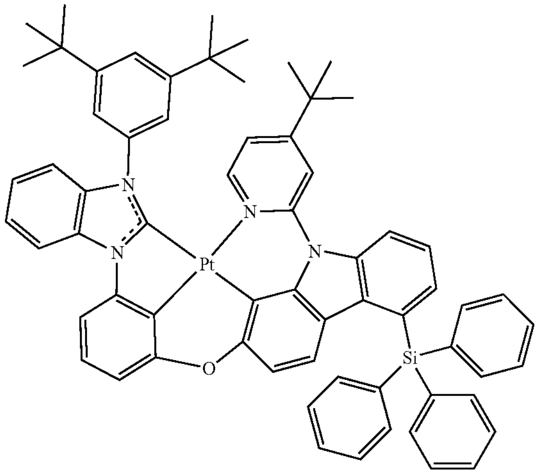
31
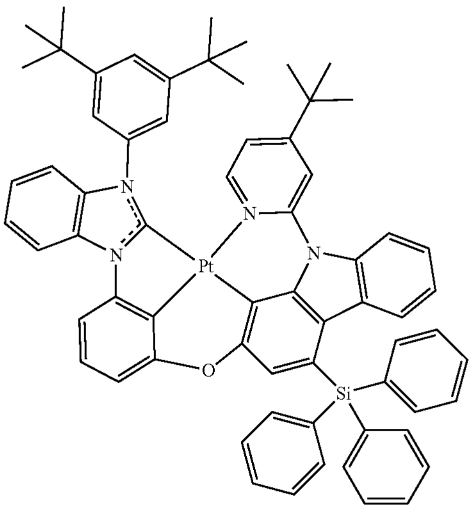
32
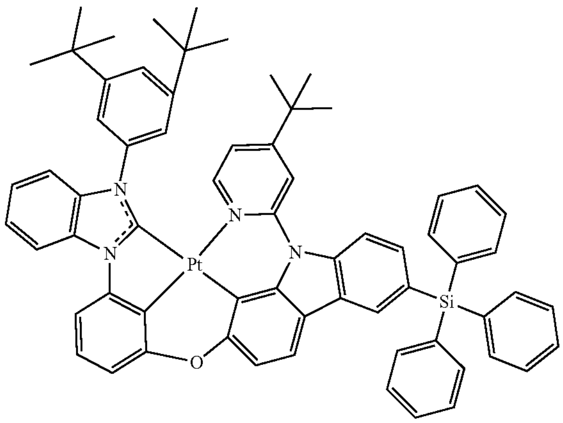
33
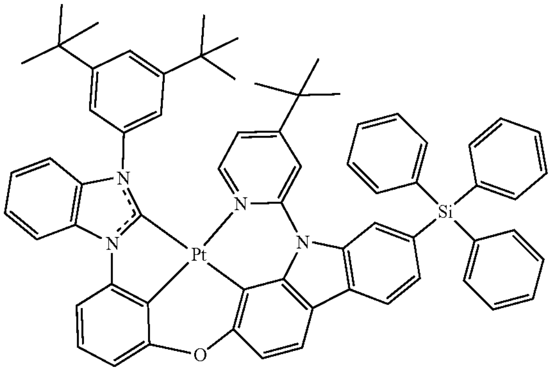
34
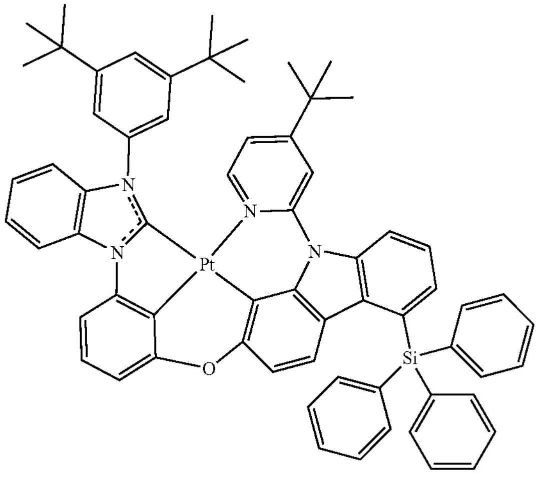

-continued
35
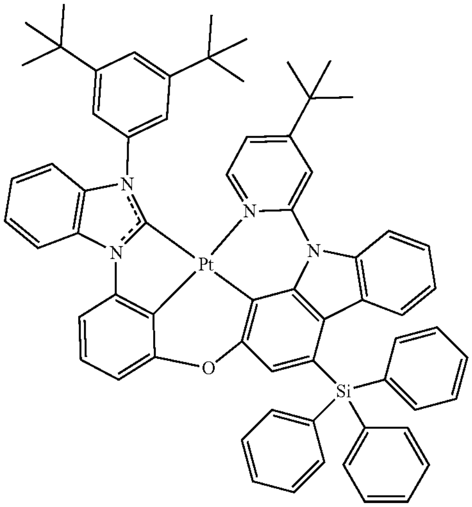
36
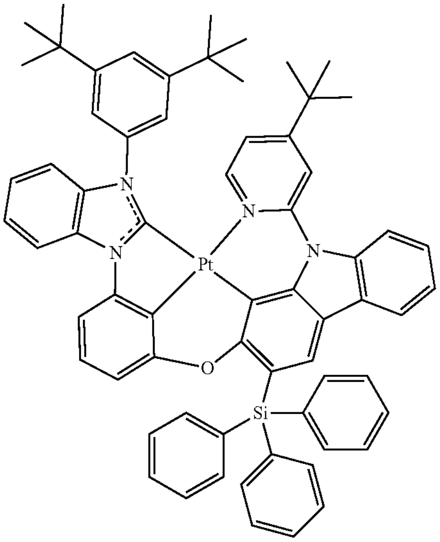
37
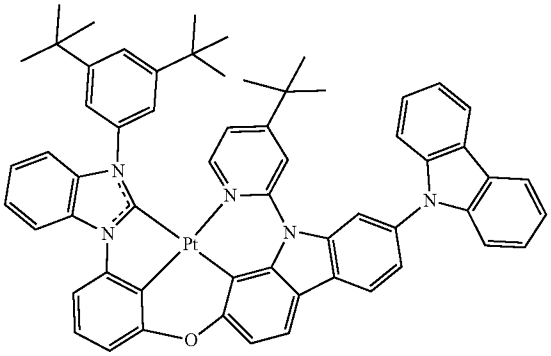
38
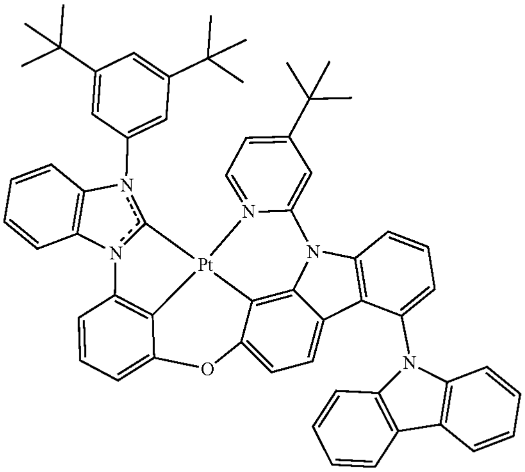
39
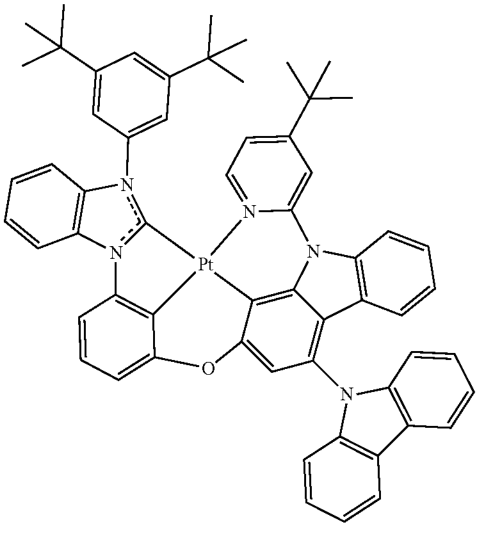
40
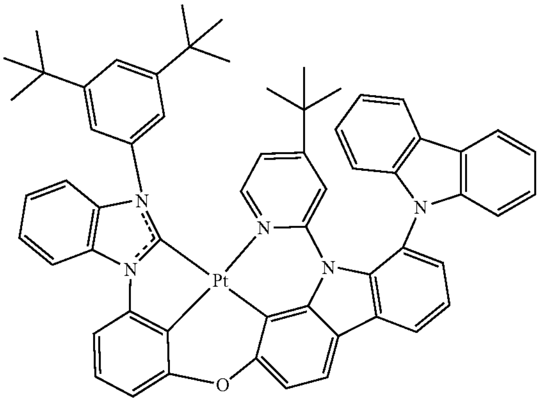

-continued
41
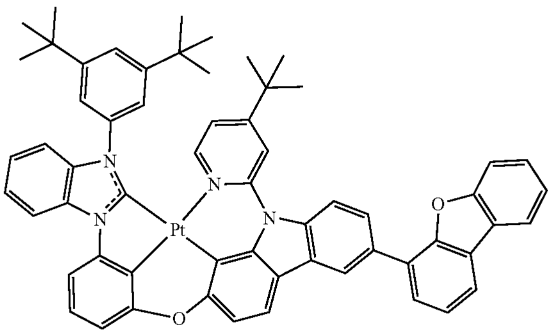
42
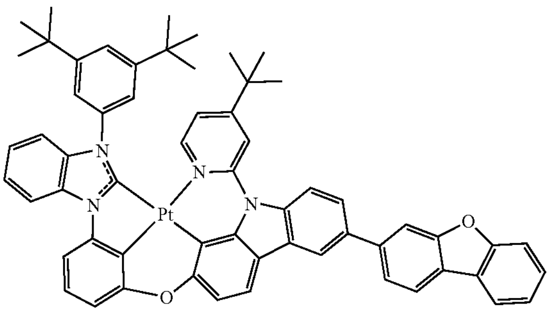
43
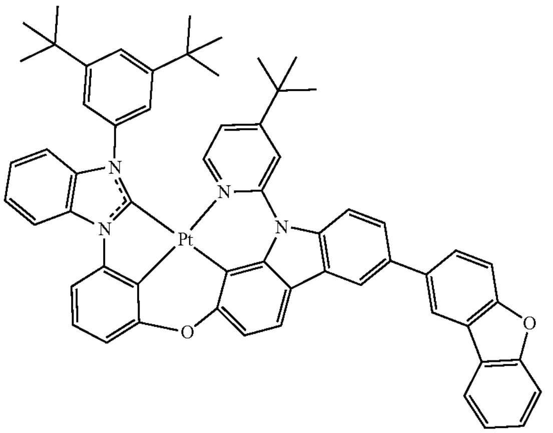
44
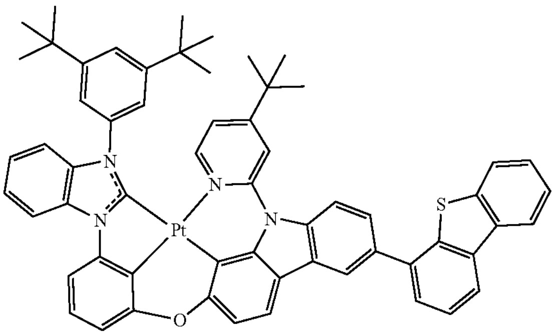
45
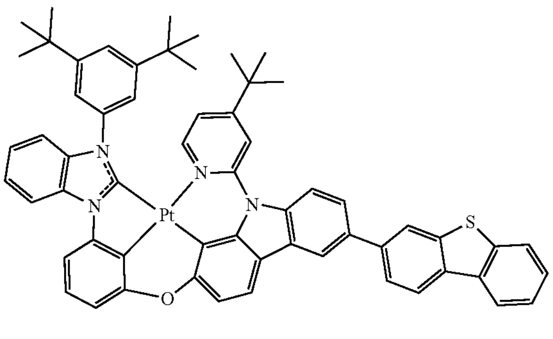
46
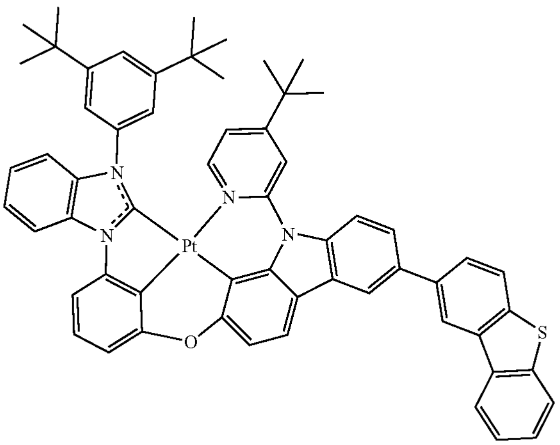

-continued
47
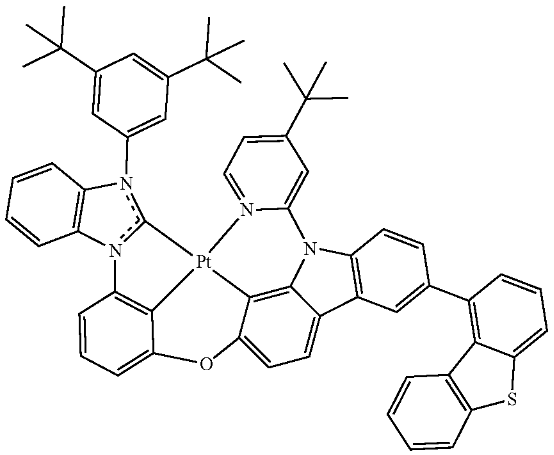
48
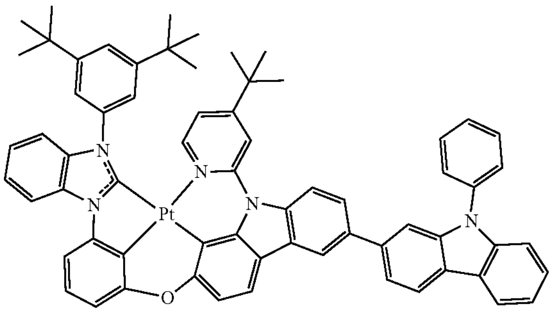
49
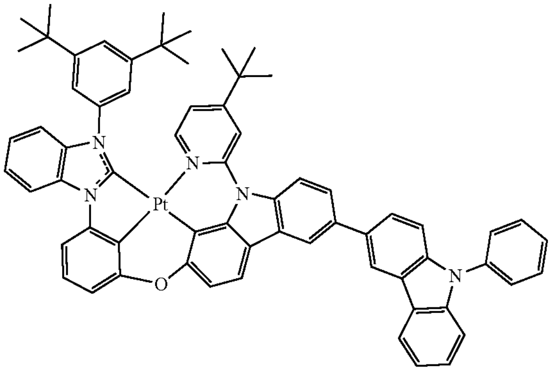
50
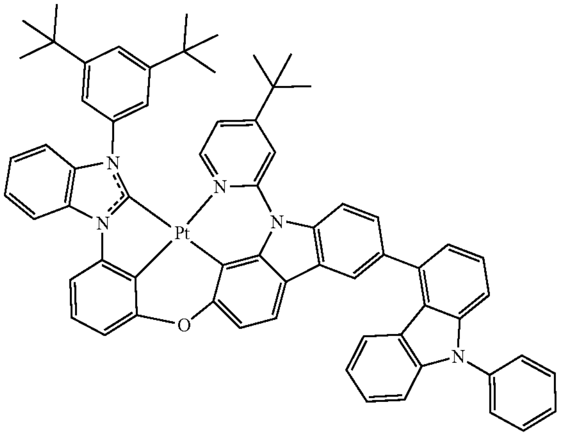
51
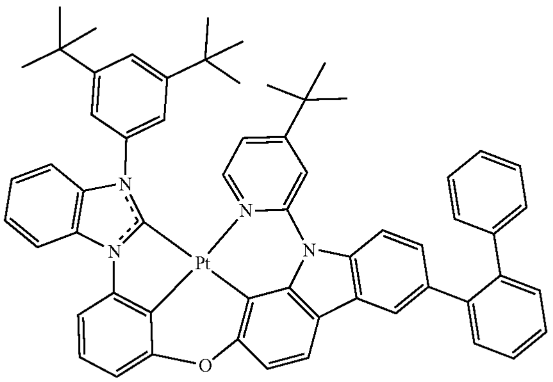
52
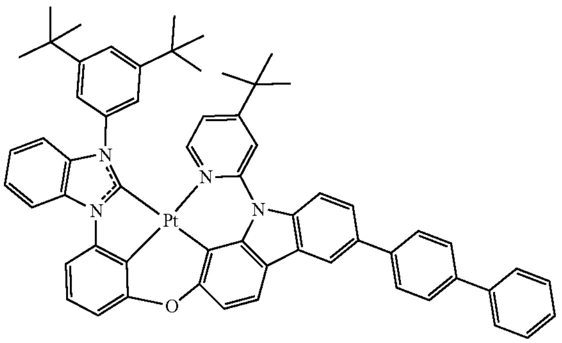

-continued
53
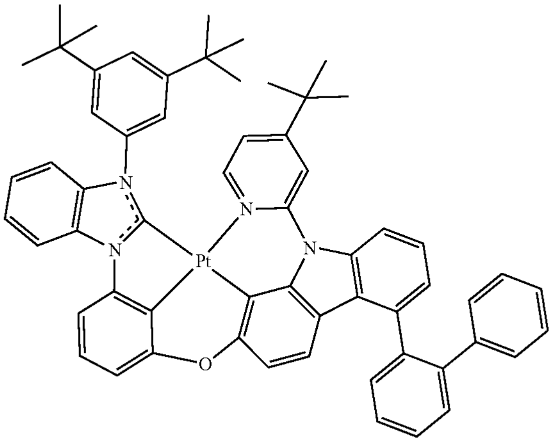
54
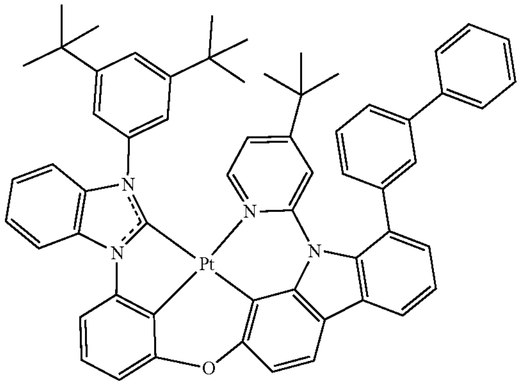
55
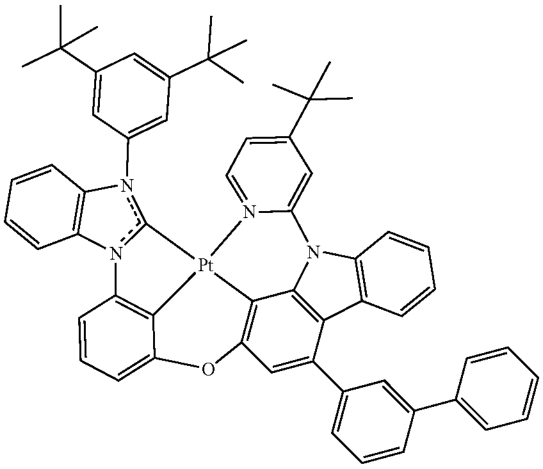
56
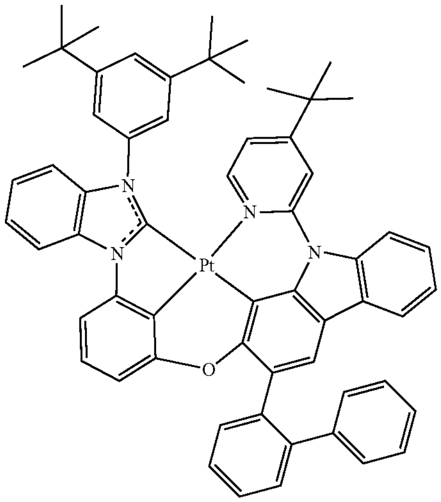
57
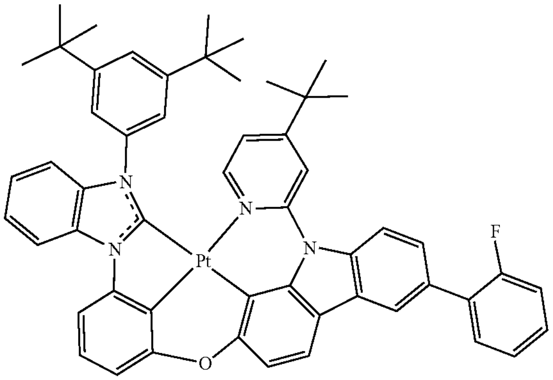
58
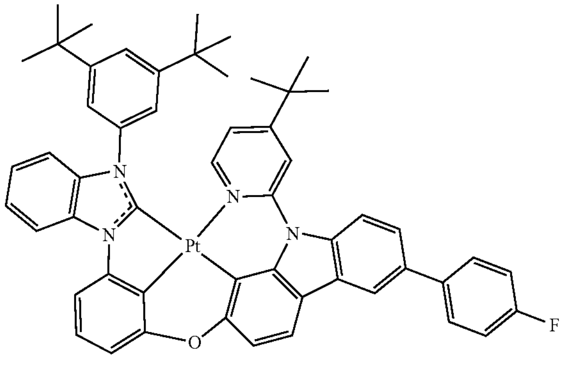

-continued
59
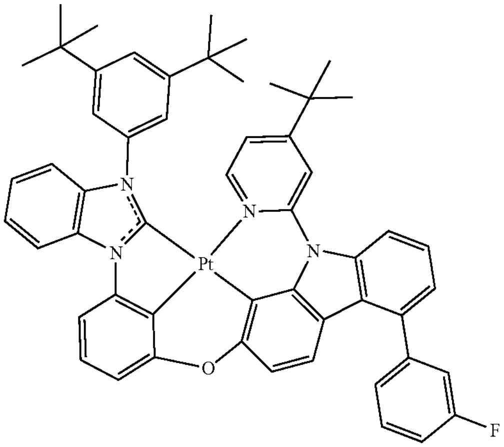
60
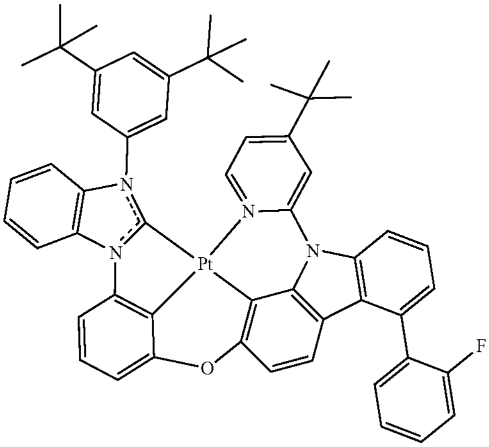
61
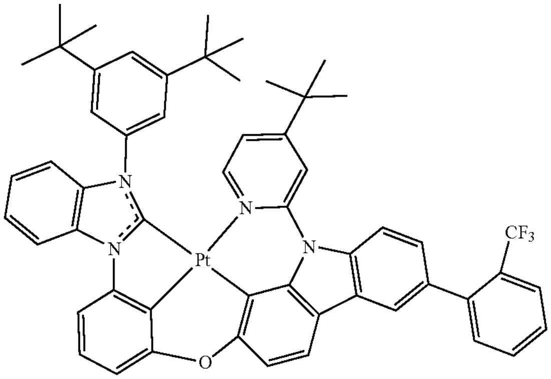
62
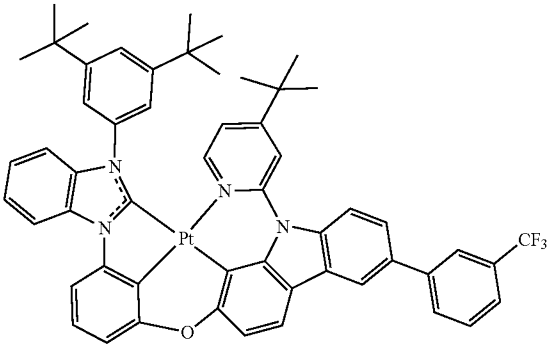
63
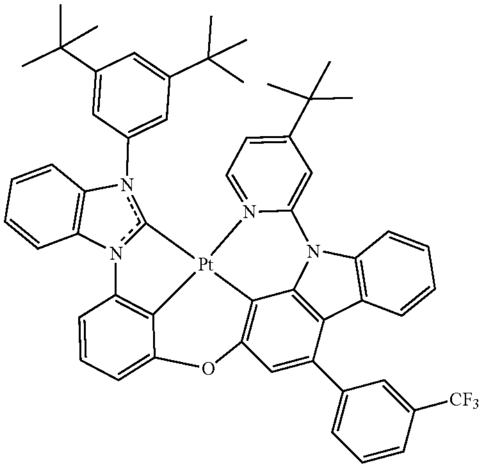
64
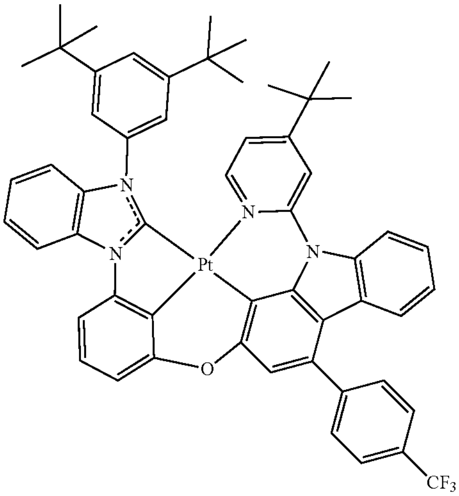

-continued
65
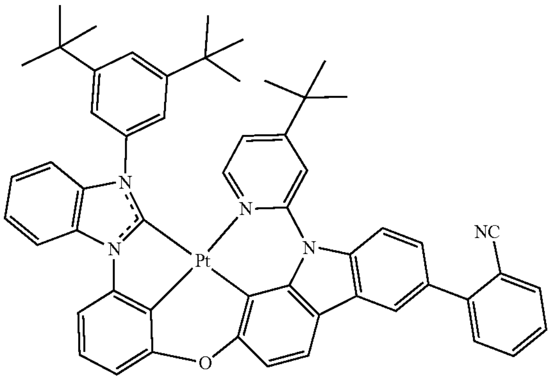
66
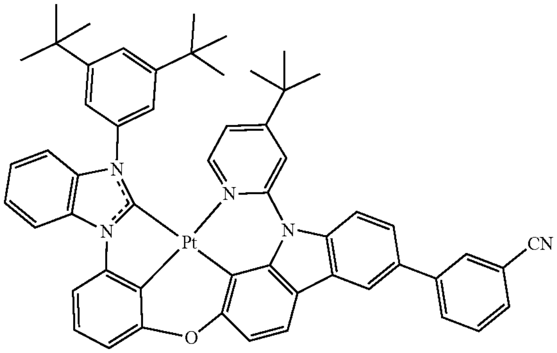
67
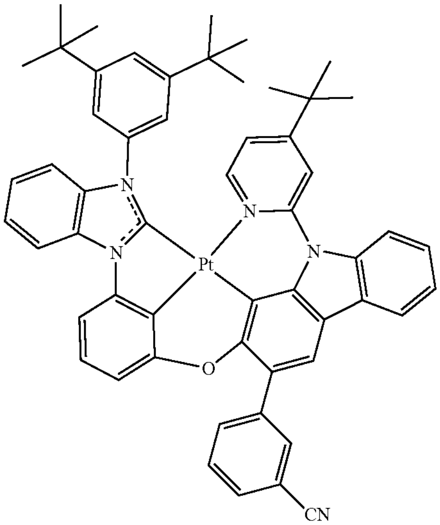
68
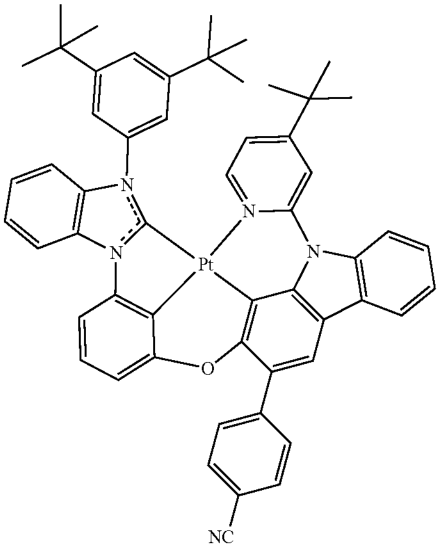
69
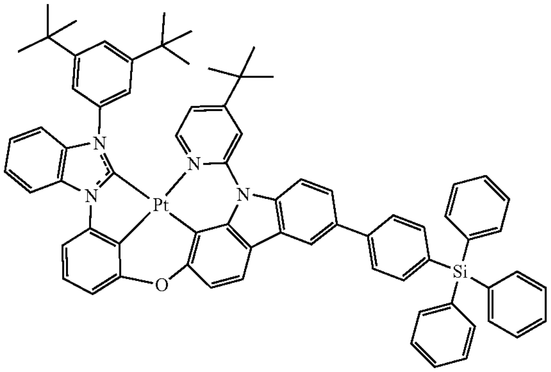
70
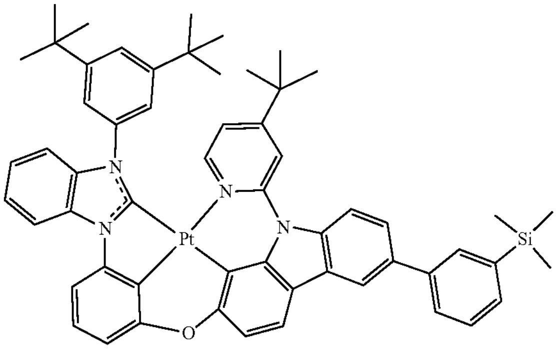

-continued
71
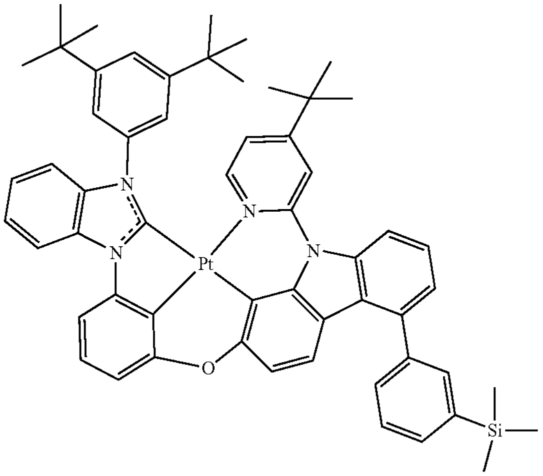
72
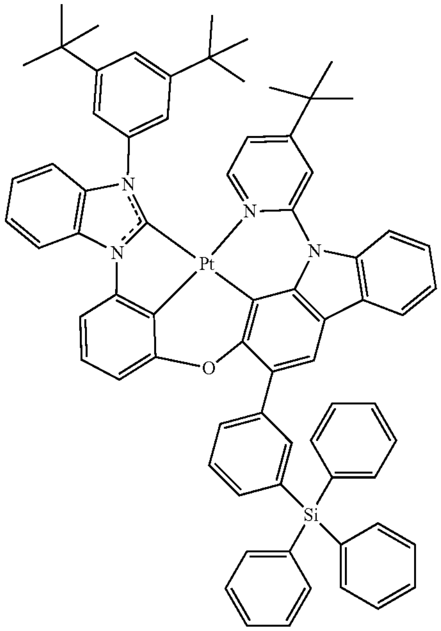
73
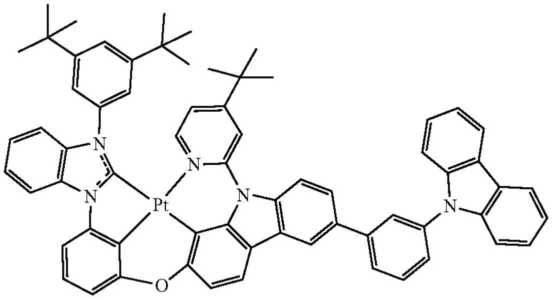
74
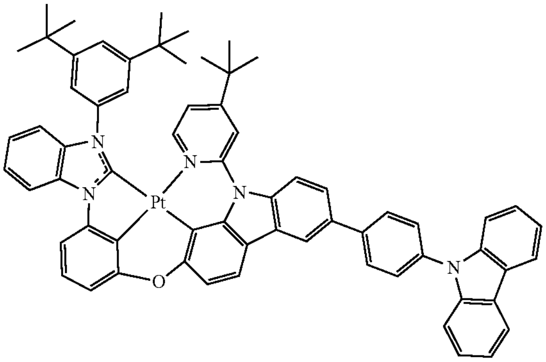
75
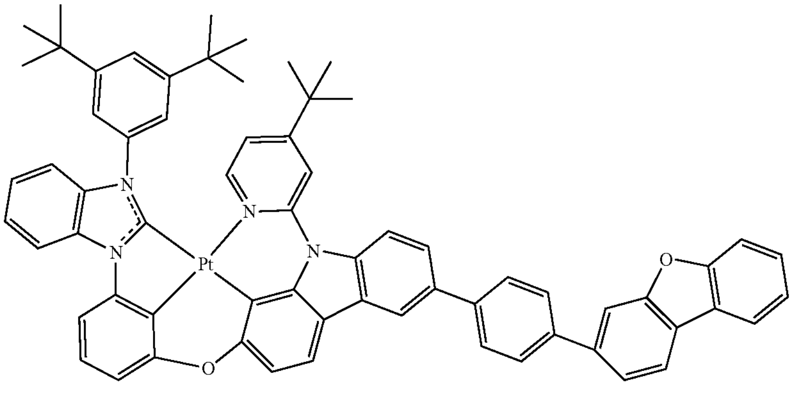

-continued
76
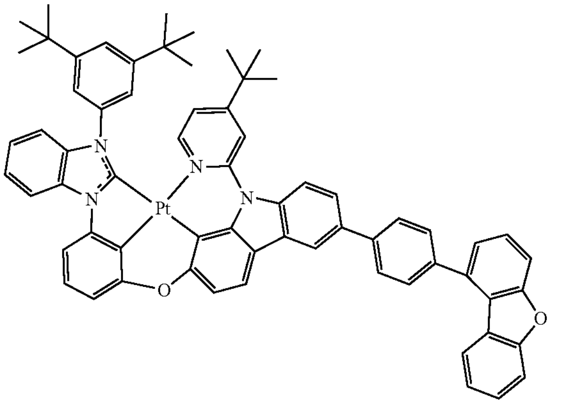
77
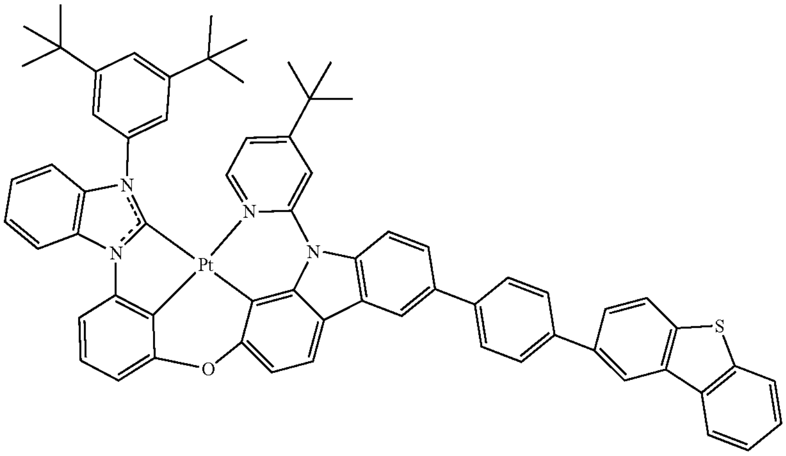
78
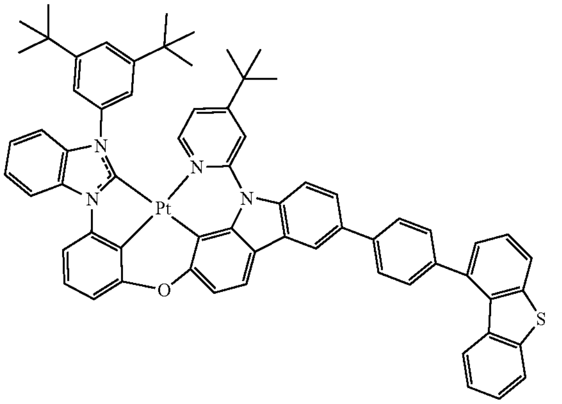
79
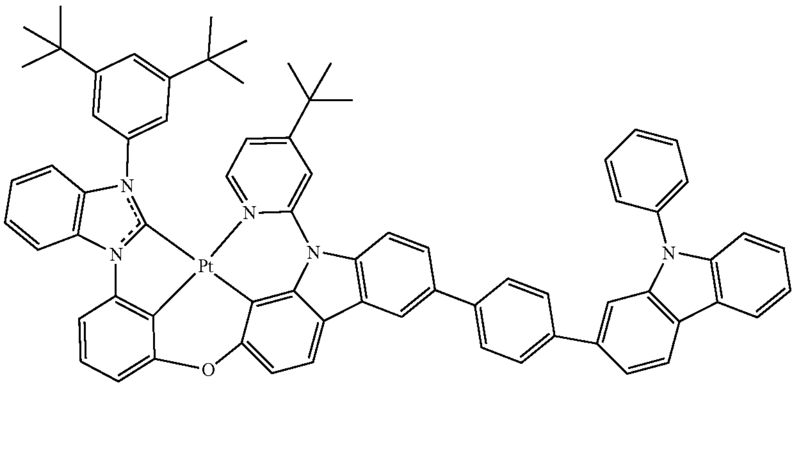

-continued
80
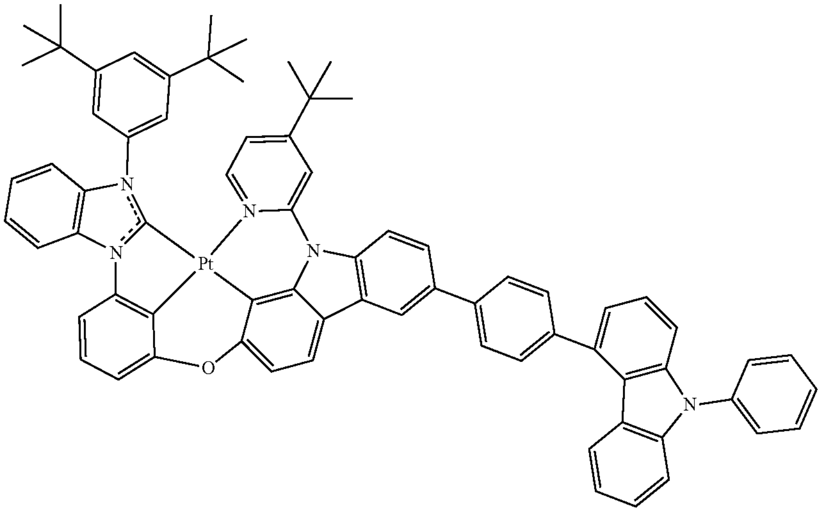
81
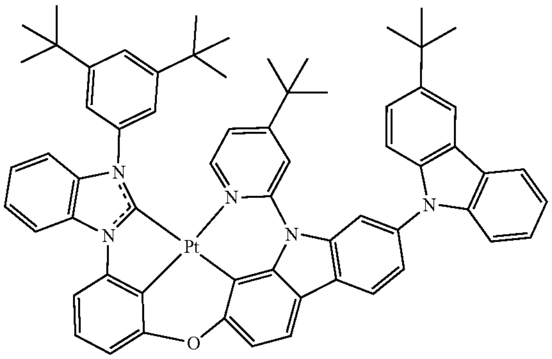
82
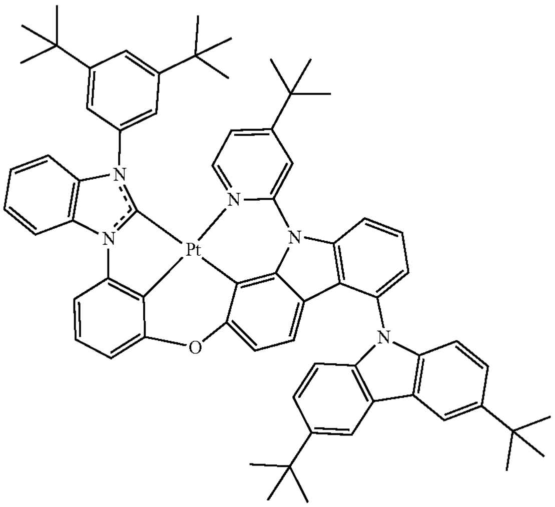
83
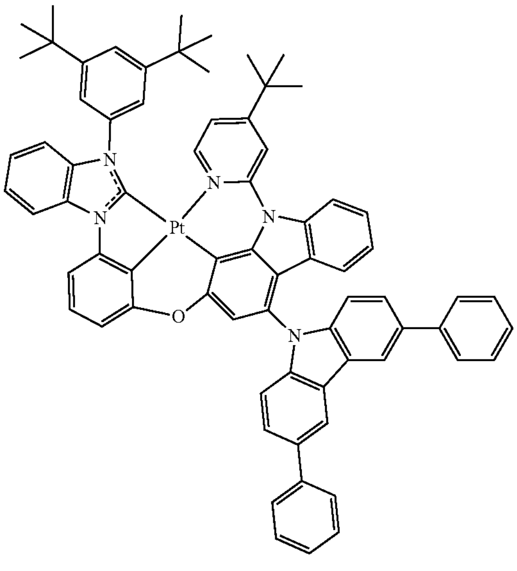
84
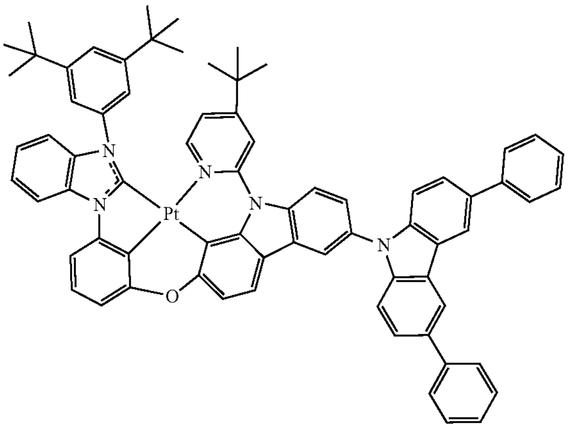

-continued
85
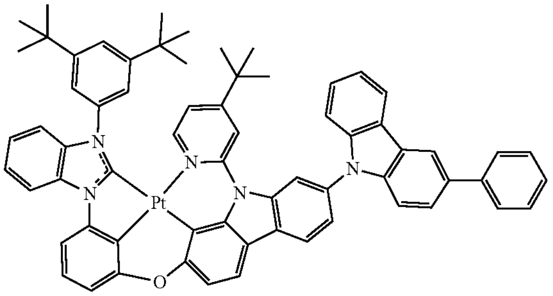
86
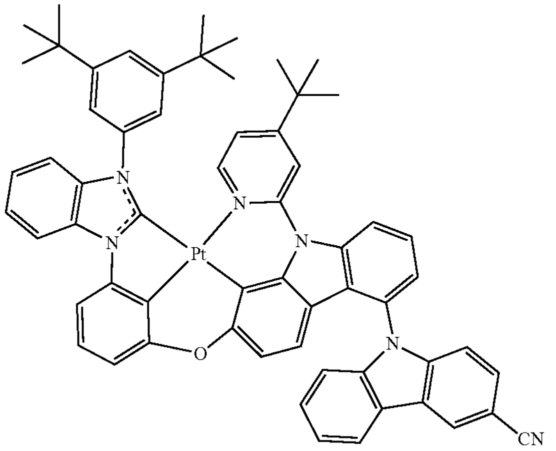
87
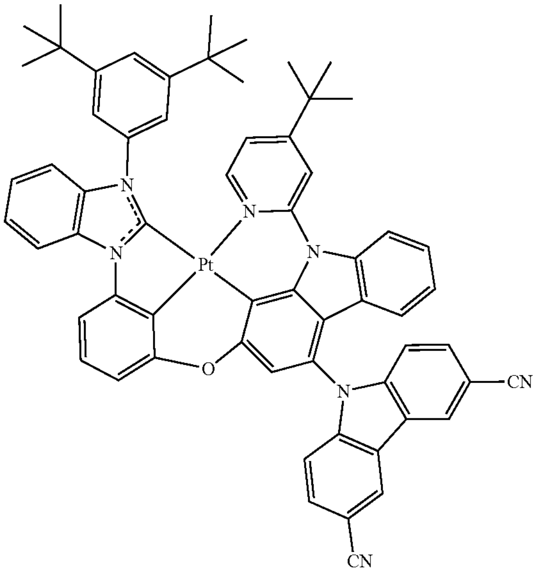
88
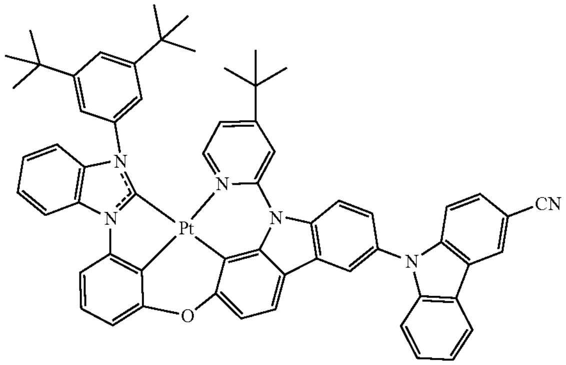
89
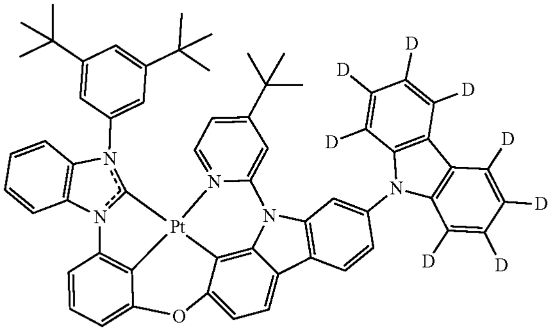
90
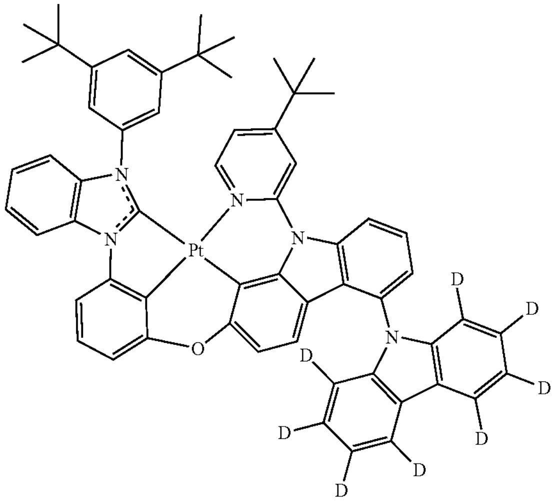

-continued
91
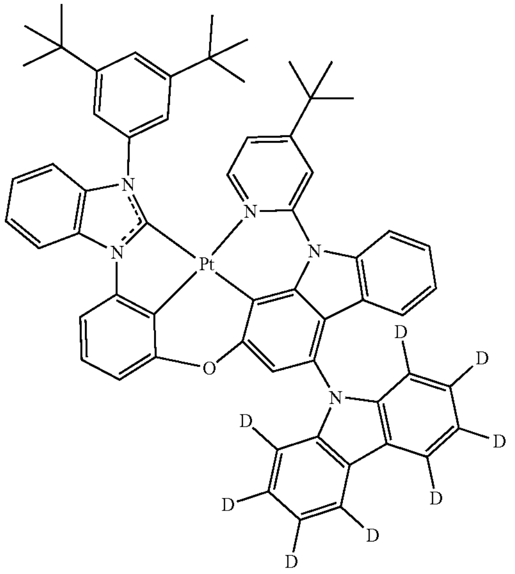
92
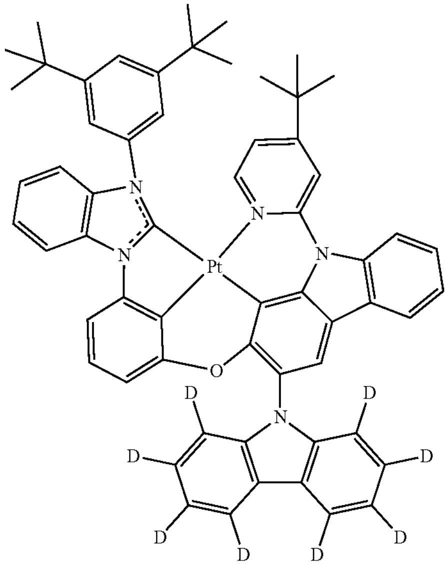
93
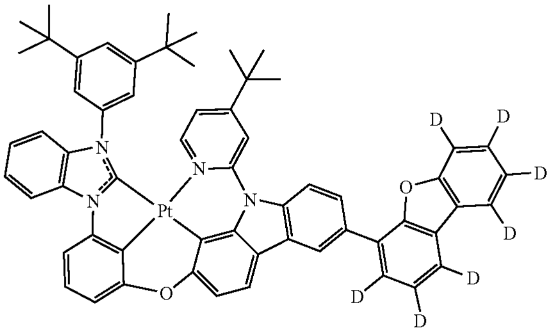
94
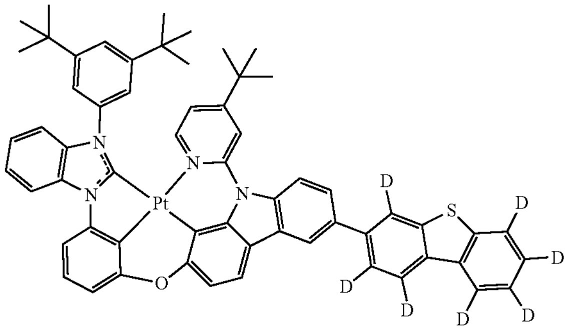
95
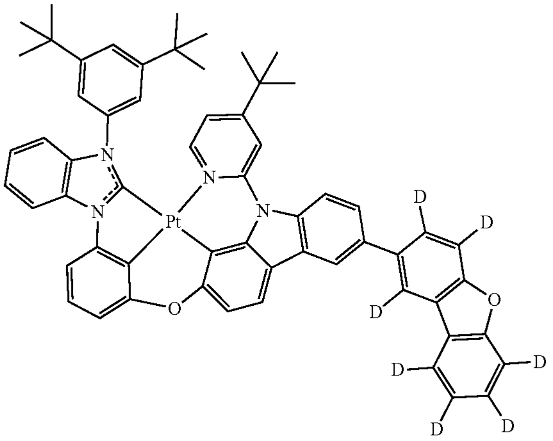
96
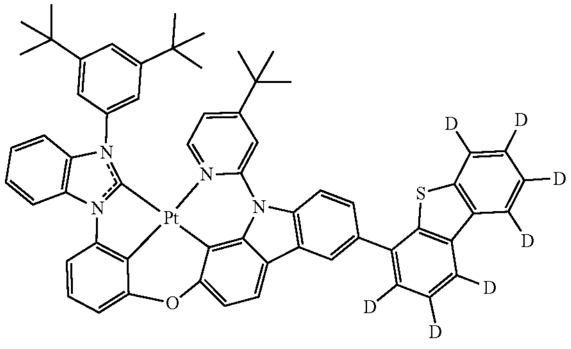

-continued
97
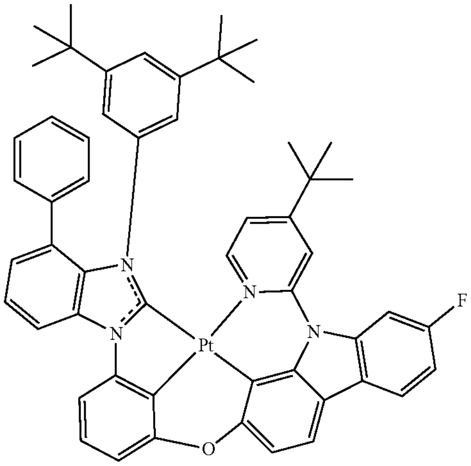
98
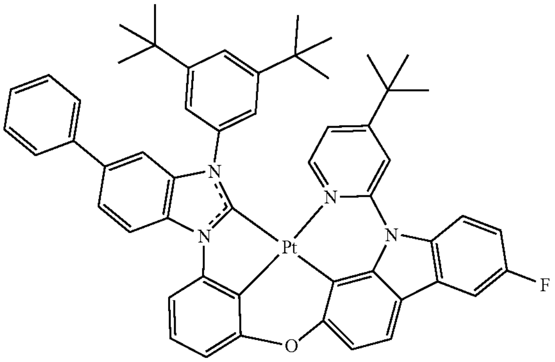
99
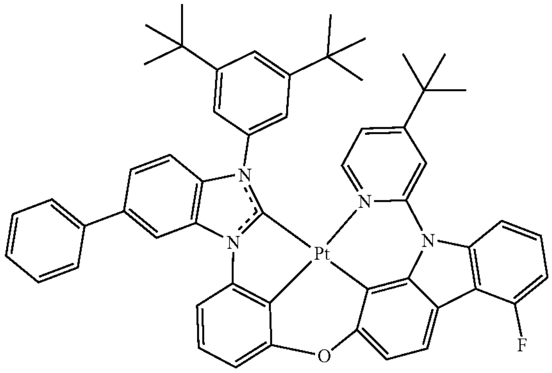
100
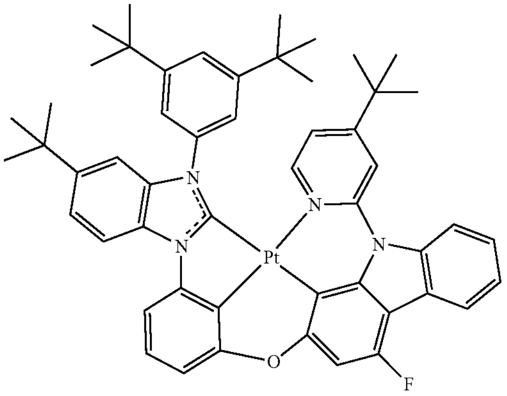
101
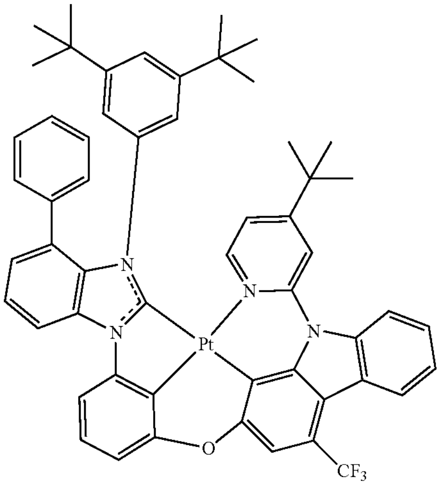
102
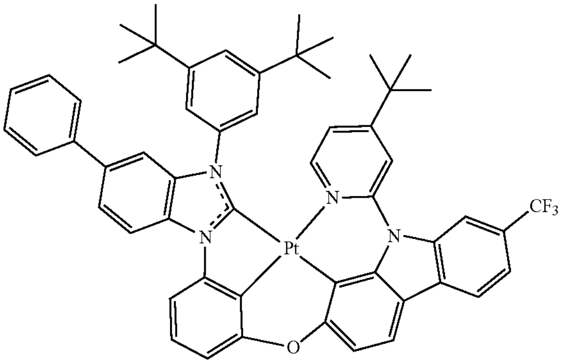

-continued
103
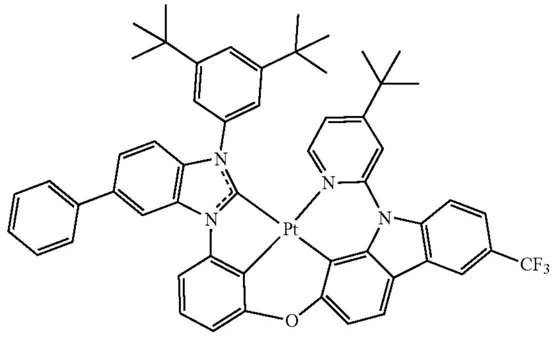
104
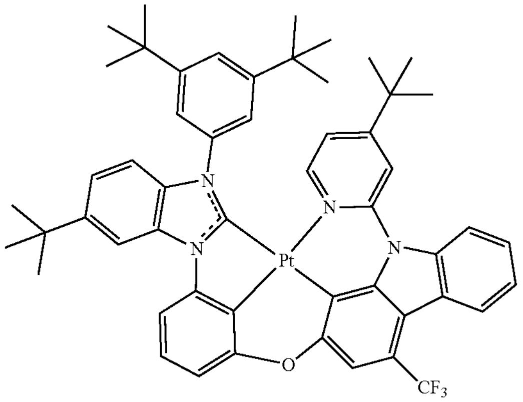
105
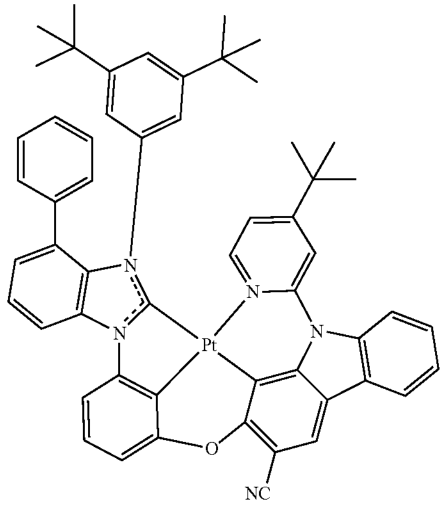
106
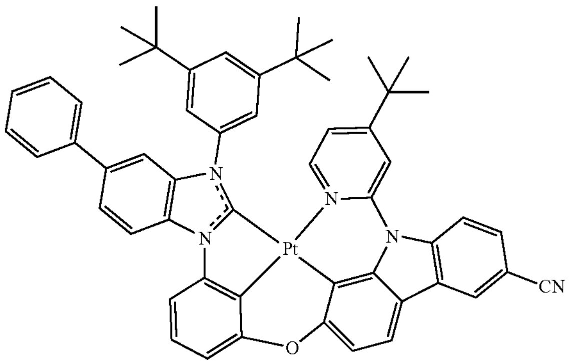
107
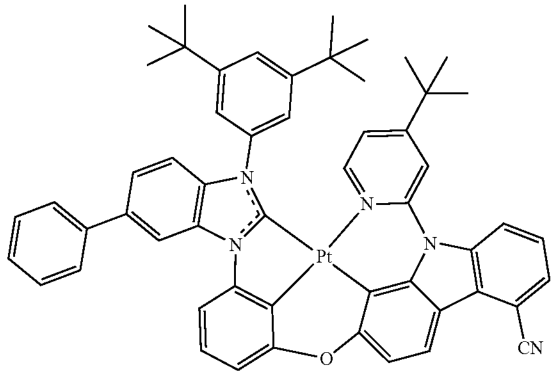
108
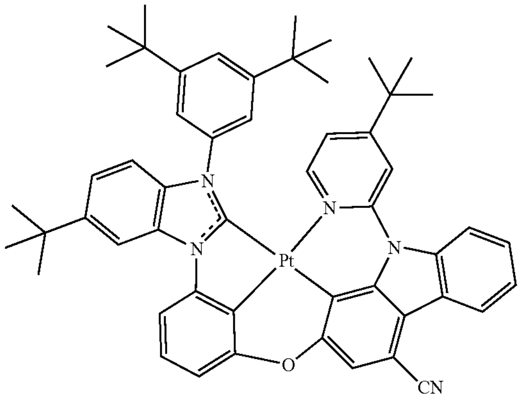

-continued
109
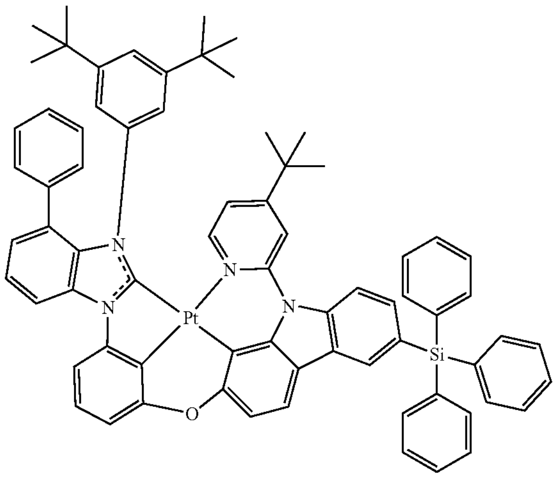
110
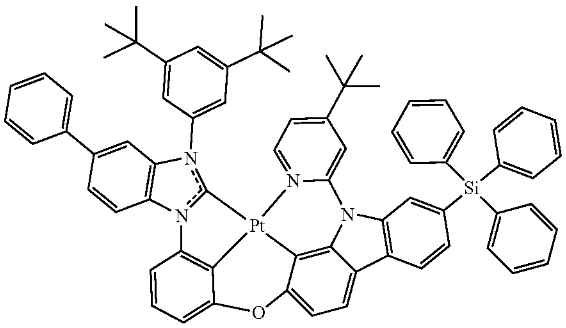
111
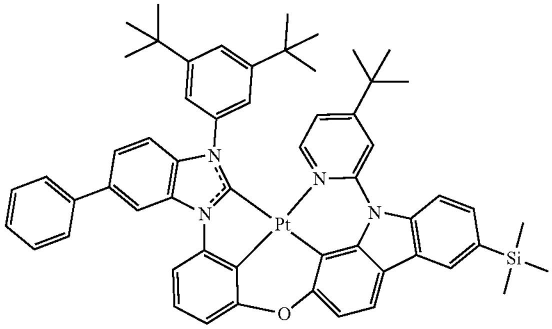
112
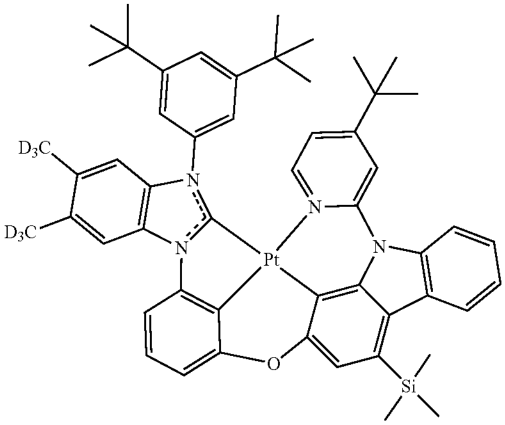
113
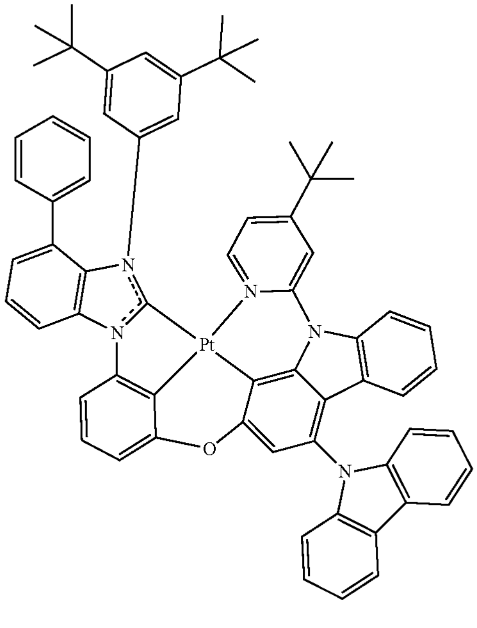
114
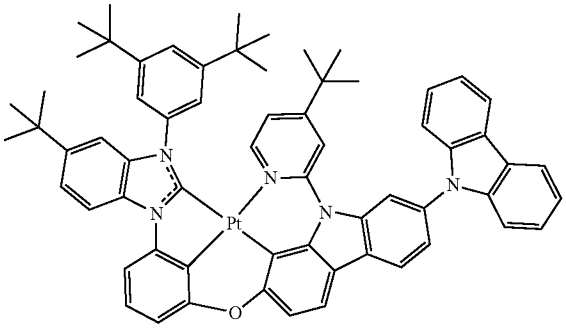

-continued
115
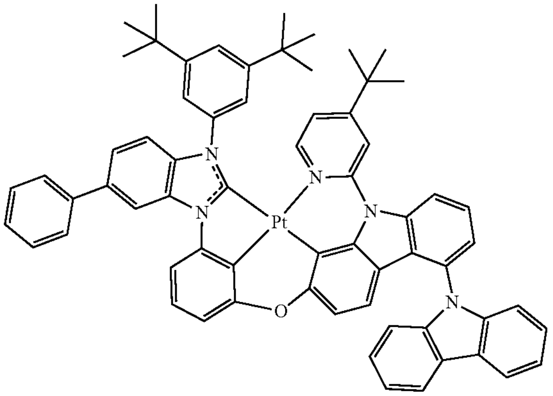
116
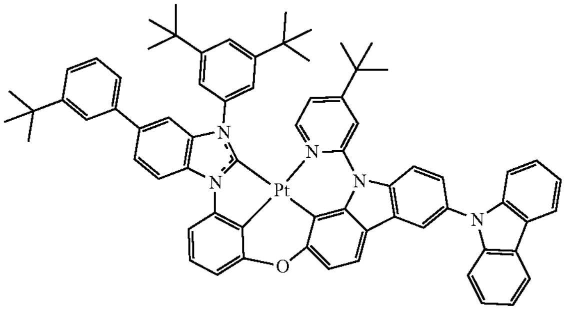
117
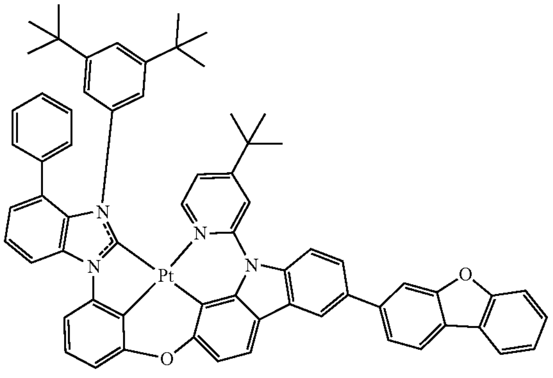
118
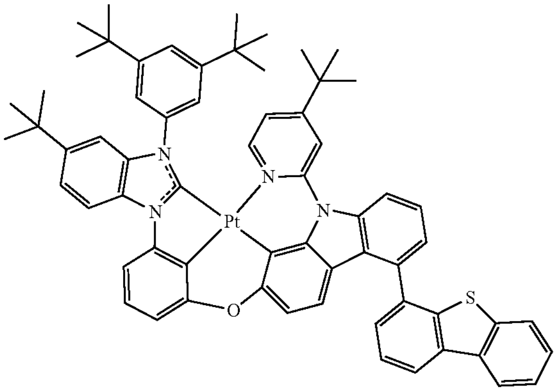
119
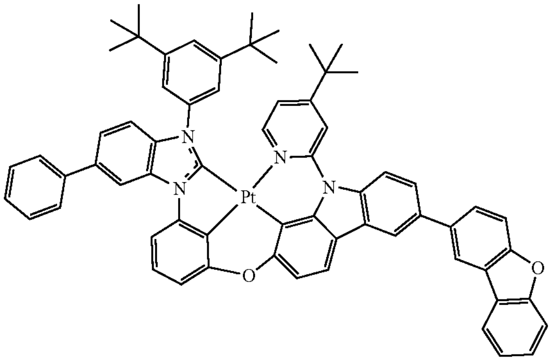
120
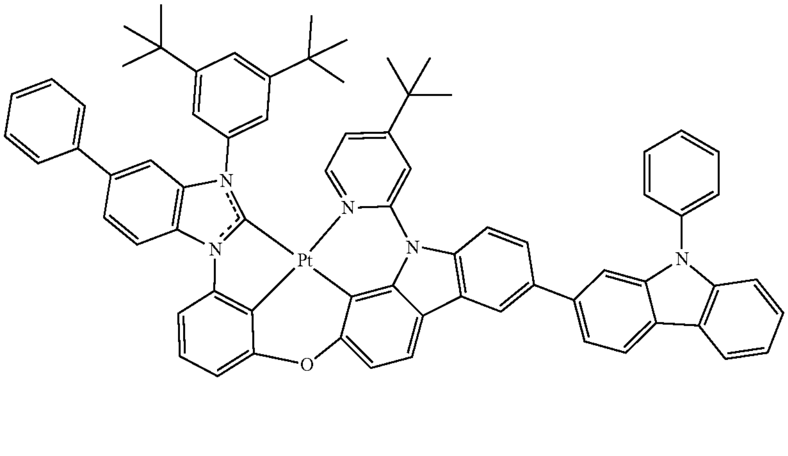

-continued
121
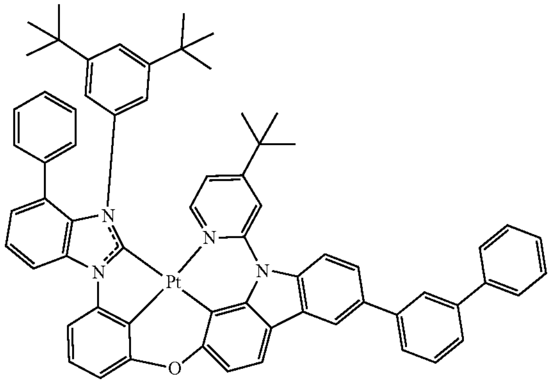
122
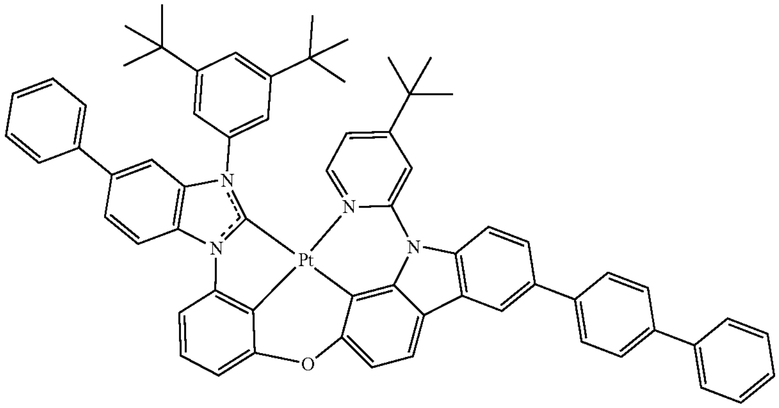
123
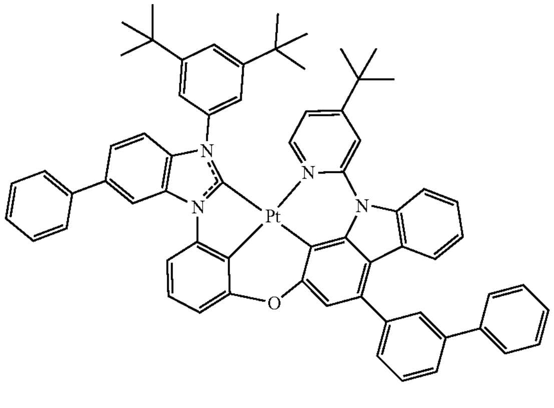
124
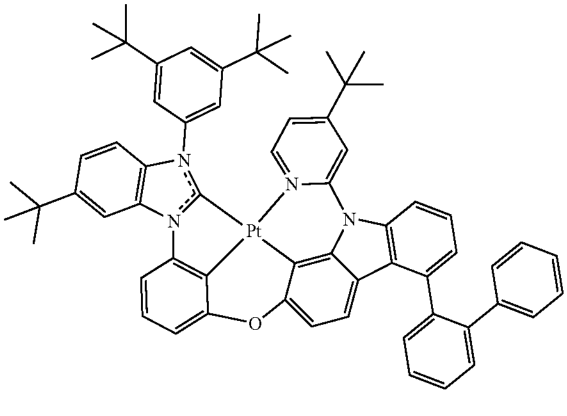

-continued
125
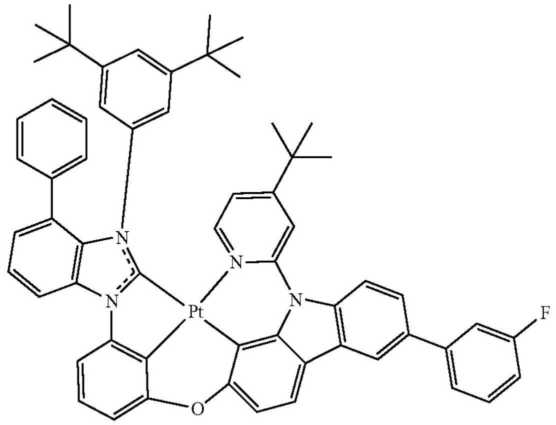
126
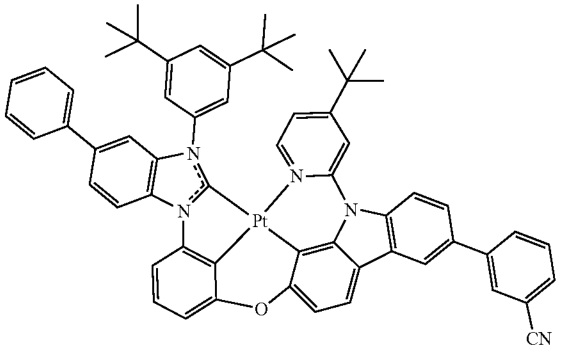
127
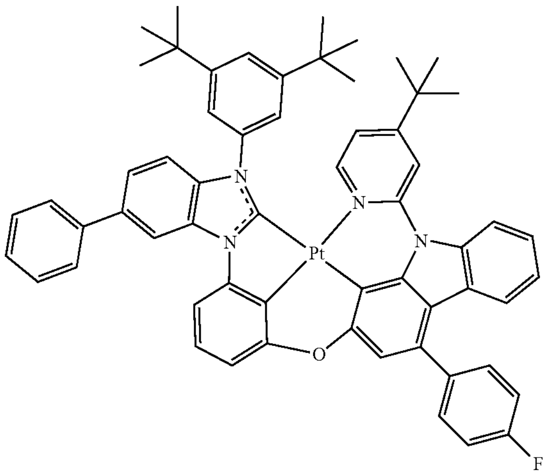
128
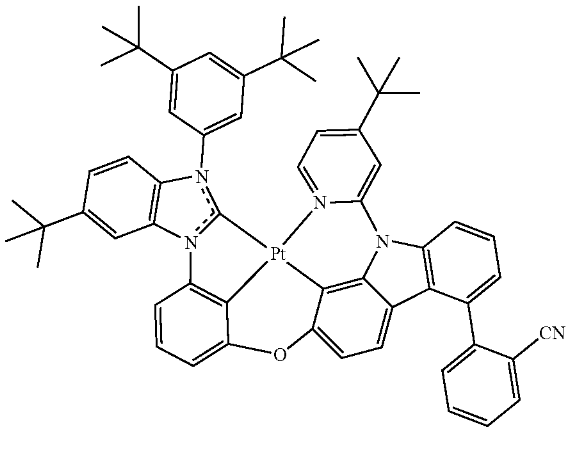
129
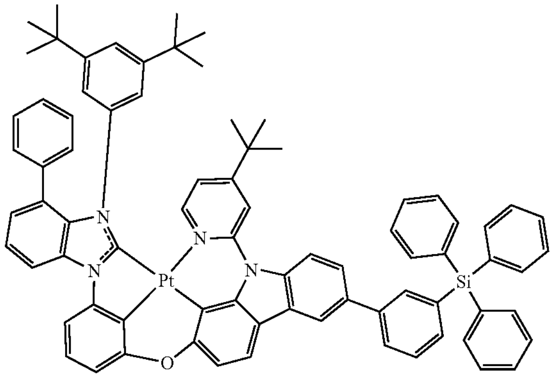
130
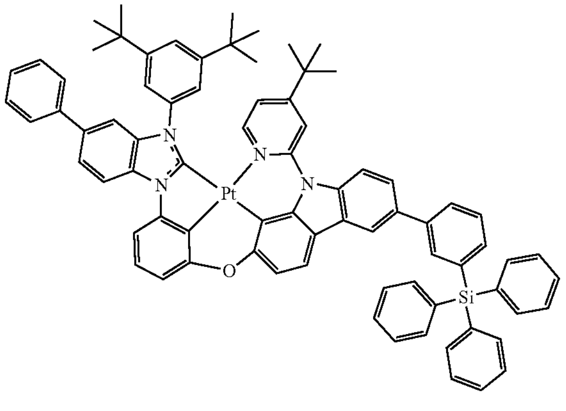

-continued
131
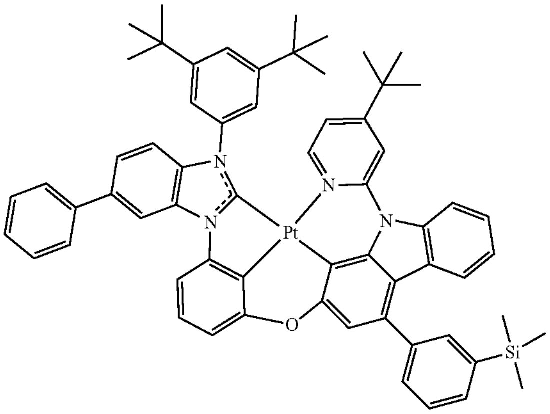
132
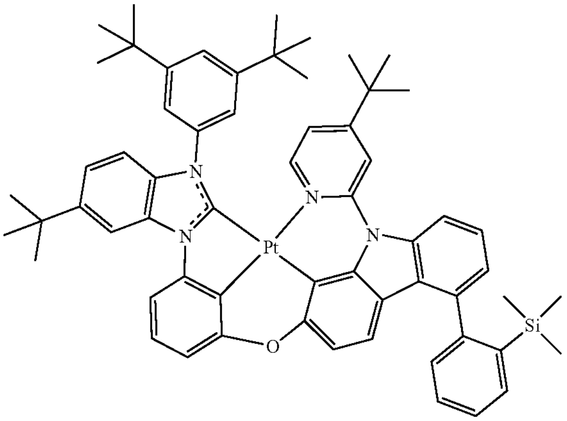
133
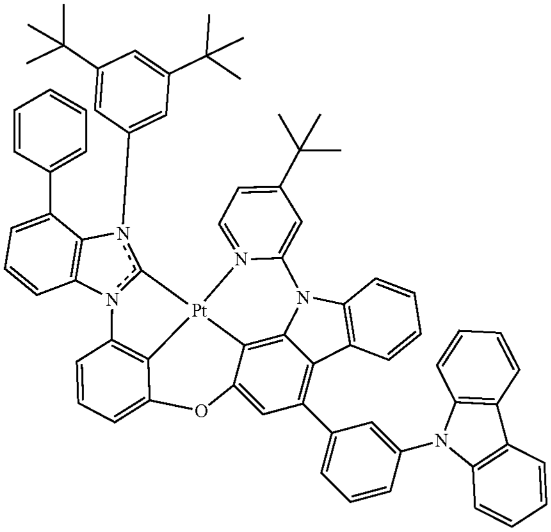
134
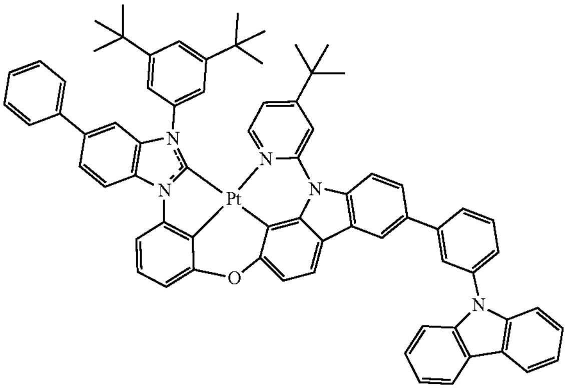
135
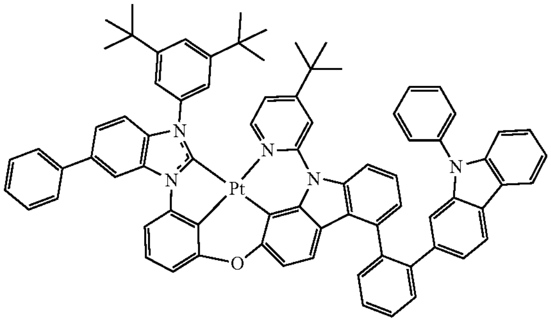

-continued
136
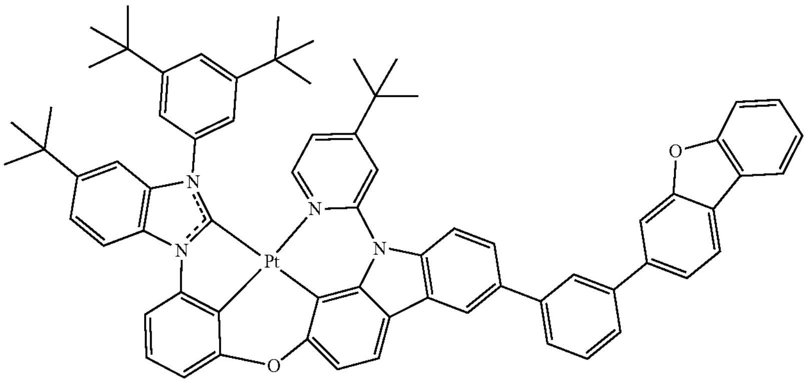
137
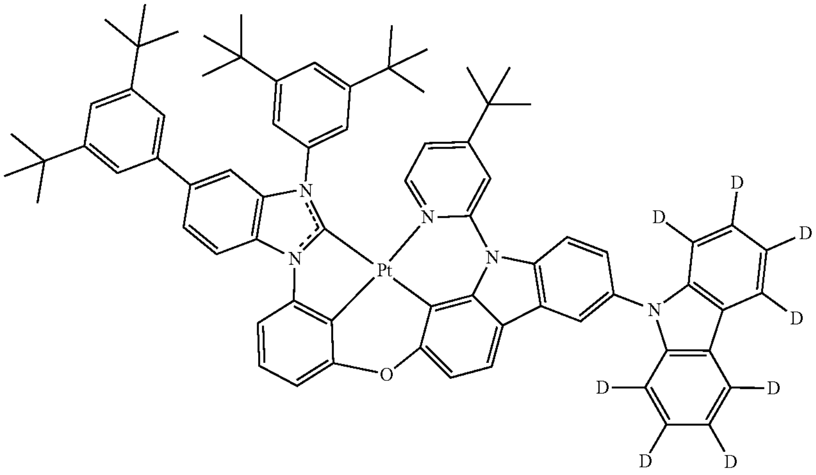
138
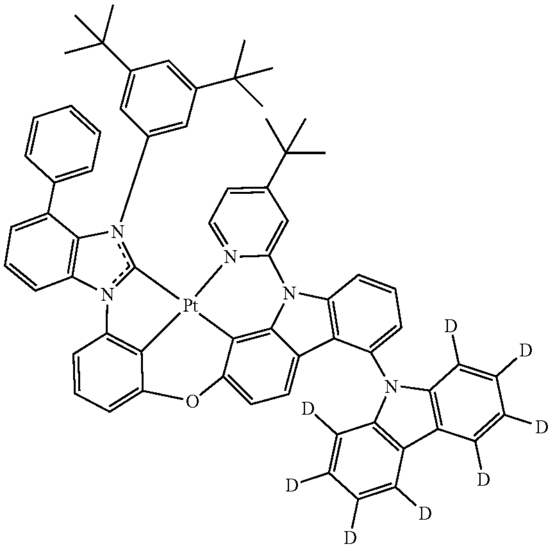
139
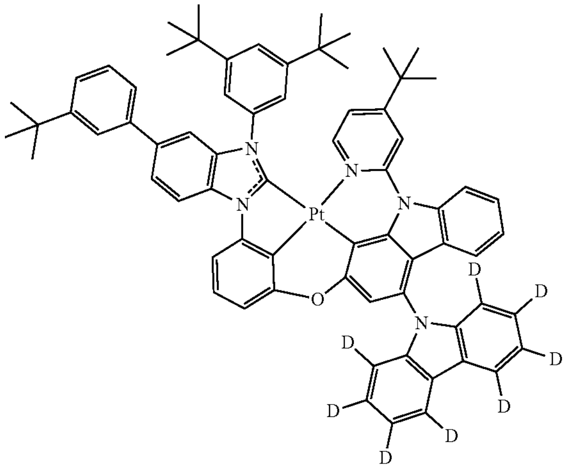

-continued
140
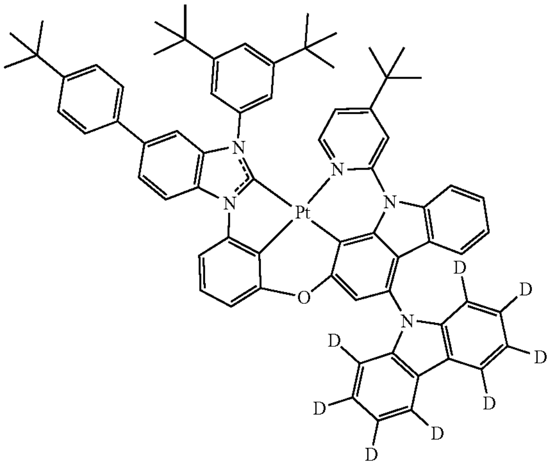
141
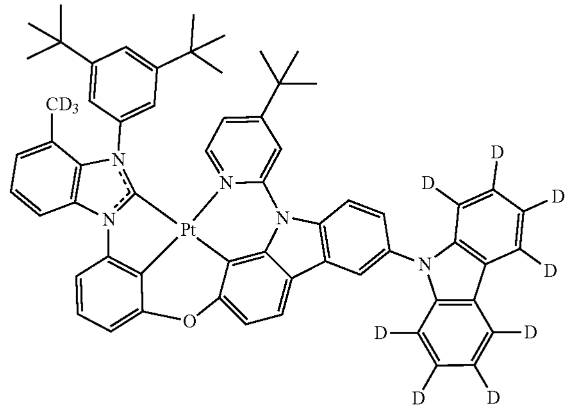
142
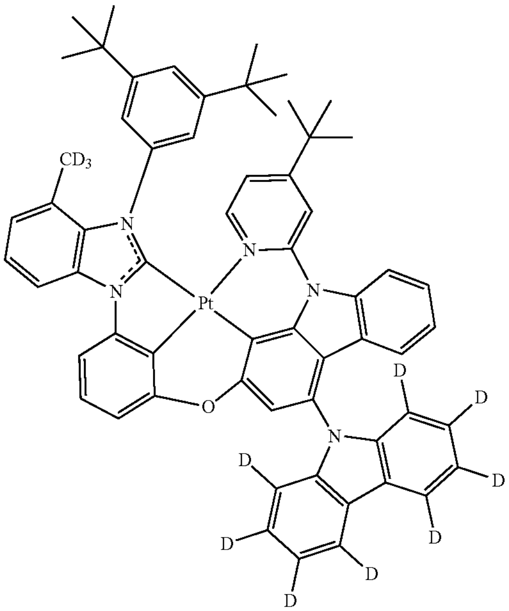
143
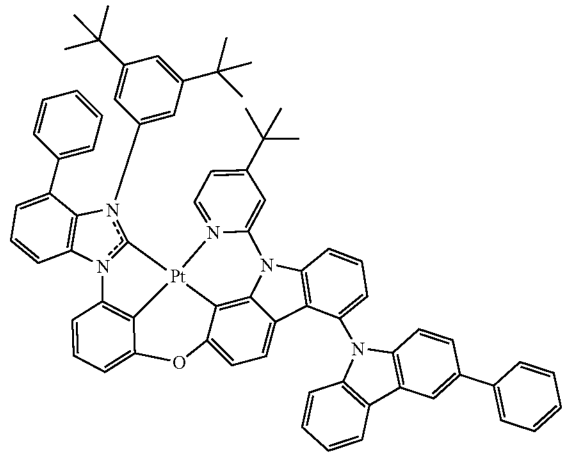
144
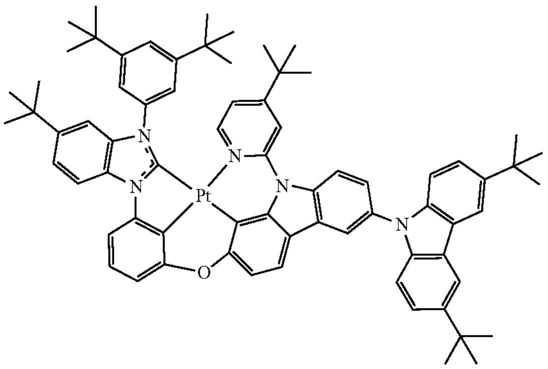
145
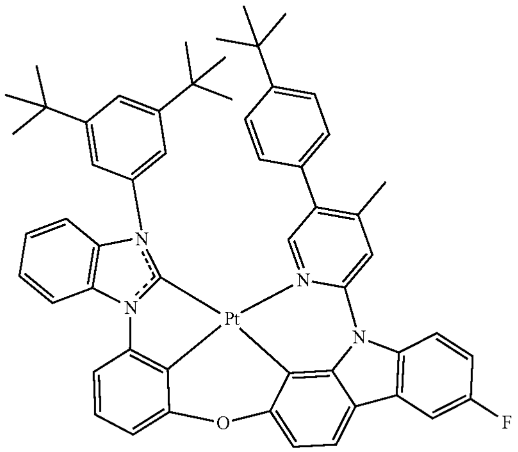

-continued
146
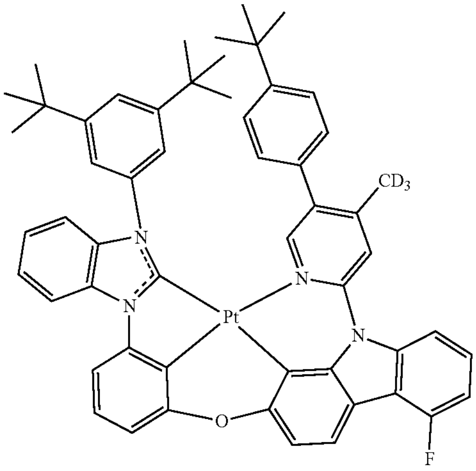
147
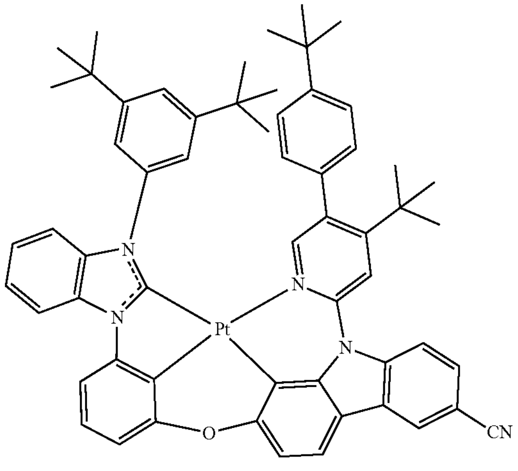
148
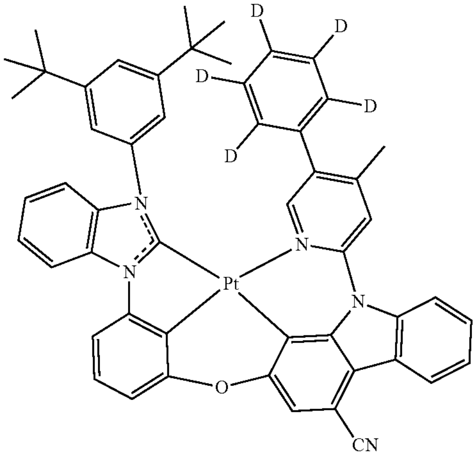
149
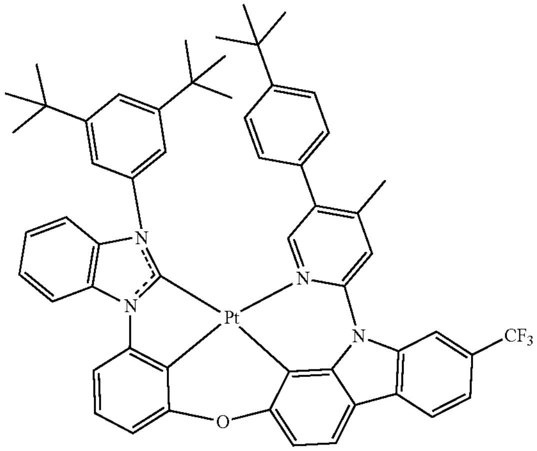
150
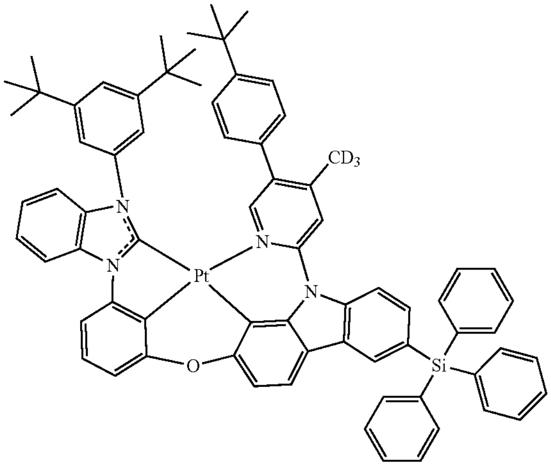
151
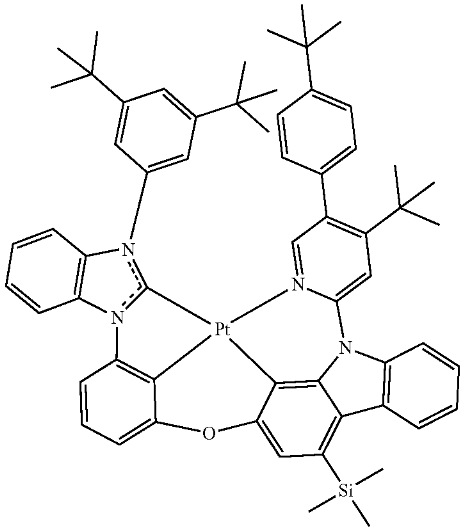

-continued
152
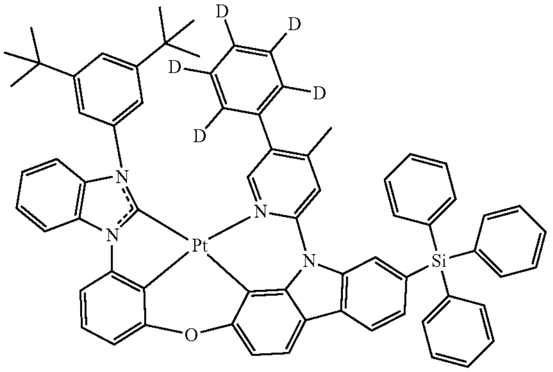
153
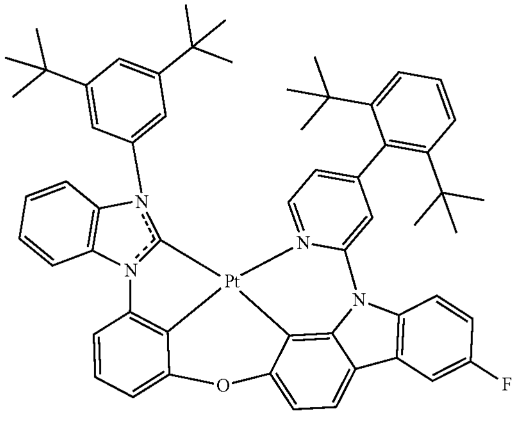
154
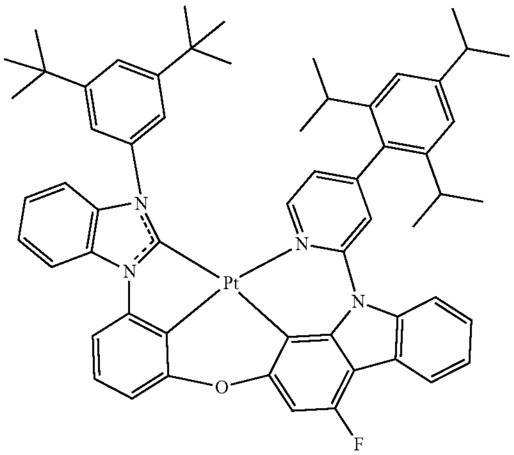
155
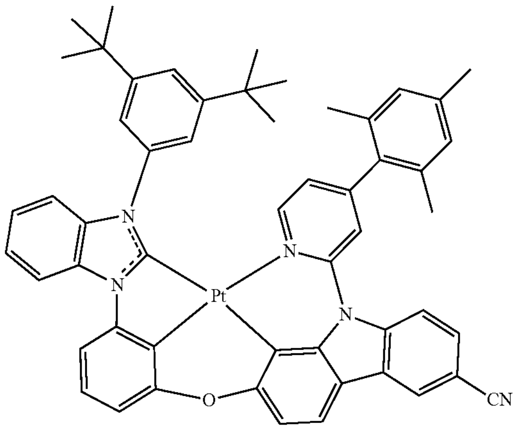
156
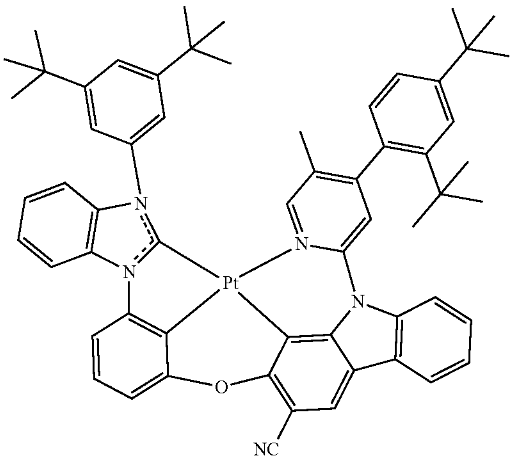
157
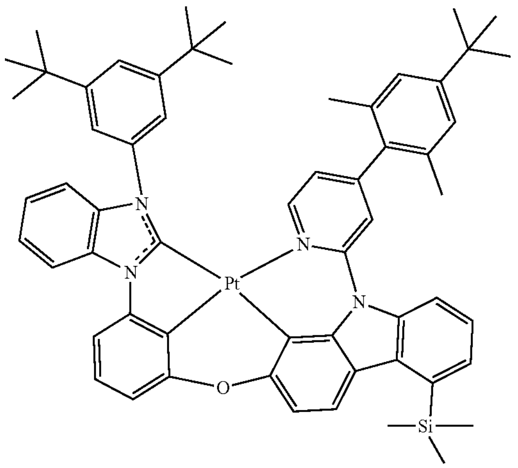

-continued
158
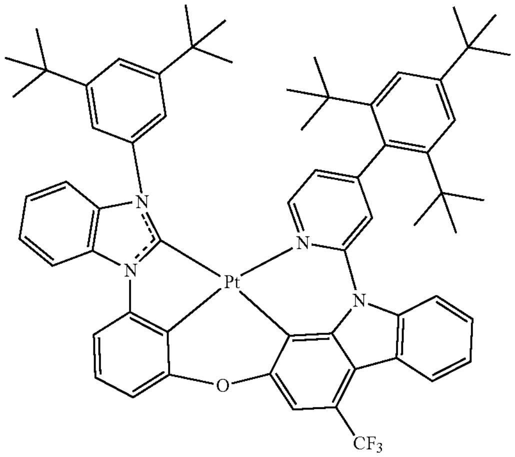
159
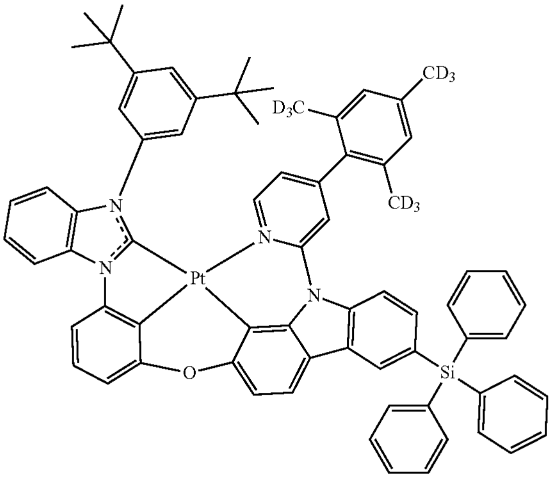
160
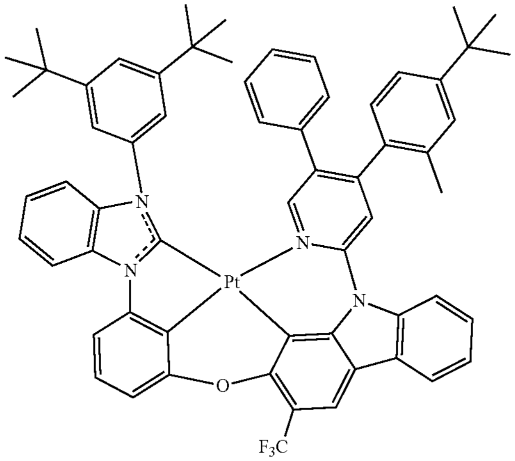
161
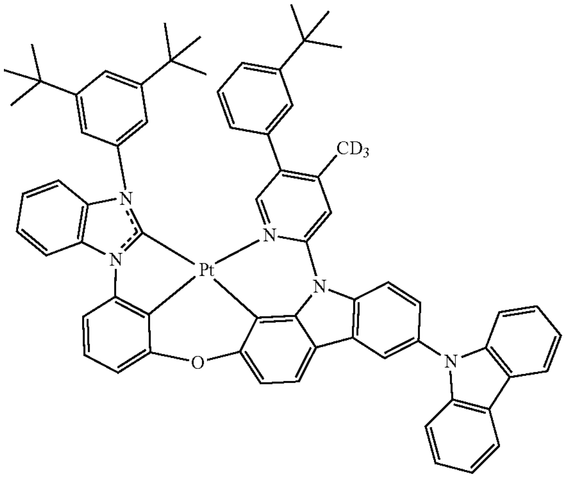
162
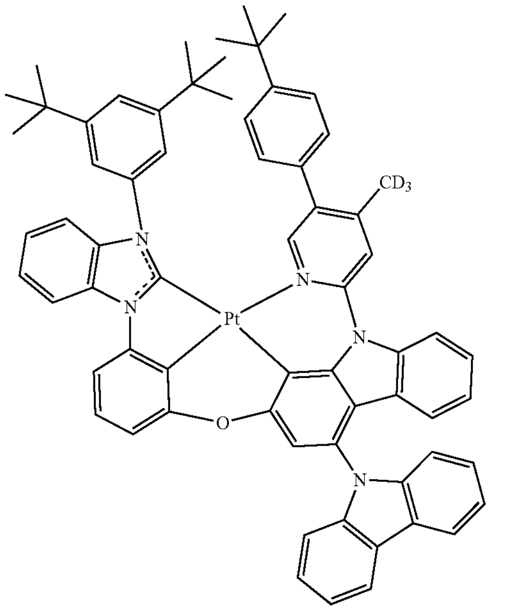
163
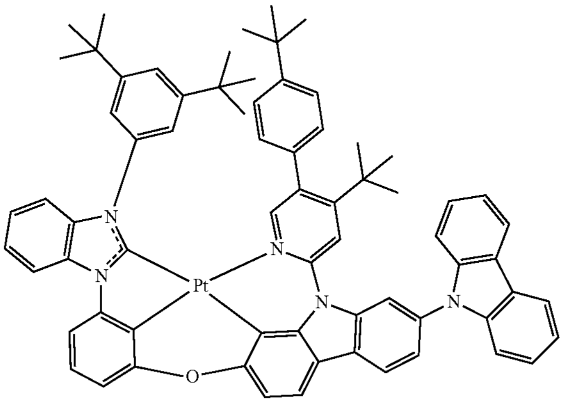

-continued
164
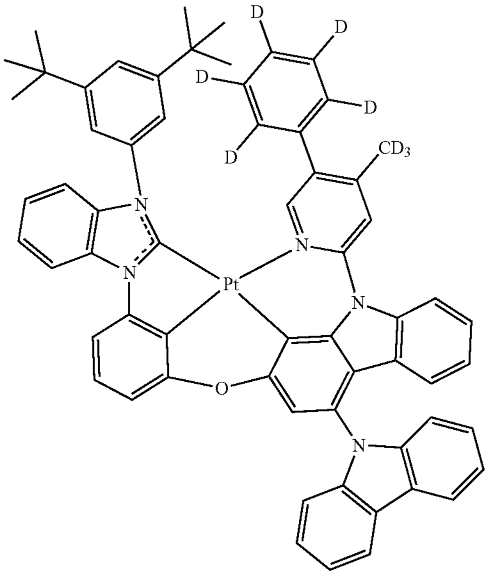
165
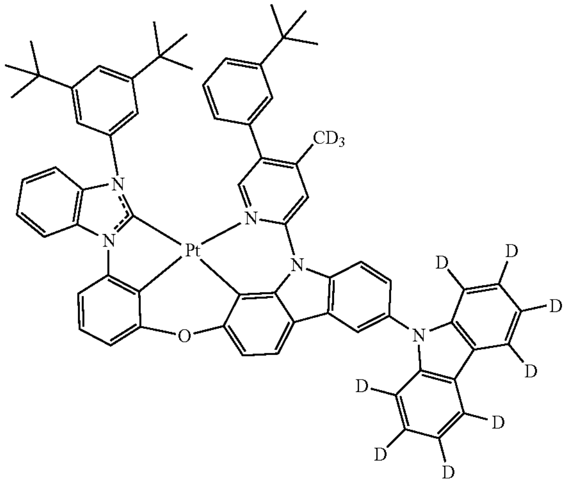
166
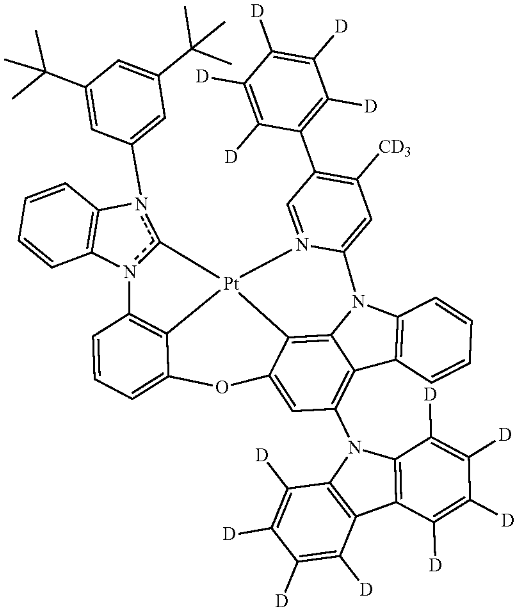
167
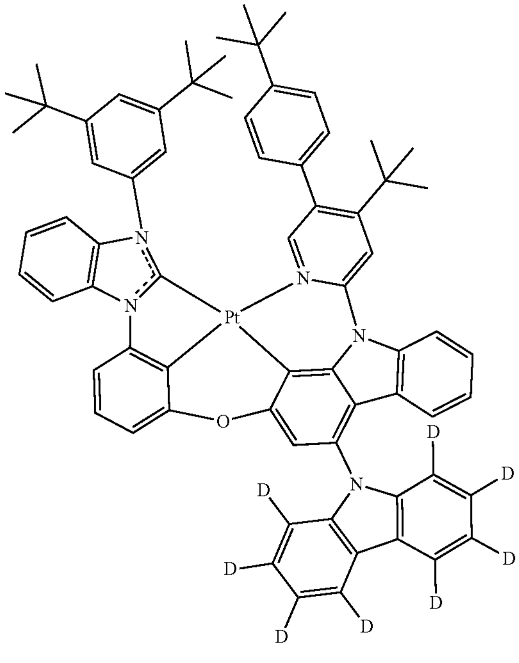

-continued
168
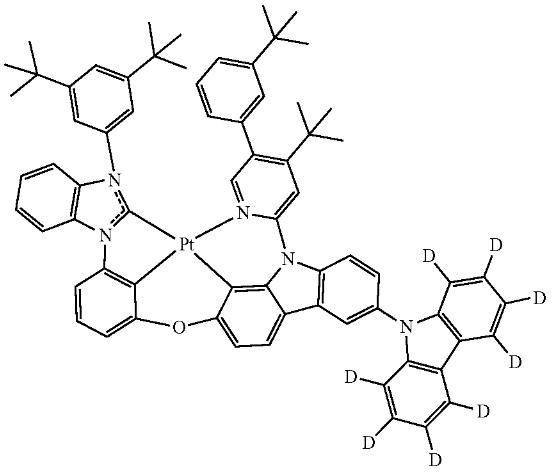
169
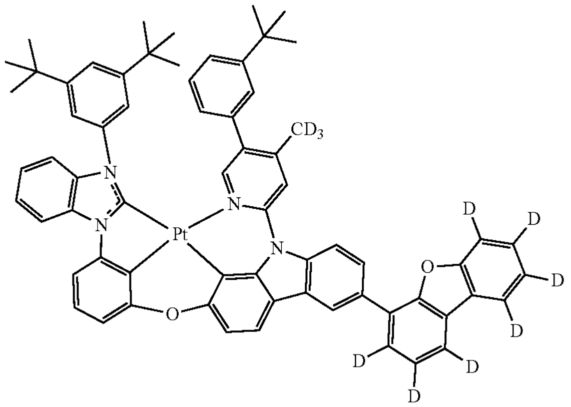
170
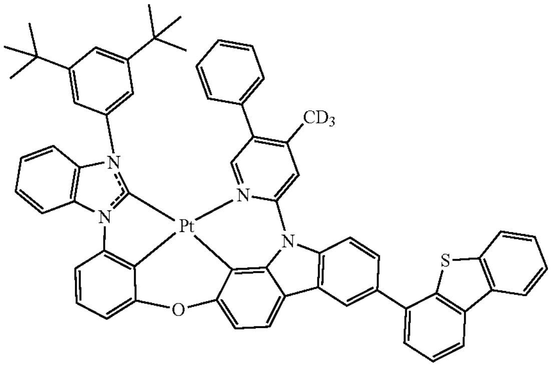
171
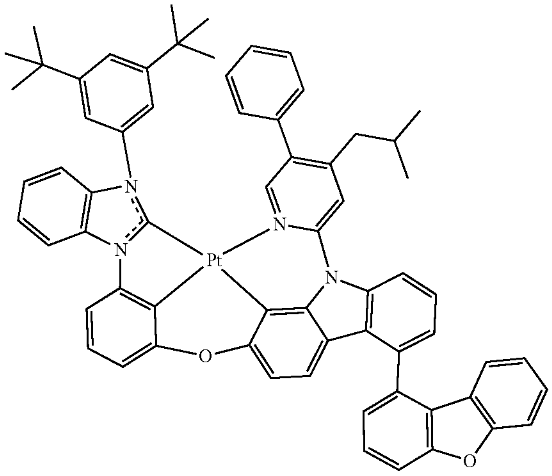
172
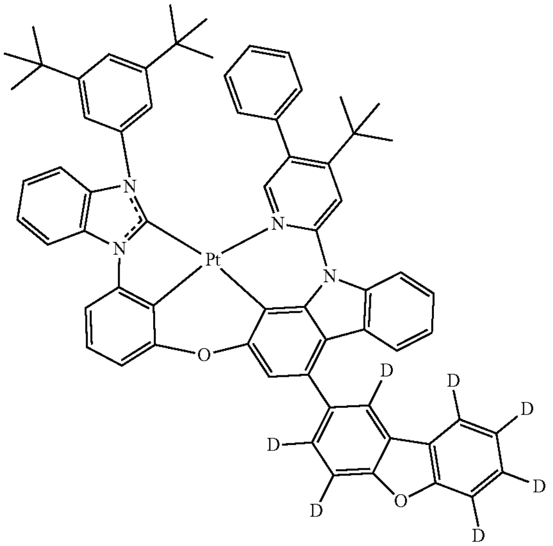
173
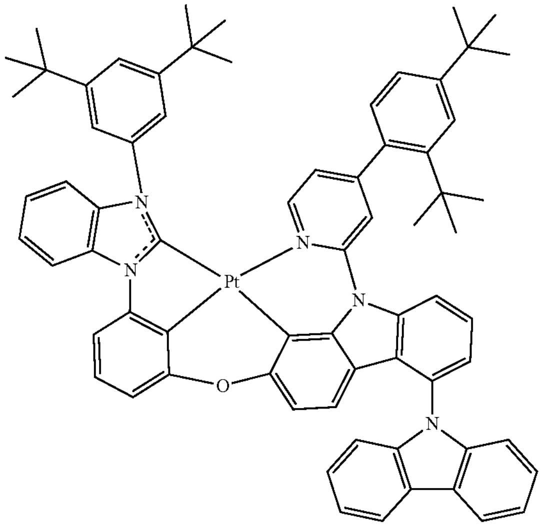

-continued
174
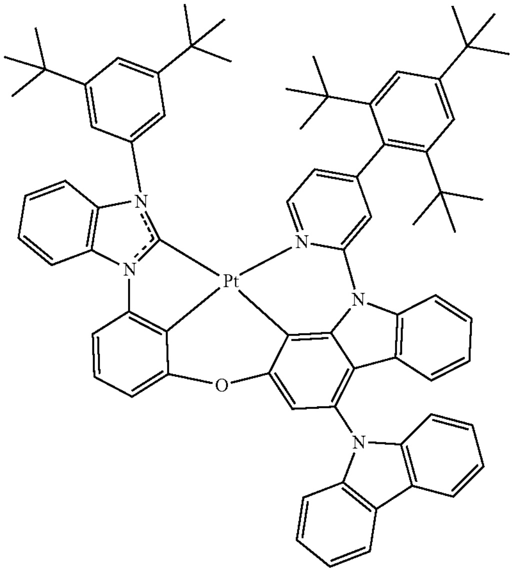
175
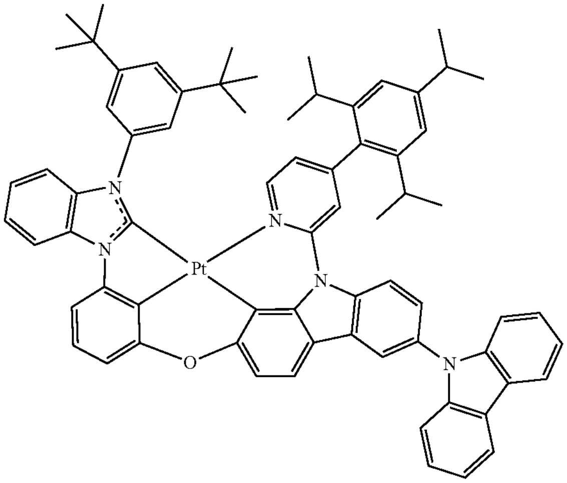
176
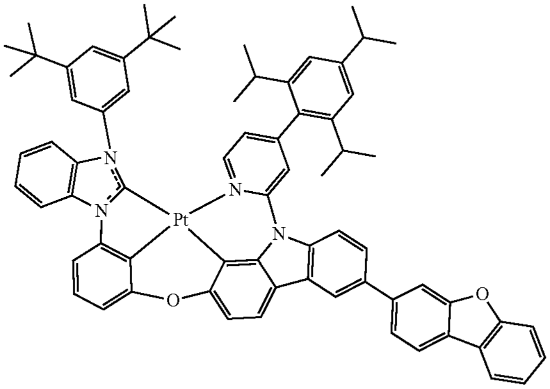
177
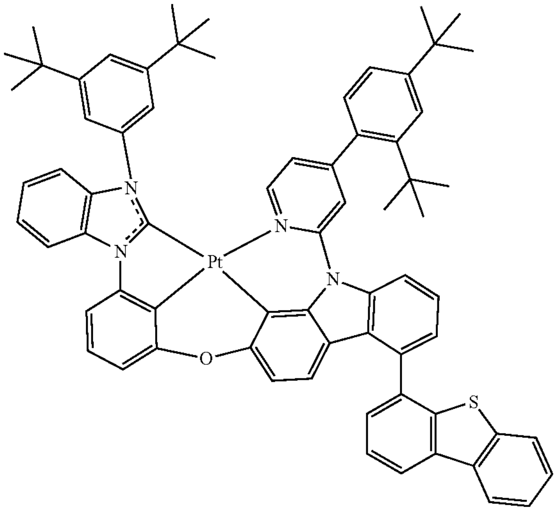

-continued
178
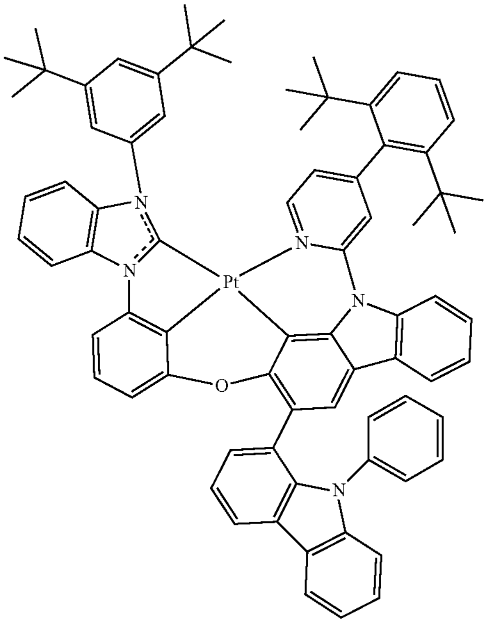
179
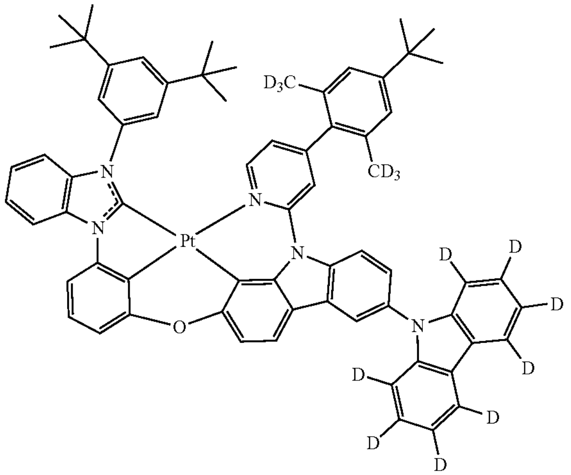
180
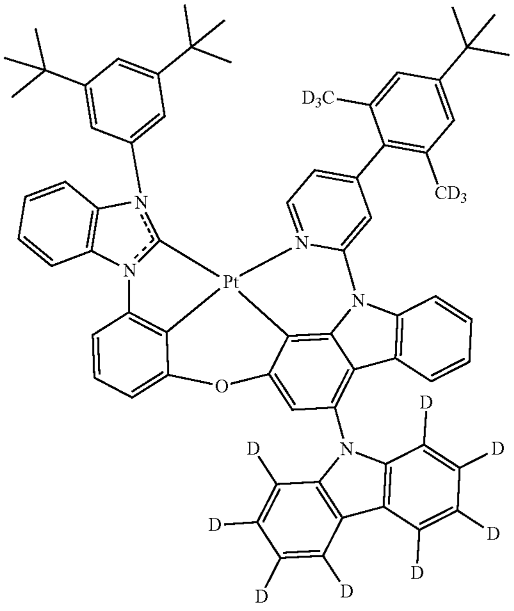
181
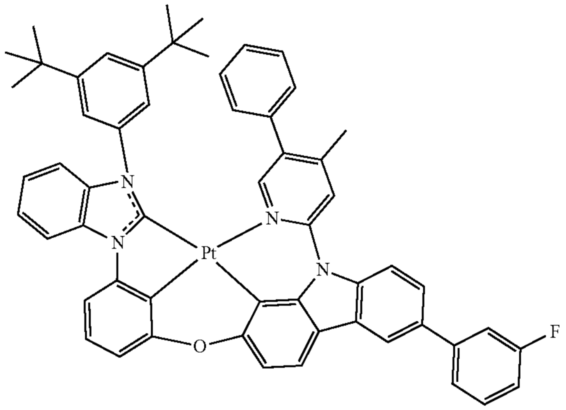

-continued
182
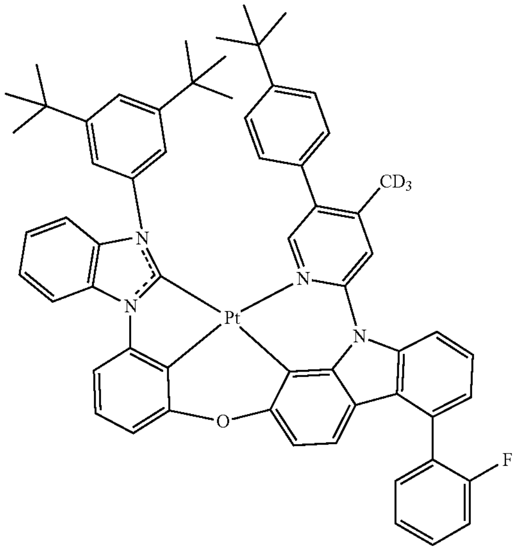
183
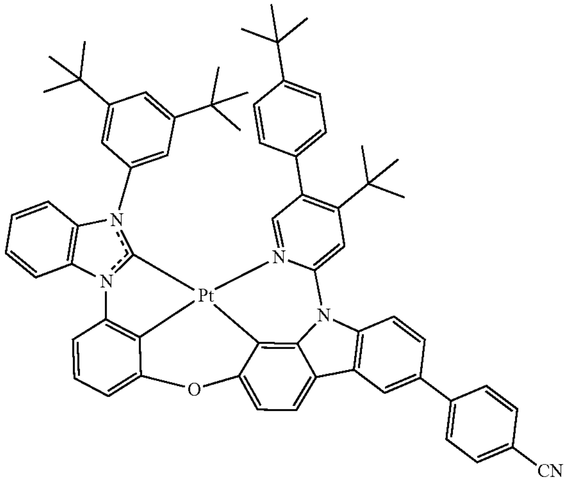
184
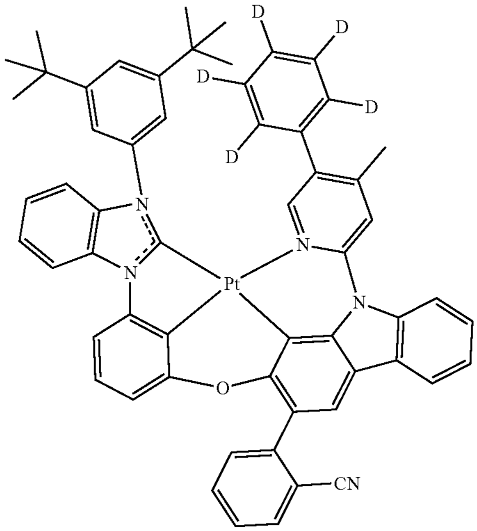
185
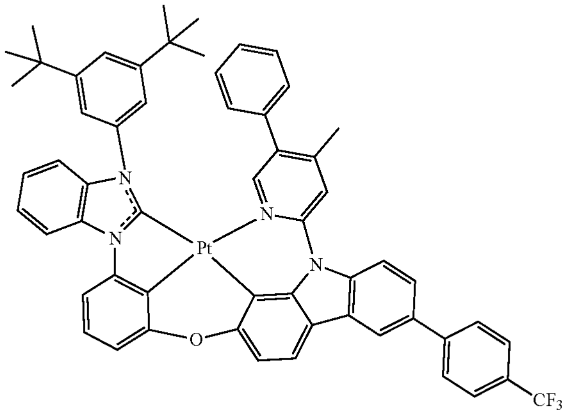
186
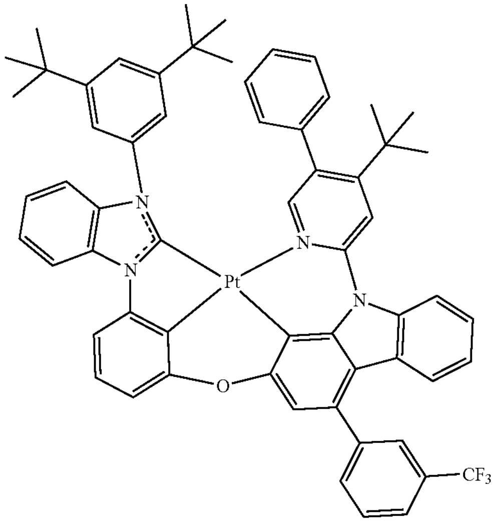
187
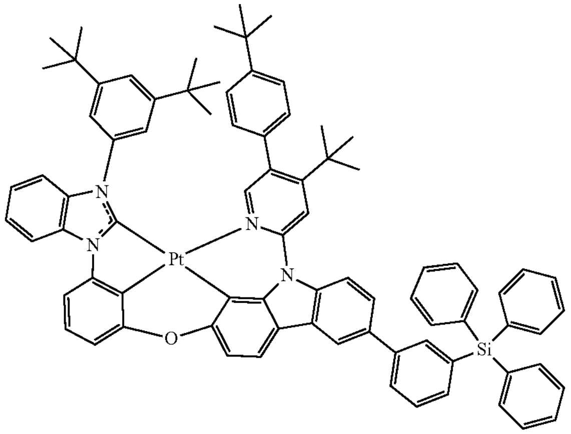

-continued
188
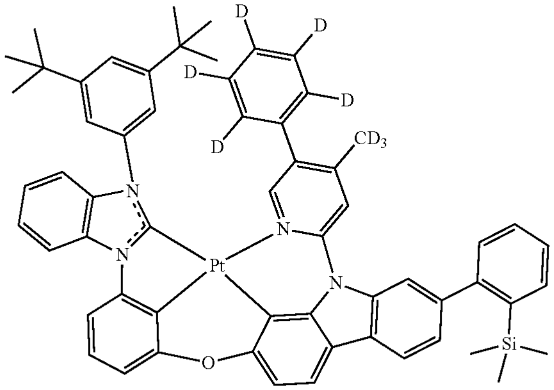
189
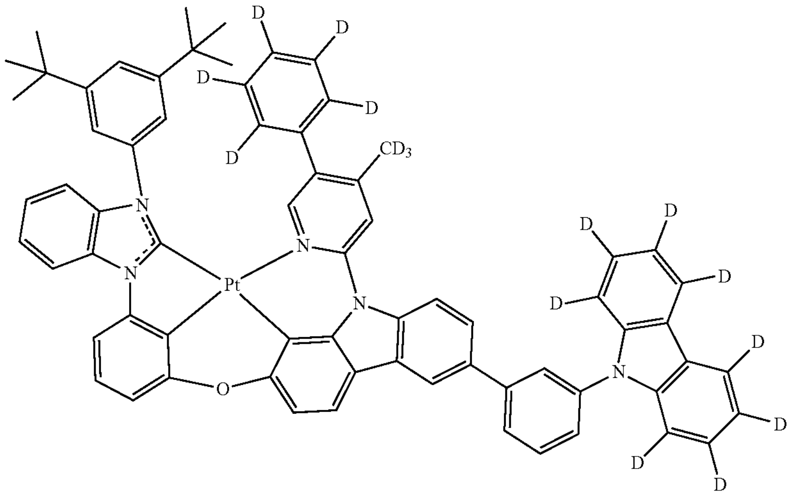
190
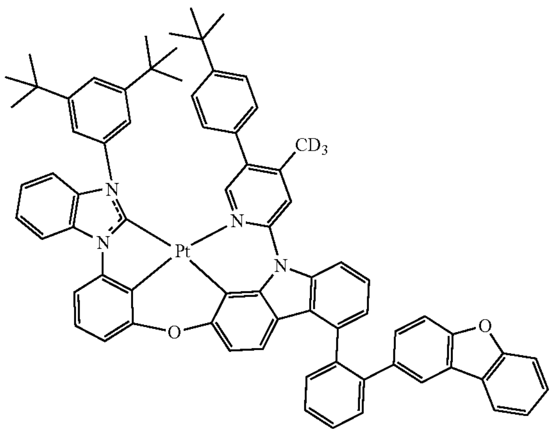
191
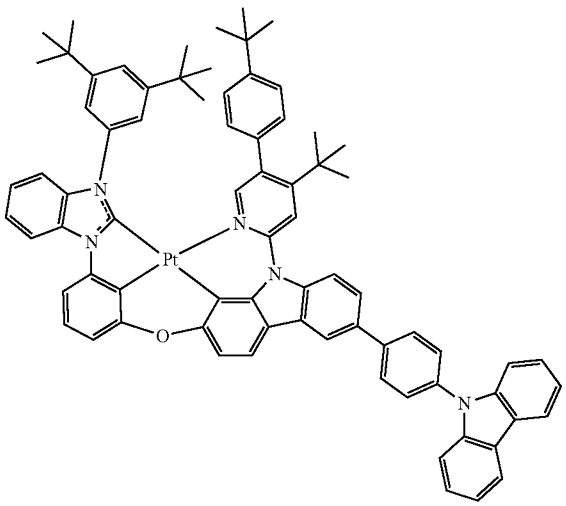

-continued
192
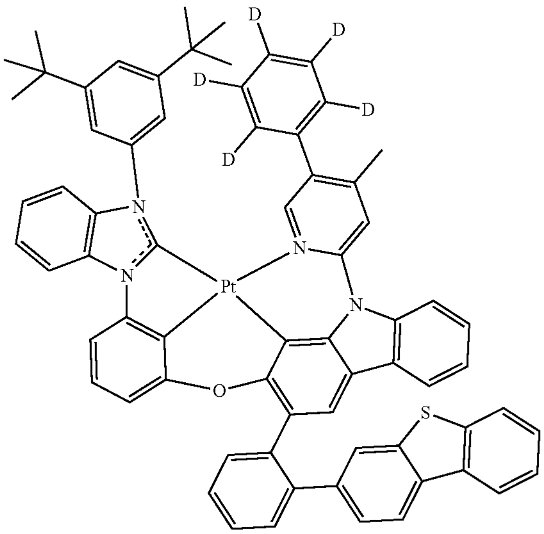
193
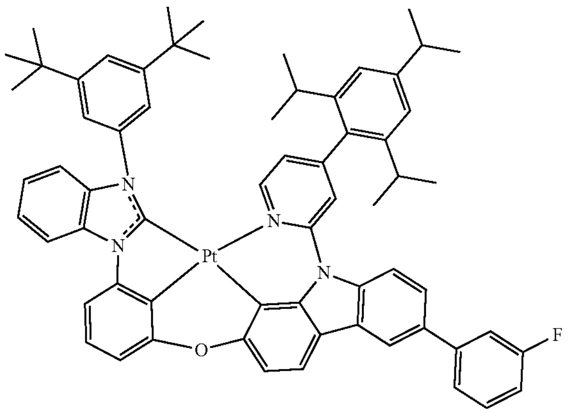
194
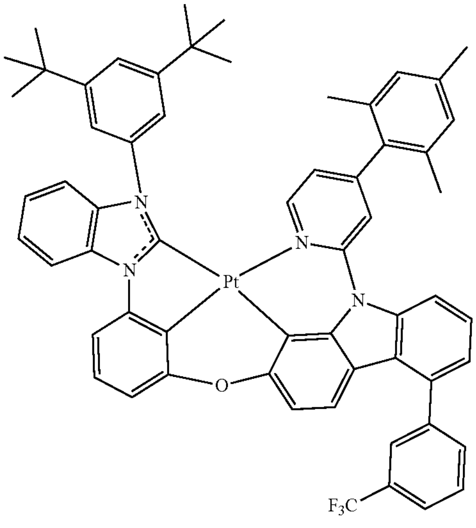
195
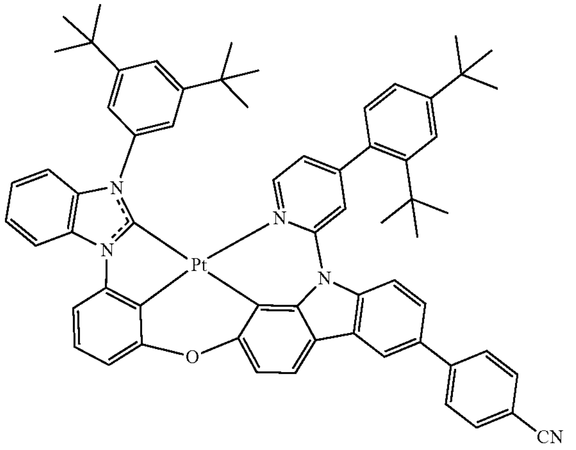
196
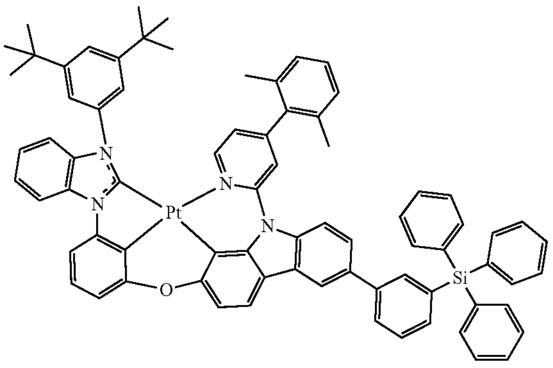
197
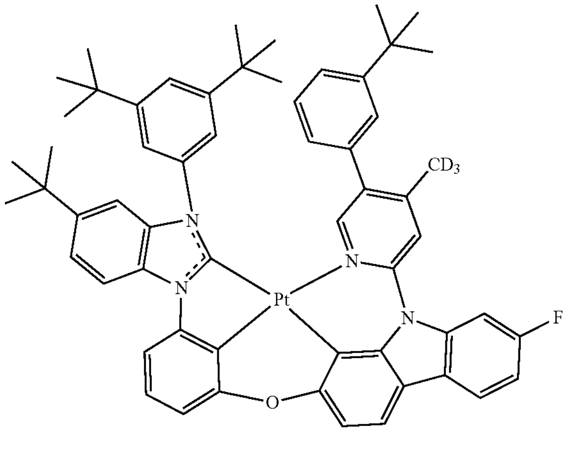

-continued
198
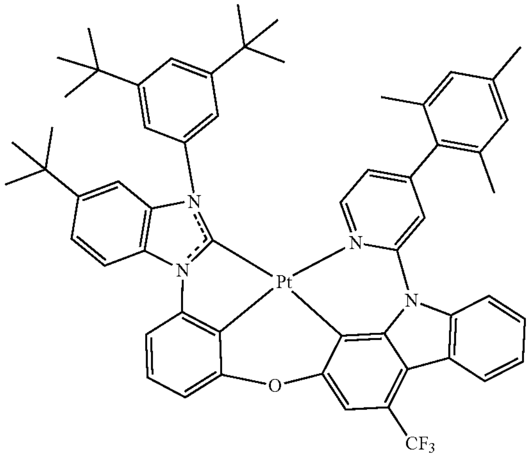
199
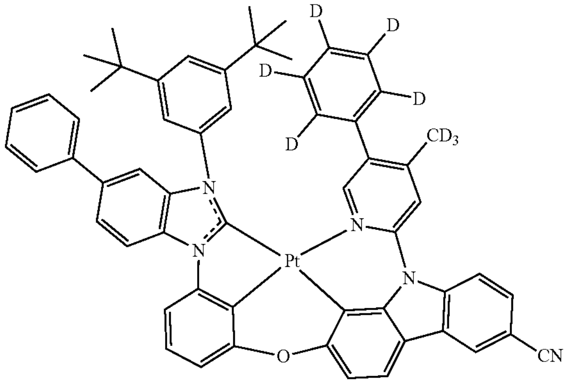
200
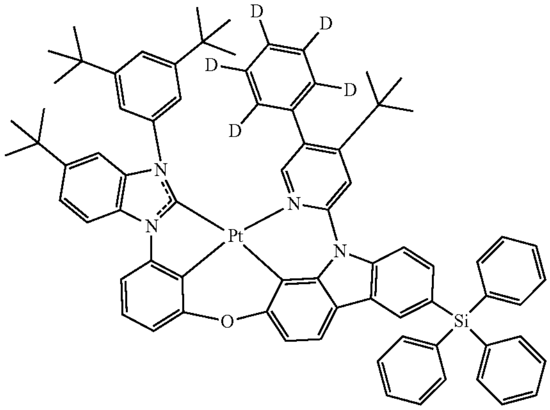
201
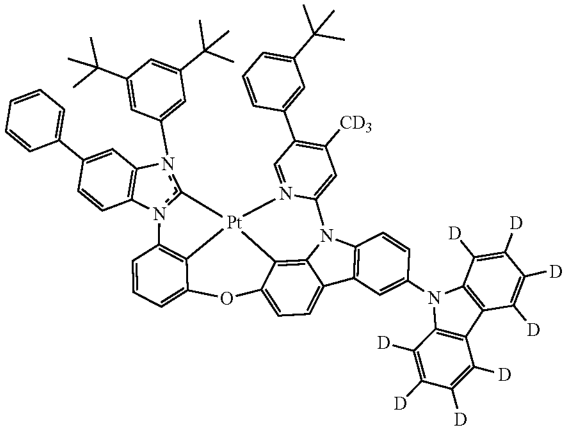
202
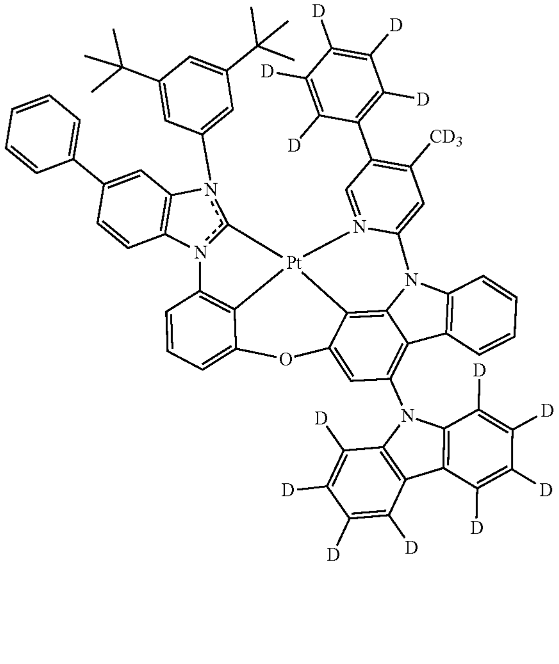
203
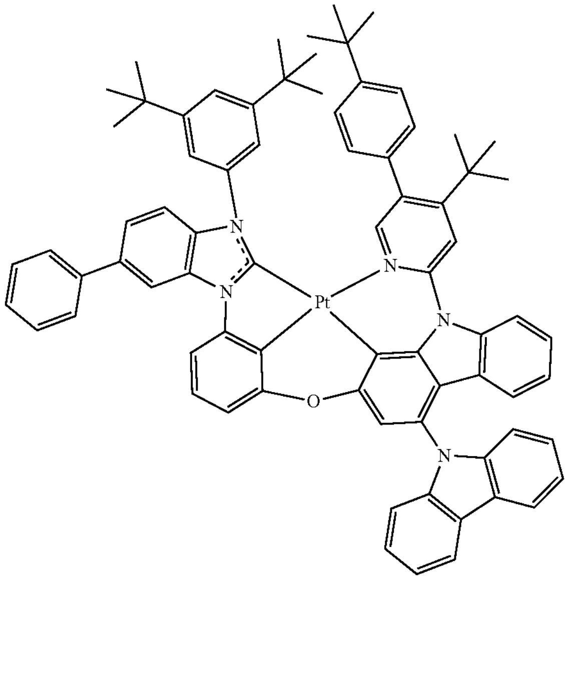

-continued
204
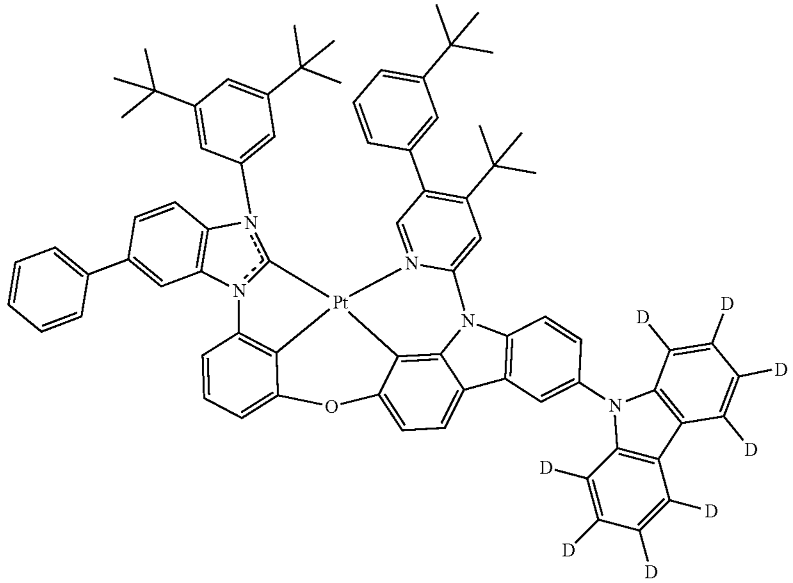
205
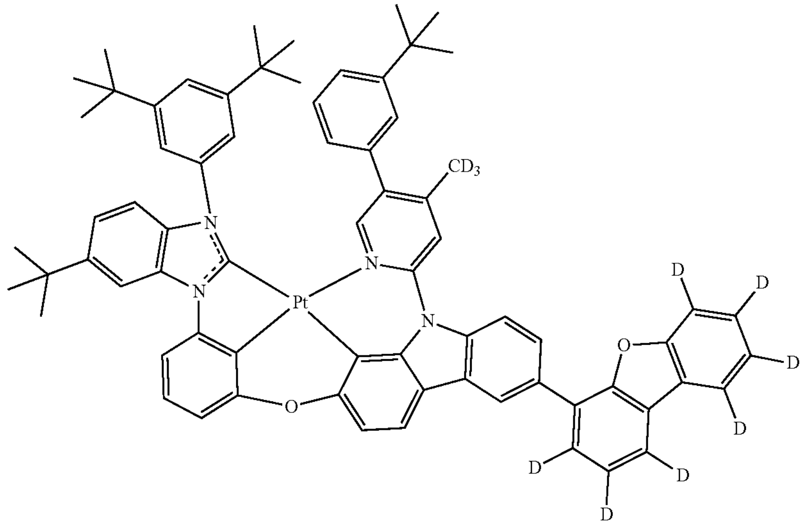
206
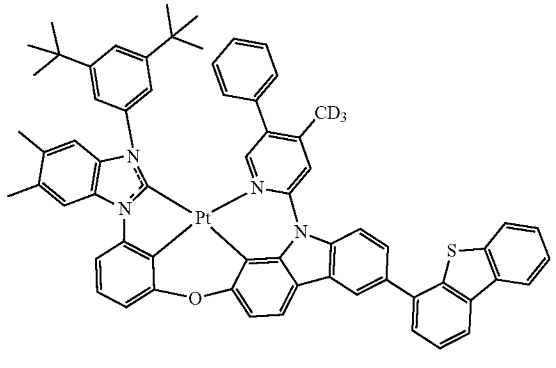

-continued
207
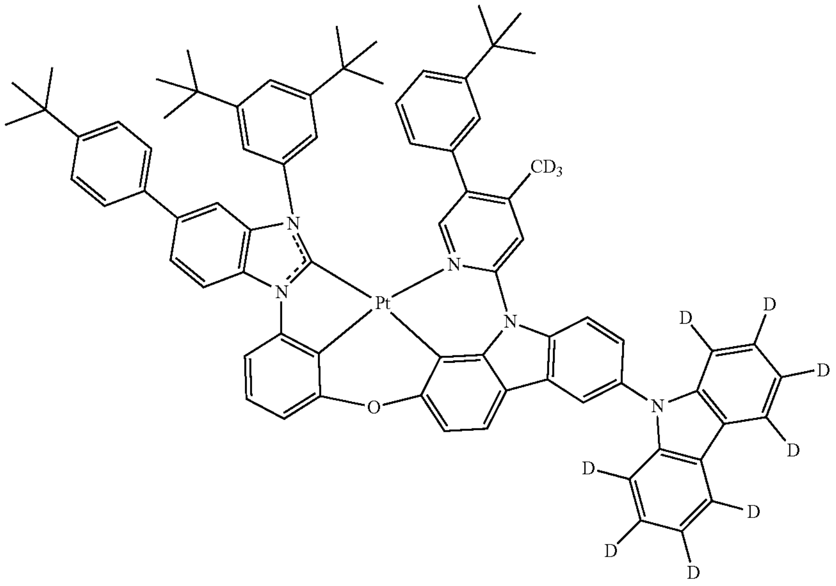
208
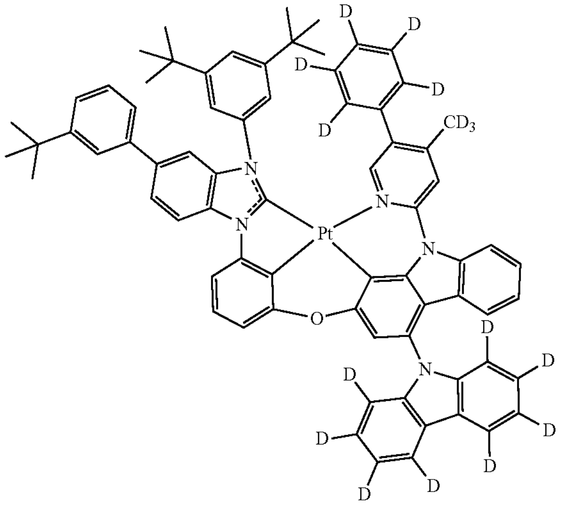
209
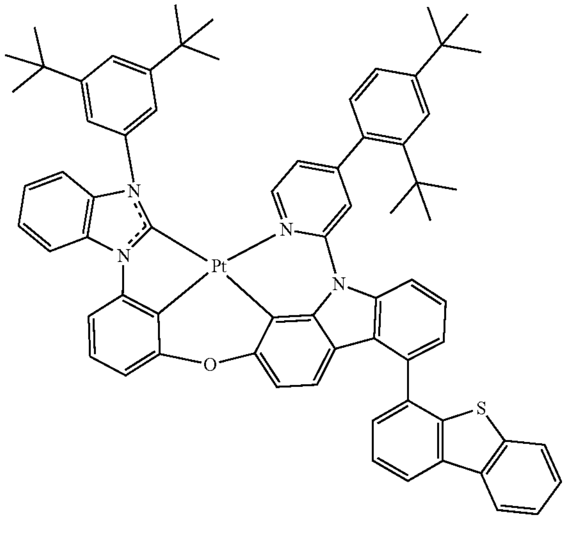

-continued
210
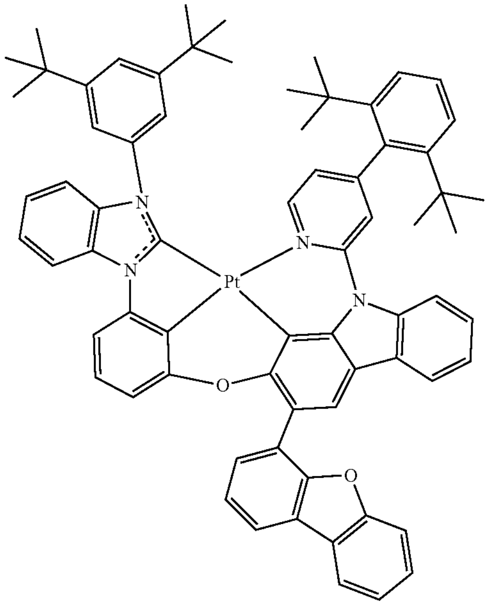
211
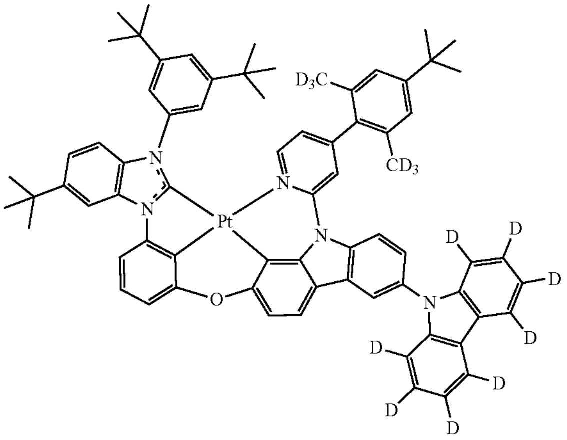
212
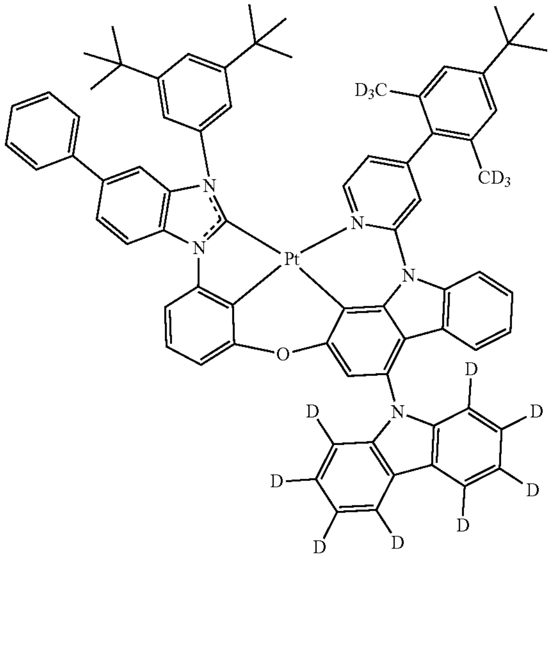
213
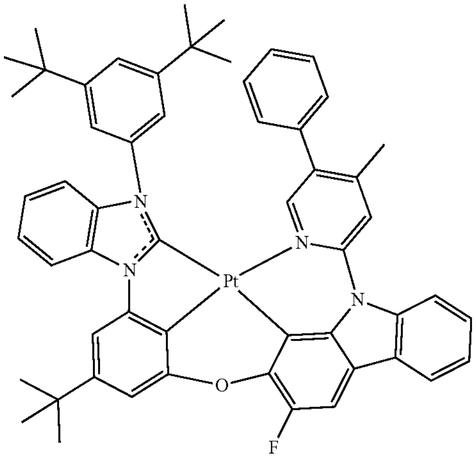

-continued
214
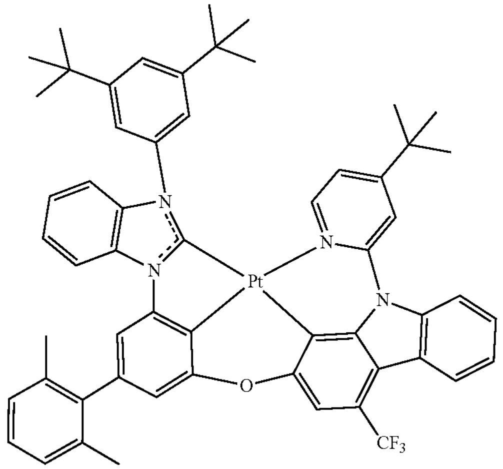
215
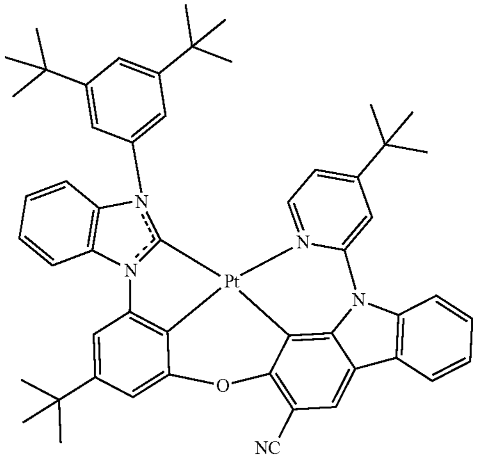
216
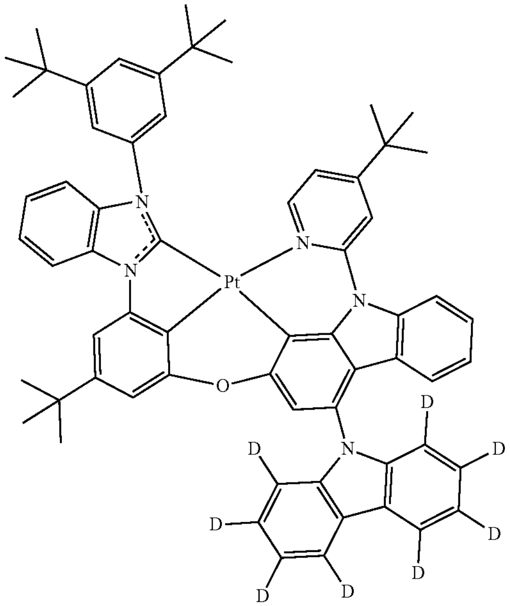
217
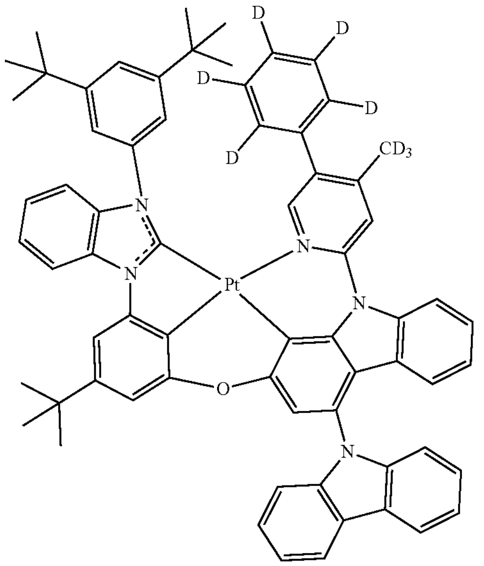
218
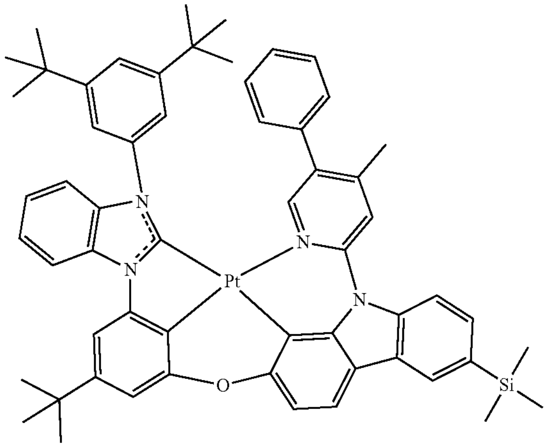
219
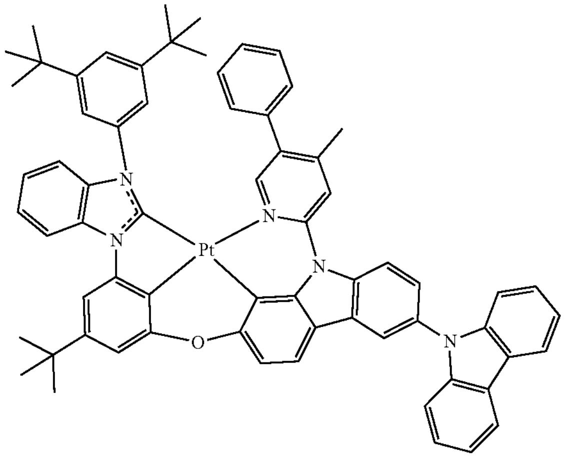

-continued
220
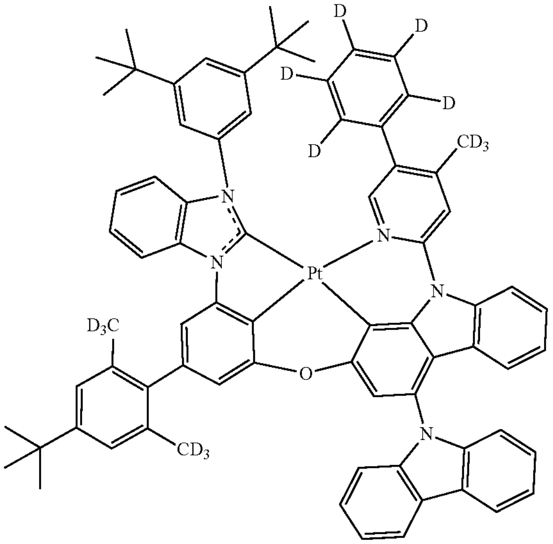
221
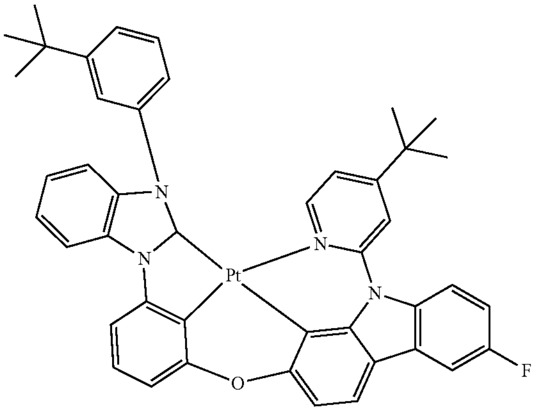
222
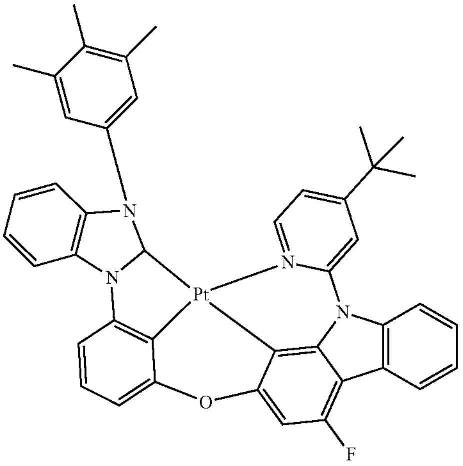
223
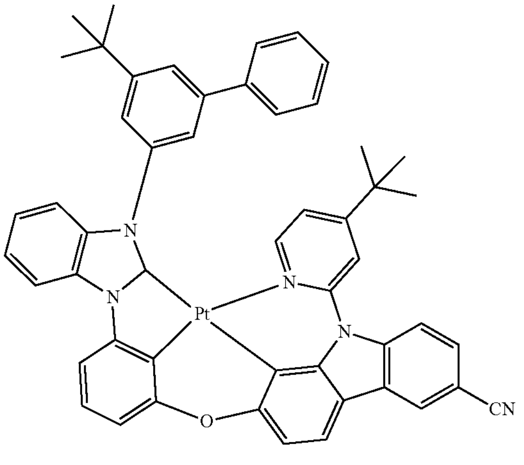
224
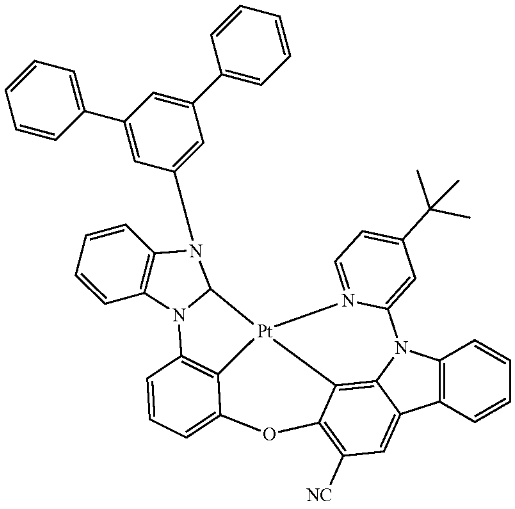

-continued
225
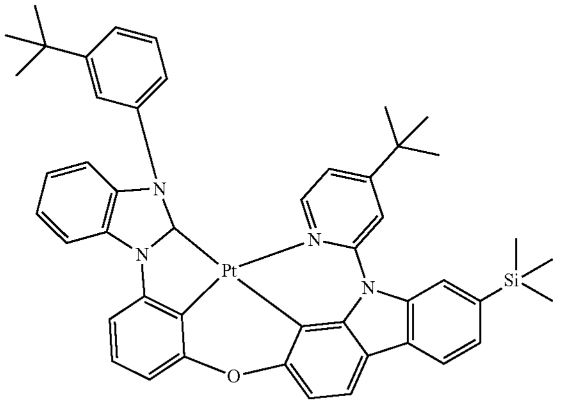
226
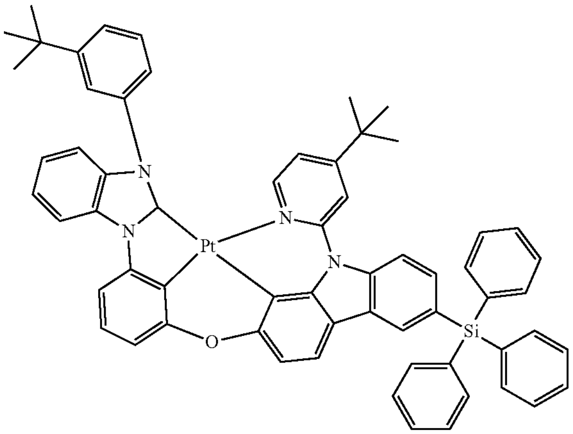
227
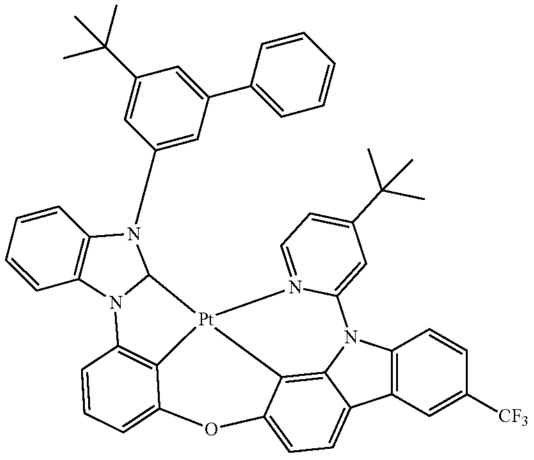
228
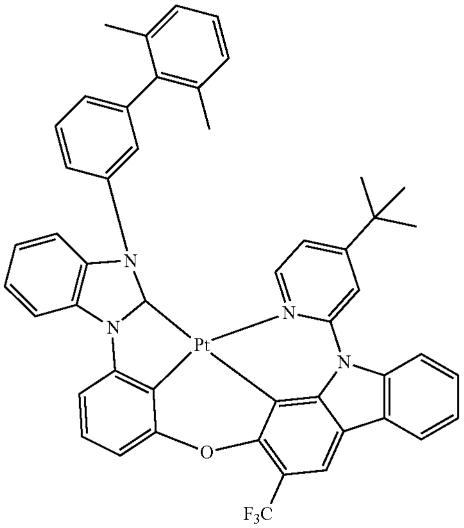
229
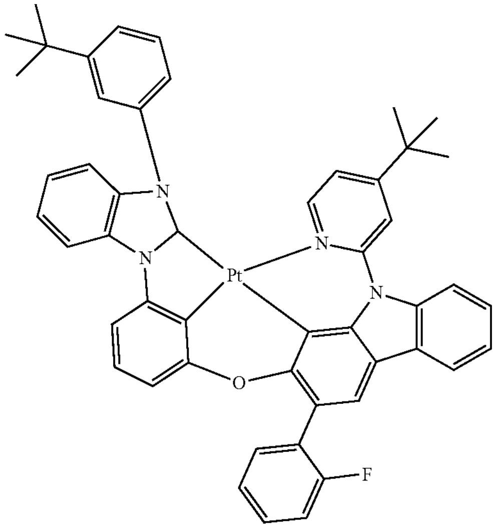
230
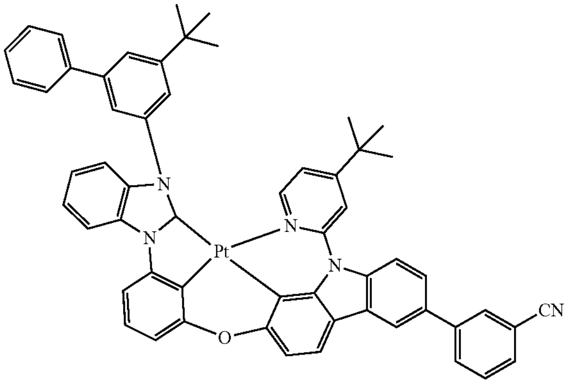

-continued
231
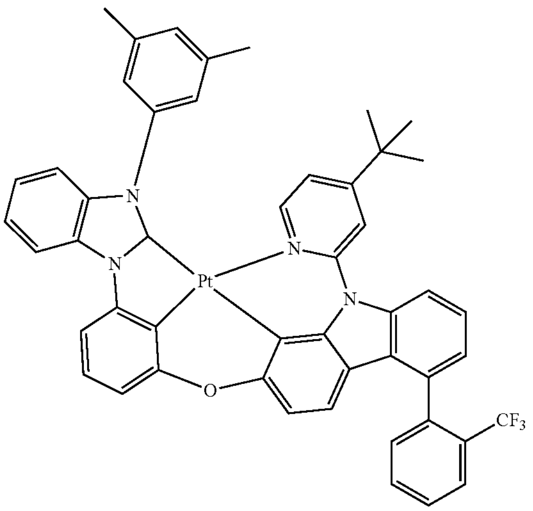
232
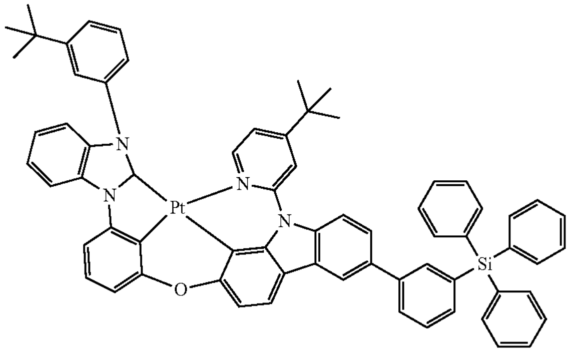
233
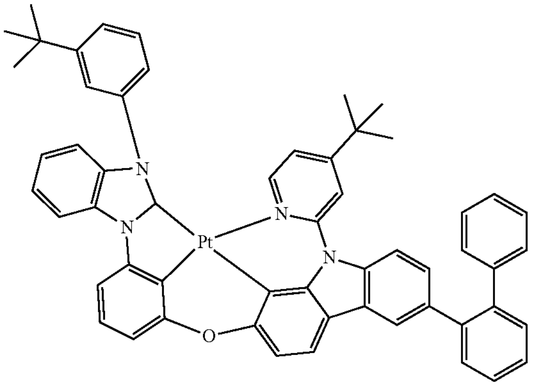
234
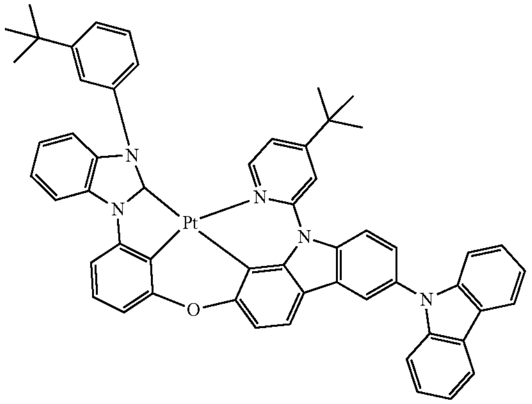
235
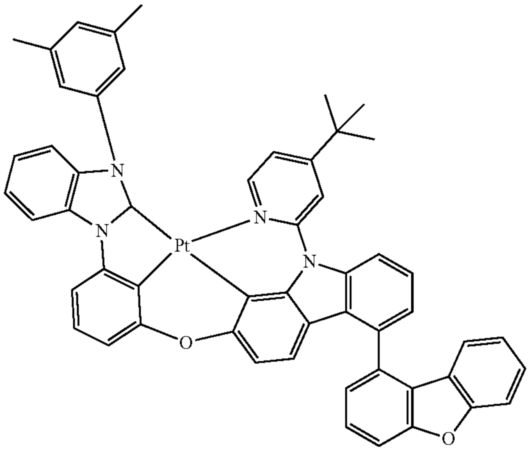
236
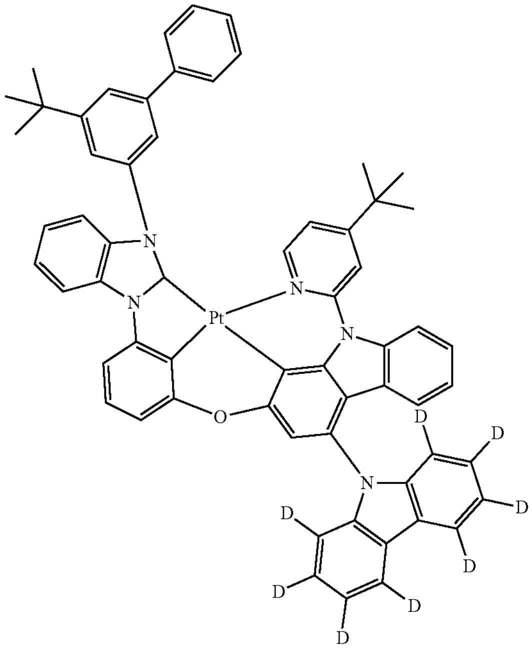

-continued
237
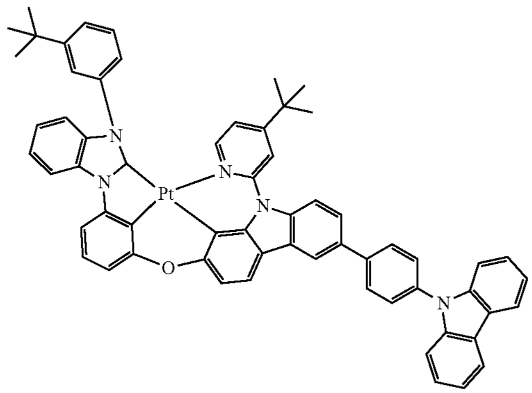
238
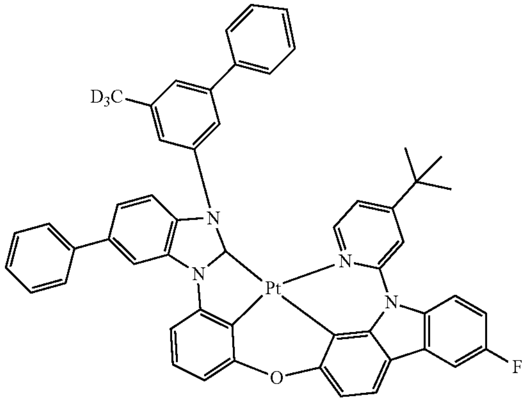
239
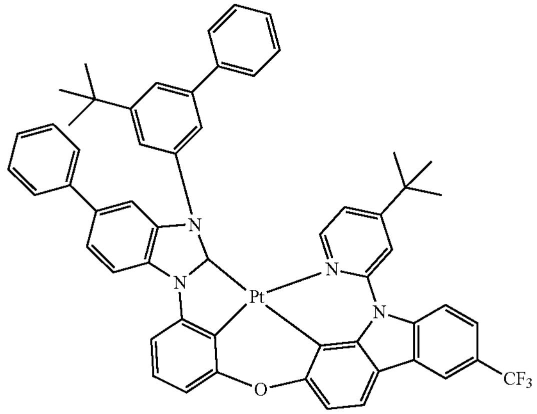
240
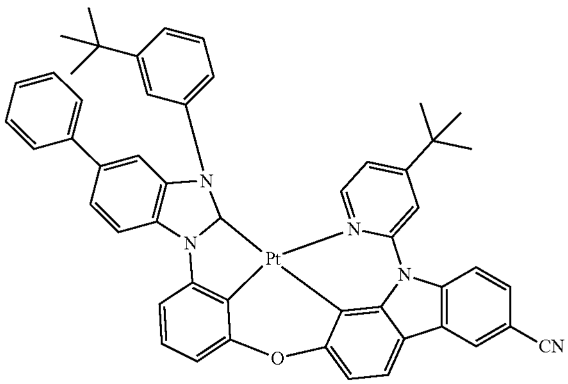
241
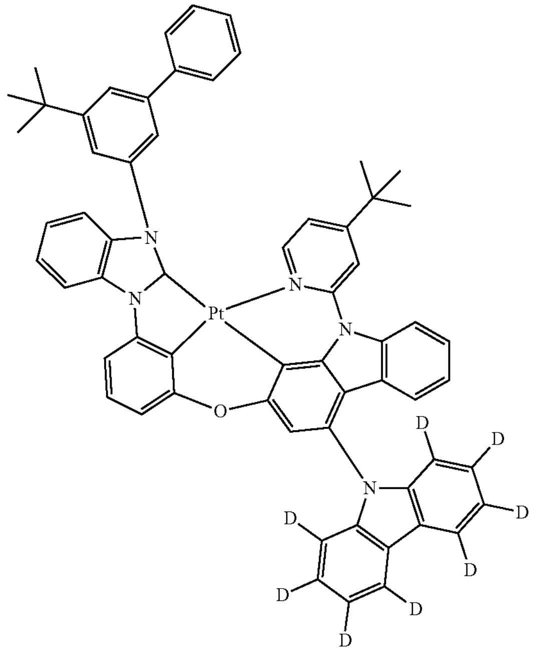
242
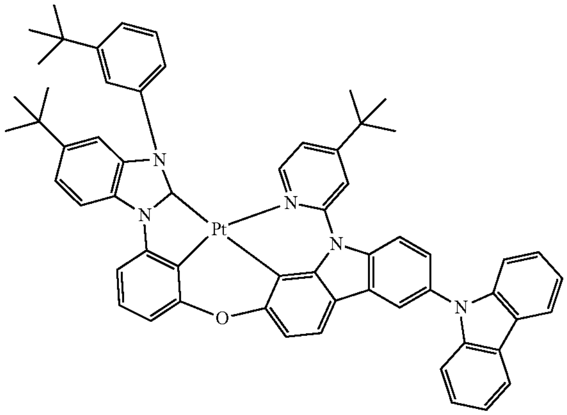

-continued
243
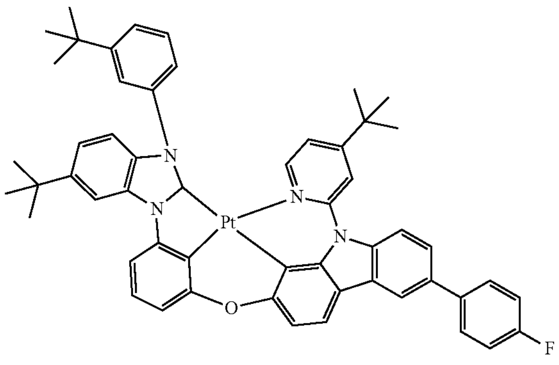
244
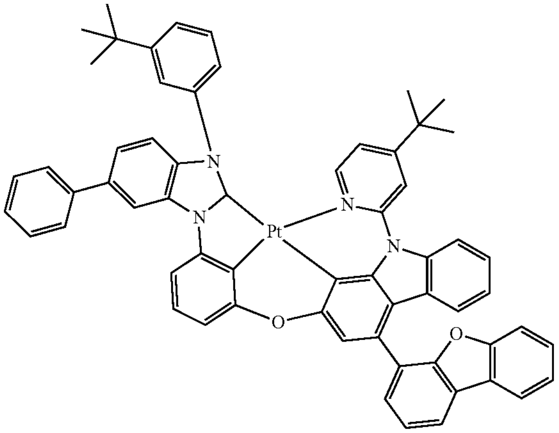
245
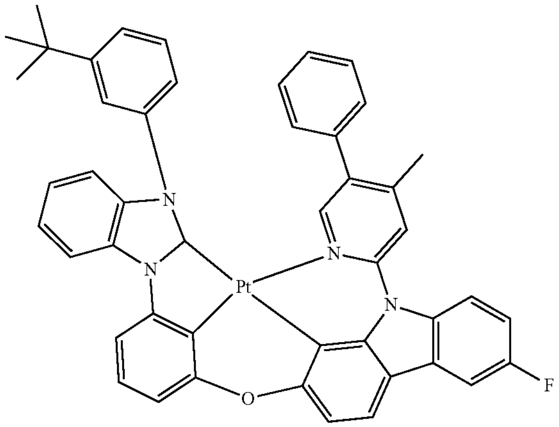
246
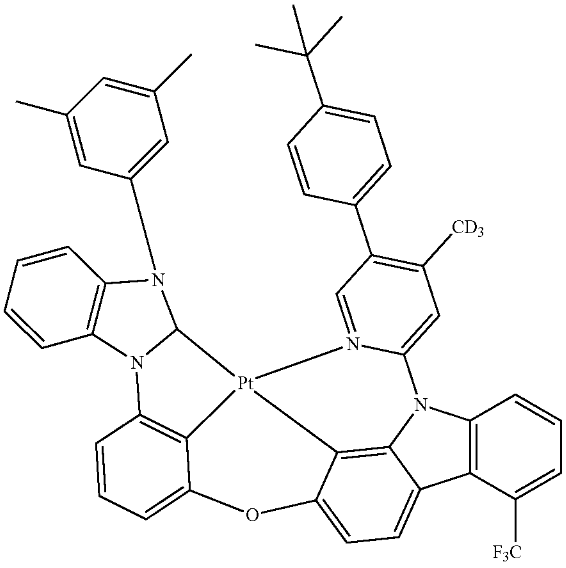
247
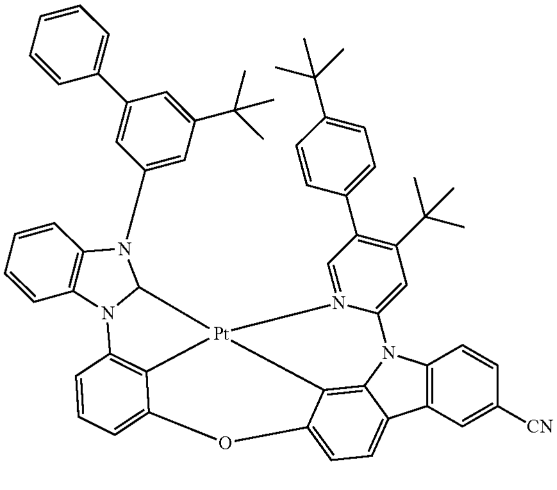
248
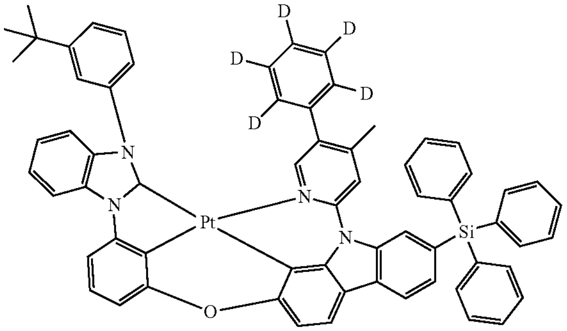

-continued
249
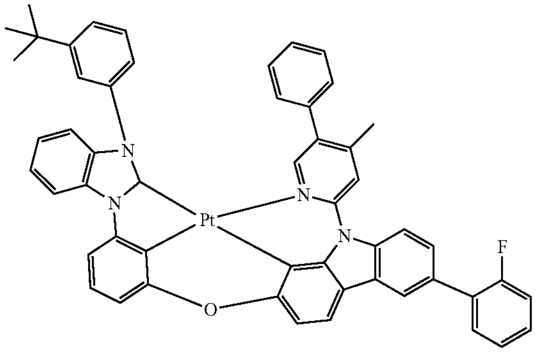
250
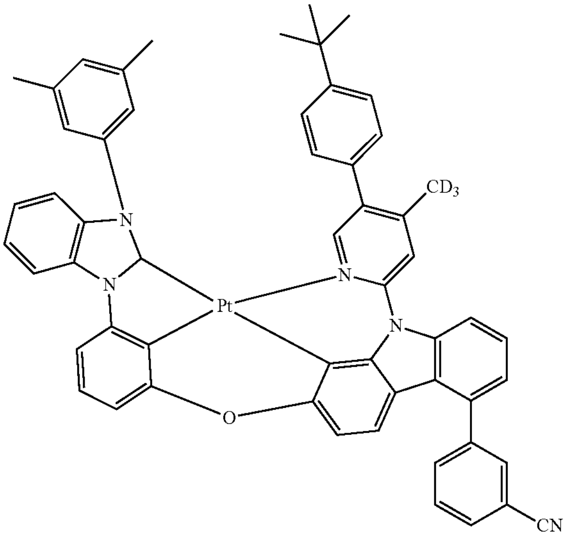
251
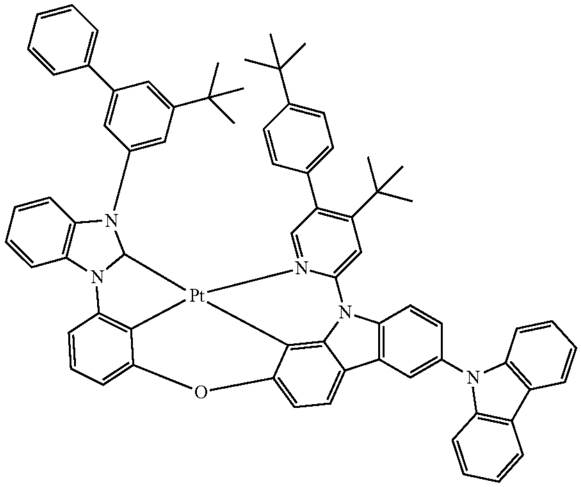
252
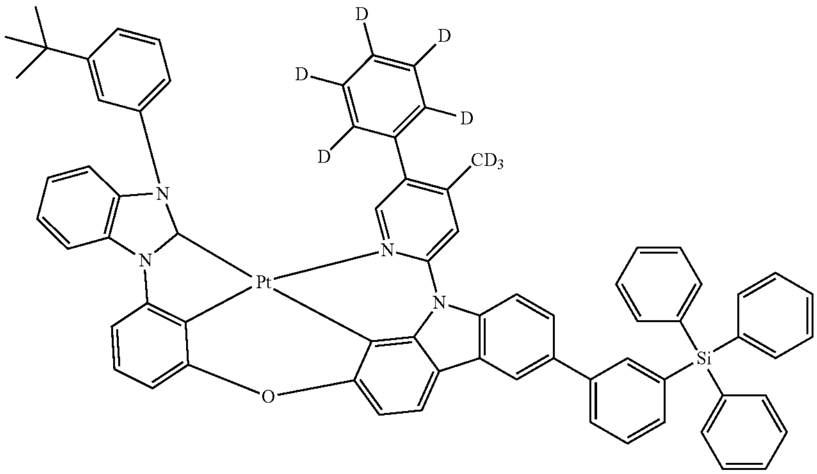

-continued
253
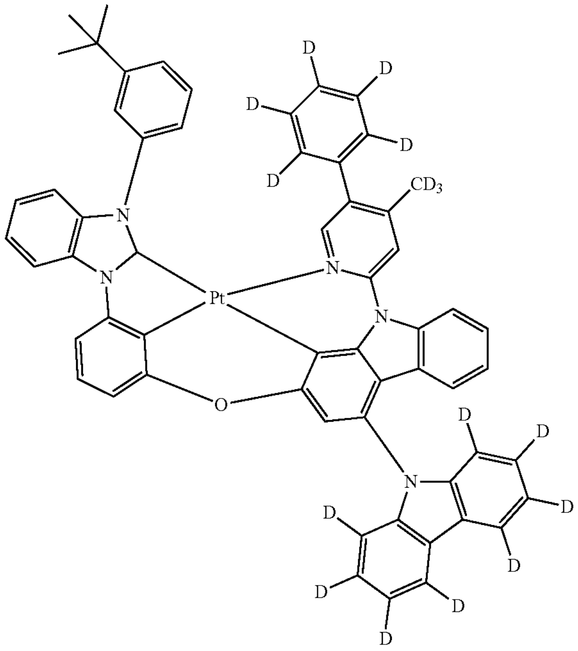
254
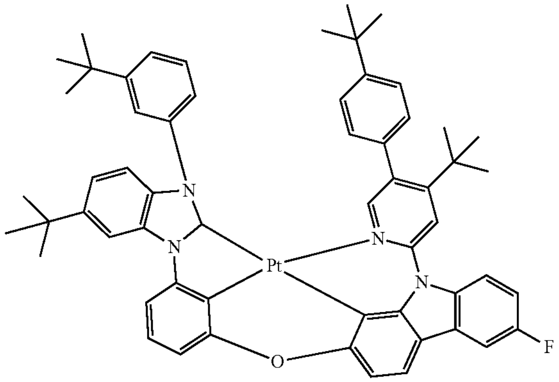
255
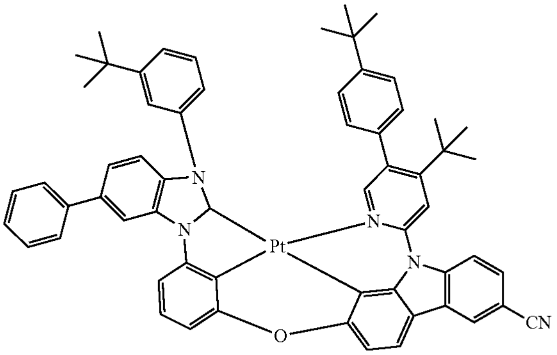
256
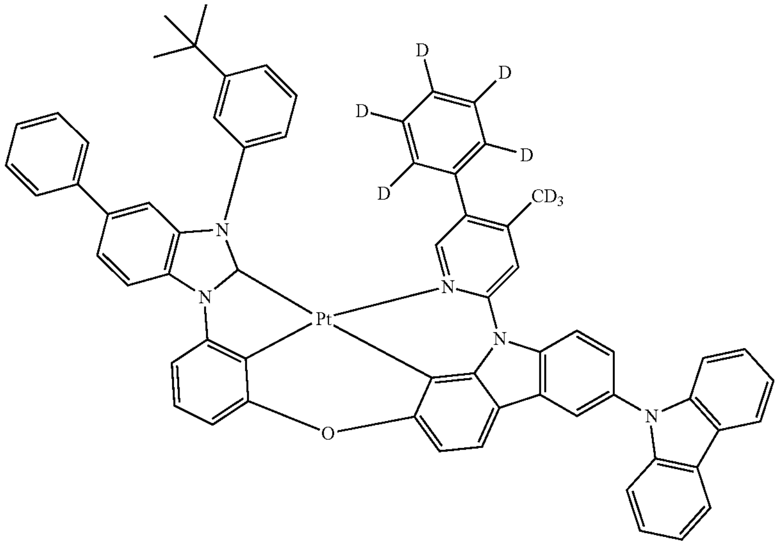

-continued
257
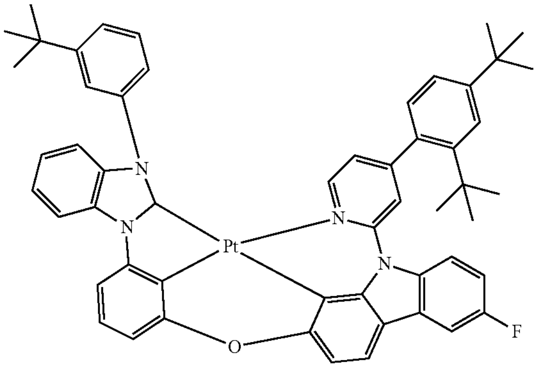
258
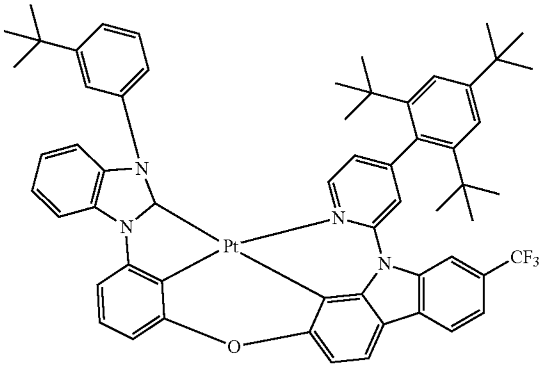
259
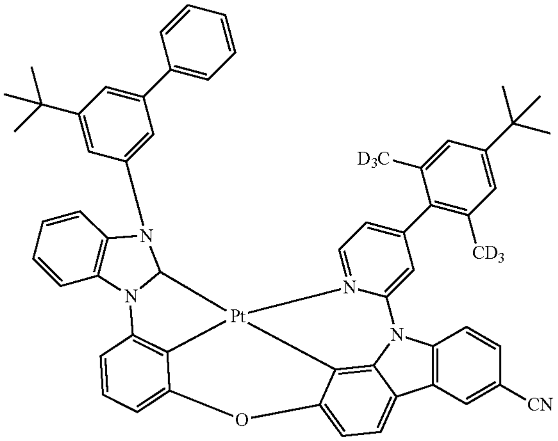
260
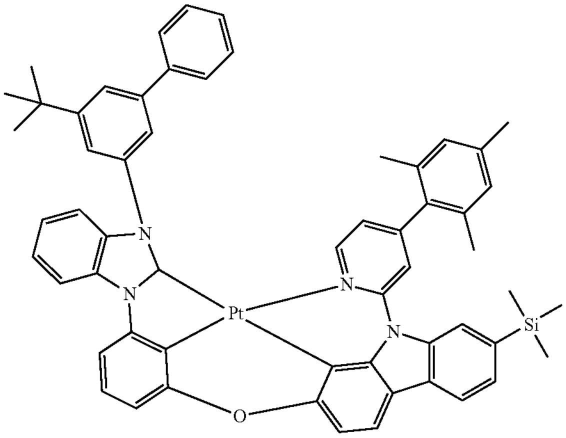
261
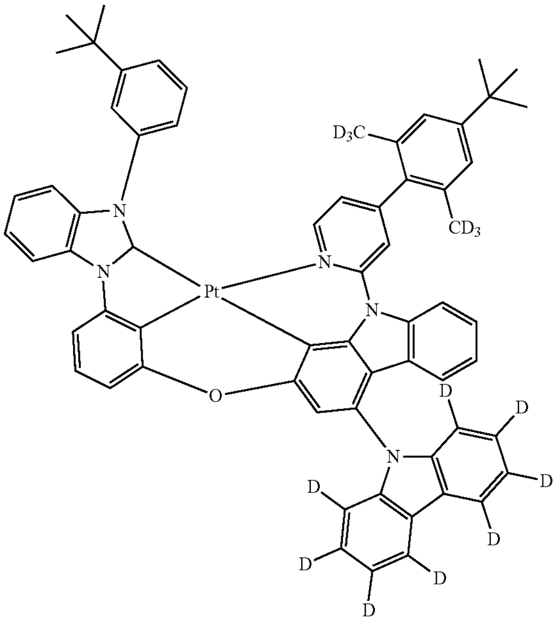
262
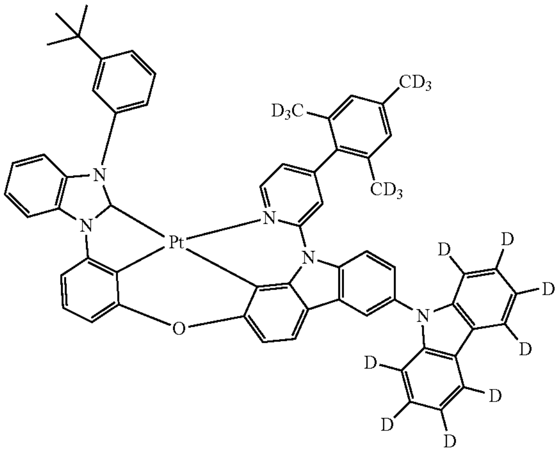

-continued
263
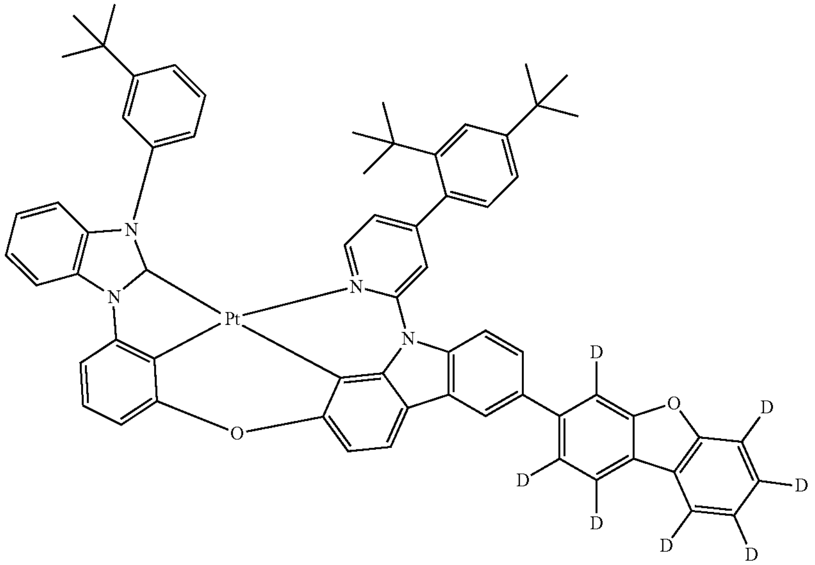
264
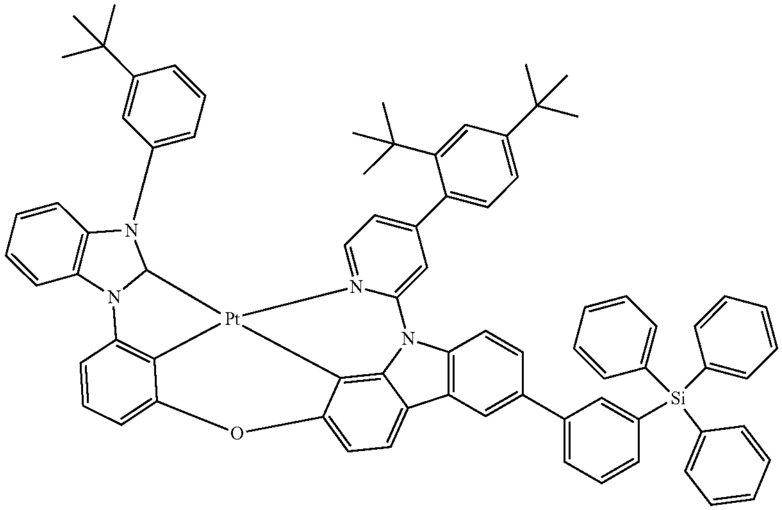
265
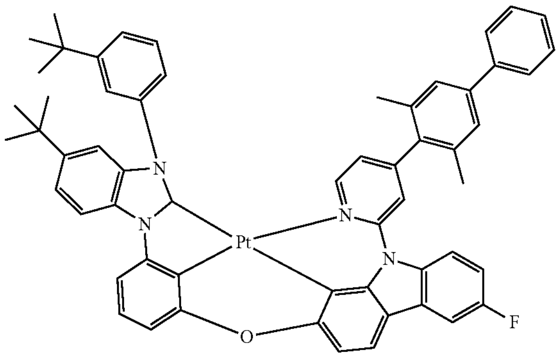
266
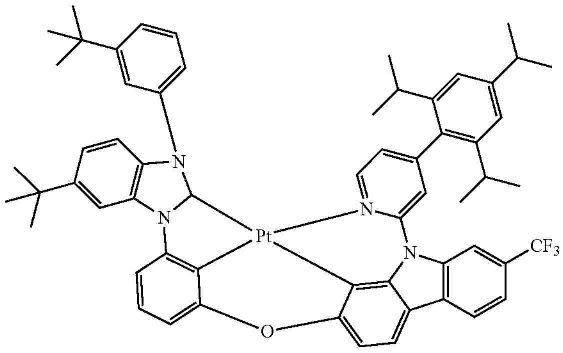

-continued
267
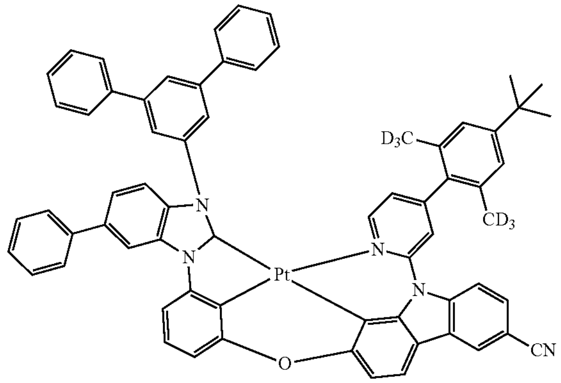
268
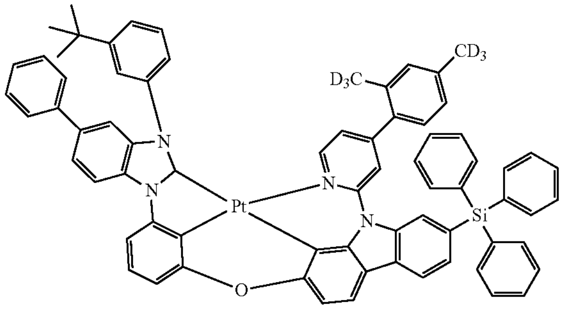
269
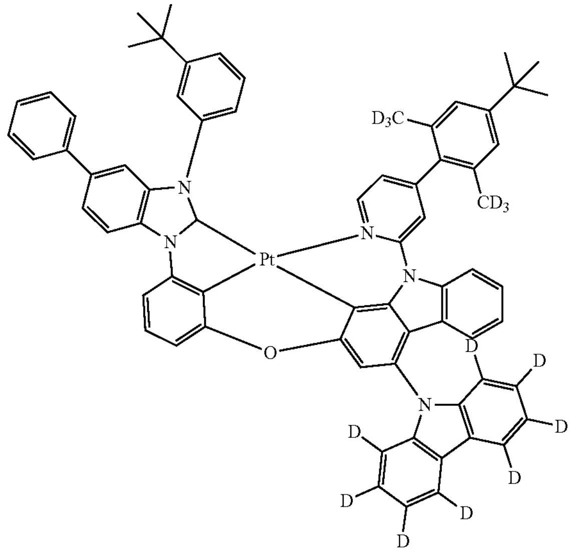
270
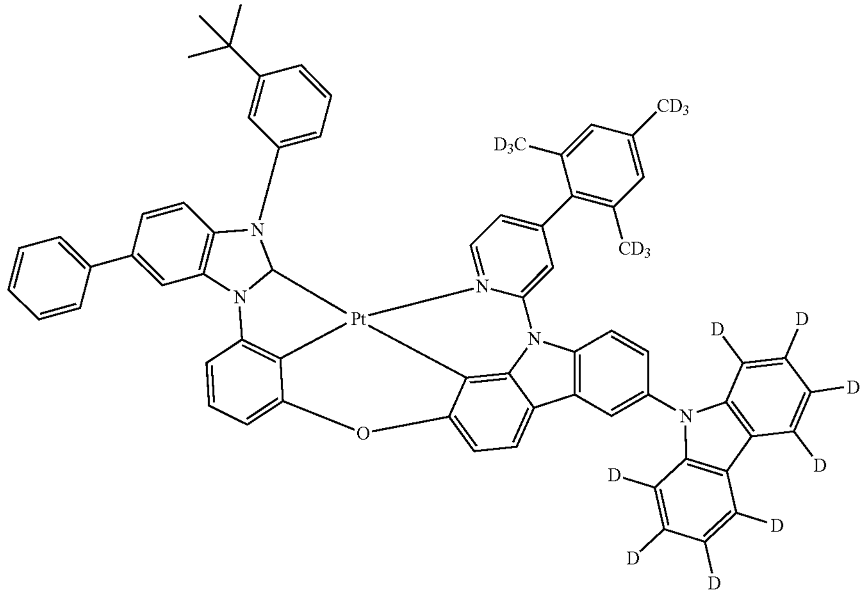

-continued
271
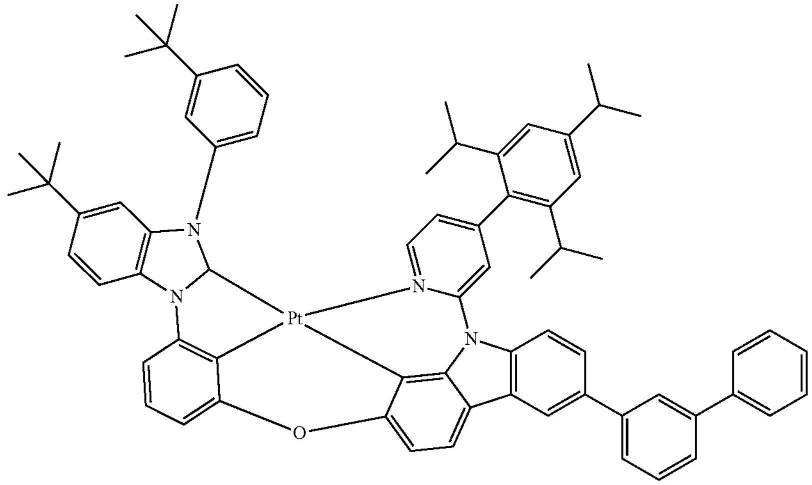
272
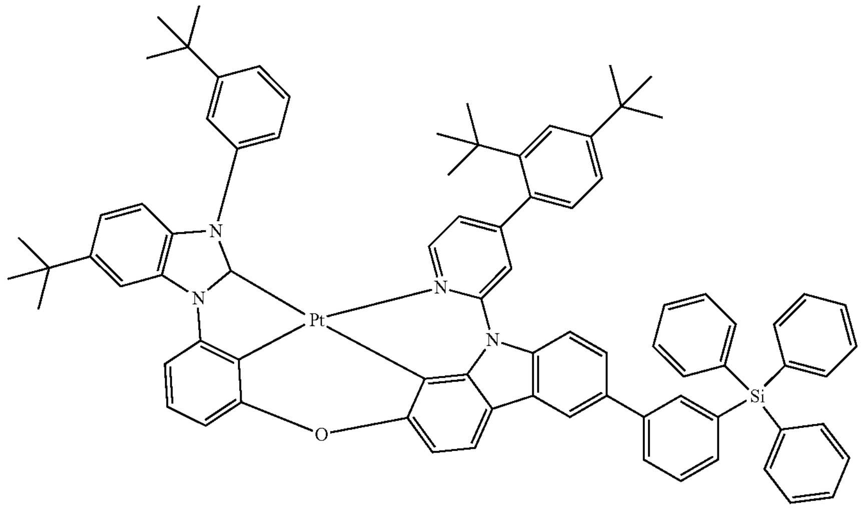
273
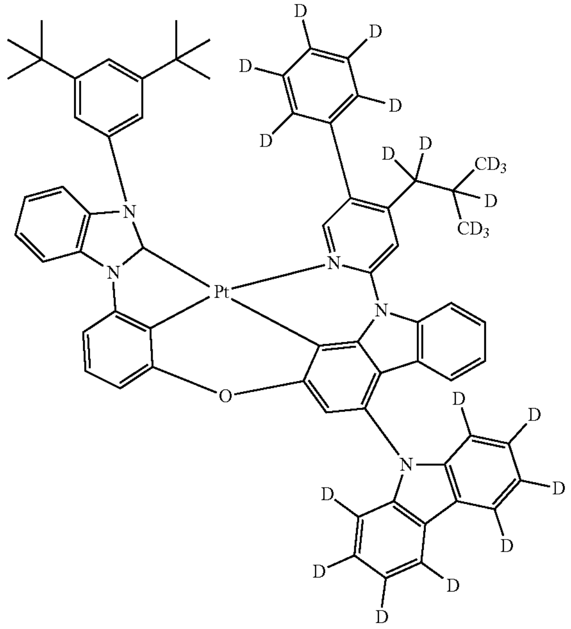

-continued
274
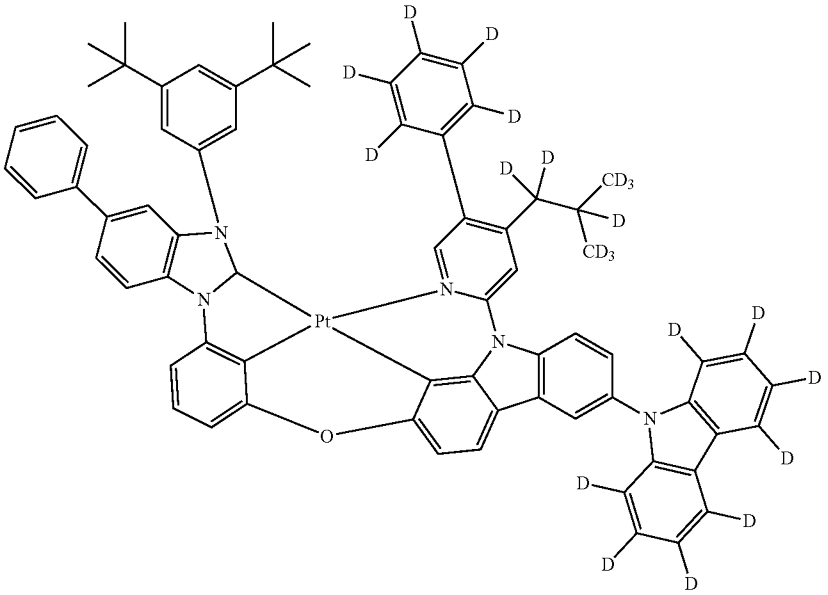
275
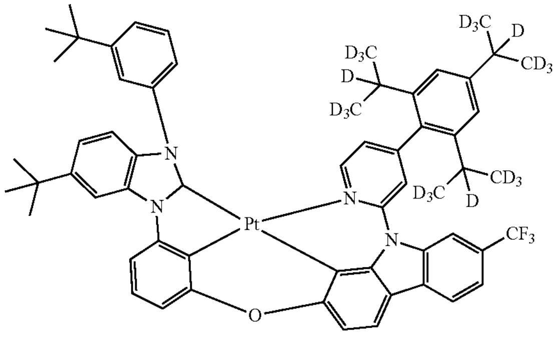
276
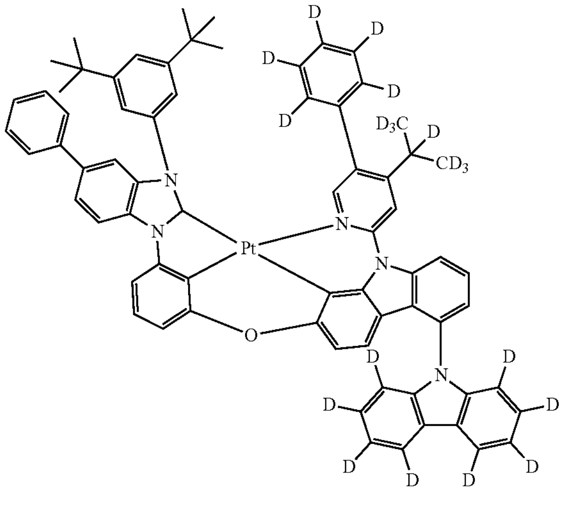

-continued
277
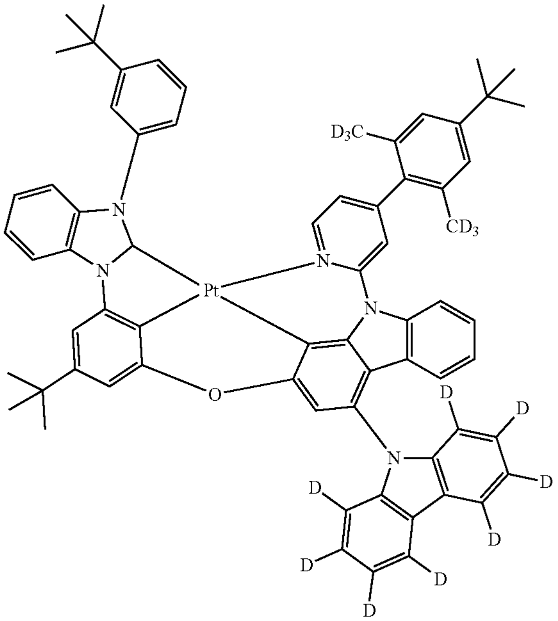
278
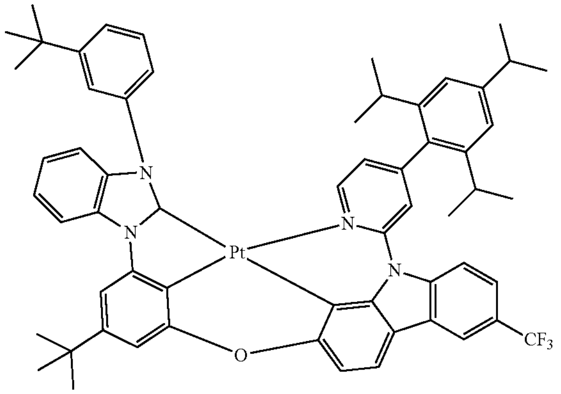
279
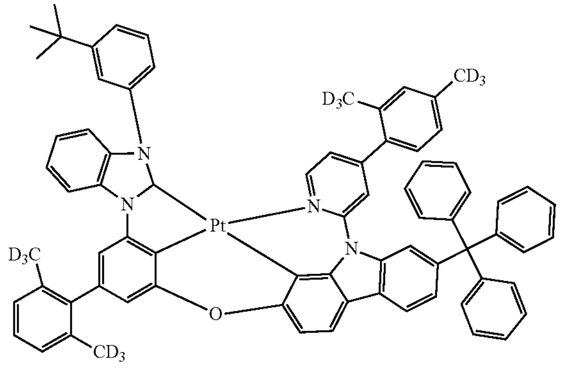
280
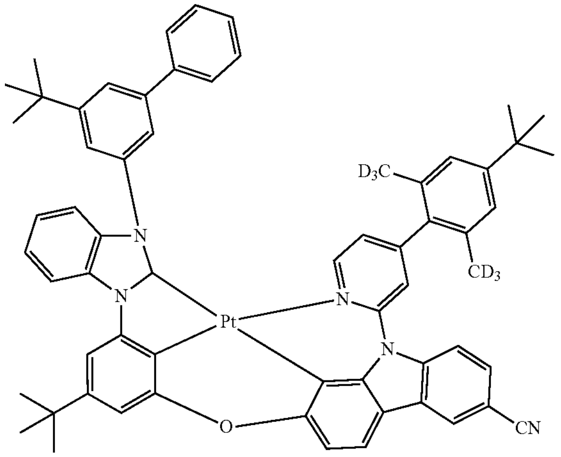
281
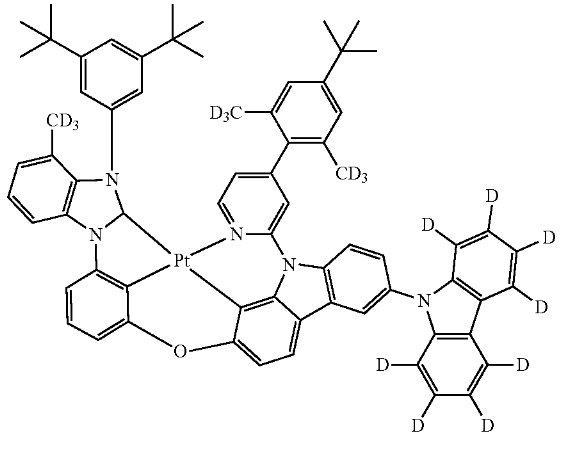
282
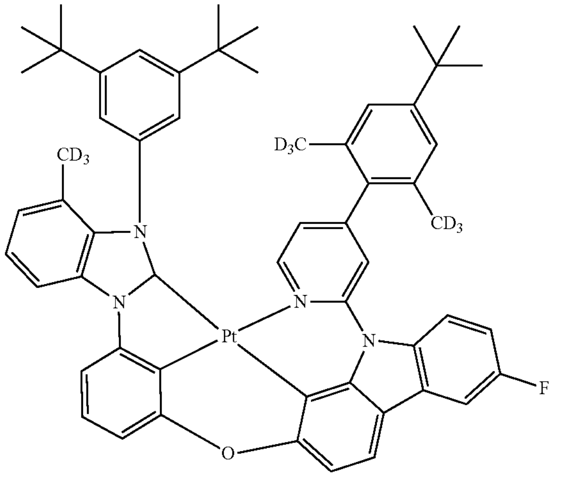

-continued
283
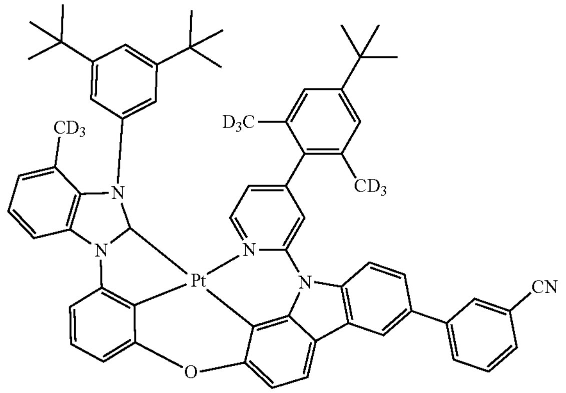
284
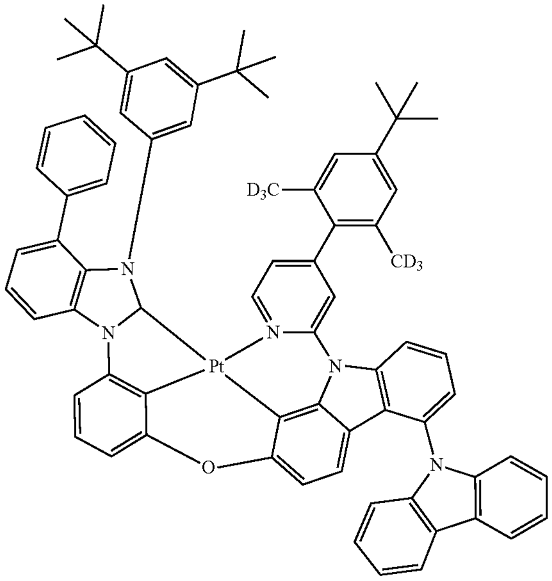
285
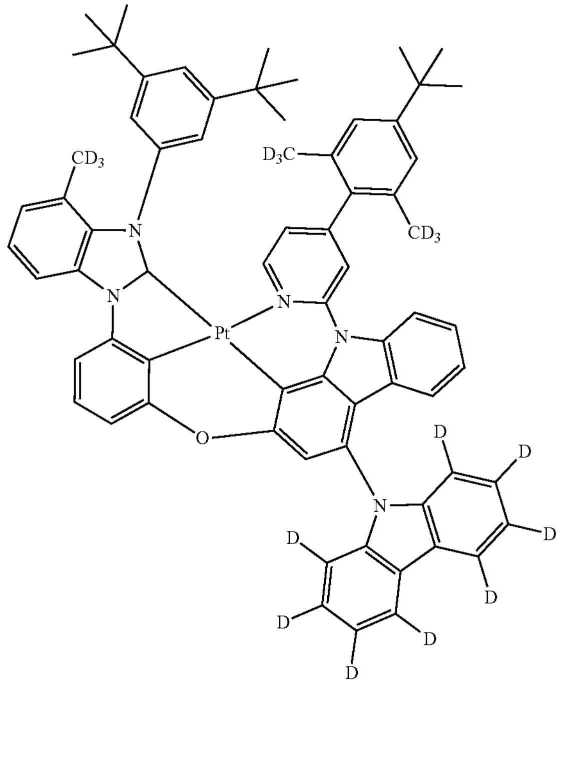
286
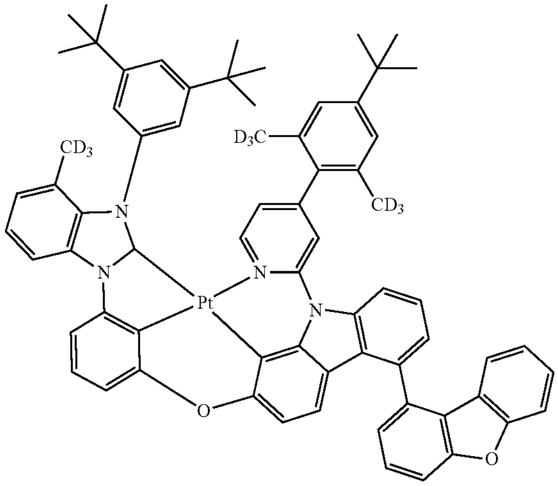

-continued
287
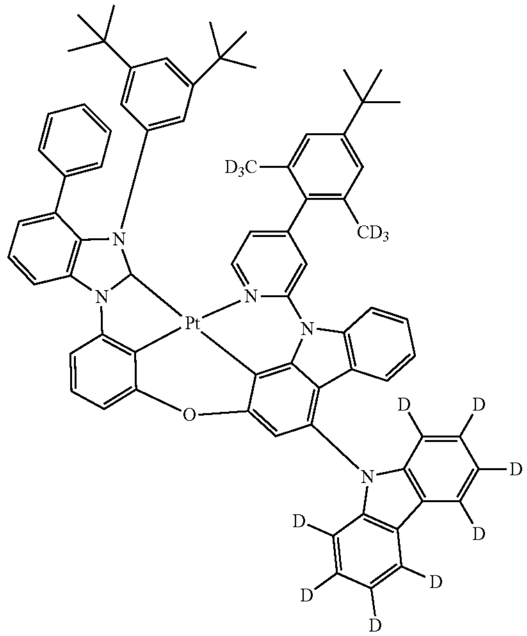
288
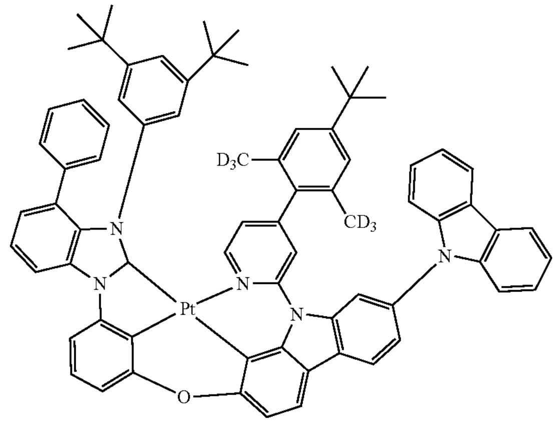
289
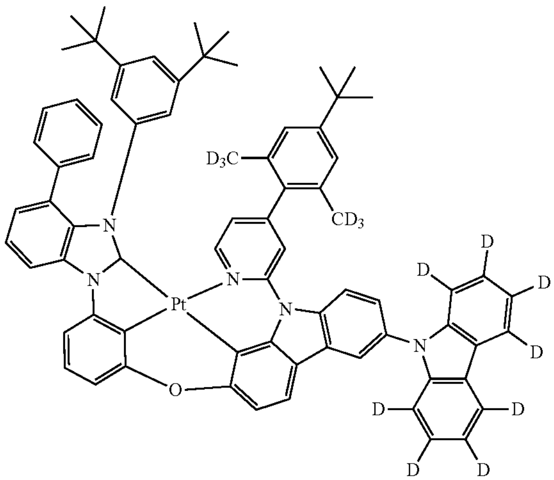
290
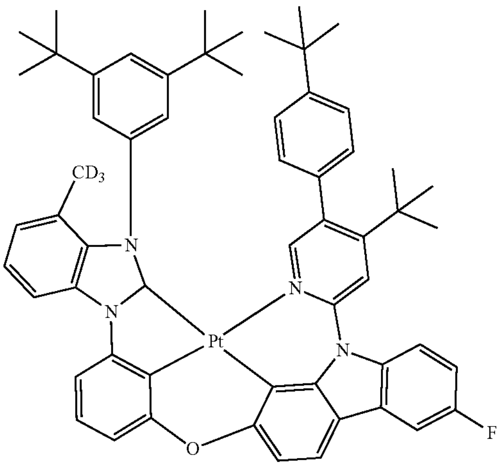

-continued
291
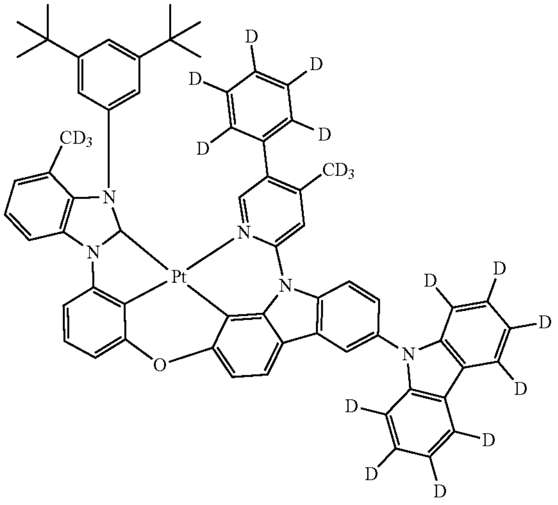
292
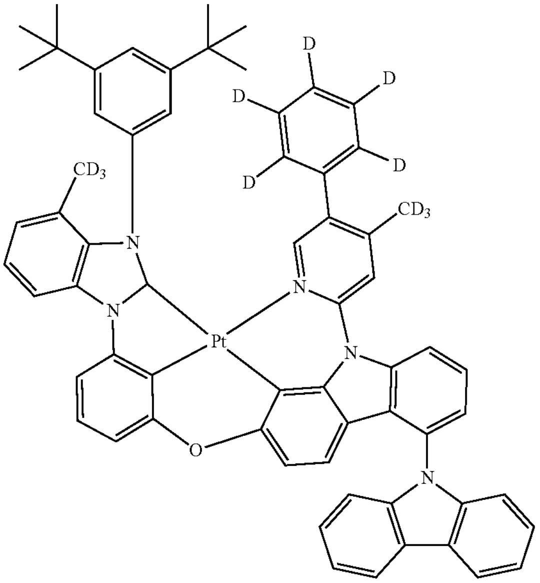
293
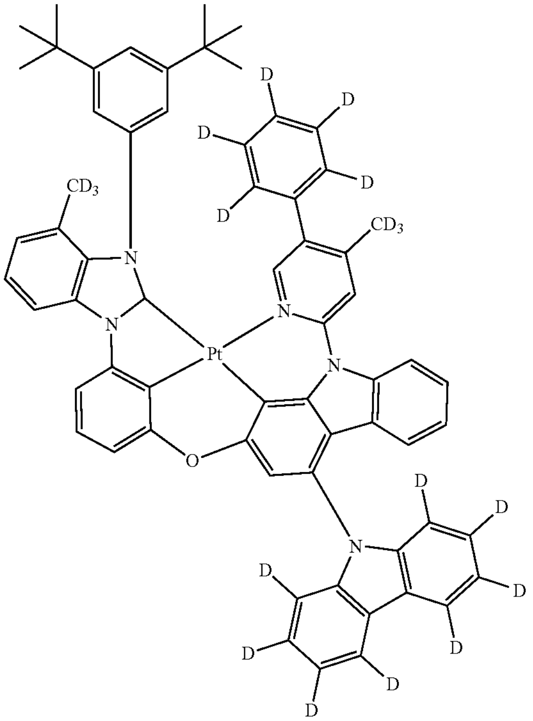
294
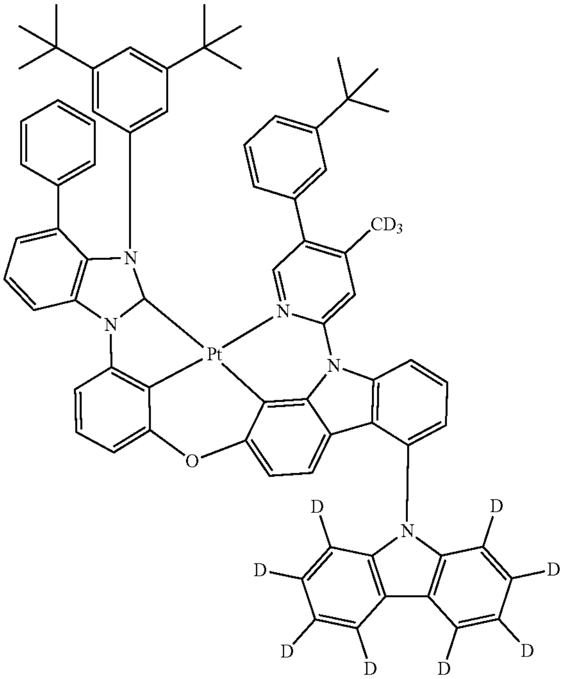

-continued
295
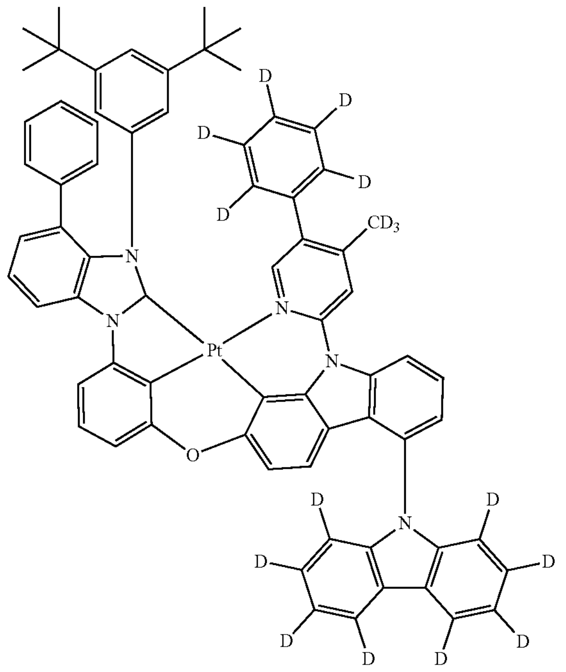
296
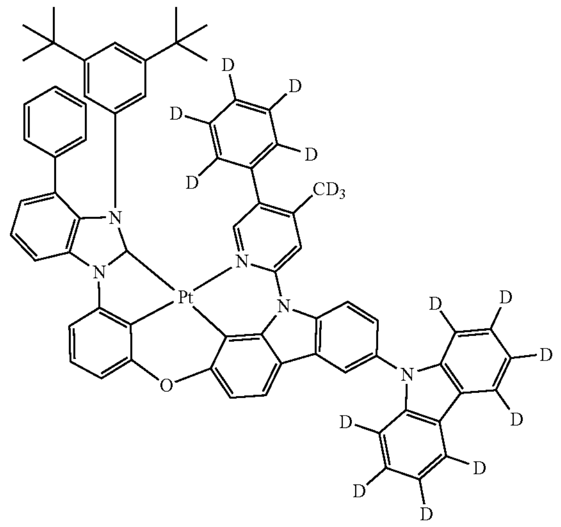
297
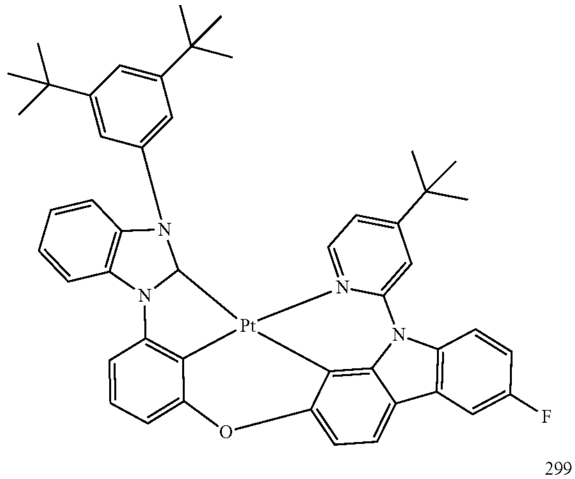
298
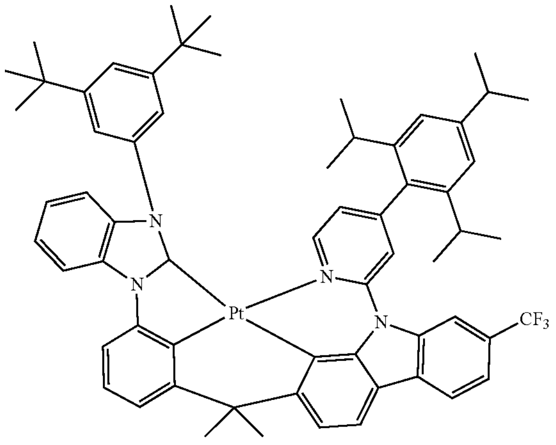
299
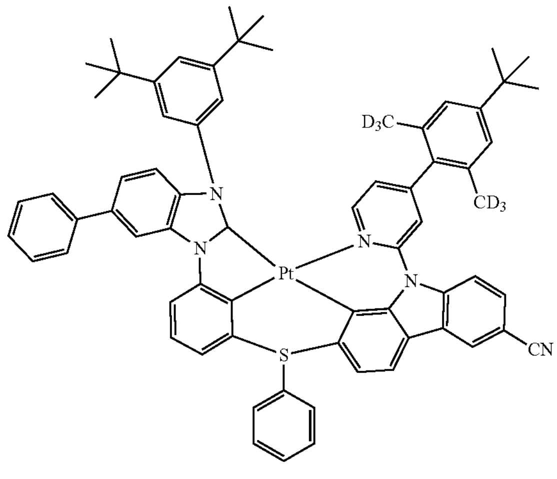
300
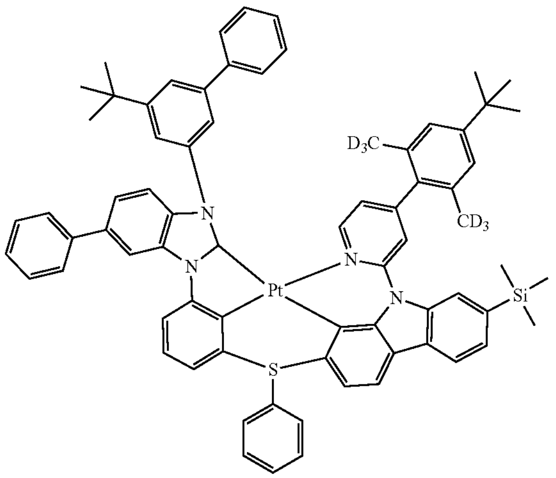

-continued
301
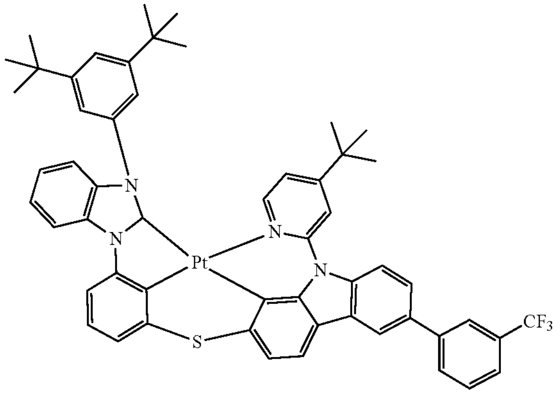
302
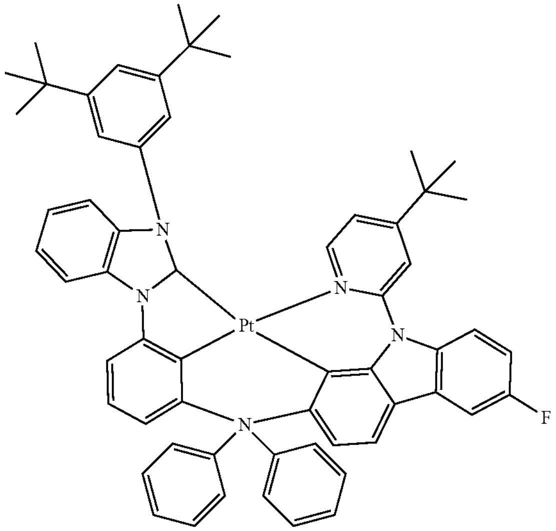
303
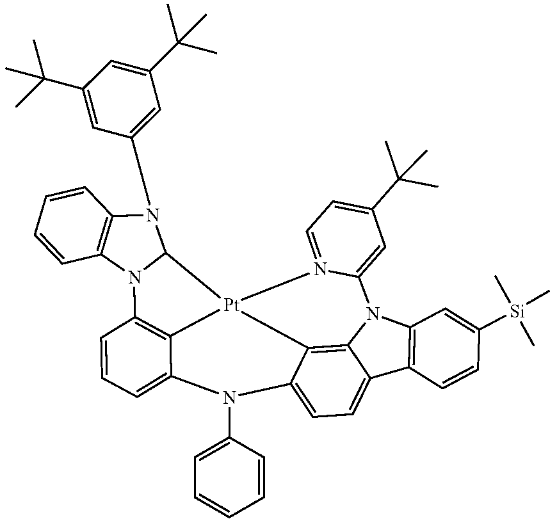
304
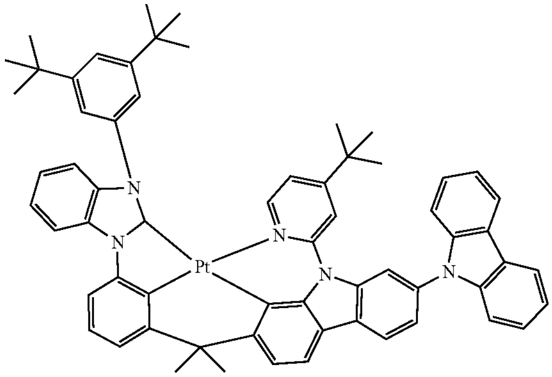

-continued
305
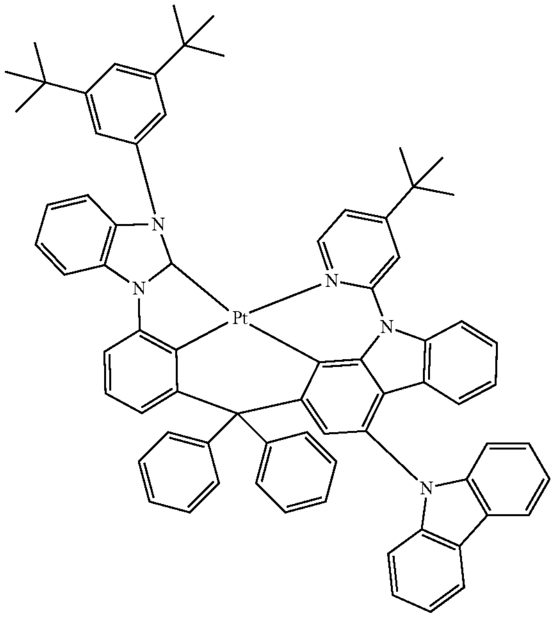
306
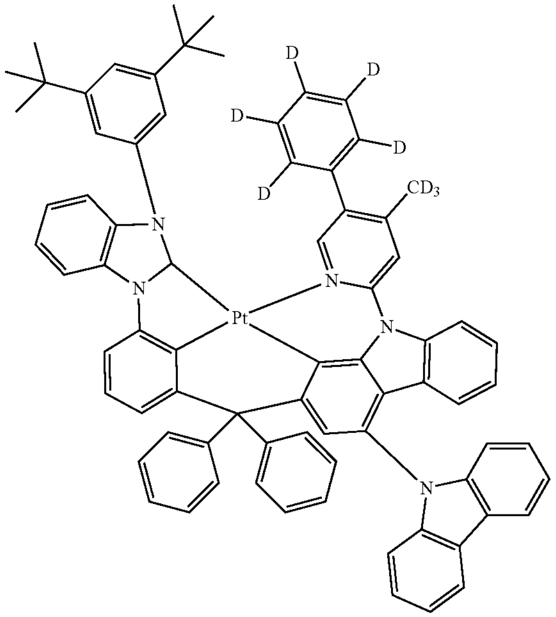
307
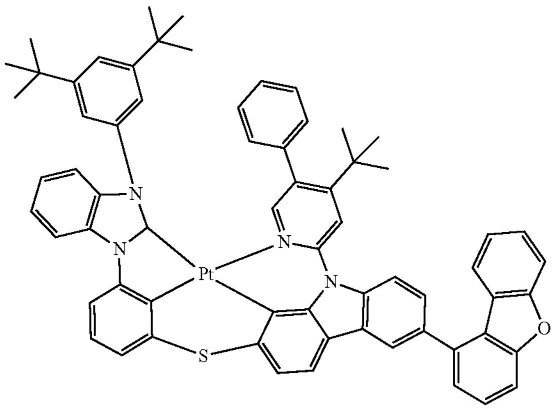
308
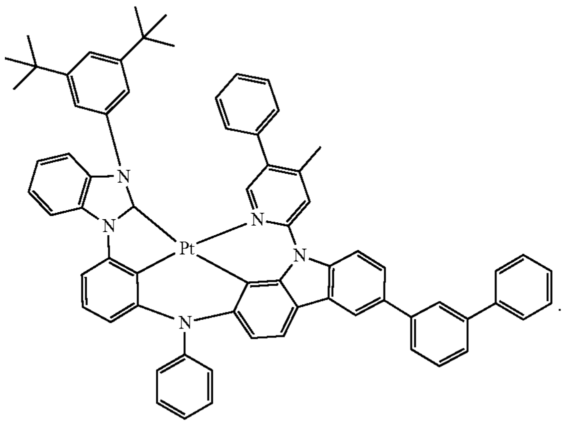

14. The organic light-emitting device of claim 1, wherein the emission layer further comprises a host, and a content of the host in the emission layer is greater than a content of the at least one organometallic compound in the emission layer.

15. The organic light-emitting device of claim 1, wherein the emission layer emits blue light having a maximum emission wavelength in a range of about 410 nanometers to about 490 nanometers.

16. The organic light-emitting device of claim 1, wherein at least about 80% or greater of total emission from the emission layer is emitted from the fluorescent dopant.

17. An electronic apparatus, comprising the organic light-emitting device of claim 1.

* * * * *